US012101995B2

(12) United States Patent
Lee et al.

(10) Patent No.: US 12,101,995 B2
(45) Date of Patent: Sep. 24, 2024

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Yong Joo Lee, Suwon-si (KR); Byungjoon Kang, Seoul (KR); Shingo Ishihara, Suwon-si (KR); Jeoungin Yi, Seoul (KR); Byoungki Choi, Hwaseong-si (KR); Yasushi Koishikawa, Hwaseong-si (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 714 days.

(21) Appl. No.: 17/208,189

(22) Filed: Mar. 22, 2021

(65) Prior Publication Data

US 2022/0102652 A1 Mar. 31, 2022

(30) Foreign Application Priority Data

Sep. 29, 2020 (KR) ........................ 10-2020-0127522

(51) Int. Cl.
*H10K 85/30* (2023.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC .... H10K 85/342; H10K 85/346; H10K 50/11; C07F 15/0033; C07F 15/0086; C09K 11/06; C09K 2211/185
See application file for complete search history.

(56) References Cited

U.S. PATENT DOCUMENTS 8,946,697 B1 * 2/2015 Ma ........................ H10K 85/342 546/4
10,998,508 B2 5/2021 Boudreault et al.
(Continued)

FOREIGN PATENT DOCUMENTS

CN 110615816 A 12/2019
CN 111690016 A * 9/2020 ........... C07B 59/002
(Continued)

OTHER PUBLICATIONS https://goldbook.iupac.org/terms/view/S05674.*
(Continued)

*Primary Examiner* — Vu A Nguyen
(74) *Attorney, Agent, or Firm* — CANTOR COLBURN LLP

(57) ABSTRACT

Provided are an organometallic compound represented by Formula 1, an organic light-emitting device including the same, and an electronic apparatus including the organic light-emitting device:

$$M(L_1)_{n1}(L_2)_{n2} \quad \text{Formula 1}$$

wherein M, $L_1$, $L_2$, n1, and n2 in Formula 1 are each the same as described in the present specification.

20 Claims, 1 Drawing Sheet

(51) Int. Cl.

| | |
|---|---|
| ***C09K 11/06*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 85/40*** | (2023.01) |

(52) U.S. Cl.

CPC ...... *H10K 85/40* (2023.02); *C09K 2211/1029* (2013.01); *C09K 2211/1033* (2013.01); *C09K 2211/1088* (2013.01); *C09K 2211/1092* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02)

(56) References Cited

U.S. PATENT DOCUMENTS

| | | | |
|---|---|---|---|
| 2015/0069334 | A1 | 3/2015 | Chuanjun et al. |
| 2015/0171349 | A1 | 6/2015 | Ma et al. |
| 2017/0346025 | A1 | 11/2017 | Hwang et al. |
| 2019/0006590 | A1 | 1/2019 | Park et al. |
| 2020/0091442 | A1 | 3/2020 | Cai et al. |
| 2022/0037599 | A1 | 2/2022 | Hwang et al. |

FOREIGN PATENT DOCUMENTS

| | | | | | |
|---|---|---|---|---|---|
| CN | 111808142 | A | * | 10/2020 | .......... C07F 15/0033 |
| CN | 111978355 | A | * | 11/2020 | .......... C07F 15/0046 |
| CN | 112079876 | A | * | 12/2020 | ........... C07B 59/002 |
| CN | 112409418 | A | * | 2/2021 | .......... C07F 15/0033 |
| EP | 2730583 | A1 | | 5/2014 | |
| EP | 3007244 | A1 | | 4/2016 | |
| EP | 3623443 | A1 | | 3/2020 | |
| EP | 3792270 | A1 | | 3/2021 | |
| EP | 3798225 | A1 | | 3/2021 | |
| EP | 3912983 | A1 | | 11/2021 | |
| EP | 4043469 | A1 | | 8/2022 | |
| EP | 4059942 | A1 | | 9/2022 | |
| KR | 101744248 | B1 | | 6/2017 | |
| KR | 1020210144587 | A | | 11/2021 | |
| KR | 1020220011010 | A | | 1/2022 | |
| WO | 2019154159 | A1 | | 8/2019 | |
| WO | 2019221484 | A1 | | 11/2019 | |

OTHER PUBLICATIONS

Machine-generated English-language translation of CN 111690016 A to Wang et al.*

Machine-generated English-language translation of CN 112079876 A to Gao et al.*

Extended European search report dated Feb. 16, 2022 of EP Patent Application No. 21198508.0.

Office Action issued Oct. 10, 2023 of EP Patent Application No. 21198508.0.

* cited by examiner

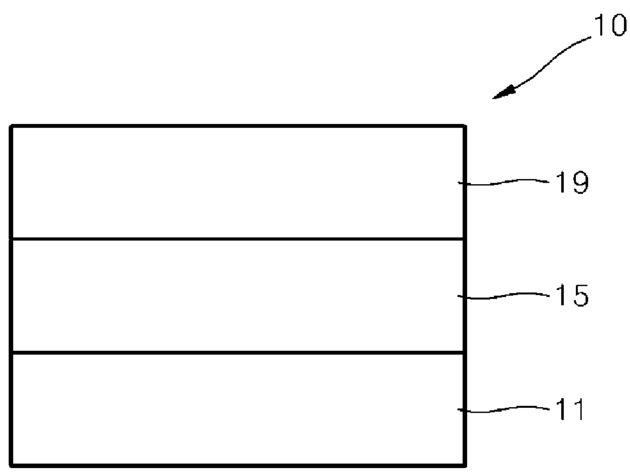
10
19
15
11

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application is based on and claims priority to Korean Patent Application No. 10-2020-0127522, filed on Sep. 29, 2020, in the Korean Intellectual Property Office, and all the benefits accruing therefrom under 35 U.S.C. § 119, the entire content of which is incorporated by reference herein.

BACKGROUND

1. Field

Aspects of the present disclosure relate to organometallic compounds, organic light-emitting devices including the same, and electronic apparatuses including the organic light-emitting devices.

2. Description of Related Art

Organic light-emitting devices (OLEDs) are self-emission devices, that have improved characteristics in terms of viewing angles, response time, brightness, driving voltage, and response speed, and produce full-color images.

In an example, an organic light-emitting device includes an anode, a cathode, and an organic layer arranged between the anode and the cathode and including an emission layer. A hole transport region may be arranged between the anode and the emission layer, and an electron transport region may be arranged between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

Various types of organic light emitting devices are known. However, there still remains a need in OLEDs having low driving voltage, high efficiency, high brightness, and long lifespan.

SUMMARY

Provided herein are novel organometallic compounds, organic light-emitting devices including the same, and electronic apparatuses including the organic light-emitting devices.

Additional aspects will be set forth in part in the description which follows and, in part, will be apparent from the description, or may be learned by practice of the presented embodiments of the disclosure.

According to an aspect of an embodiment, provided is an organometallic compound represented by Formula 1:

$$M(L_1)_{n1}(L_2)_{n2} \qquad \text{Formula 1}$$

wherein, in Formula 1,

M is a transition metal, $L_1$ is a ligand represented by Formula 2A, $L_2$ is a ligand represented by Formula 2B, n1 and n2 are each independently 1 or 2, wherein, when n1 is 2, two of $L_1$(s) are identical to or different from each other, and when n2 is 2, two of $L_2$(s) are identical to or different from each other, the sum of n1 and n2 is 2 or 3, and $L_1$ and $L_2$ are different from each other:

Formula 2A

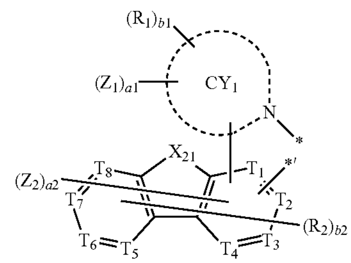

Formula 2B

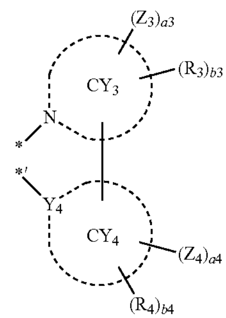

wherein, in Formulae 2A and 2B, $Y_4$ is C or N, $X_{21}$ is O, S, Se, S(=O), N($R_{29}$), C($R_{29}$)($R_{30}$), or Si($R_{29}$)($R_{30}$), $T_1$ to $T_4$ are each independently C, N, carbon bonded to ring $CY_1$, or carbon bonded to M in Formula 1, wherein one of $T_1$ to $T_4$ is the carbon bonded to M in Formula 1, and one of the remaining groups $T_1$ to $T_4$ that is not bonded to M in Formula 1 is the carbon bonded to ring $CY_1$, $T_5$ to $T_8$ are each independently C or N, ring $CY_1$ and ring $CY_3$ are each independently a $C_1$-$C_{30}$ heterocyclic group, ring $CY_4$ is a $C_5$-$C_{30}$ carbocyclic group or a $C_1$-$C_{30}$ heterocyclic group, $Z_1$, $Z_3$, and $Z_4$ are each independently a fluoro group (—F) or a fluorinated group, $Z_2$ is a fluoro group, a fluorinated non-cyclic group, or a fluorinated saturated cyclic group, a1, a3, and a4 are each independently an integer from 0 to 20, wherein a2 is an integer from 0 to 6, and the sum of a1, a2, a3, and a4 is 1 or more, $R_1$ to $R_4$, $R_{29}$, and $R_{30}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, b1, b3, and b4 are each independently an integer from 0 to 20, and b2 is an integer from 0 to 6, when i) none of $T_1$ to $T_8$ in Formula 2A is N, ii) a2 in Formula 2A is not 0, and iii) $Z_2$ in Formula 2A is a fluoro group, then a) b3 in Formula 2B is not 0, and b) at least one of $R_3$(s) in the number of b3 in Formula 2B is —$Si(Q_3)(Q_4)(Q_5)$ or —$Ge(Q_3)(Q_4)(Q_5)$, two or more of a plurality of $R_1$(s) are optionally linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_2$(s) are optionally linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_3$(s) are optionally linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_4$(s) are optionally linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_1$, and *' in Formulae 2A and 2B each indicate a binding site to M in Formula 1, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each independently substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each independently unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$S(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$ or —$P(Q_{38})(Q_{39})$; or a combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

According to an aspect of an embodiment, provided is an organic light-emitting device including: a first electrode; a second electrode; and an organic layer arranged between the first electrode and the second electrode and wherein the organic layer includes an emission layer, wherein the organic layer further includes at least one organometallic compound represented by Formula 1.

The organometallic compound may be included in the emission layer of the organic layer, and the organometallic compound included in the emission layer may act as a dopant.

According to an aspect of another embodiment, provided is an electronic apparatus including the organic light-emitting device.

BRIEF DESCRIPTION OF THE DRAWINGS

The above and other aspects, features, and advantages of certain embodiments of the disclosure will be more apparent from the following description taken in conjunction with FIGURE which shows a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In any formula, * and *' each indicate a binding site to a neighboring atom or a neighboring functional group.

An aspect of the present disclosure provides an organometallic compound represented by Formula 1:

$$M(L_1)_{n1}(L_2)_{n2} \quad \text{Formula 1}$$

wherein M in Formula 1 is a transition metal.

In an embodiment, M may be a Period 1 transition metal, a Period 2 transition metal, or a Period 3 transition metal.

In an embodiment, M may be iridium (Ir), platinum (Pt), osmium (Os), titanium (Ti), zirconium (Zr), hafnium (Hf), europium (Eu), terbium (Tb), thulium (Tm)), or rhodium (Rh).

In an embodiment, M may be Ir, Pt, Os, or Rh.

In Formula 1, $L_1$ may be a ligand represented by Formula 2A, and $L_2$ may be a ligand represented by Formula 2B:

Formula 2A

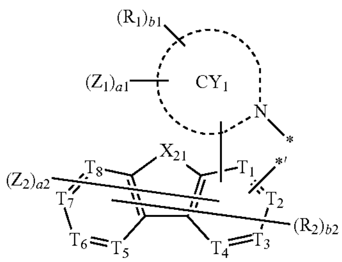

Formula 2B

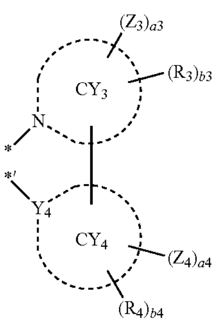

wherein Formulae 2A and 2B are the same as described in the present specification.

In Formula 1, n1 and n2 may each independently be 1 or 2, wherein, when n1 is 2, two $L_1$(s) may be identical to or different from each other, and when n2 is 2, two $L_2$(s) may be identical to or different from each other.

In Formula 1, the sum of n1 and n2 may be 2 or 3. For example, the sum of n1 and n2 may be 3.

In an embodiment, in Formula 1, i) M may be Ir, and the sum of n1 and n2 may be 3; or ii) M may be Pt, and the sum of n1 and n2 may be 2.

In an embodiment, in Formula 1, M may be Ir, and i) n1 may be 1, and n2 may 2, or ii) n1 may be 2, and n2 may be 1.

In Formula 1, $L_1$ and $L_2$ may be different from each other. That is, the organometallic compound represented by Formula 1 may be a heteroleptic complex.

In Formula 2B, $Y_4$ may be C or N. For example, $Y_4$ may be C.

In Formula 2A, $X_{21}$ may be O, S, Se, S(═O), N($R_{29}$), C($R_{29}$)($R_{30}$), or Si($R_{29}$)($R_{30}$), wherein $R_{29}$ and $R_{30}$ may each be the same as described herein. For example, $X_{21}$ may be O or S.

In Formula 2A, $T_1$ to $T_4$ may each independently be C, N, carbon bonded to ring $CY_1$, or carbon bonded to M in Formula 1, wherein one of $T_1$ to $T_4$ is the carbon bonded to M in Formula 1, and one of the remaining groups $T_1$ to $T_4$ that is not bonded to M in Formula 1 is the carbon bonded to ring $CY_1$, and $T_5$ to $T_8$ may each independently be C or N.

In an embodiment, none of $T_1$ to $T_8$ may be N.

In an embodiment, one or two of $T_1$ to $T_8$ may be N.

In an embodiment, one or two of $T_5$ to $T_8$ may be N.

In Formulae 2A and 2B, ring $CY_1$ and ring $CY_3$ may each independently be a $C_1$-$C_{30}$ heterocyclic group, and ring $CY_4$ may be a $C_3$-$C_{30}$ carbocyclic group or a $C_1$-$C_{30}$ heterocyclic group.

For example, ring $CY_1$, and ring $CY_3$ may each independently be a pyrrole group, an indole group, a carbazole group, a benzocarbazole group, a dibenzocarbazole group, an indolophenanthrene group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isoxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzisoxadiazole group, a benzothiadiazole group, a 5,6,7,8-tetrahydroisoquinoline group, a 5,6,7,8-tetrahydroquinoline group, a pyridine group condensed with a cyclohexane group, or a pyridine group condensed with a norbornane group.

For example, ring $CY_4$ may be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluorene-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isoxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzisoxadiazole group, a benzothiadiazole group, a 5,6,7,8-tetrahydroisoquinoline group, a 5,6,7,8-tetrahydroquinoline group, an adamantane group, a norbornane group, a norbornene group, a benzene group condensed with a cyclohexane group, a benzene group condensed with a norbornane group, a pyridine group condensed with a cyclohexane group, or a pyridine group condensed with a norbornane group.

In an embodiment, ring $CY_1$ and ring $CY_3$ may each independently be a pyridine group, a pyrimidine group, a pyrazine group, a pyridazine group, a triazine group, a quinoline group, an isoquinoline group, a benzoquinoline group, a benzoisoquinoline group, a 5,6,7,8-tetrahydroisoquinoline group, a 5,6,7,8-tetrahydroquinoline group, or a pyridine group condensed with a norbornane group.

In an embodiment, in Formula 2B, $Y_4$ may be C, and ring $CY_4$ may be a benzene group, a naphthalene group, a 1,2,3,4-tetrahydronaphthalene group, a fluorene group, a carbazole group, a dibenzofuran group, a dibenzothiophene group, a dibenzosilole group, an azafluorene group, an azacarbazole group, an azadibenzofuran group, an azadibenzothiophene group, an azadibenzosilole group, or a benzene group condensed with a norbornane group.

In Formulae 2A and 2B, $Z_1$, $Z_3$, and $Z_4$ may each independently be a fluoro group (—F) or a fluorinated group, and $Z_2$ may be a fluoro group, a fluorinated non-cyclic group, or a fluorinated saturated cyclic group.

The term “fluorinated group” as used herein refers to any group including at least one fluoro group. For example, a fluorinated non-cyclic group refers to a non-cyclic group including at least one fluoro group. For example, a fluorinated cyclic group refers to a cyclic group (for example, an unsaturated cyclic group or a saturated cyclic group) including at least one fluoro group.

The term “fluorinated non-cyclic group” as used herein refers to a non-cyclic group including at least one fluoro group. The non-cyclic group may be a non-cyclic group including at least one carbon, and examples thereof are a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, and the like. The “fluorinated non-cyclic group” may optionally be further substituted with another group (except a cyclic group) other than a fluoro group or fluorinated group. Examples of the “fluorinated non-cyclic group” are —$CFH_2$, —$CF_2H$, —$CF_3$, and the like.

The term “fluorinated saturated cyclic group” as used herein refers to a saturated cyclic group including at least one fluoro group. The saturated cyclic group may be a saturated cyclic group including at least one carbon, and examples thereof are a $C_3$-$C_{10}$ cycloalkyl group, a $C_1$-$C_{10}$ heterocycloalkyl group, and the like. The “fluorinated saturated cyclic group” may optionally be further substituted with another group (except an unsaturated cyclic group) other than a fluoro group or a fluorinated group. An example of the “fluorinated saturated cyclic group” is a cyclohexyl group substituted with at least one fluoro group.

In an embodiment, $Z_1$, $Z_3$, and $Z_4$ may each independently be:

a fluoro group; or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, or a fluorinated biphenyl group, each unsubstituted or substituted with deuterium, a cyano group, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a $C_1$-$C_{10}$ heterocycloalkyl group, a deuterated heterocycloalkyl group, a phenyl group, a deuterated phenyl group, a biphenyl group, a deuterated biphenyl group, or a combination thereof.

In one or more embodiments, $Z_2$ may be:

a fluoro group; or a fluorinated $C_1$-$C_{20}$ alkyl group, a fluorinated $C_3$-$C_{10}$ cycloalkyl group, or a fluorinated $C_1$-$C_{10}$ heterocycloalkyl group, each independently unsubstituted or substituted with deuterium, a cyano group, a $C_1$-$C_{20}$ alkyl group, a deuterated $C_1$-$C_{20}$ alkyl group, a $C_3$-$C_{10}$ cycloalkyl group, a deuterated $C_3$-$C_{10}$ cycloalkyl group, a $C_1$-$C_{10}$ heterocycloalkyl group, a deuterated heterocycloalkyl group, or a combination thereof.

In Formulae 2A and 2B, a1, a3, and a4 indicate the number of $Z_1$, the number of $Z_3$, and the number of $Z_4$, respectively, and may each independently be an integer from 0 to 20. When a1 is 2 or more, two or more of $Z_1$(s) may be identical to or different from each other, when a3 is 2 or more, two or more of $Z_3$(s) may be identical to or different from each other, and when a4 is 2 or more, two or more of $Z_4$(s) may be identical to or different from each other. For example, a1, a3, and a4 may each independently be 0, 1, 2, or 3.

In Formula 2A, a2 indicates the number of $Z_2$, and may be an integer from 0 to 6. When a2 is 2 or more, two or more of $Z_2$(s) may be identical to or different from each other. For example, a2 may be 0, 1, 2, or 3.

In Formulae 2A and 2B, the sum of a1, a2, a3, and a4 may be 1 or more (for example, 1, 2, or 3). That is, the organometallic compound represented by Formula 1 may include at least one of $Z_1$ to $Z_4$.

In an embodiment, in Formula 1, the sum of a1, a2, a3, and a4 may be 1 or 2.

In an embodiment, in Formula 1, i) a1 may be 1, and a2, a3, and a4 may each independently be 0, ii) a2 may be 1 or 2, and a1, a3, and a4 may each independently be 0, iii) a3 may be 1, and a1, a2, and a4 may each independently be 0, iv) a4 may be 1, and a1, a2, and a3 may each independently be 0, v) a2 and a4 may each independently be 1, and a1 and a3 may each independently be 0, or vi) a1 and a2 may each independently be 1, and a3 and a4 may each independently be 0.

In Formulae 2A and 2B, $R_1$ to $R_4$, $R_{29}$, and $R_{30}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, wherein $Q_1$ to $Q_9$ may each be the same as described herein.

In an embodiment, each of $R_1$ to $R_4$, $R_{29}$, and $R_{30}$ may not include a fluoro group.

In an embodiment, a substituent of the "substituted $C_1$-$C_{60}$ alkyl group", which can be one of $R_1$ to $R_4$, $R_{29}$, and $R_{30}$, may each independently be:

deuterium, —$CD_3$, —$CD_2H$, —$CDH_2$, a cyano group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —$CD_3$, —$CD_2H$, —$CDH_2$, a cyano group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, or a $C_1$-$C_{10}$ heterocycloalkenyl group, each unsubstituted or substituted with deuterium, —$CD_3$, —$CD_2H$, —$CDH_2$, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a heterocycloalkenyl group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof; or —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$.

In an embodiment, $R_1$ to $R_4$, $R_{29}$, and $R_{30}$ may each independently be:

hydrogen, deuterium, or a cyano group;

a $C_1$-$C_{20}$ alkyl group unsubstituted or substituted with deuterium, a cyano group, a $C_3$-$C_{10}$ cycloalkyl group, a deuterated $C_3$-$C_{10}$ cycloalkyl group, a ($C_1$-$C_{20}$ alkyl) $C_3$-$C_{10}$ cycloalkyl group, a deuterated ($C_1$-$C_{20}$ alkyl) $C_3$-$C_{10}$ cycloalkyl group, a $C_1$-$C_{10}$ heterocycloalkyl group, a deuterated heterocycloalkyl group, a ($C_1$-$C_{20}$ heterocycloalkyl group, a deuterated ($C_1$-$C_{20}$ heterocycloalkyl group, a phenyl group, a deuterated phenyl group, a ($C_1$-$C_{20}$ alkyl)phenyl group, a deuterated ($C_1$-$C_{20}$ alkyl)phenyl group, a biphenyl group, a deuterated biphenyl group, a ($C_1$-$C_{20}$ alkyl)biphenyl group, a deuterated ($C_1$-$C_{20}$ alkyl)biphenyl group, or a combination thereof;

a $C_3$-$C_{10}$ cycloalkyl group, a $C_1$-$C_{10}$ heterocycloalkyl group, a phenyl group, or a biphenyl group, each independently unsubstituted or substituted with deuterium, a cyano group, a $C_1$-$C_{20}$ alkyl group, a deuterated $C_1$-$C_{20}$ alkyl group, a $C_1$-$C_{20}$ alkoxy group, a deuterated $C_1$-$C_{20}$ alkoxy group, a $C_3$-$C_{10}$ cycloalkyl group, a deuterated a $C_3$-$C_{10}$ cycloalkyl group, a ($C_1$-$C_{20}$ alkyl)$C_3$-$C_{10}$ cycloalkyl group, a deuterated ($C_1$-$C_{20}$ alkyl)$C_3$-$C_{10}$ cycloalkyl group, a $C_1$-$C_{10}$ heterocycloalkyl group, a deuterated heterocycloalkyl group, a ($C_1$-$C_{20}$ heterocycloalkyl group, a deuterated ($C_1$-$C_{20}$ alkyl)

$C_1$-$C_{10}$ heterocycloalkyl group, a phenyl group, a deuterated phenyl group, a ($C_1$-$C_{20}$ alkyl)phenyl group, a deuterated ($C_1$-$C_{20}$ alkyl)phenyl group, a biphenyl group, a deuterated biphenyl group, a ($C_1$-$C_{20}$ alkyl) biphenyl group, a deuterated ($C_1$-$C_{20}$ alkyl)biphenyl group, or a combination thereof; or —Si($Q_3$)($Q_4$)($Q_5$) or —Ge($Q_3$)($Q_4$)($Q_5$).

In an embodiment, $R_1$ to $R_4$, $R_{29}$, and $R_{30}$ may each independently be:

hydrogen, deuterium, or a cyano group;

a $C_1$-$C_{20}$ alkyl group unsubstituted or substituted with deuterium, a cyano group, a $C_3$-$C_{10}$ cycloalkyl group, a deuterated $C_3$-$C_{10}$ cycloalkyl group, a ($C_1$-$C_{20}$ alkyl) $C_3$-$C_{10}$ cycloalkyl group, a deuterated ($C_1$-$C_{20}$ alkyl) $C_3$-$C_{10}$ cycloalkyl group, a $C_1$-$C_{10}$ heterocycloalkyl group, a deuterated heterocycloalkyl group, a ($C_1$-$C_{20}$ heterocycloalkyl group, a deuterated ($C_1$-$C_{20}$ alkyl)$C_1$-$C_{10}$ heterocycloalkyl group, or a combination thereof;

a $C_3$-$C_{10}$ cycloalkyl group, a $C_1$-$C_{10}$ heterocycloalkyl group, a phenyl group, or a biphenyl group, each independently unsubstituted or substituted with deuterium, a cyano group, a $C_1$-$C_{20}$ alkyl group, a deuterated $C_1$-$C_{20}$ alkyl group, a $C_1$-$C_{20}$ alkoxy group, a deuterated $C_1$-$C_{20}$ alkoxy group, a $C_3$-$C_{10}$ cycloalkyl group, a deuterated a $C_3$-$C_{10}$ cycloalkyl group, a ($C_1$-$C_{20}$ alkyl)$C_3$-$C_{10}$ cycloalkyl group, a deuterated ($C_1$-$C_{20}$ alkyl)$C_3$-$C_{10}$ cycloalkyl group, a $C_1$-$C_{10}$ heterocycloalkyl group, a deuterated heterocycloalkyl group, a ($C_1$-$C_{20}$ alkyl)$C_1$-$C_{10}$ heterocycloalkyl group, a deuterated ($C_1$-$C_{20}$ alkyl)$C_1$-$C_{10}$ heterocycloalkyl group, a phenyl group, a deuterated phenyl group, a ($C_1$-$C_{20}$ alkyl) phenyl group, a deuterated ($C_1$-$C_{20}$ alkyl)phenyl group, a biphenyl group, a deuterated biphenyl group, a ($C_1$-$C_{20}$ alkyl)biphenyl group, a deuterated ($C_1$-$C_{20}$ alkyl) biphenyl group, or a combination thereof; or —Si($Q_3$)($Q_4$)($Q_5$) or —Ge($Q_3$)($Q_4$)($Q_5$).

In an embodiment, in Formulae 2A and 2B, $R_1$ to $R_4$, $R_{29}$, and $R_{30}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each independently substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl) cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl) cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each independently unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a (phenyl)$C_1$-$C_{10}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl) cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl) cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or —$N(Q_1)(Q_2)$, —$Ge(Q_3)(Q_4)(Q_5)$, —$B(Q_6)(Q_7)$, —$P(=O)(Q_8)(Q_9)$, or —$P(Q_8)(Q_9)$, wherein Qi to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each independently unsubstituted or substituted with deuterium, a $C_1$-$C_{10}$ alkyl group, a phenyl group, or a combination thereof.

In Formulae 2A and 2B, b1, b3, and b4 indicate the number of $R_1$, the number of $R_3$, and the number of $R_4$, respectively, and may each independently be an integer from 0 to 20. When b1 is two or more, two or more of $R_1$(s) may be identical to or different from each other, and when b3 is two or more, two or more of $R_3$(s) may be identical to or different from each other, and when b4 is two or more, two or more of $R_4$(s) may be identical to or different from each other. For example, b1, b3, and b4 may each independently be an integer from 0 to 8.

In Formula 2A, b2 indicates the number of $R_2$, and may be an integer from 0 to 6. When b2 is 2 or more, two or more of $R_2$(s) may be identical to or different from each other. For example, b2 may be 0, 1, 2, or 3.

When i) none of $T_1$ to $T_8$ in Formula 2A is N, ii) a2 in Formula 2A is not 0, and iii) $Z_2$ in Formula 2A is a fluoro group, then a) b3 in Formula 2B may not be 0, and b) at least one of $R_3$(s) in the number of b3 in Formula 2B may be —$Si(Q_3)(Q_4)(Q_5)$ or —$Ge(Q_3)(Q_4)(Q_5)$, wherein $Q_3$ to $Q_5$ may each independently be the same as described herein.

For example, $Q_3$ to $Q_5$ may each independently be:

a $C_1$-$C_{60}$ alkyl group unsubstituted or substituted with deuterium, a $C_1$-$C_{60}$ alkyl group, a $C_6$-$C_{60}$ aryl group, or a combination thereof; or a $C_6$-$C_{60}$ alkyl group unsubstituted or substituted with deuterium, a $C_1$-$C_{60}$ alkyl group, or a $C_6$-$C_{60}$ aryl group, or a combination thereof.

In an embodiment, $Q_3$ to $Q_5$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each independently unsubstituted or substituted with deuterium, a $C_1$-$C_{10}$ alkyl group, a phenyl group, or a combination thereof.

In an embodiment, $Q_3$ to $Q_5$ may be identical to each other.

In an embodiment, two or more of $Q_3$ to $Q_5$ may be identical to each other.

In an embodiment, in Formula 2B, b3 may not 0, and at least one of $R_3$(s) in the number of b3 may be —$Si(Q_3)(Q_4)(Q_5)$ or —$Ge(Q_3)(Q_4)(Q_5)$.

In an embodiment, the organometallic compound represented by Formula 1 may include at least one deuterium.

For example, the organometallic compound represented by Formula 1 may satisfy at least one of Condition (1) to Condition (4):

Condition (1)

b1 in Formula 2A is not 0, and at least one of Ri(s) in the number of b1 includes deuterium Condition (2)

b2 in Formula 2A is not 0, and at least one of $R_2$(s) in the number of b2 includes deuterium Condition (3)

b3 in Formula 2B is not 0, and at least one of $R_3$(s) in the number of b3 includes deuterium Condition (4)

b4 in Formula 2B is not 0, and at least one of Ra(s) in the number of b4 includes deuterium.

In an embodiment, in Formulae 2A and 2B, $R_1$ to $R_4$, $R_{29}$, and $R_{30}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$OCH_3$, —$OCDH_2$, —$OCD_2H$, —$OCD_3$, —$SCH_3$, —$SCDH_2$, —$SCD_2H$, —$SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with a fluoro group, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with a fluoro group, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with a fluoro group, a group represented by one of Formulae 10-201 to 10-354, a group represented by one of Formulae 10-201 to 10-354 in which at least one hydrogen is substituted with deuterium, a group represented by one of Formulae 10-201 to 10-354 in which at least one hydrogen is substituted with a fluoro group, —$Si(Q_3)(Q_4)(Q_5)$, or —$Ge(Q_3)(Q_4)(Q_5)$ (wherein $Q_3$ to $Q_5$ may each independently be the same as described herein).

In an embodiment, in Formulae 2A and 2B, $R_1$ to $R_4$, $R_{29}$, and $R_{30}$ may each independently be hydrogen, deuterium, a cyano group, a nitro group, —$CH_3$, —$CD_3$, —$CD_2H$, —$CDH_2$, —$OCH_3$, —$OCDH_2$, —$OCD_2H$, —$OCD_3$, —$SCH_3$, —$SCDH_2$, —$SCD_2H$, —$SCD_3$, a group represented by one of Formulae 9-1 to 9-39, a group represented by one of Formulae 9-1 to 9-39 in which at least one hydrogen is substituted with deuterium, a group represented by one of Formulae 9-201 to 9-230, a group represented by one of Formulae 9-201 to 9-230 in which at least one hydrogen is substituted with deuterium, a group represented by one of Formulae 10-1 to 10-145, a group represented by one of Formulae 10-1 to 10-145 in which at least one hydrogen is substituted with deuterium, a group represented by one of Formulae 10-201 to 10-354, group represented by one of Formulae 10-201 to 10-354 in which at least one hydrogen is substituted with deuterium, —Si($Q_3$)($Q_4$)($Q_5$), or —Ge($Q_3$)($Q_4$)($Q_5$) (wherein $Q_3$ to $Q_5$ may each independently be the same as described herein).

In an embodiment, in Formulae 2A and 2B, $Z_1$, $Z_3$, and $Z_4$ may each independently be —F, —$CF_3$, —$CF_2H$, —$CFH_2$, a group represented by of one of Formulae 9-1 to 9-39 in which at least one hydrogen is substituted with a fluoro group, a group represented by of one of Formulae 9-201 to 9-230 in which at least one hydrogen is substituted with a fluoro group, a group represented by one of Formulae 10-1 to 10-145 in which at least one hydrogen is substituted with a fluoro group, or a group represented by one of Formulae 10-201 to 10-354 in which at least one hydrogen is substituted with a fluoro group.

In an embodiment, in Formula 2A, $Z_2$ may be —F, —$CF_3$, —$CF_2H$, —$CFH_2$, a group represented by one of Formulae 9-1 to 9-39 in which at least one hydrogen is substituted with a fluoro group, a group represented by one of Formulae 9-201 to 9-227 in which at least one hydrogen is substituted with a fluoro group, or a group represented by one of Formulae 10-1 to 10-11 in which at least one hydrogen is substituted with a fluoro group:

9-1
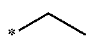
9-2
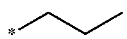
9-3
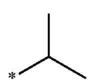
9-4
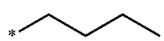
9-5
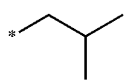
9-6
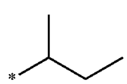
9-7
9-8
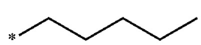
9-9
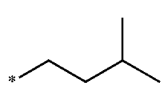
9-10
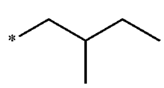
9-11
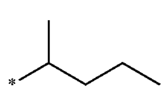
9-12
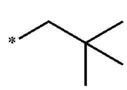

-continued 9-13
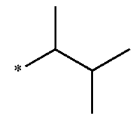
9-14
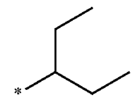
9-15
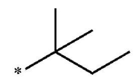
9-16
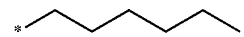
9-17
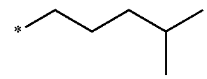
9-18
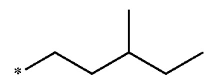
9-19
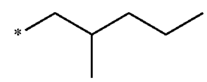
9-20
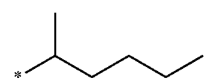
9-21
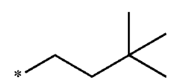
9-22
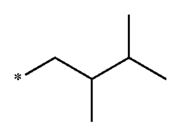
9-23
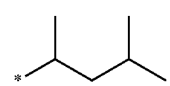
9-24
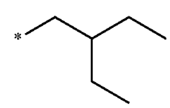
9-25
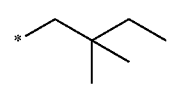
9-26
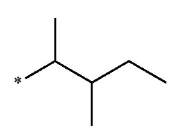
9-27
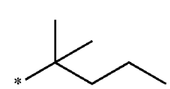
9-28
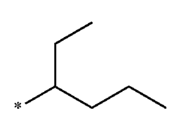

-continued
9-29
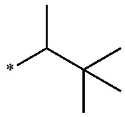
9-30
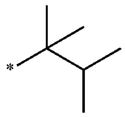
9-31
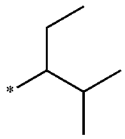
9-32
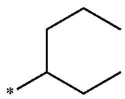
9-33
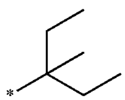
9-34
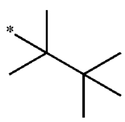
9-35
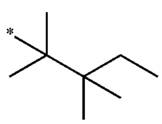
9-36
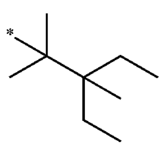
9-37
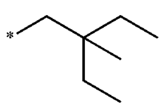
9-38
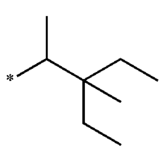
9-39
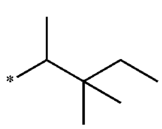
9-201
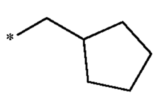
-continued
9-202
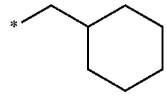
9-203
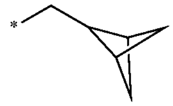
9-204
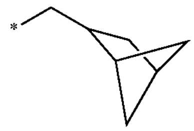
9-205
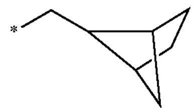
9-206
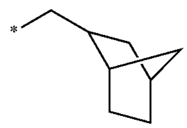
9-207
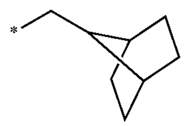
9-208
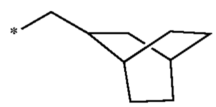
9-209
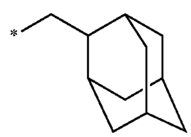
9-210
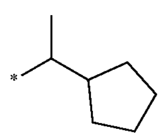
9-211
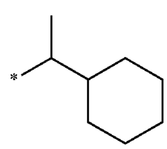
9-212
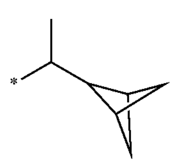

-continued
9-213
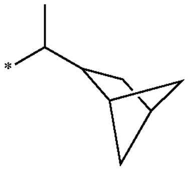
9-214
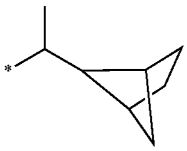
9-215
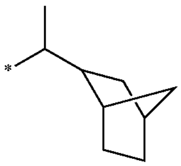
9-216
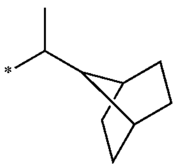
9-217
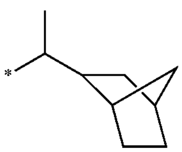
9-218
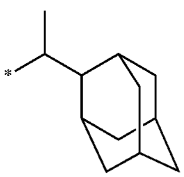
9-219
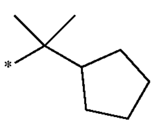
9-220
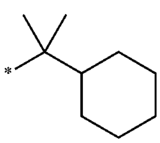
9-221
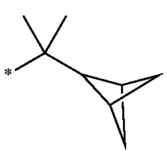
9-222
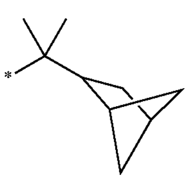
-continued
9-223
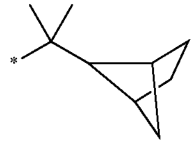
9-224
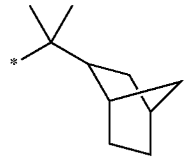
9-225
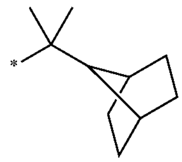
9-226
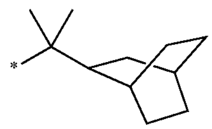
9-227
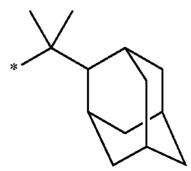
9-228
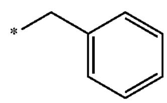
9-229
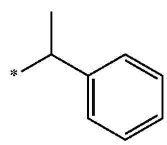
9-230
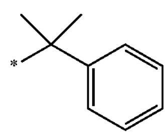
10-1
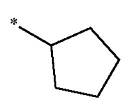
10-2
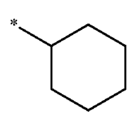
10-3
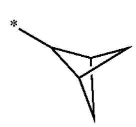

-continued
10-4
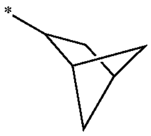
10-5
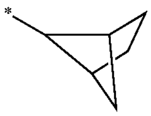
10-6
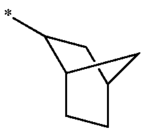
10-7
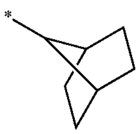
10-8
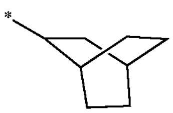
10-9
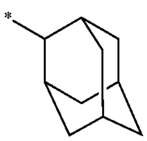
10-10
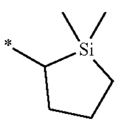
10-11
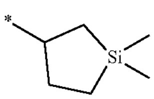
10-12
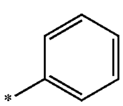
10-13
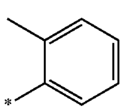
10-14
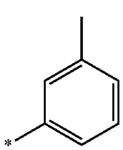
10-15
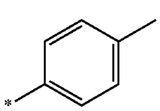
-continued
10-16
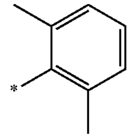
10-17
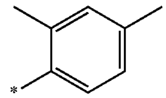
10-18
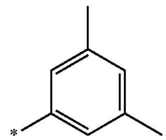
10-19
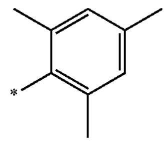
10-20
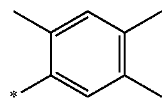
10-21
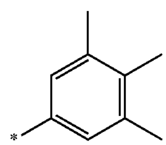
10-22
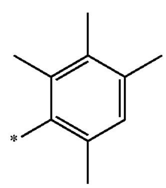
10-23
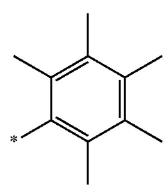
10-24
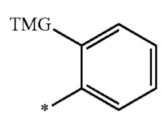
10-25
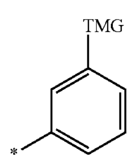
10-26
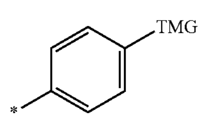

-continued
10-27
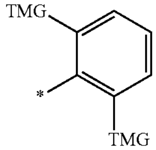
10-28
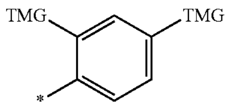
10-29
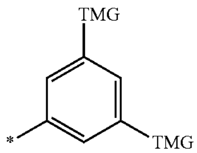
10-30
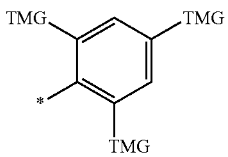
10-31
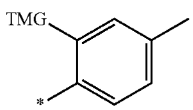
10-32
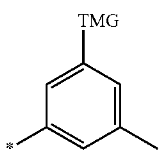
10-33
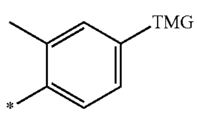
10-34
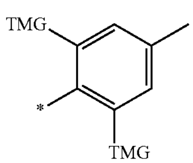
10-35
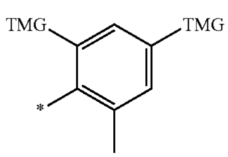
10-36
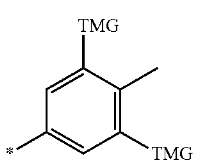
10-37
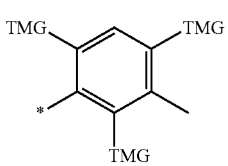
-continued
10-38
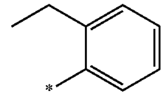
10-39
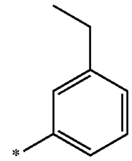
10-40
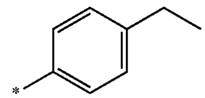
10-41
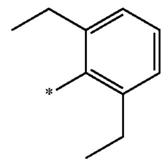
10-42
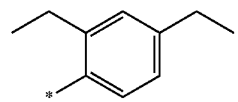
10-43
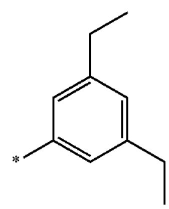
10-44
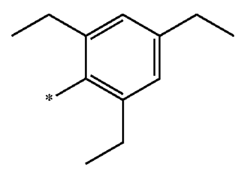
10-45
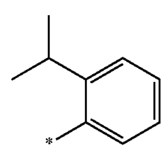
10-46
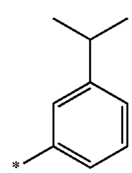
10-47
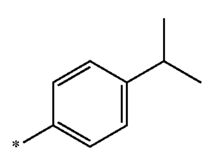

-continued
10-48
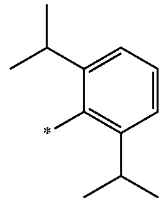
10-49
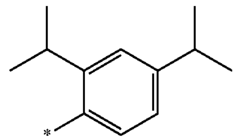
10-50
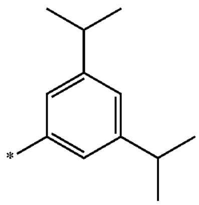
10-51
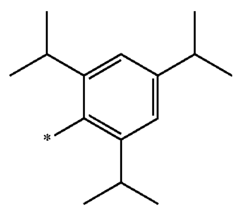
10-52
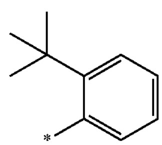
10-53
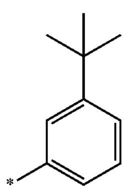
10-54
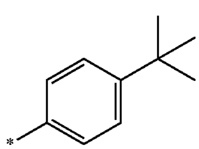
10-55
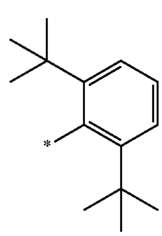
-continued
10-56
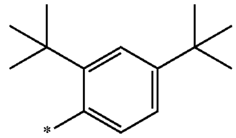
10-57
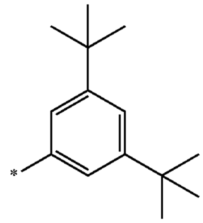
10-58
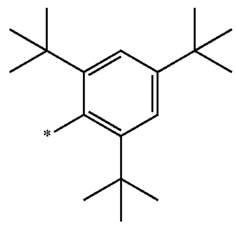
10-59
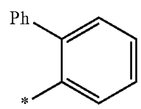
10-60
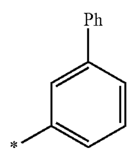
10-61
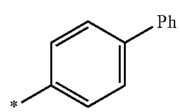
10-62
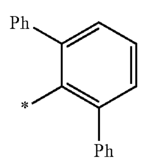
10-63
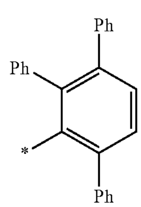
10-64
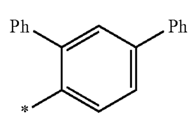

10-65
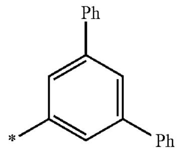
10-66
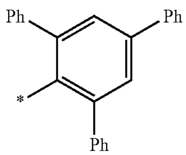
10-67
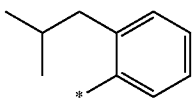
10-68
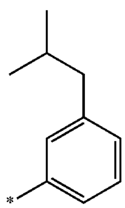
10-69
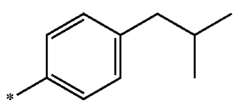
10-70
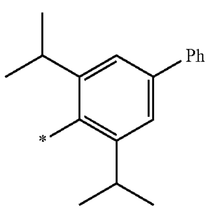
10-71
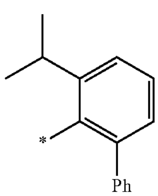
10-72
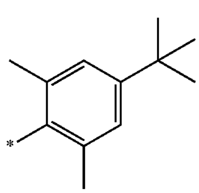
10-73
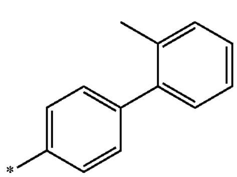
10-74
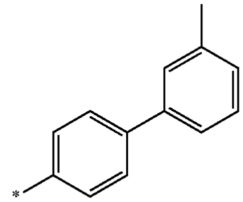
10-75
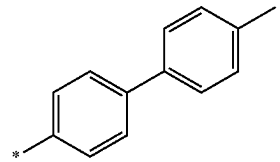
10-76
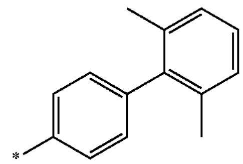
10-77
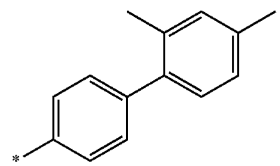
10-78
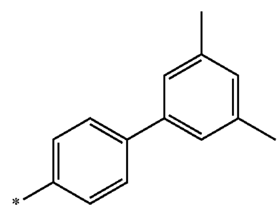
10-79
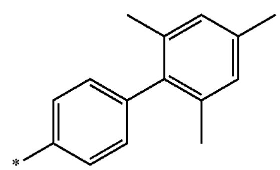
10-80
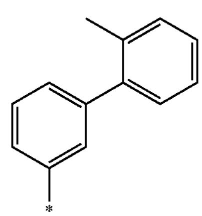
10-81
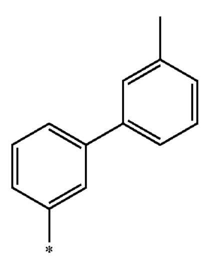

-continued
10-82
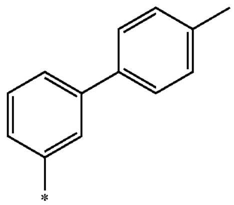
10-83
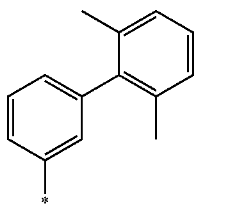
10-84
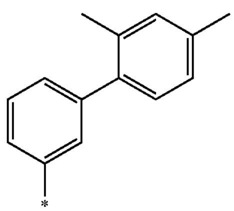
10-85
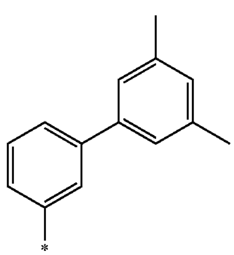
10-86
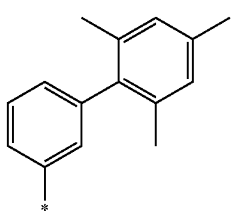
10-87
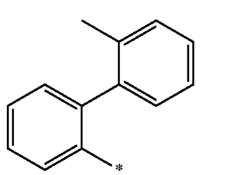
10-88
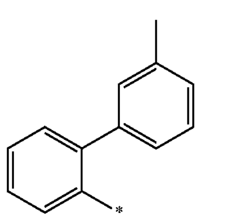
-continued
10-89
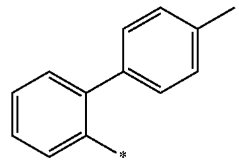
10-90
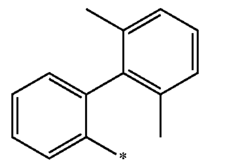
10-1
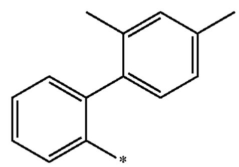
10-92
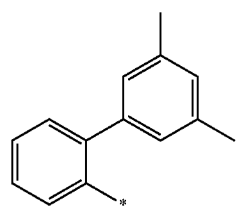
10-93
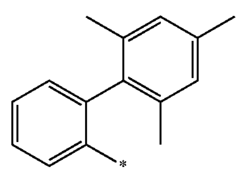
10-94
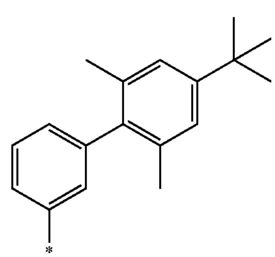
10-95
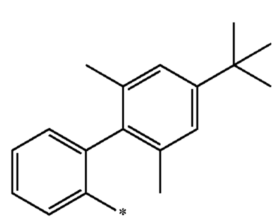
10-96
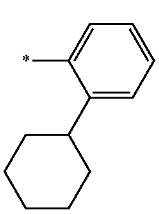

10-97
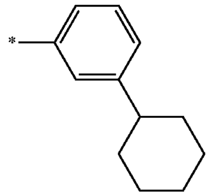
10-98
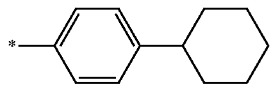
10-99
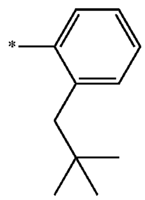
10-100
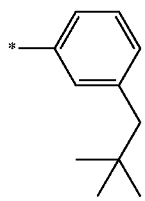
10-101
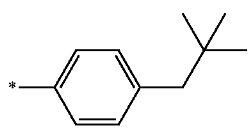
10-102
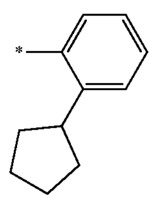
10-103
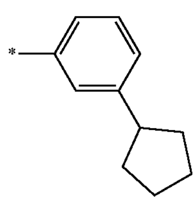
10-104
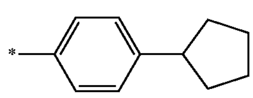
10-105
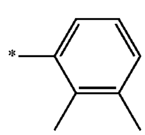
10-106
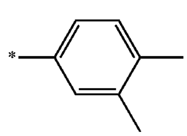
10-107
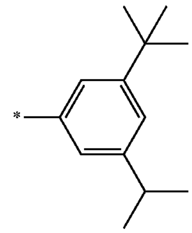
10-108
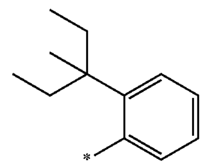
10-109
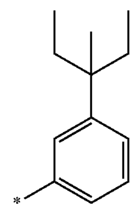
10-110
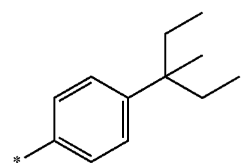
10-111
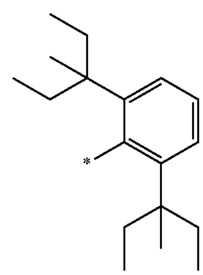
10-112
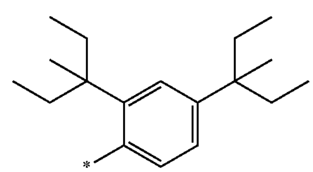
10-113
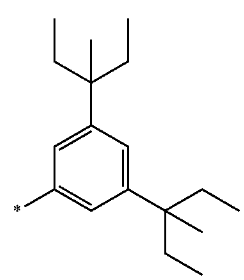

-continued
10-114
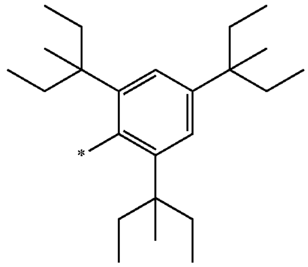
10-115
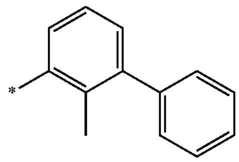
10-116
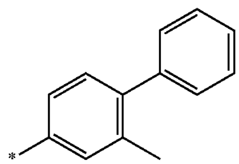
10-117
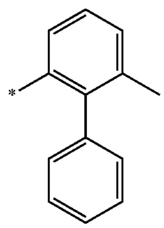
10-118
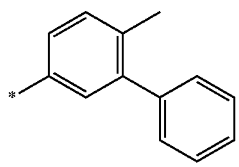
10-119
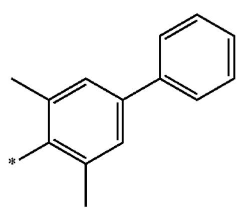
10-120
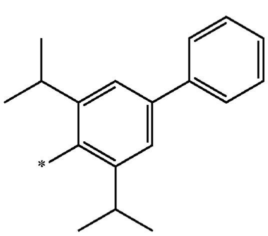
10-121
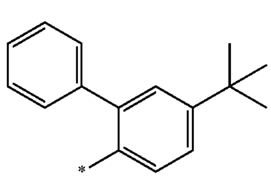
-continued
10-122
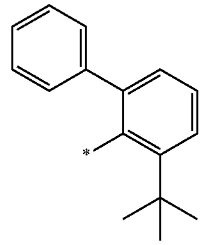
10-123
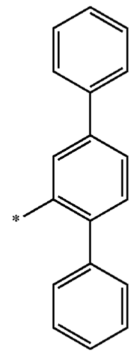
10-124
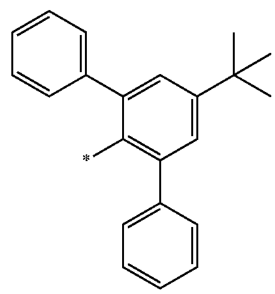
10-125
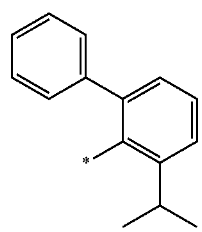
10-126
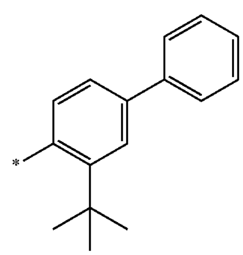
10-127
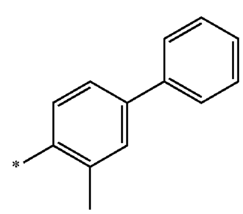

-continued
10-128
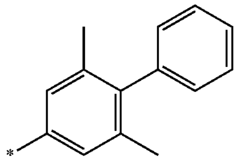
10-129
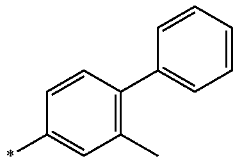
10-130
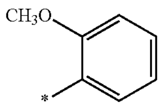
10-131
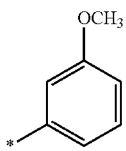
10-132
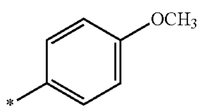
10-133
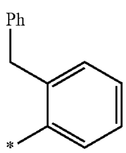
10-134
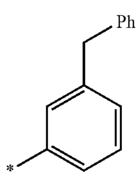
10-135
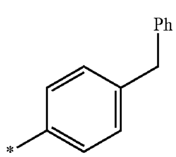
10-136
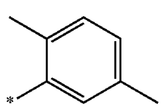
10-137
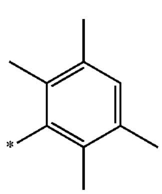
-continued
10-138
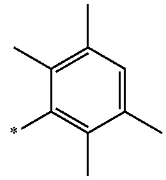
10-139
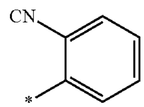
10-140
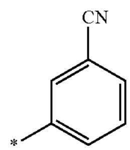
10-141
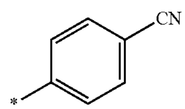
10-142
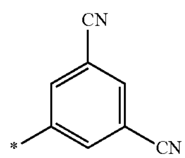
10-143
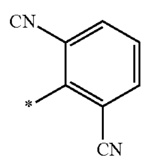
10-144
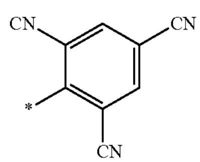
10-145
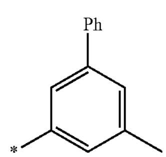
10-201
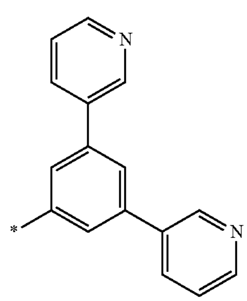

-continued
10-202
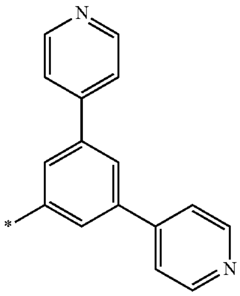
10-203
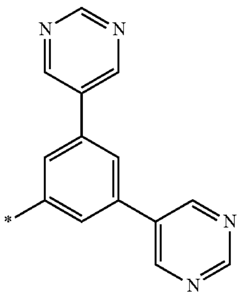
10-204
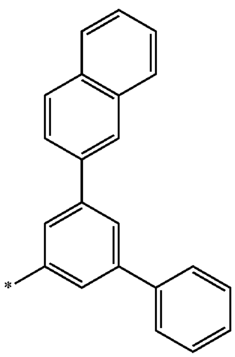
10-205
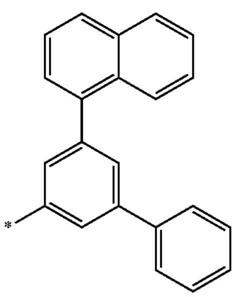
10-206
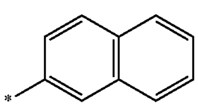
10-207
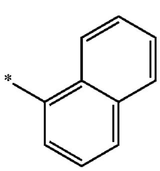
10-208
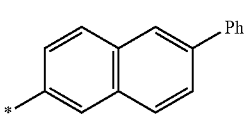
-continued
10-209
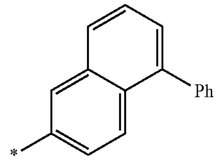
10-210
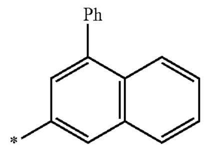
10-211
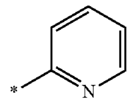
10-212
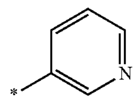
10-213
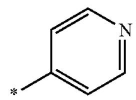
10-214
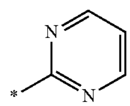
10-215
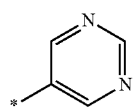
10-216
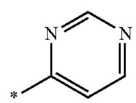
10-217
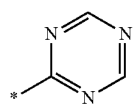
10-218
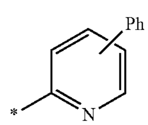
10-219
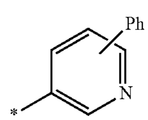
10-220
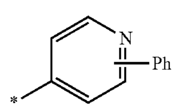
10-221
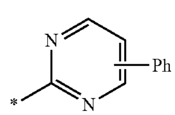

10-222
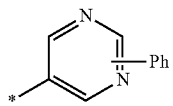
10-223
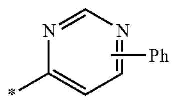
10-224
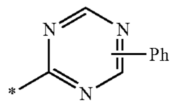
10-225
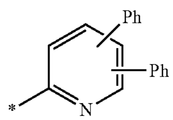
10-226
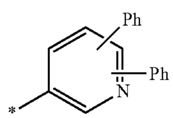
10-227
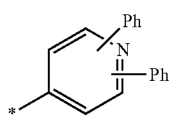
10-228
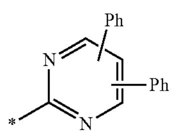
10-229
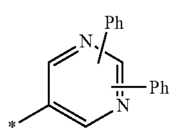
10-230
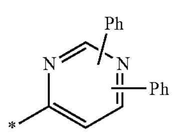
10-231
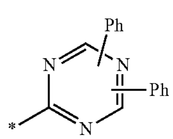
10-232
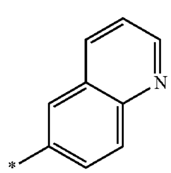
10-233
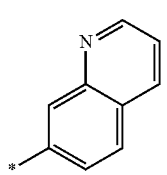
10-234
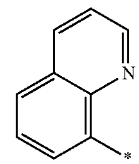
10-235
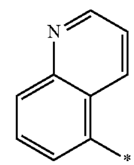
10-236
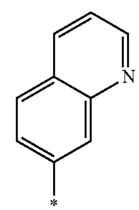
10-237
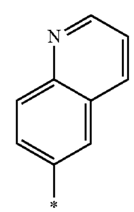
10-238
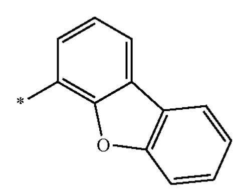
10-239
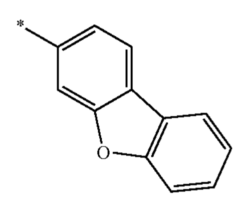
10-240
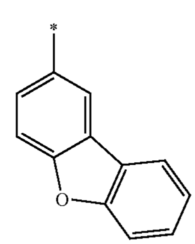

-continued
10-241
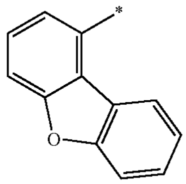
10-242
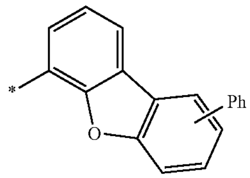
10-243
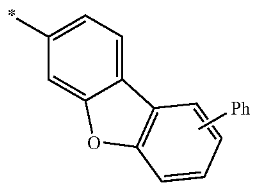
10-244
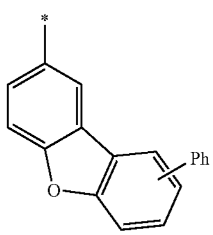
10-245
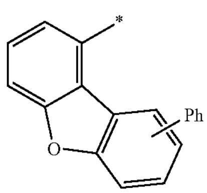
10-246
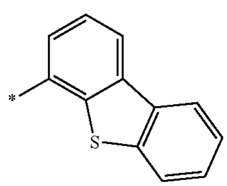
10-247
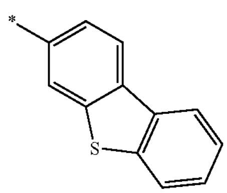
10-248
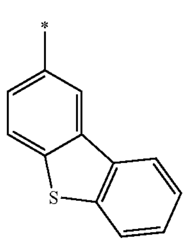
-continued
10-249
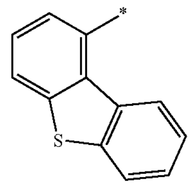
10-250
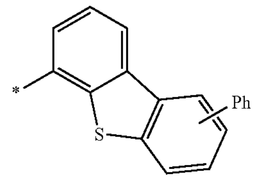
10-251
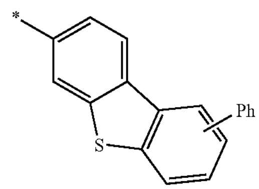
10-252
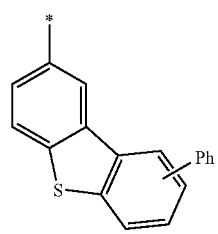
10-253
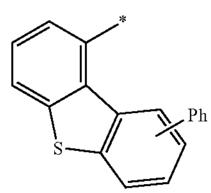
10-254
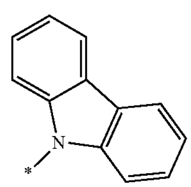
10-255
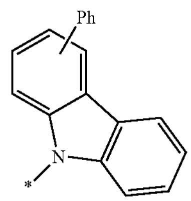
10-256
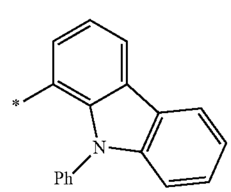

10-257
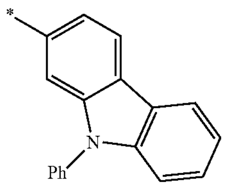
10-258
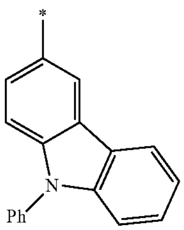
10-259
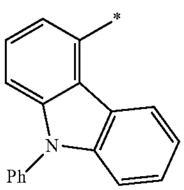
10-260
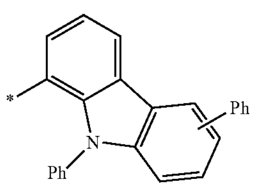
10-261
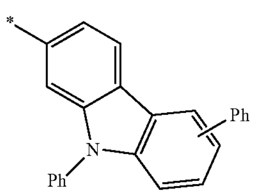
10-262
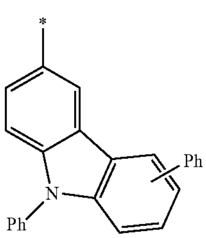
10-263
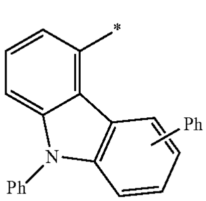
10-264
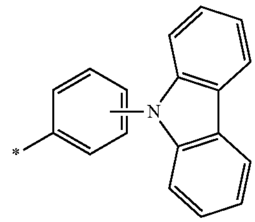
10-265
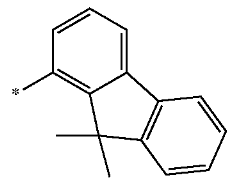
10-266
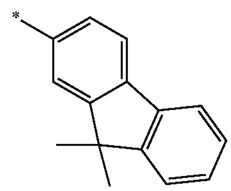
10-267
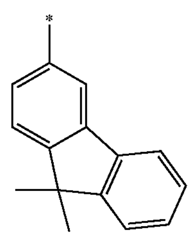
10-268
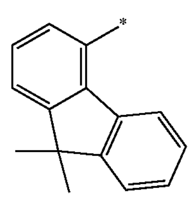
10-269
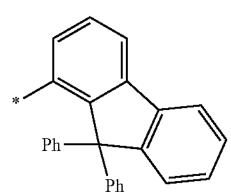
10-270
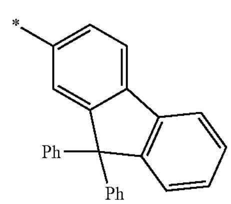

-continued
10-271
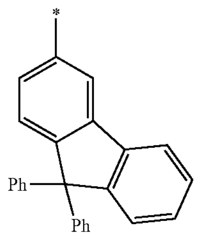
10-272
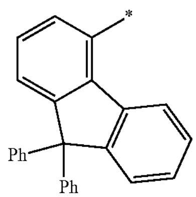
10-273
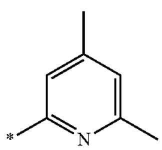
10-274
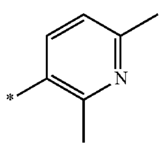
10-275
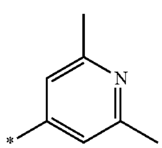
10-276
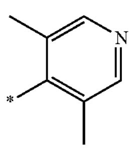
10-277
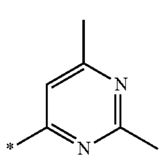
10-278
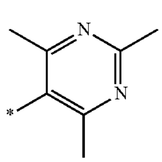
10-279
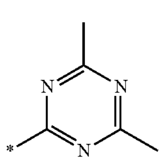
-continued
10-280
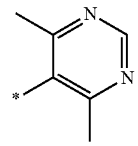
10-281
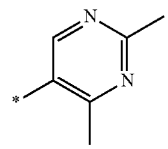
10-282
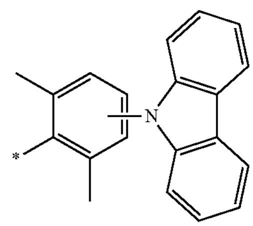
10-283
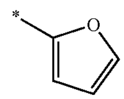
10-284
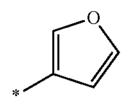
10-285
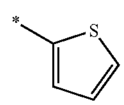
10-286
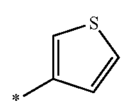
10-287
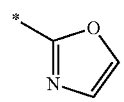
10-288
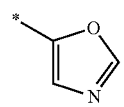
10-289
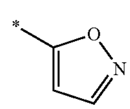
10-290
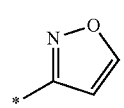
10-291
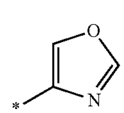
10-292
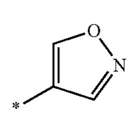

-continued
10-293
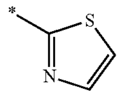
10-294
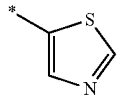
10-295
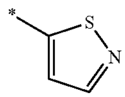
10-296
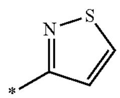
10-297
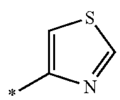
10-298
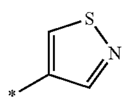
10-299
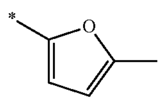
10-300
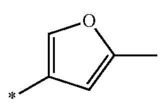
10-301
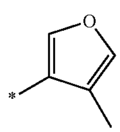
10-302
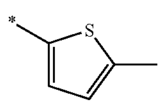
10-303
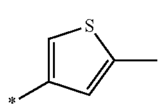
10-304
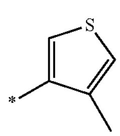
10-305
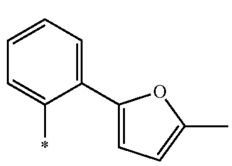
-continued
10-306
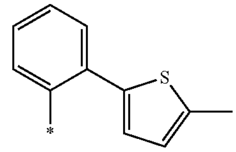
10-307
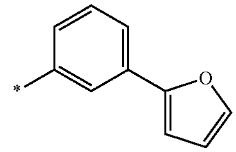
10-308
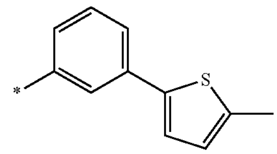
10-309
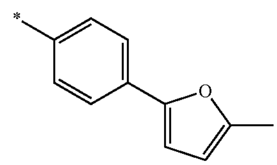
10-310
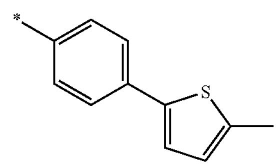
10-311
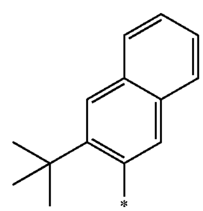
10-312
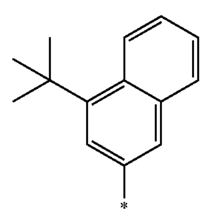
10-313
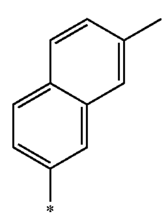

-continued
10-314
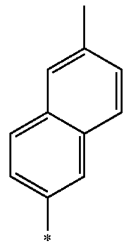
10-315
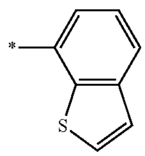
10-316
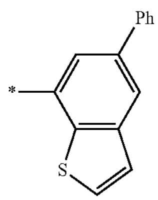
10-317
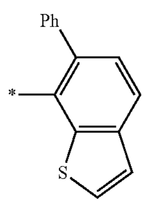
10-318
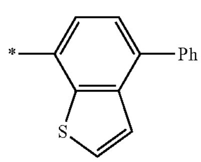
10-319
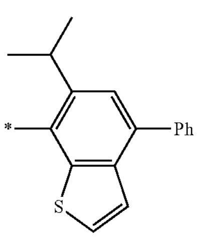
10-320
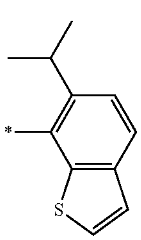
-continued
10-321
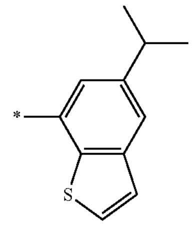
10-322
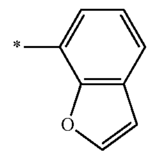
10-323
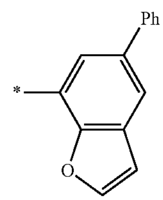
10-324
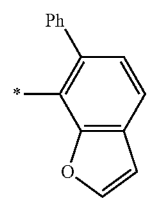
10-325
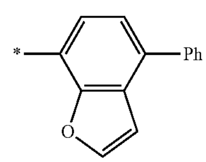
10-326
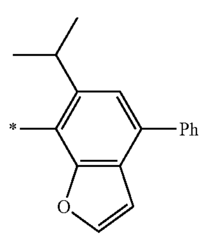
10-327
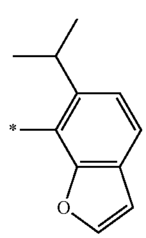

-continued
10-328
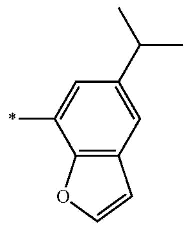
10-329
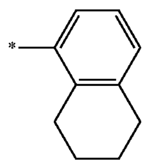
10-330
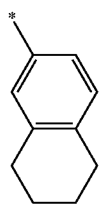
10-331
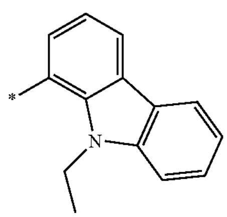
10-332
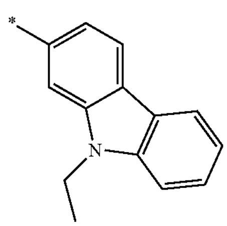
10-333
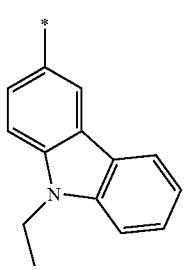
10-334
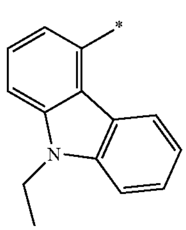
-continued
10-335
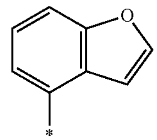
10-336
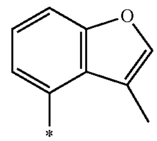
10-337
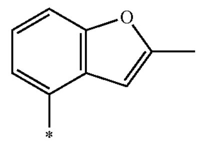
10-338
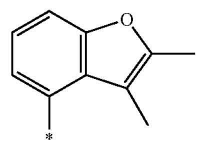
10-339
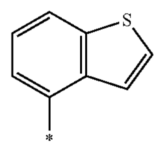
10-340
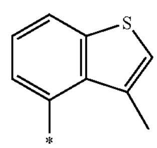
10-341
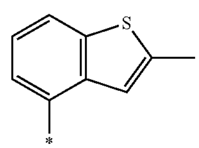
10-342
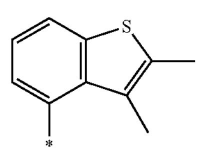
10-343
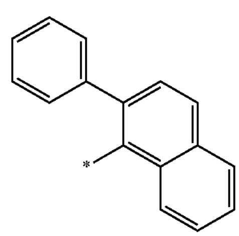
10-344
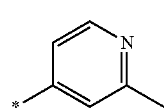

-continued 10-345

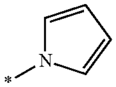

10-346

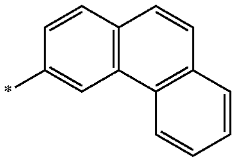

10-347

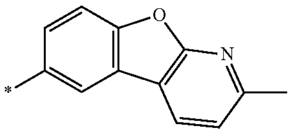

10-348

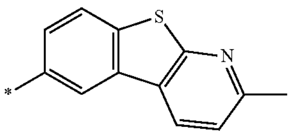

10-349

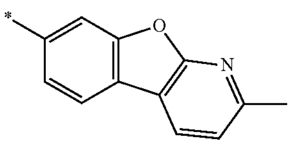

10-350

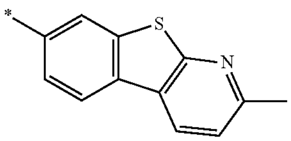

10-351

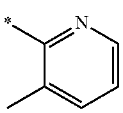

10-352

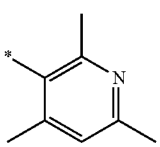

10-353

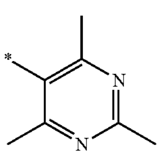

10-354

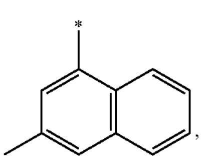

wherein, in Formulae 9-1 to 9-39, 9-201 to 9-230, 10-1 to 10-145, and 10-201 to 10-354, * indicates a binding site to a neighboring atom, Ph indicates a phenyl group, TMS indicates a trimethylsilyl group, TMG indicates a trimethylgermyl group, and OMe indicates a methoxy group.

The "group represented by one of Formulae 9-1 to 9-39 in which at least one hydrogen is substituted with deuterium" and the "group represented by one of Formulae 9-201 to 9-230 in which at least one hydrogen is substituted with deuterium" may be, for example, a group represented by one of Formulae 9-501 to 9-514 and 9-601 to 9-637:

9-501

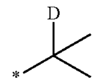

9-502

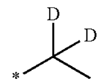

9-503

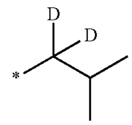

9-504

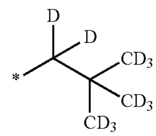

9-505

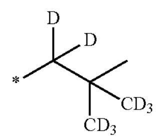

9-506

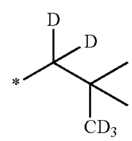

9-507

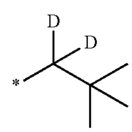

9-508

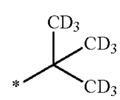

9-509

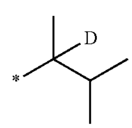

9-510

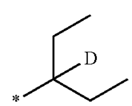

9-511

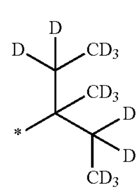

-continued
9-512
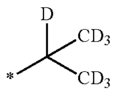
9-513
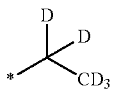
9-514
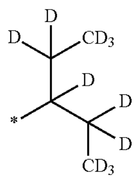
9-601
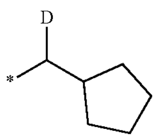
9-602
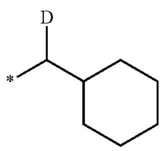
9-603
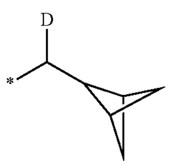
9-604
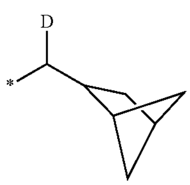
9-605
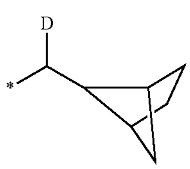
9-606
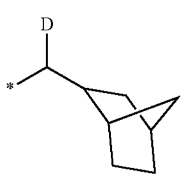
9-607
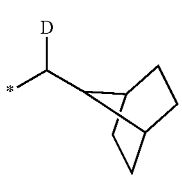
-continued
9-608
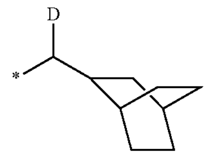
9-609
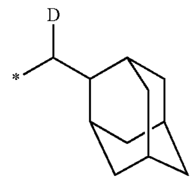
9-610
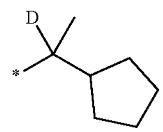
9-611
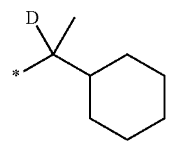
9-612
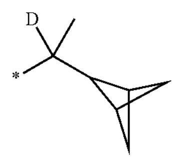
9-613
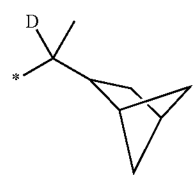
9-614
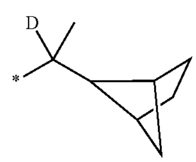
9-615
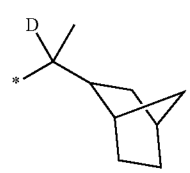
9-616
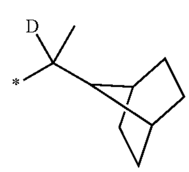
9-617
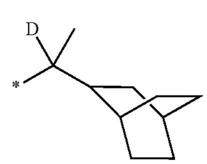

-continued
9-618
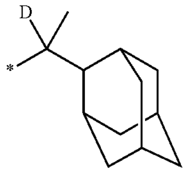
9-619
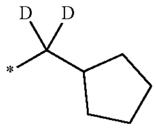
9-620
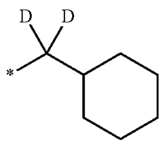
9-621
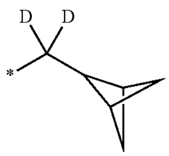
9-622
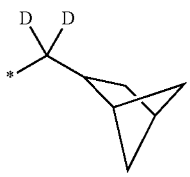
9-623
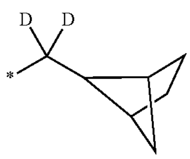
9-624
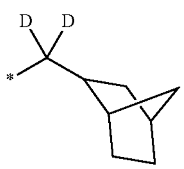
9-625
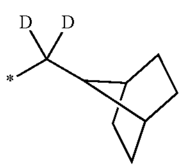
9-626
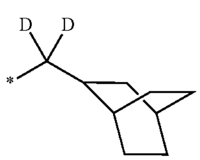
-continued
9-627
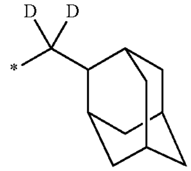
9-628
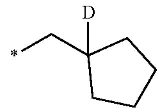
9-629
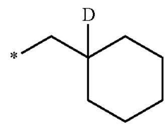
9-630
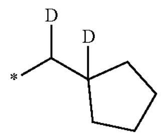
9-631
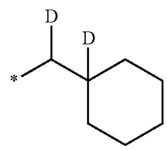
9-632
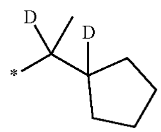
9-633
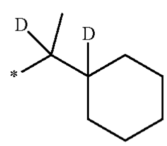
9-634
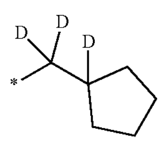
9-635
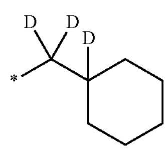
9-636
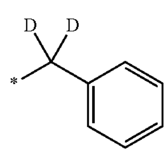

-continued 9-637

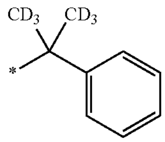

wherein * indicates a binding site to a neighboring atom.

The "group represented by one of Formulae 9-1 to 9-39 in which at least one hydrogen is substituted with a fluoro group" and the "group represented by one of Formulae 9-201 to 9-230 in which at least one hydrogen is substituted with a fluoro group" may be, for example, a group represented by one of Formulae 9-701 to 9-710:

9-701

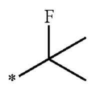

9-702

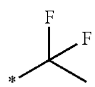

9-703

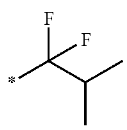

9-704

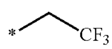

9-705

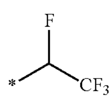

9-706

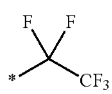

9-707

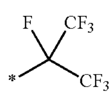

9-708

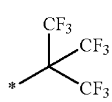

9-709

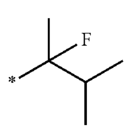

9-710

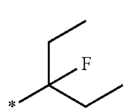

, wherein * indicates a binding site to a neighboring atom.

The "group represented by one of Formulae 10-1 to 10-145 in which at least one hydrogen is substituted with deuterium" and the "group represented by one of Formulae 10-201 to 10-354 in which at least one hydrogen is substituted with deuterium" may be, for example, a group represented by one of Formulae 10-501 to 10-553:

10-501

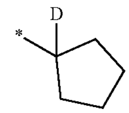

10-502

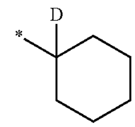

10-503

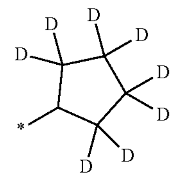

10-504

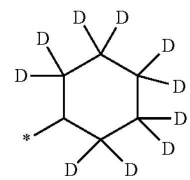

10-505

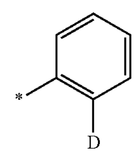

10-506

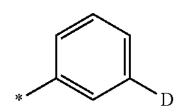

10-507

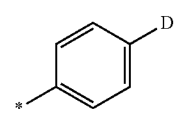

10-508

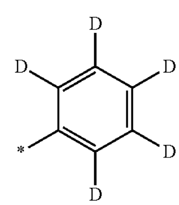

10-509

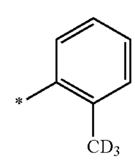

10-510

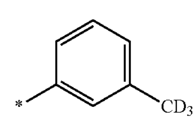

10-511

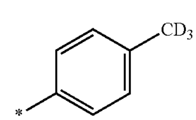

-continued
10-512
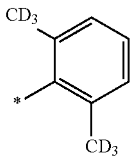
10-513
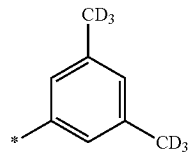
10-514
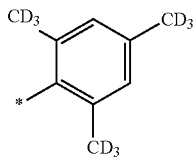
10-515
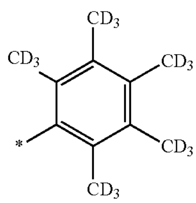
10-516
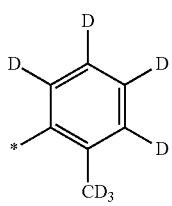
10-517
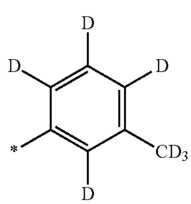
10-518
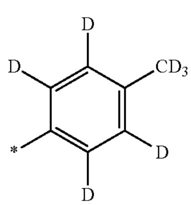
10-519
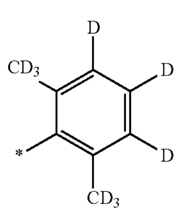
-continued
10-520
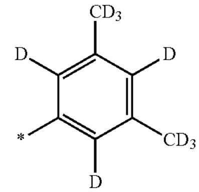
10-521
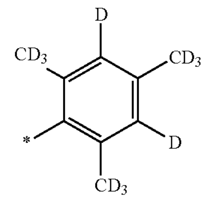
10-522
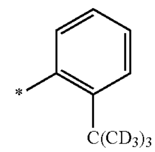
10-523
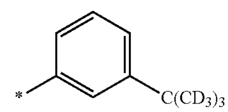
10-524
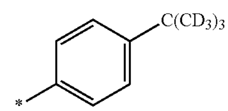
10-525
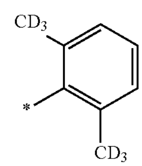
10-526
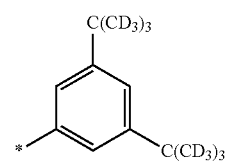
10-517
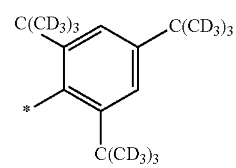
10-528
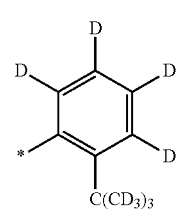

-continued
10-529
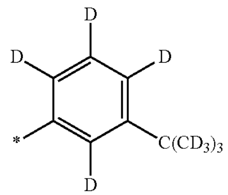
10-530
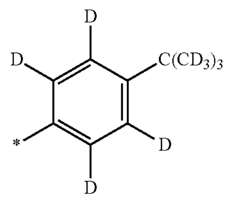
10-531
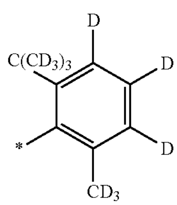
10-532
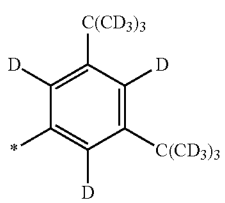
10-533
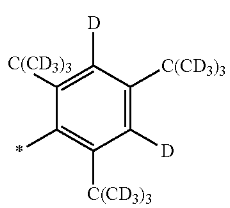
10-534
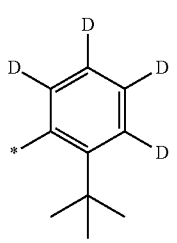
10-535
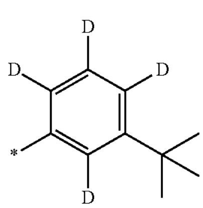
-continued
10-536
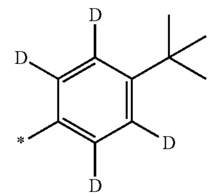
10-537
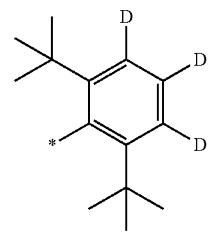
10-538
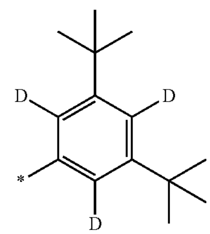
10-540
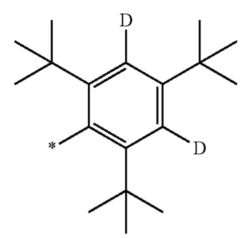
10-541
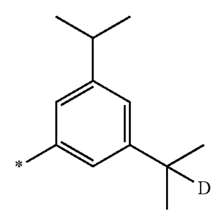
10-542
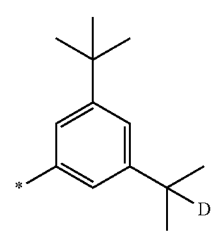
10-543
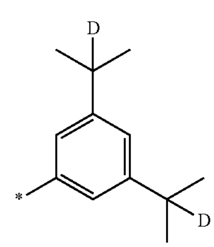

-continued
10-544
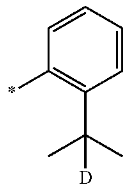
10-545
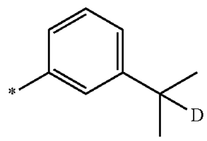
10-546
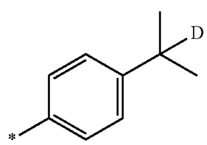
10-547
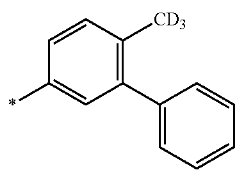
10-548
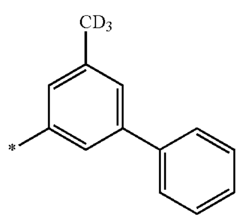
10-549
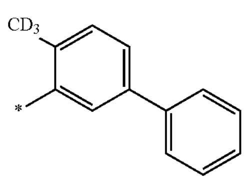
10-550
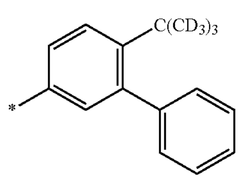
10-551
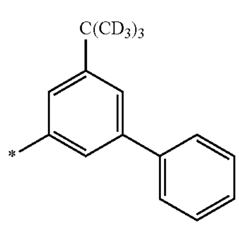
-continued
10-552
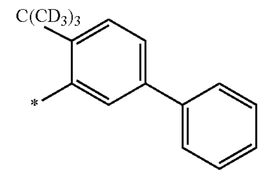
10-553
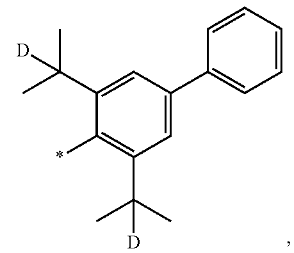
wherein * indicates a binding site to a neighboring atom.
The "group represented by one of Formulae 10-1 to 10-145 in which at least one hydrogen is substituted with a fluoro group" and the "group represented by Formulae 10-201 to 10-354 in which at least one hydrogen is substituted with a fluoro group" may be, for example, a group represented by one of Formulae 10-601 to 10-636:
10-601
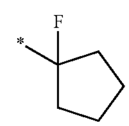
10-602
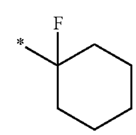
10-603
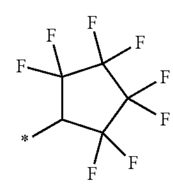
10-604
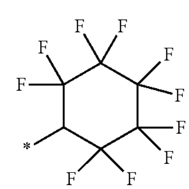
10-605
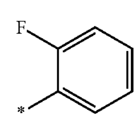
10-606
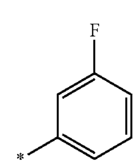

-continued
10-607
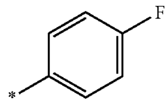
10-608
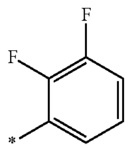
10-609
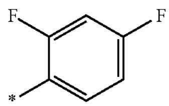
10-610
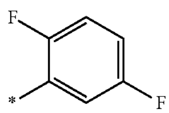
10-611
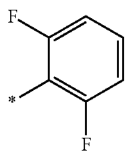
10-612
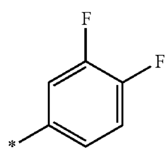
10-613
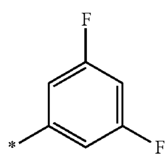
10-614
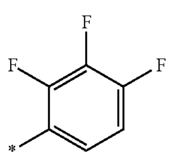
10-615
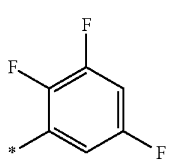
10-616
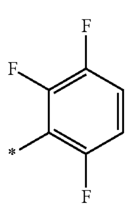
10-617
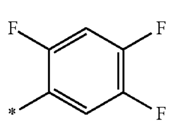
-continued
10-618
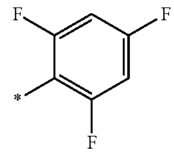
10-619
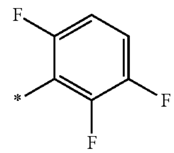
10-620
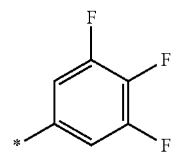
10-621
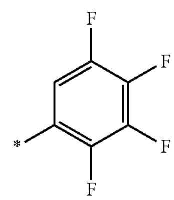
10-622
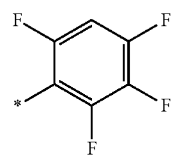
10-623
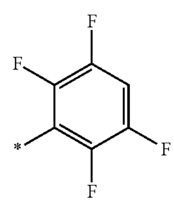
10-624
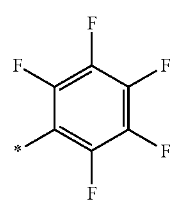
10-625
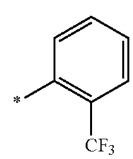
10-626
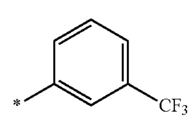

-continued 10-627

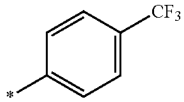

10-628

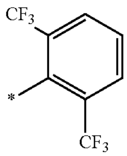

10-629

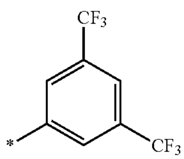

10-630

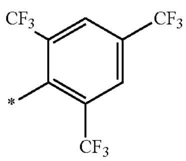

10-631

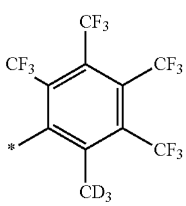

10-632

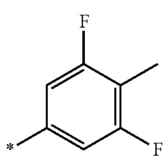

10-633

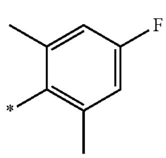

10-634

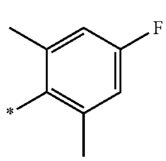

10-635

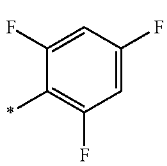

-continued 10-636

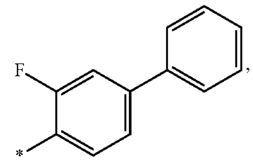

wherein * indicates a binding site to a neighboring atom.

In Formulae 2A and 2B, i) two or more of a plurality of $R_1$(s) may optionally be linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of $R_2$(s) may optionally be linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iii) two or more of a plurality of $R_3$(s) may optionally be linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and iv) two or more of a plurality of Ra(s) may optionally be linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, wherein $R_{10a}$ may be the same as described in connection with $R_1$.

In Formulae 2A and 2B, * and *' each indicate a binding site to M in Formula 1.

In an embodiment, a group represented by

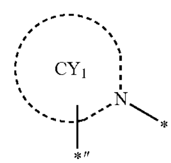

in Formula 2A may be a group represented by one of Formulae CY1(1) to CY1(22):

CY1(1)

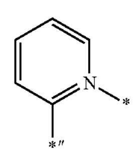

CY1(2)

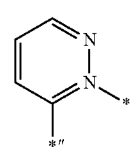

CY1(3)

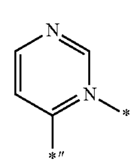

CY1(4)
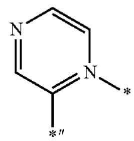
CY1(5)
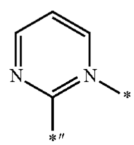
CY1(6)
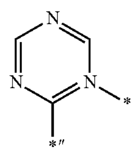
CY1(7)
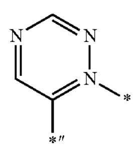
CY1(8)
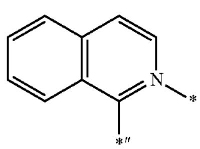
CY1(9)
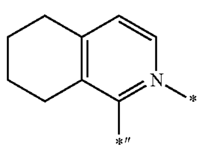
CY1(10)
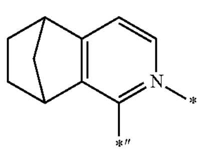
CY1(11)
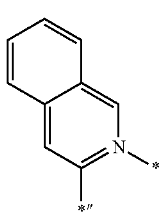
CY1(12)
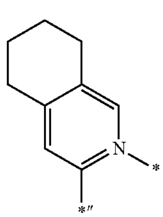
CY1(13)
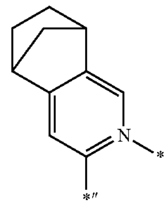
CY1(14)
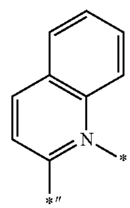
CY1(15)
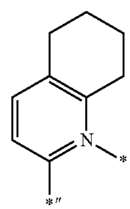
CY1(16)
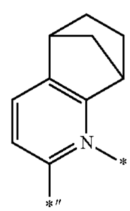
CY1(17)
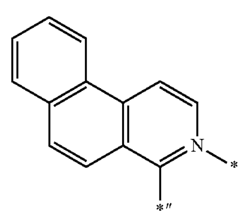
CY1(18)
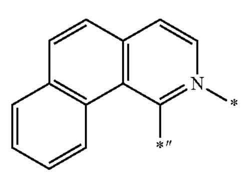
CY1(19)
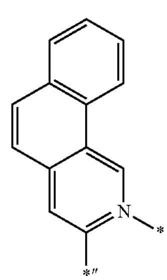

-continued
CY1(20)
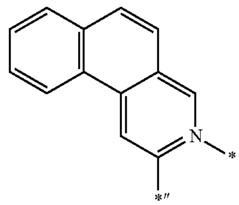
CY1(21)
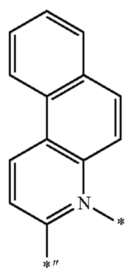
CY1(22)
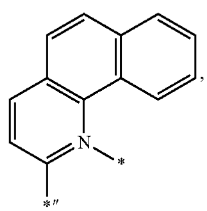
wherein, in Formulae CY1(1) to CY1(22), * indicates a binding site to M in Formula 1, and *" indicates a binding site to a neighboring carbon atom in Formula 2A.
In an embodiment, a group represented by
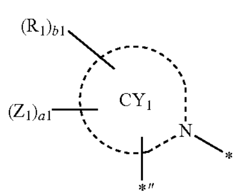
in Formula 2A may be a group represented by one of Formulae CY1-1 to CY1-16 and CY1-1F to CY1-32F:
CY1-1
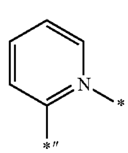
CY1-2
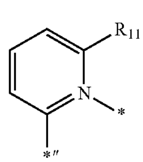
-continued
CY1-3
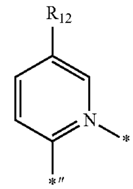
CY1-4
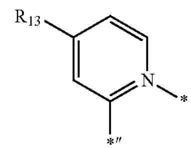
CY1-5
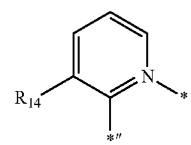
CY1-6
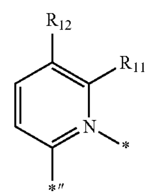
CY1-7
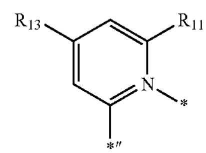
CY1-8
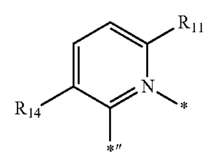
CY1-9
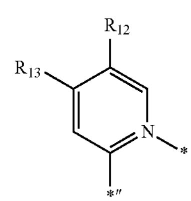
CY1-10
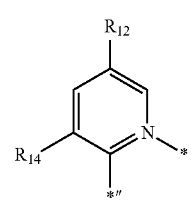
CY1-11
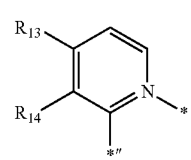

-continued
CY1-12
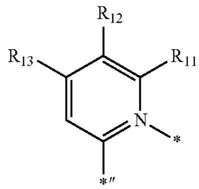
CY1-13
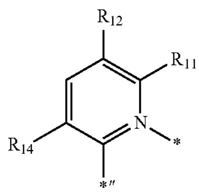
CY1-14
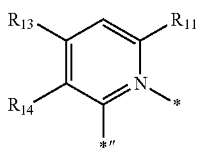
CY1-15
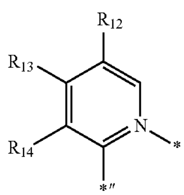
CY1-16
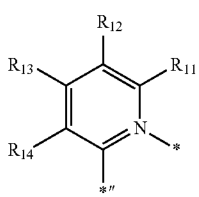
CY1-1F
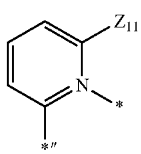
CY1-2F
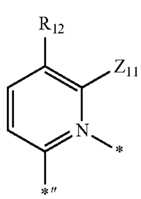
CY1-3F
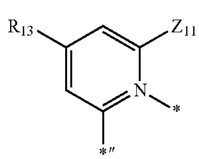
CY1-4F
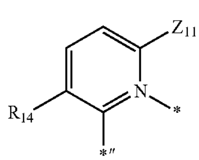
-continued
CY1-5F
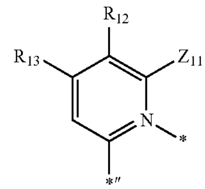
CY1-6F
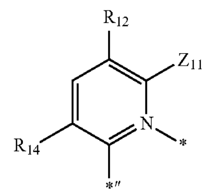
CY1-7F
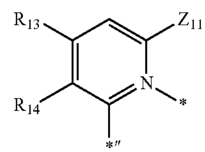
CY1-8F
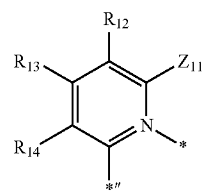
CY1-9F
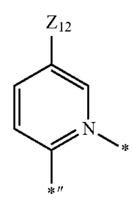
CY1-10F
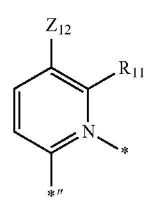
CY1-11F
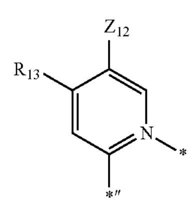
CY1-12F
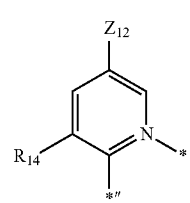

-continued
CY1-13F
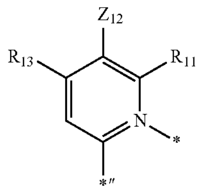
CY1-14F
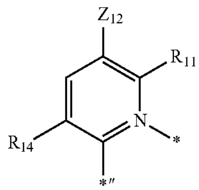
CY1-15F
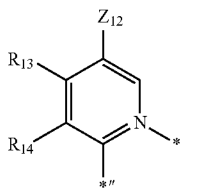
CY1-16F
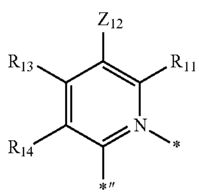
CY1-17F
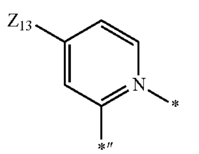
CY1-18F
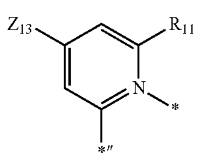
CY1-19F
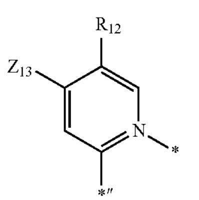
CY1-20F
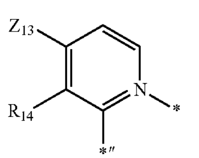
-continued
CY1-21F
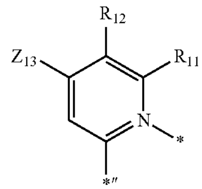
CY1-22F
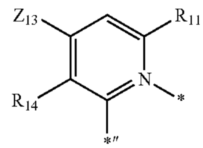
CY1-23F
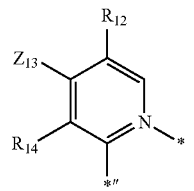
CY1-24F
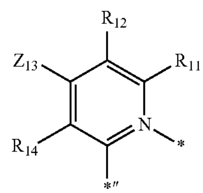
CY1-25F
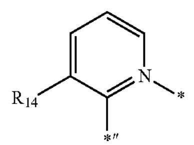
CY1-26F
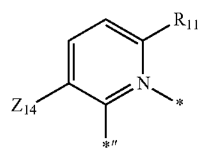
CY1-27F
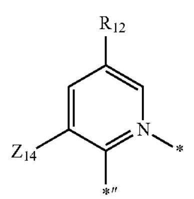
CY1-28F
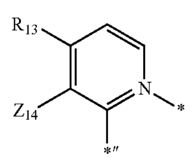
CY1-29F
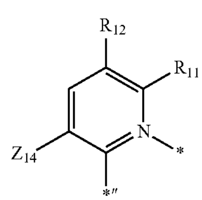

-continued

CY1-30F

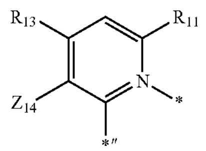

CY1-31F

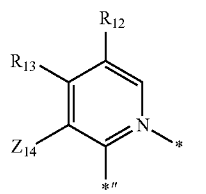

CY1-32F

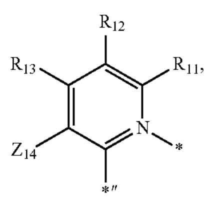

wherein, in Formulae CY1-1 to CY1-16 and CY1-1F to CY1-32F, $Z_{11}$ to $Z_{14}$ may each be the same as described in connection with $Z_1$, $R_{11}$ to $R_{14}$ may each be the same as described in connection with $R_1$, wherein each of $R_{11}$ to $R_{14}$ may not be hydrogen, indicates a binding site to M in Formula 1, and " indicates a binding site to a neighboring carbon atom in Formula 2A.

In an embodiment, a group represented by

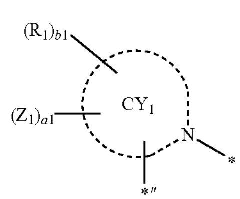

in Formula 2A may be a group represented by one of Formulae CY1(8) to CY1(22).

In an embodiment, a group represented by

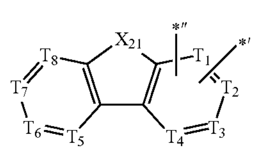

in Formula 2A may be a group represented by one of Formulae CY2-1 to CY2-6:

CY2-1

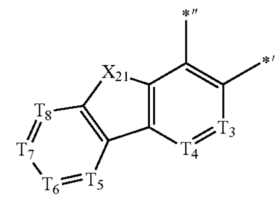

CY2-2

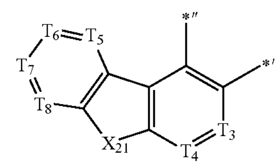

CY2-3

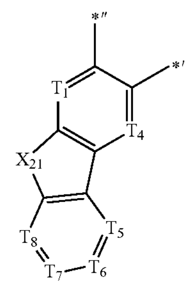

CY2-4

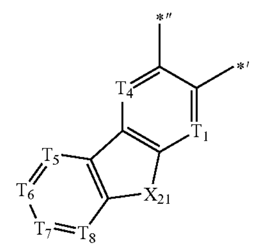

CY2-5

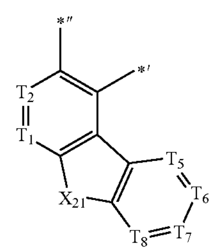

CY2-6

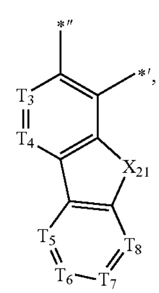

wherein, in Formulae CY2-1 to CY2-6, *' indicates a binding site to M in Formula 1, and *" indicates a binding site to ring $CY_1$ in Formula 2A.

In an embodiment, in Formulae CY2-1 to CY2-6, each of $T_1$ to $T_8$ may be C.

In an embodiment, in Formulae CY2-1 to CY2-6, $T_8$ may be N, and each of $T_1$ to $T_7$ may be C.
In an embodiment, a group represented by
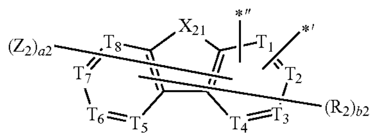
in Formula 2A may be a group represented by one of Formulae CY2-1-1 to CY2-1-22, CY2-1-1N to CY2-1-16N, CY2-4-1 to CY2-4-22, CY2-4-1N to CY2-4-16N, CY2-1-1F to CY2-1-21F, CY2-1-1NF to CY2-1-15NF, CY2-4-1F to CY2-4-21F, and CY2-4-1NF to CY2-4-15NF:
CY2-1-1
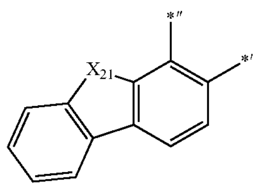
CY2-1-2
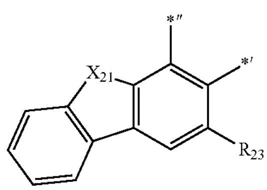
CY2-1-3
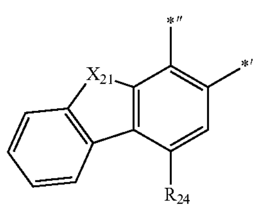
CY2-1-4
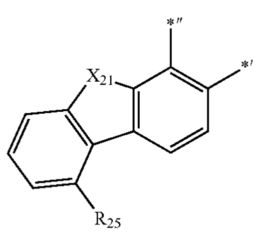
CY2-1-5
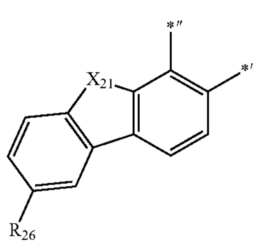
-continued
CY2-1-6
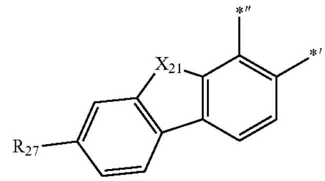
CY2-1-7
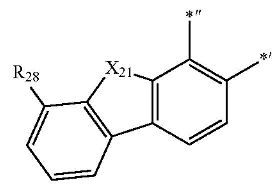
CY2-1-8
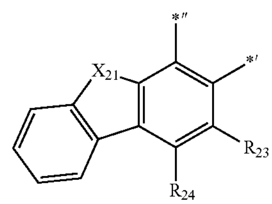
CY2-1-9
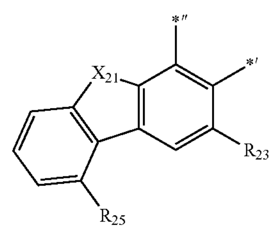
CY2-1-10
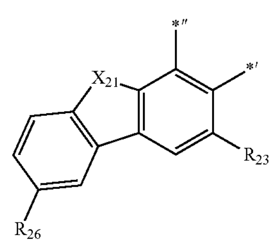
CY2-1-11
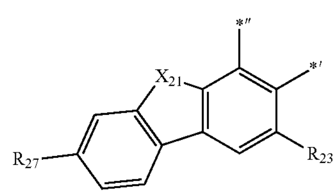
CY2-1-12
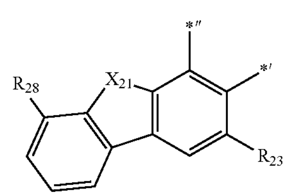

CY2-1-13
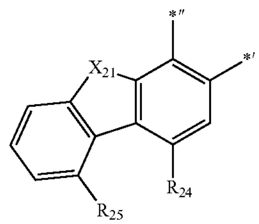
CY2-1-14
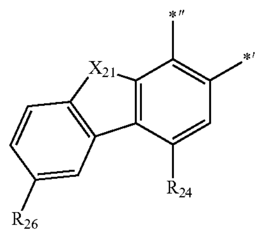
CY2-1-15
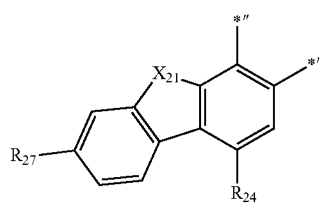
CY2-1-16
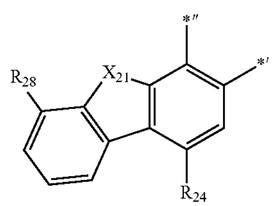
CY2-1-17
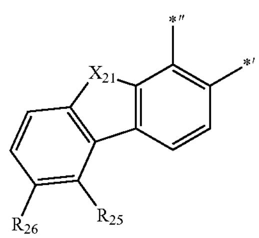
CY2-1-18
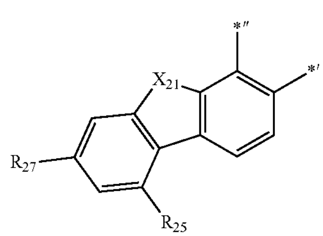
CY2-1-19
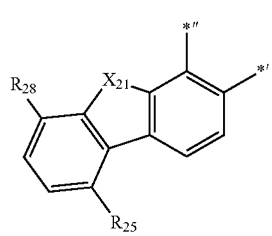
CY2-1-20
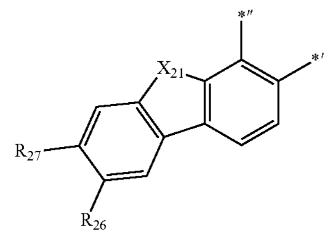
CY2-1-21
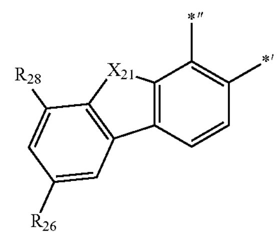
CY2-1-22
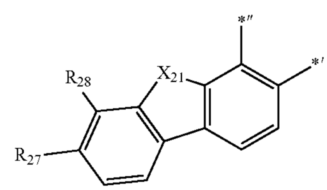
CY2-1-1N
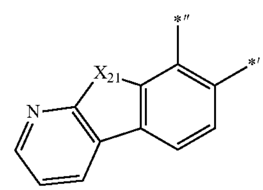
CY2-1-2N
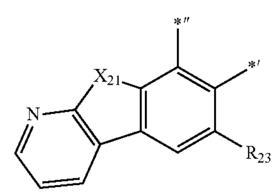
CY2-1-3N
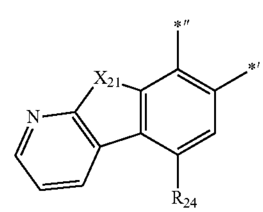
CY2-1-4N
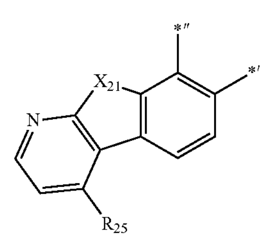

CY2-1-5N
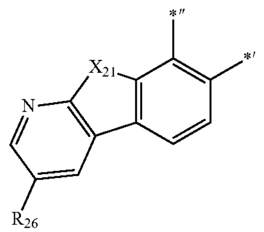
CY2-1-6N
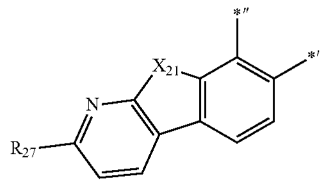
CY2-1-7N
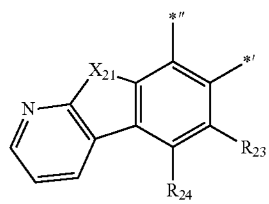
CY2-1-8N
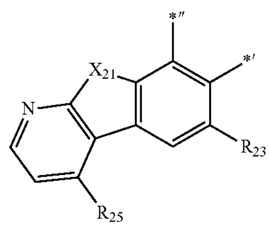
CY2-1-9N
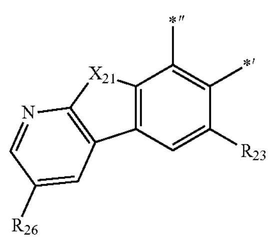
CY2-1-10N
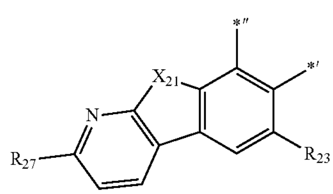
CY2-1-11N
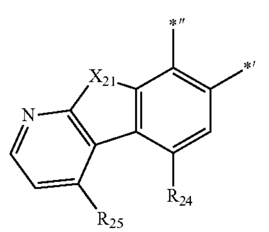
CY2-1-12N
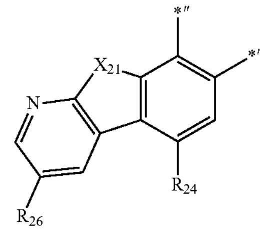
CY2-1-13N
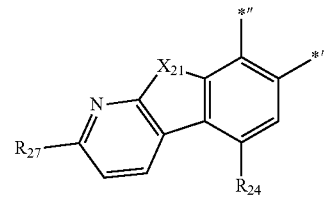
CY2-1-14N
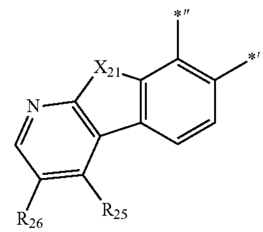
CY2-1-15N
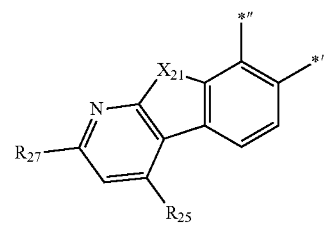
CY2-1-16N
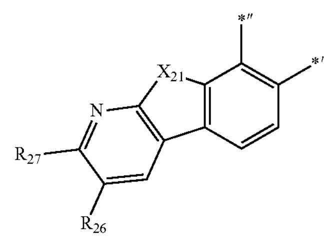
CY2-4-1
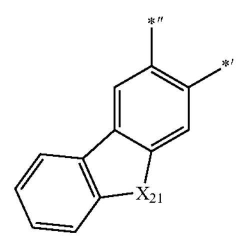
CY2-4-2
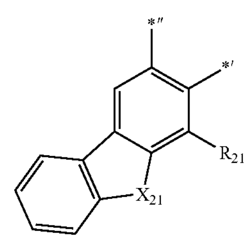

-continued
CY2-4-3
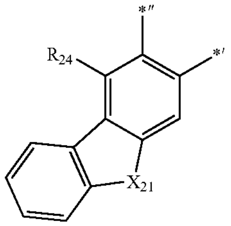
CY2-4-4
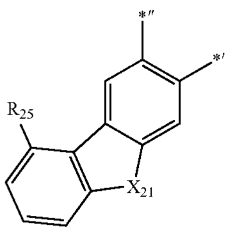
CY2-4-5
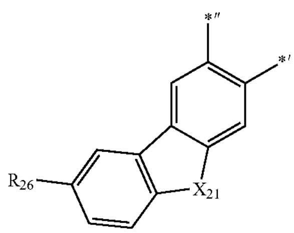
CY2-4-6
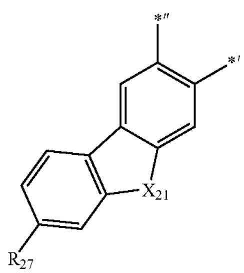
CY2-4-7
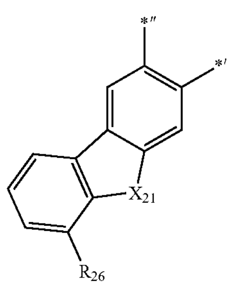
CY2-4-8
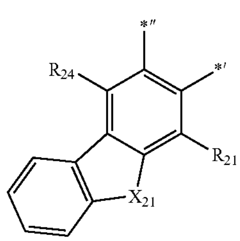
-continued
CY2-4-9
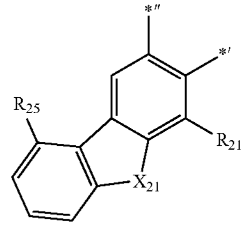
CY2-4-10
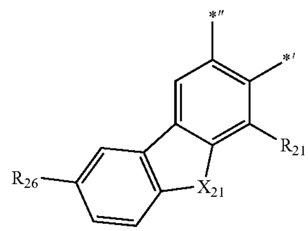
CY2-4-11
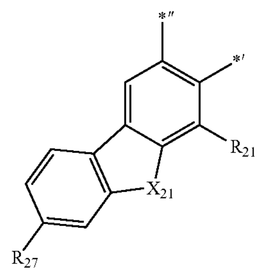
CY2-4-12
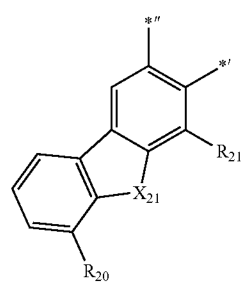
CY2-4-13
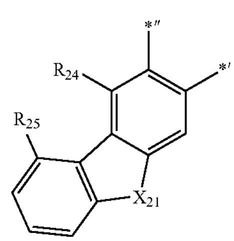
CY2-4-14
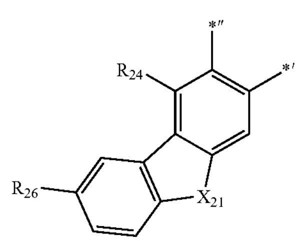

-continued
CY2-4-15
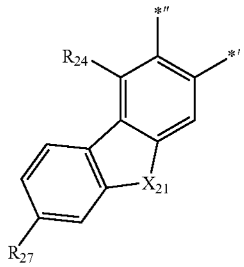
CY2-4-16
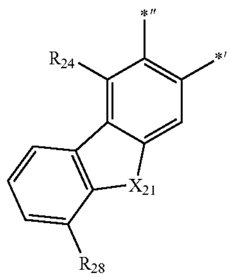
CY2-4-17
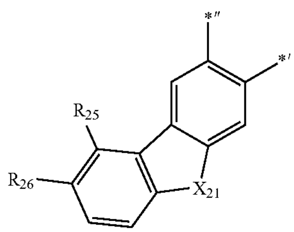
CY2-4-18
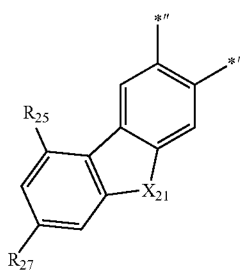
CY2-4-19
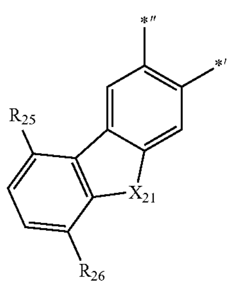
CY2-4-20
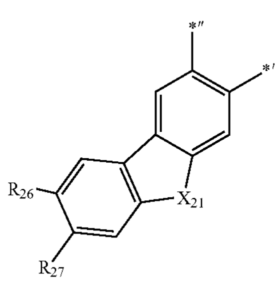
-continued
CY2-4-21
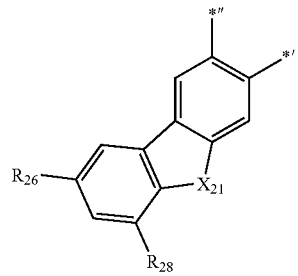
CY2-4-22
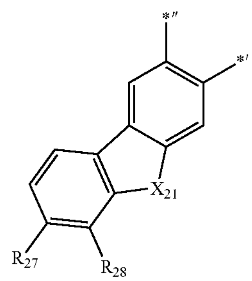
CY2-4-1N
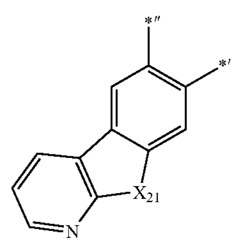
CY2-4-2N
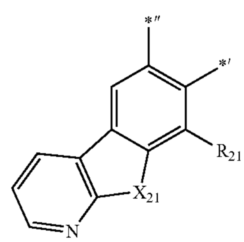
CY2-4-3N
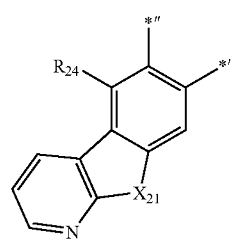
CY2-4-4N
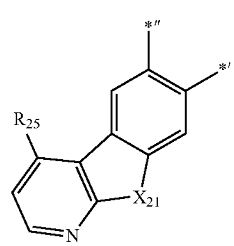

-continued
CY2-4-5N
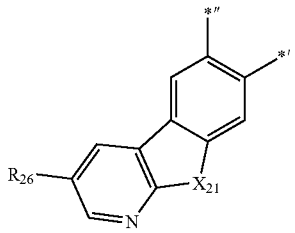
CY2-4-6N
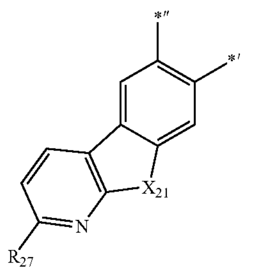
CY2-4-7N
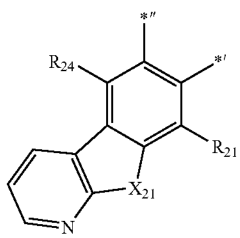
CY2-4-8N
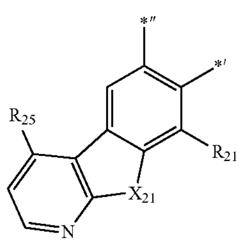
CY2-4-9N
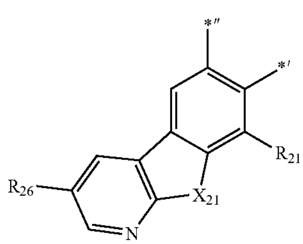
CY2-4-10N
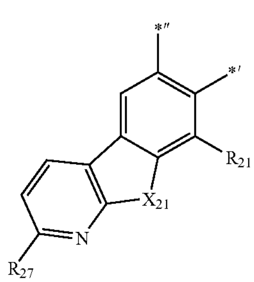
-continued
CY2-4-11N
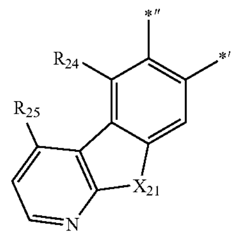
CY2-4-12N
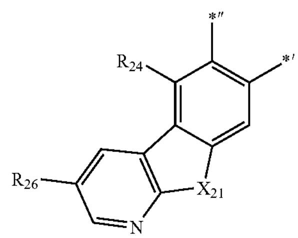
CY2-4-13N
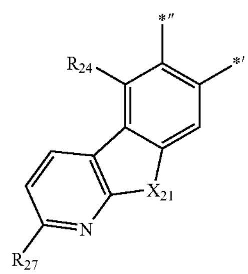
CY2-4-14N
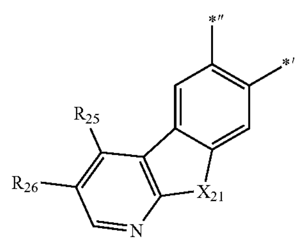
CY2-4-15N
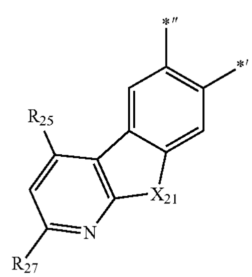
CY2-4-16N
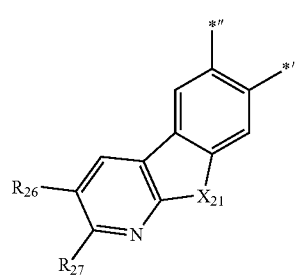

-continued
CY2-1-1F
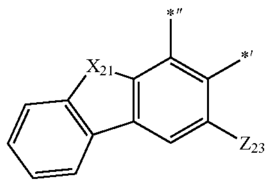
CY2-1-2F
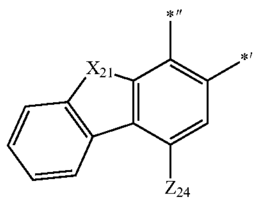
CY2-1-3F
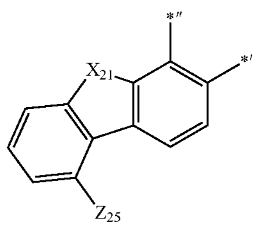
CY2-1-4F
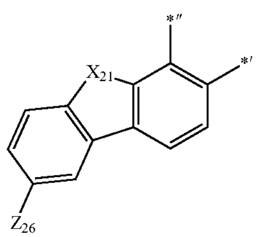
CY2-1-5F
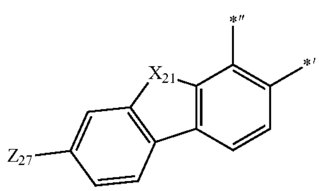
CY2-1-6F
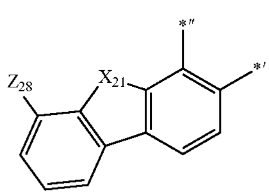
CY2-1-7F
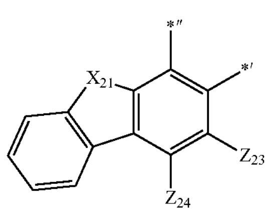
-continued
CY2-1-8F
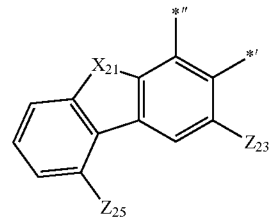
CY2-1-9F
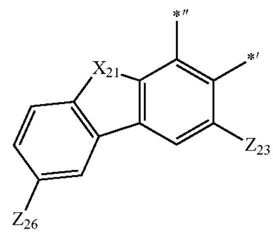
CY2-1-10F
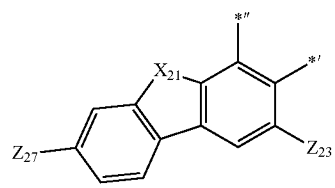
CY2-1-11F
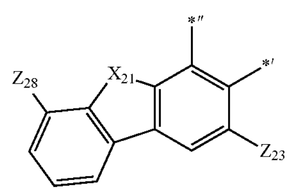
CY2-1-12F
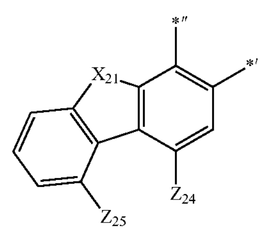
CY2-1-13F
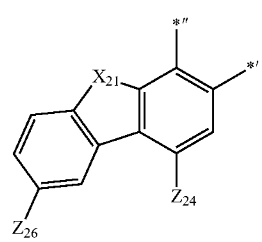
CY2-1-14F
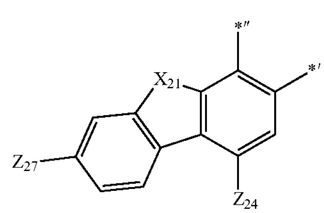

-continued
CY2-1-15F
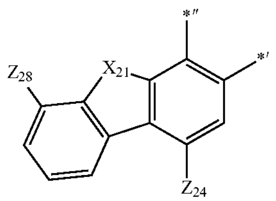
CY2-1-16F
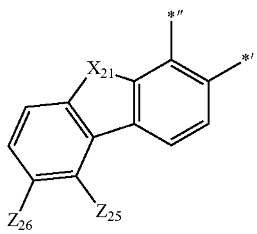
CY2-1-17F
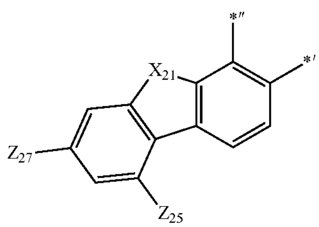
CY2-1-18F
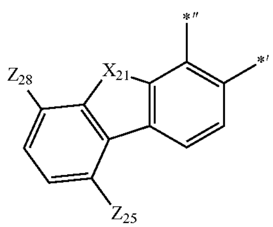
CY2-1-19F
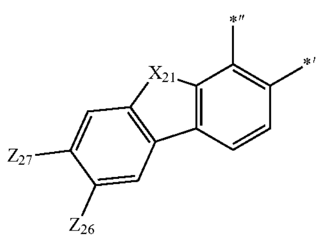
CY2-1-20F
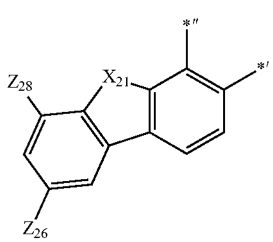
CY2-1-21F
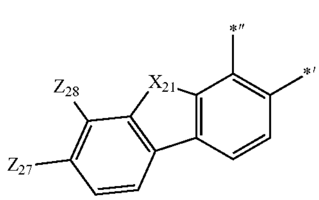
-continued
CY2-1-1NF
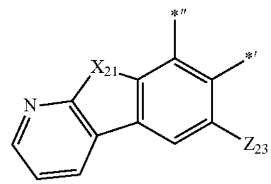
CY2-1-2NF
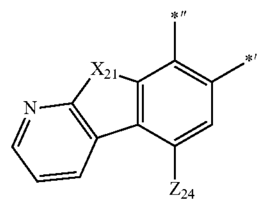
CY2-1-3NF
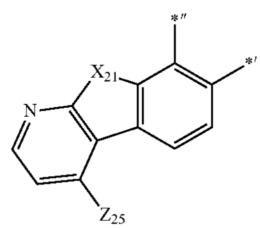
CY2-1-4NF
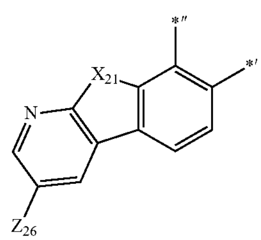
CY2-1-5NF
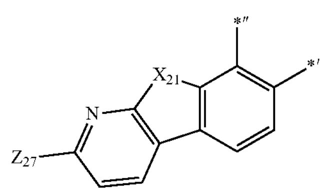
CY2-1-6NF
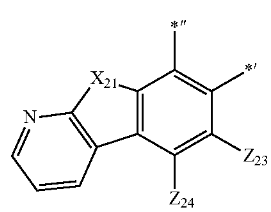
CY2-1-7NF
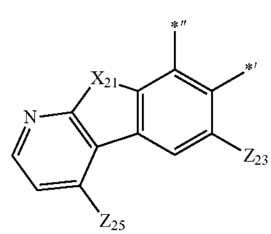

-continued
CY2-1-8NF
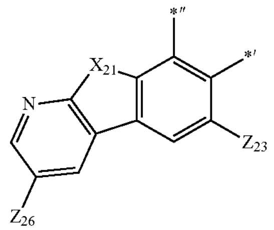
CY2-1-9NF
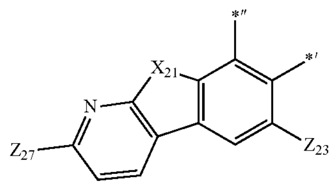
CY2-1-10NF
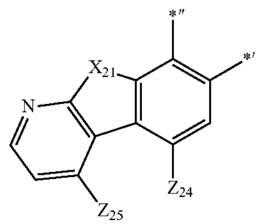
CY2-1-11NF
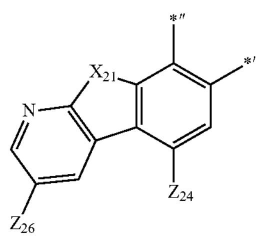
CY2-1-12NF
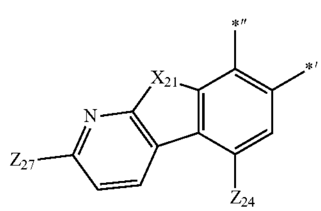
CY2-1-13NF
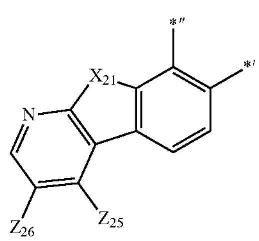
CY2-1-14NF
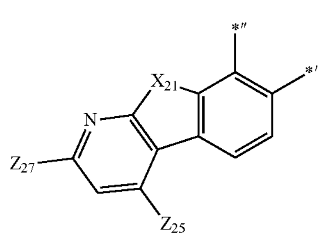
-continued
CY2-1-15NF
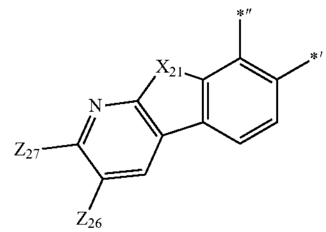
CY2-4-1F
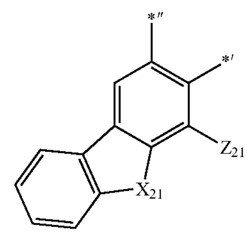
CY2-4-2F
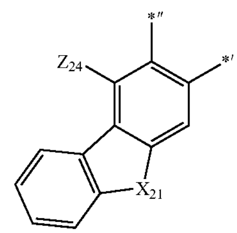
CY2-4-3F
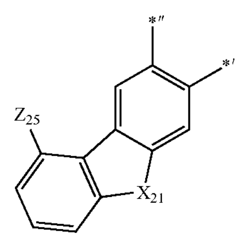
CY2-4-4F
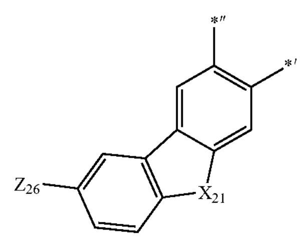
CY2-4-5F
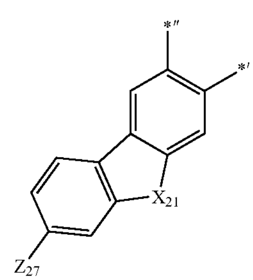

-continued
CY2-4-6F
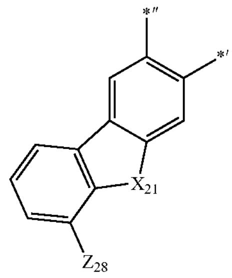
CY2-4-7F
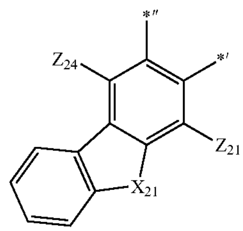
CY2-4-8F
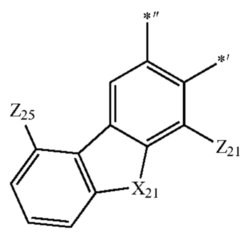
CY2-4-9F
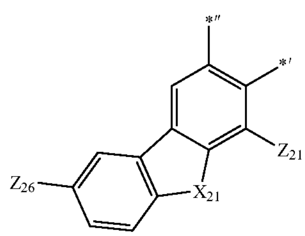
CY2-4-10F
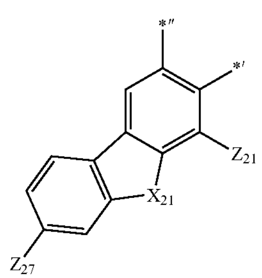
CY2-4-11F
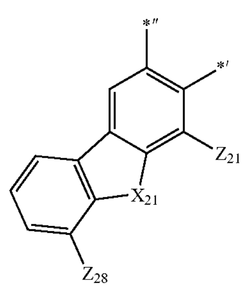
-continued
CY2-4-12F
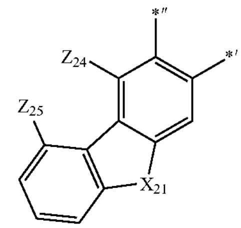
CY2-4-13F
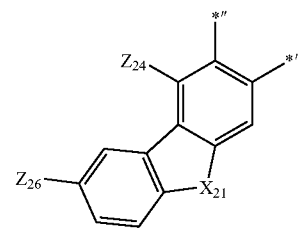
CY2-4-14F
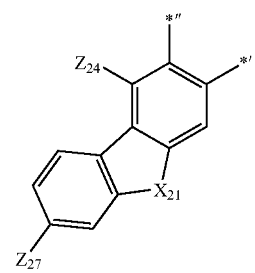
CY2-4-15F
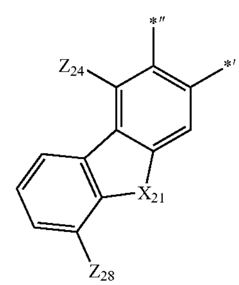
CY2-4-16F
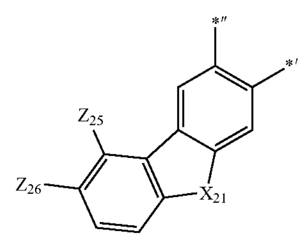
CY2-4-17F
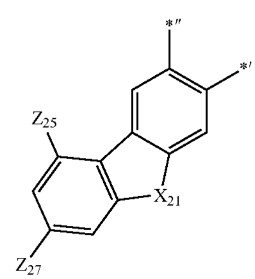

CY2-4-18F
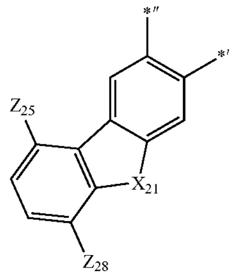
CY2-4-19F
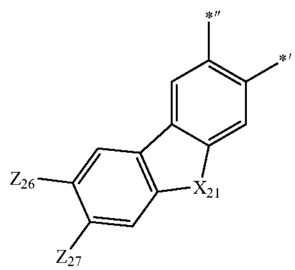
CY2-4-20F
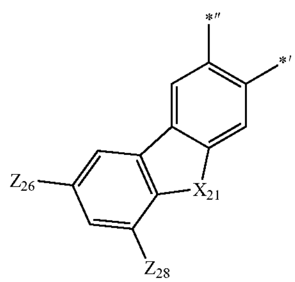
CY2-4-21F
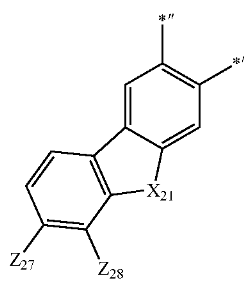
CY2-4-1NF
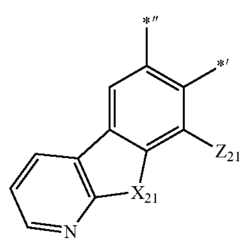
CY2-4-2NF
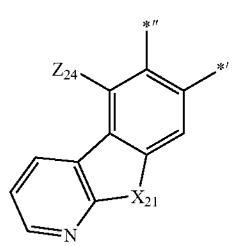
CY2-4-3NF
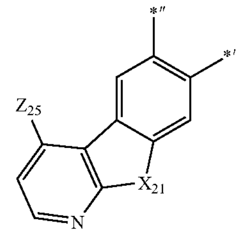
CY2-4-4NF
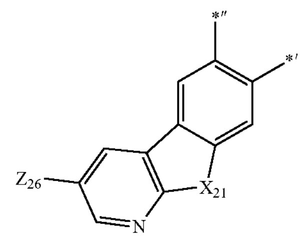
CY2-4-5NF
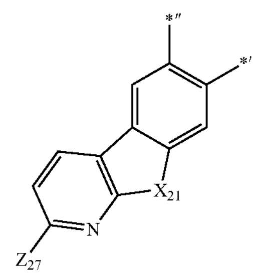
CY2-4-6NF
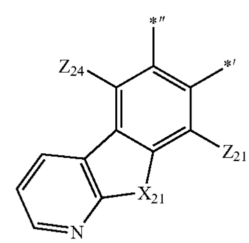
CY2-4-7NF
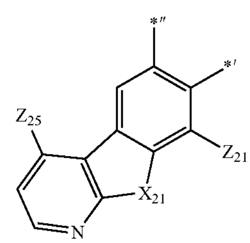
CY2-4-8NF
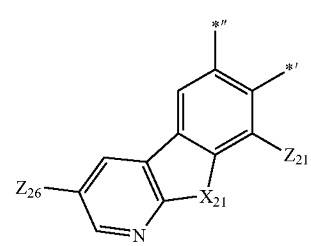

-continued

CY2-4-9NF

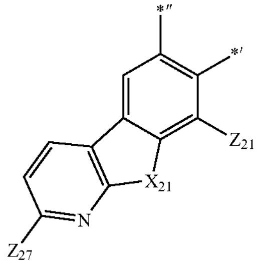

CY2-4-10NF

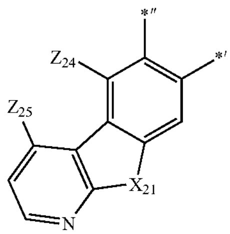

CY2-4-11NF

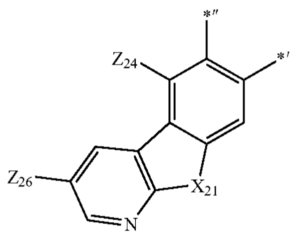

CY2-4-12NF

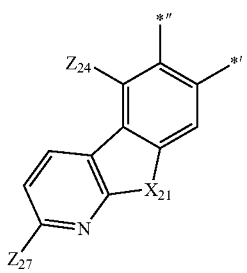

CY2-4-13NF

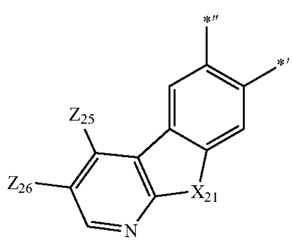

CY2-4-14NF

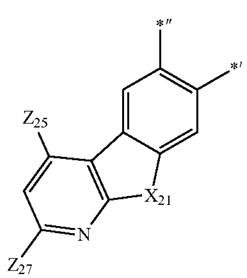

-continued

CY2-4-15NF

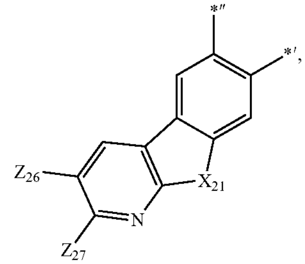

wherein, in Formulae CY2-1-1 to CY2-1-22, CY2-1-1N to CY2-1-16N, CY2-4-1 to CY2-4-22, CY2-4-1N to CY2-4-16N, CY2-1-1F to CY2-1-21F, CY2-1-1NF to CY2-1-15NF, CY2-4-1F to CY2-4-21F, and CY2-4-1NF to CY2-4-15NF, $Z_{21}$ to $Z_{28}$ may each be the same as described in connection with $Z_2$, $R_{21}$ to $R_{28}$ may each be the same as described in connection with $R_2$, wherein each of $R_{21}$ to $R_{28}$ may not be hydrogen, indicates a binding site to M in Formula 1, and indicates a binding site to ring $CY_1$ in Formula 2A.

In an embodiment, a group represented by

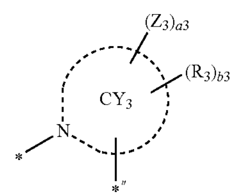

in Formula 2B may be a group represented by Formula CY3(1):

CY3(1)

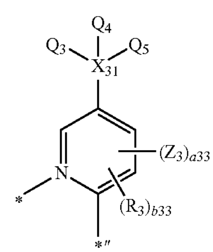

wherein, in Formula CY3(1), $X_{31}$ may be Si or Ge, $Z_3$, $R_3$, and $Q_3$ to $Q_5$ may each be the same as described herein, a33 and b33 may each independently be an integer from 0 to 3, two or more of $R_3$(s) in the number of a33 may optionally be linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, a cyclohexane group, a norbornane group, a benzene group, a pyridine group, a naphthalene group, a quinoline group, or an isoquinoline group, each independently unsubstituted or substituted with at least one $R_{10a}$), indicates a binding site to M in Formula 1, and
" indicates a binding site to ring $CY_4$ in Formula 2B.
For example, in Formula CY3(1), at least one of $R_3$(s) in the number of a33 may further include two or more carbons.
In an embodiment, a group represented by
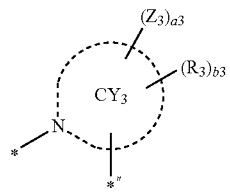
in Formula 2B may be a group represented by one of Formulae CY3-1 to CY3-16 and CY3-1F to CY3-32F:
CY3-1
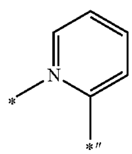
CY3-2
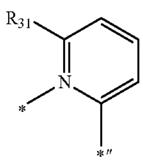
CY3-3
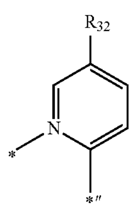
CY3-4
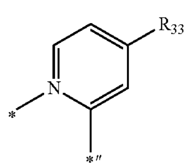
CY3-5
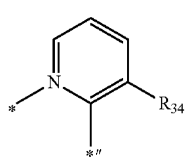
CY3-6
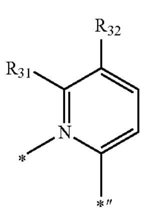
-continued
CY3-7
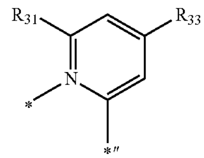
CY3-8
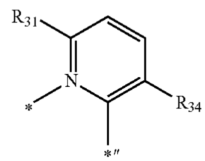
CY3-9
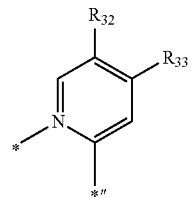
CY3-10
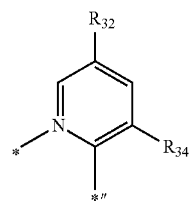
CY3-11
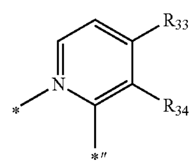
CY3-12
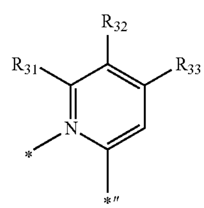
CY3-13
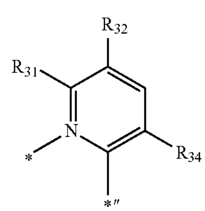
CY3-14
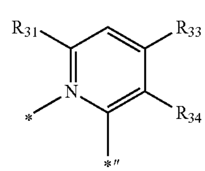

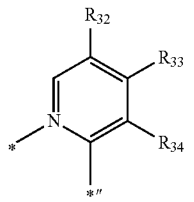
CY3-15
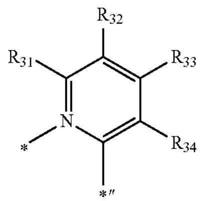
CY3-16
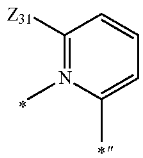
CY3-1F
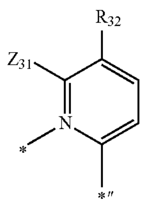
CY3-2F
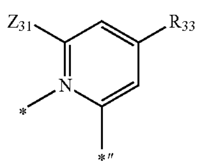
CY3-3F
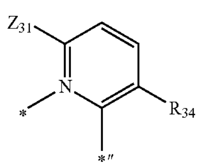
CY3-4F
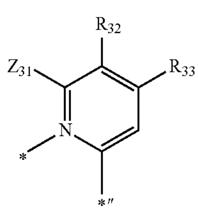
CY3-5F
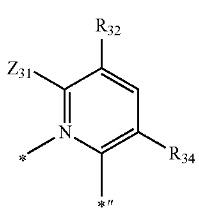
CY3-6F
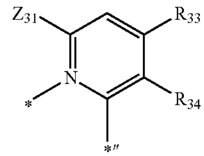
CY3-7F
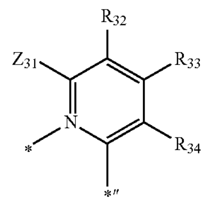
CY3-8F
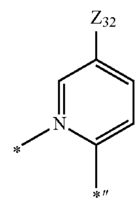
CY3-9F
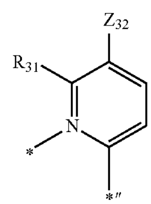
CY3-10F
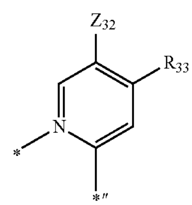
CY3-11F
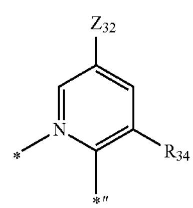
CY3-12F
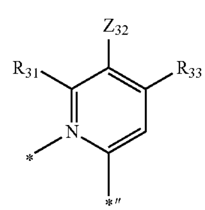
CY3-13F CY3-14F
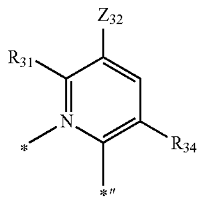
CY3-15F
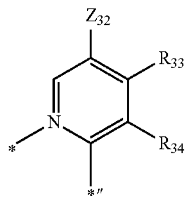
CY3-16F
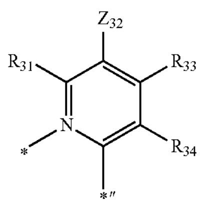
CY3-17F
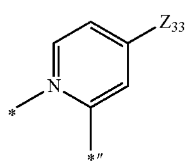
CY3-18F
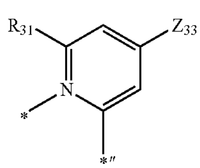
CY3-19F
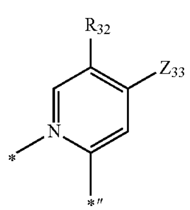
CY3-20F
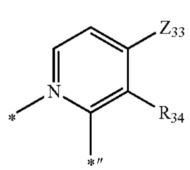
CY3-21F
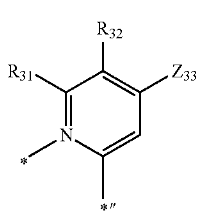
CY3-22F
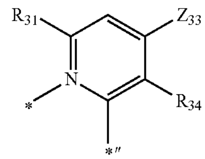
CY3-23F
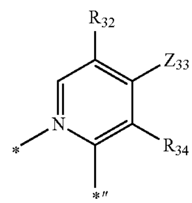
CY3-24F
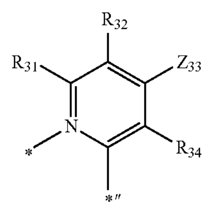
CY3-25F
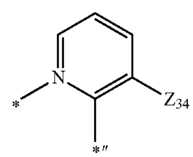
CY3-26F
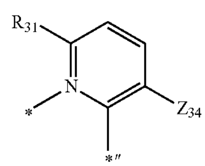
CY3-27F
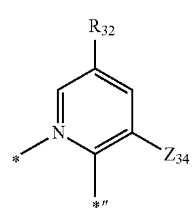
CY3-28F
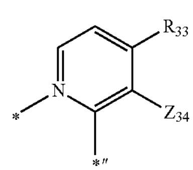
CY3-29F
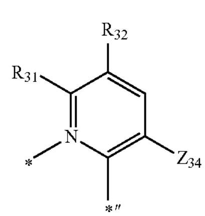

-continued

CY3-30F

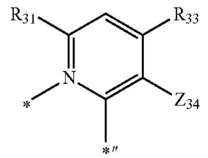

CY3-31F

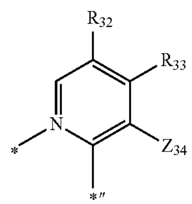

CY3-32F

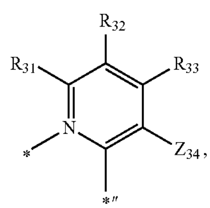

wherein, in Formulae CY3-1 to CY3-16 and CY3-1F to CY3-32F, $Z_{31}$ to $Z_{34}$ may each be the same as described in connection with $Z_3$, $R_{31}$ to $R_{34}$ may each be the same as described in connection with $R_3$, wherein each of $R_{31}$ to $R_{34}$ may not be hydrogen, indicates a binding site to M in Formula 1, and " indicates a binding site to ring $CY_4$ in Formula 2B.

In an embodiment, in Formulae CY3-1 to CY3-16 and CY3-1F to CY3-32F, $R_{32}$ may be a $C_1$-$C_{10}$ alkyl group substituted with at least one deuterium; —Si($Q_3$)($Q_4$)($Q_5$); or —Ge($Q_3$)($Q_4$)($Q_5$).

In an embodiment, in Formulae CY3-1 to CY3-16 and CY3-1F to CY3-32F, $R_{33}$ may include two or more carbons.

In an embodiment, in Formulae CY3-1 to CY3-16 and CY3-1F to CY3-32F, $R_{33}$ and $R_{34}$ may optionally be linked to each other to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, a cyclohexane group, a norbornane group, a benzene group, a pyridine group, a naphthalene group, a quinoline group, or an isoquinoline group, each independently unsubstituted or substituted with at least one $R_{10a}$).

In an embodiment, a group represented by

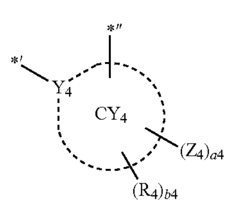

in Formula 2B may be a group represented by one of Formulae CY4-1 to CY4-16 and CY4-1F to CY4-32F:

CY4-1

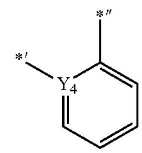

CY4-2

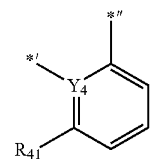

CY4-3

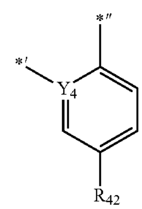

CY4-4

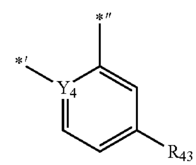

CY4-5

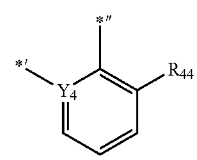

CY4-6

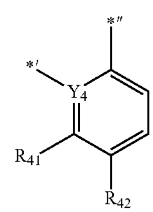

CY4-7

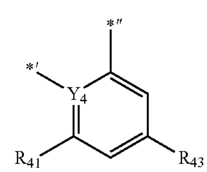

CY4-8

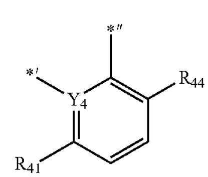

-continued
CY4-9
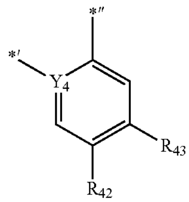
CY4-10
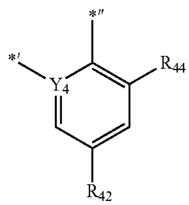
CY4-11
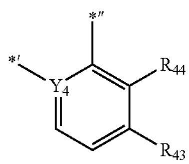
CY4-12
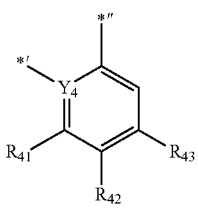
CY4-13
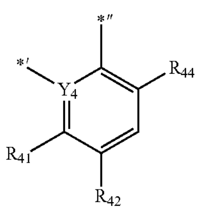
CY4-14
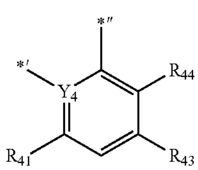
CY4-15
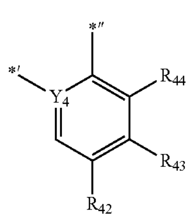
CY4-16
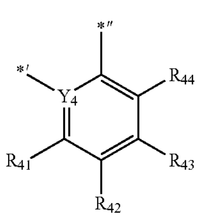
-continued
CY4-1F
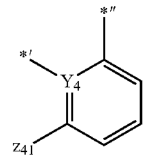
CY4-2F
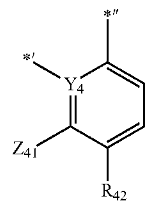
CY4-3F
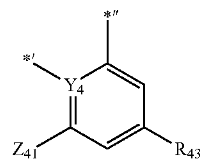
CY4-4F
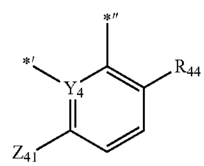
CY4-5F
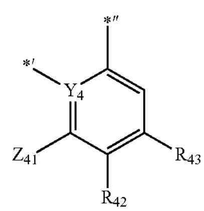
CY4-6F
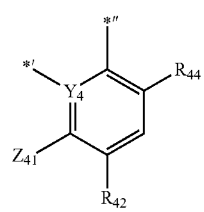
CY4-7F
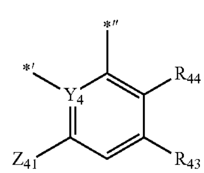
CY4-8F
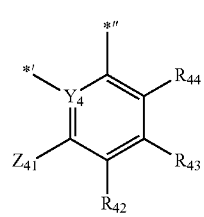

-continued
CY4-9F
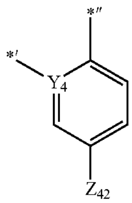
CY4-10F
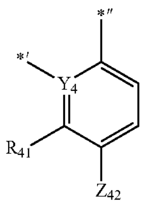
CY4-11F
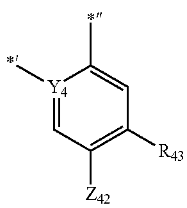
CY4-12F
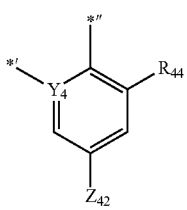
CY4-13F
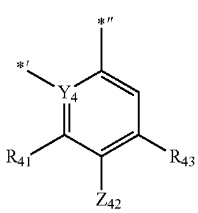
CY4-14F
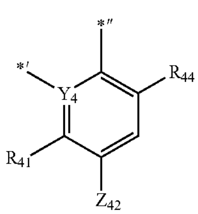
CY4-15F
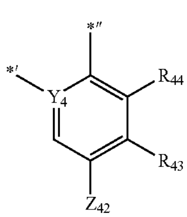
-continued
CY4-16F
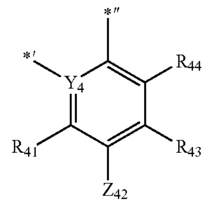
CY4-17F
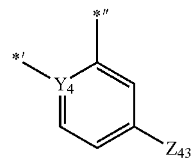
CY4-18F
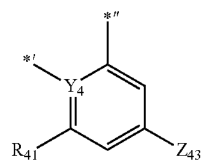
CY4-19F
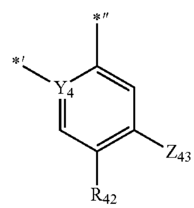
CY4-20F
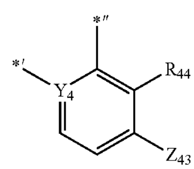
CY4-21F
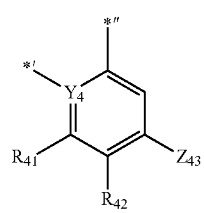
CY4-22F
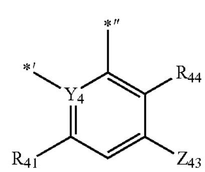
CY4-23F
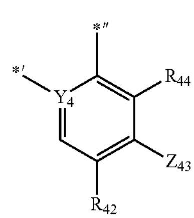

-continued

CY4-24F

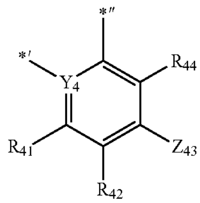

CY4-25F

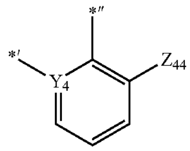

CY4-26F

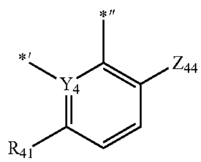

CY4-27F

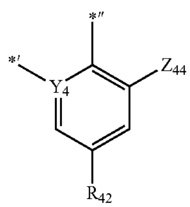

CY4-28F

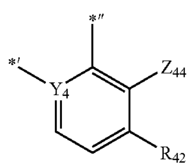

CY4-29F

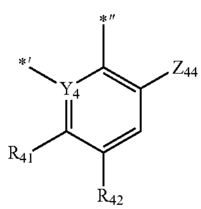

CY4-30F

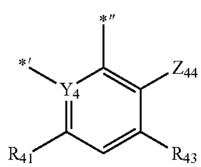

CY4-31F

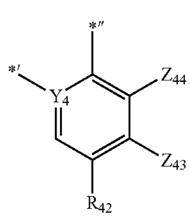

-continued

CY4-32F

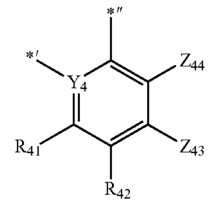

wherein, in Formulae CY4-1 to CY4-16 and CY4-1F to CY4-32F, $Z_{41}$ to $Z_{44}$ may each be the same as described in connection with $Z_4$, $R_{41}$ to $R_{44}$ may each be the same as described in connection with $R_4$, wherein each of $R_{41}$ to $R_{44}$ may not be hydrogen, ' indicates a binding site to M in Formula 1, and " indicates a binding site to ring $CY_3$ in Formula 2B.

In an embodiment, the organometallic compound represented by Formula 1 may satisfy at least one of Condition 1 to Condition 4:

Condition 1 a group represented by

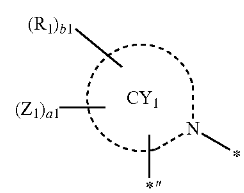

in Formula 2A is a group represented by one of Formulae CY1-1F to CY1-32F

Condition 2 a group represented by

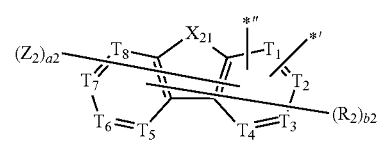

in Formula 2A is a group represented by one of Formulae CY2-1-1F to CY2-1-21F, CY2-1-1NF to CY2-1-15NF, CY2-4-1F to CY2-4-21F and CY2-4-1NF to CY2-4-15NF Condition 3 a group represented by

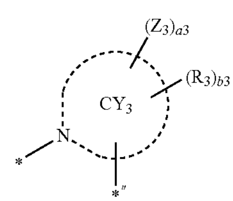

in Formula 2B is a group represented by one of Formulae CY3-1F to CY3-32F

Condition 4
a group represented by
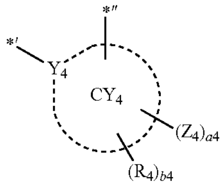
in Formula 2B is a group represented by one of Formulae CY4-1F to CY4-32F.
In an embodiment, the organometallic compound may be one of Compounds 1 to 1440:
1
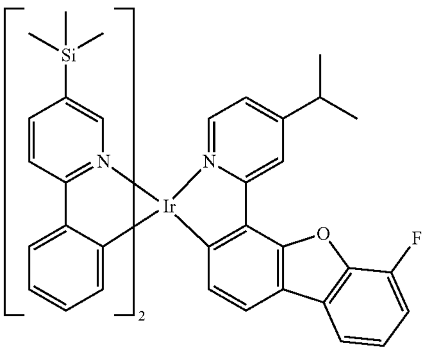
2
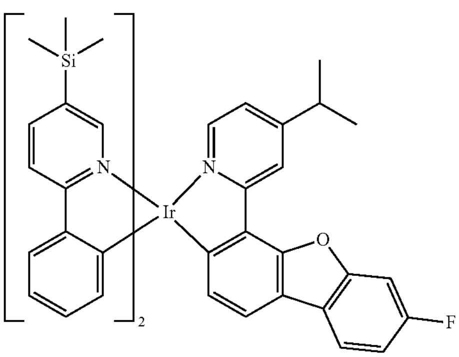
3
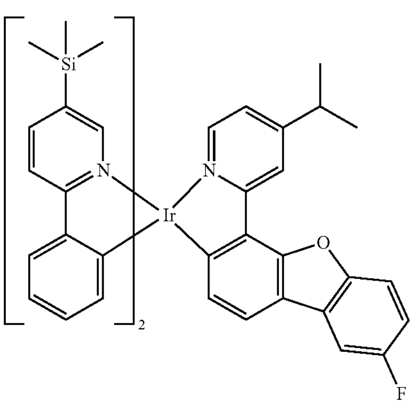
-continued
4
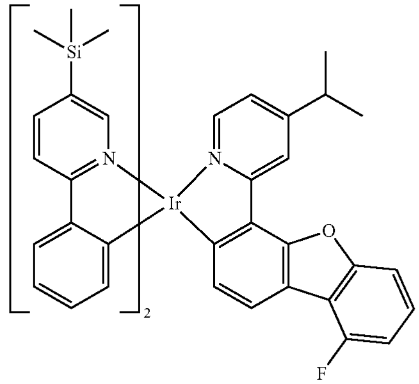
5
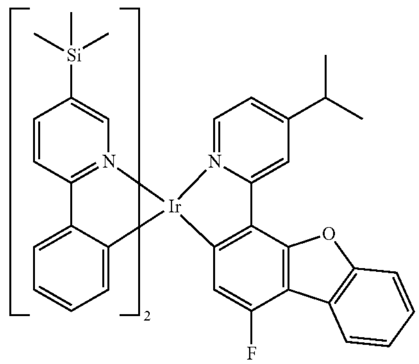
6
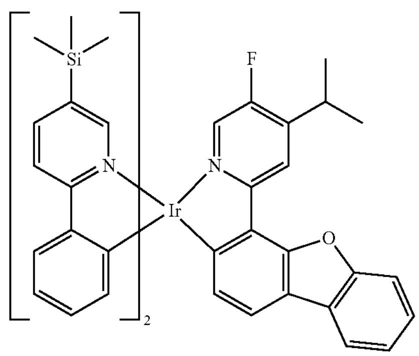
7
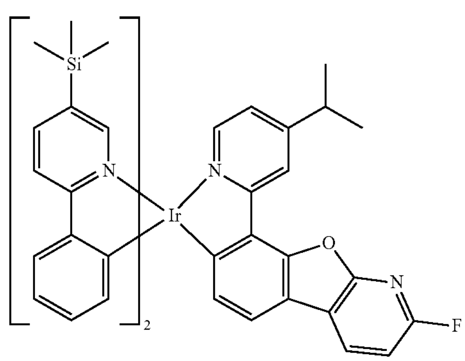

-continued
8
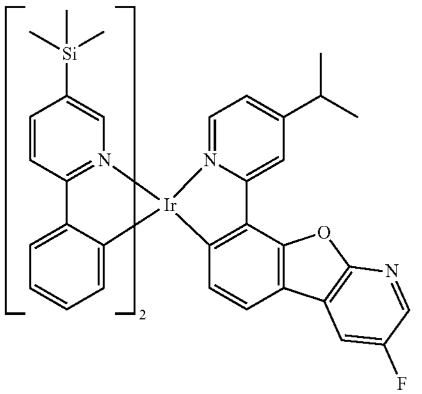
9
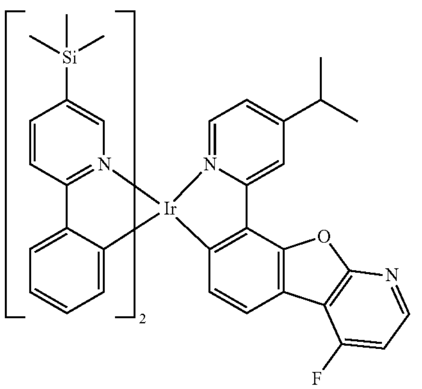
10
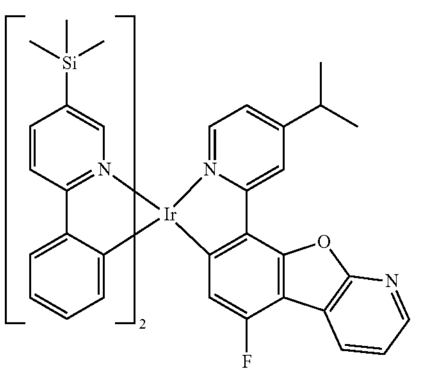
11
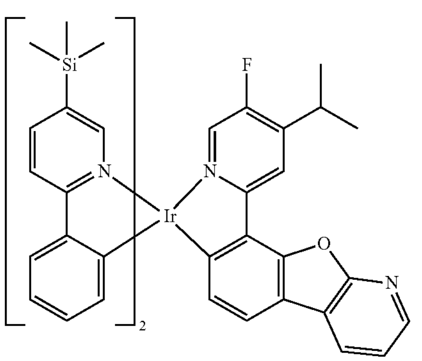
-continued
12
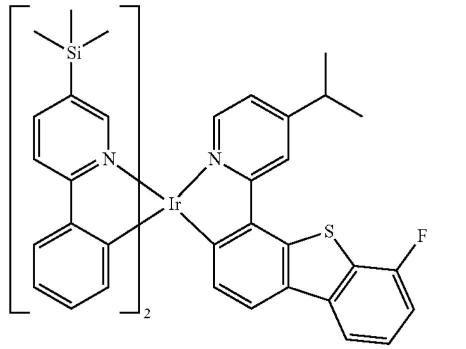
13
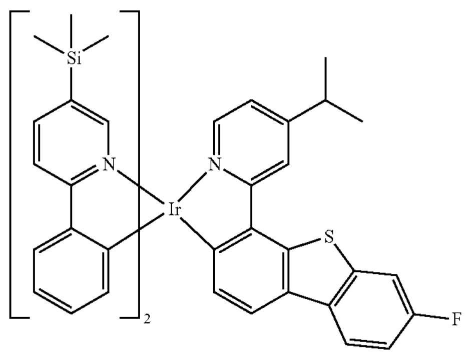
14
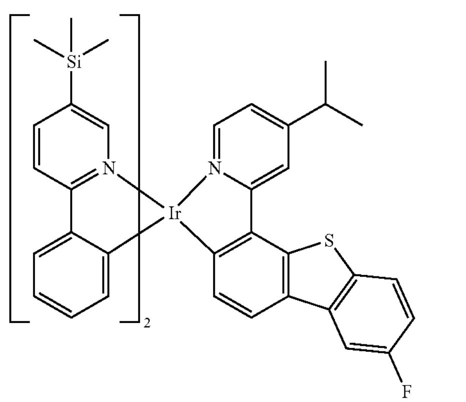
15
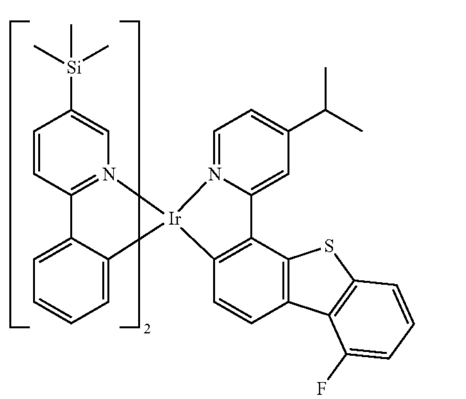

-continued
16
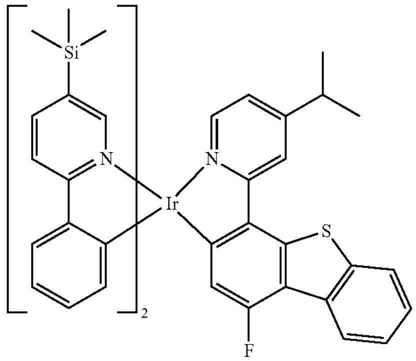
17
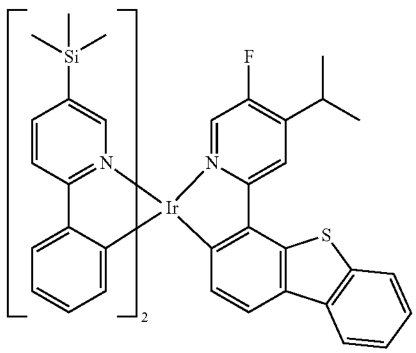
18
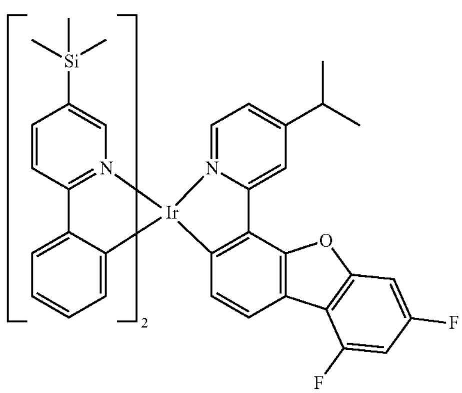
19
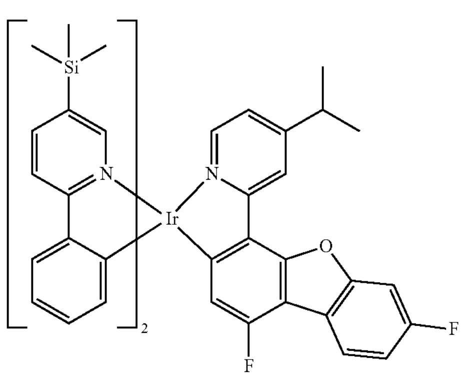
-continued
20
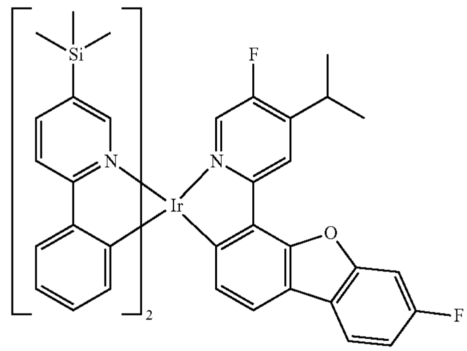
21
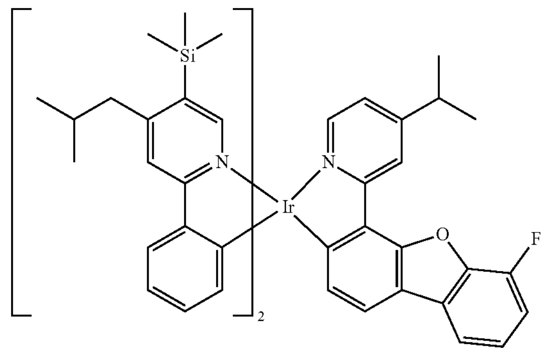
22
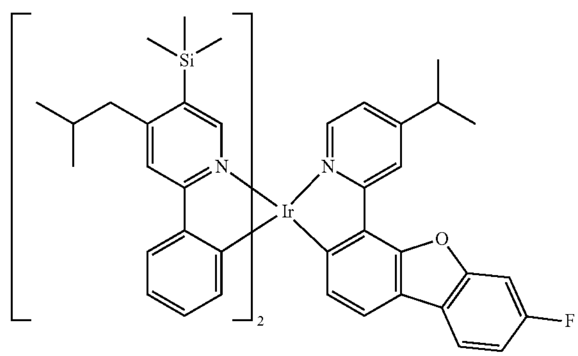
23
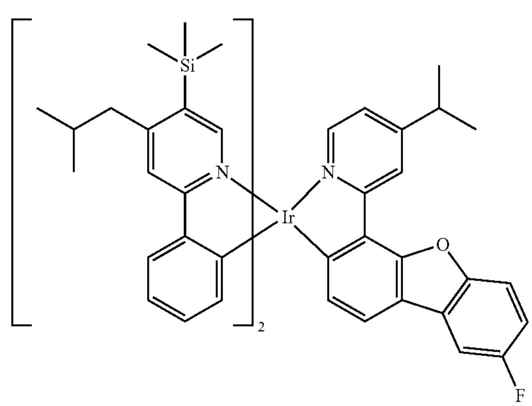

24
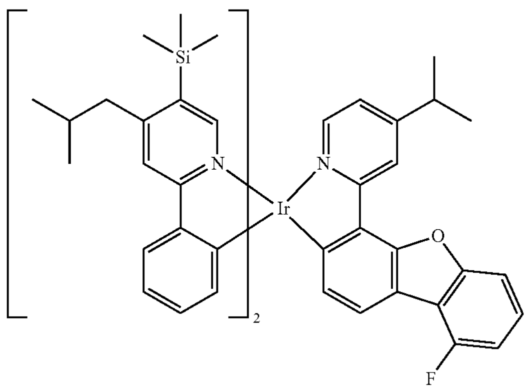
25
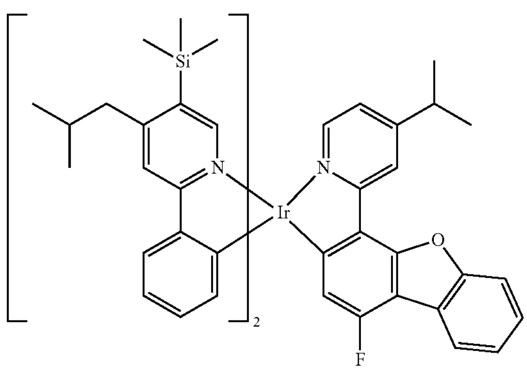
26
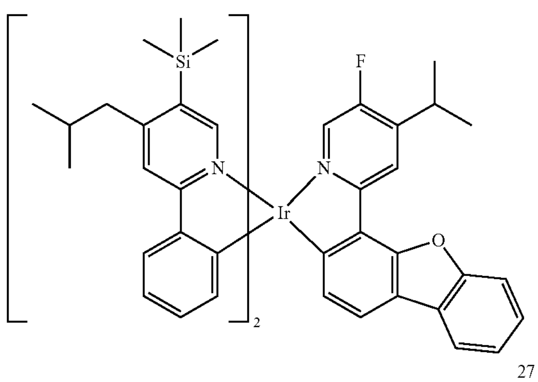
27
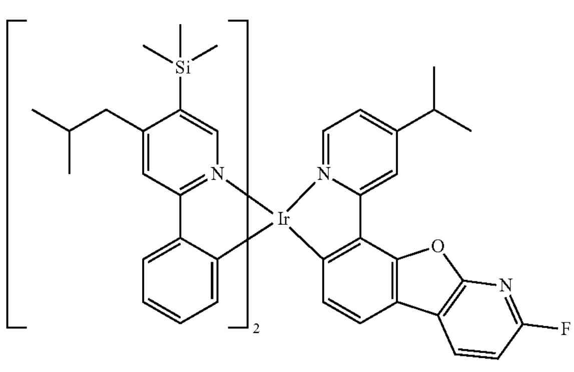
28
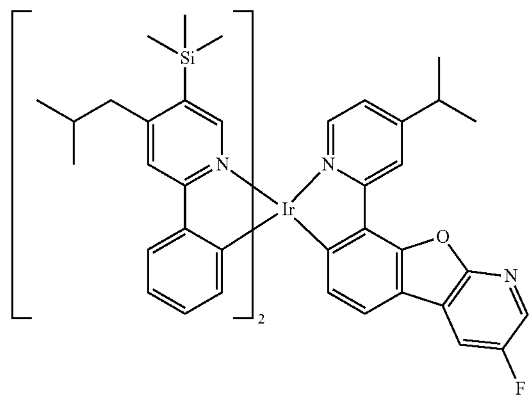
29
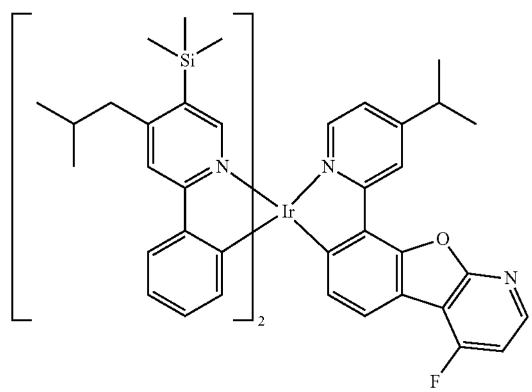
30
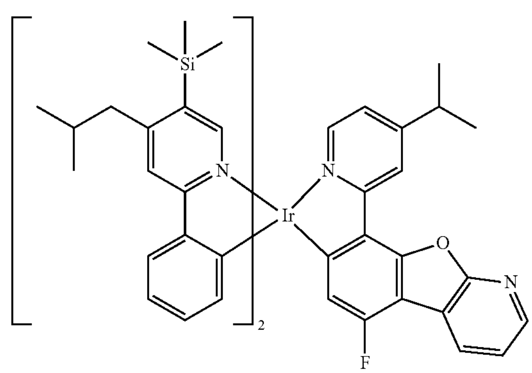
31
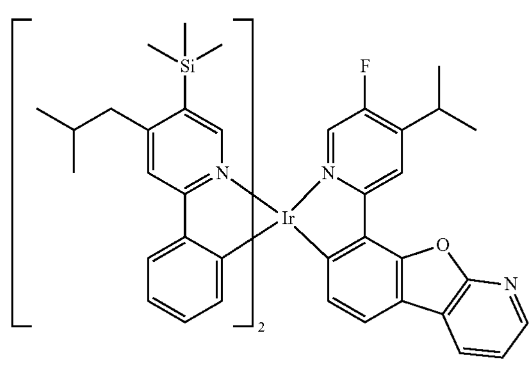

32
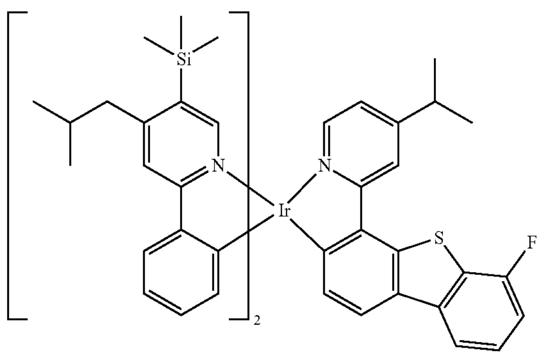
33
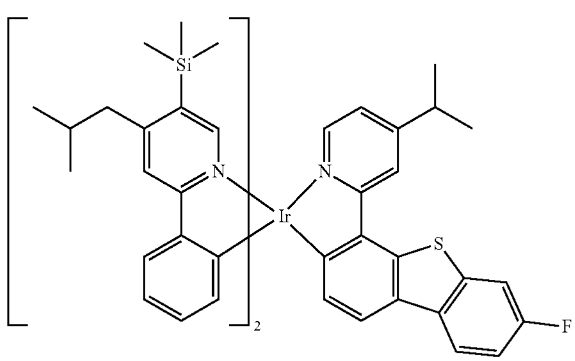
34
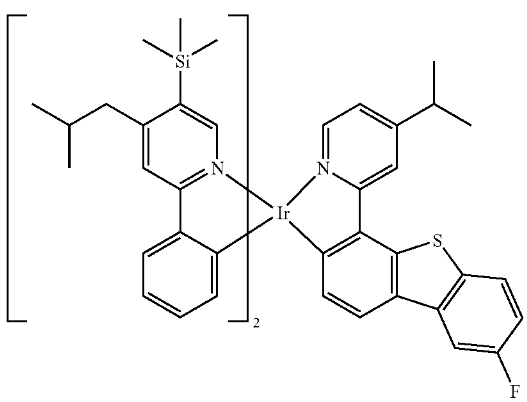
35
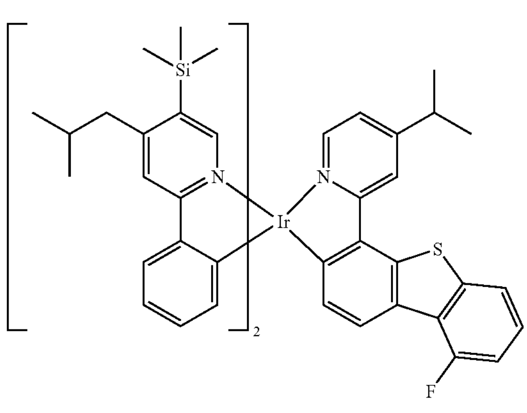
36
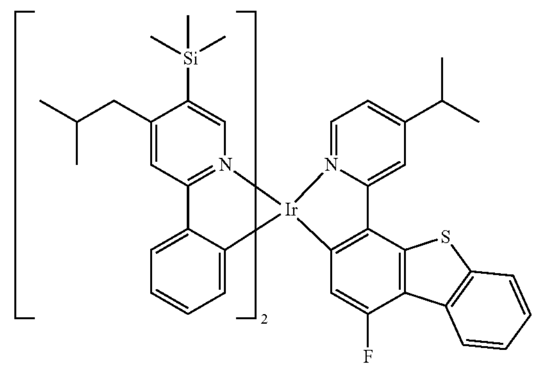
37
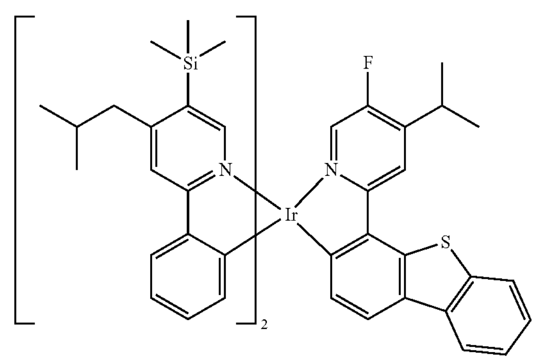
38
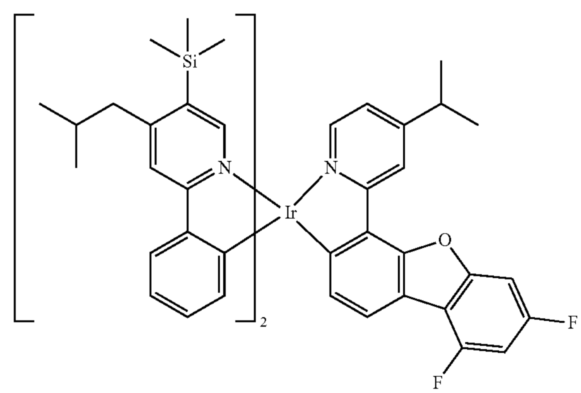
39
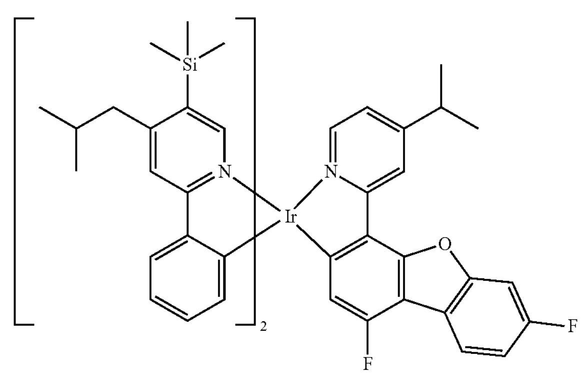

-continued
40
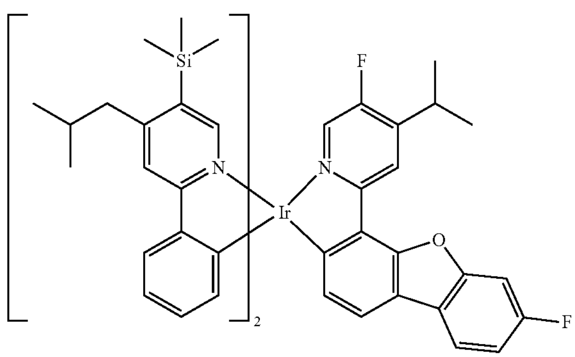
41
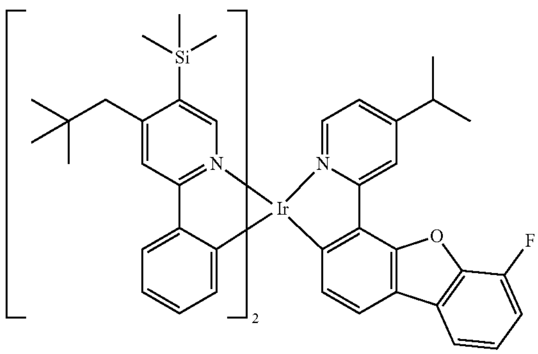
42
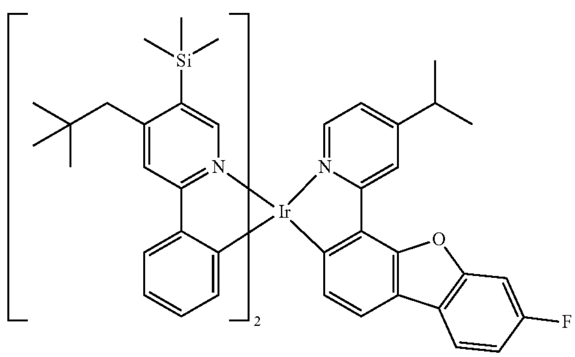
43
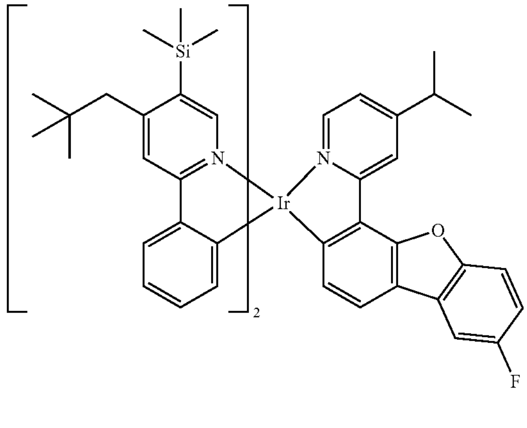
-continued
44
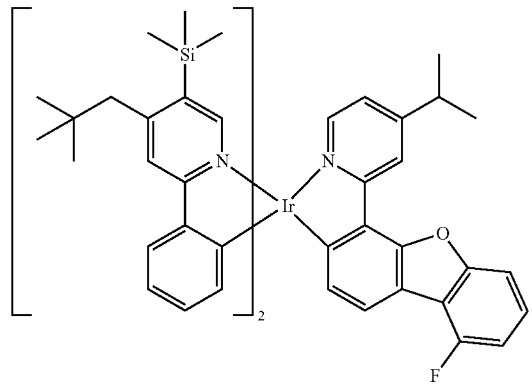
45
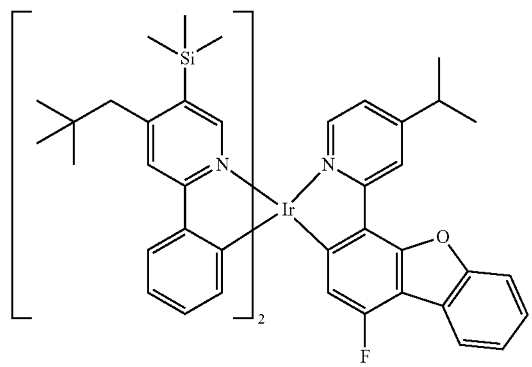
46
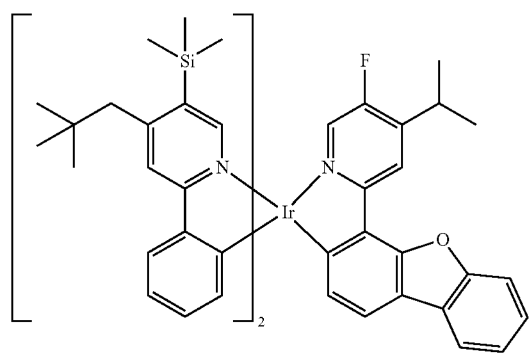
47
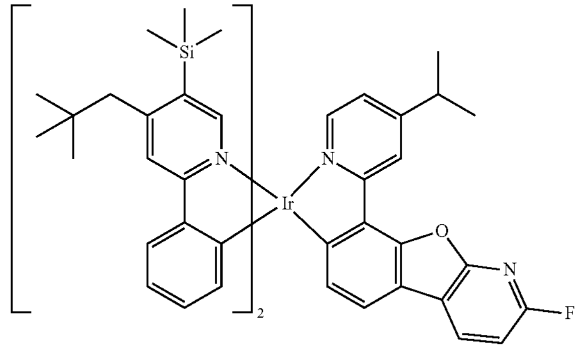

48
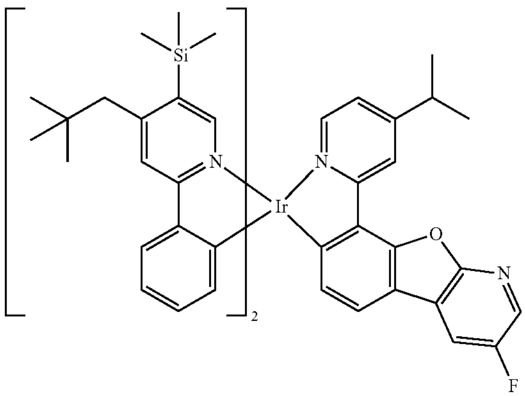
49
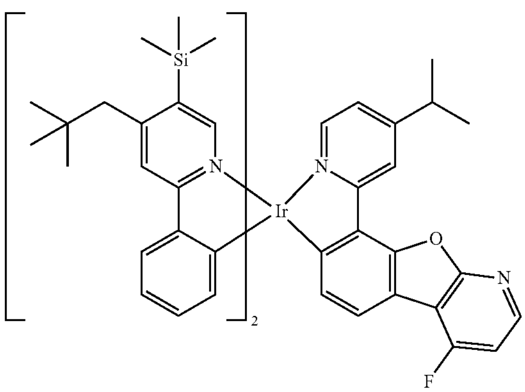
50
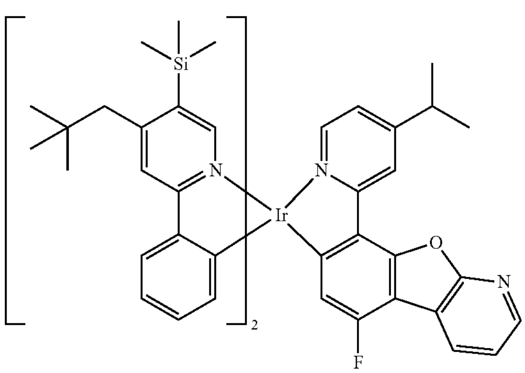
51
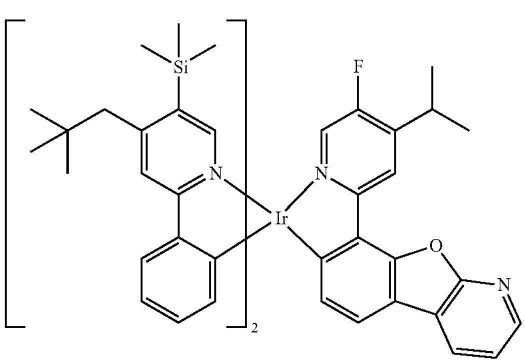
52
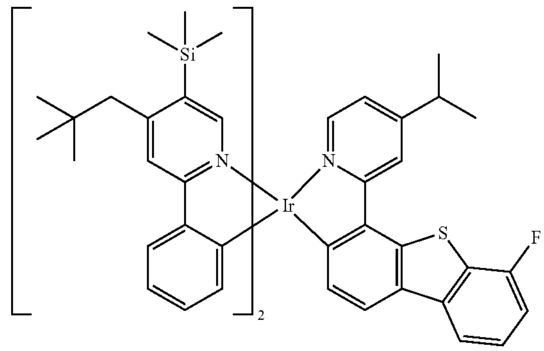
53
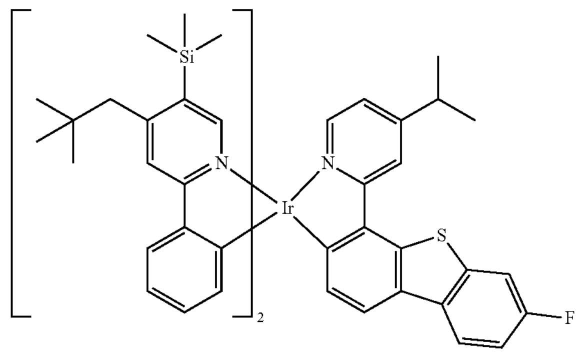
54
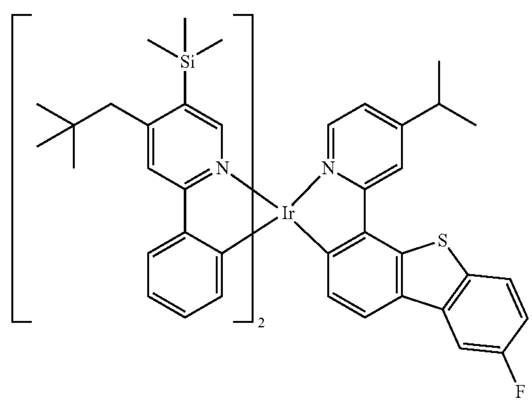
55
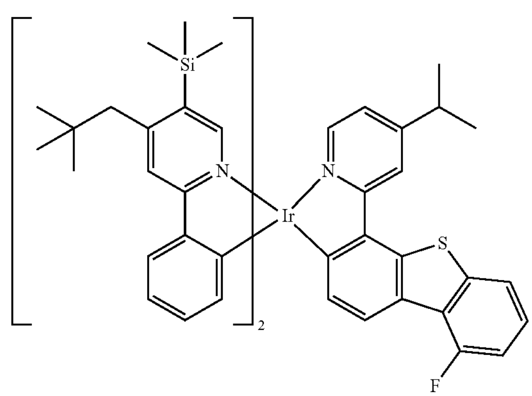

-continued
56
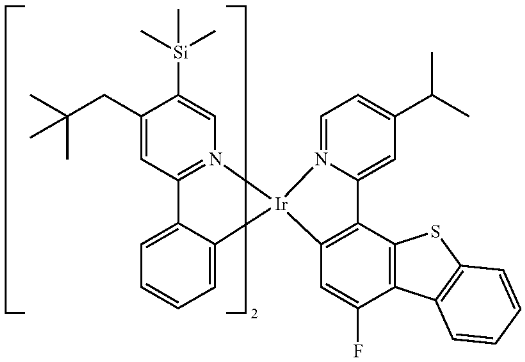
57
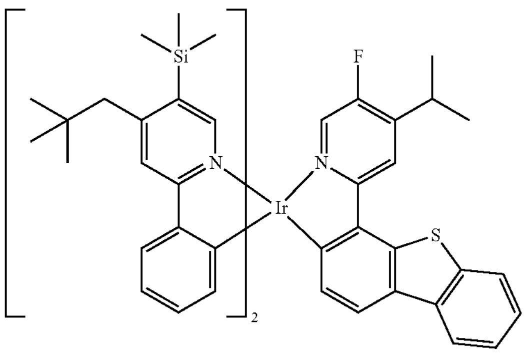
58
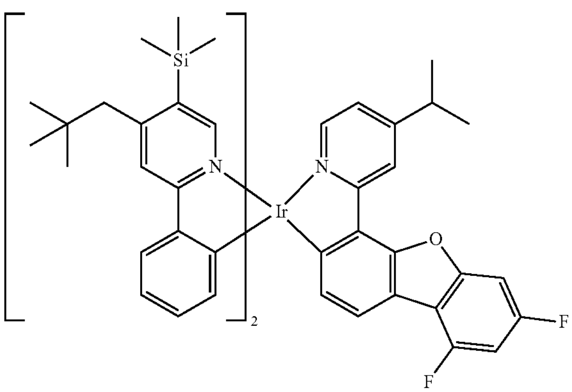
59
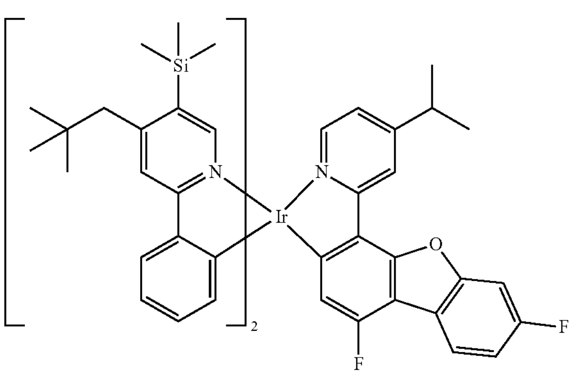
-continued
60
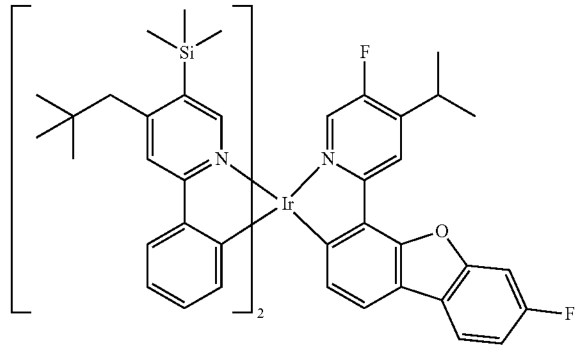
61
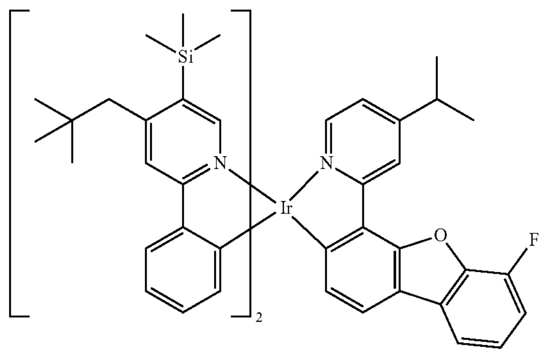
62
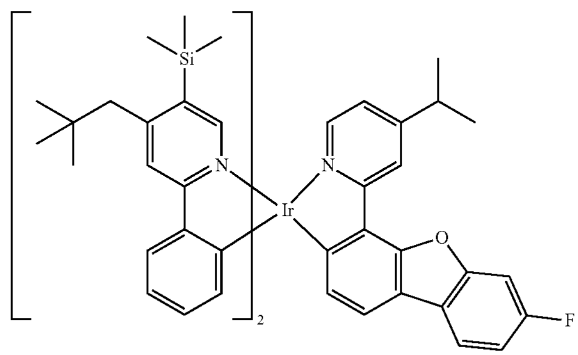
63
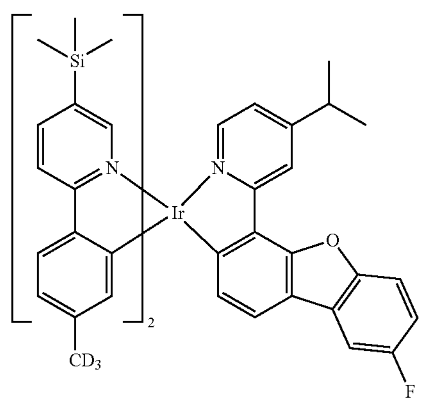

-continued
64
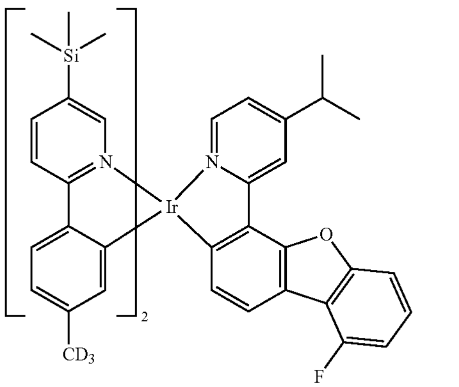
65
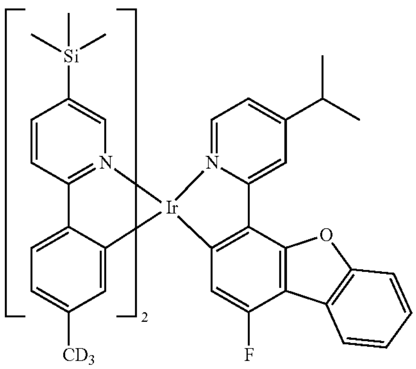
66
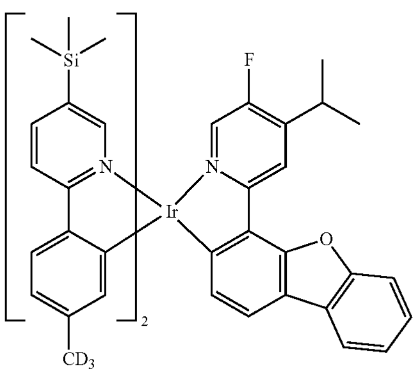
67
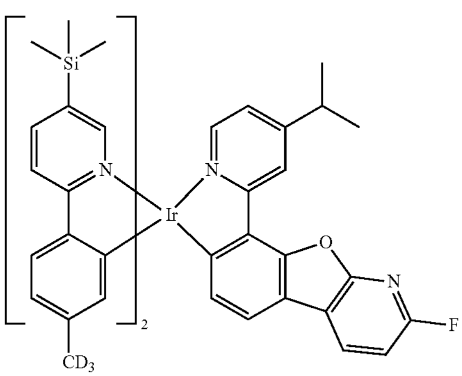
-continued
68
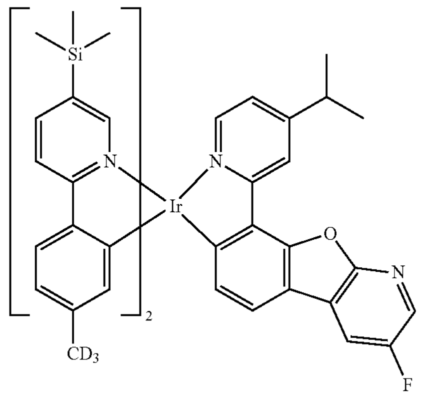
69
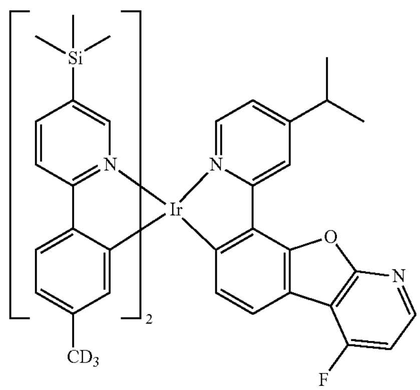
70
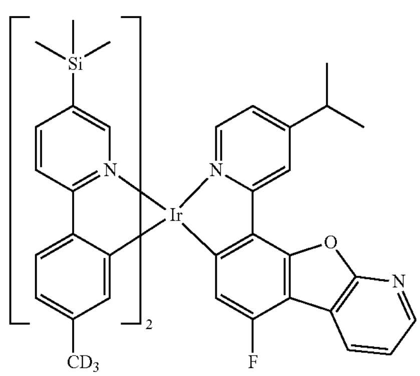
71
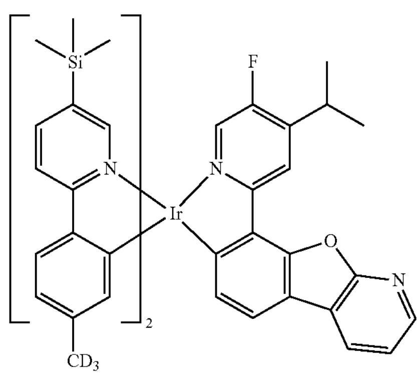

-continued
72
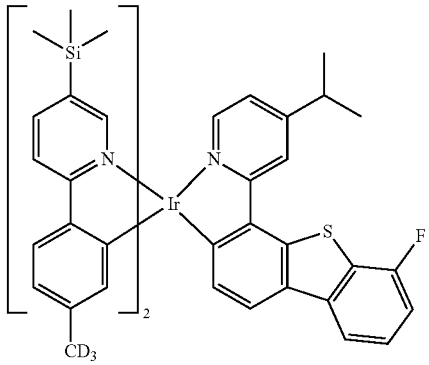
73
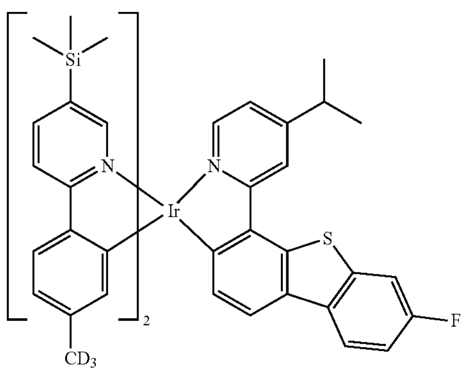
74
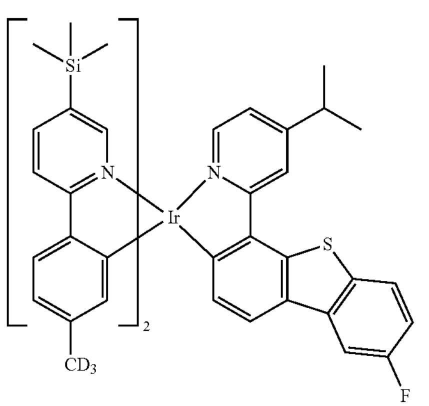
75
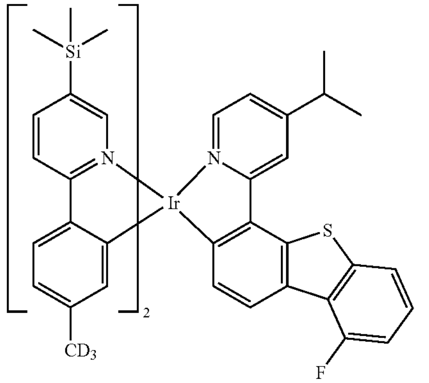
-continued
76
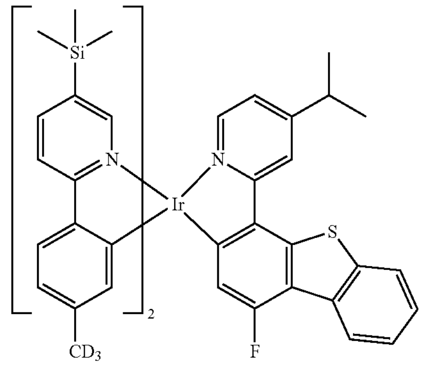
77
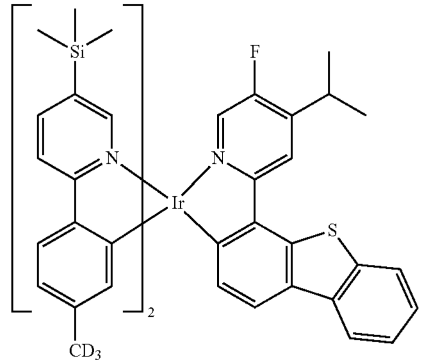
78
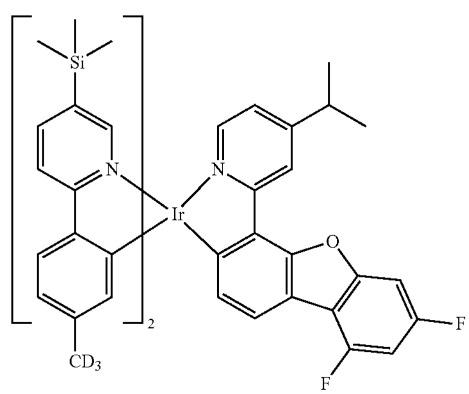
79
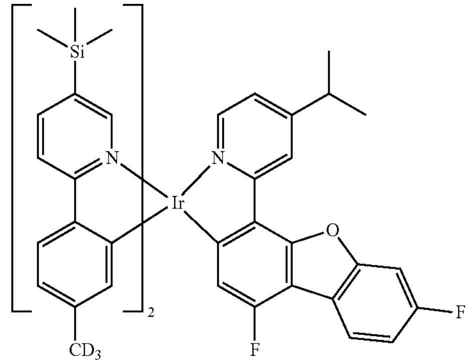

-continued
80
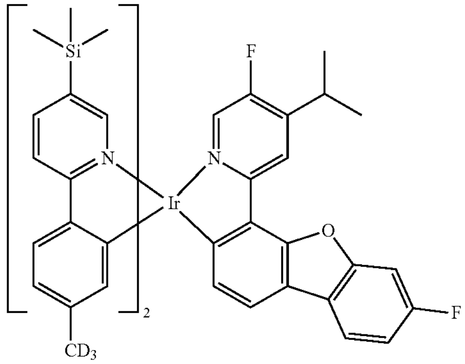
81
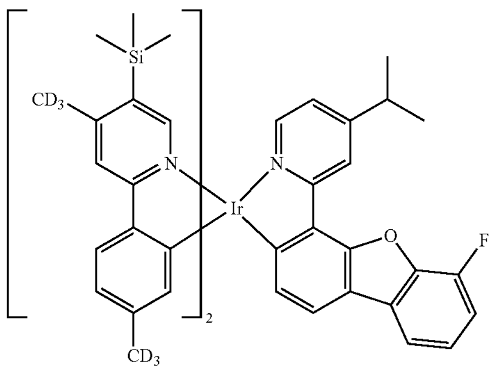
82
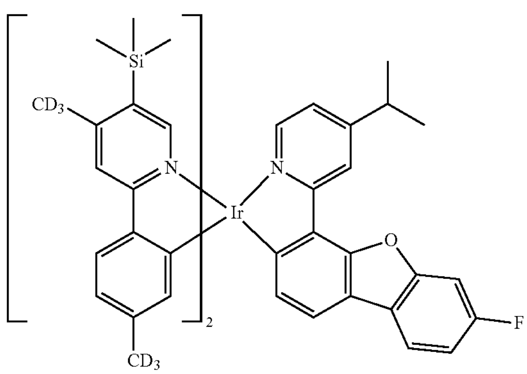
83
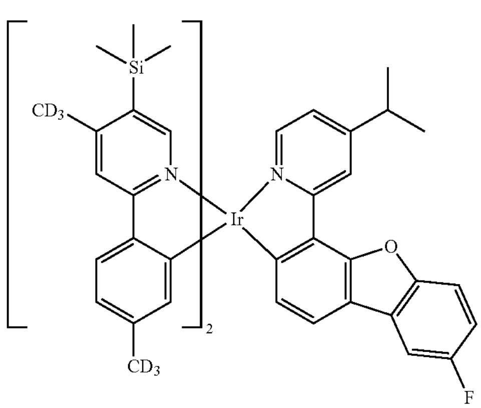
-continued
84
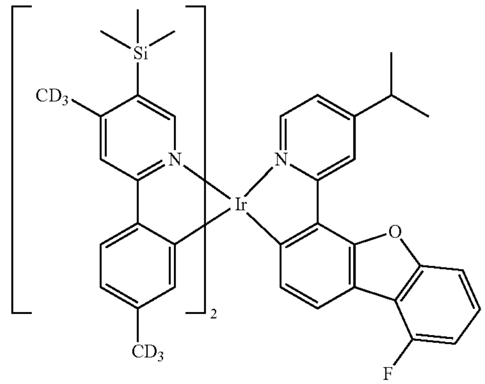
85
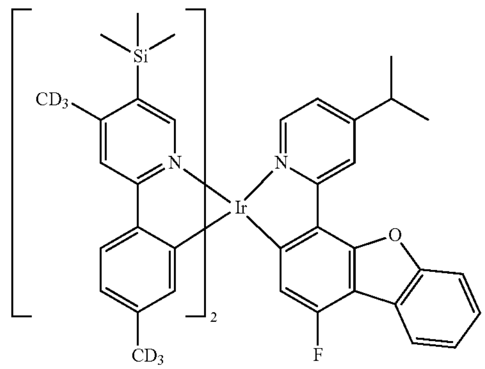
86
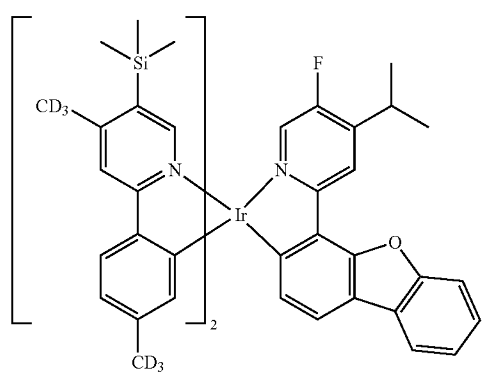
87
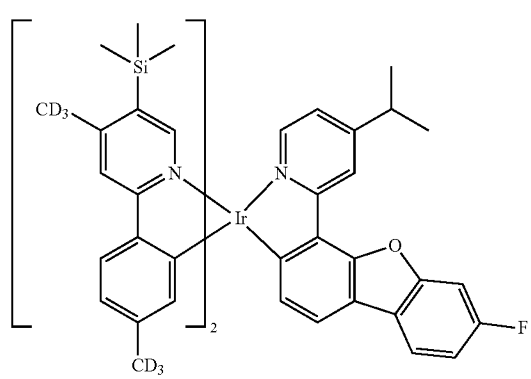

-continued
88
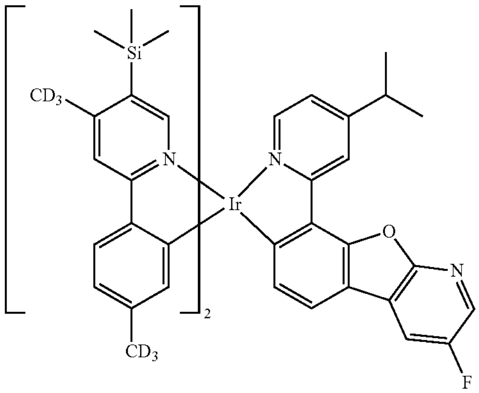
89
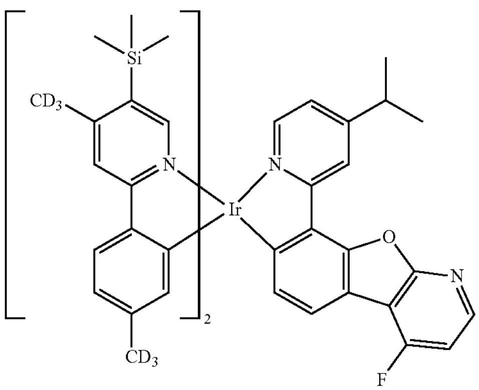
90
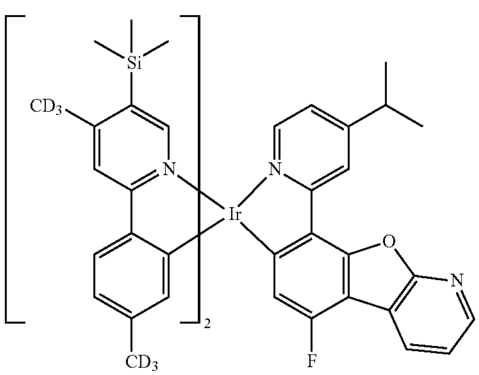
91
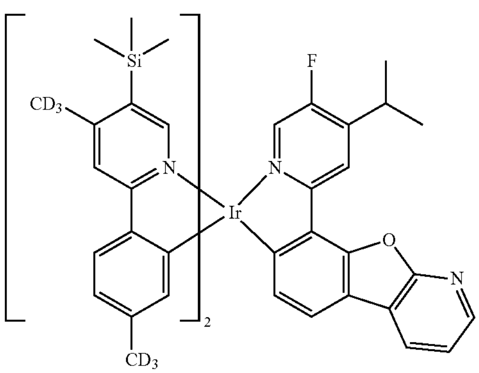
-continued
92
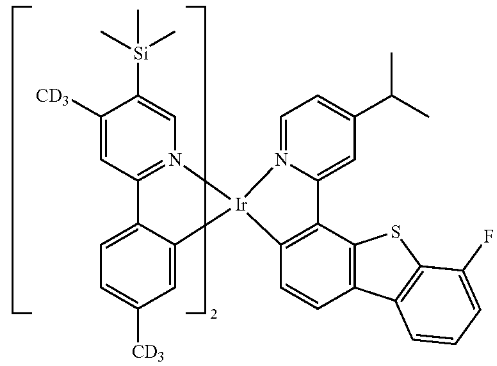
93
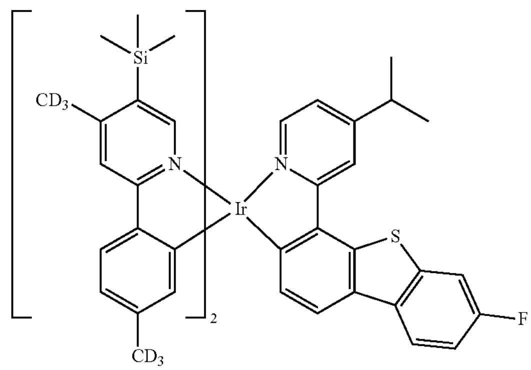
94
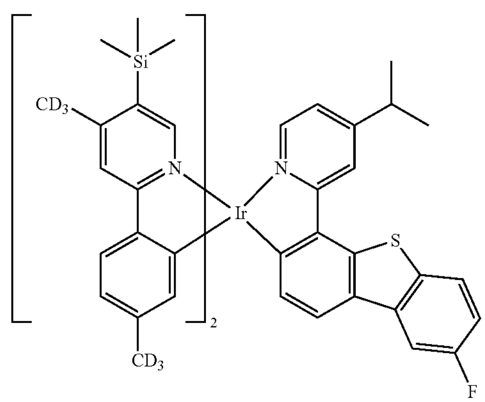
95
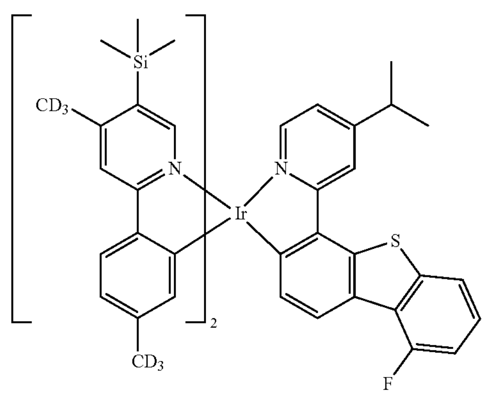

96
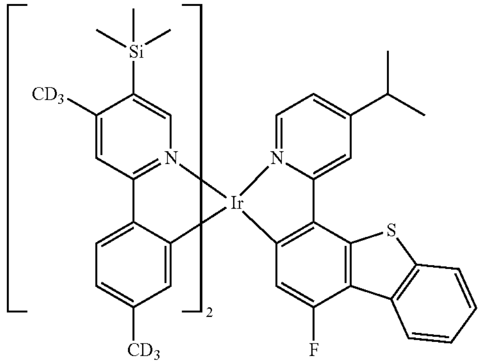
97
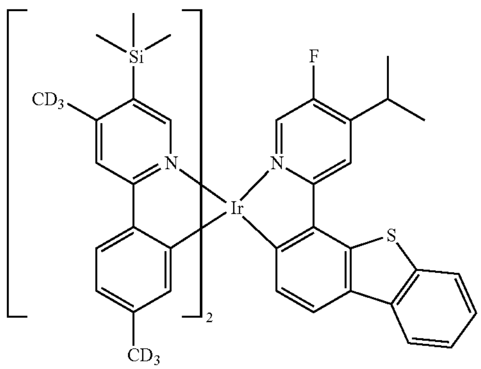
98
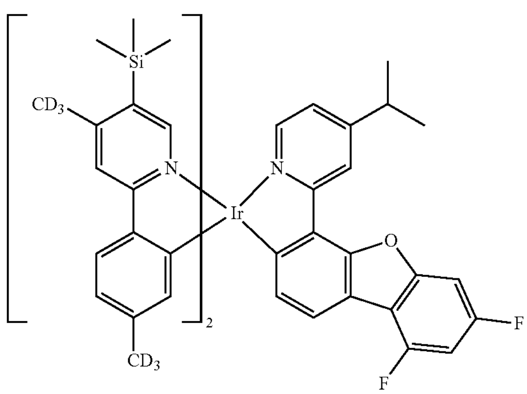
99
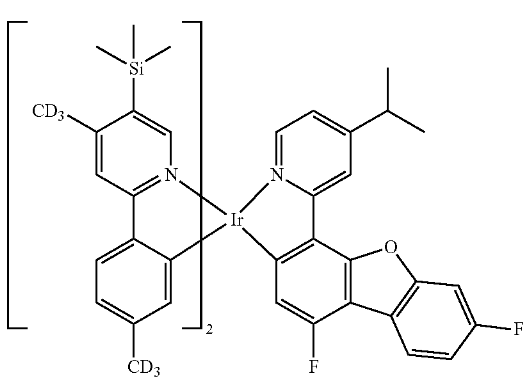
100
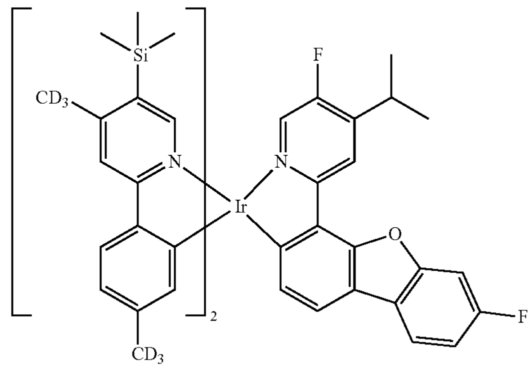
101
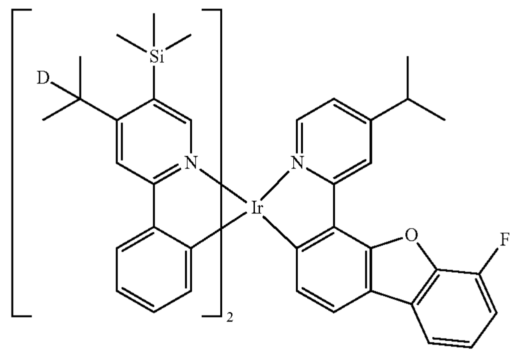
102
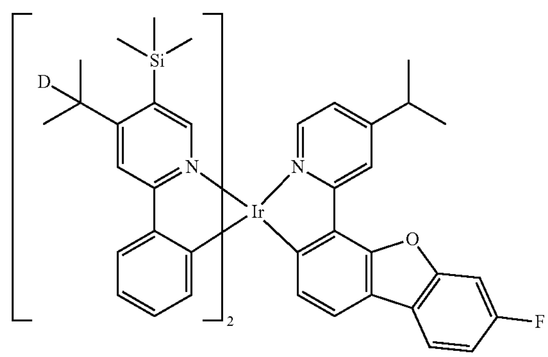
103
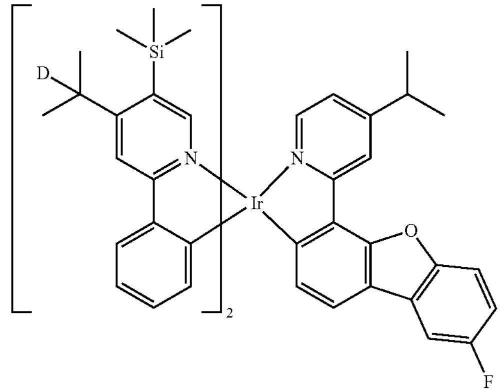

-continued
104
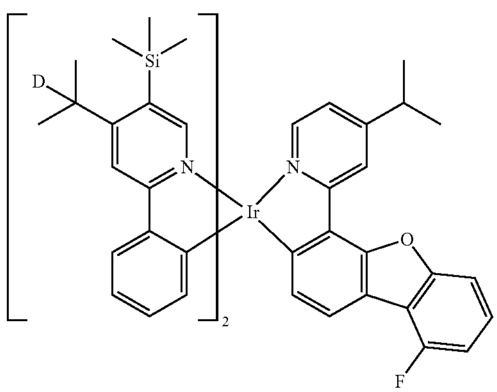
105
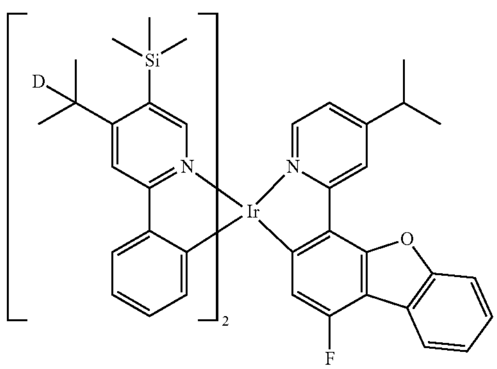
106
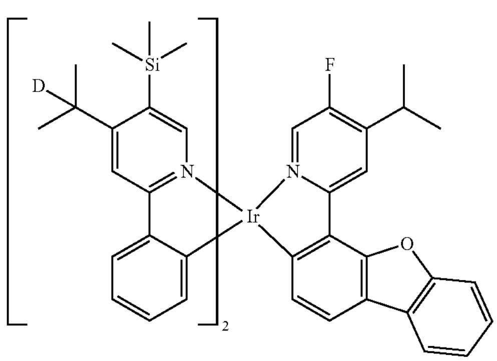
107
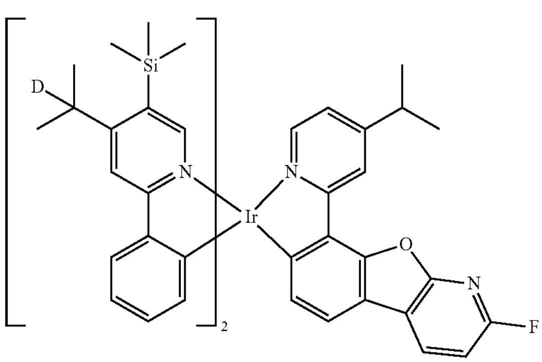
-continued
108
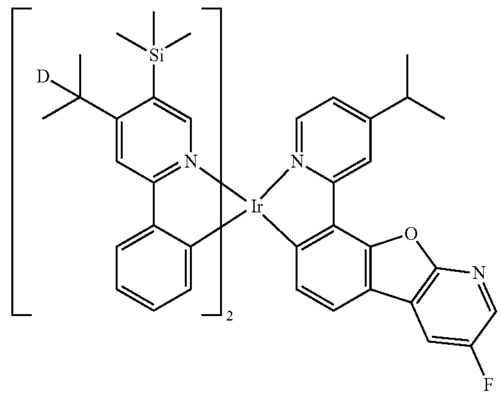
109
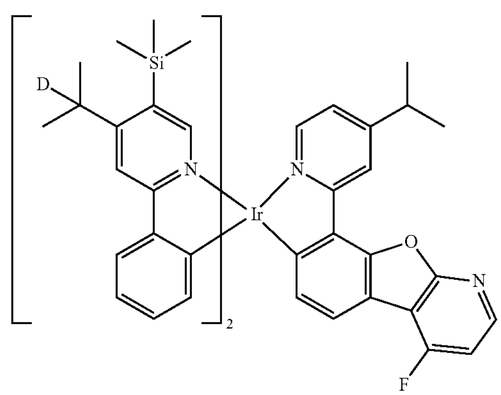
110
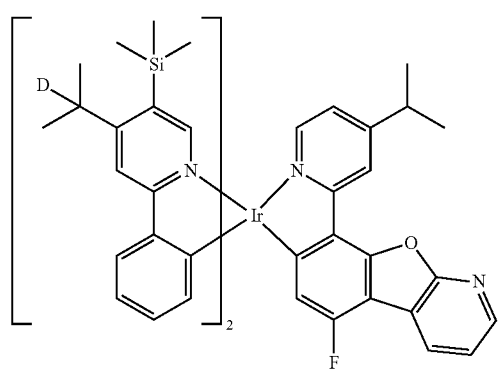
111
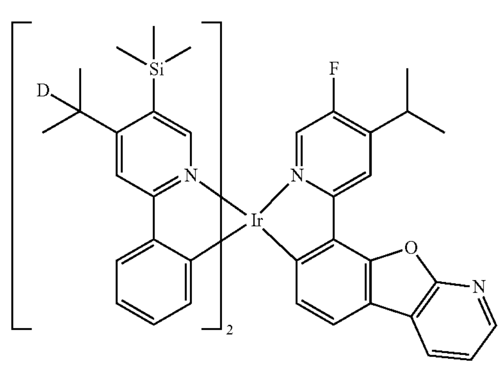

112
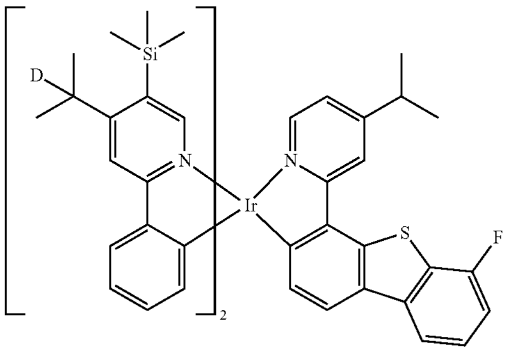
113
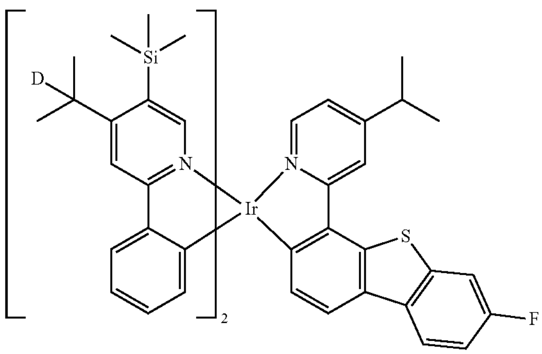
114
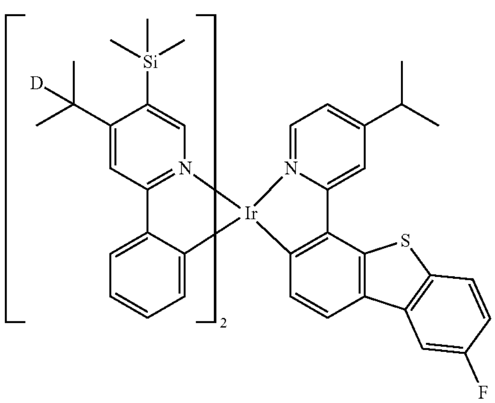
115
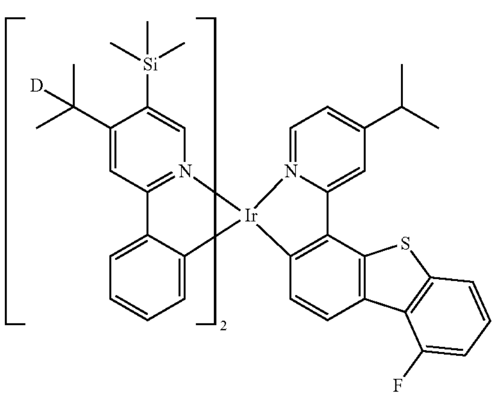
116
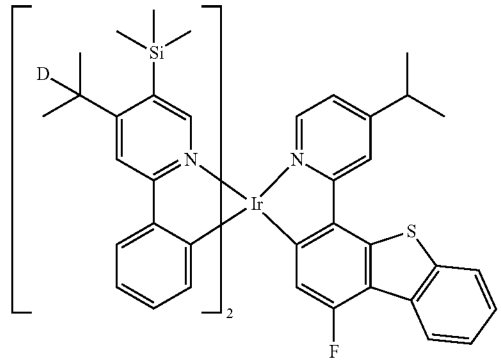
117
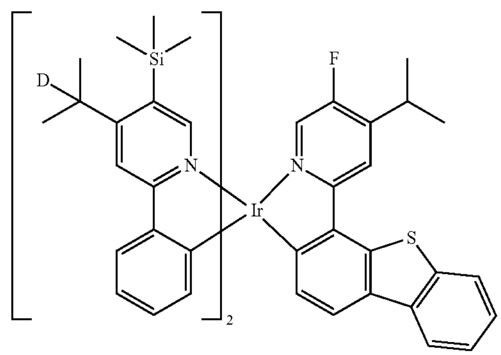
118
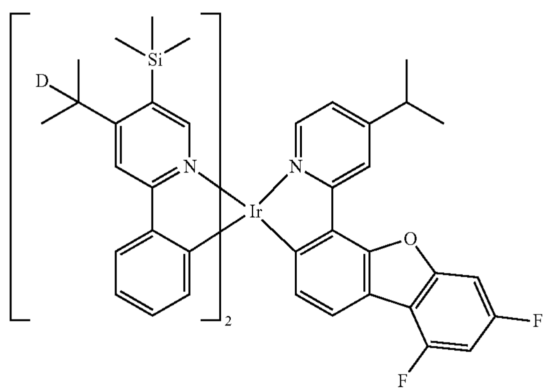
119
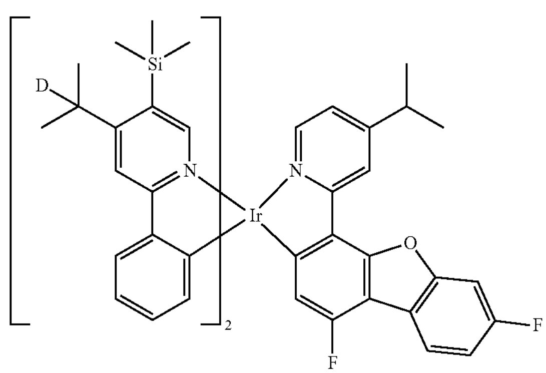

-continued
120
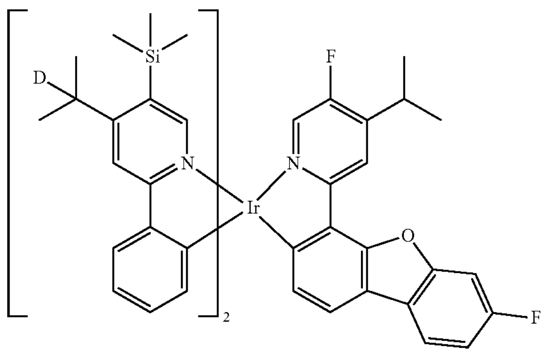
121
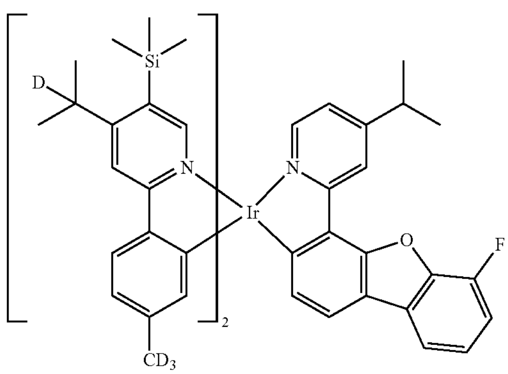
122
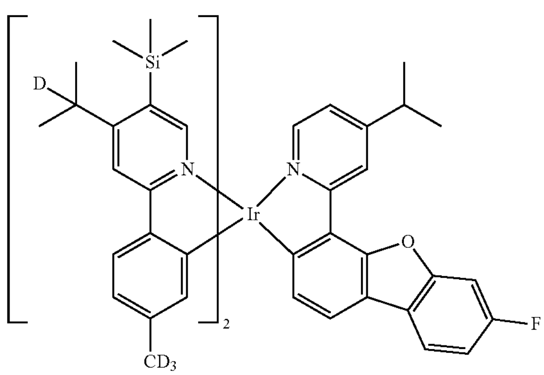
123
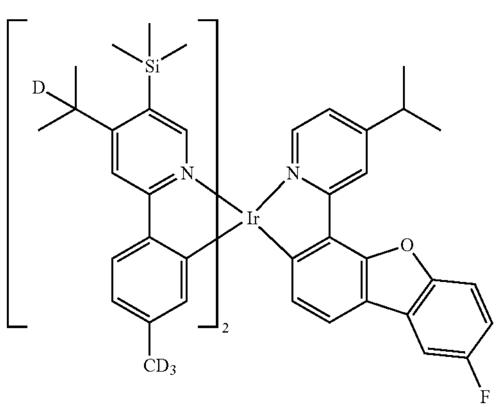
-continued
124
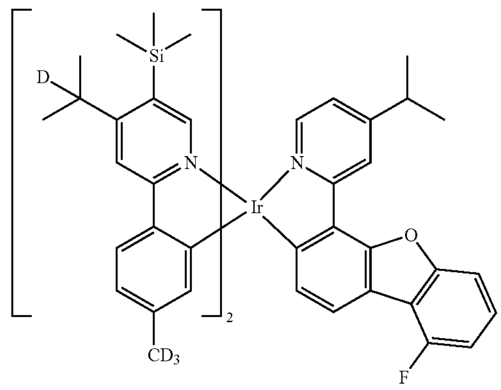
125
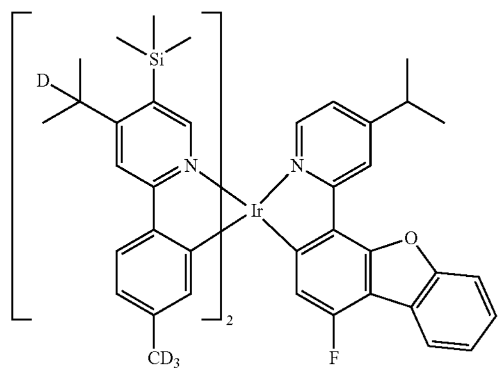
126
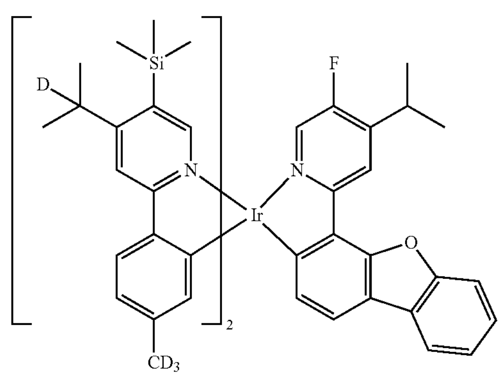
127
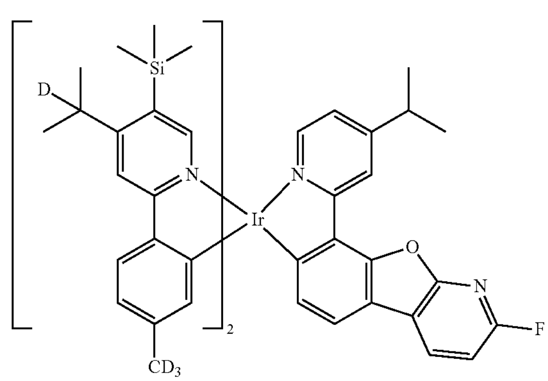

-continued
128
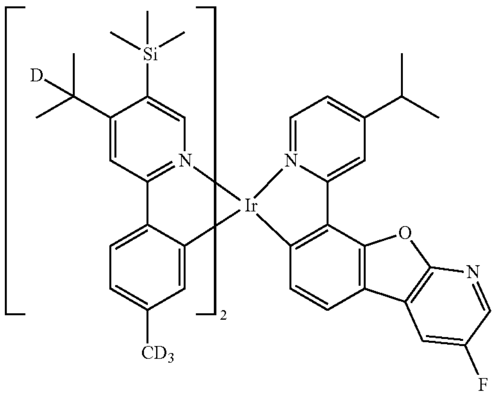
129
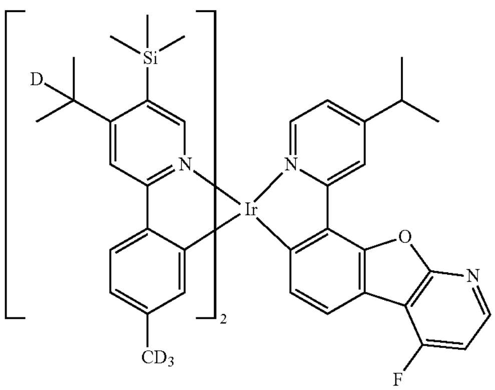
130
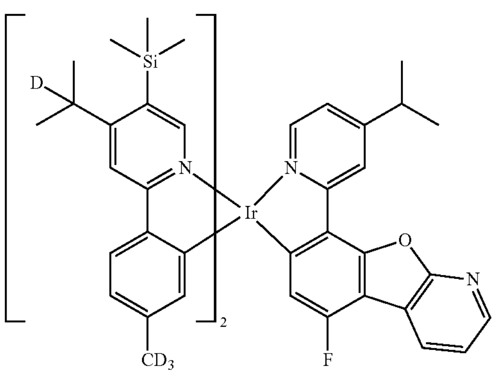
131
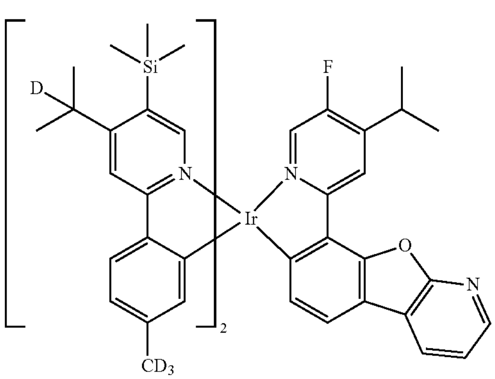
-continued
132
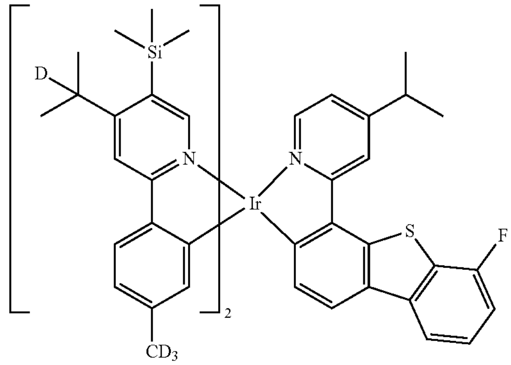
133
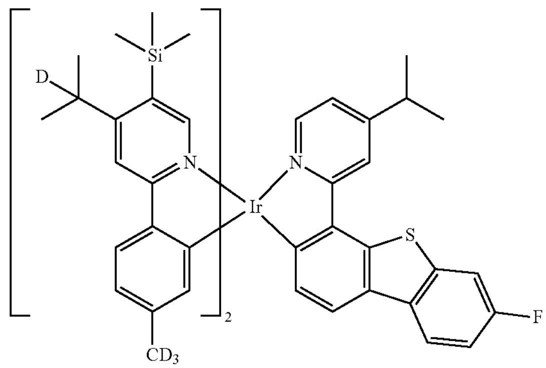
134
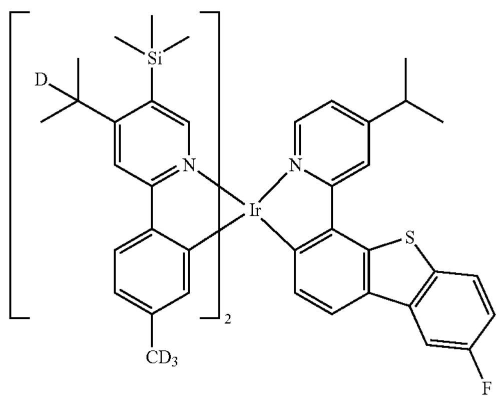
135
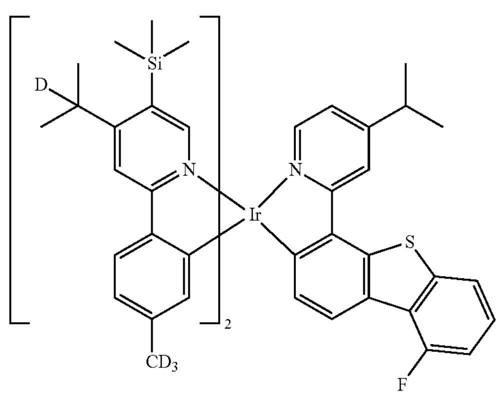

-continued
136
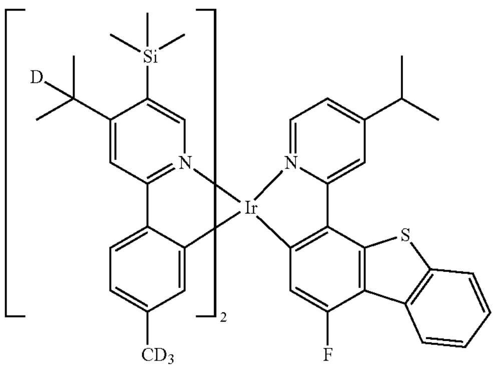
137
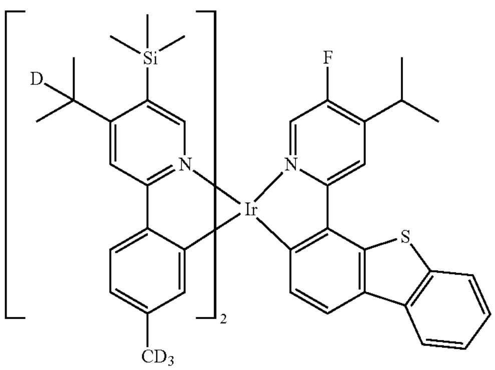
138
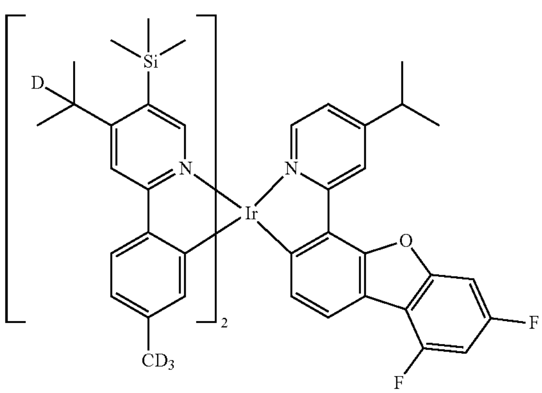
139
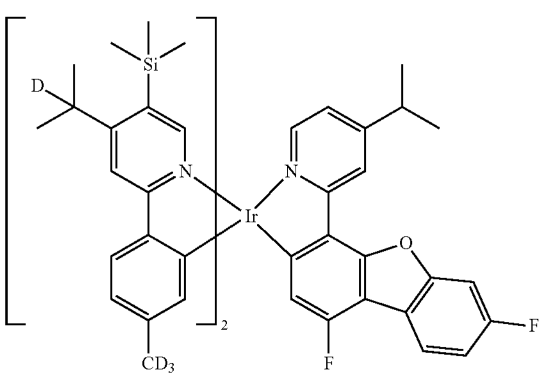
-continued
140
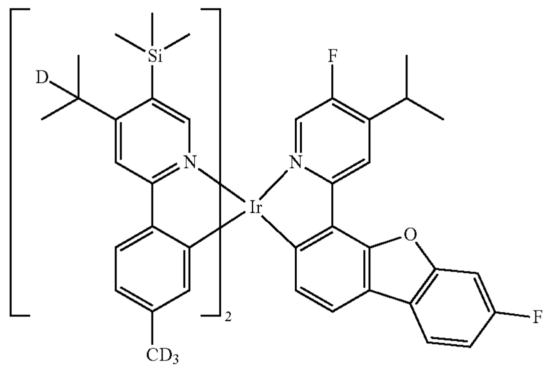
141
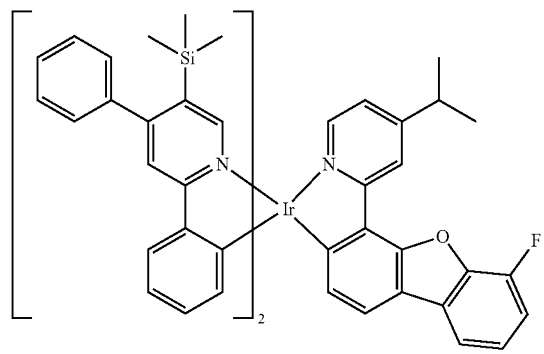
142
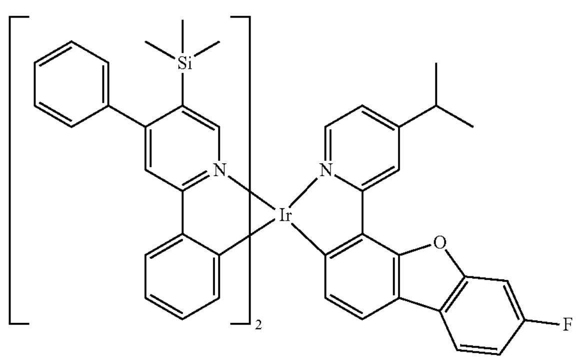
143
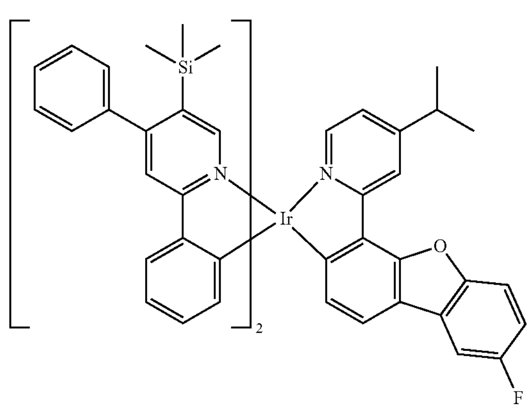

-continued
144
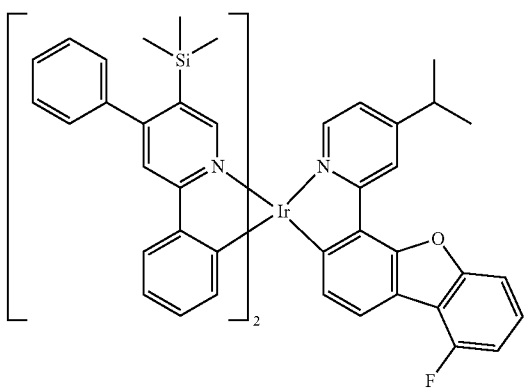
145
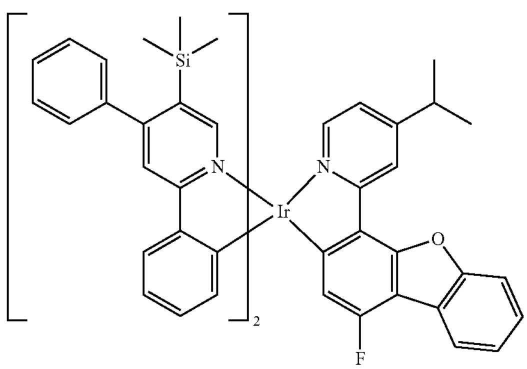
146
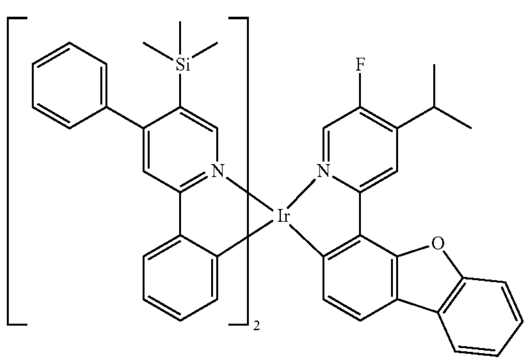
147
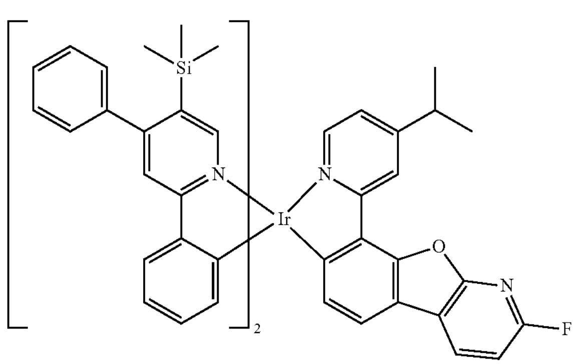
-continued
148
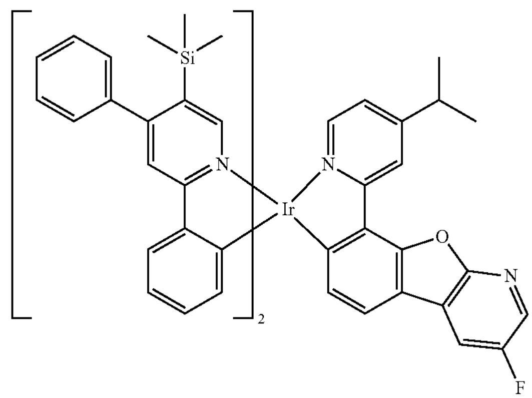
149
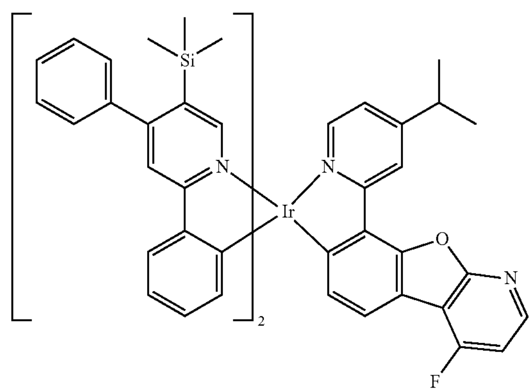
150
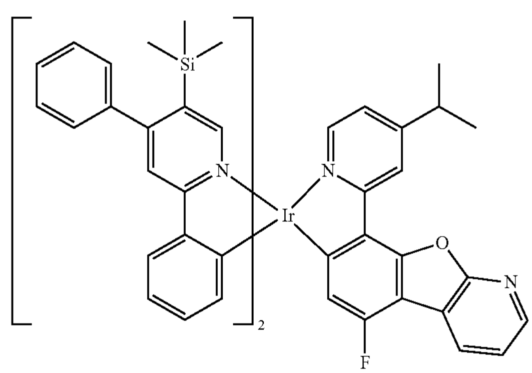
151
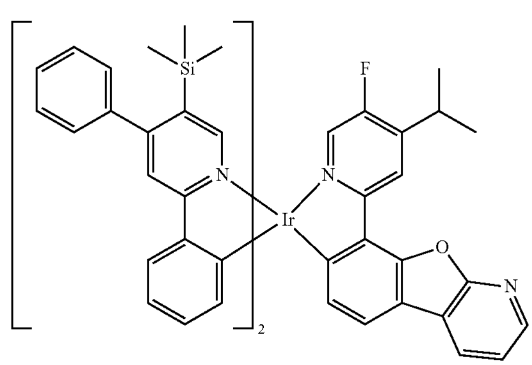

-continued
152
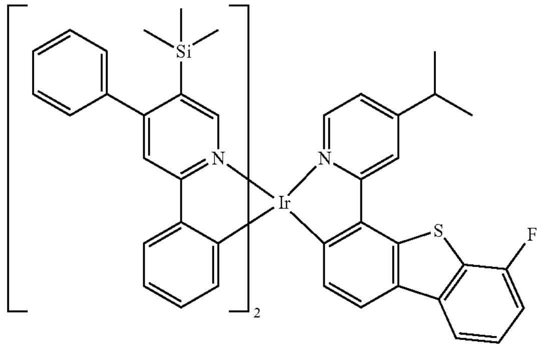
153
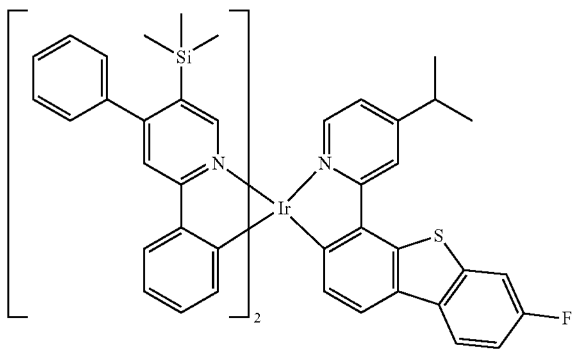
154
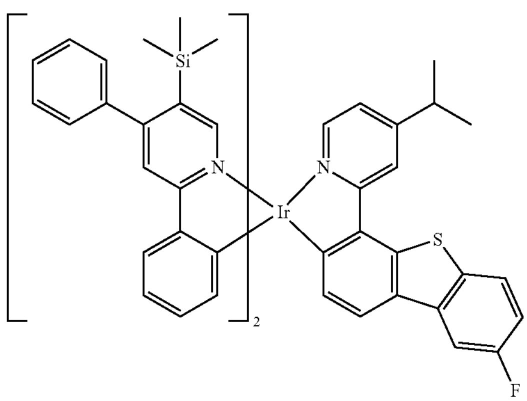
155
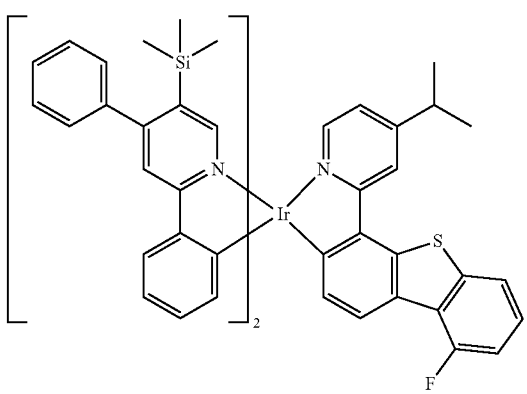
-continued
156
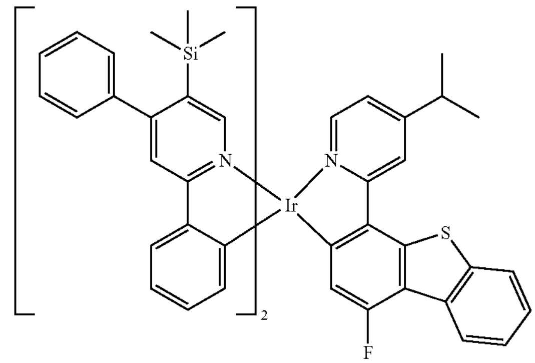
157
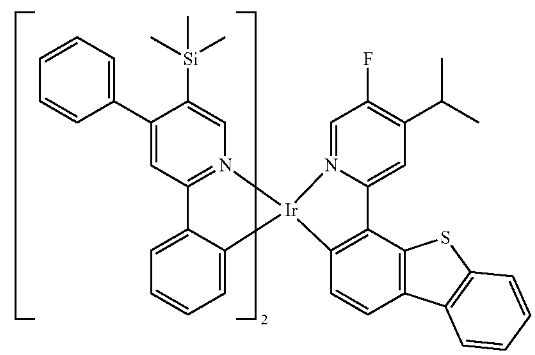
158
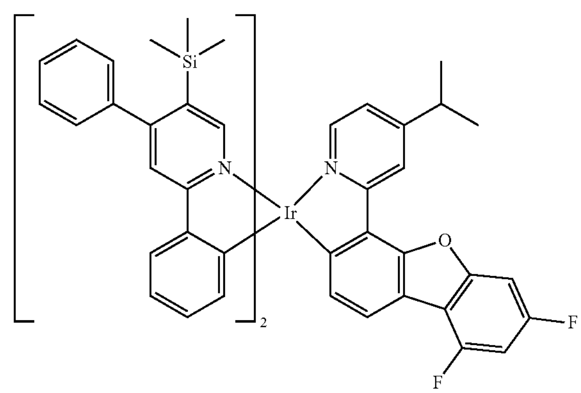
159
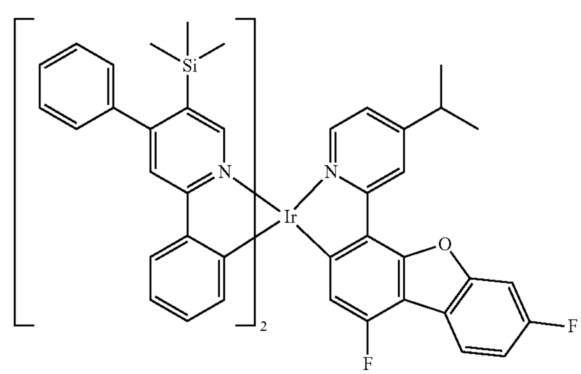

-continued
160
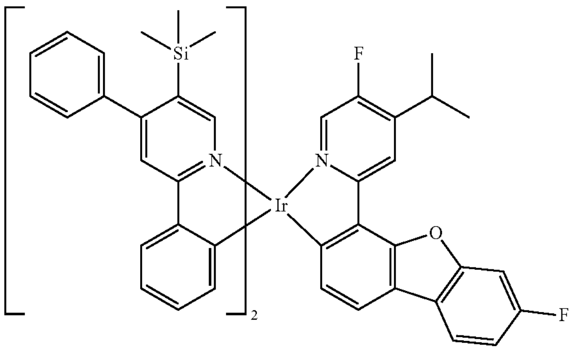
161
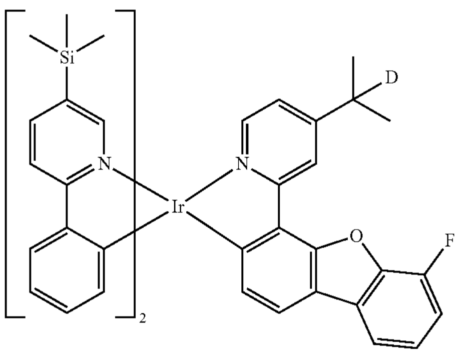
162
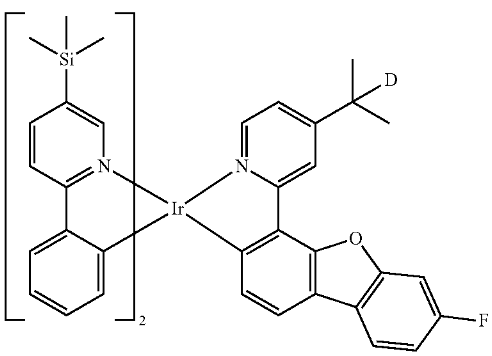
163
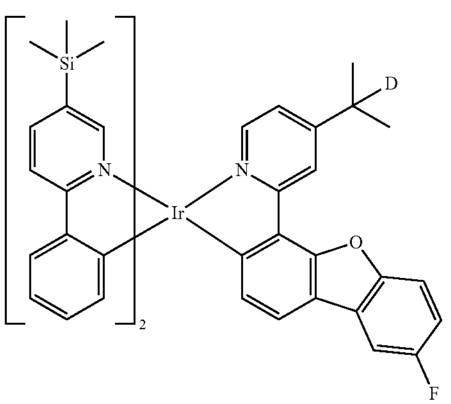
-continued
164
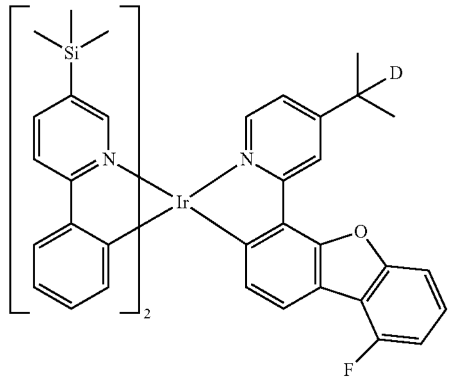
165
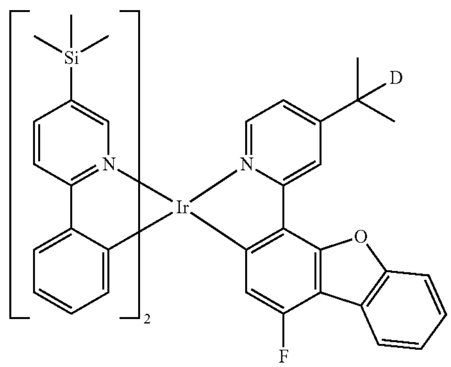
166
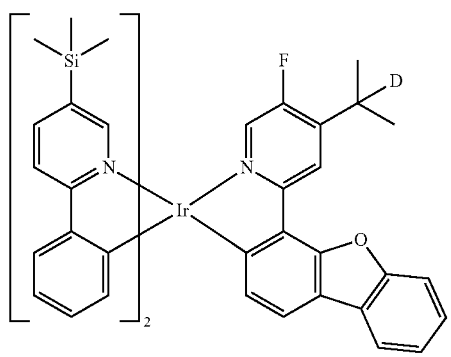
167
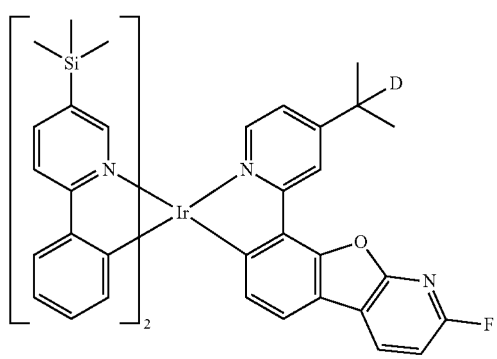

168
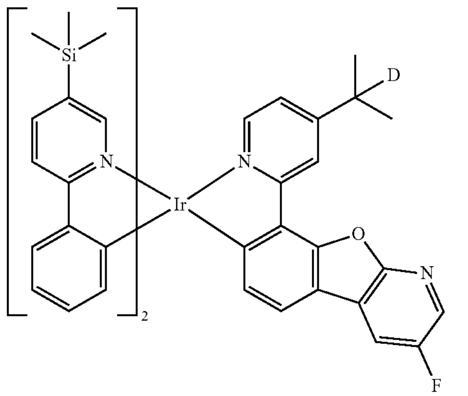
169
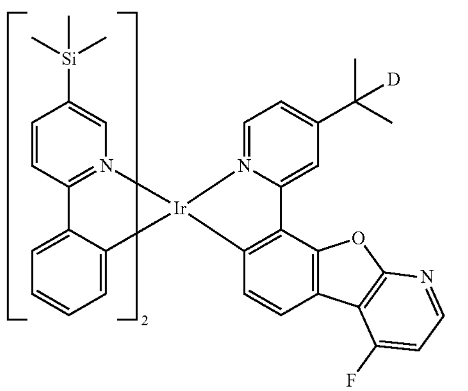
170
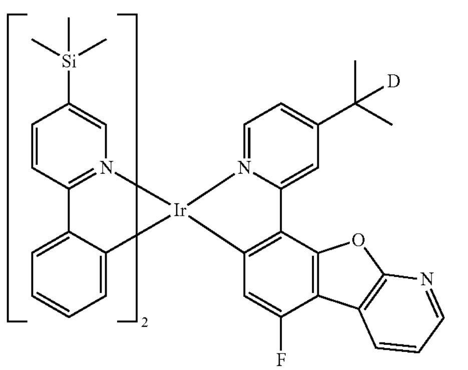
171
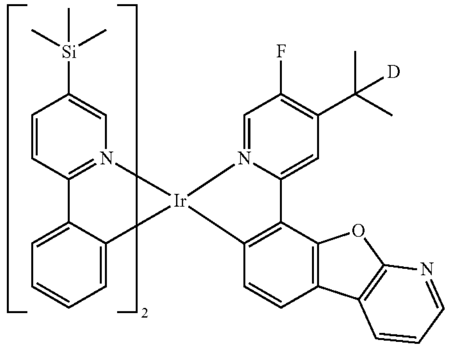
172
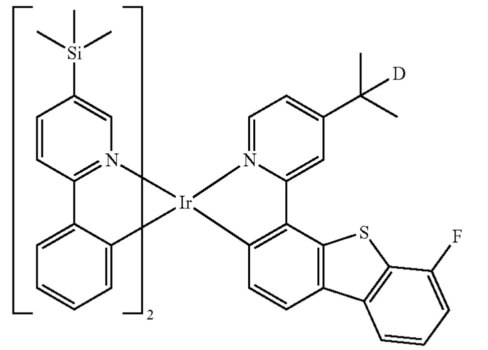
173
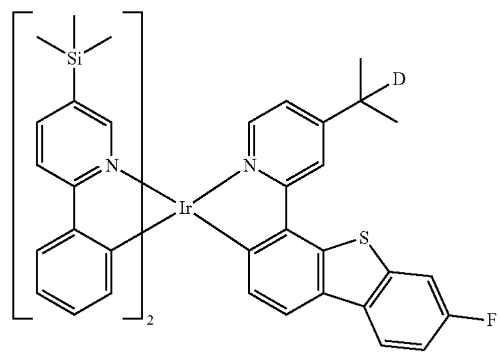
174
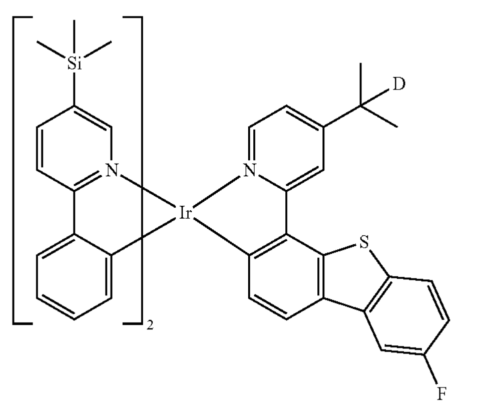
175
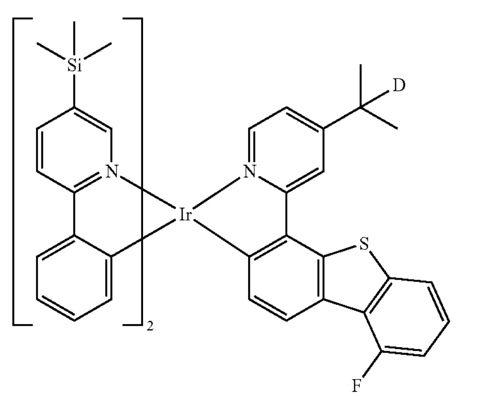

-continued
176
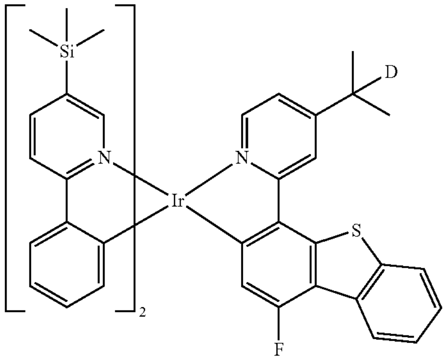
177
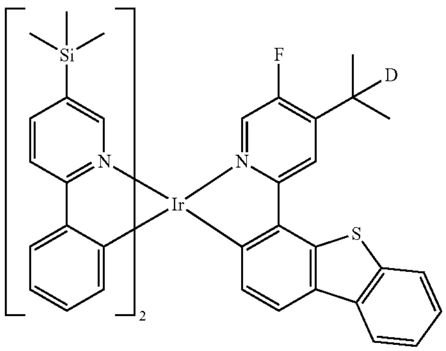
178
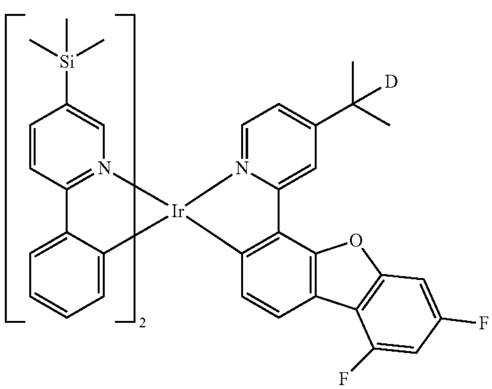
179
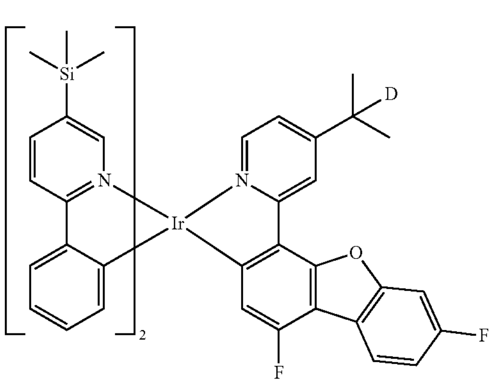
-continued
180
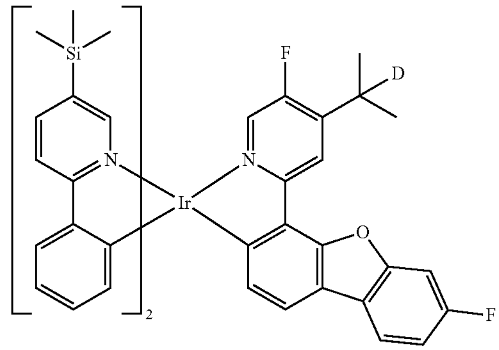
181
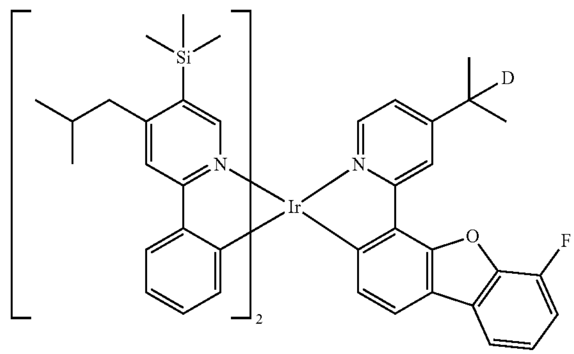
182
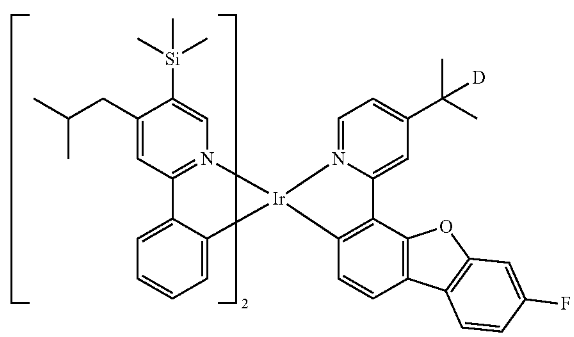
183
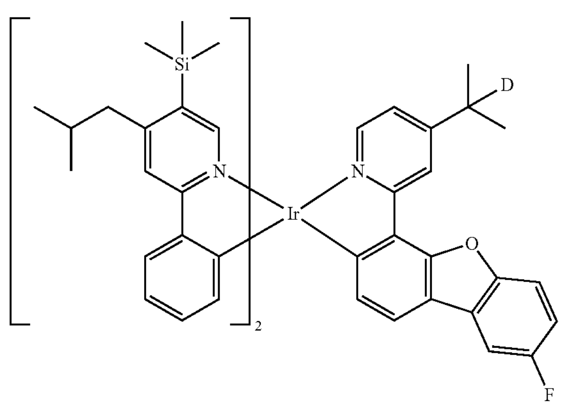

-continued
184
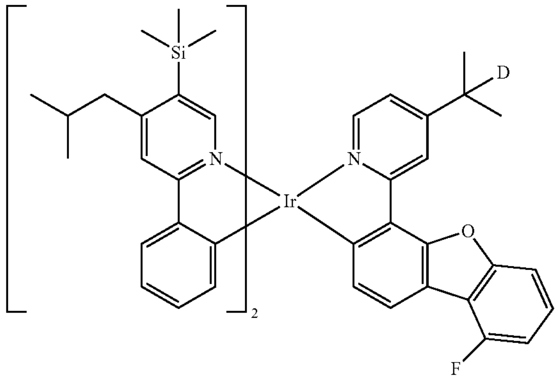
185
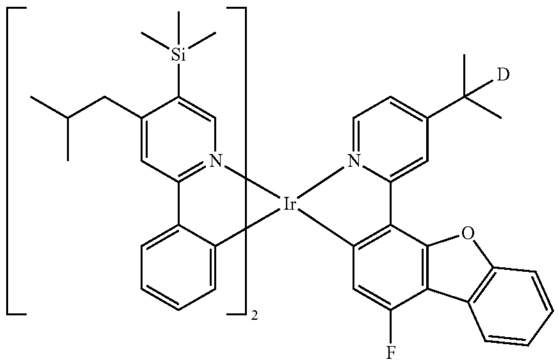
186
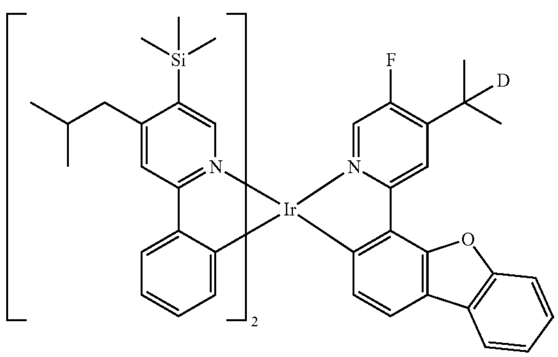
187
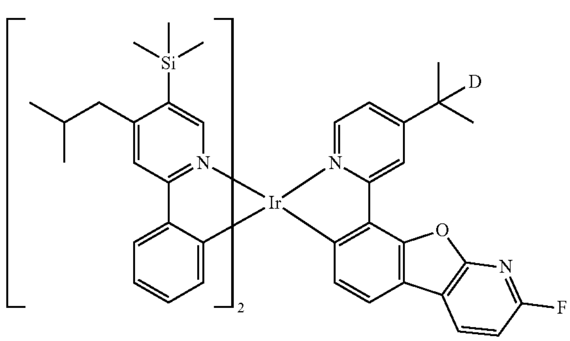
-continued
188
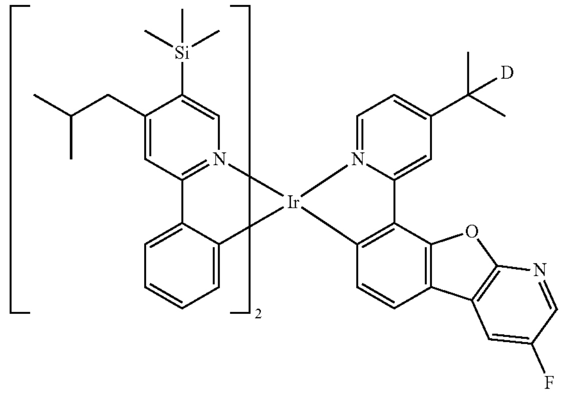
189
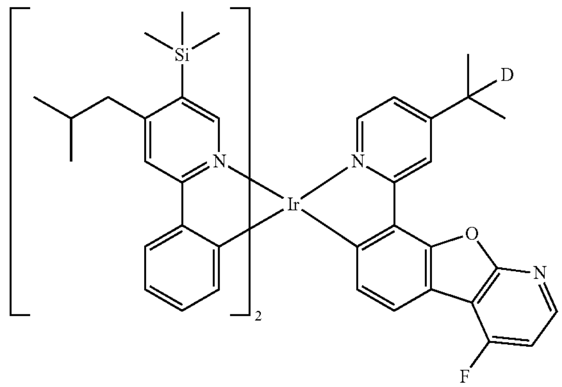
190
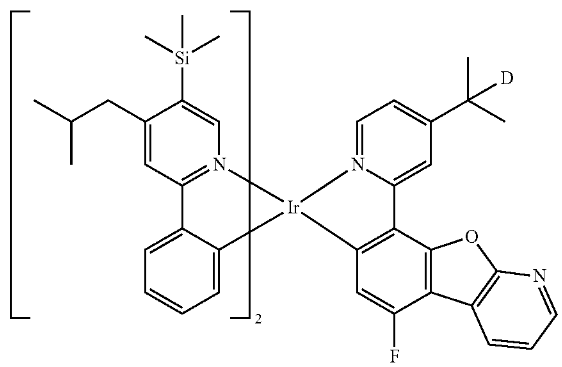
191
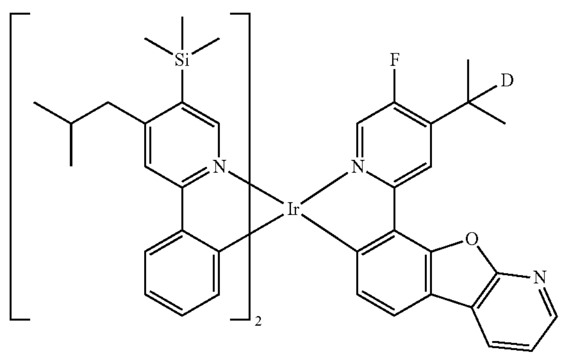

-continued
192
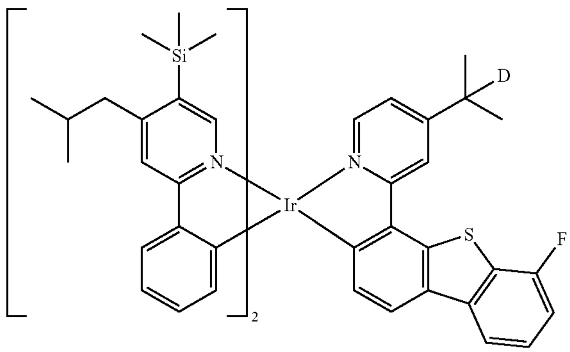
193
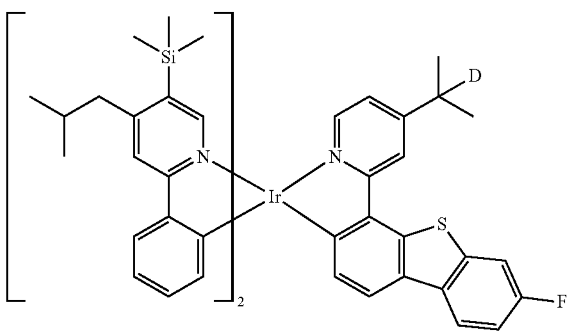
194
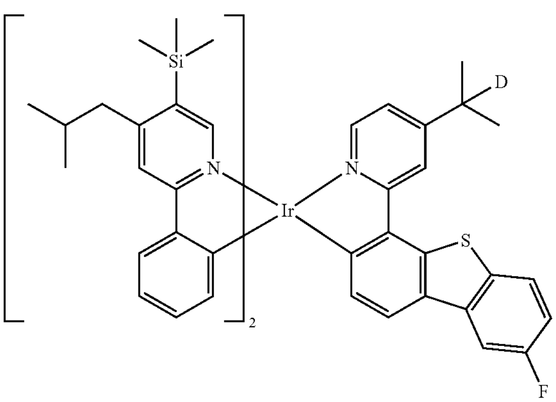
195
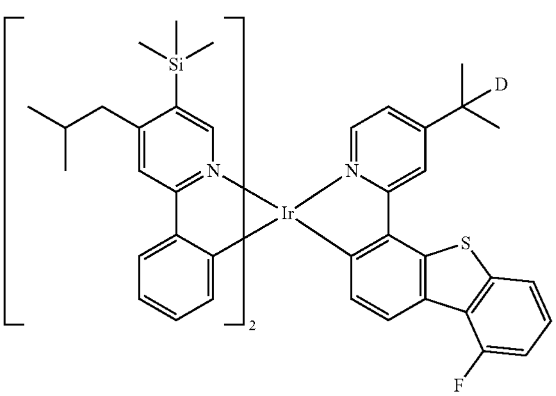
-continued
196
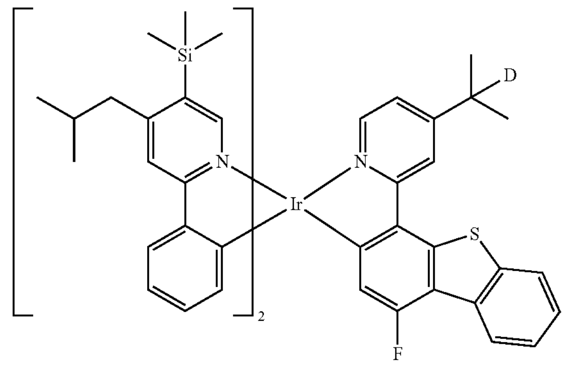
197
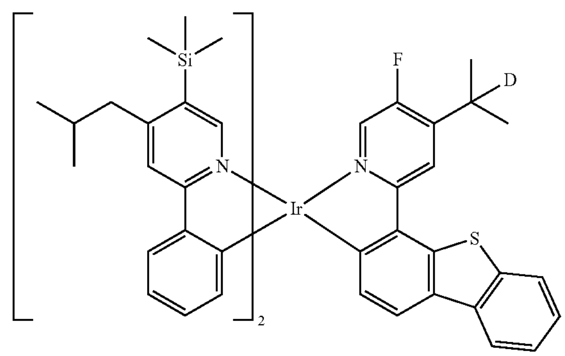
198
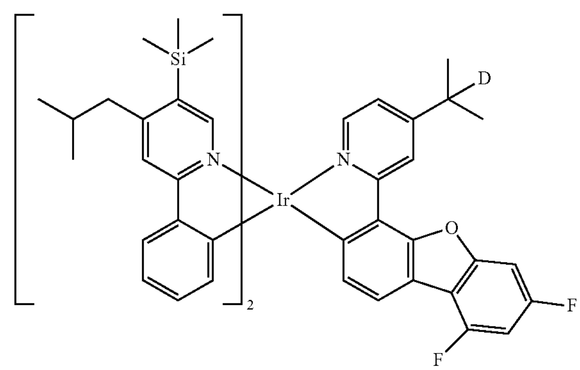
199
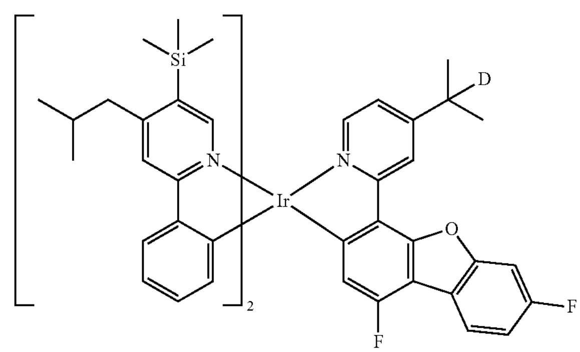

-continued
200
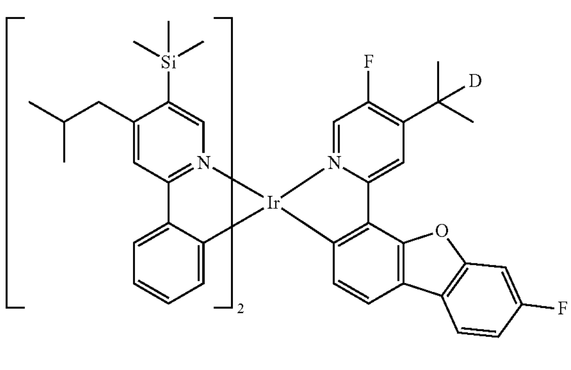
201
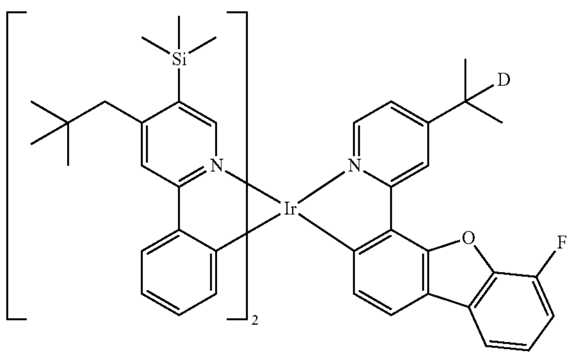
202
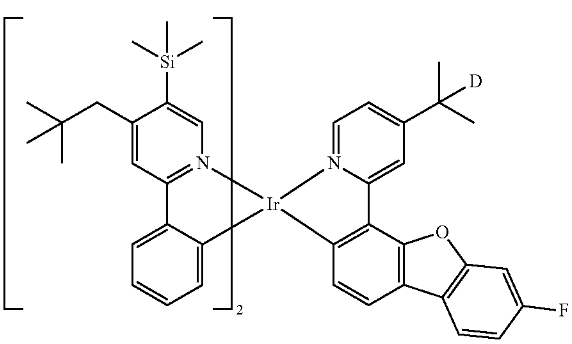
203
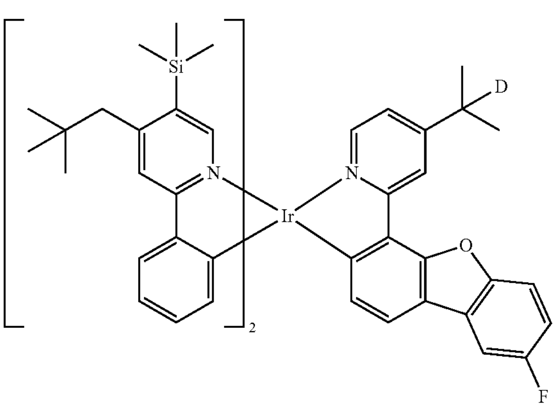
-continued
204
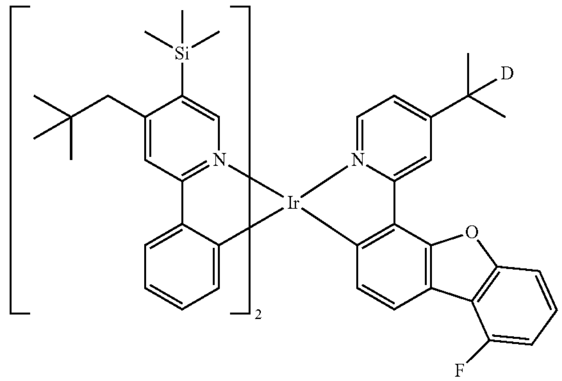
205
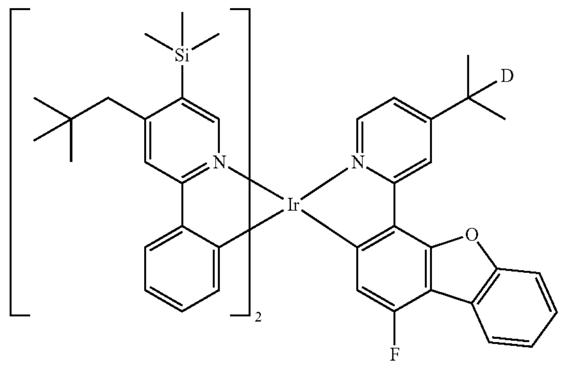
206
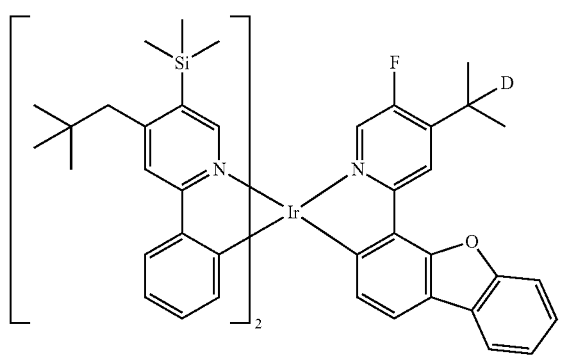
207
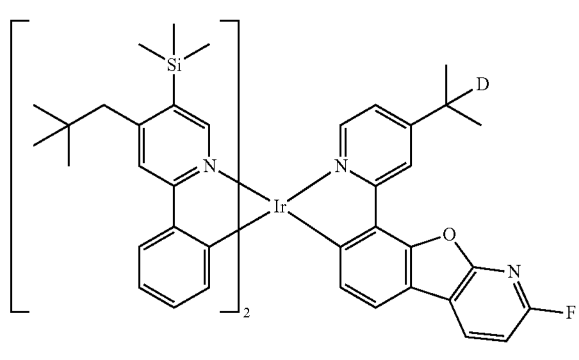

-continued
208
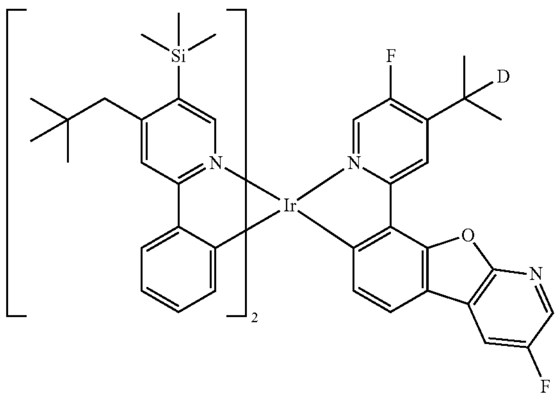
209
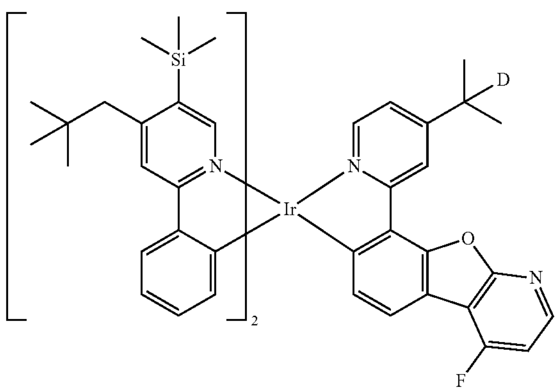
210
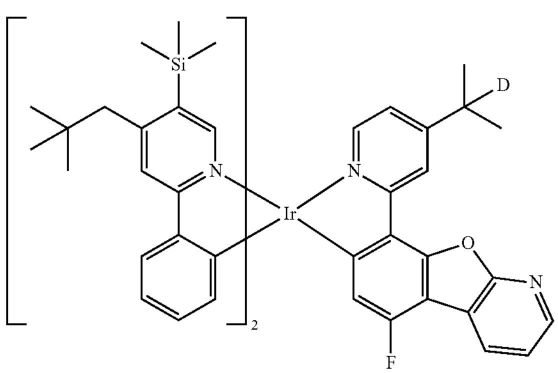
211
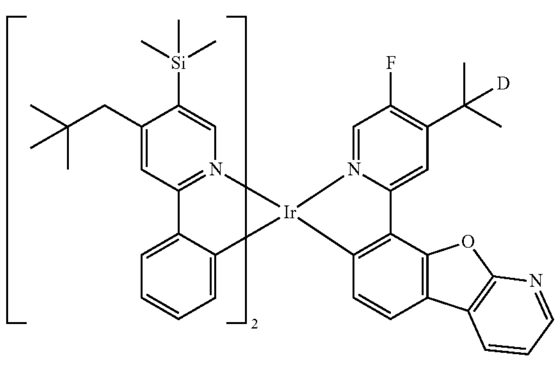
-continued
212
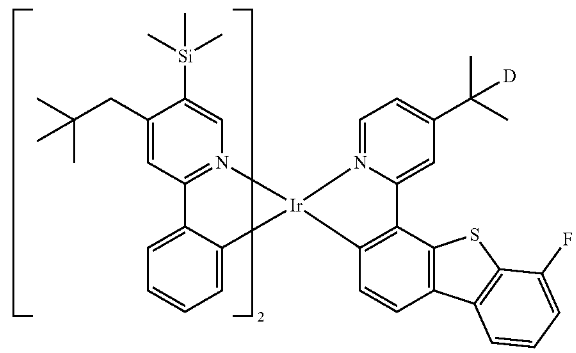
213
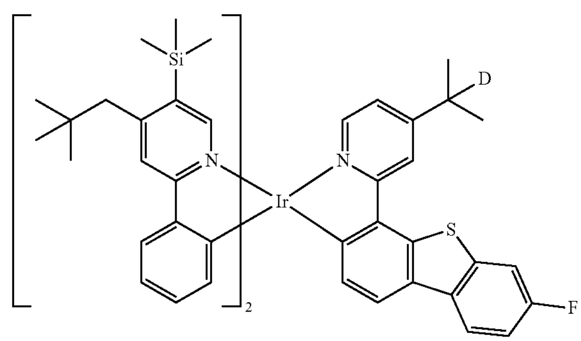
214
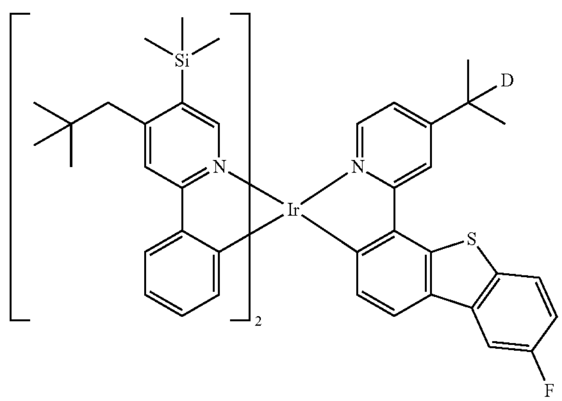
215
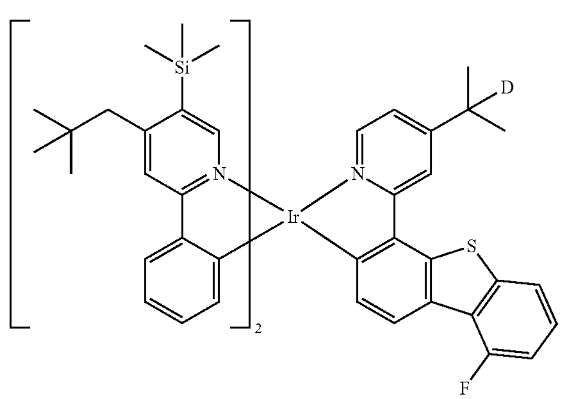

-continued
216
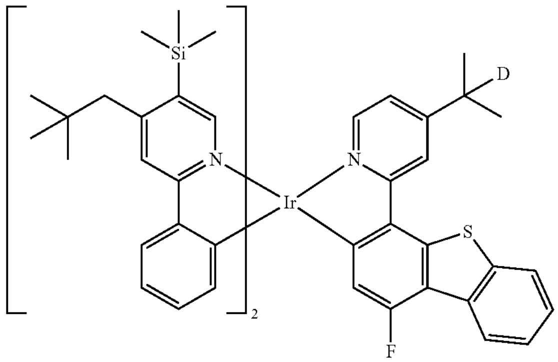
217
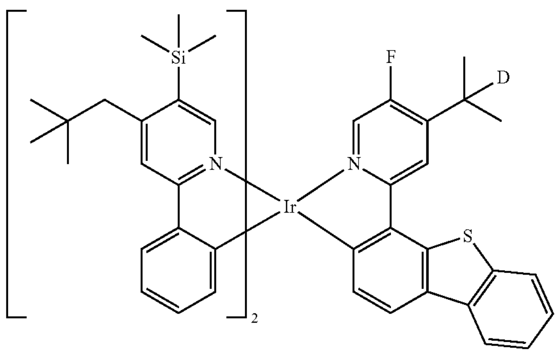
218
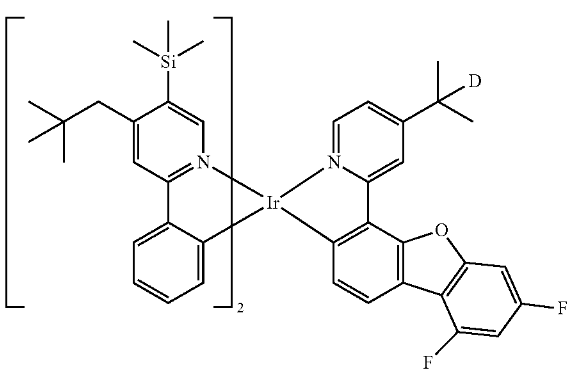
219
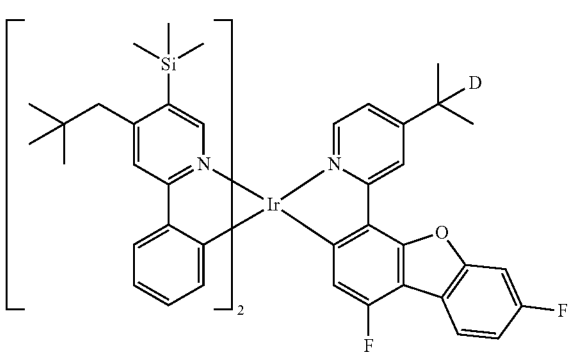
-continued
220
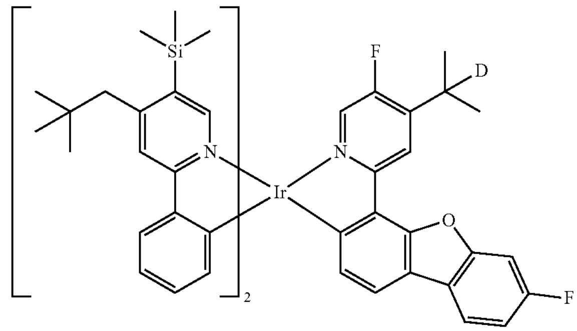
221
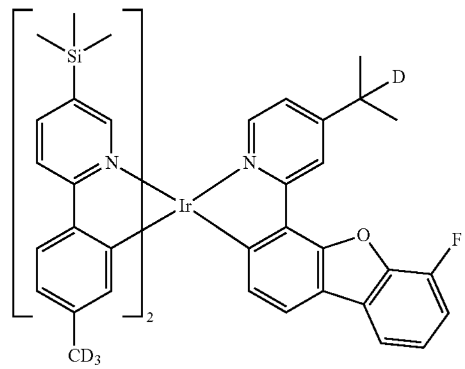
222
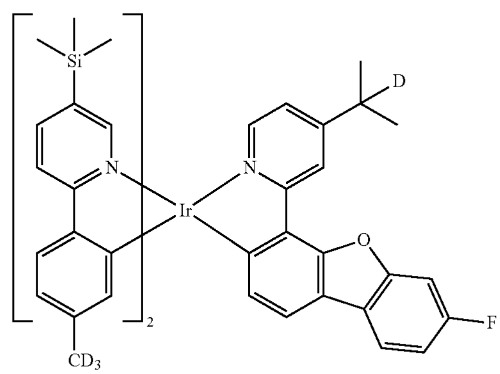
223
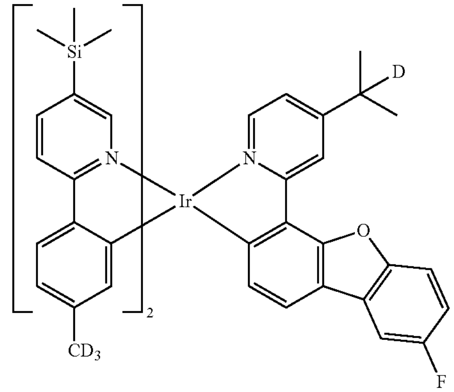

224
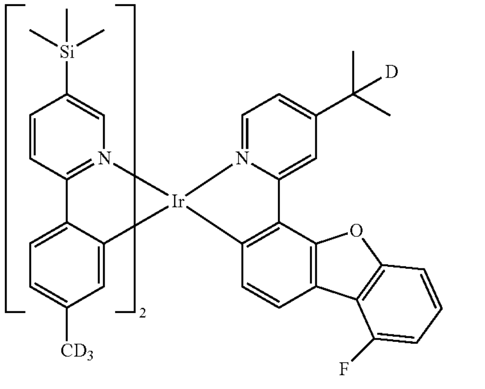
225
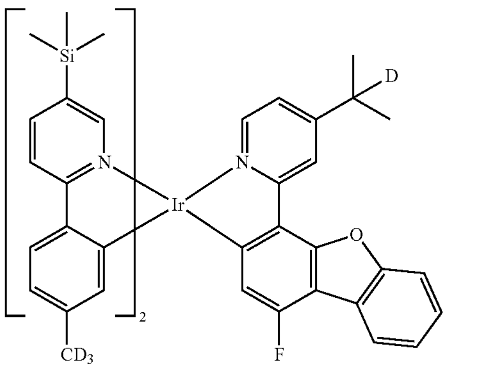
226
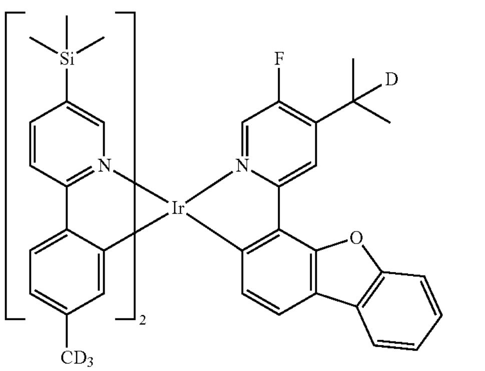
227
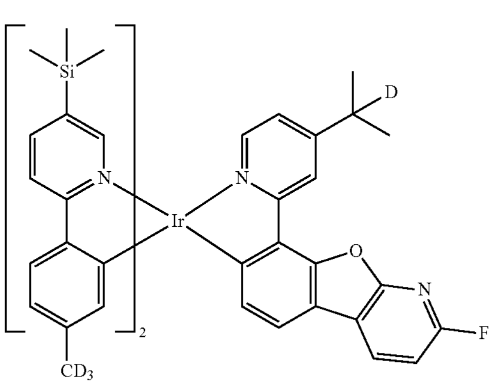
228
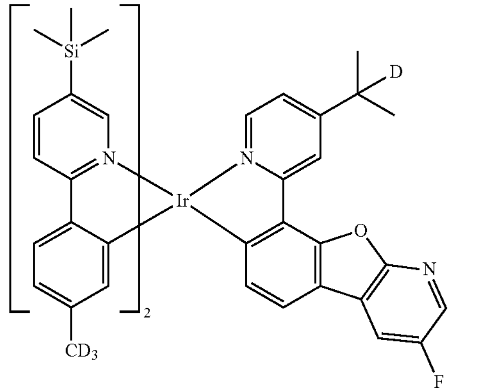
229
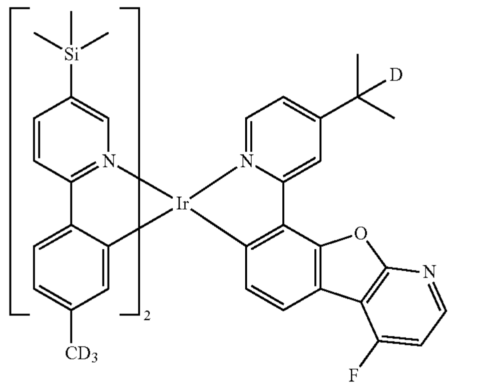
230
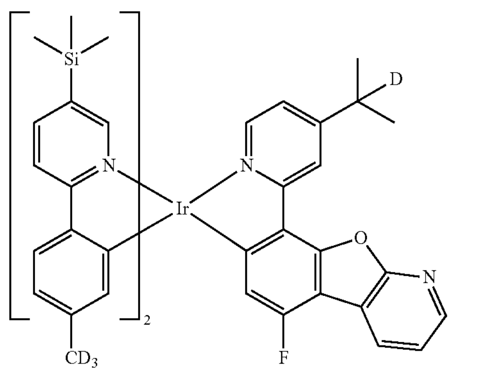
231
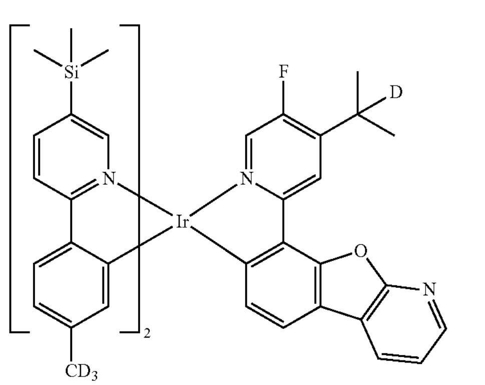

232
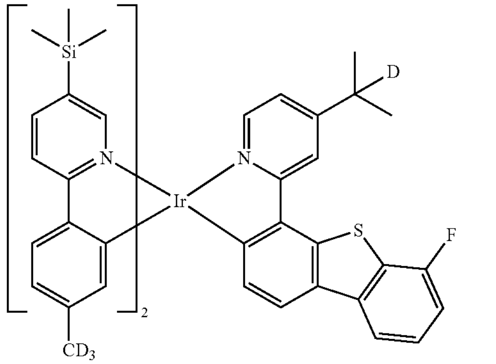
233
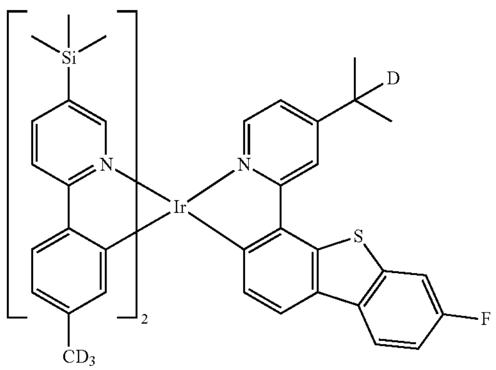
234
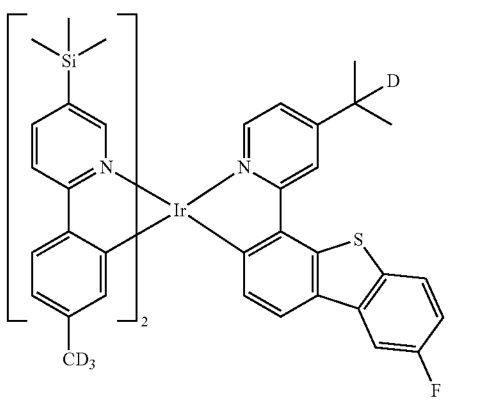
235
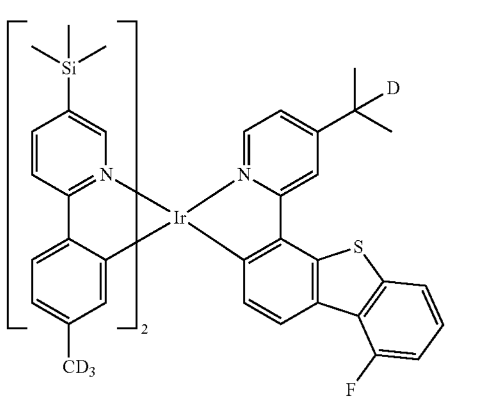
236
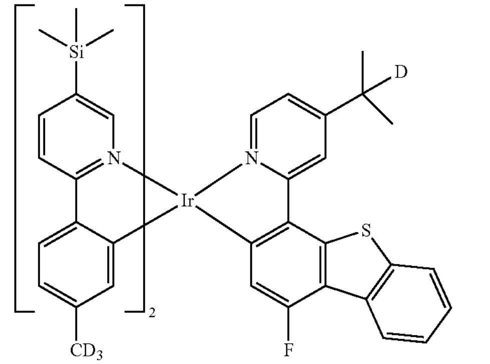
237
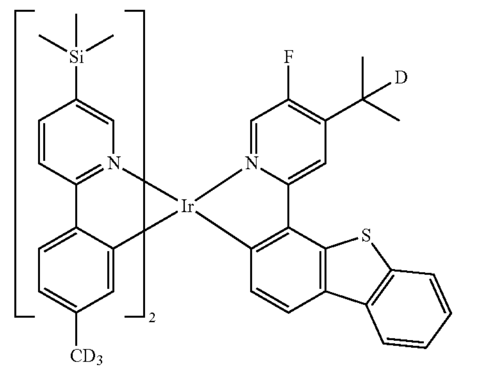
238
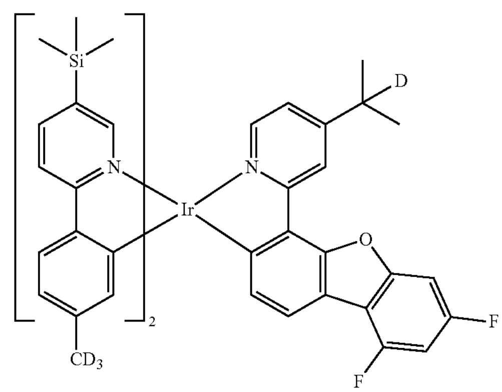
239
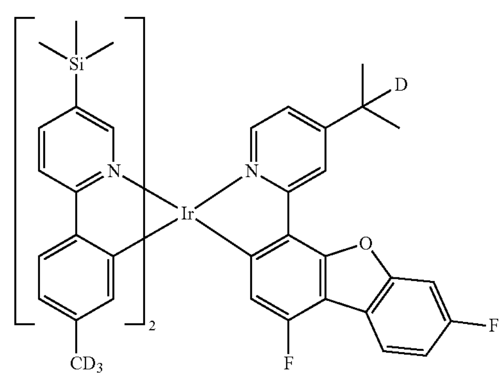

240
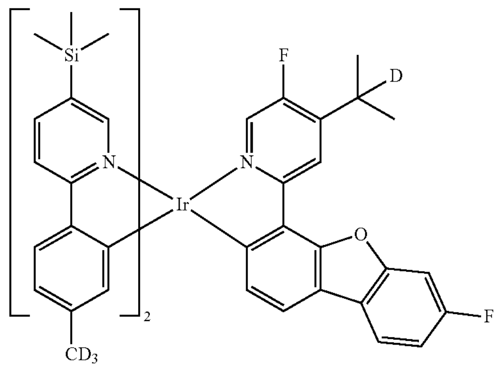
241
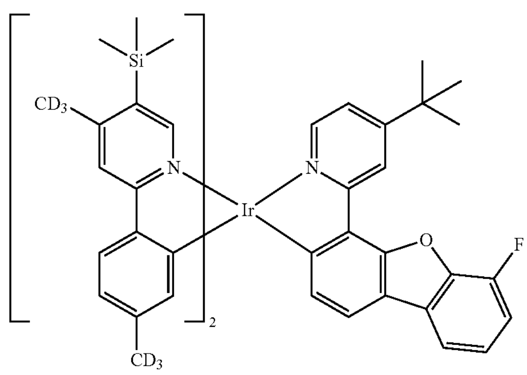
242
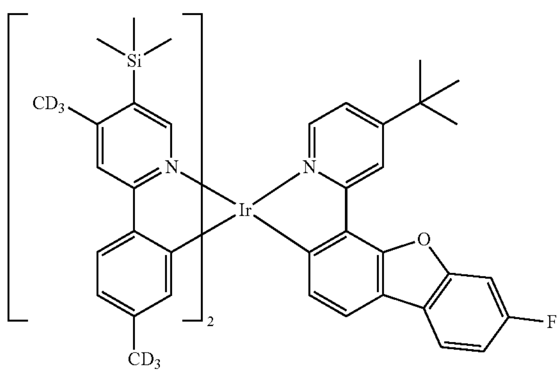
243
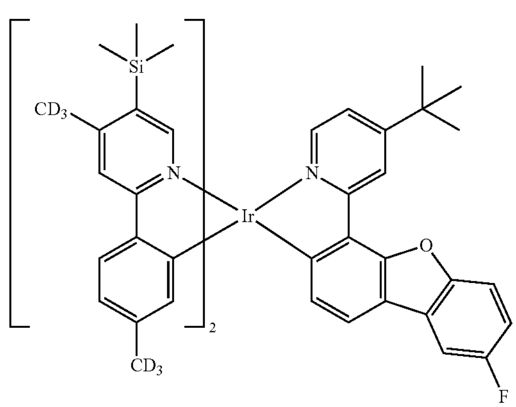
244
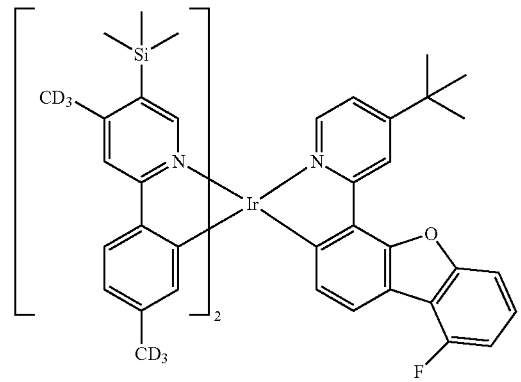
245
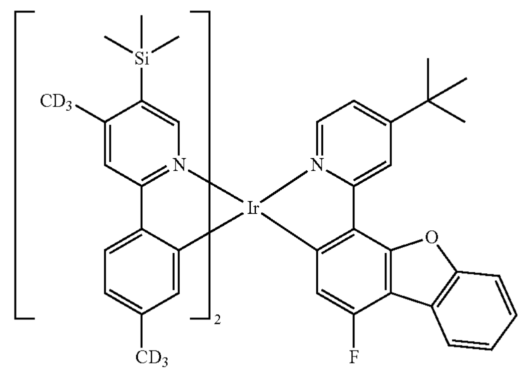
246
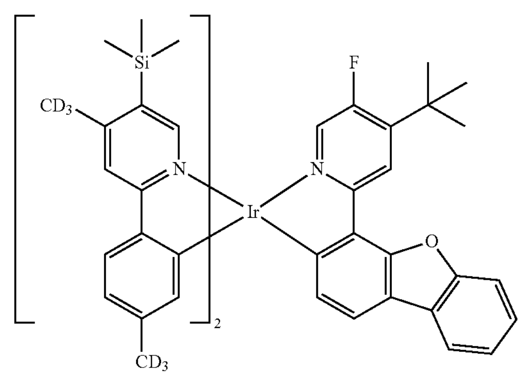
247
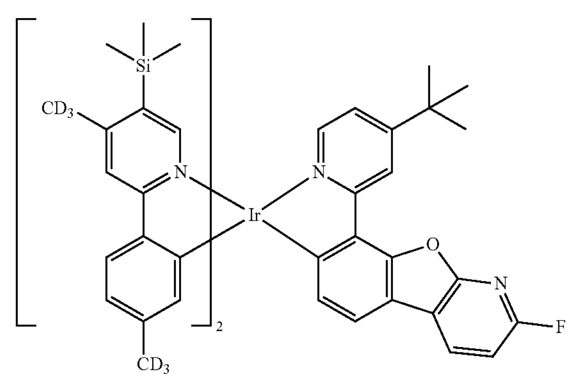

-continued
248
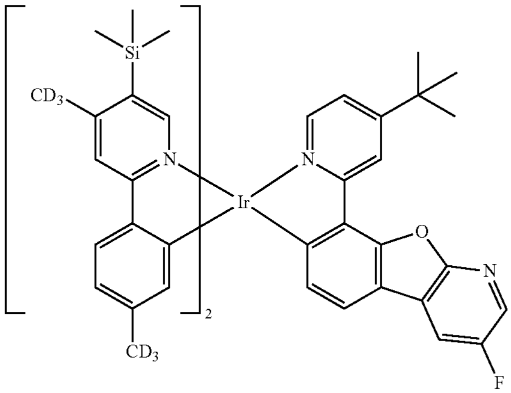
249
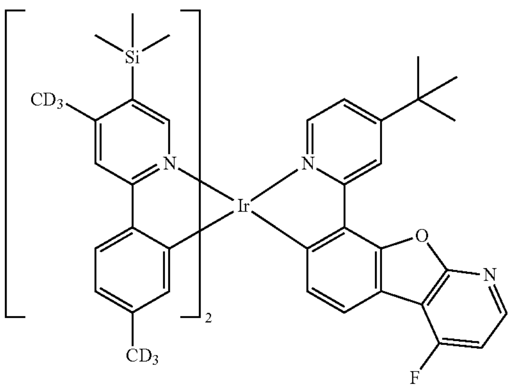
250
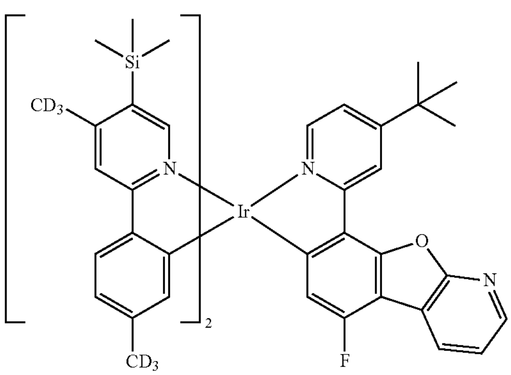
251
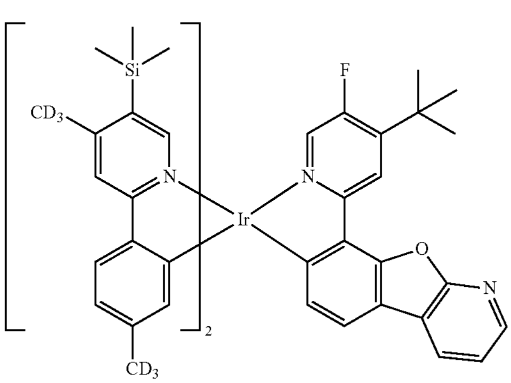
-continued
252
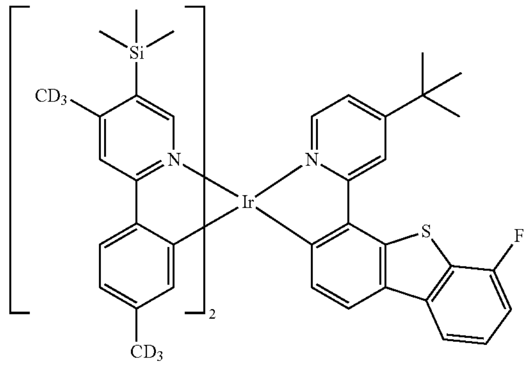
253
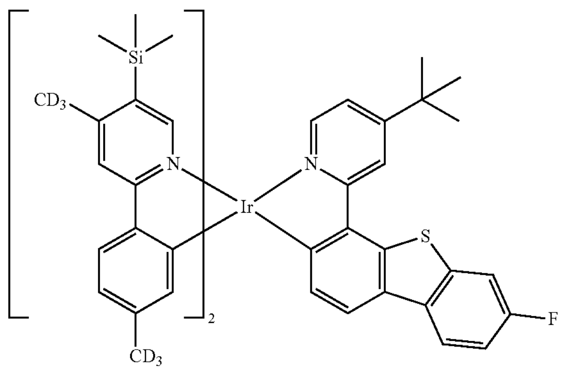
254
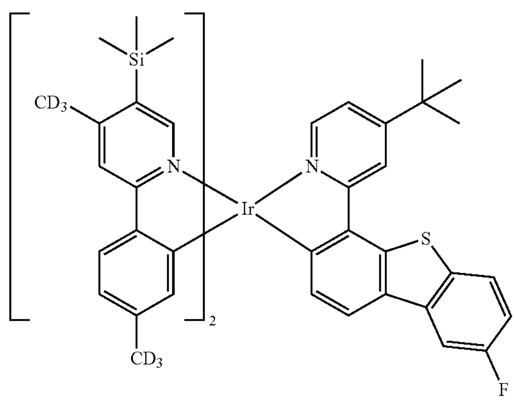
255
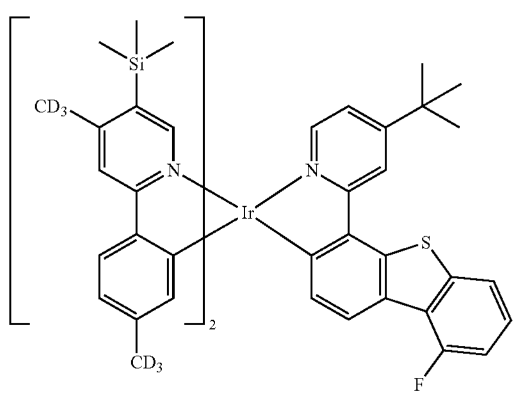

-continued
256
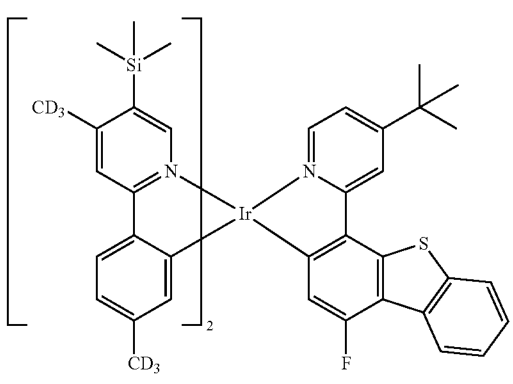
257
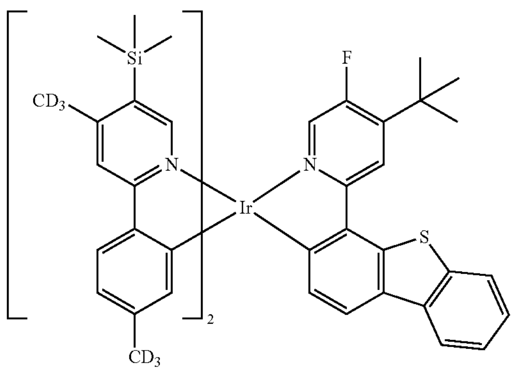
258
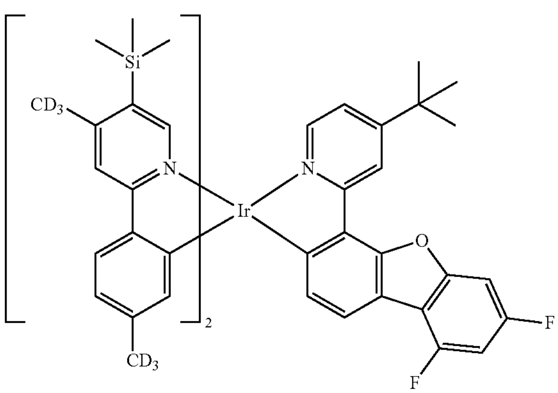
259
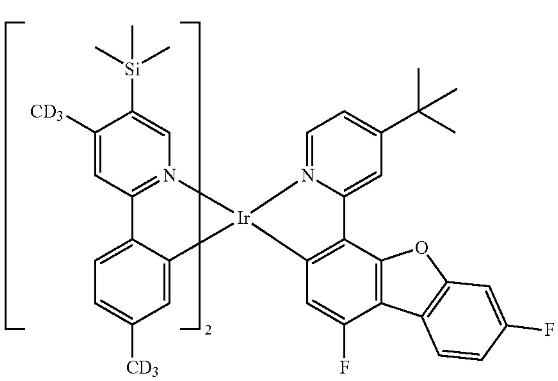
-continued
260
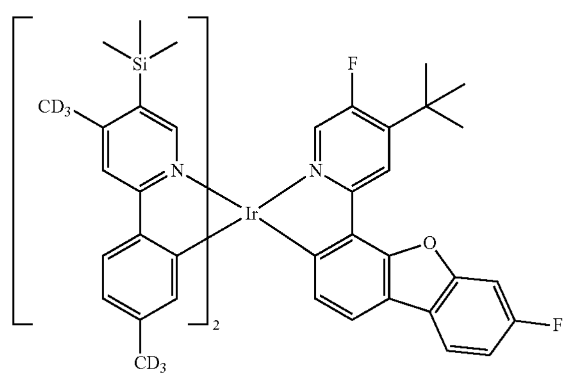
261
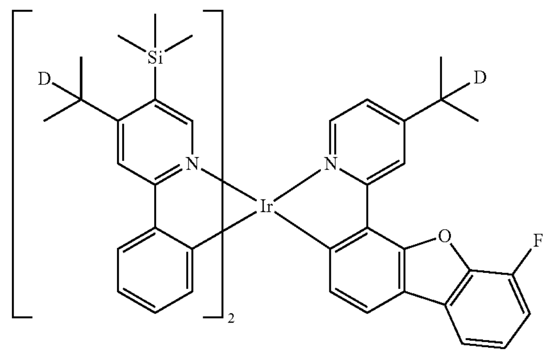
262
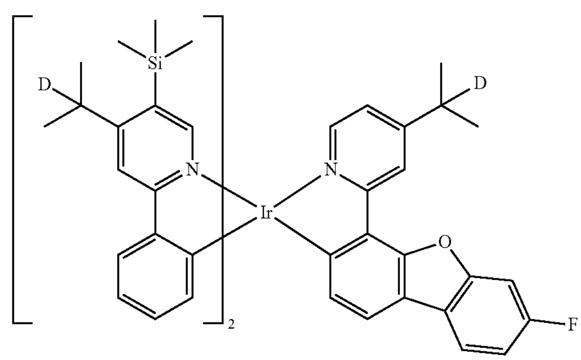
263
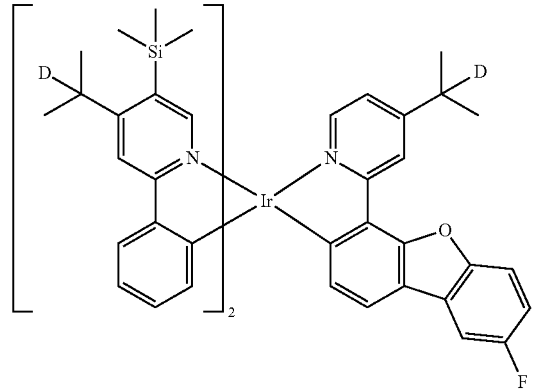

264
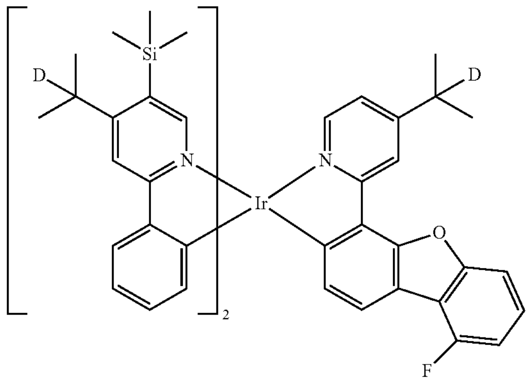
265
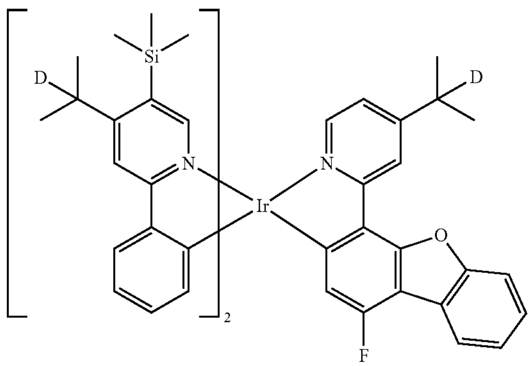
266
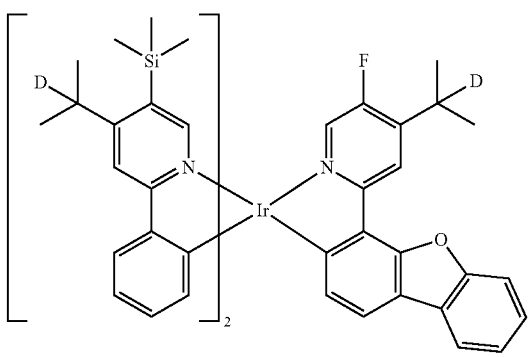
267
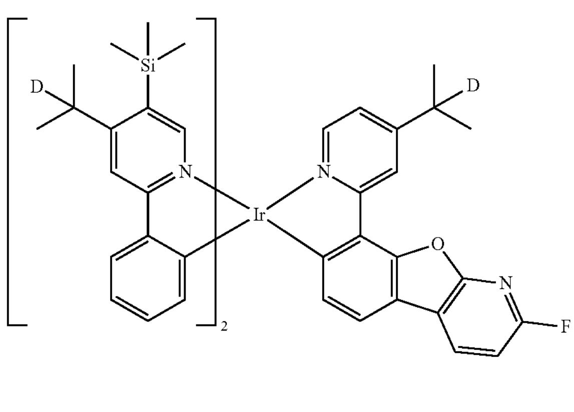
268
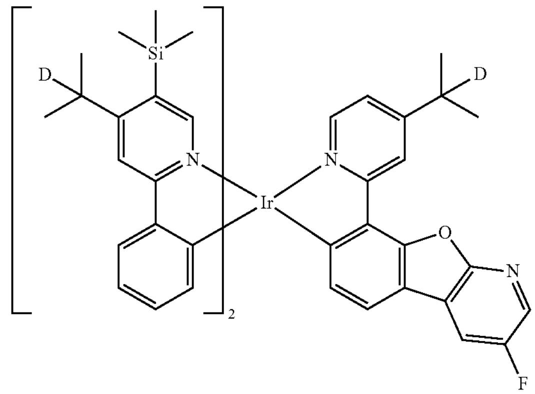
269
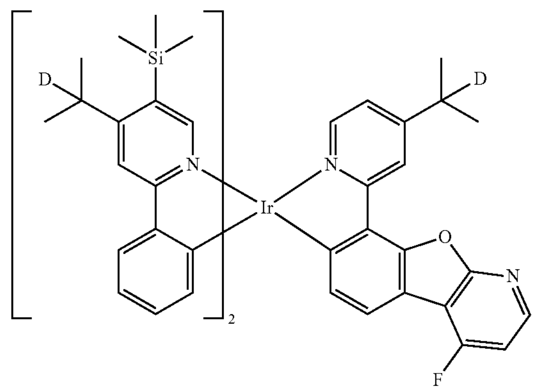
270
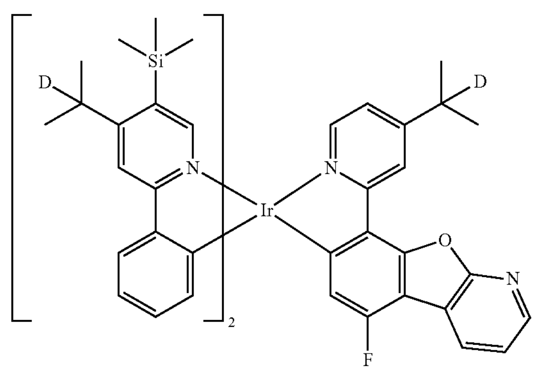
271
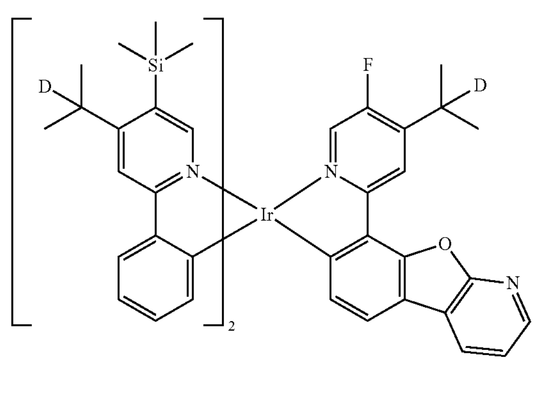

-continued
272
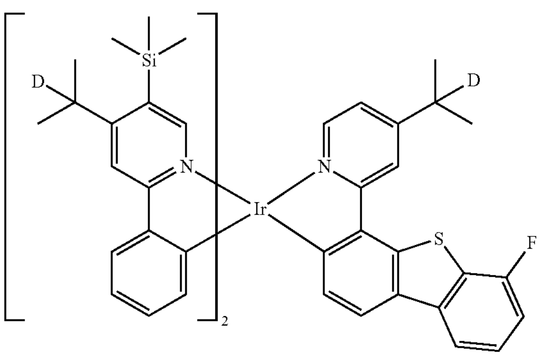
273
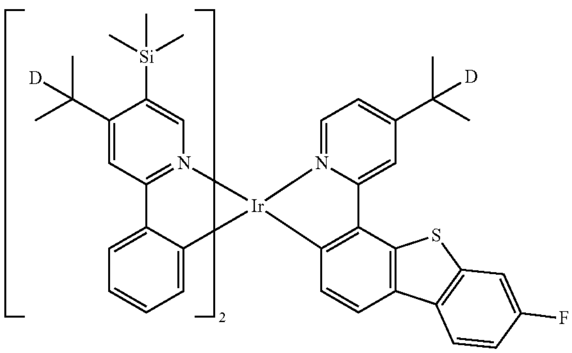
274
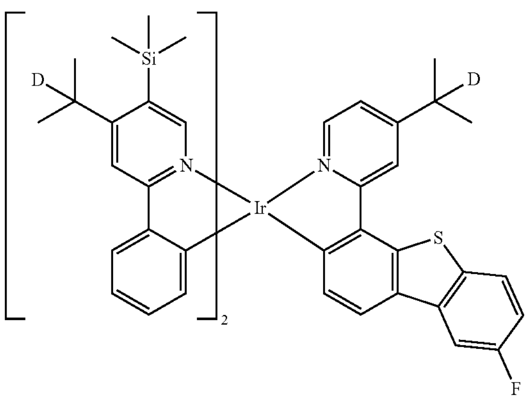
275
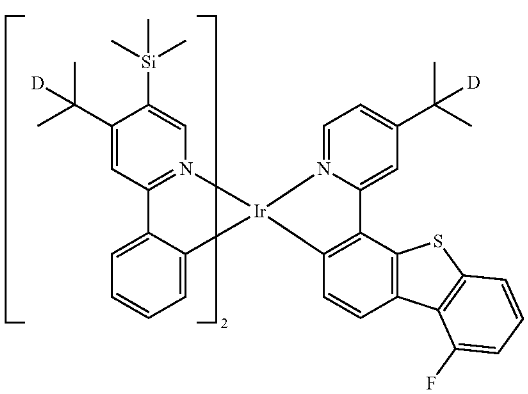
-continued
276
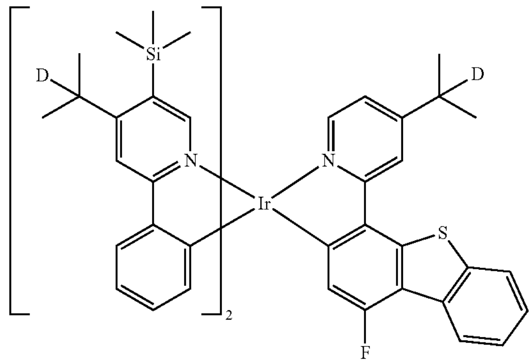
277
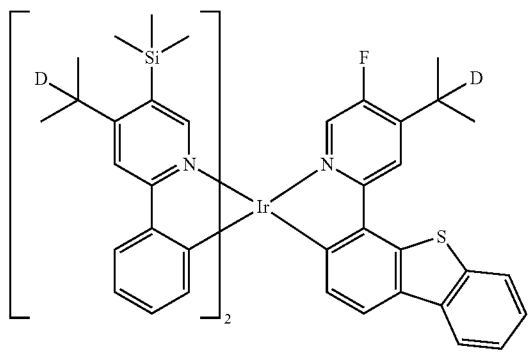
278
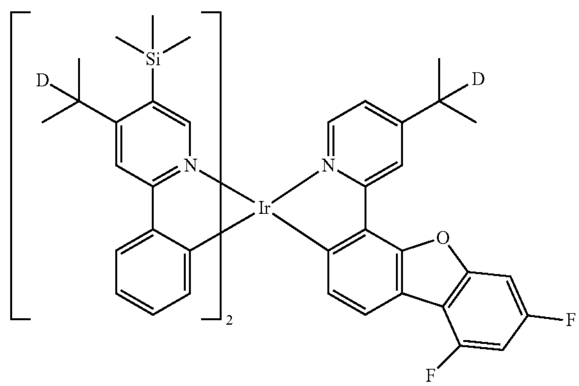
279
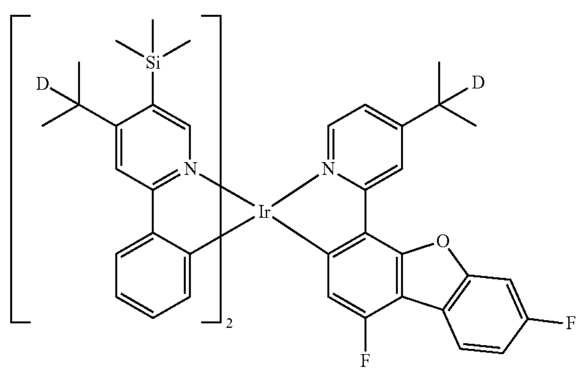

-continued
280
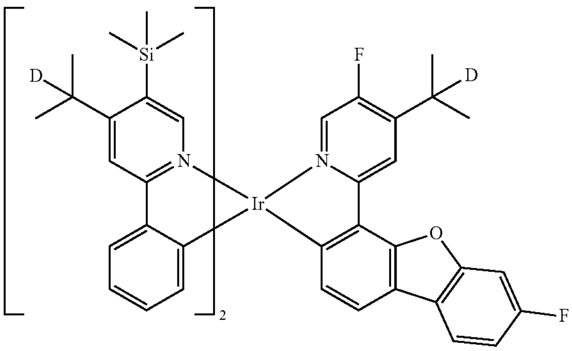
281
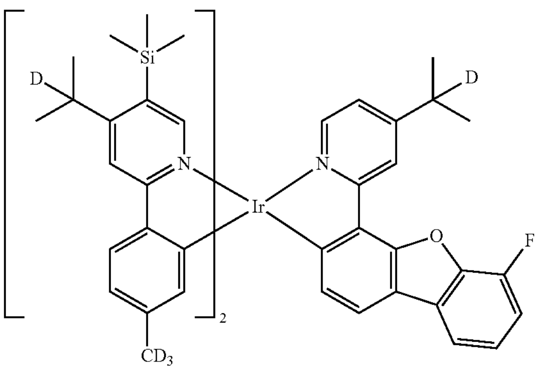
282
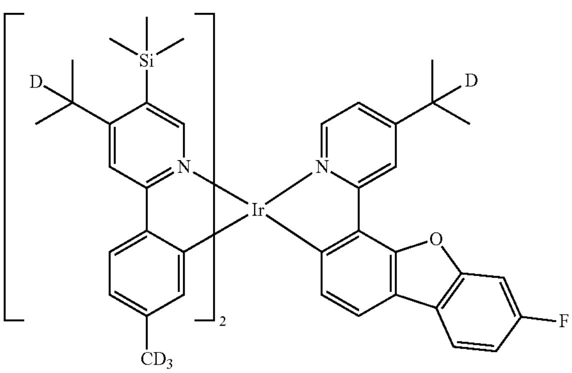
283
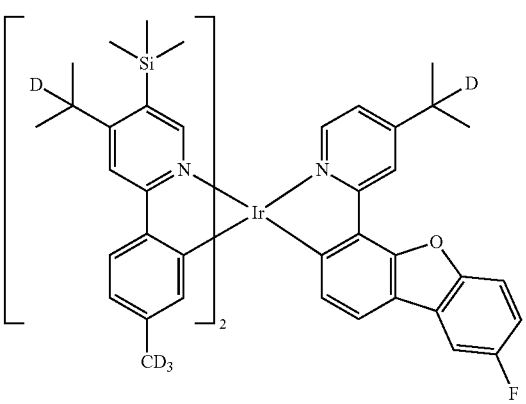
-continued
284
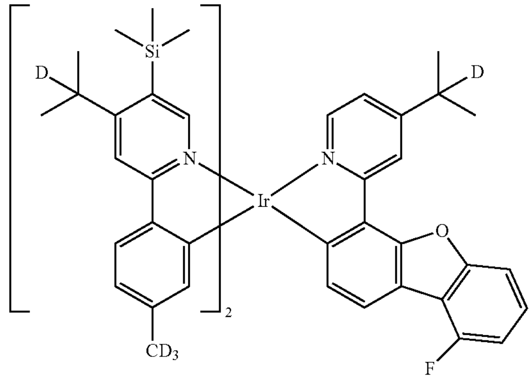
285
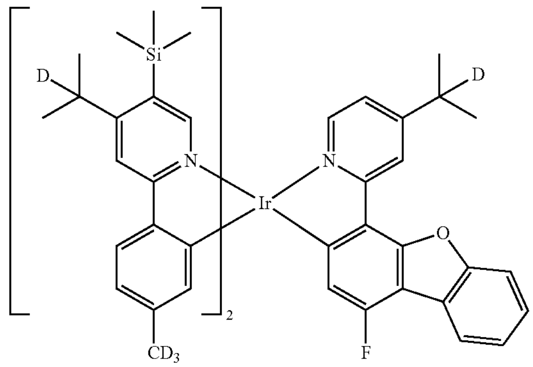
286
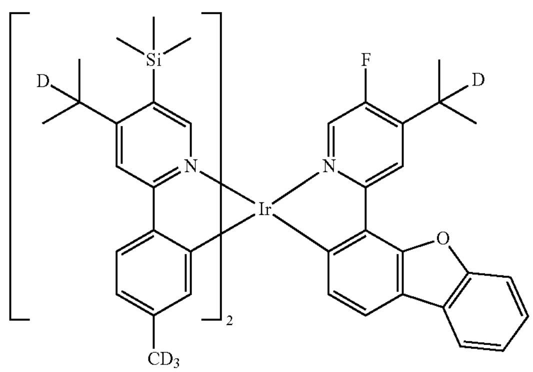
287
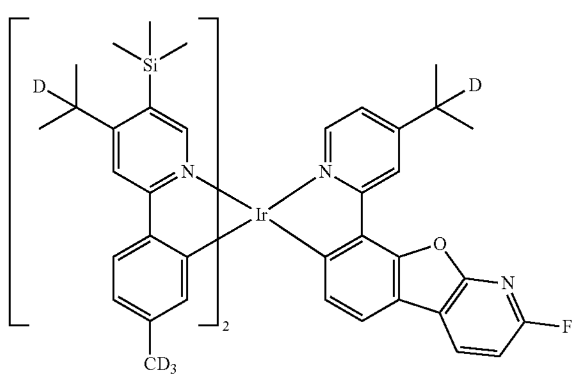

-continued
288
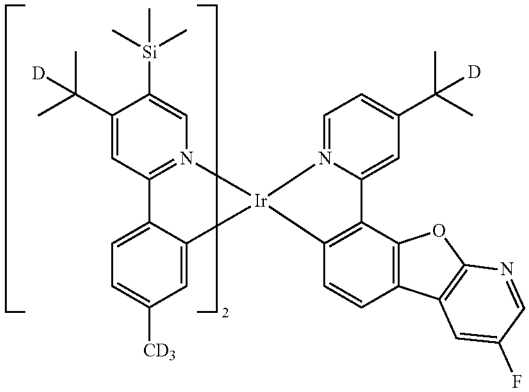
289
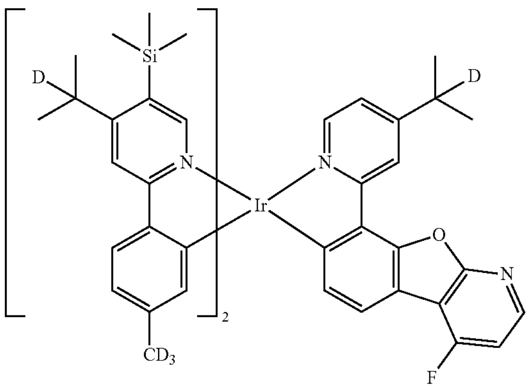
290
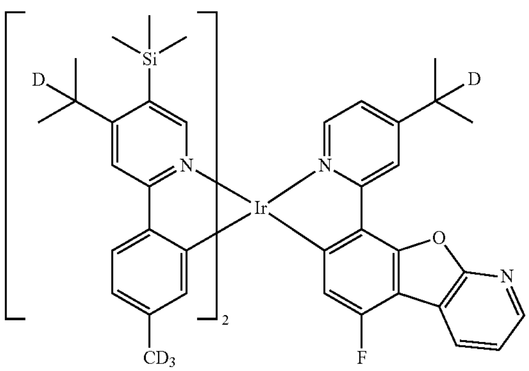
291
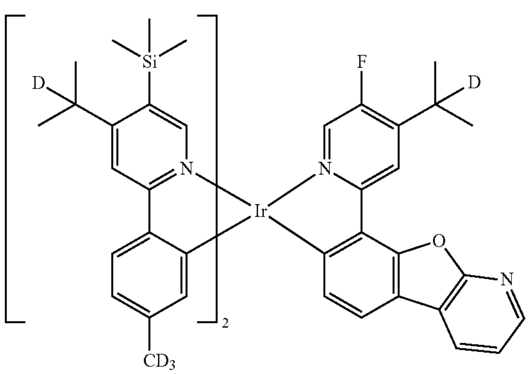
-continued
292
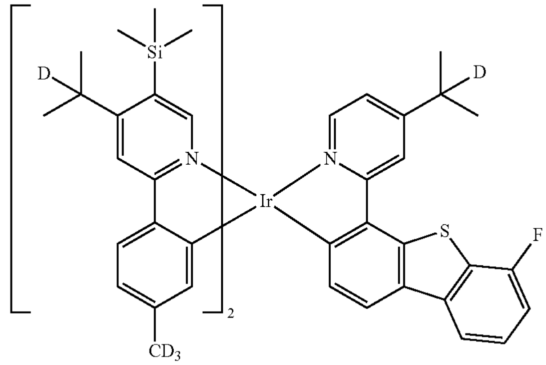
293
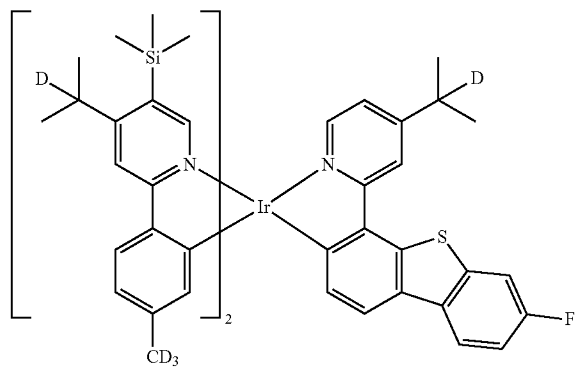
294
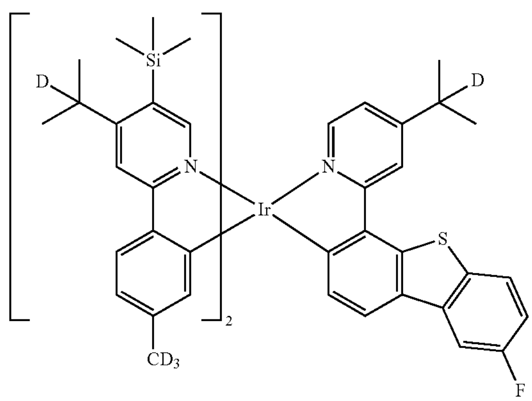
295
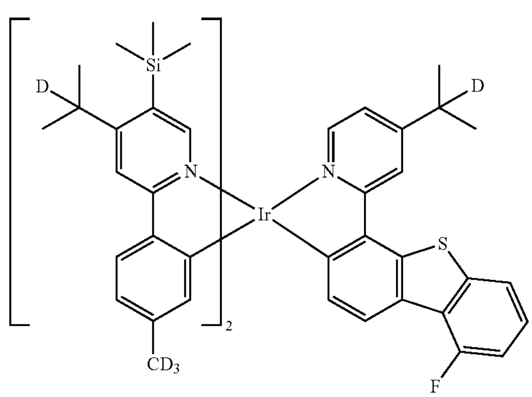

-continued
296
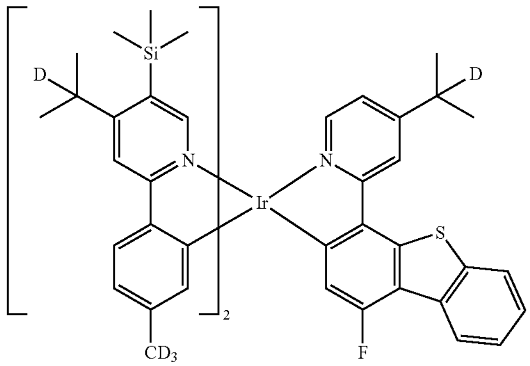
297
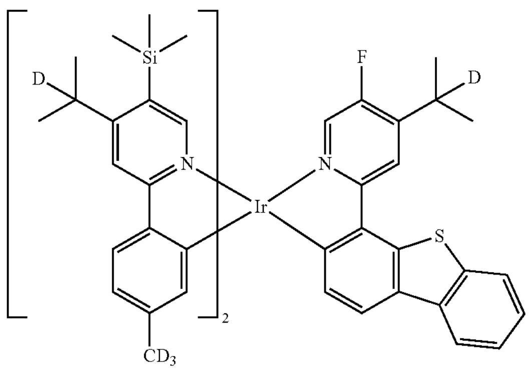
298
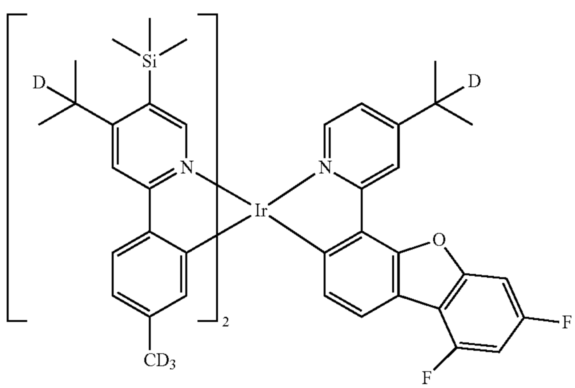
299
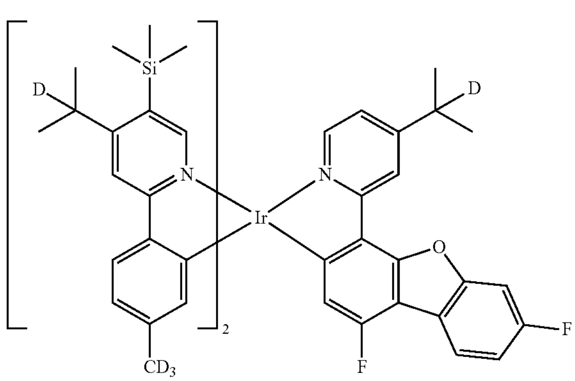
-continued
300
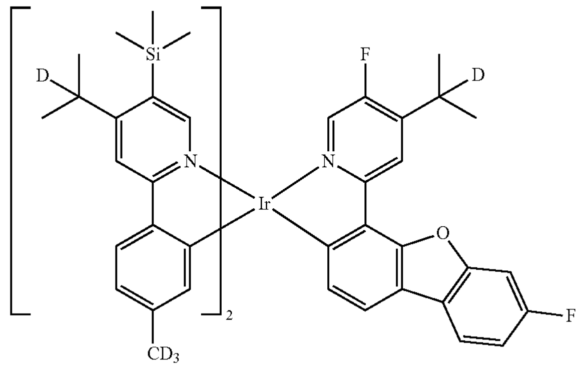
301
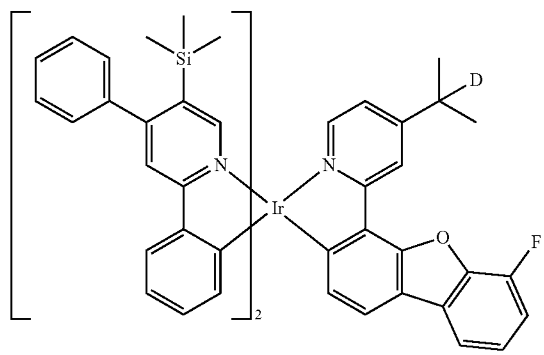
302
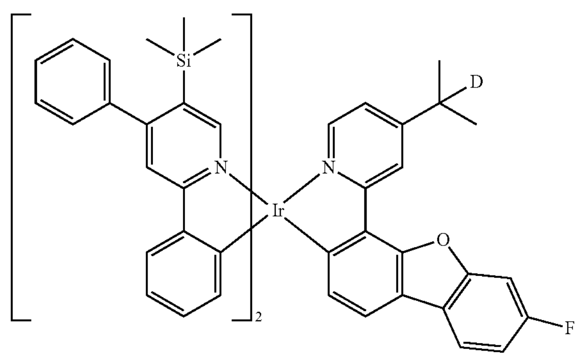
303
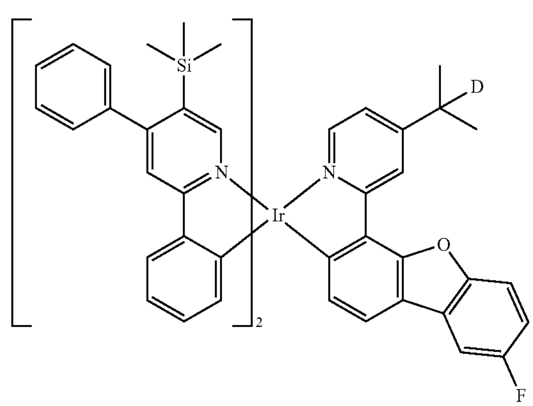

-continued
304
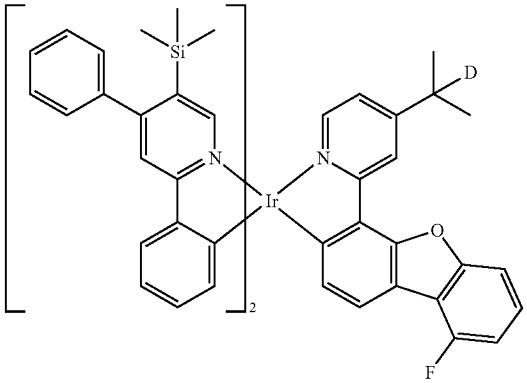
305
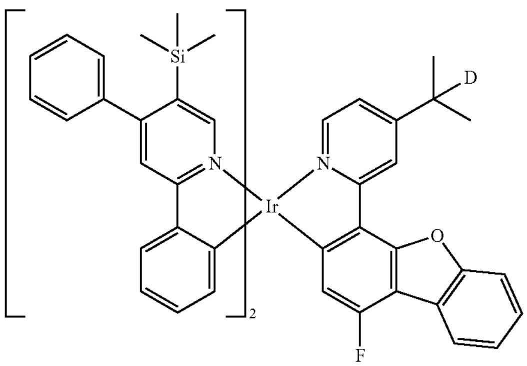
306
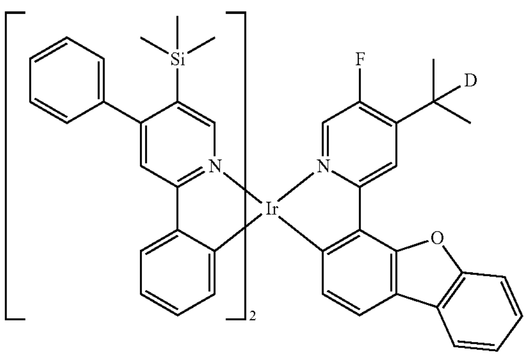
307
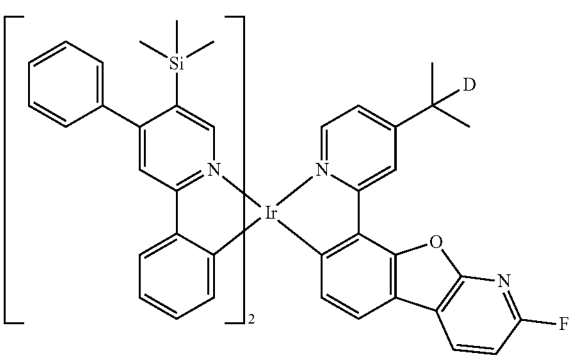
-continued
308
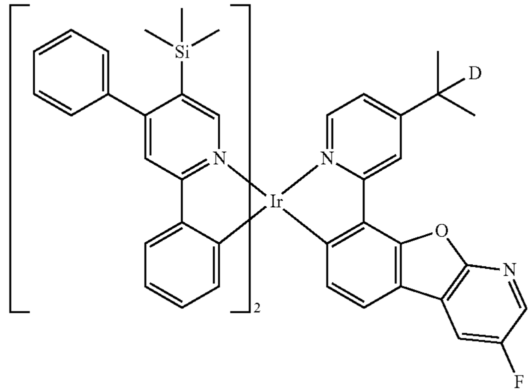
309
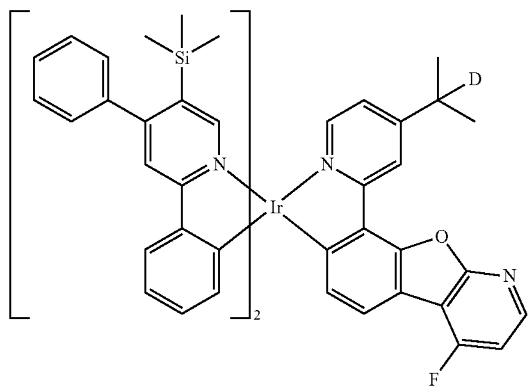
310
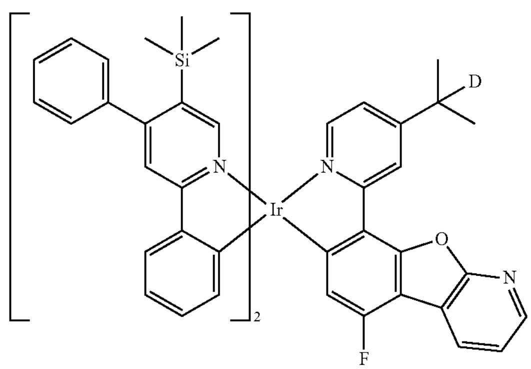
311
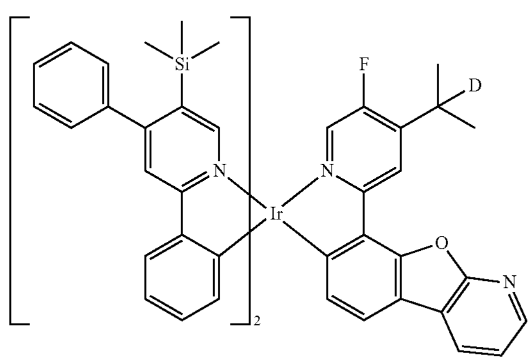

-continued
312
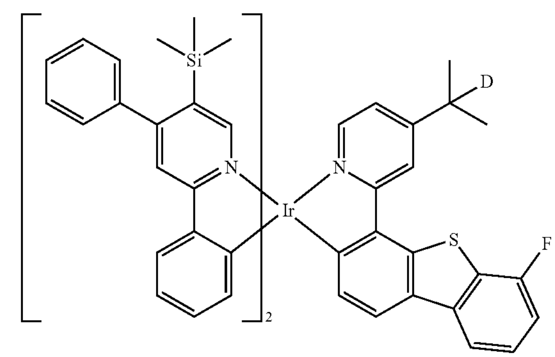
313
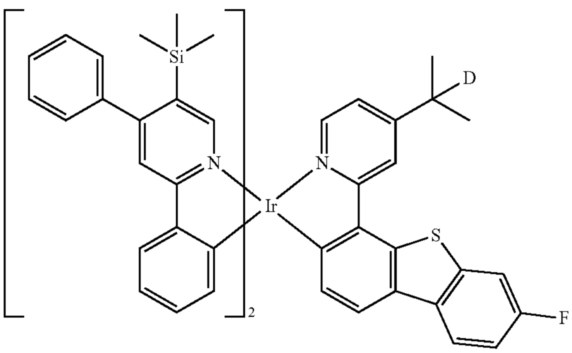
314
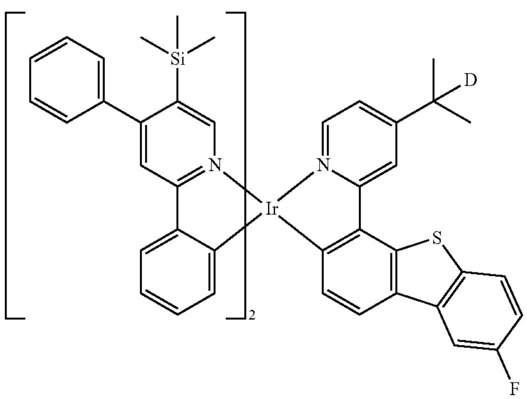
315
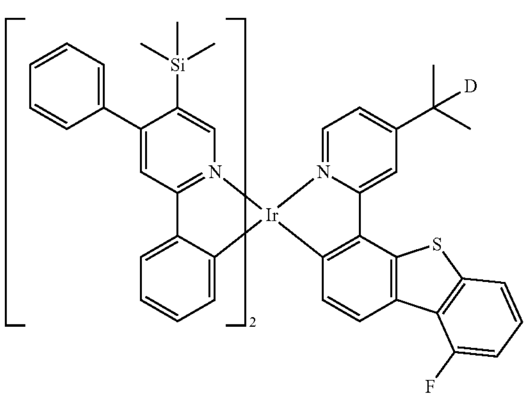
-continued
316
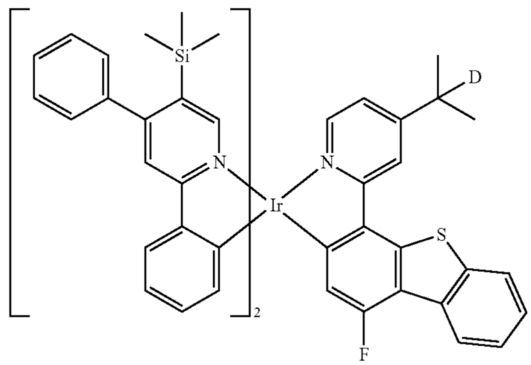
317
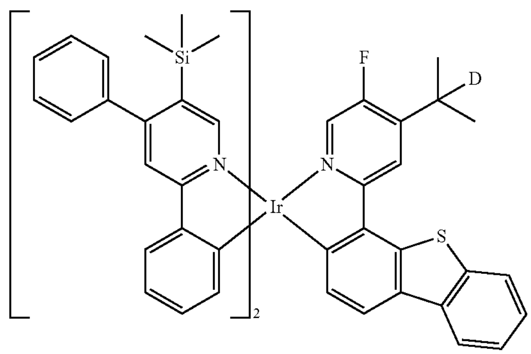
318
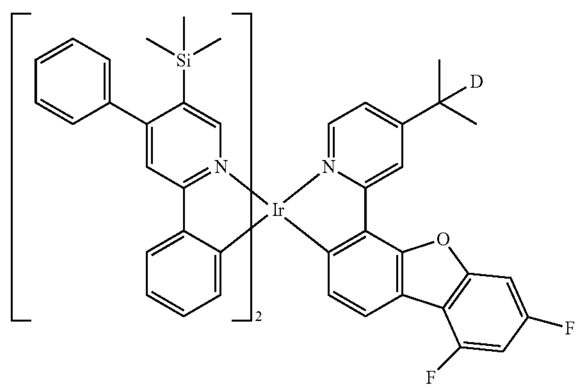
319
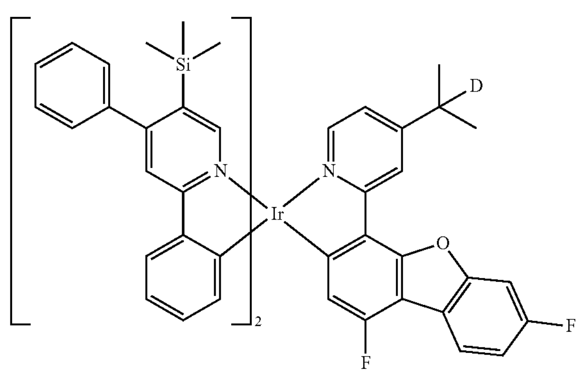

320
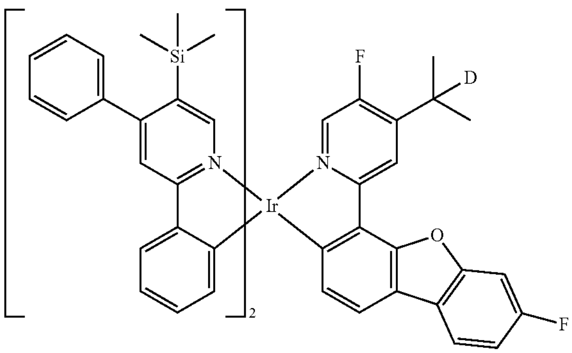
321
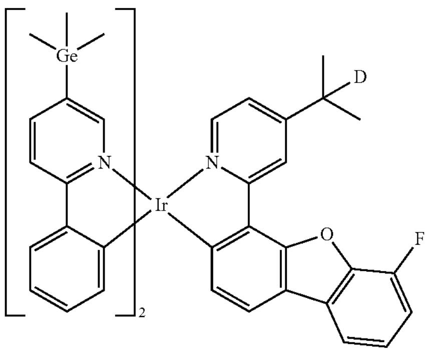
322
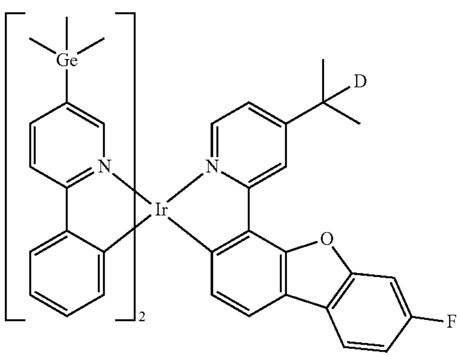
323
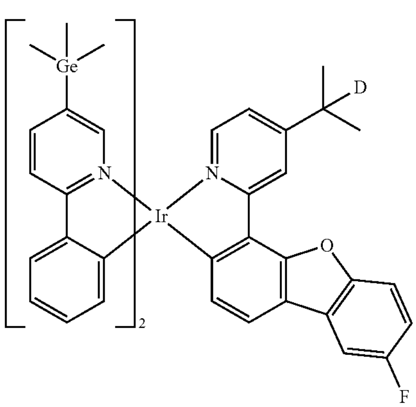
324
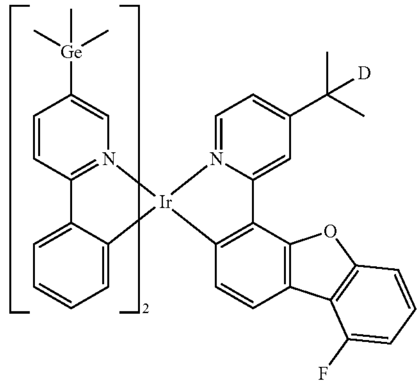
325
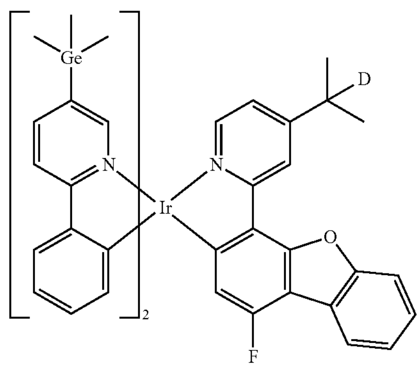
326
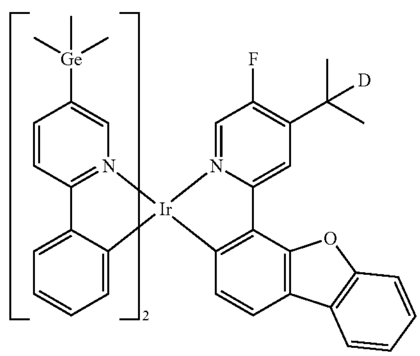
327
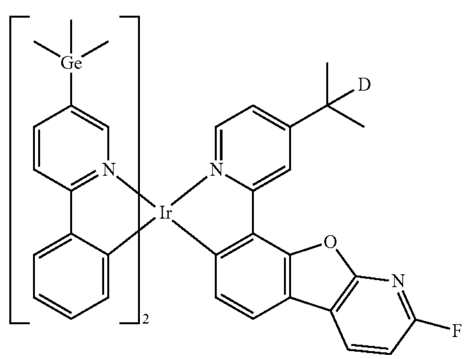

-continued
328
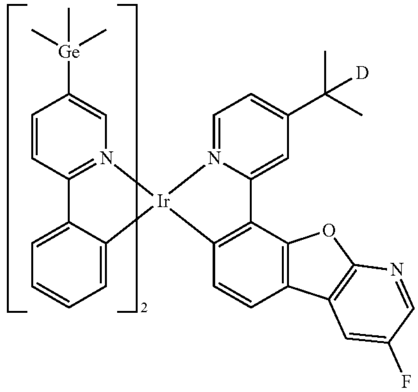
329
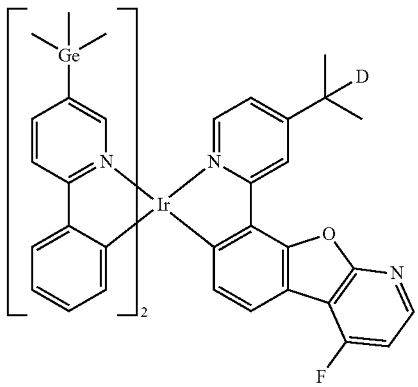
330
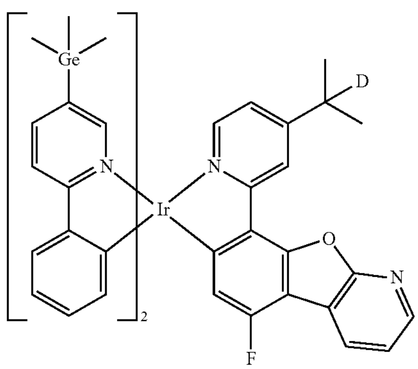
331
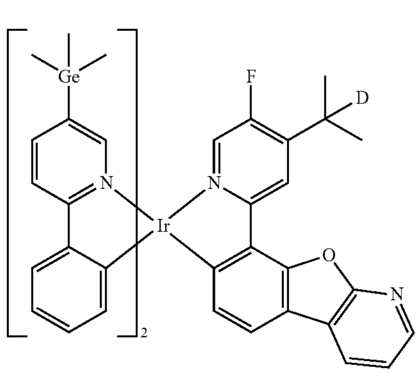
-continued
332
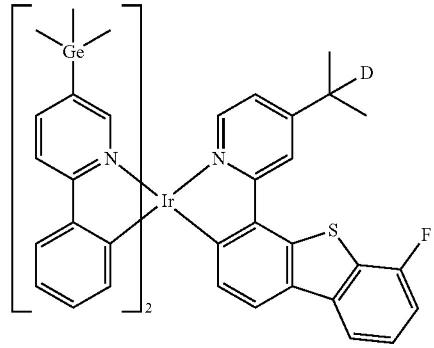
333
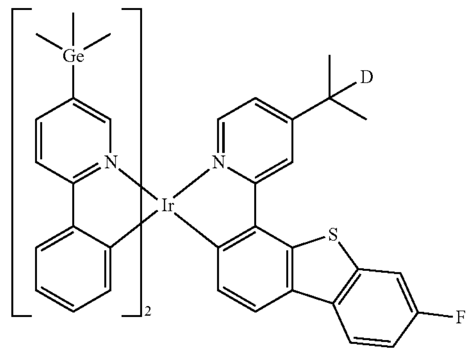
334
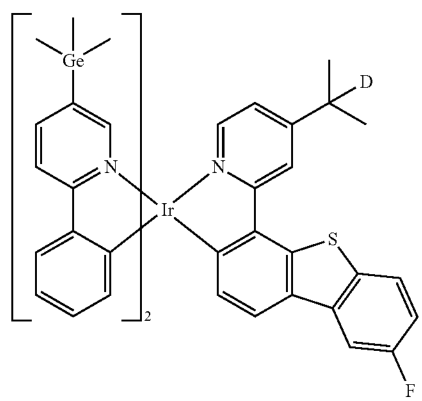
335
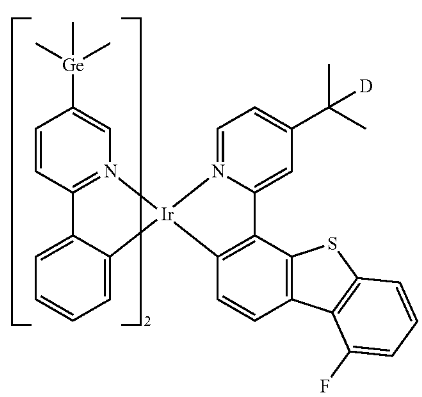

-continued
336
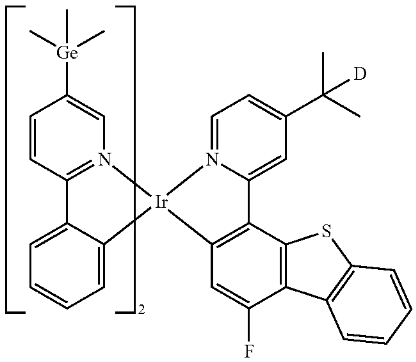
337
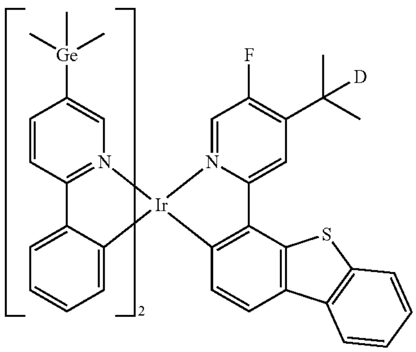
338
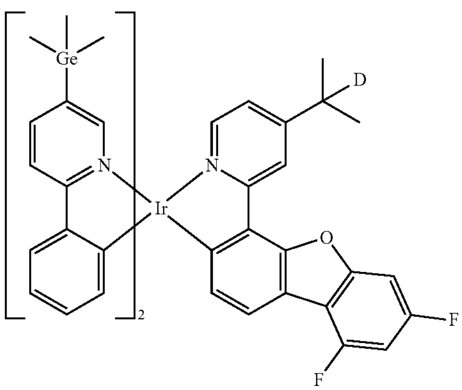
339
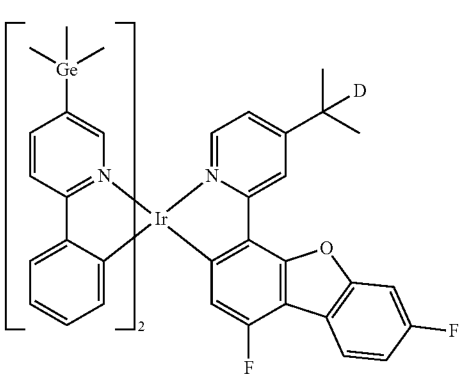
-continued
340
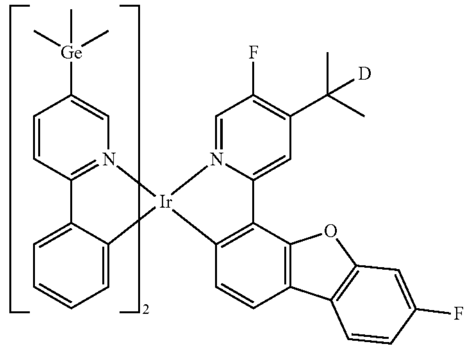
341
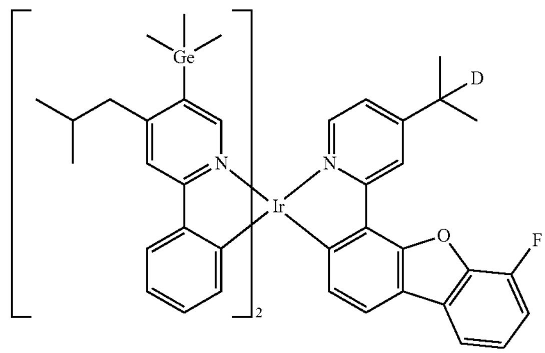
342
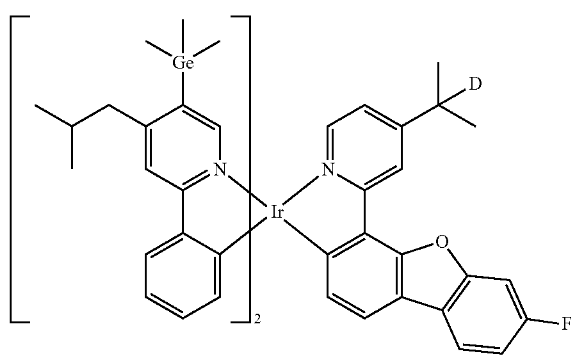
343
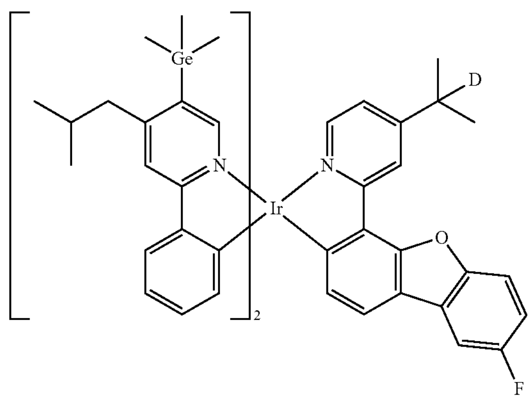

-continued
344
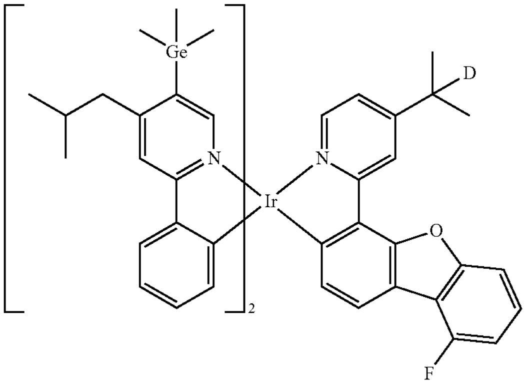
345
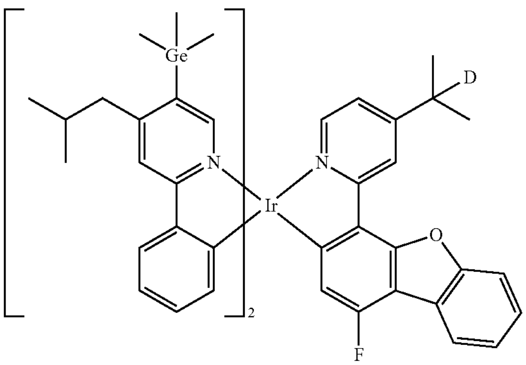
346
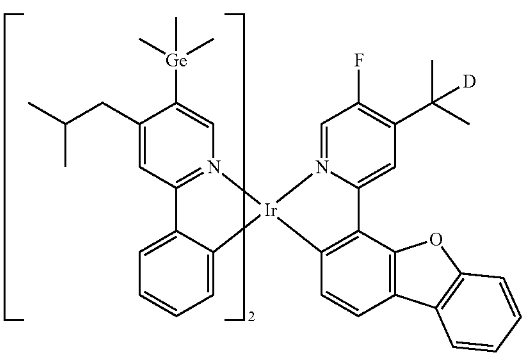
347
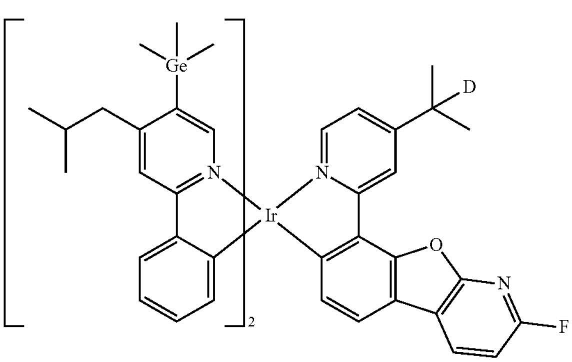
-continued
348
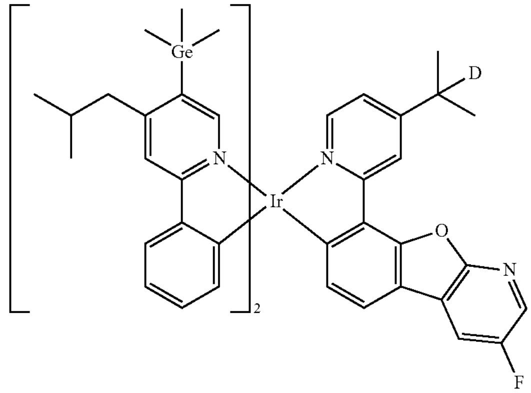
349
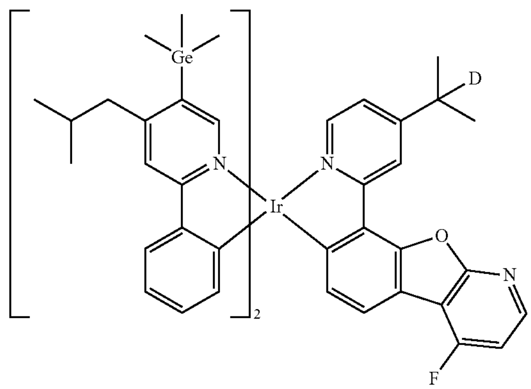
350
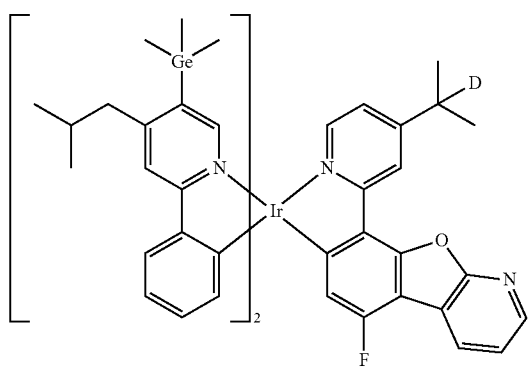
351
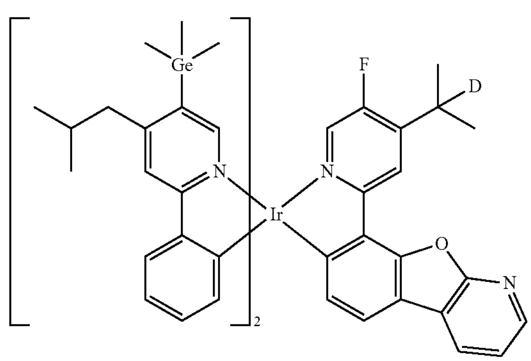

-continued
352
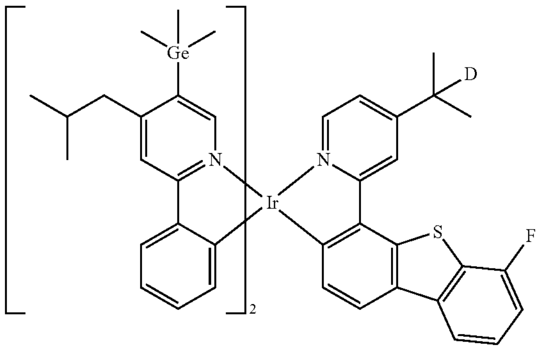
353
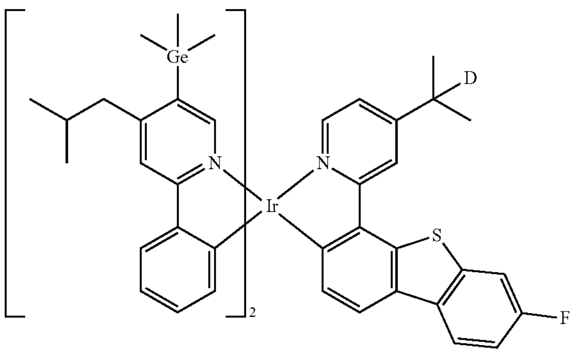
354
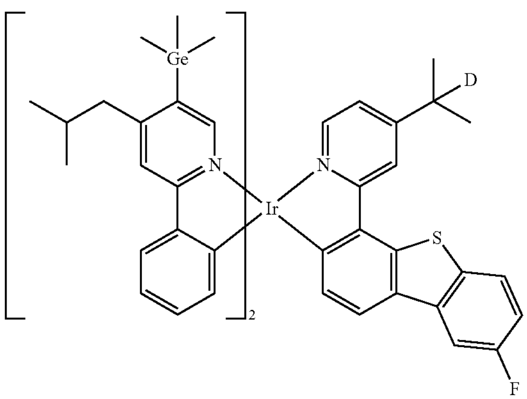
355
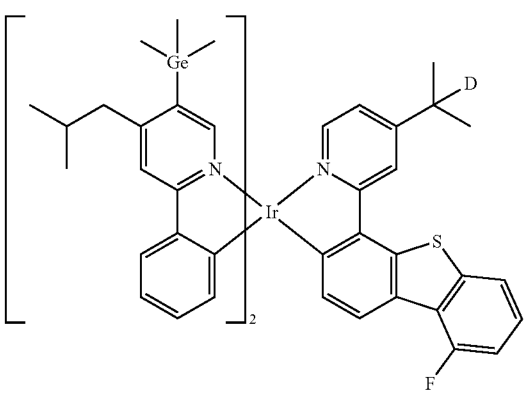
-continued
356
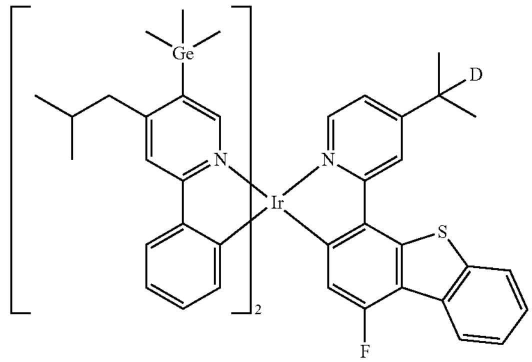
357
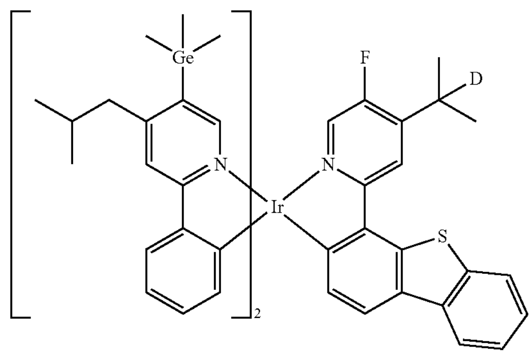
358
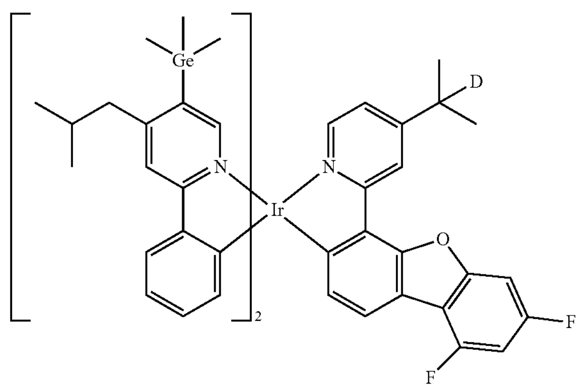
359
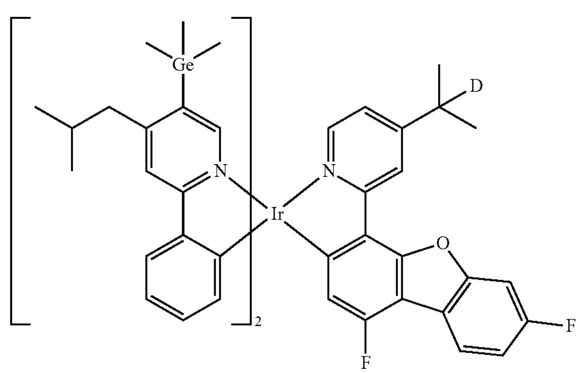

-continued
360
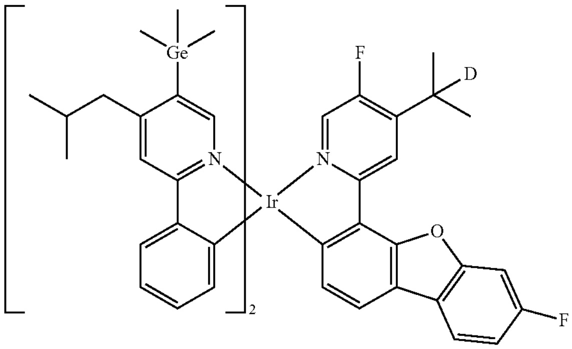
361
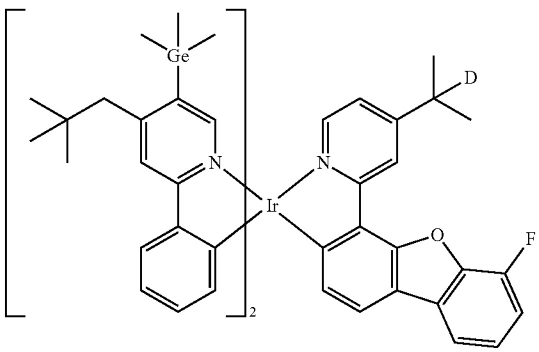
362
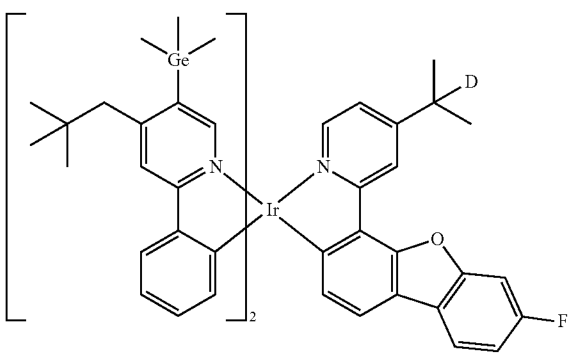
363
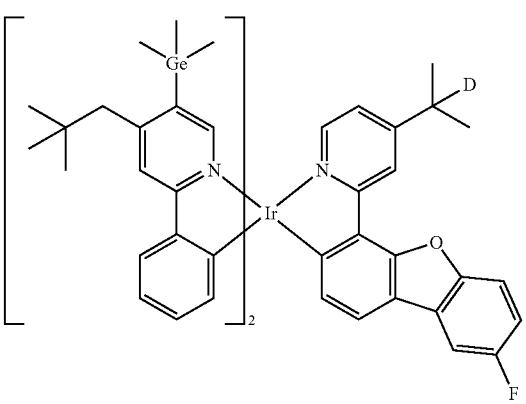
-continued
364
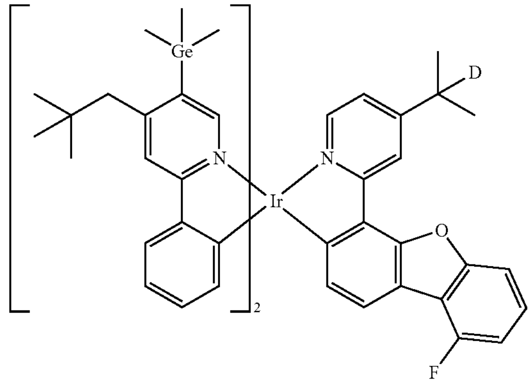
365
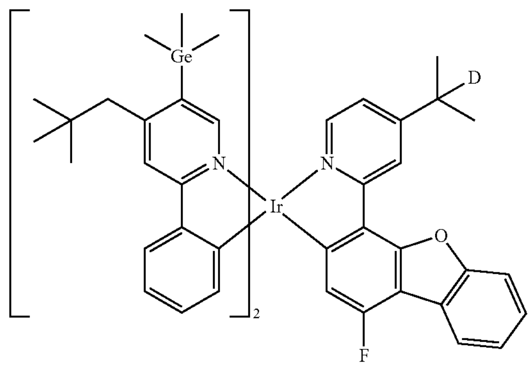
366
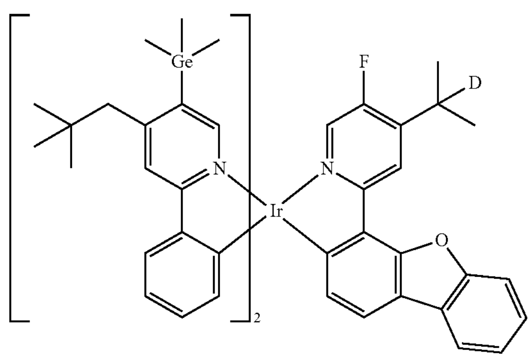
367
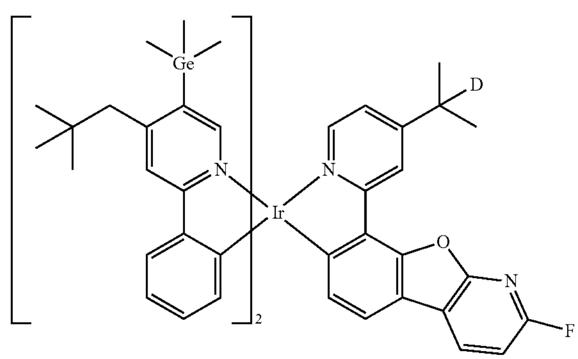

368
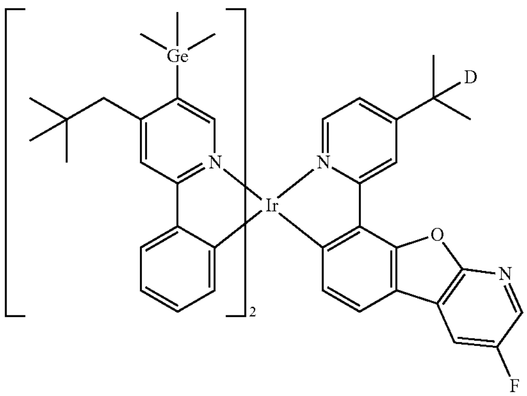
369
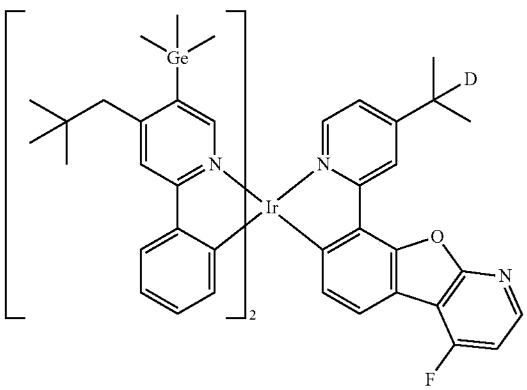
370
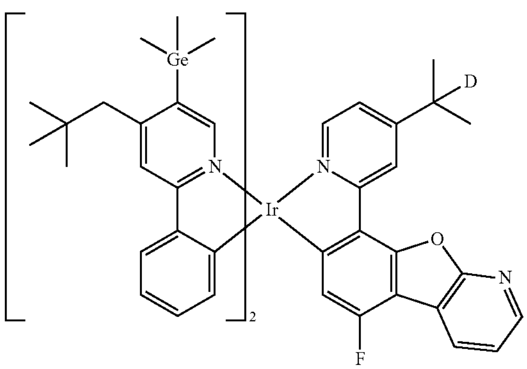
371
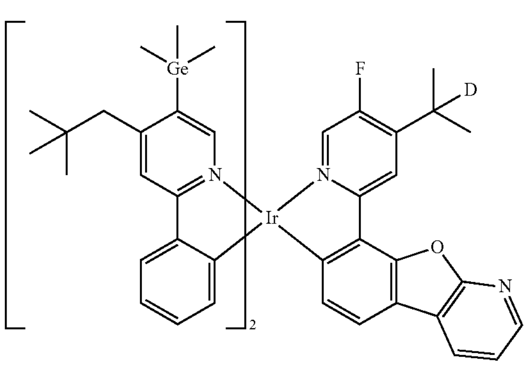
372
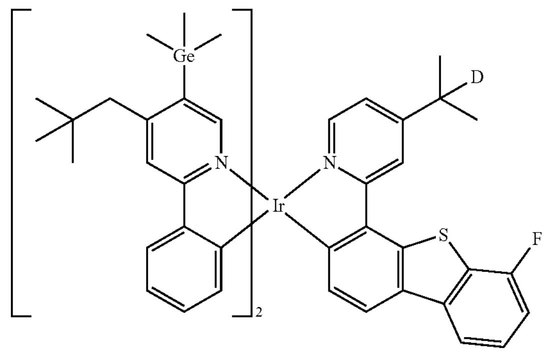
373
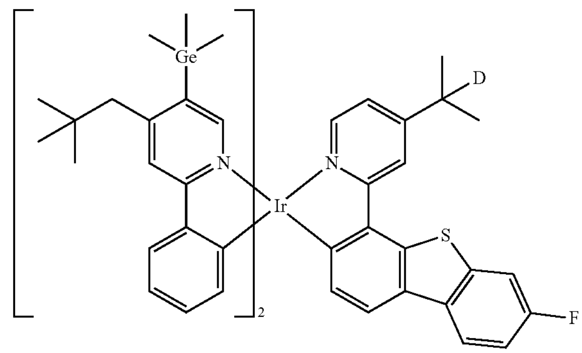
374
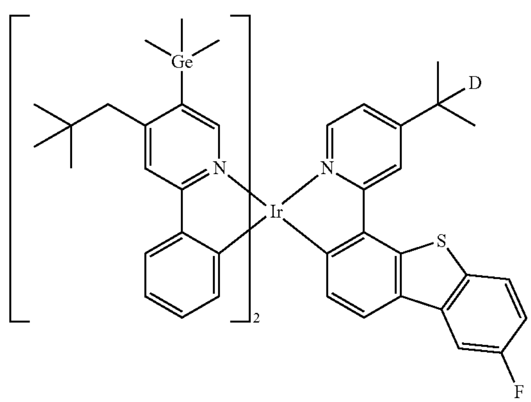
375
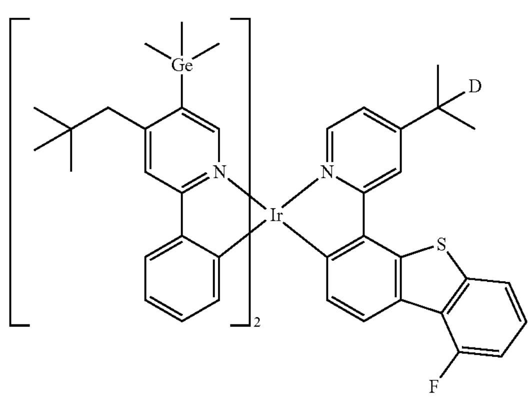

-continued
376
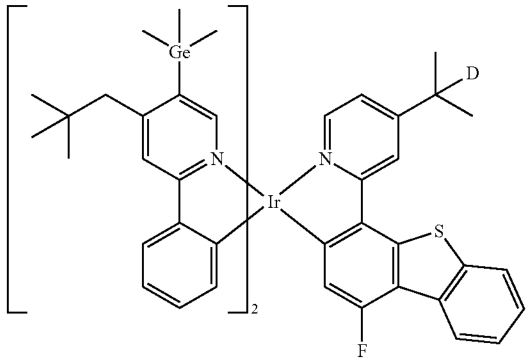
377
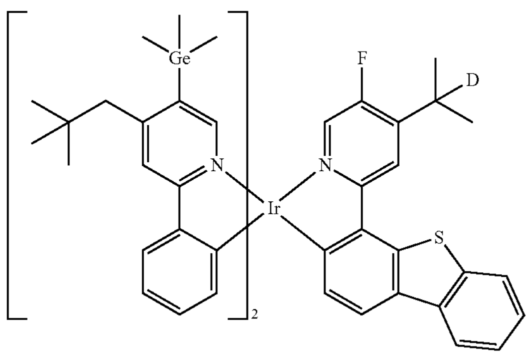
378
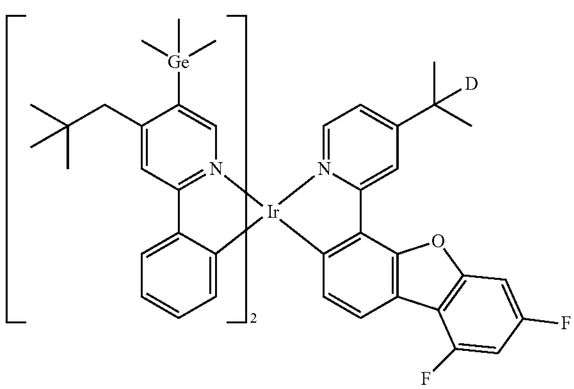
379
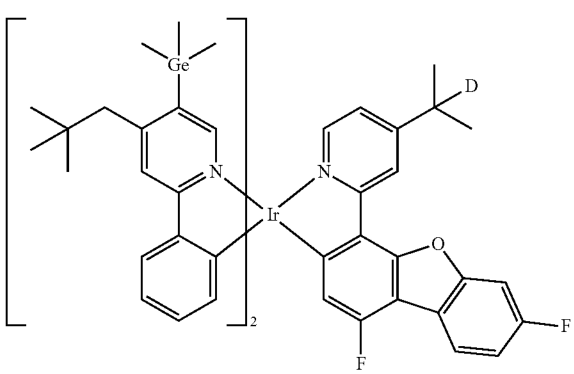
-continued
380
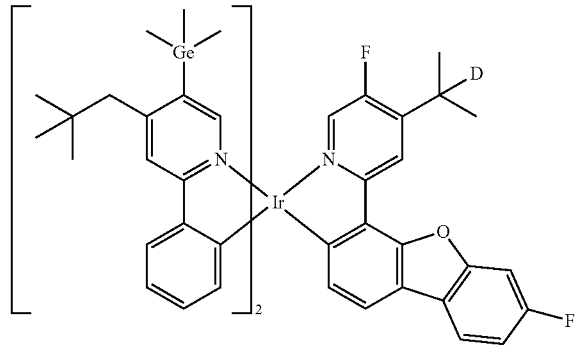
381
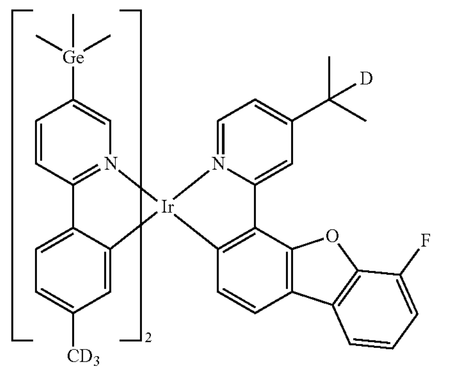
382
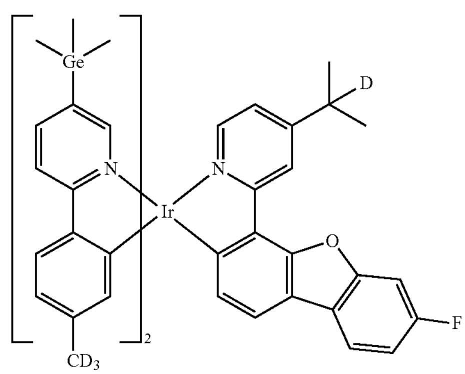
383
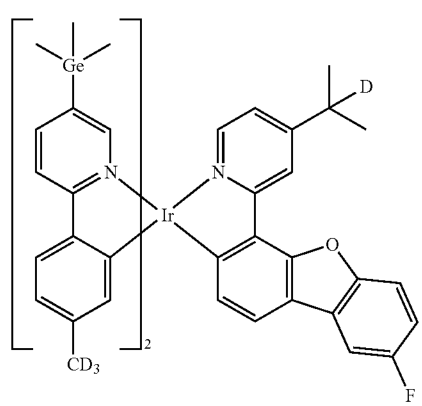

-continued
384
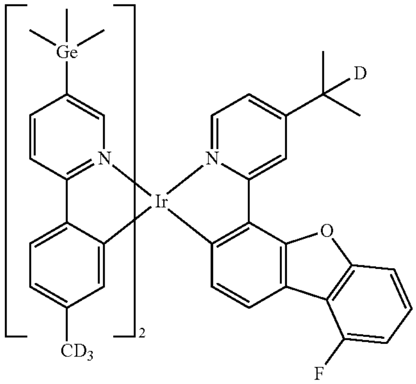
385
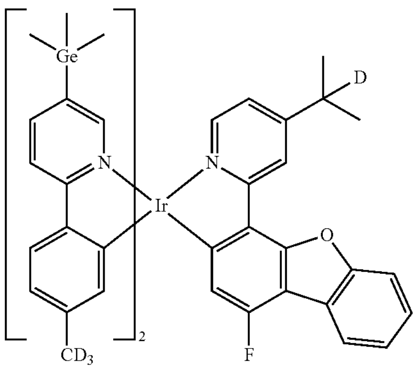
386
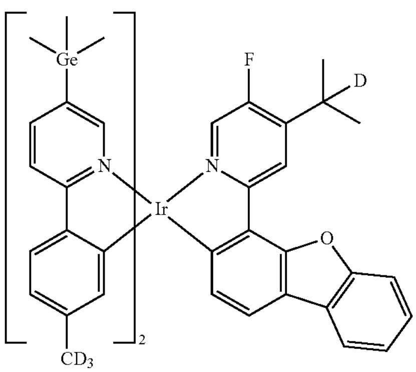
387
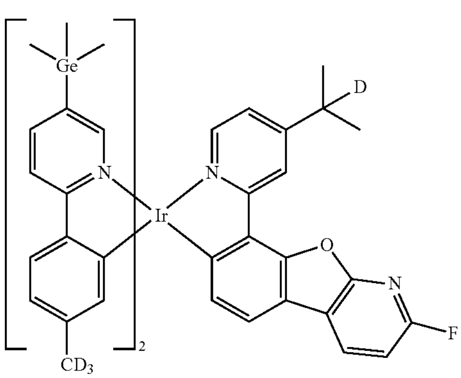
-continued
388
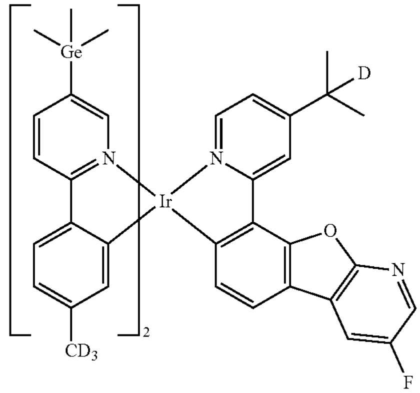
389
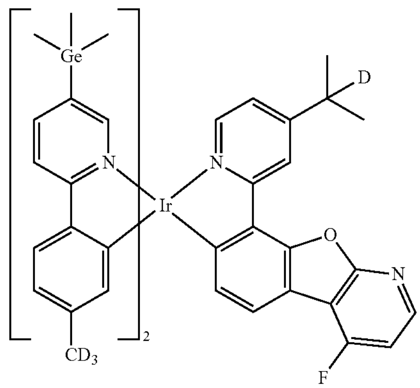
390
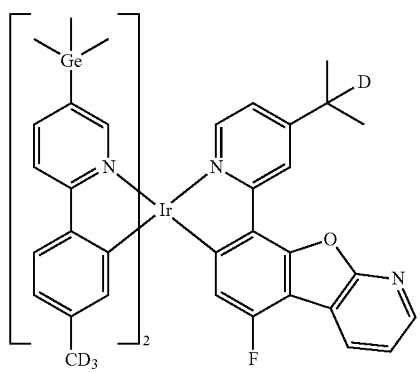
391
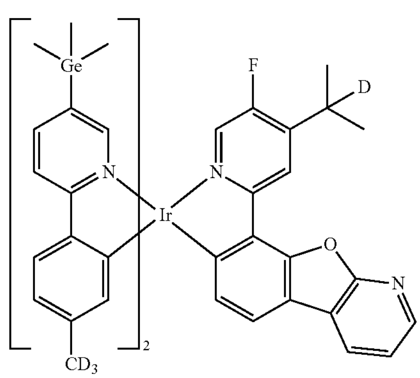

-continued
392
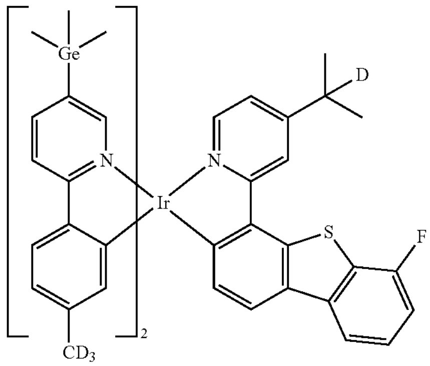
393
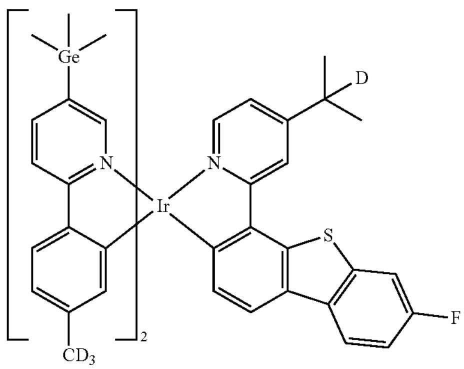
394
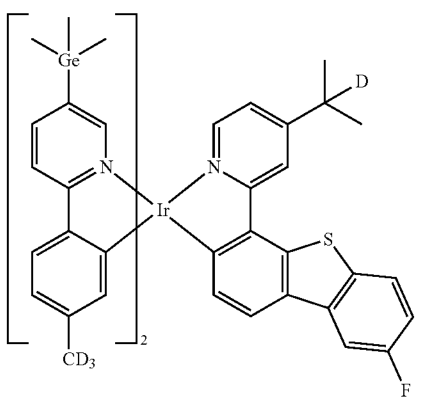
395
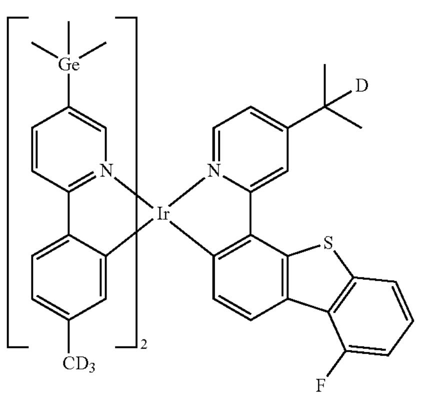
-continued
396
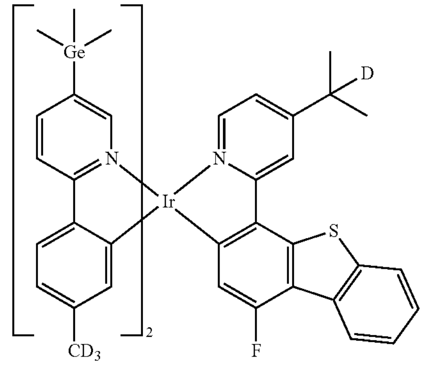
397
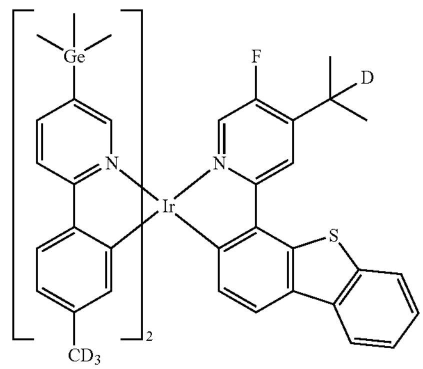
398
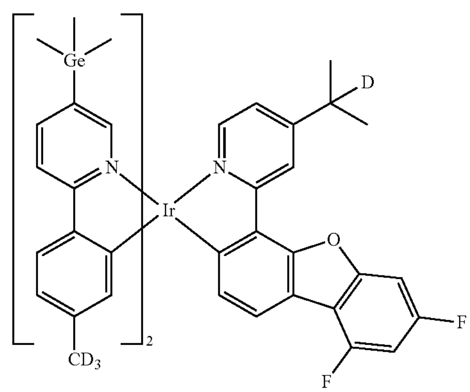
399
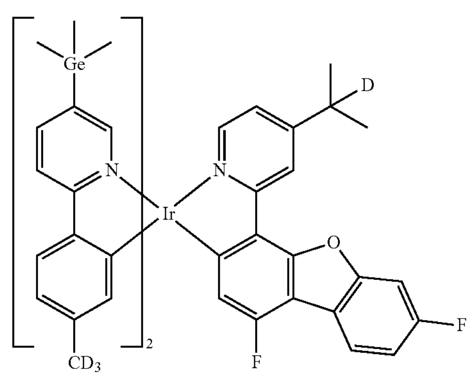

-continued
400
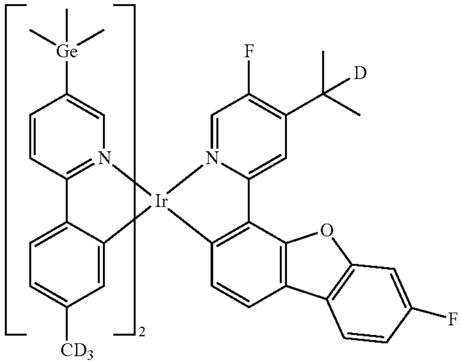
401
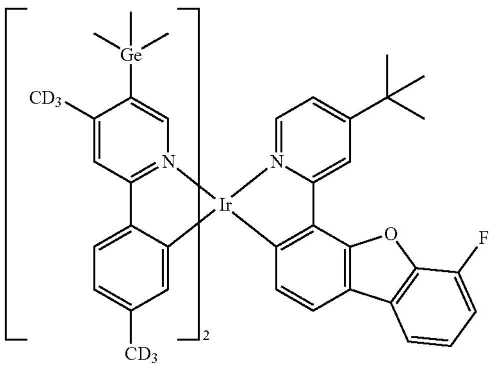
402
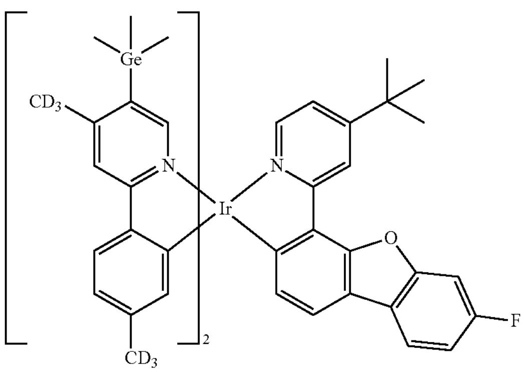
403
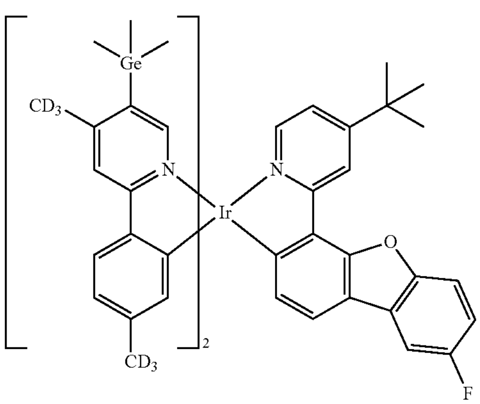
-continued
404
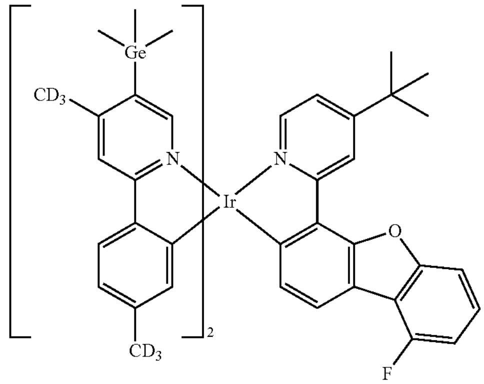
405
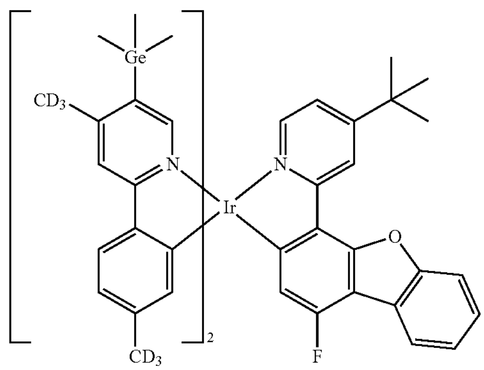
406
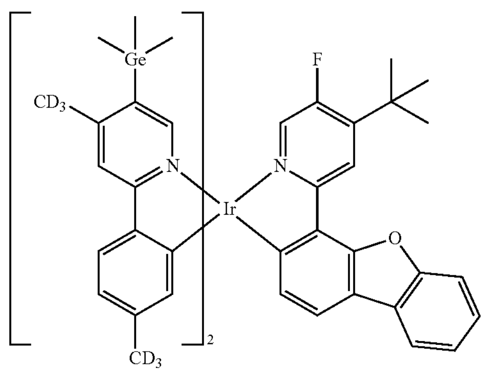
407
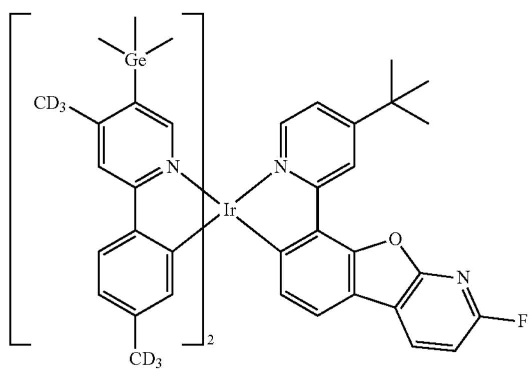

-continued
408
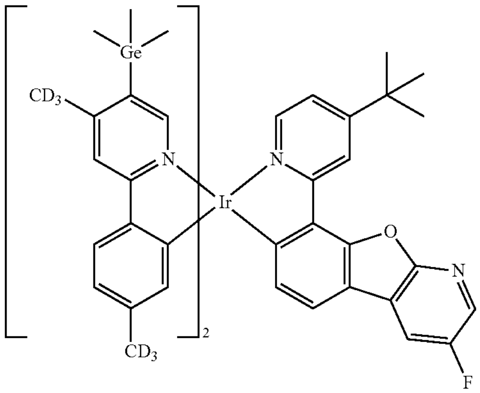
409
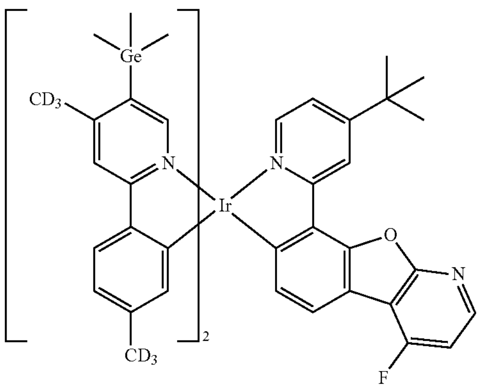
410
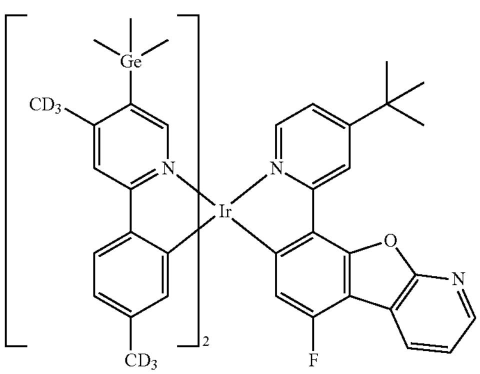
411
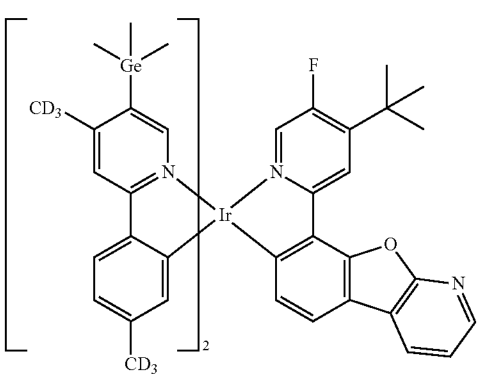
-continued
412
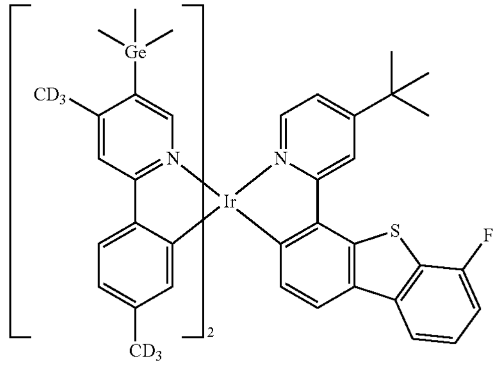
413
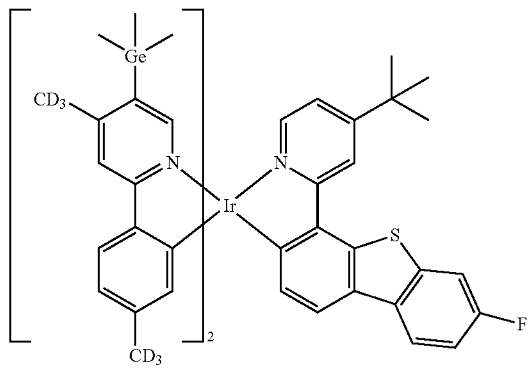
414
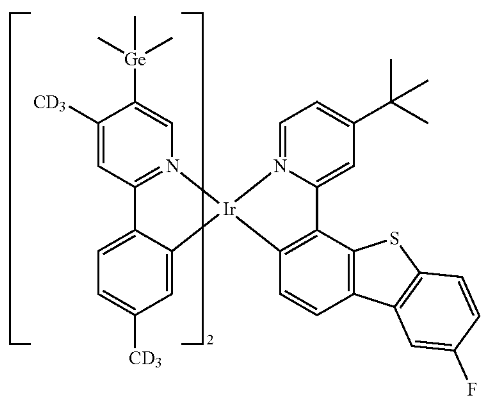
415
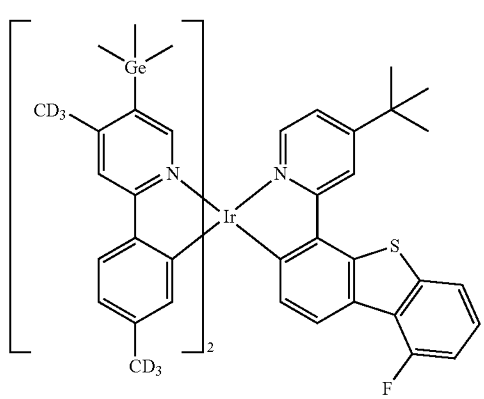

-continued
416
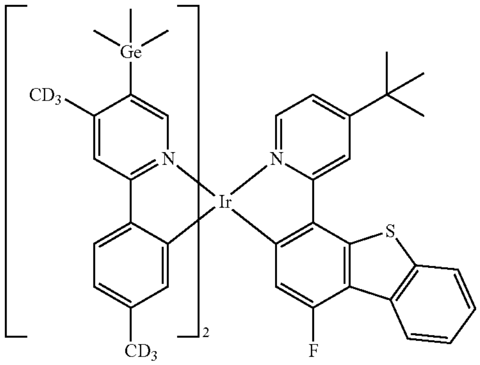
417
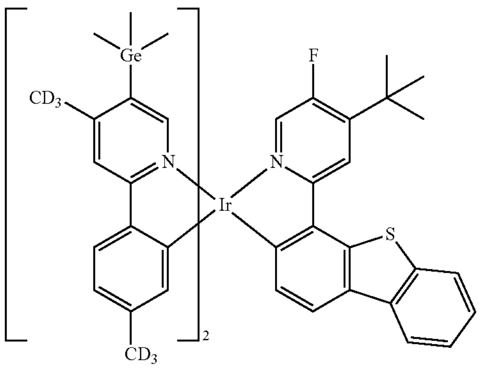
418
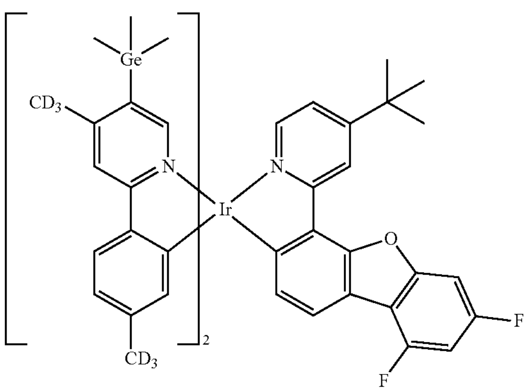
419
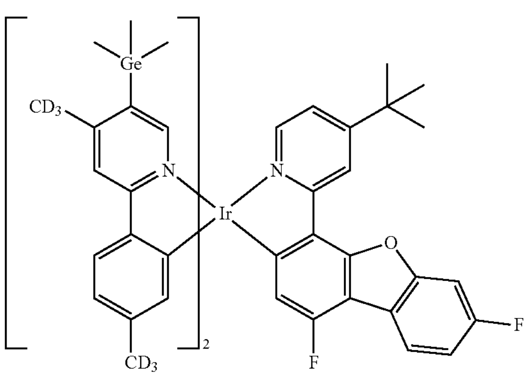
-continued
420
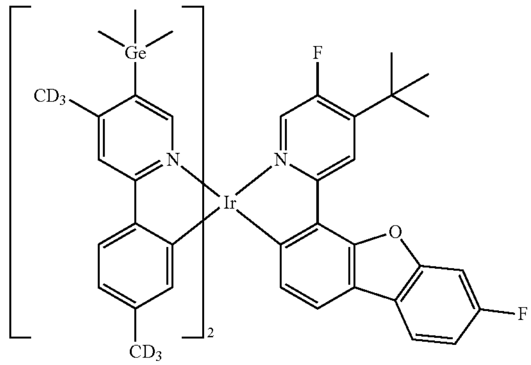
421
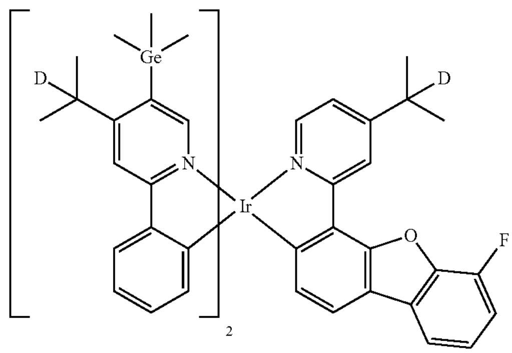
422
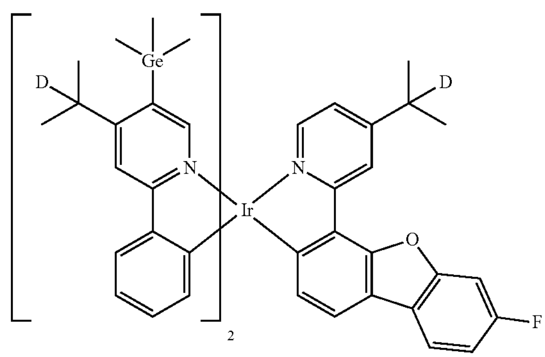
423
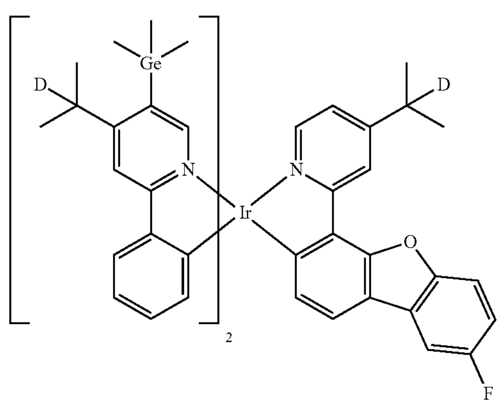

-continued
424
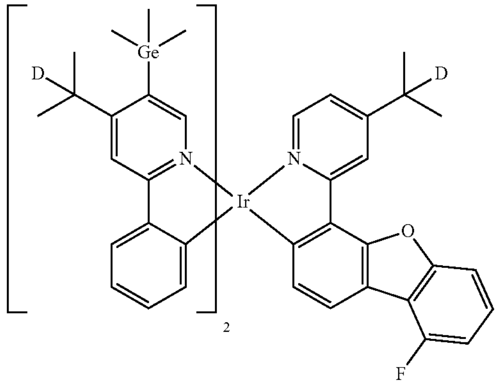
425
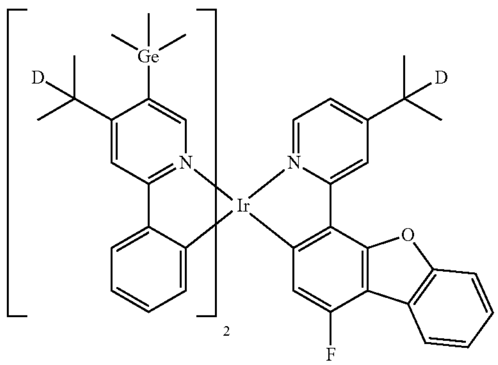
426
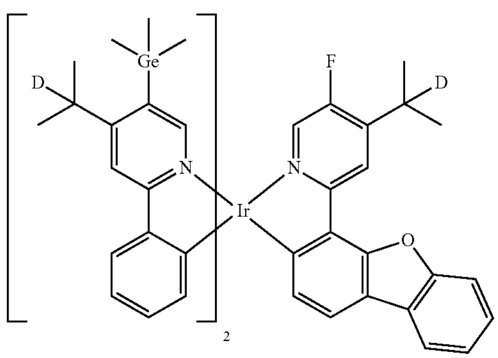
427
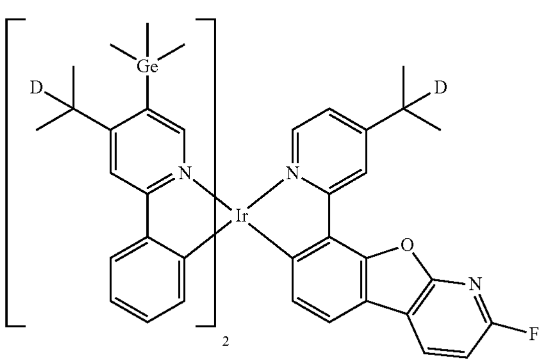
-continued
428
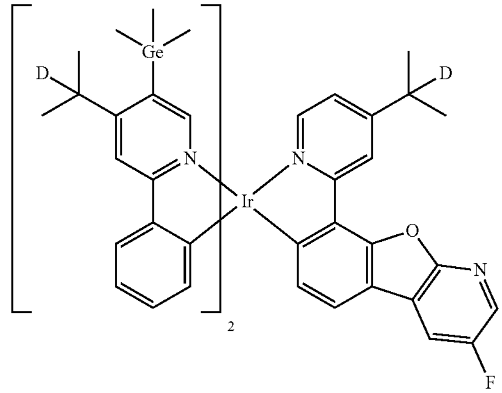
429
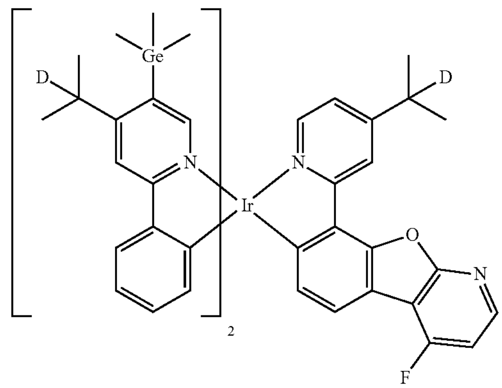
430
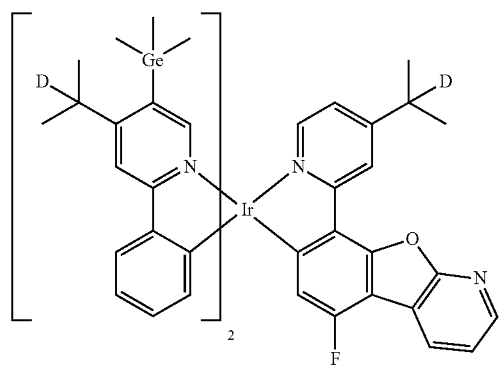
431
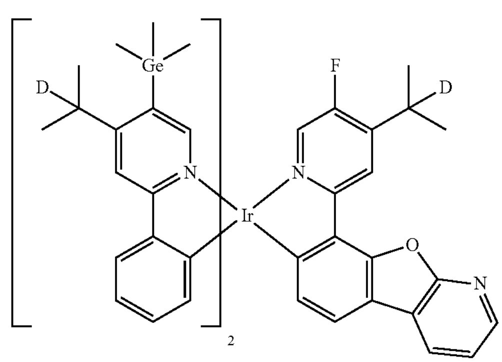

432
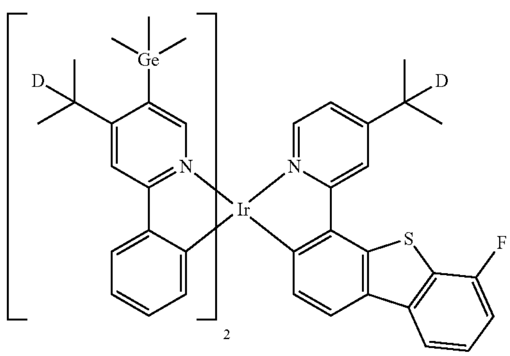
433
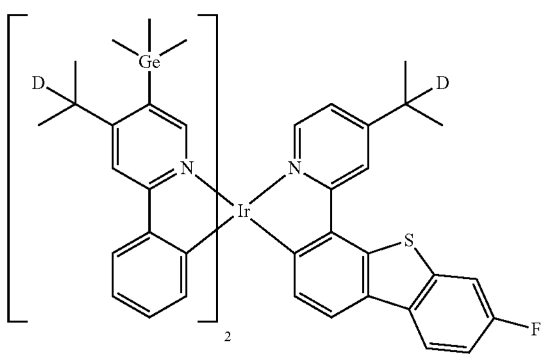
434
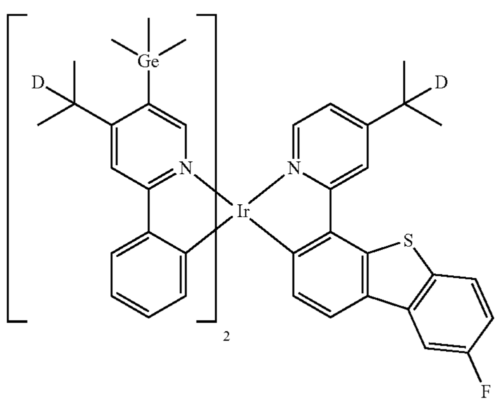
435
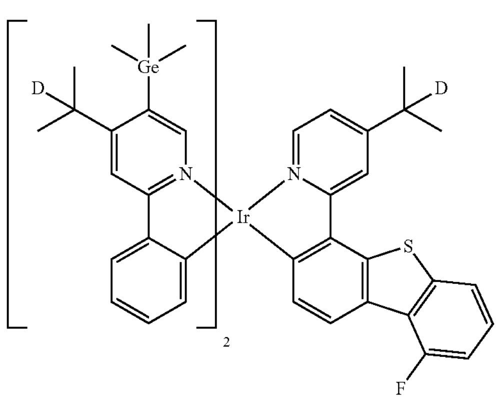
436
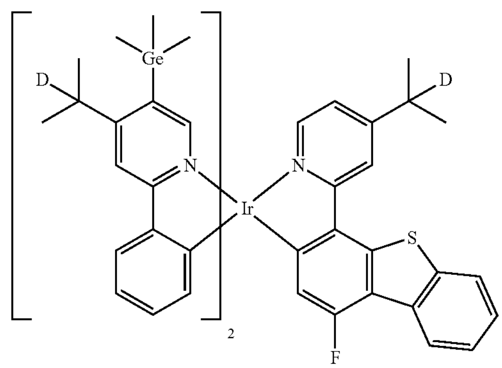
437
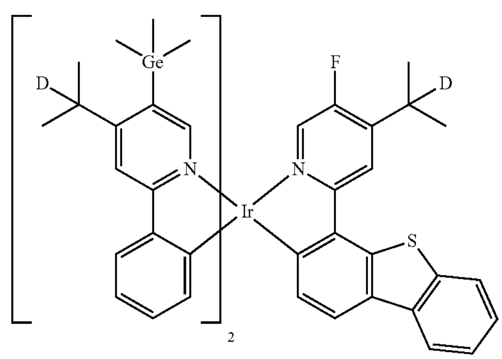
438
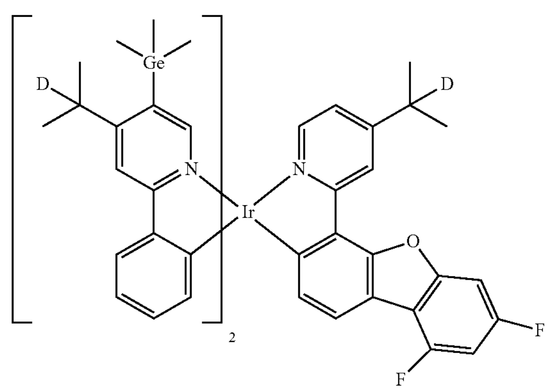
439
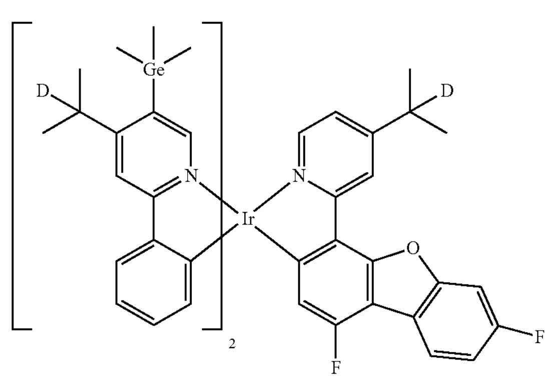

-continued
440
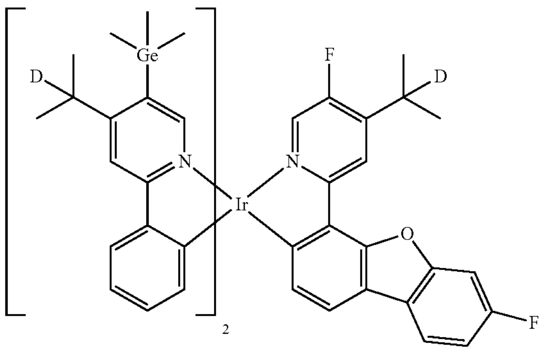
441
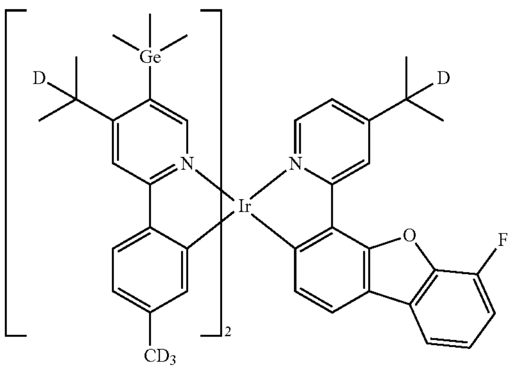
442
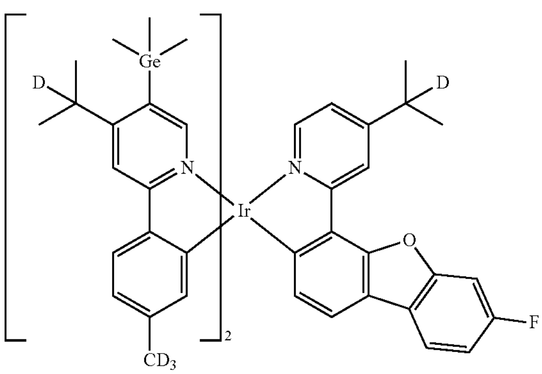
443
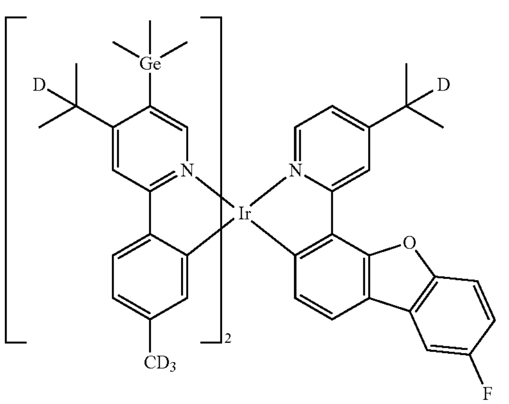
-continued
444
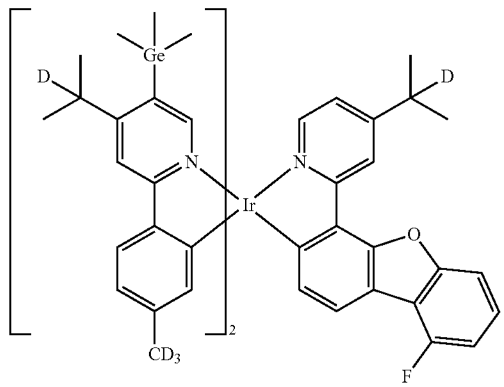
445
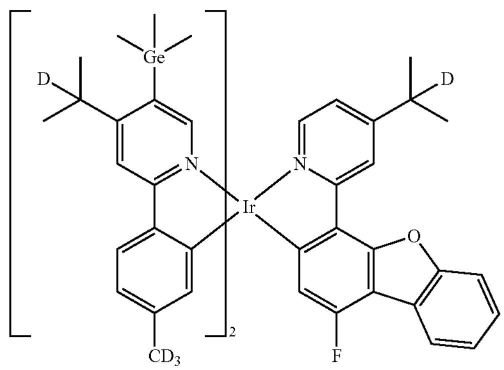
446
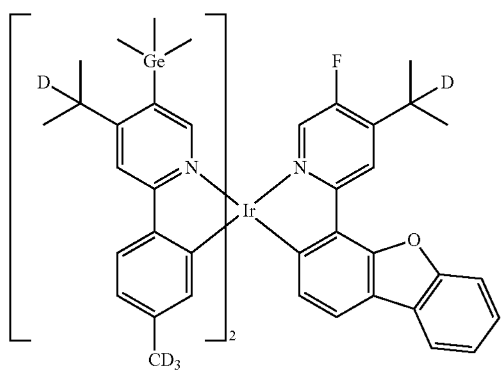
447
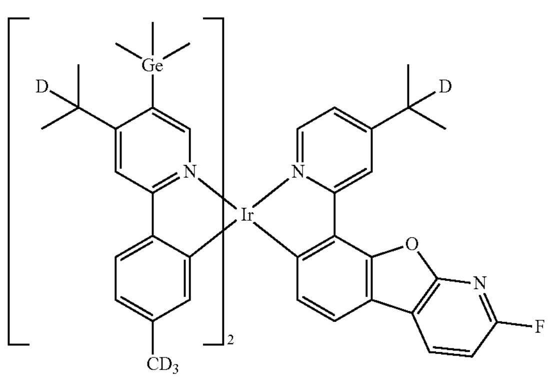

-continued
448
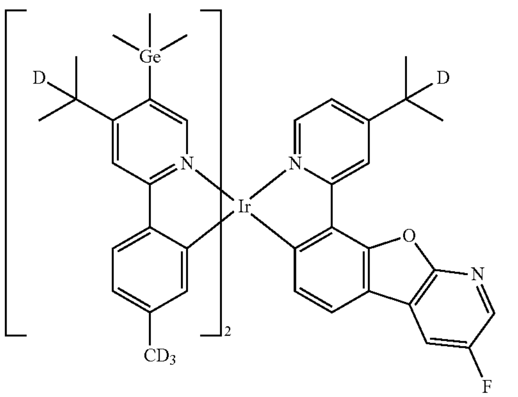
449
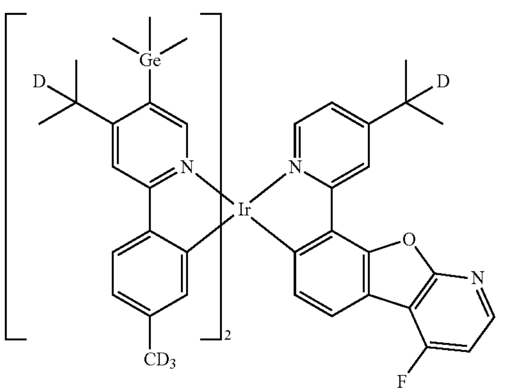
450
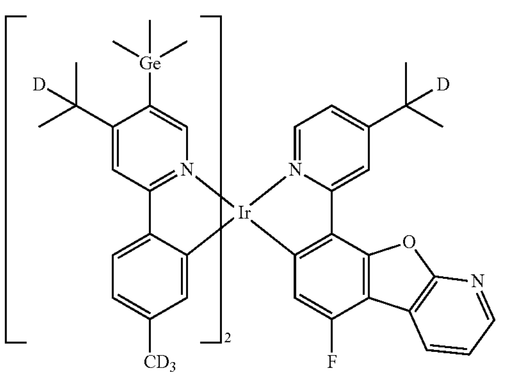
451
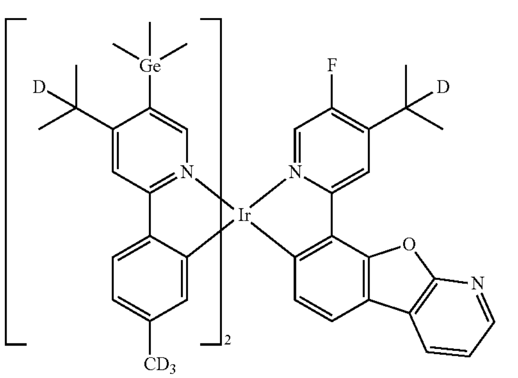
-continued
452
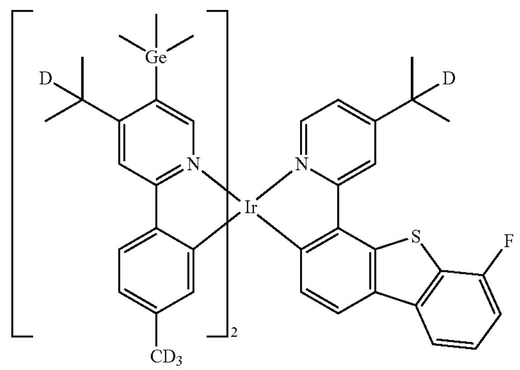
453
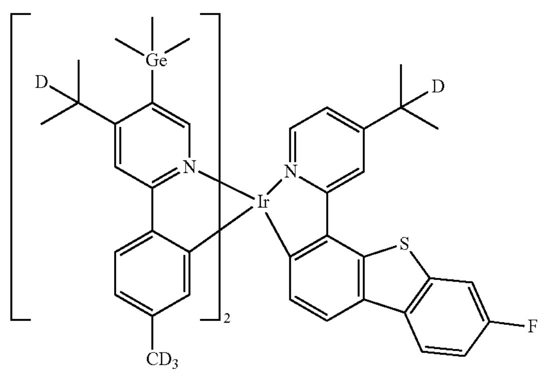
454
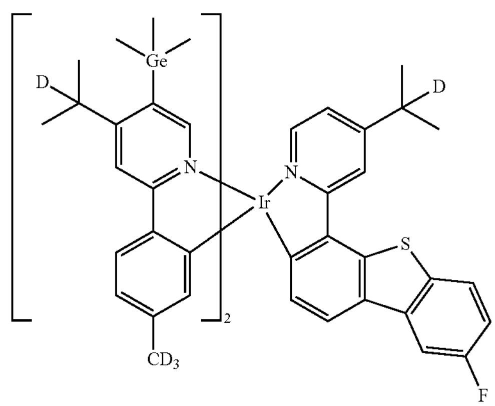
455
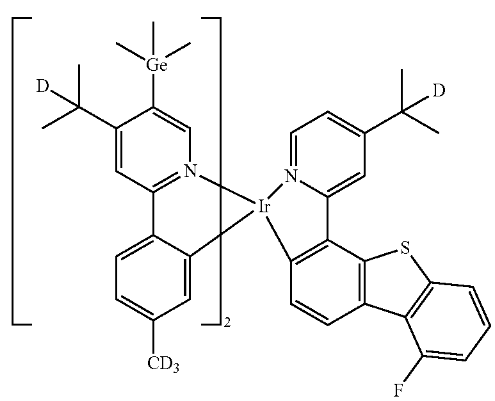

-continued
456
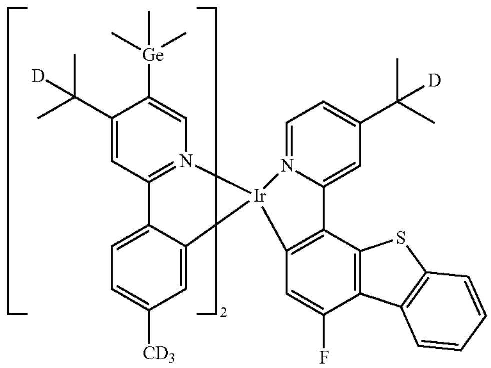
457
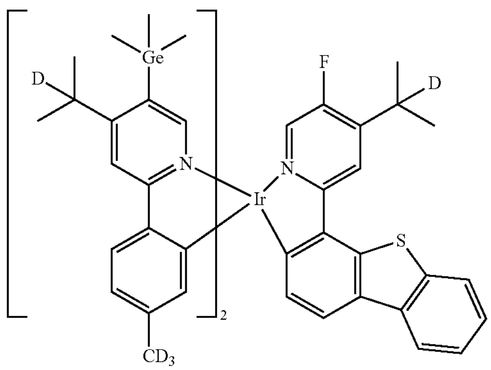
458
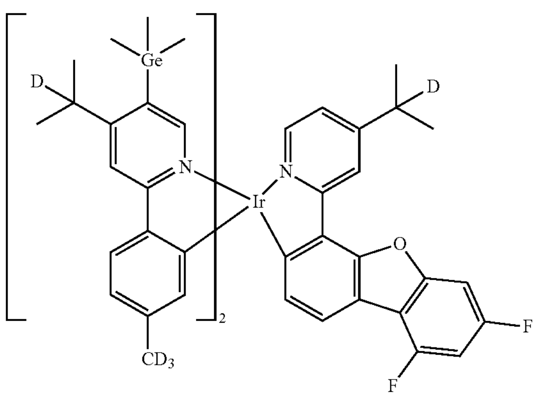
459
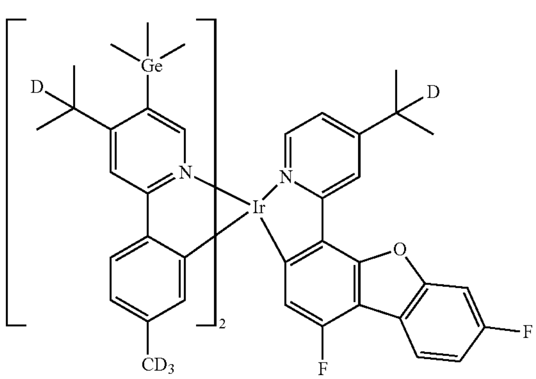
-continued
460
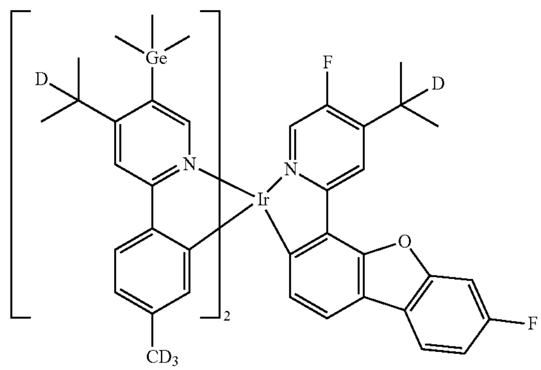
461
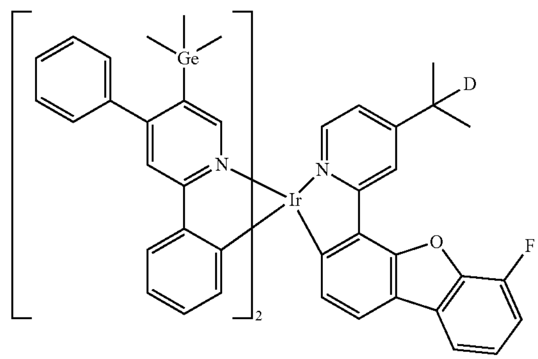
462
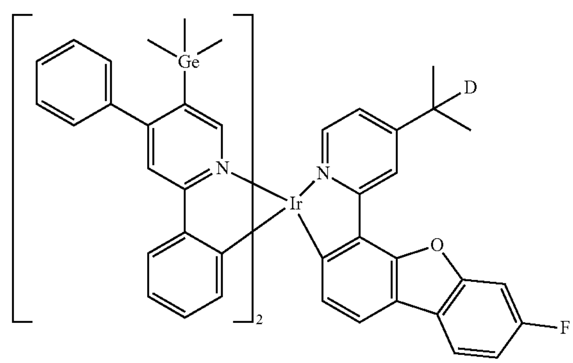
463
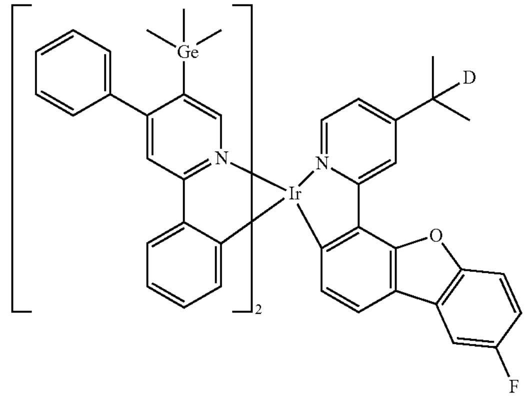

-continued
464
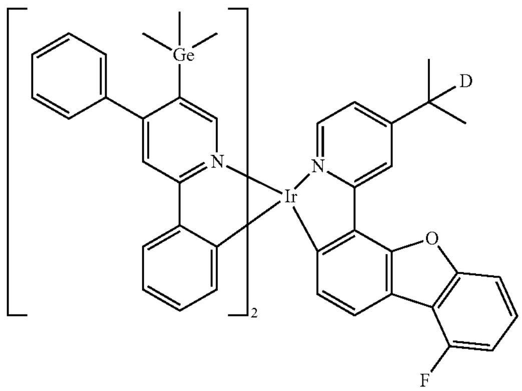
465
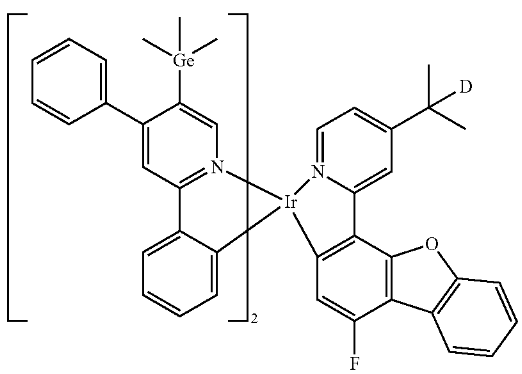
466
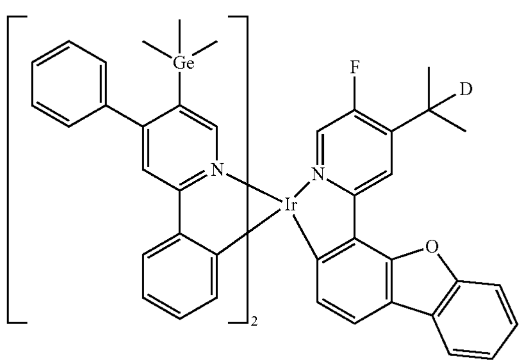
467
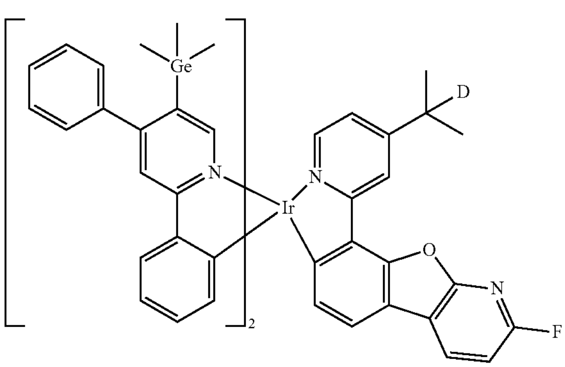
-continued
468
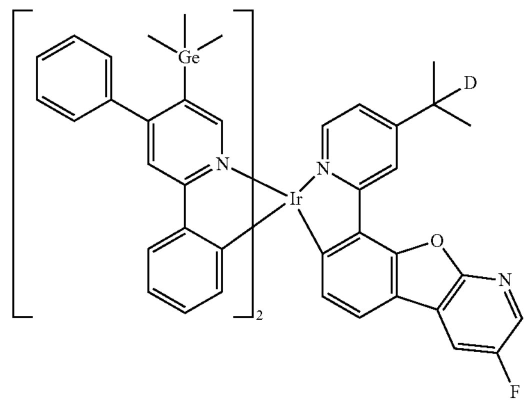
469
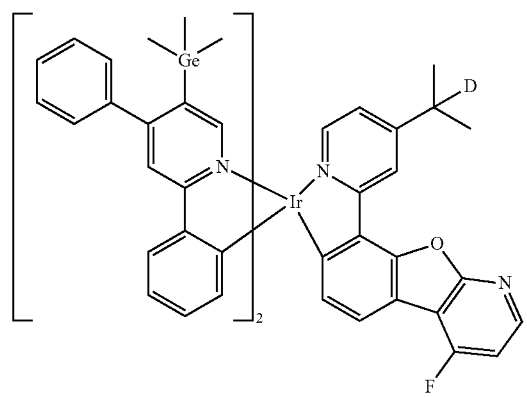
470
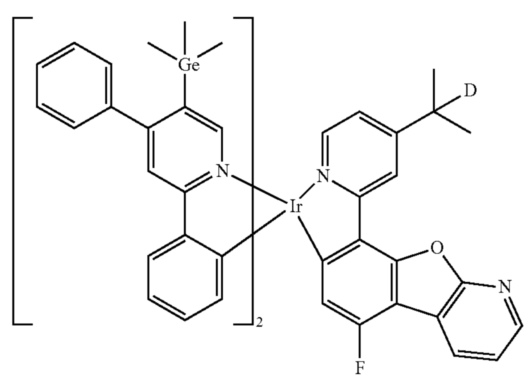
471
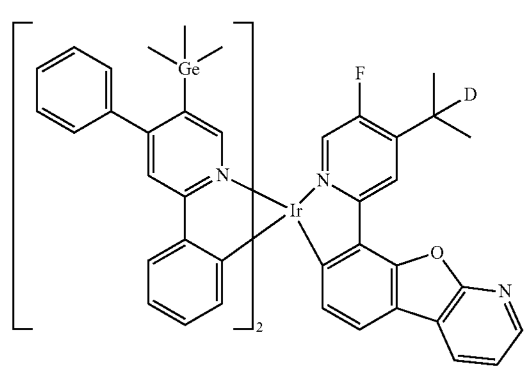

-continued
472
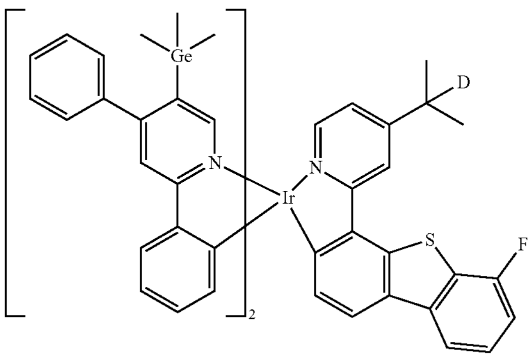
473
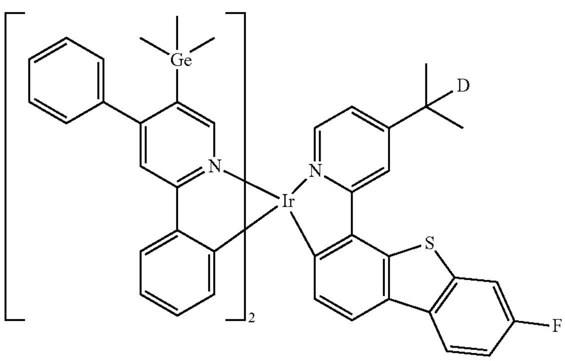
474
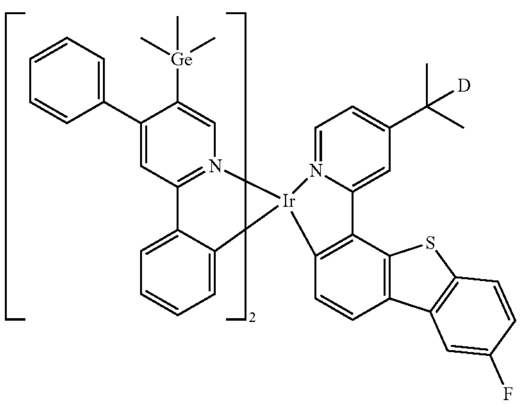
475
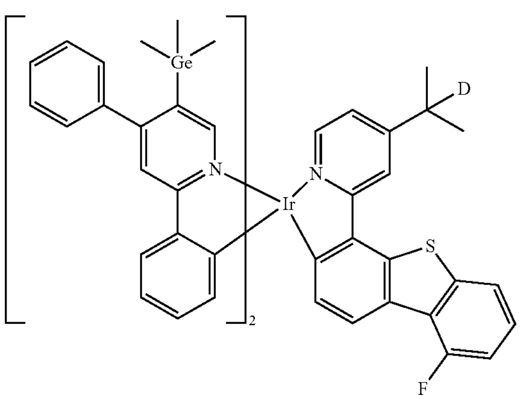
-continued
476
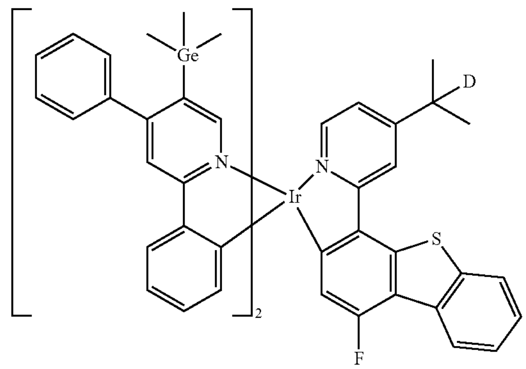
477
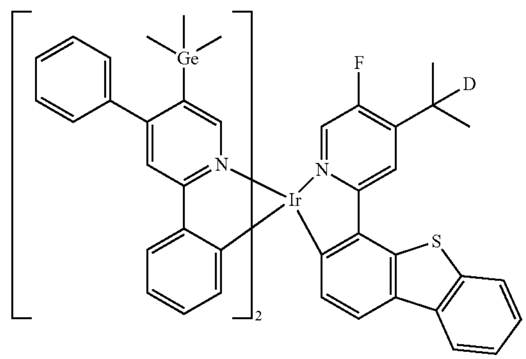
478
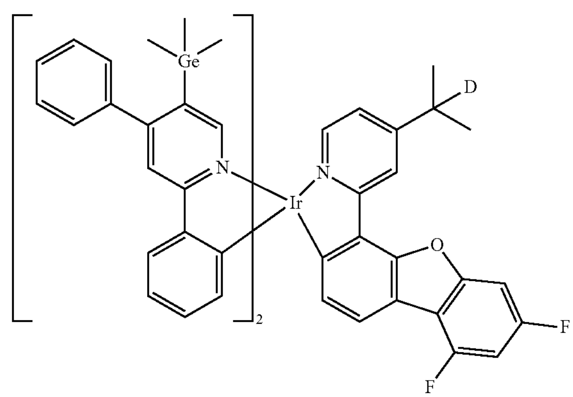
479
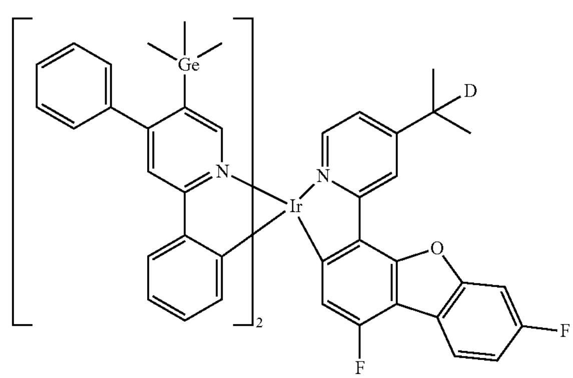

480
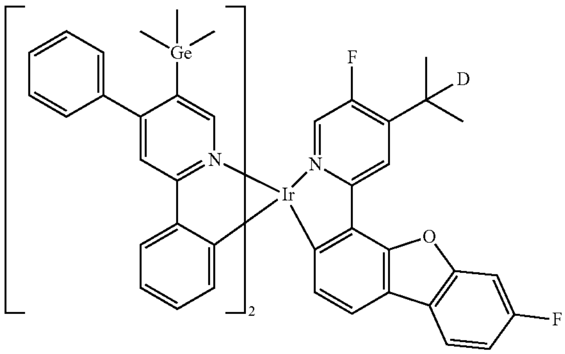
481
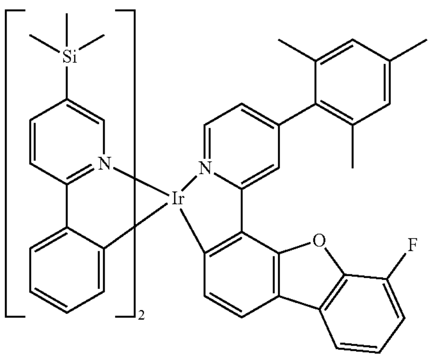
482
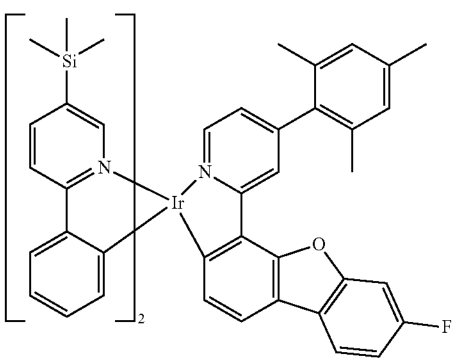
483
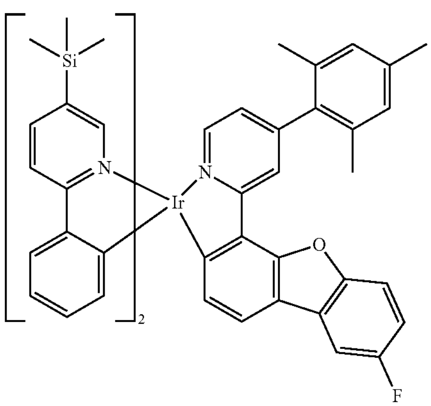
484
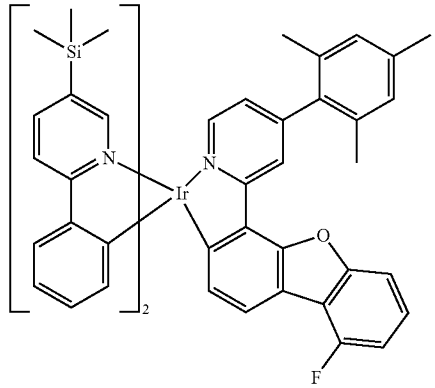
485
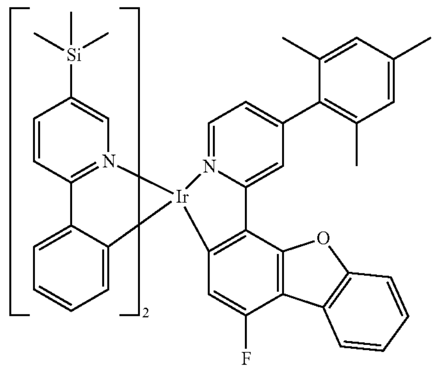
486
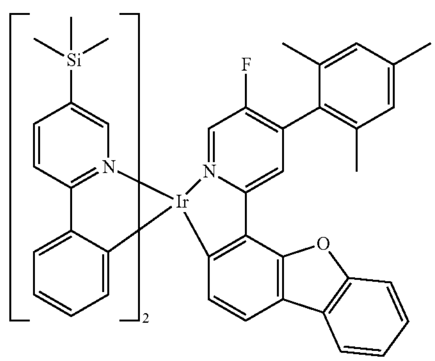
487
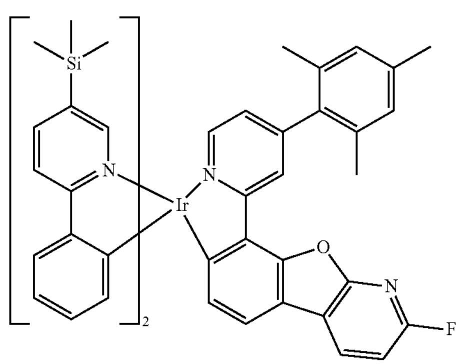

488
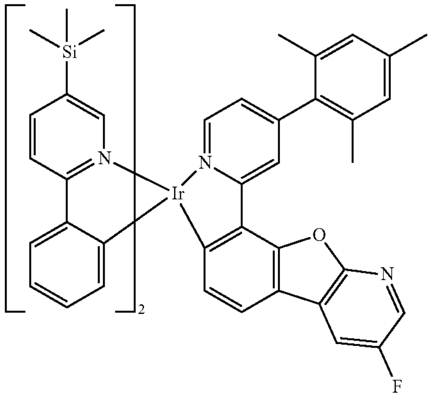
489
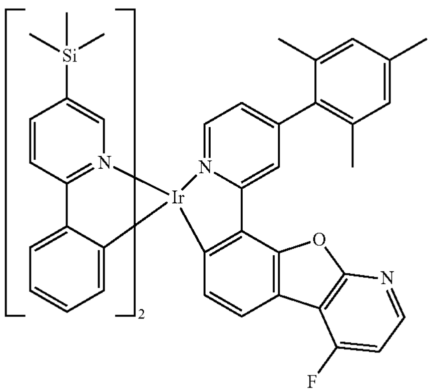
490
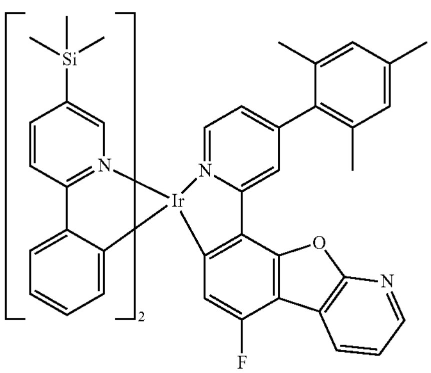
491
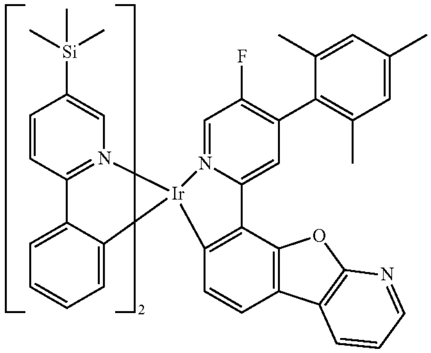
492
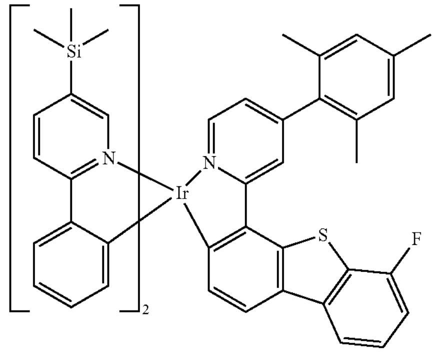
493
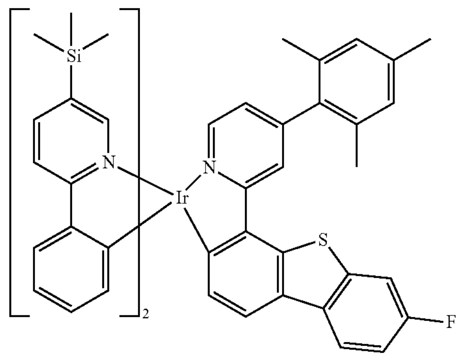
494
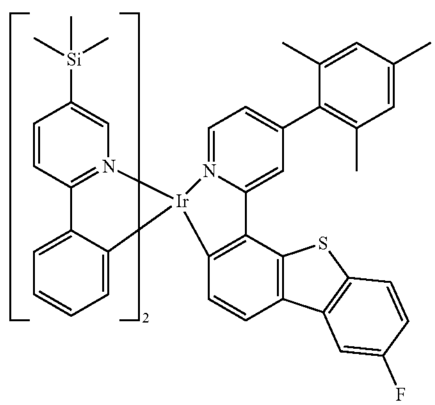
495
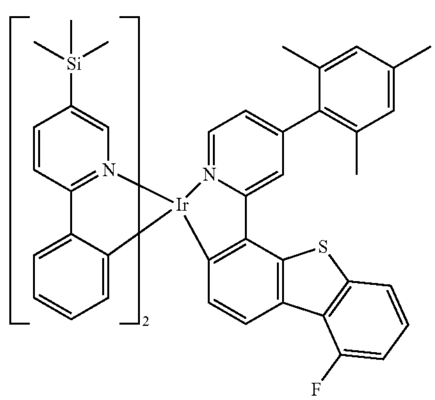

496
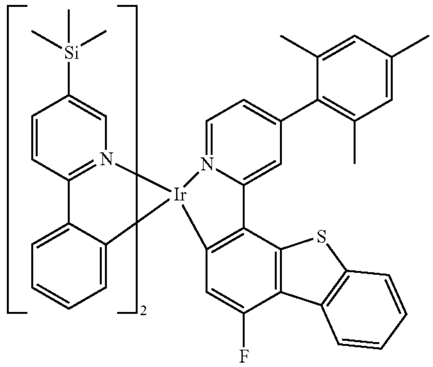
497
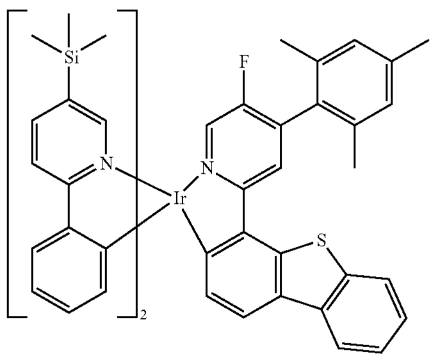
498
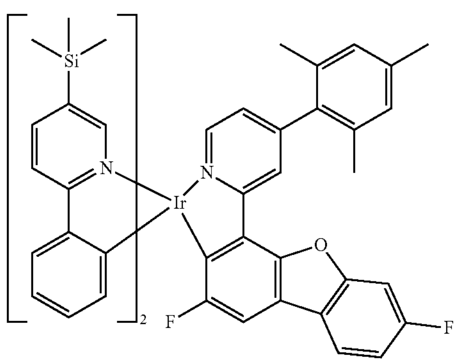
499
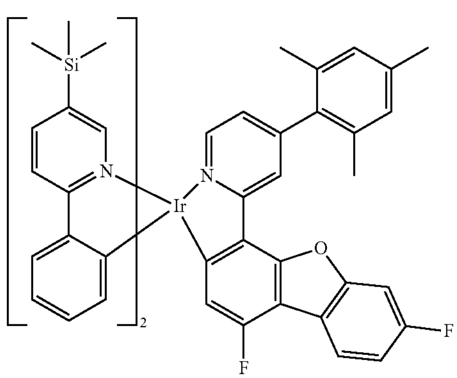
500
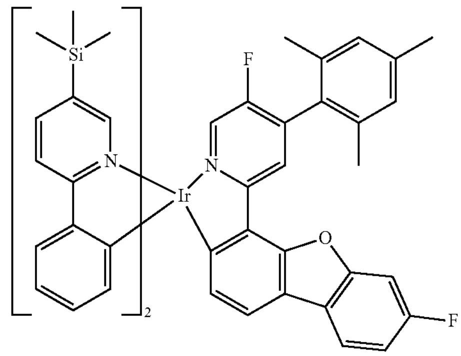
501
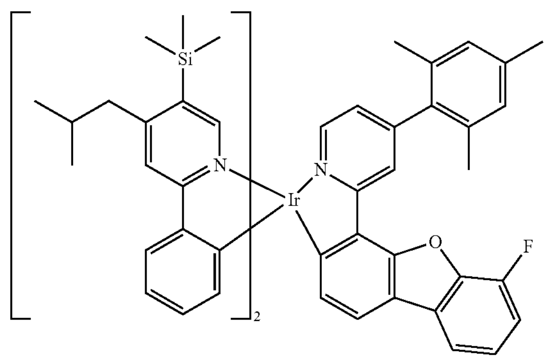
502
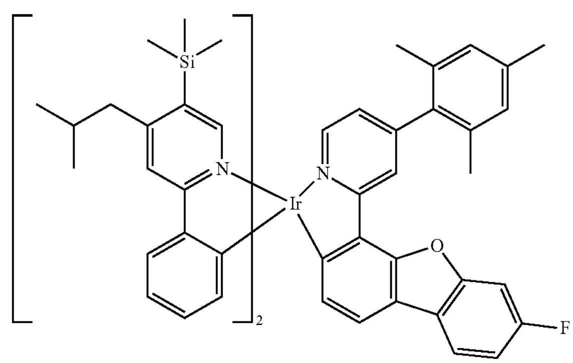
503
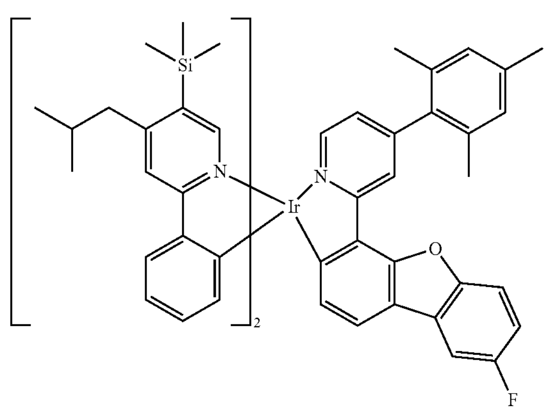

-continued
504
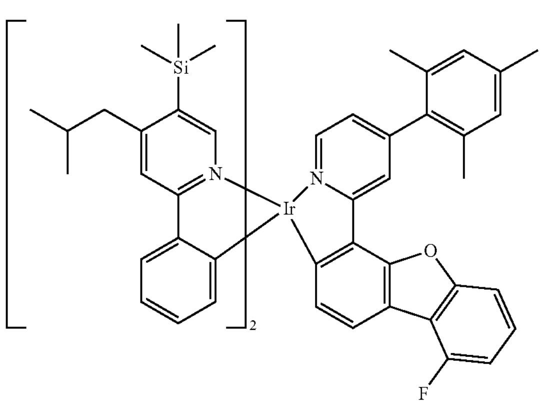
505
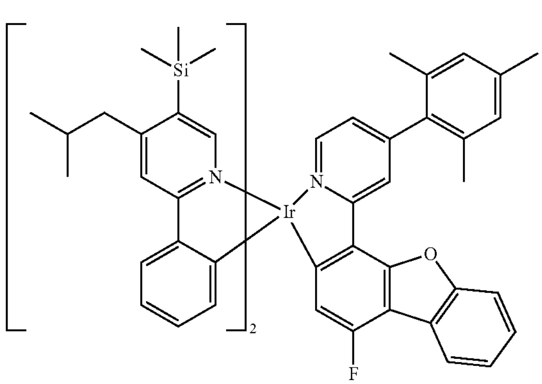
506
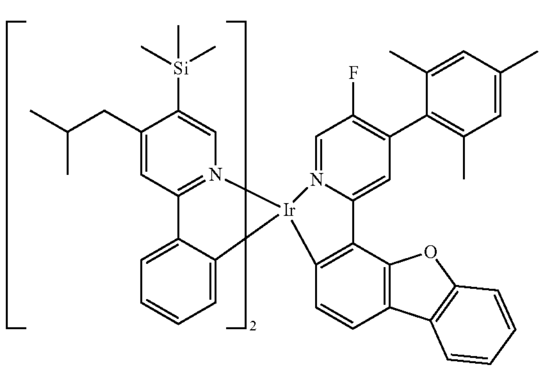
507
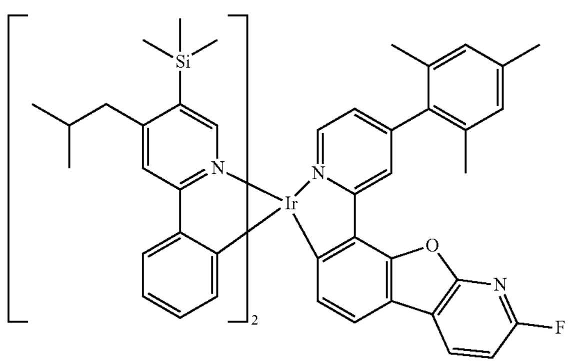
-continued
508
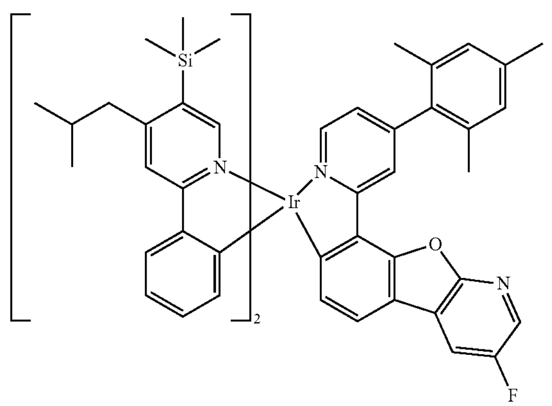
509
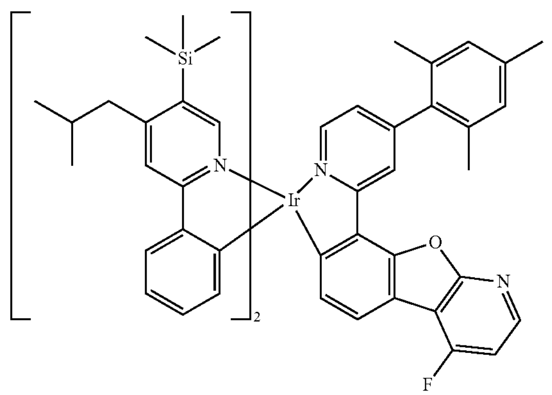
510
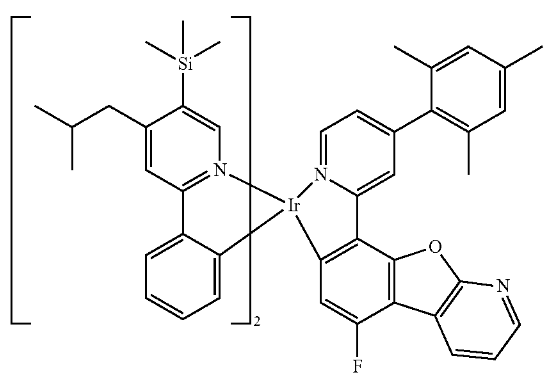
511
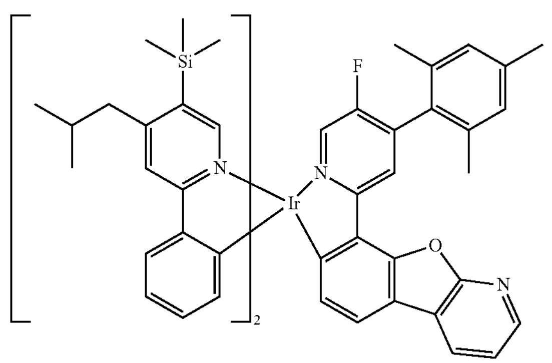

-continued
512
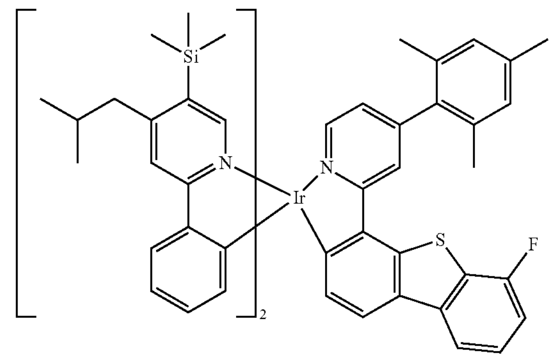
513
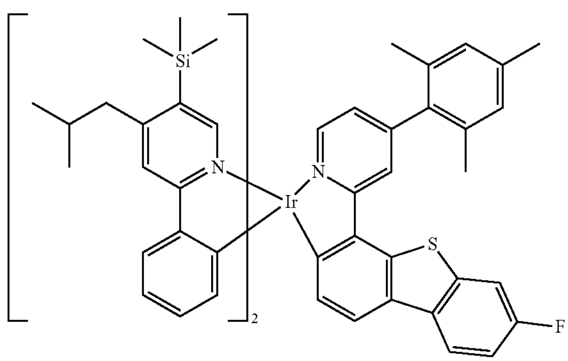
514
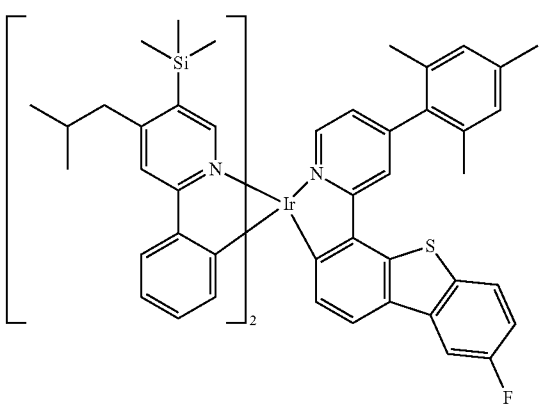
515
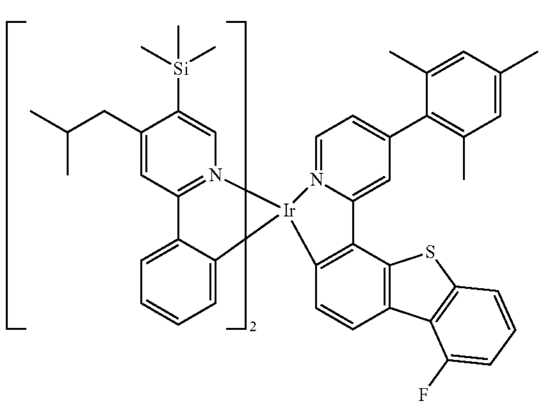
-continued
516
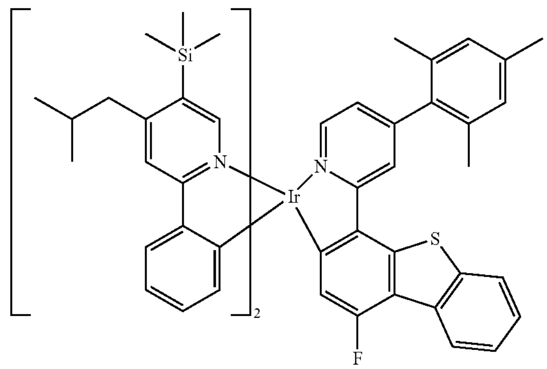
517
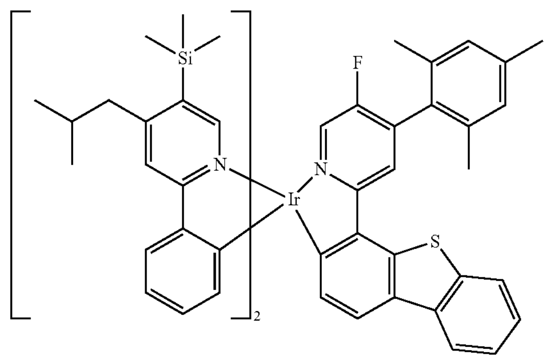
518
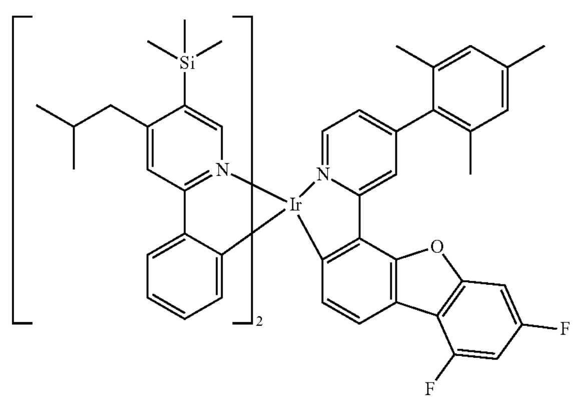
519
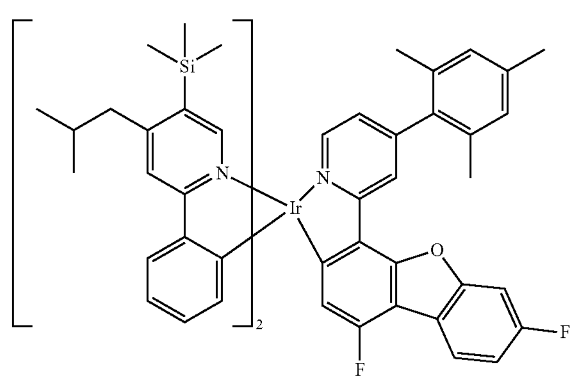

-continued
520
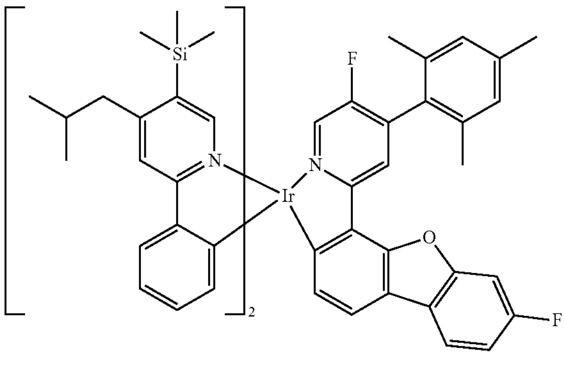
521
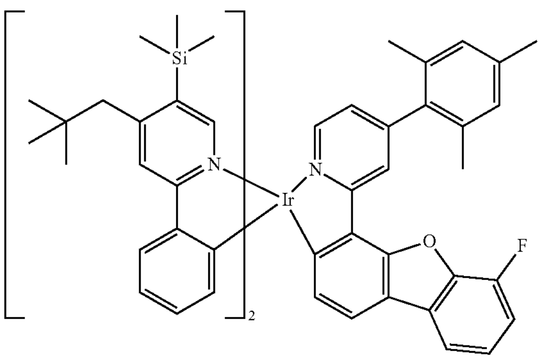
522
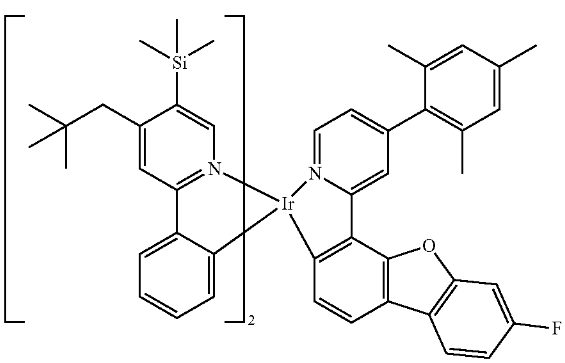
523
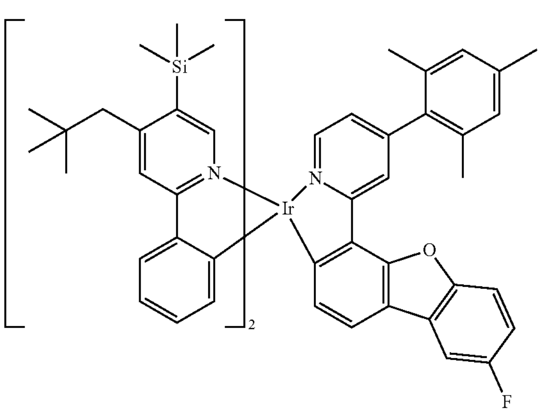
-continued
524
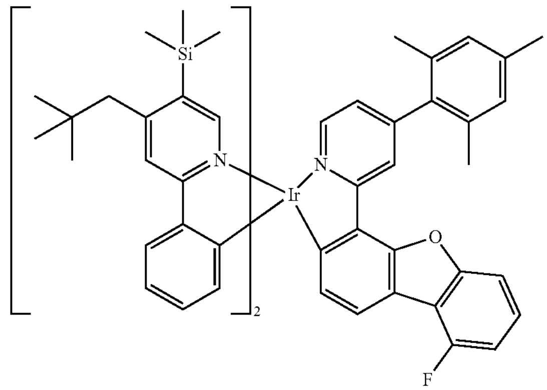
525
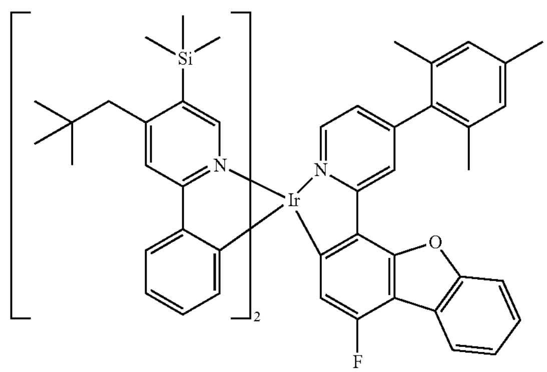
526
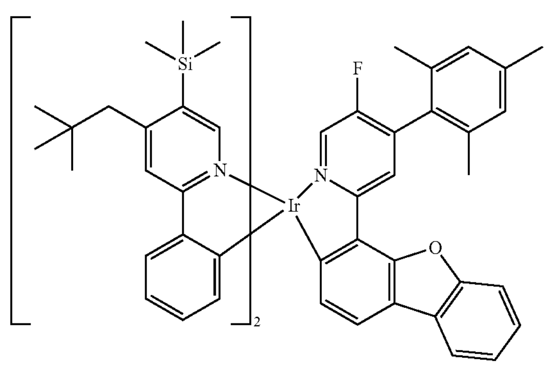
527
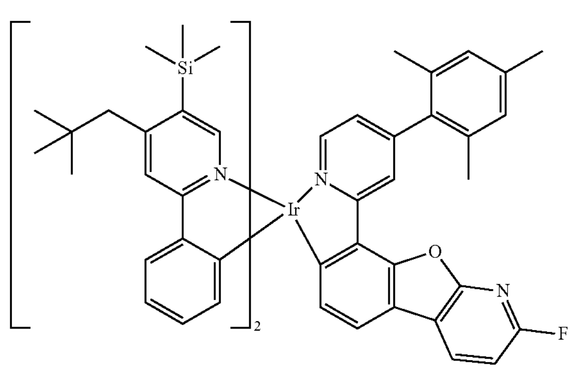

-continued
528
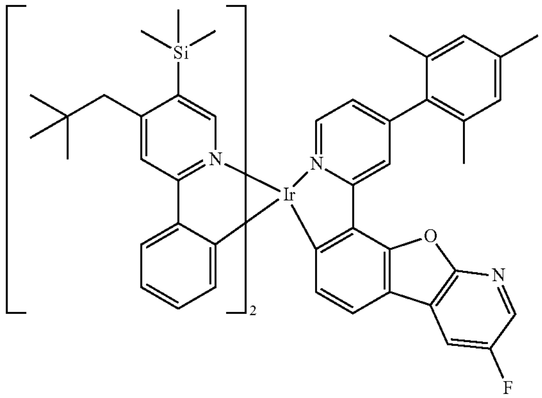
529
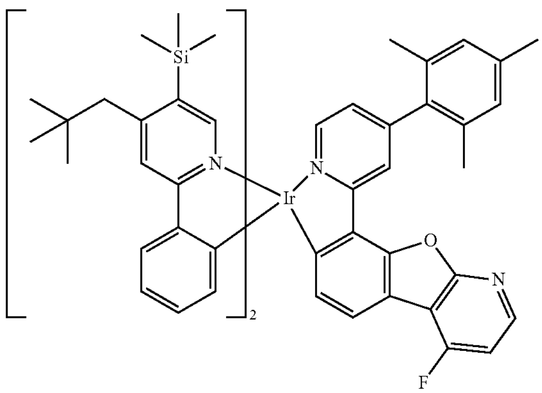
530
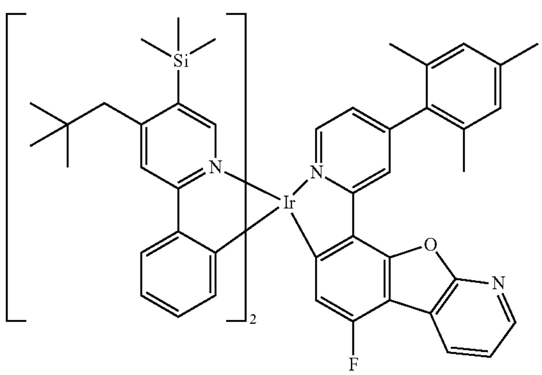
531
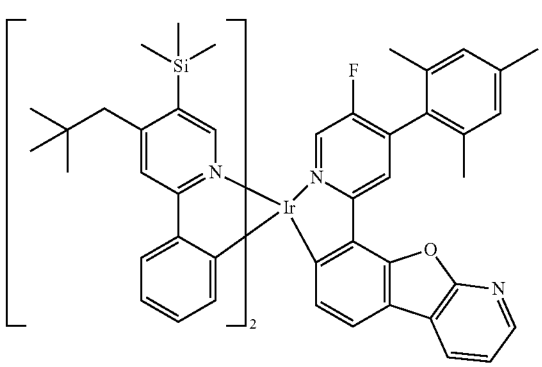
-continued
532
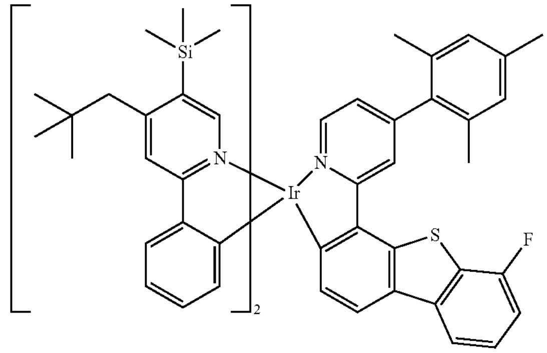
533
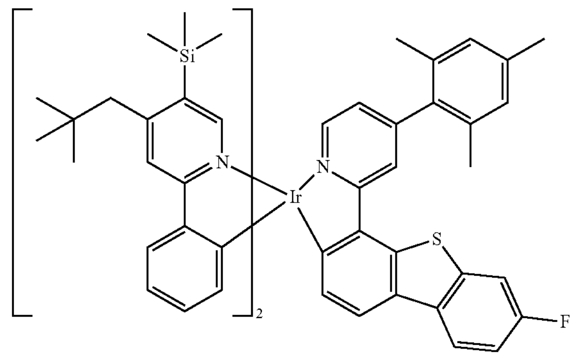
534
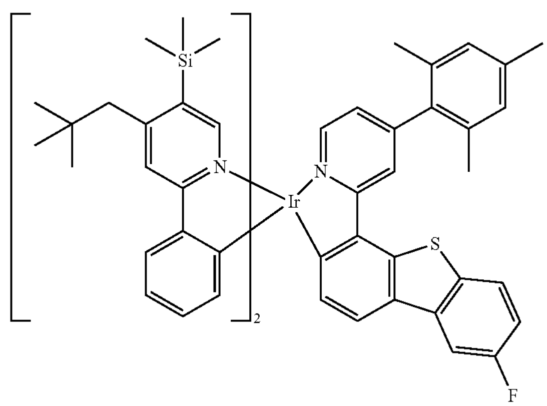
535
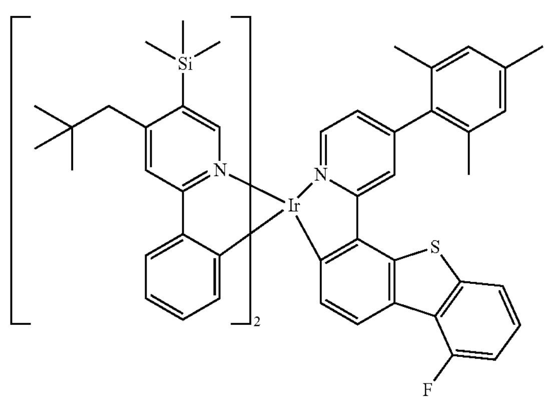

-continued
536
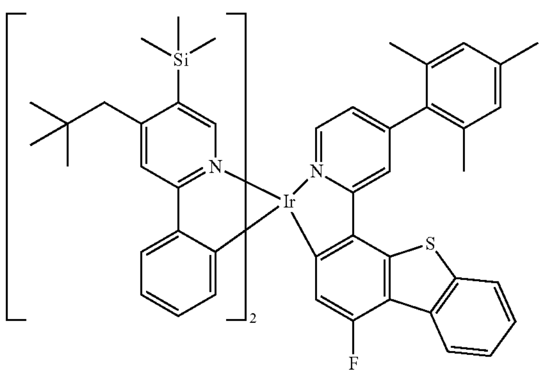
537
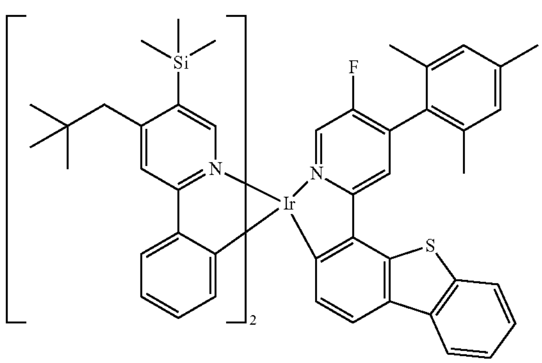
538
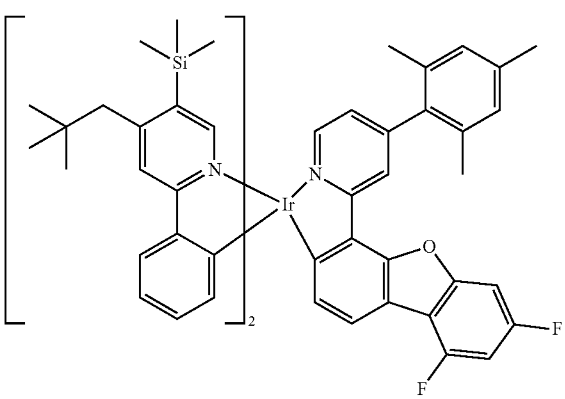
539
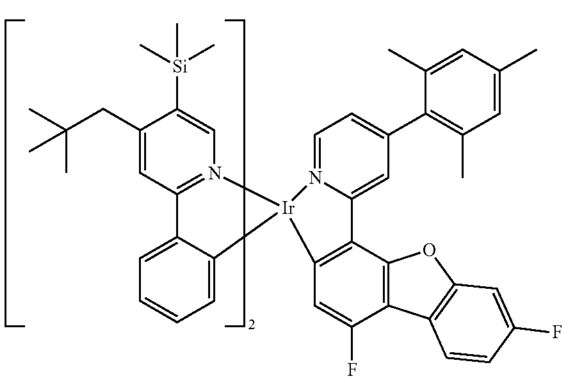
540
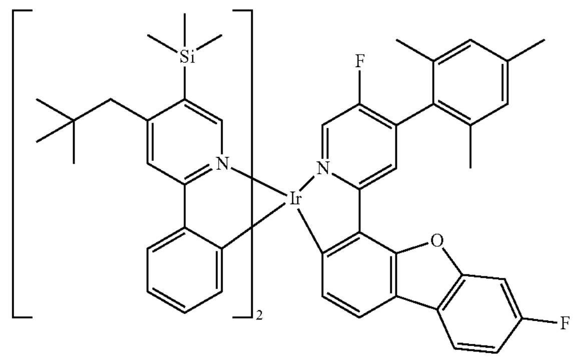
541
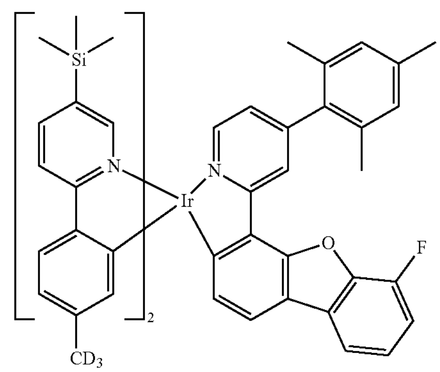
542
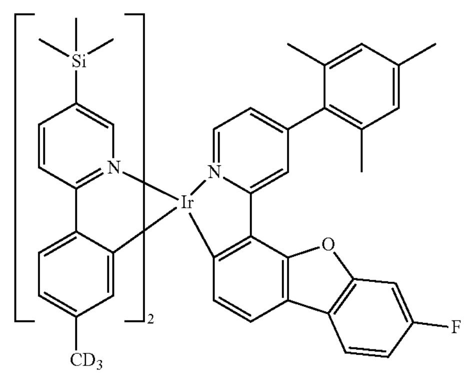
543
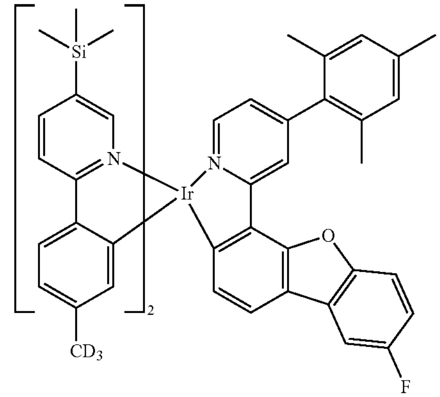

-continued
544
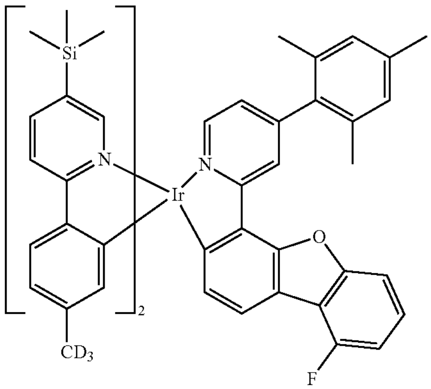
545
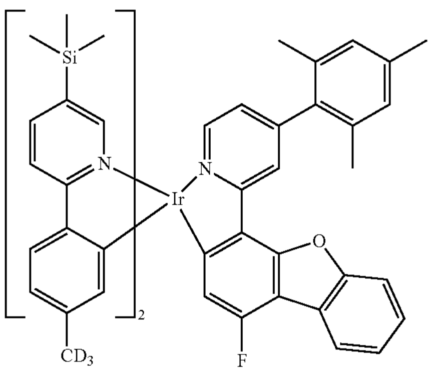
546
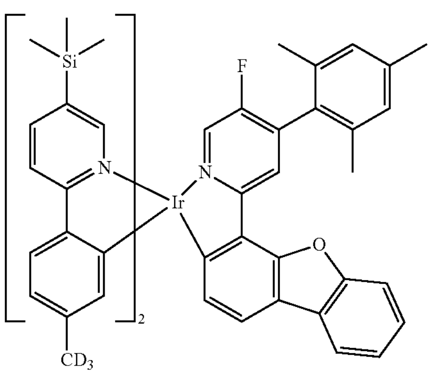
547
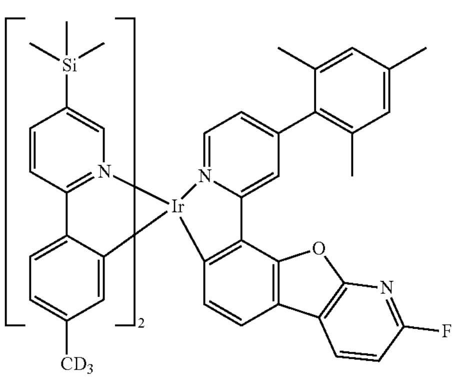
-continued
548
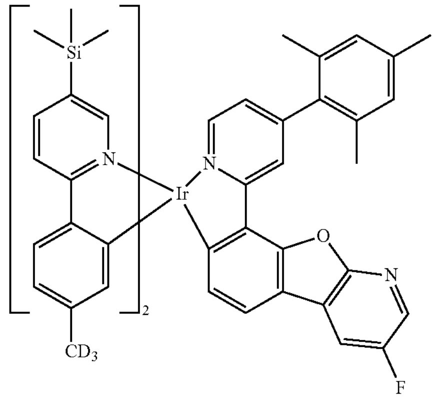
549
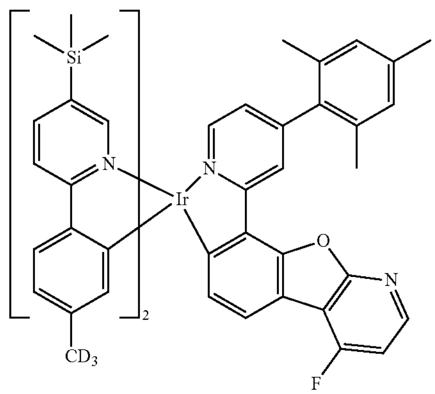
550
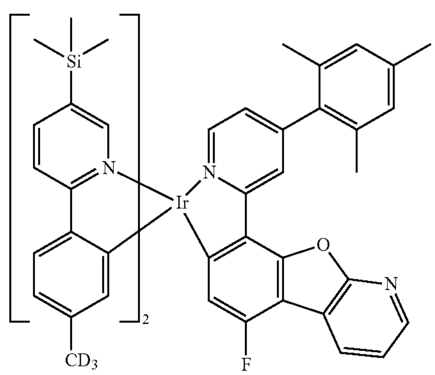
551
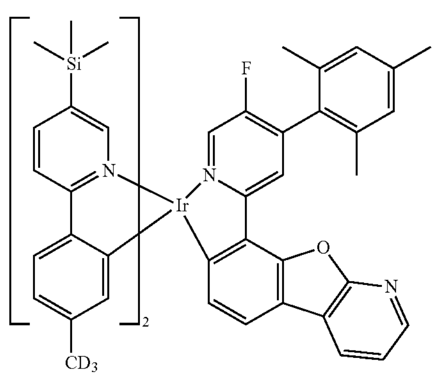

-continued
552
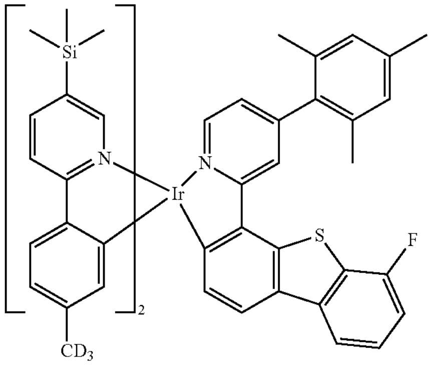
553
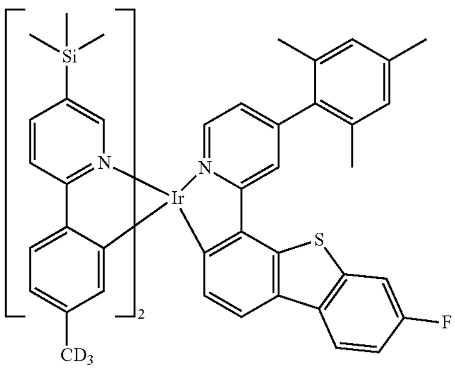
554
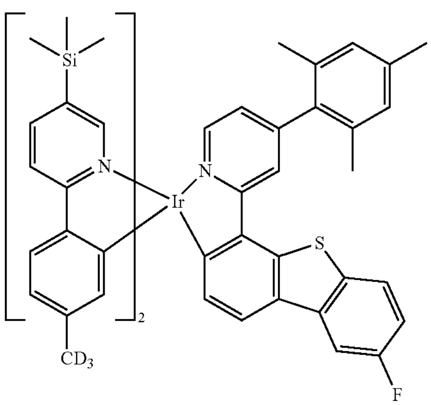
555
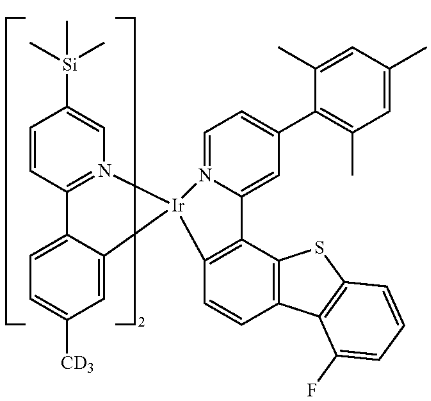
-continued
556
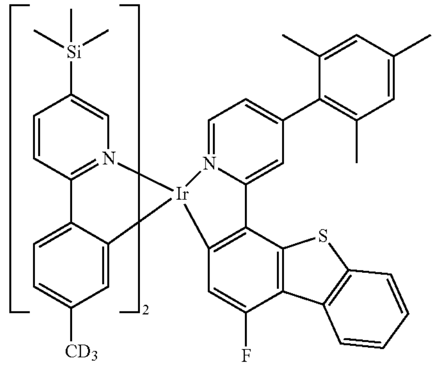
557
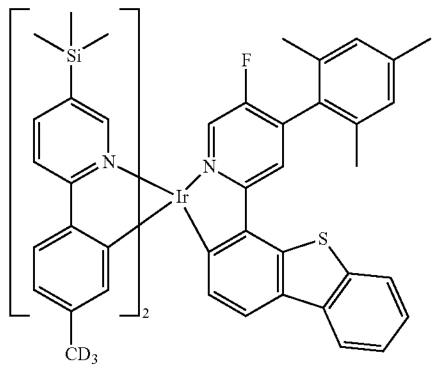
558
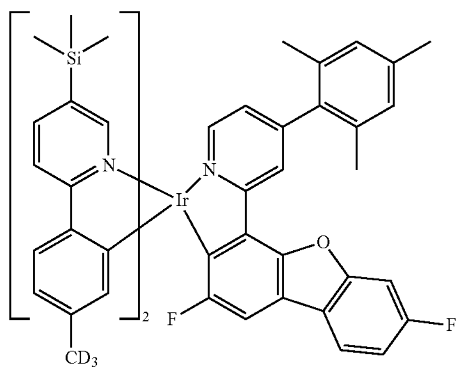
559
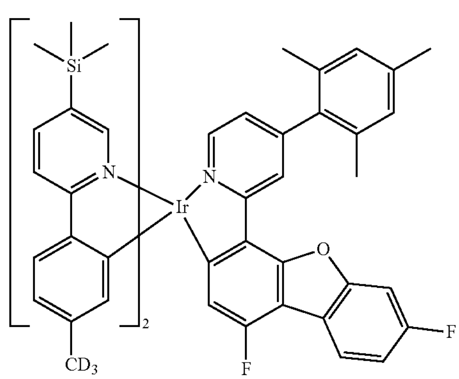

-continued
560
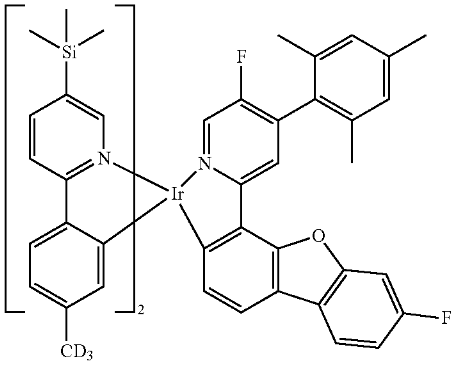
561
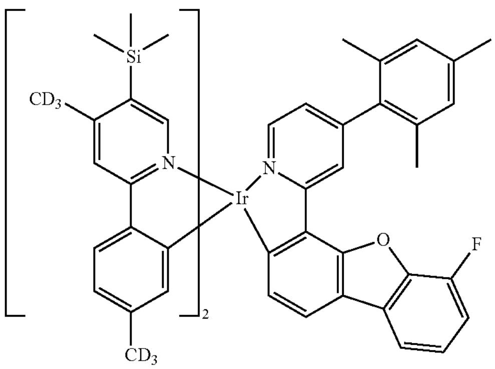
562
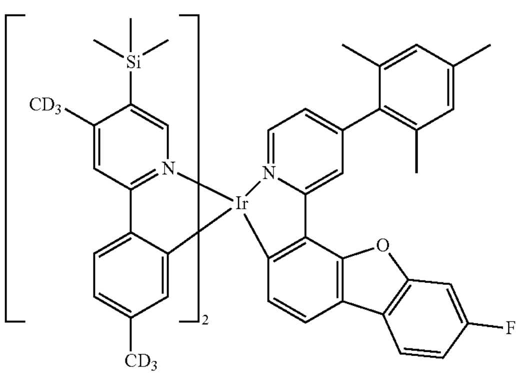
563
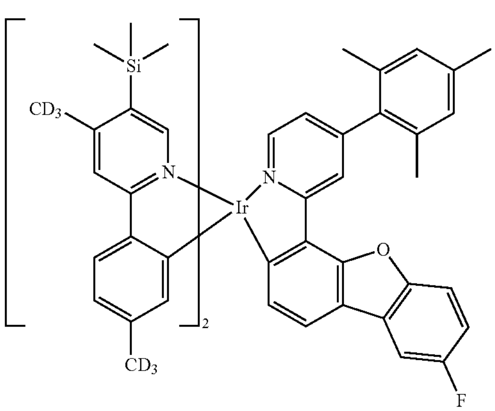
-continued
564
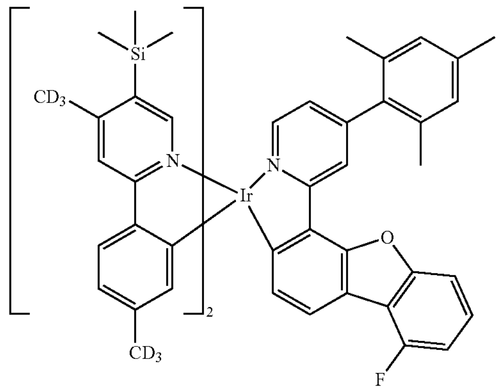
565
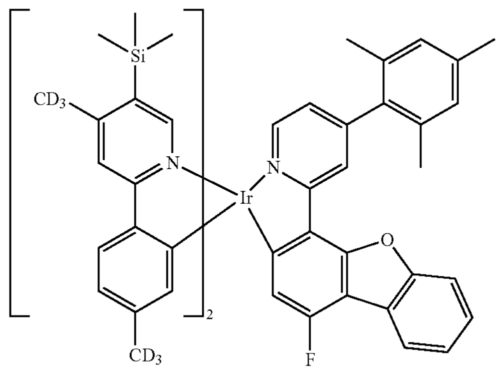
566
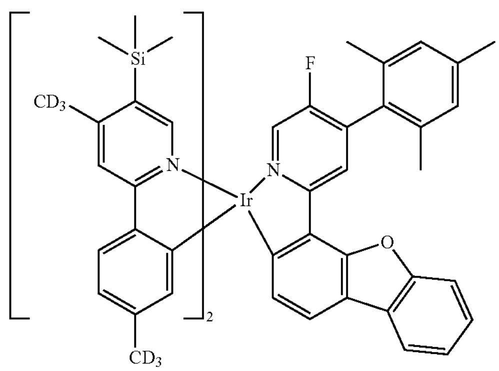
567
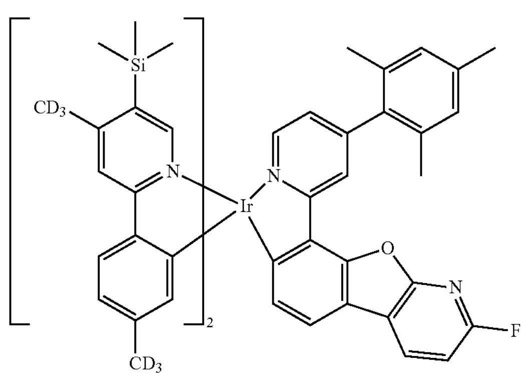

-continued
568
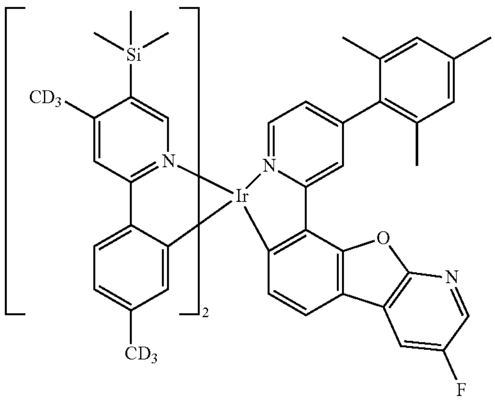
569
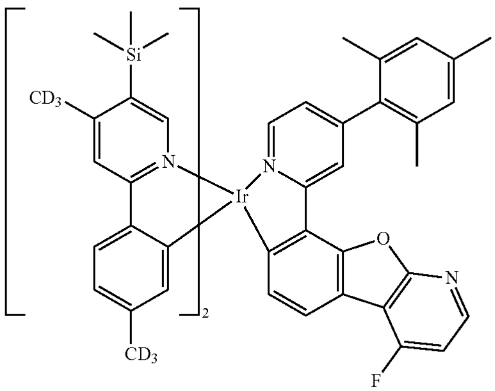
570
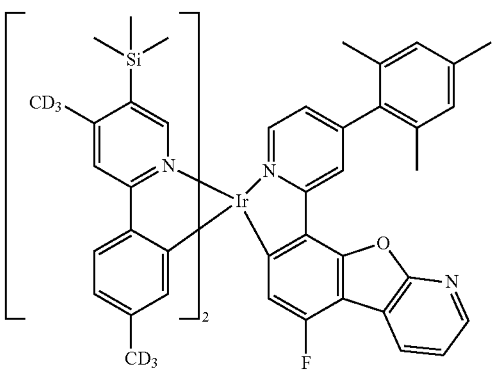
571
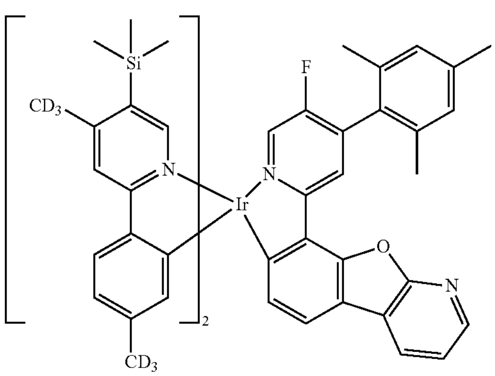
-continued
572
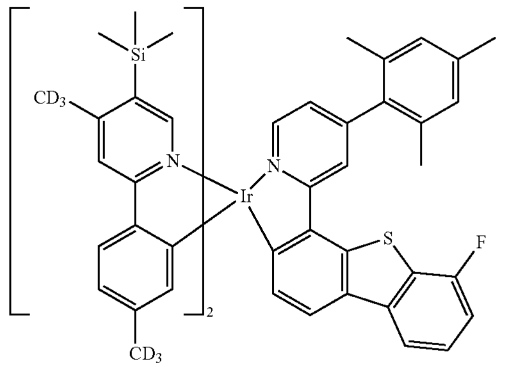
573
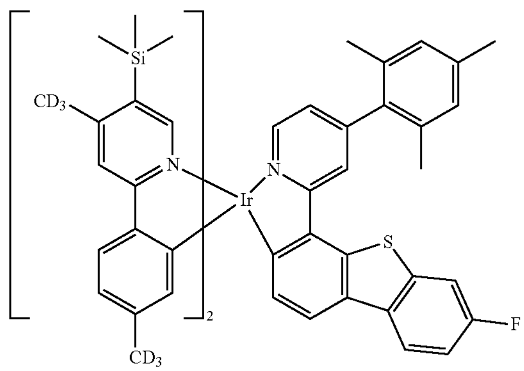
574
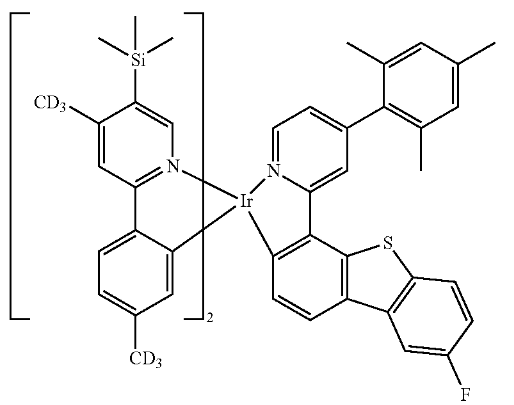
575
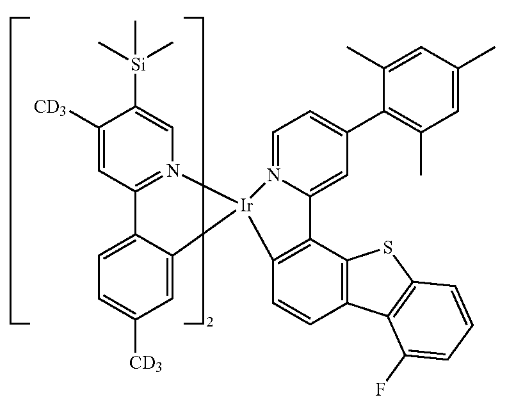

576
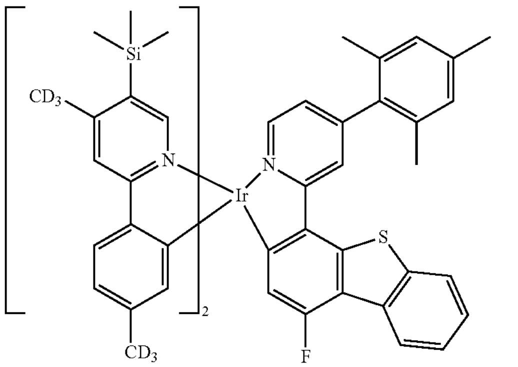
577
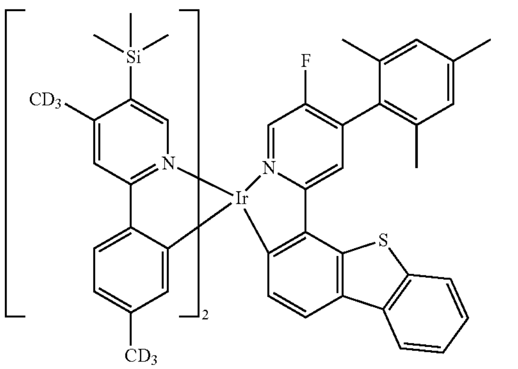
578
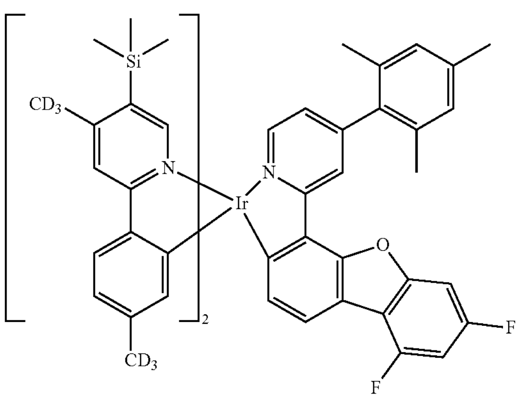
579
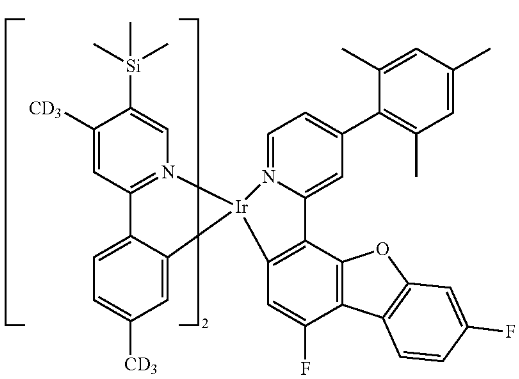
580
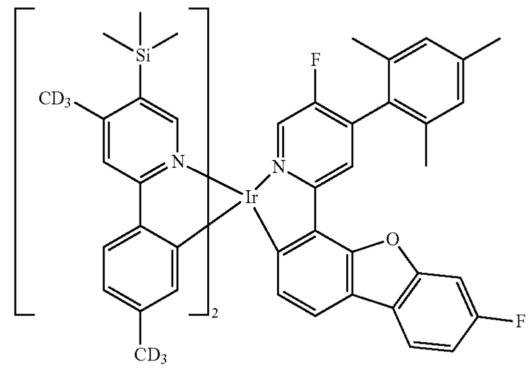
581
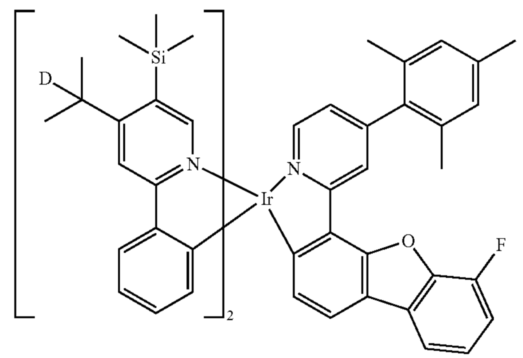
582
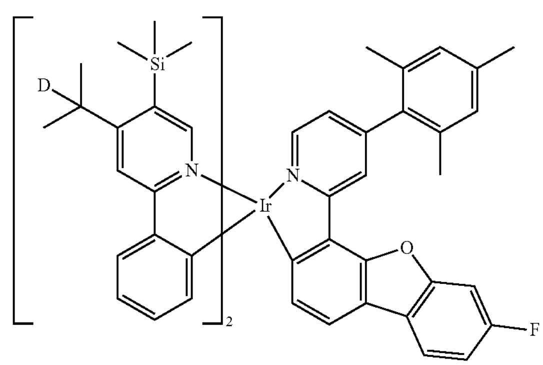
583
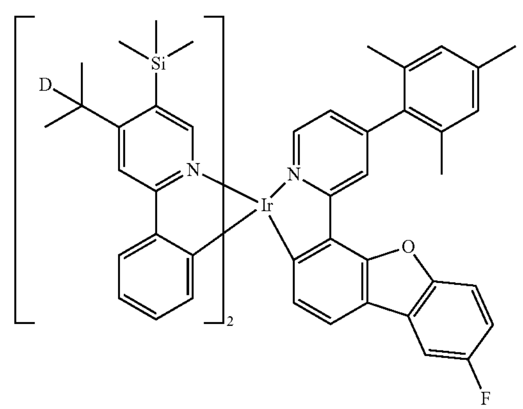

-continued
584
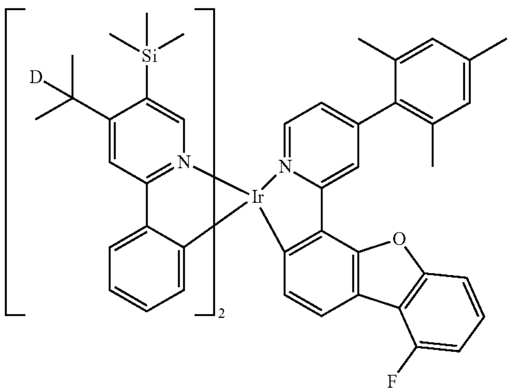
585
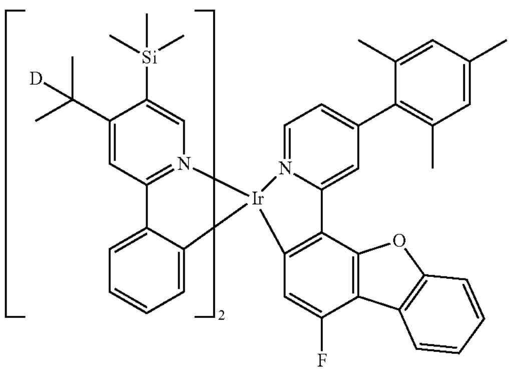
586
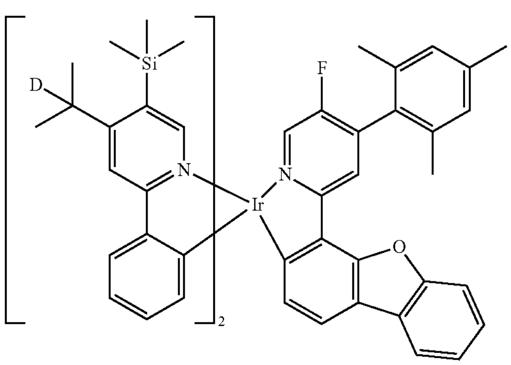
587
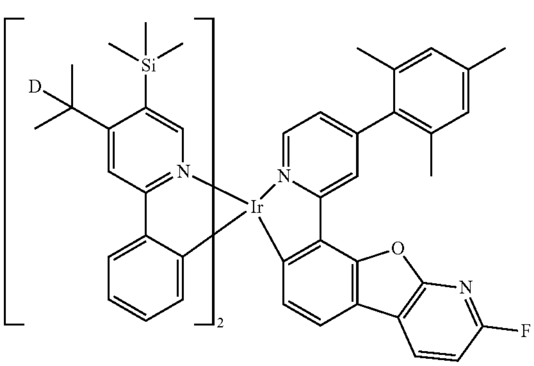
-continued
588
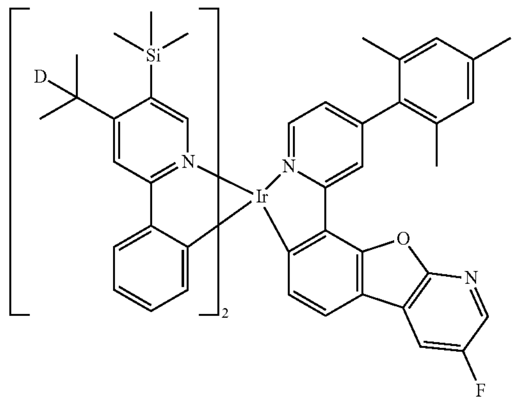
589
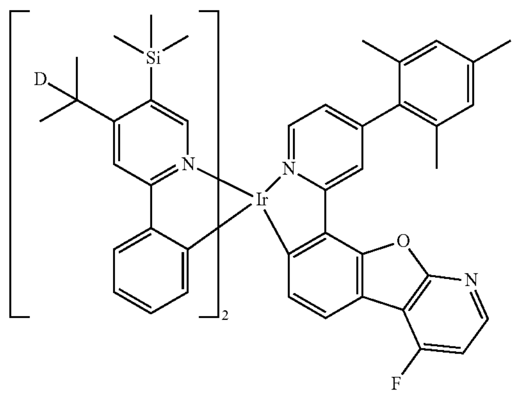
590
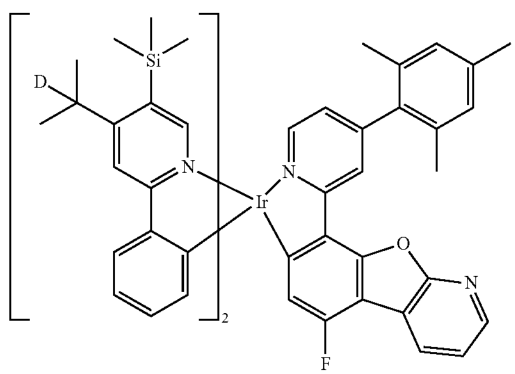
591
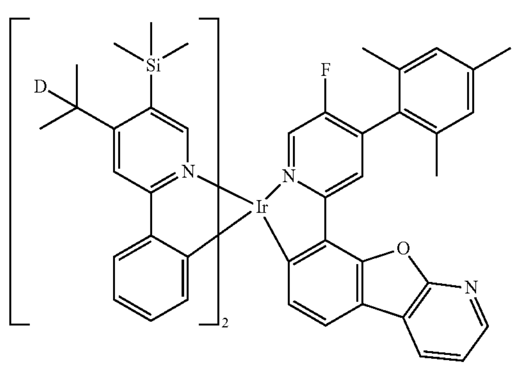

-continued
592
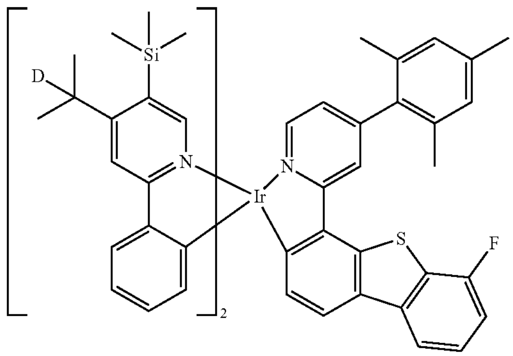
593
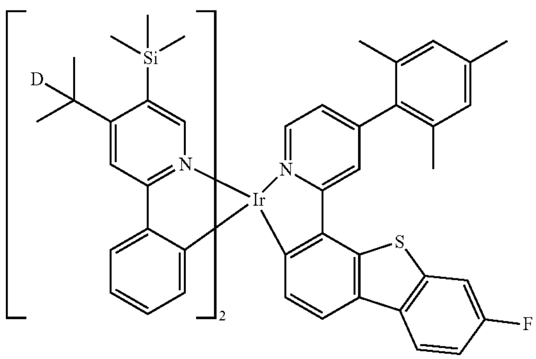
594
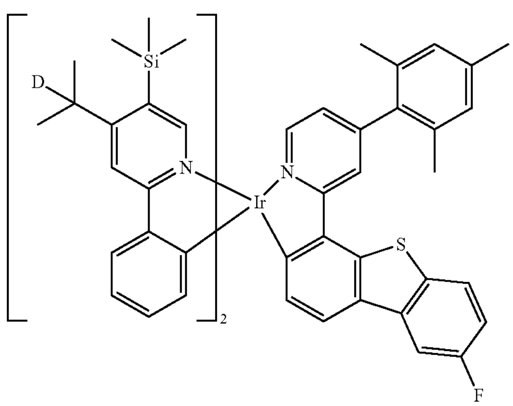
595
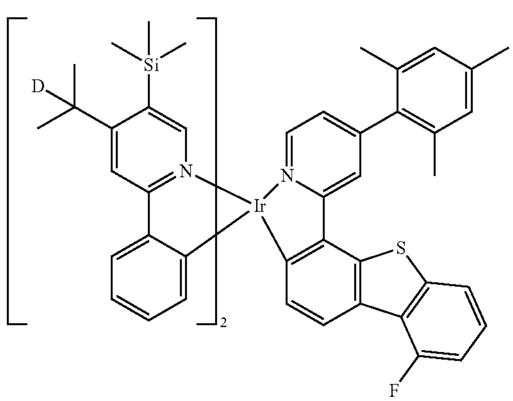
-continued
596
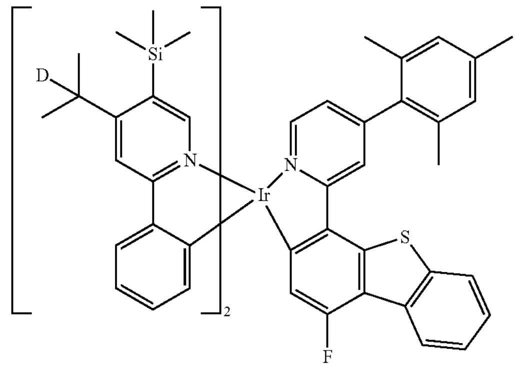
597
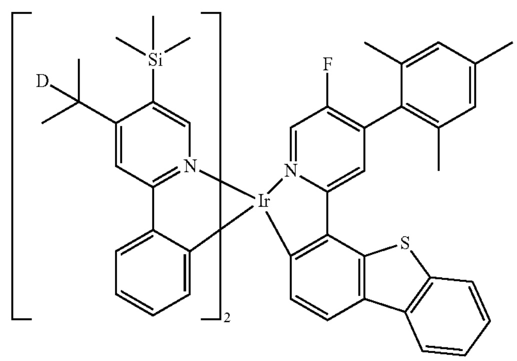
598
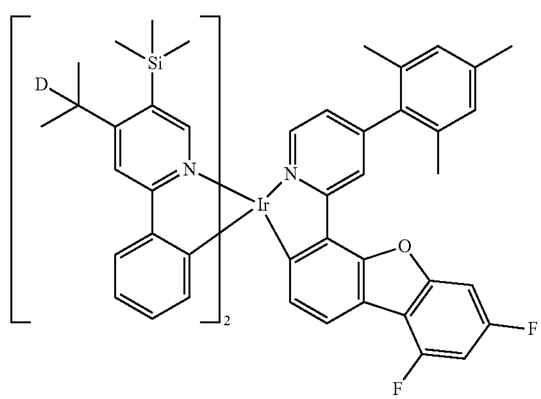
599
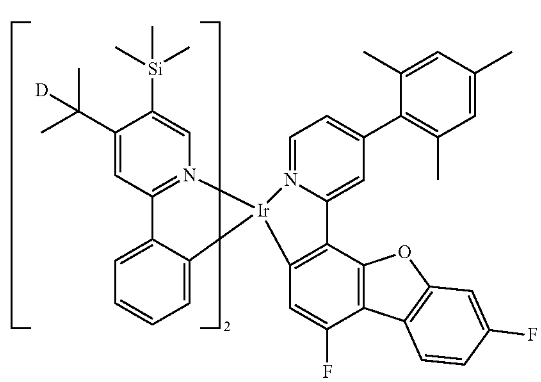

-continued
600
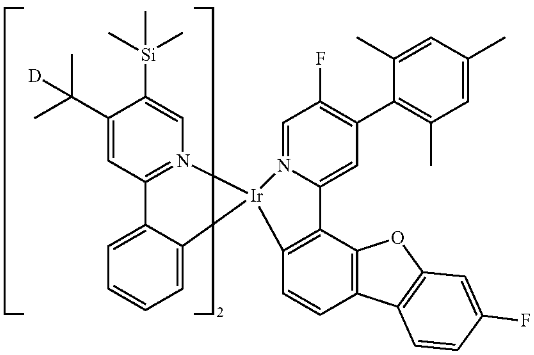
601
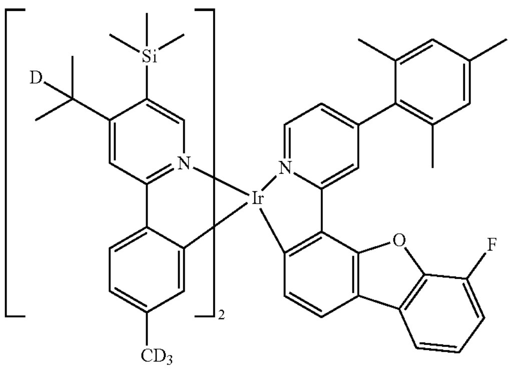
602
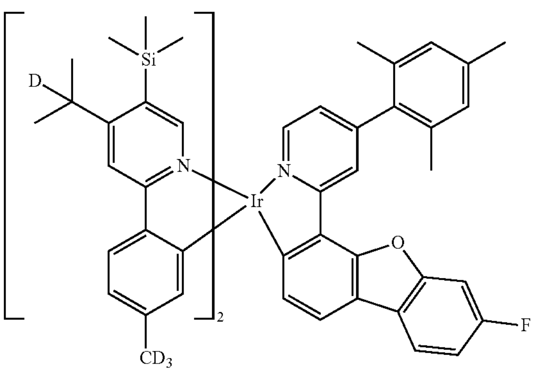
603
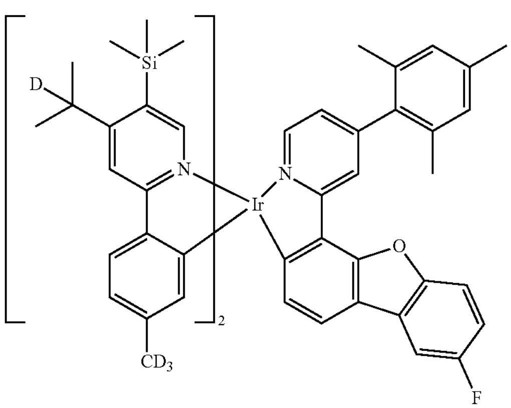
-continued
604
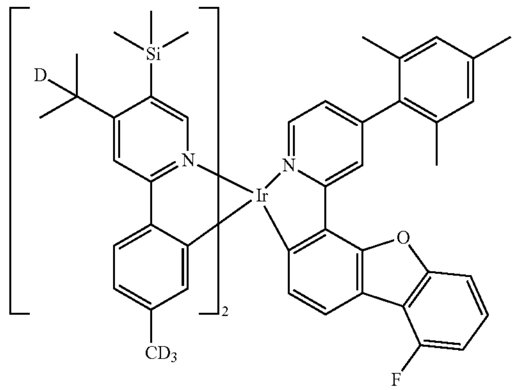
605
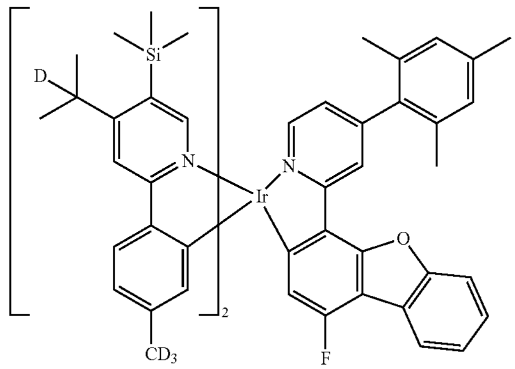
606
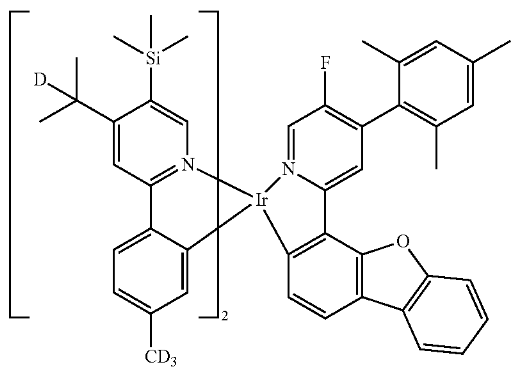
607
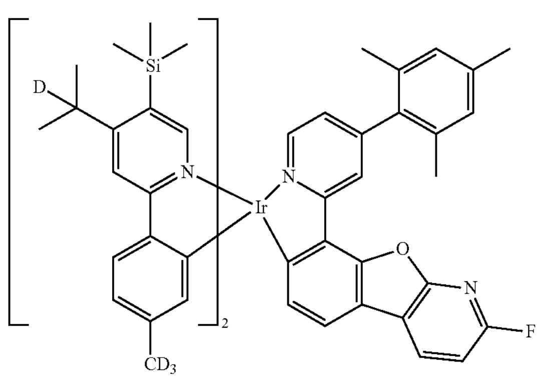

-continued
608
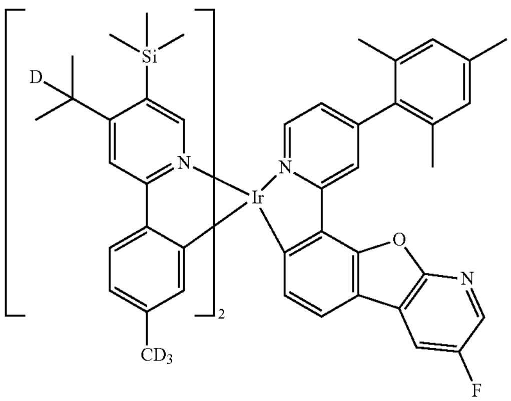
609
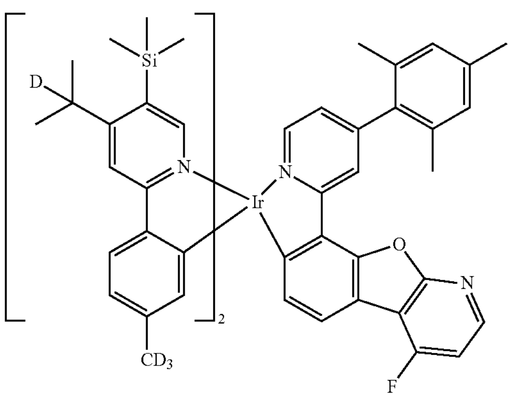
610
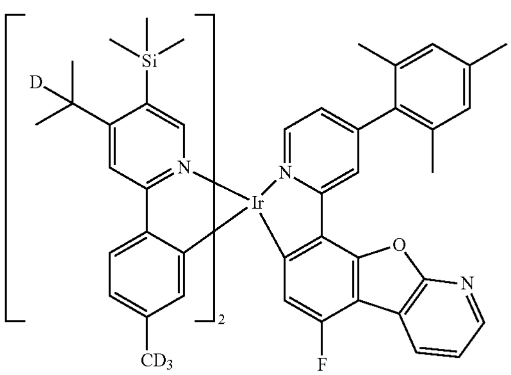
611
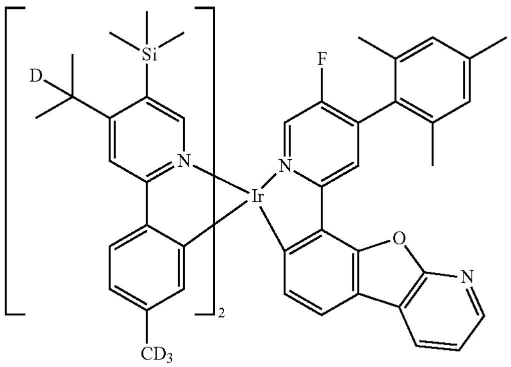
-continued
612
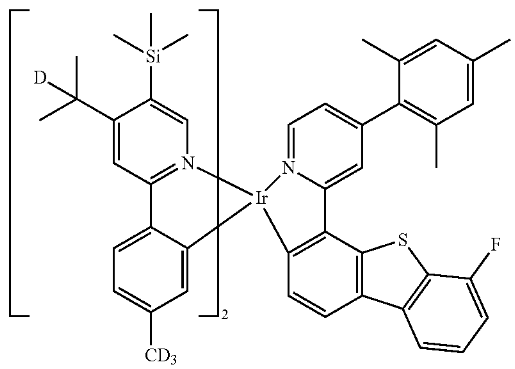
613
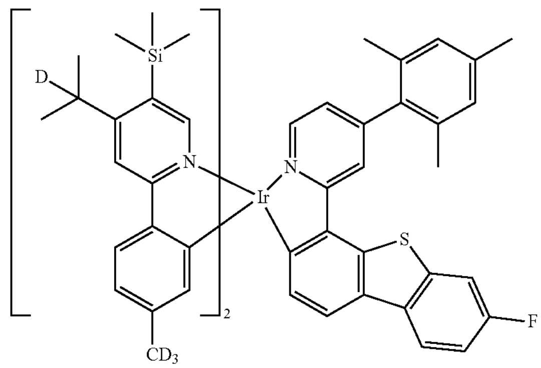
614
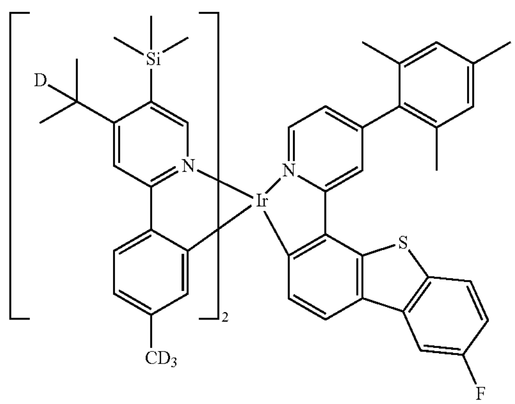
615
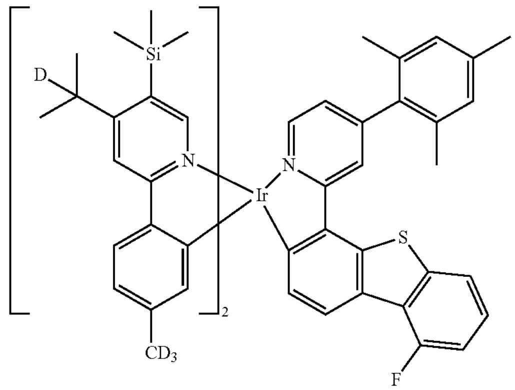

-continued
616
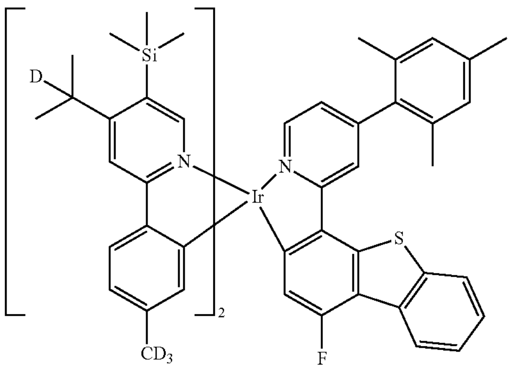
617
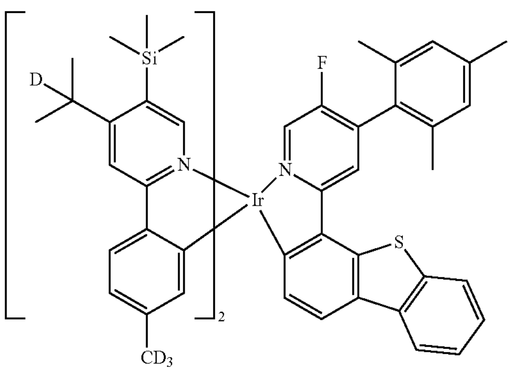
618
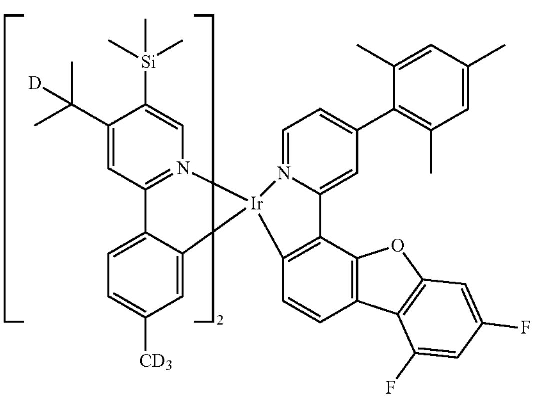
619
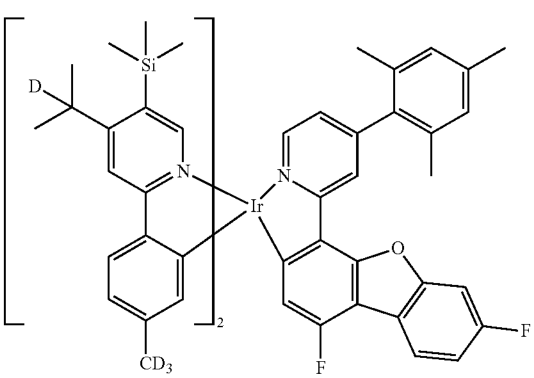
-continued
620
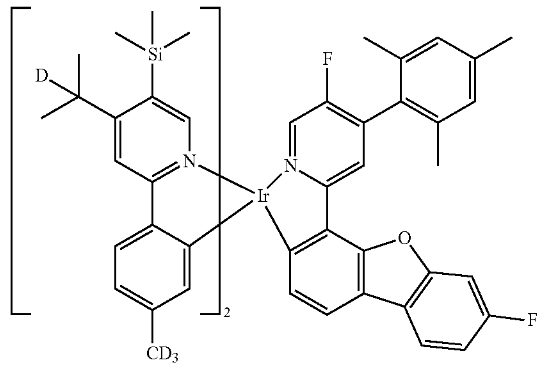
621
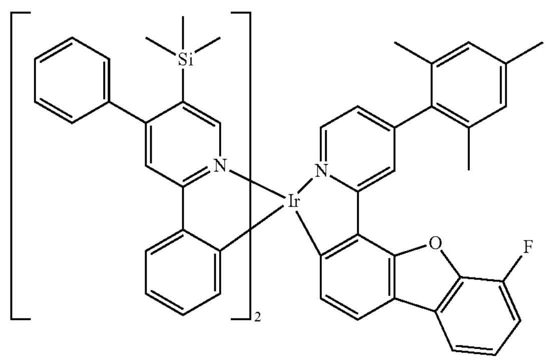
622
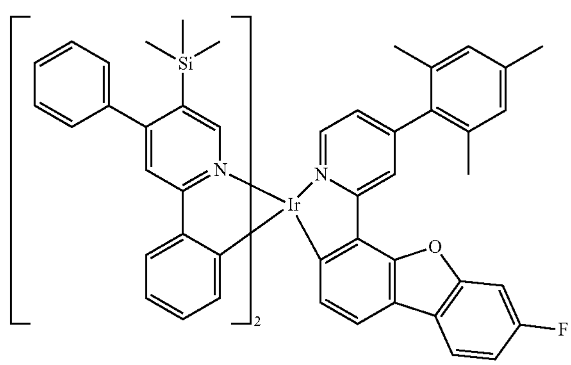
623
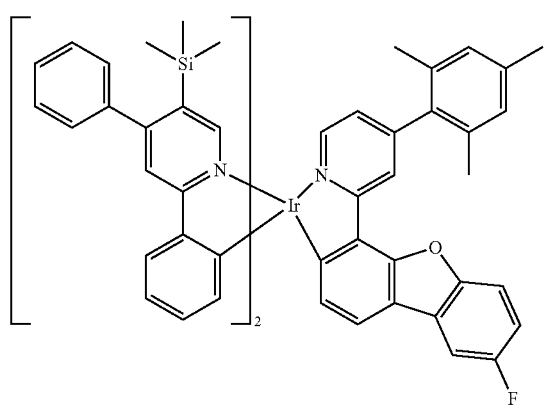

624
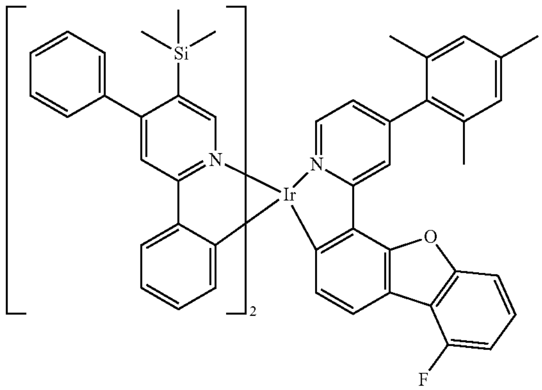
625
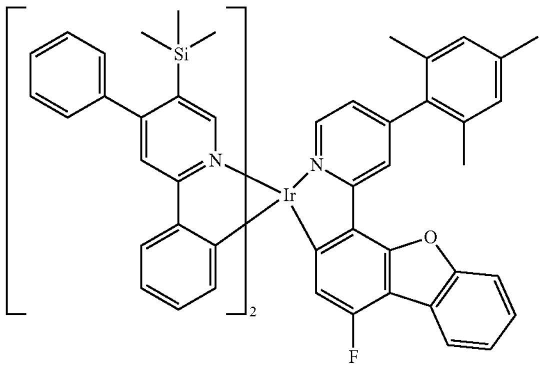
626
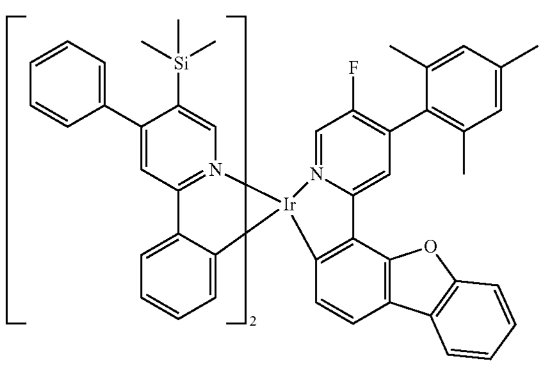
627
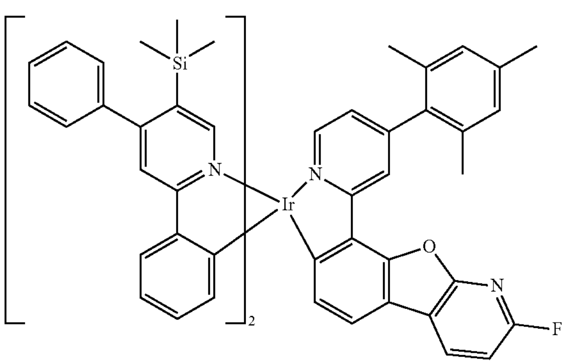
628
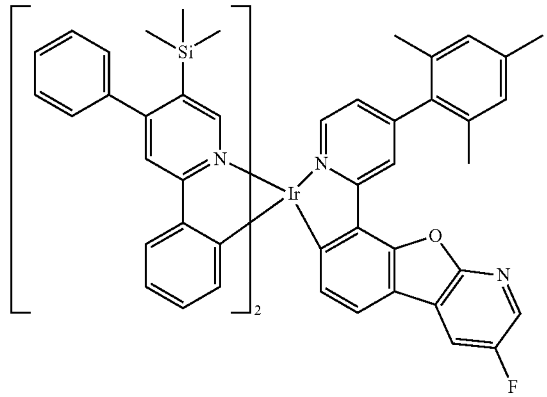
629
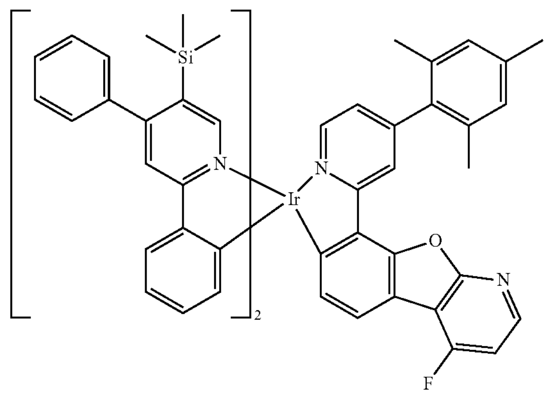
630
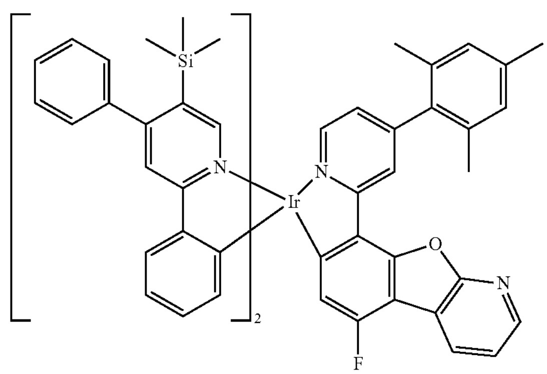
631
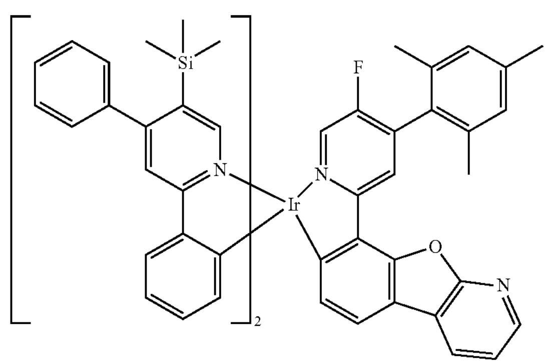

632
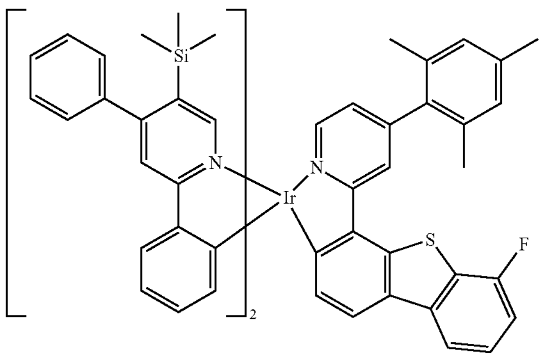
633
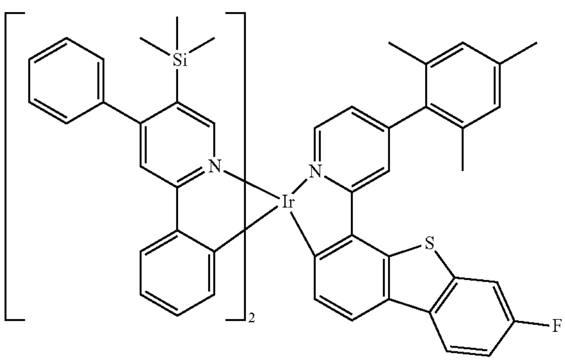
634
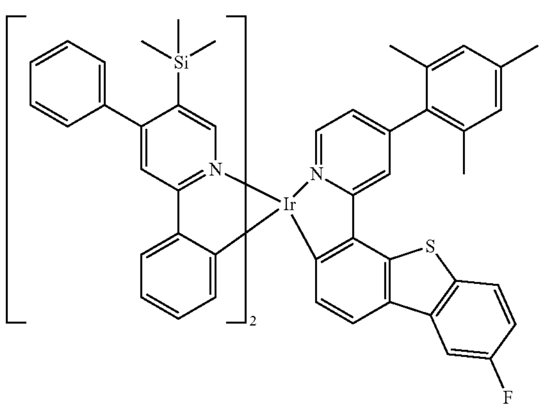
635
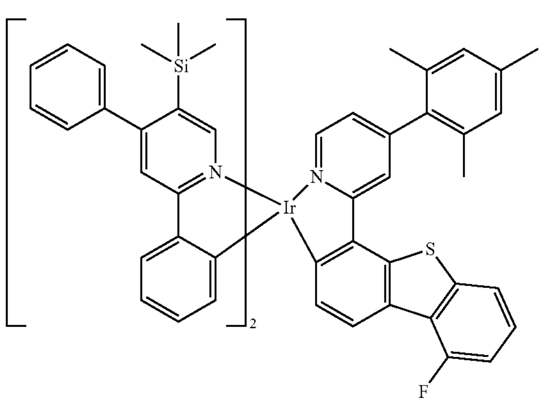
636
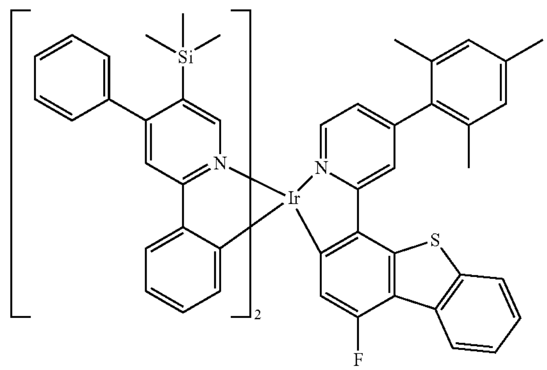
637
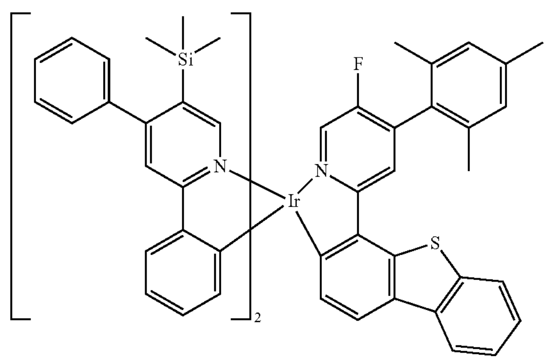
638
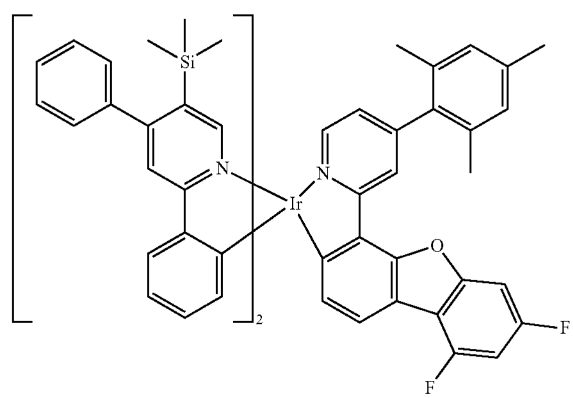
639
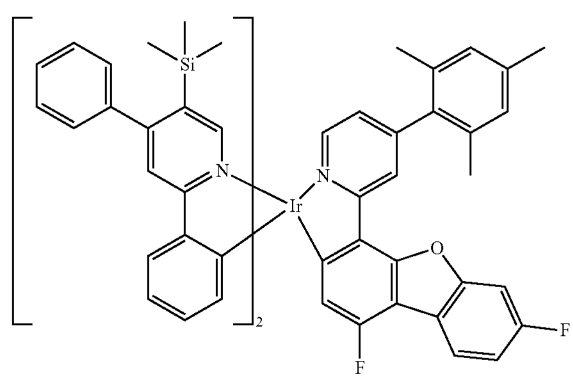

-continued
640
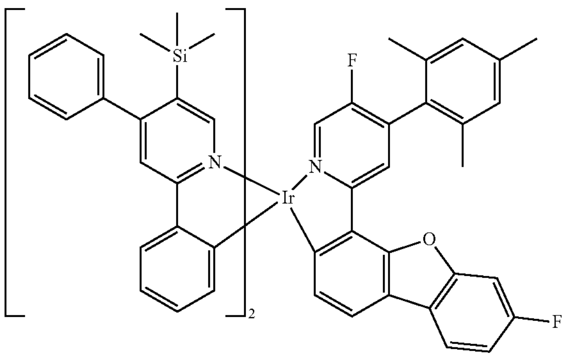
641
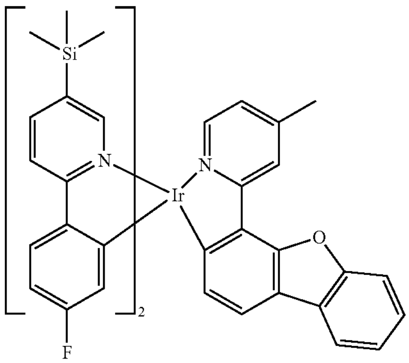
642
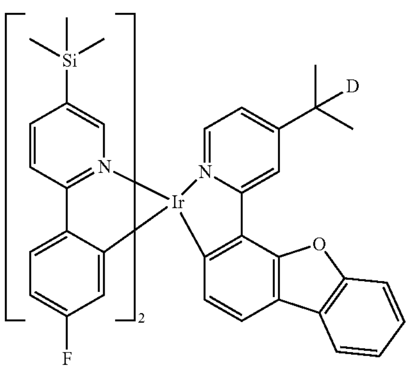
643
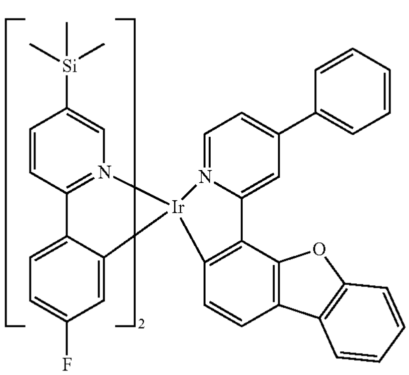
-continued
644
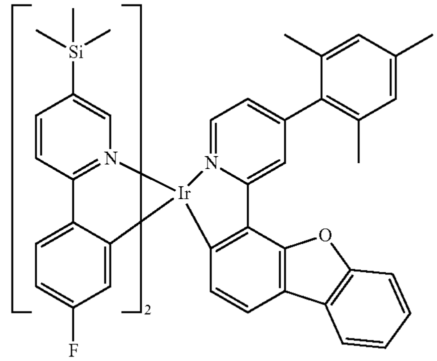
645
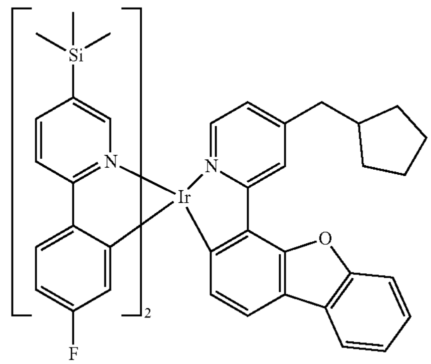
646
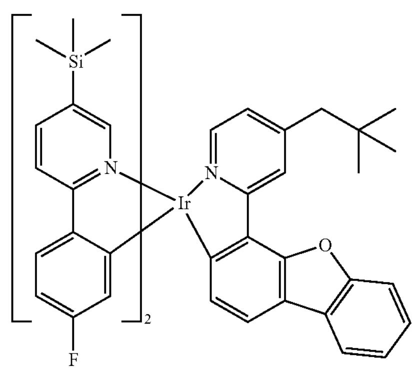
647
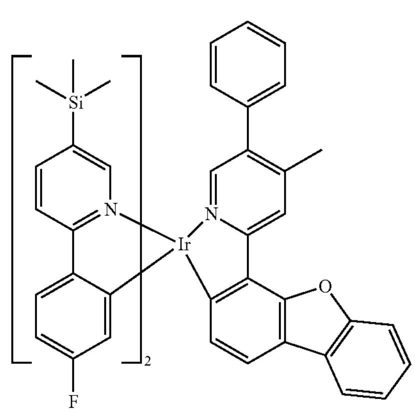

-continued
648
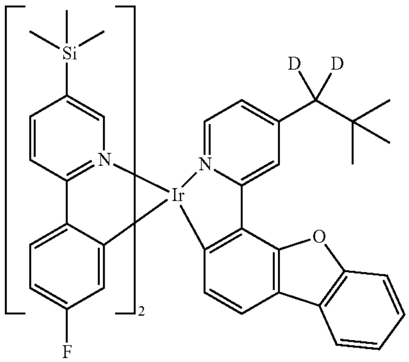
649
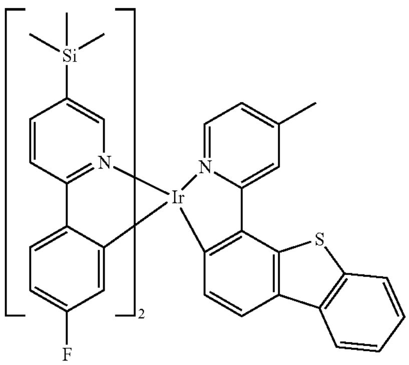
650
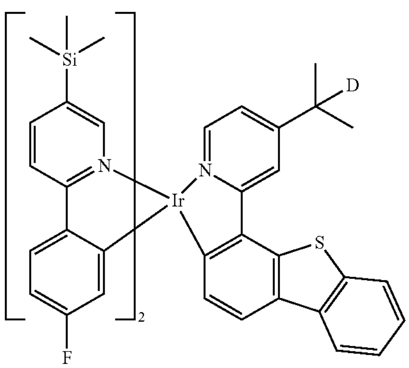
651
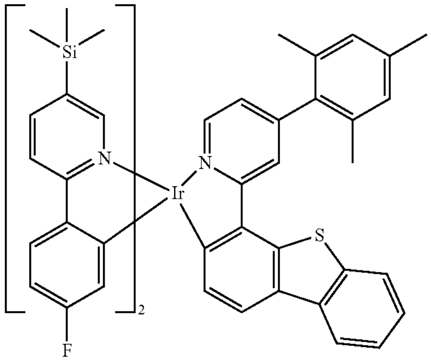
-continued
652
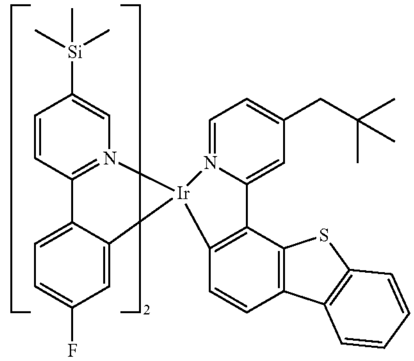
653
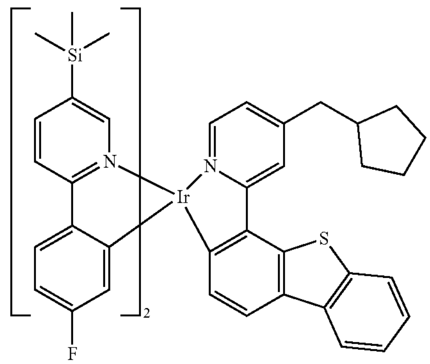
654
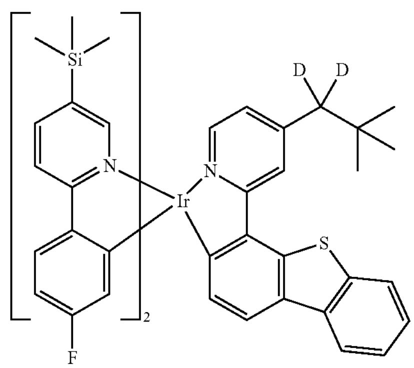
655
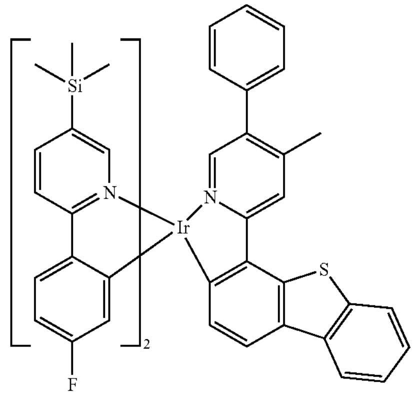

-continued
656
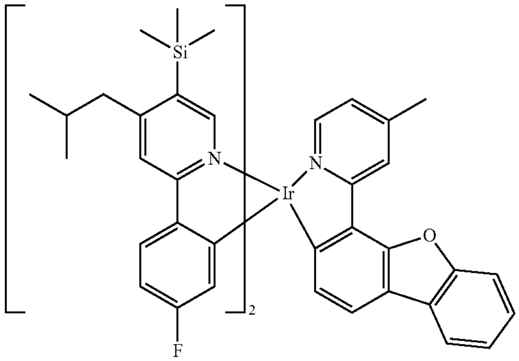
657
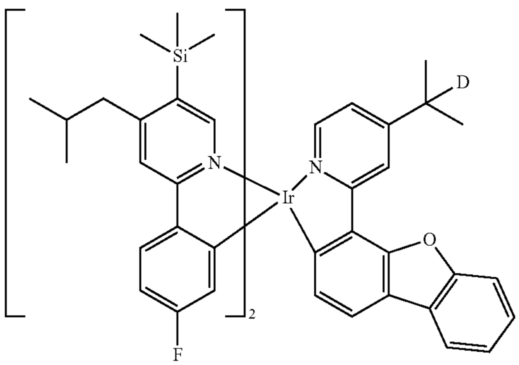
658
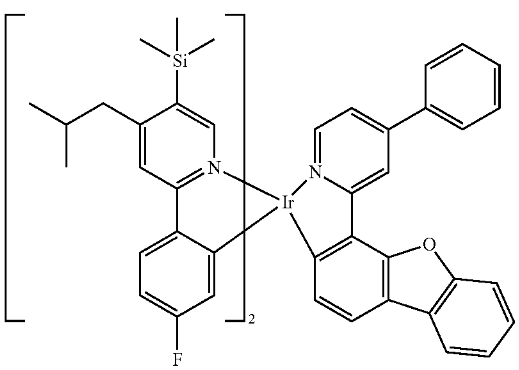
659
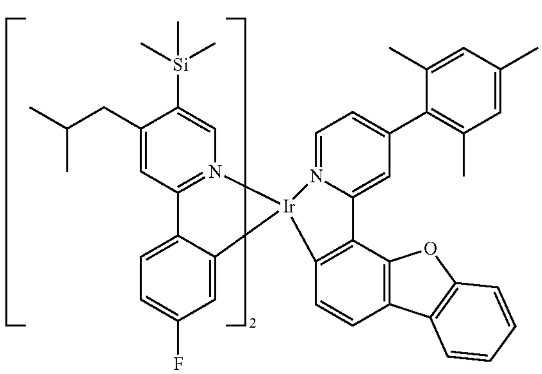
-continued
660
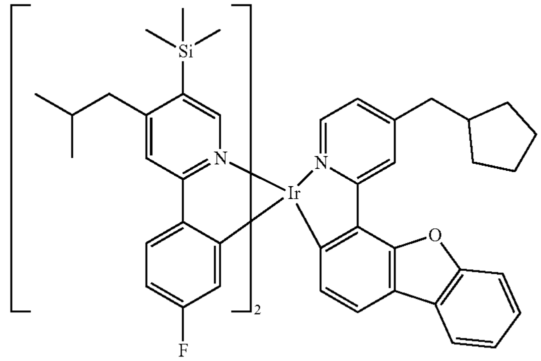
661
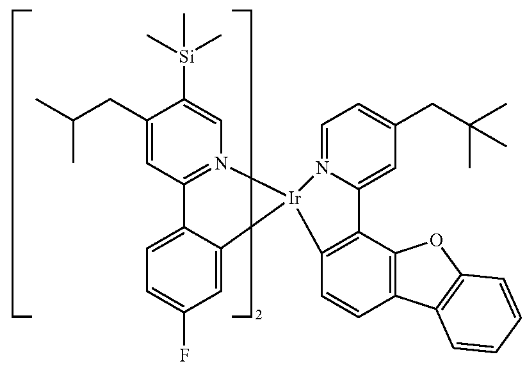
662
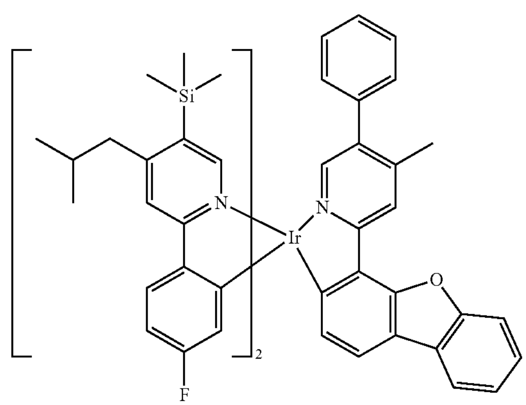
663
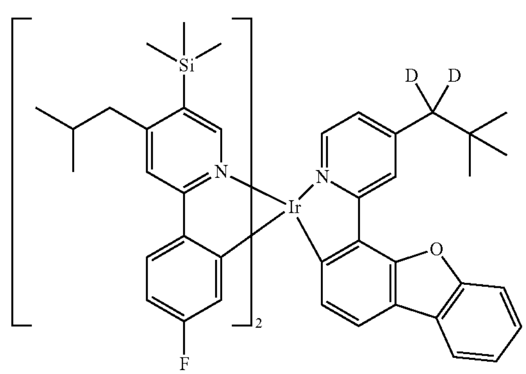

-continued
664
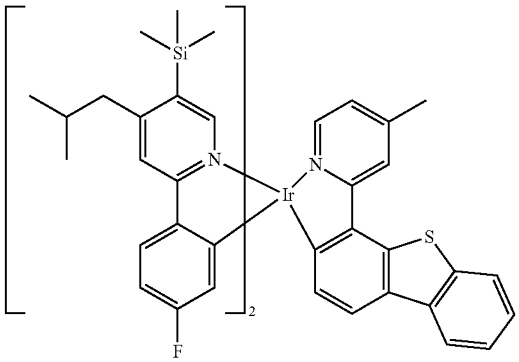
665
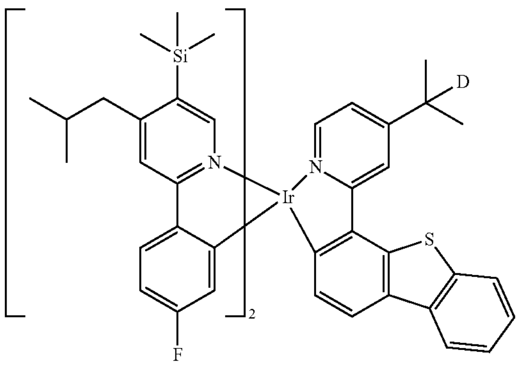
666
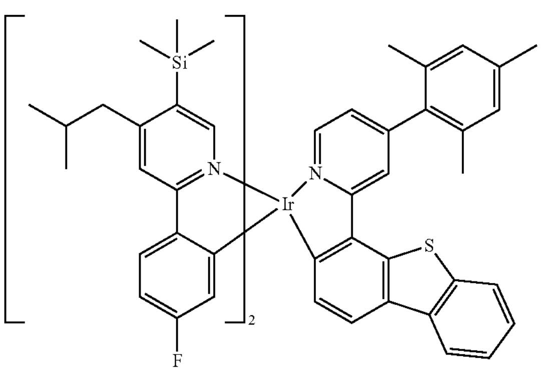
667
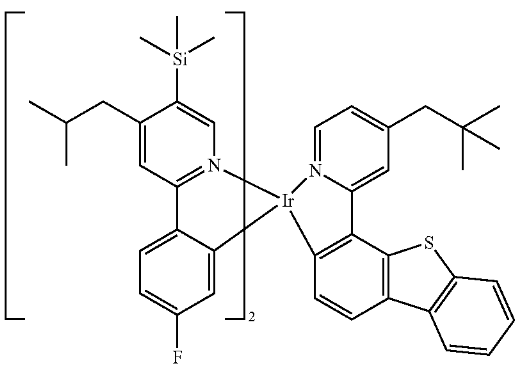
-continued
668
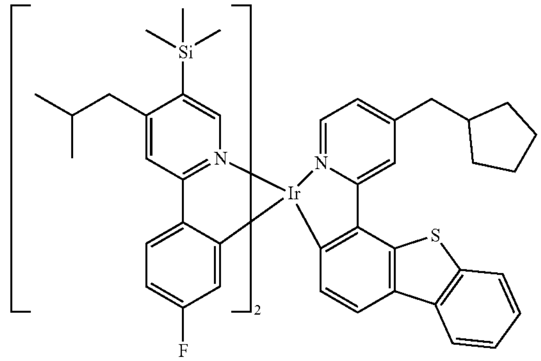
669
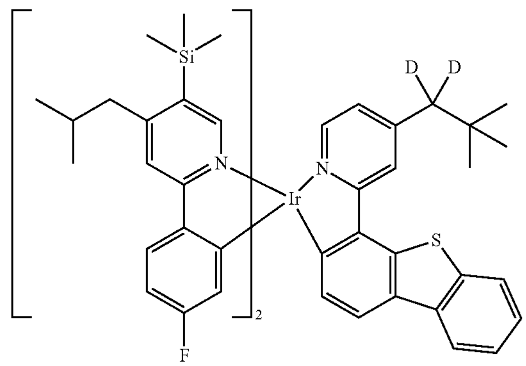
670
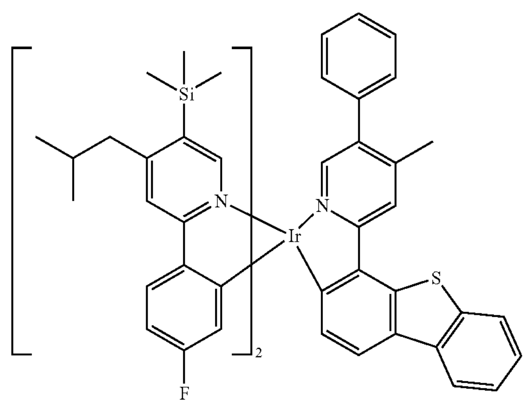
671
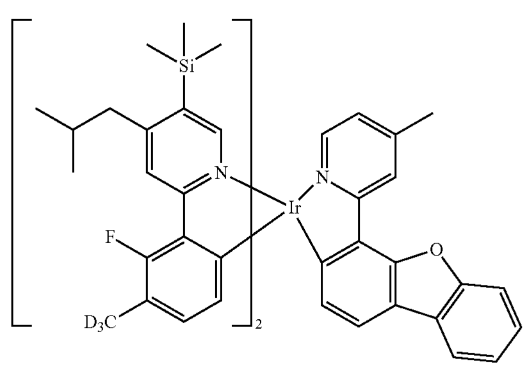

672
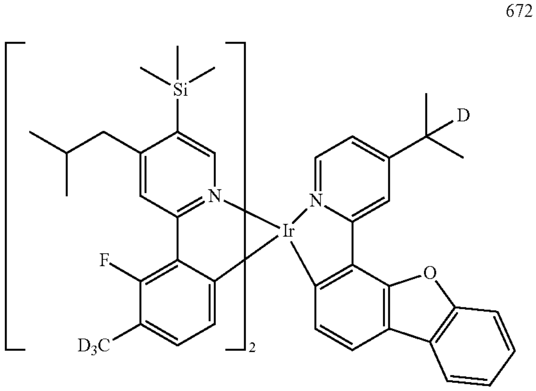
673
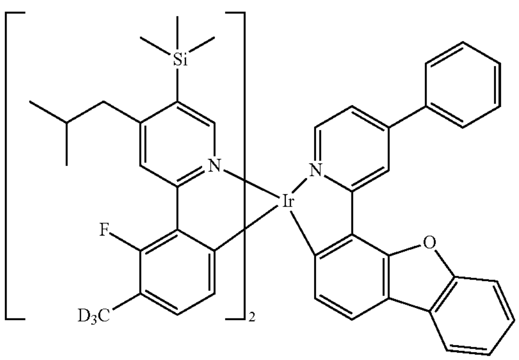
674
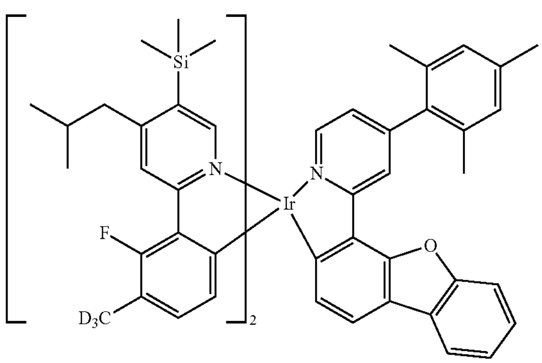
675
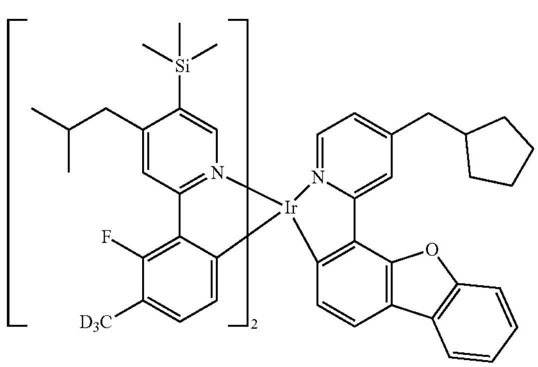
676
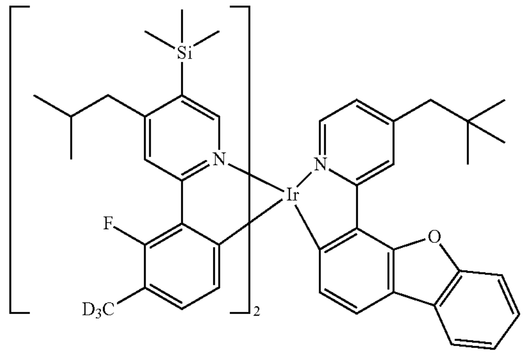
677
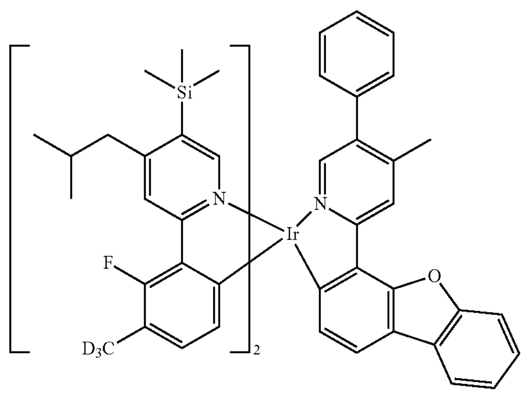
678
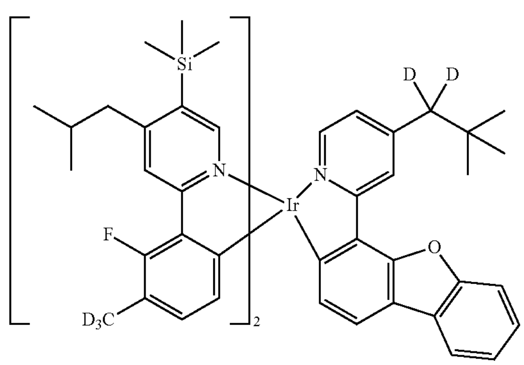
679
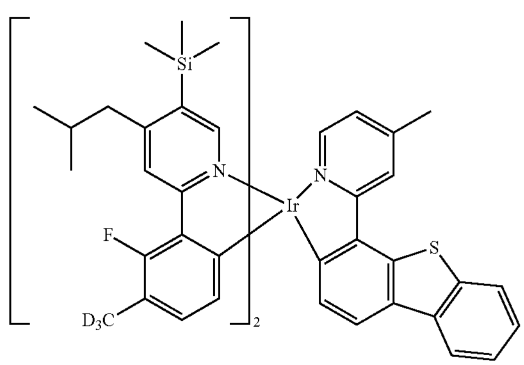

-continued
680
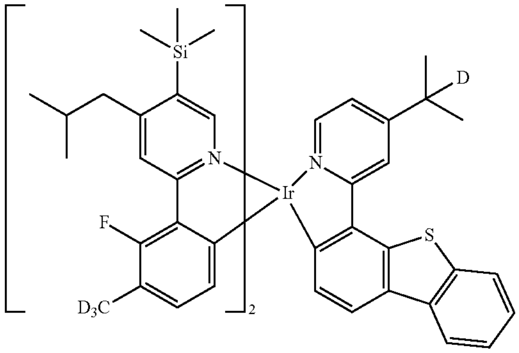
681
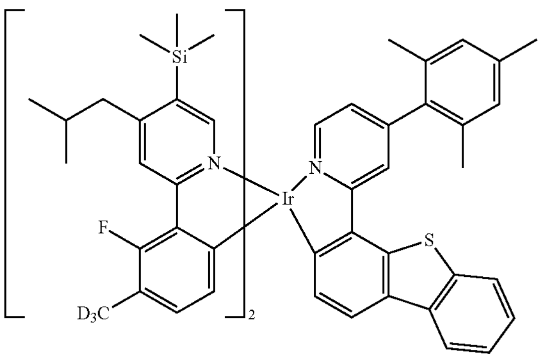
682
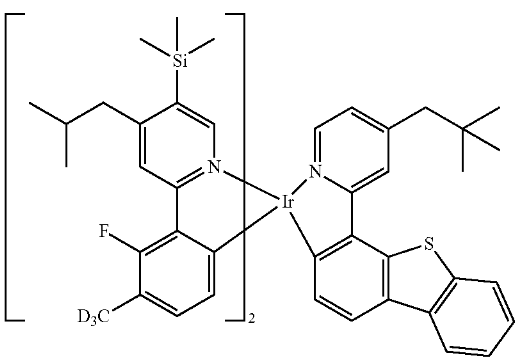
683
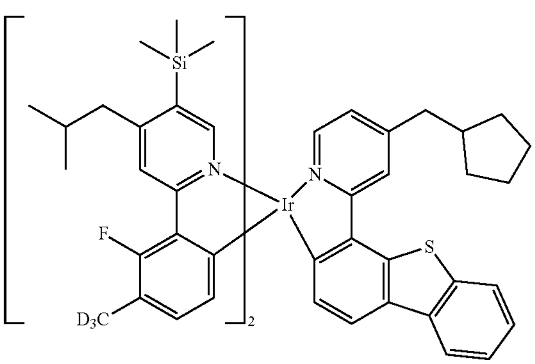
684
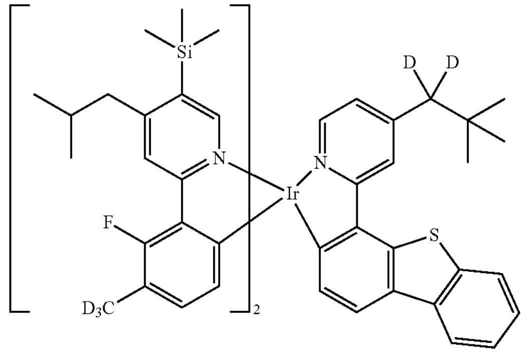
685
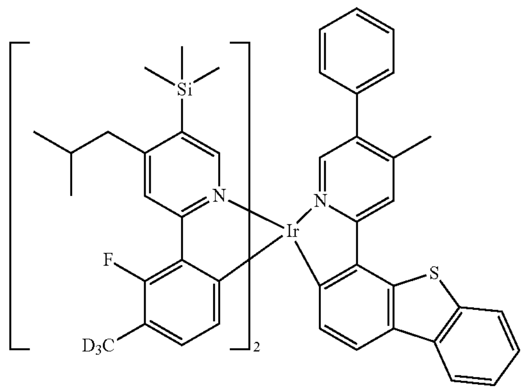
686
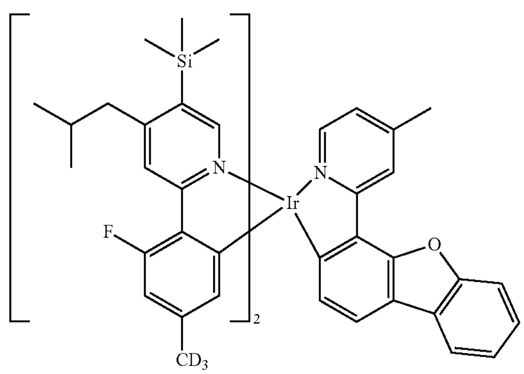
687
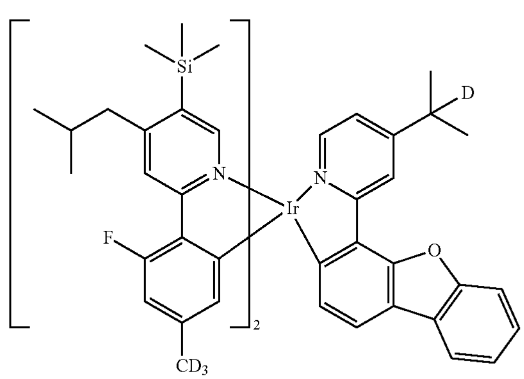

-continued
688
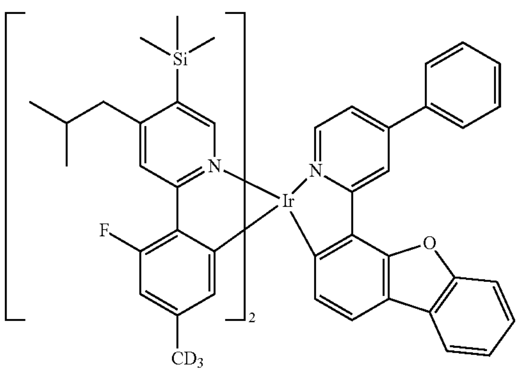
689
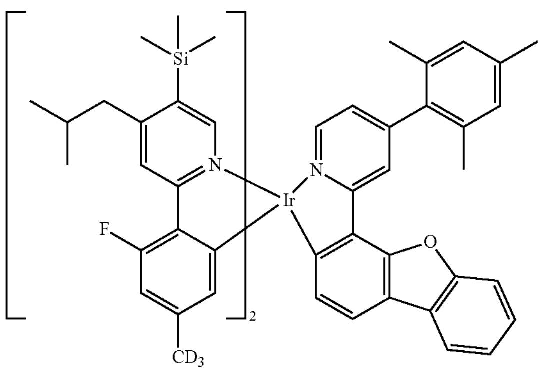
690
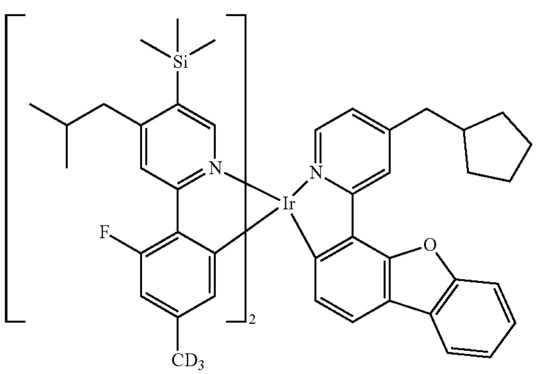
691
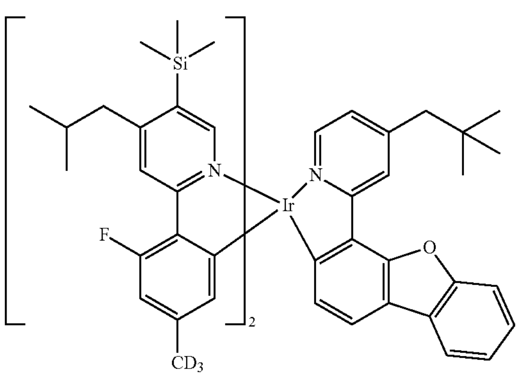
-continued
692
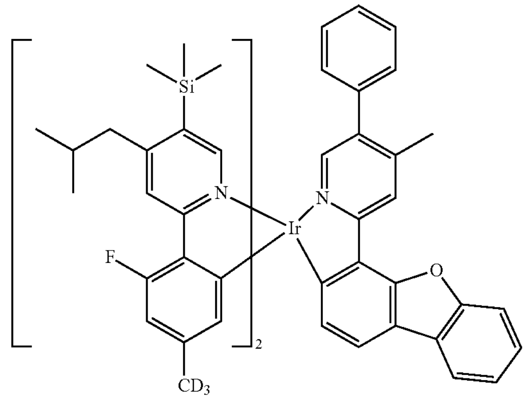
693
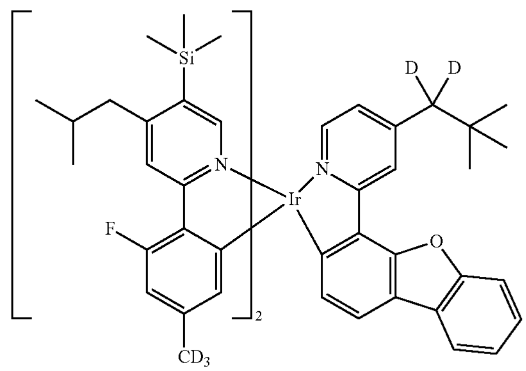
694
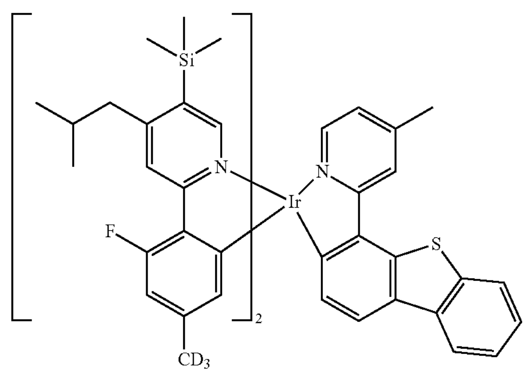
695
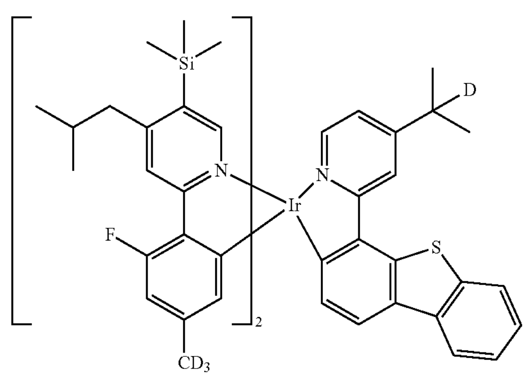

-continued
696
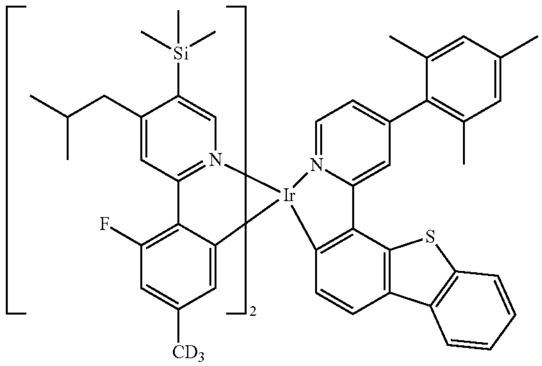
697
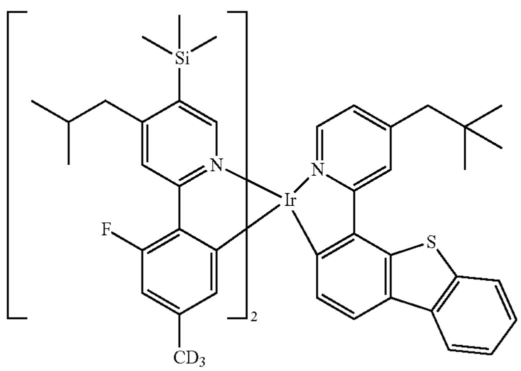
698
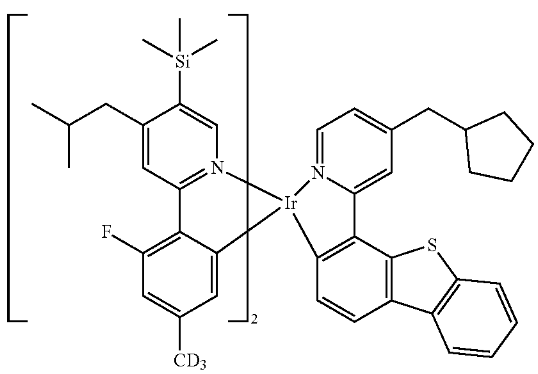
699
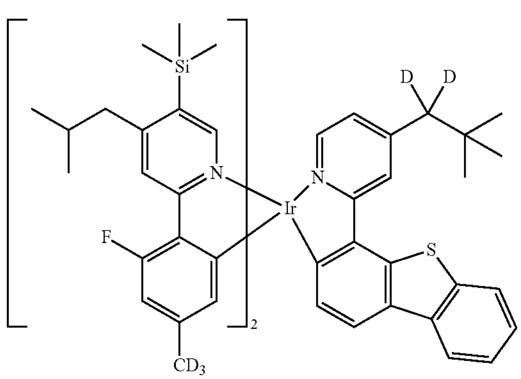
-continued
700
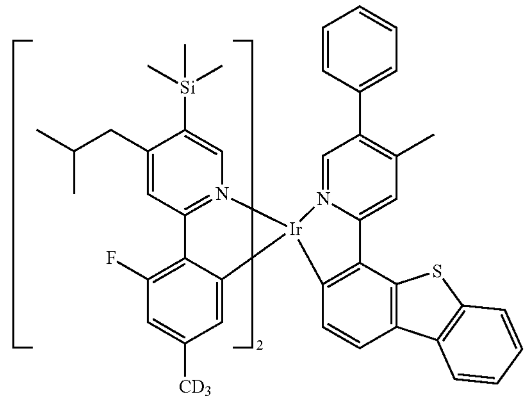
701
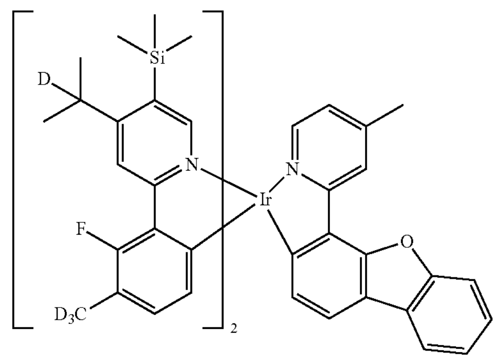
702
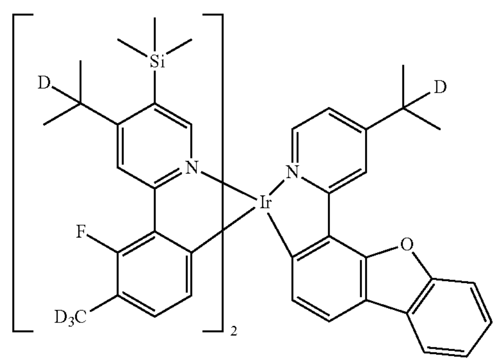
703
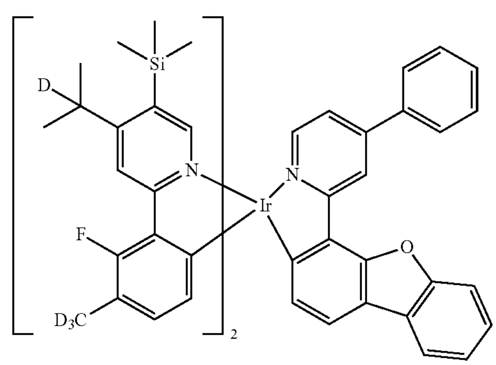

704
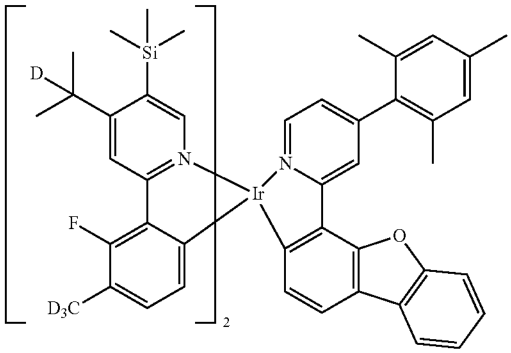
705
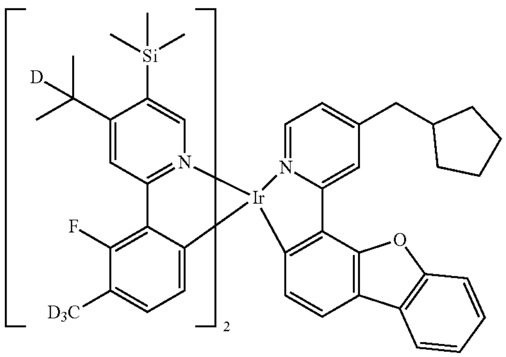
706
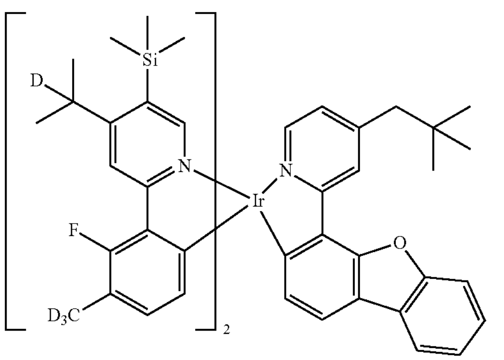
707
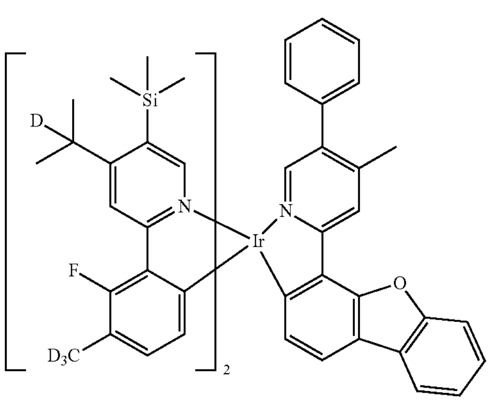
708
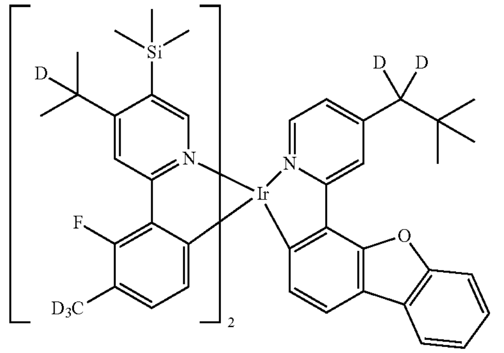
709
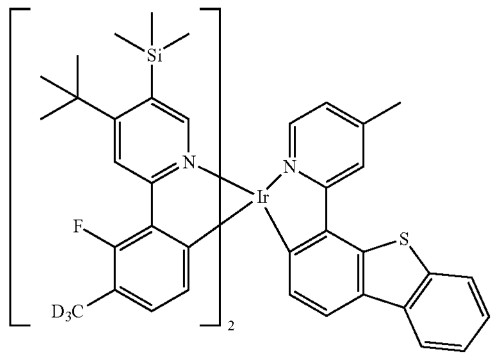
710
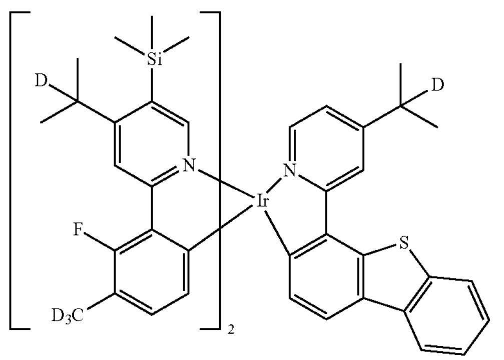
711
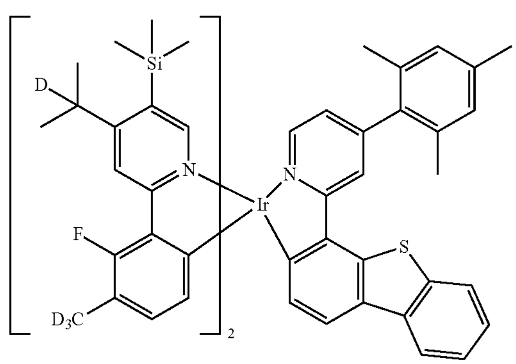

-continued
712
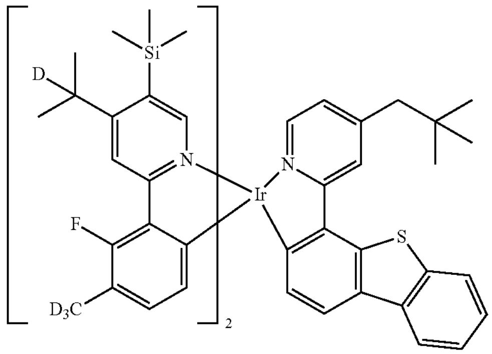
713
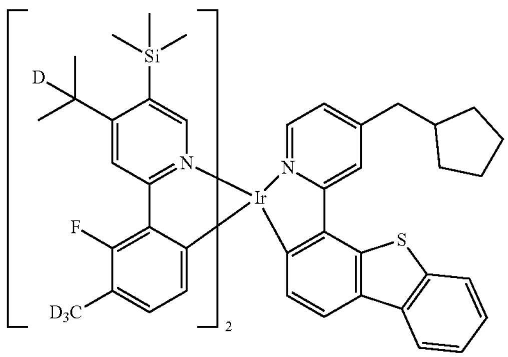
714
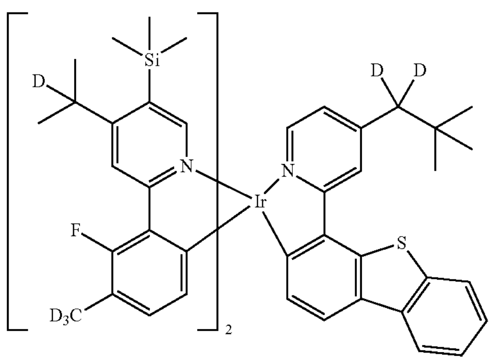
715
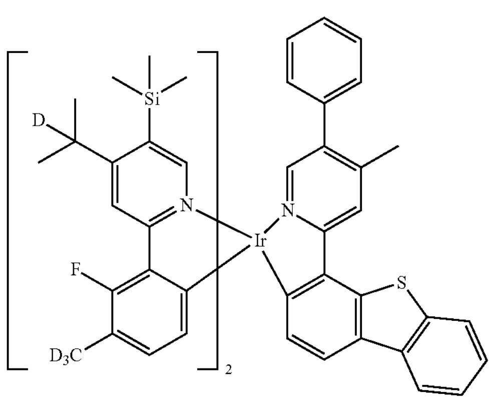
-continued
716
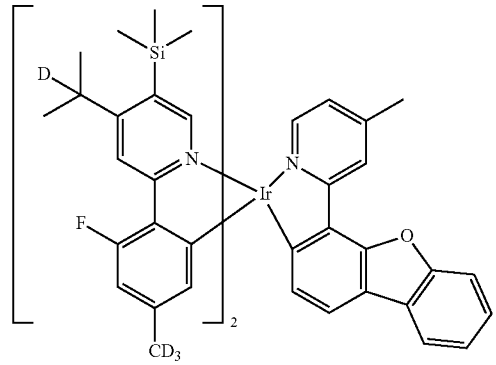
717
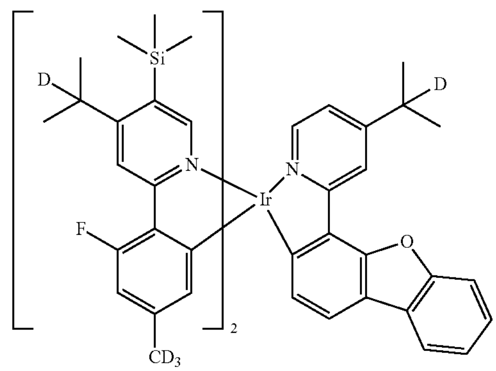
718
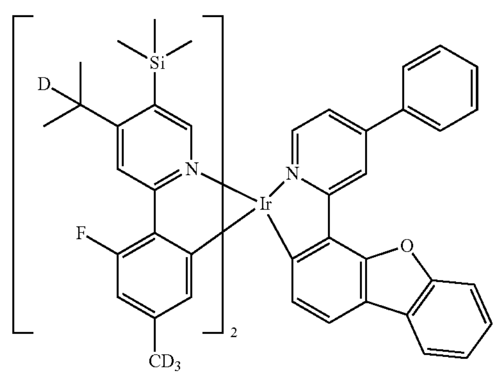
719
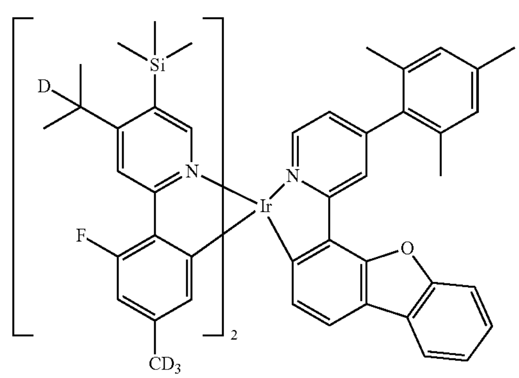

720
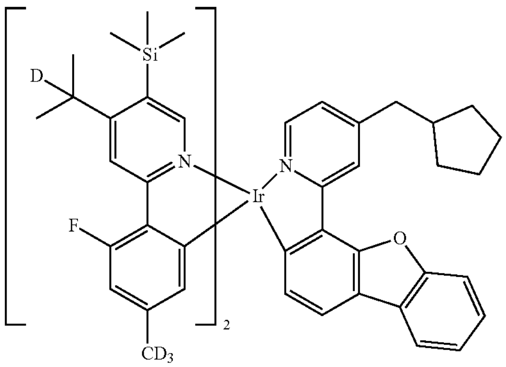
721
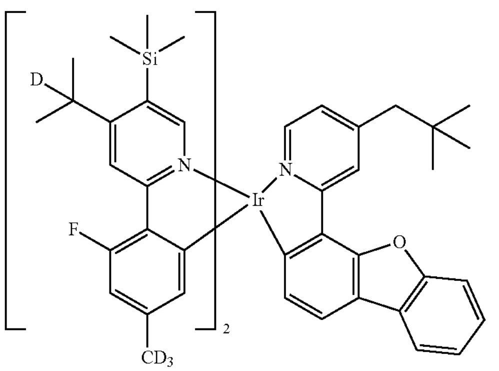
722
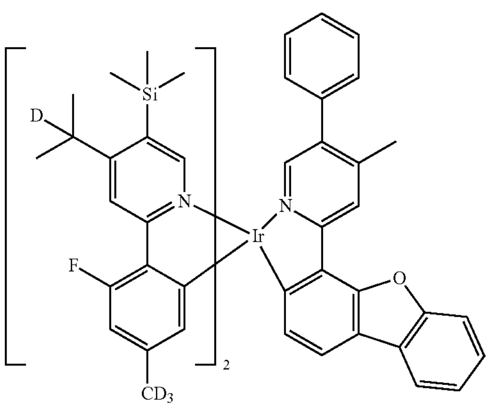
723
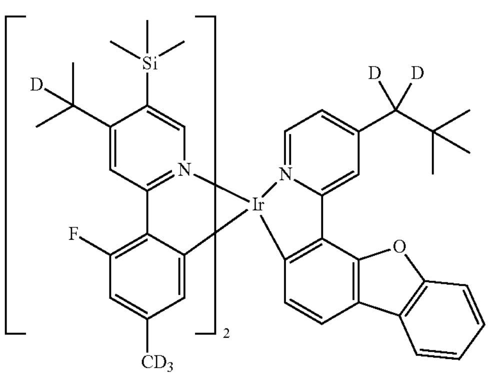
724
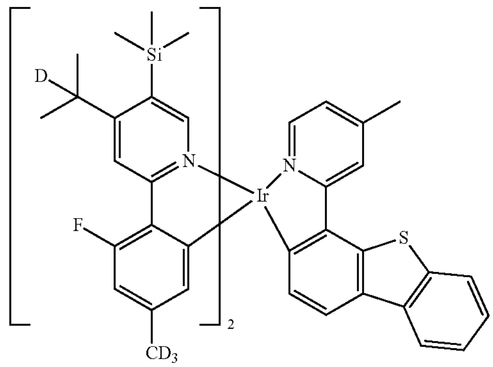
725
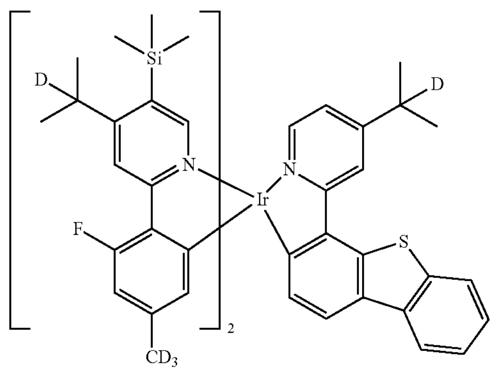
726
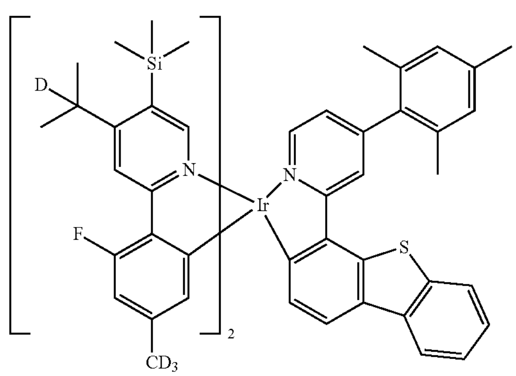
727
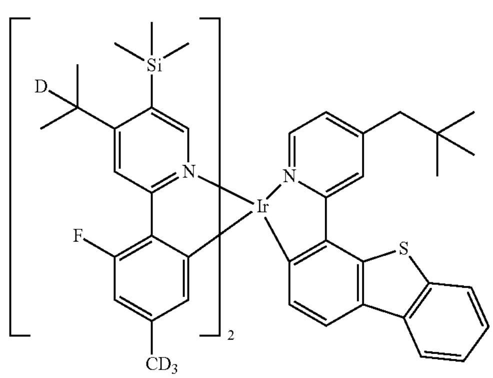

-continued
728
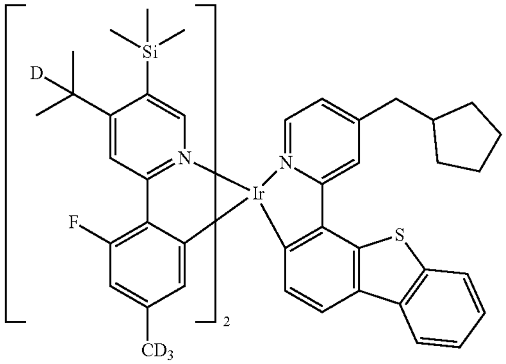
729
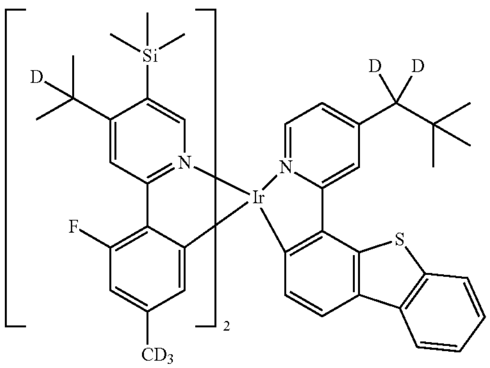
730
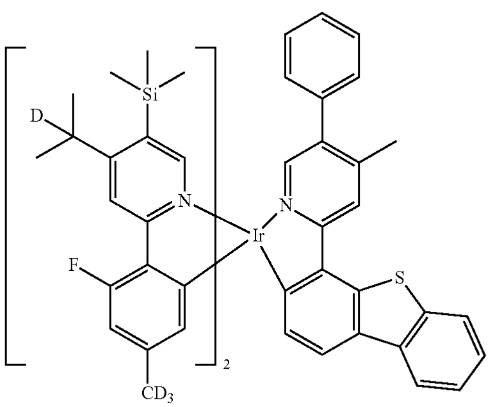
731
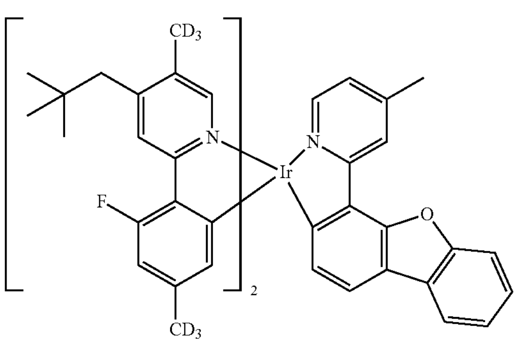
-continued
732
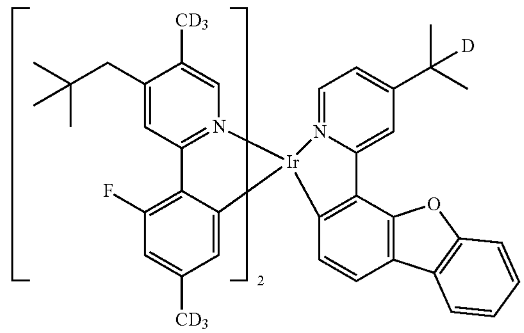
733
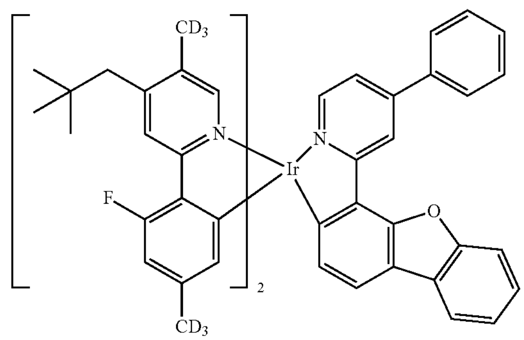
734
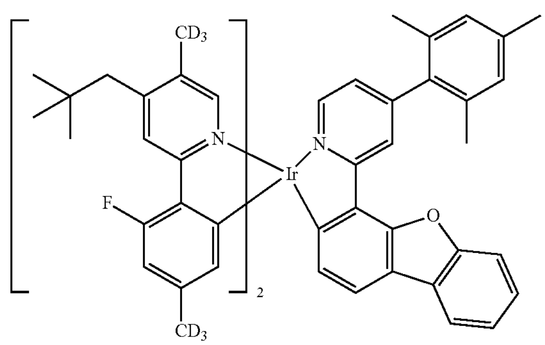
735
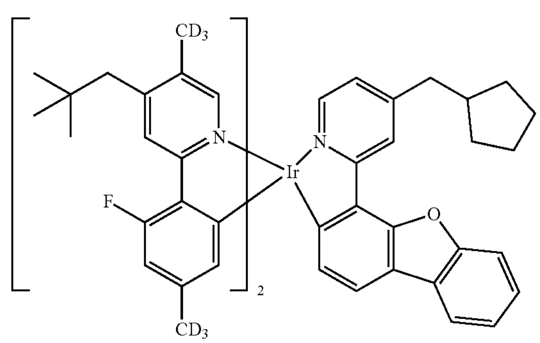

-continued
736
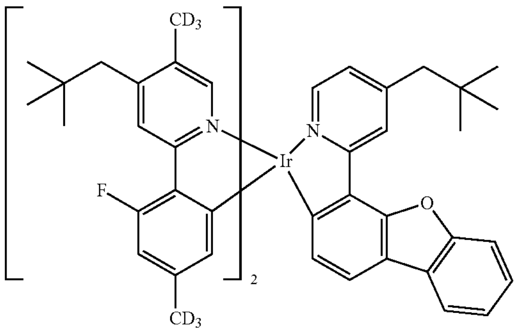
737
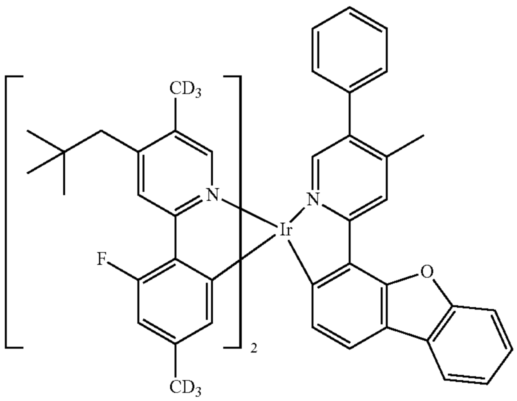
738
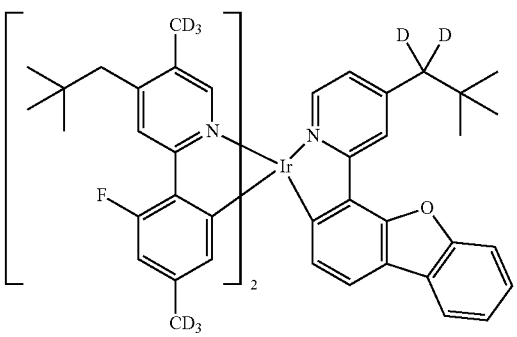
739
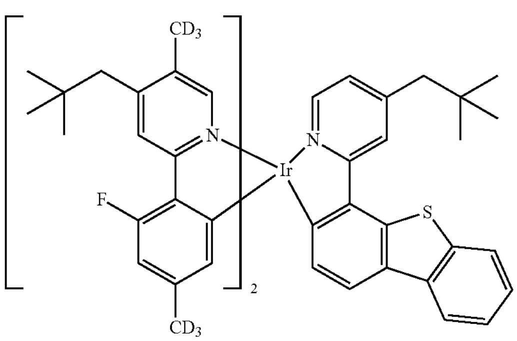
-continued
740
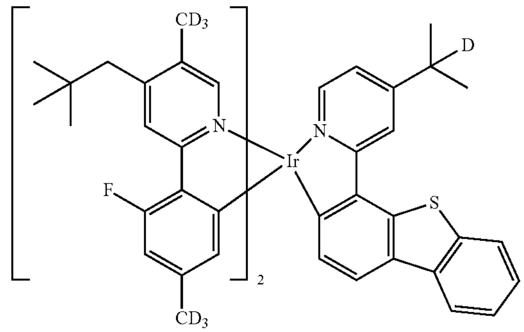
741
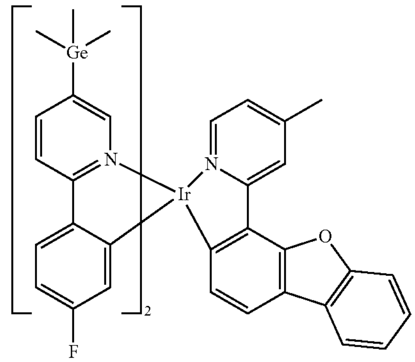
742
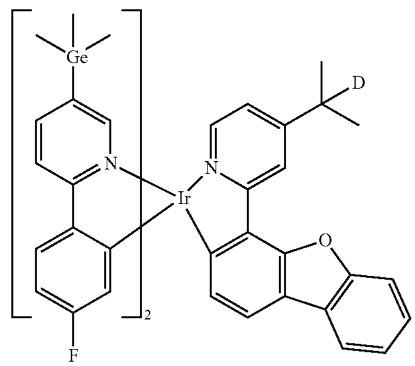
743
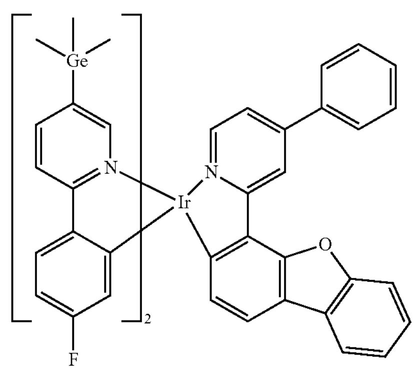

744
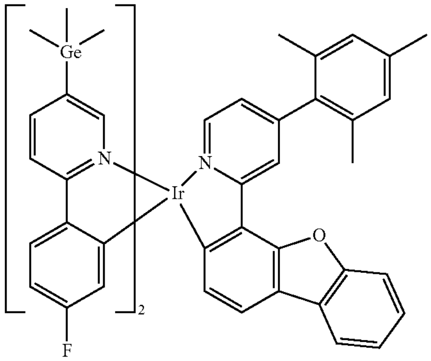
745
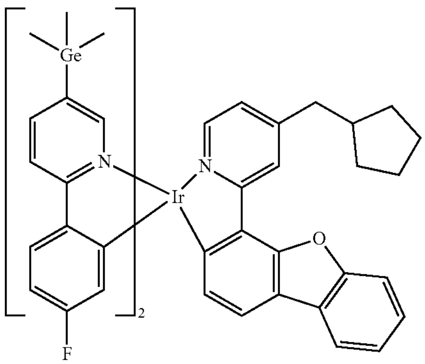
746
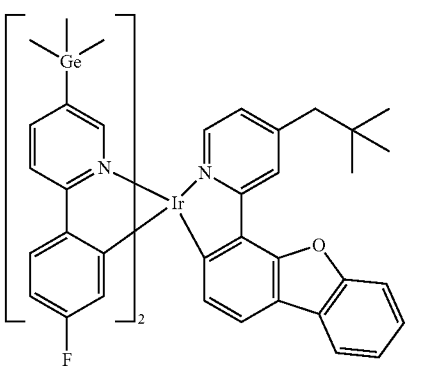
747
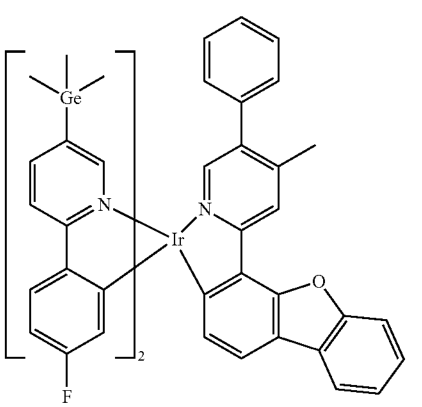
748
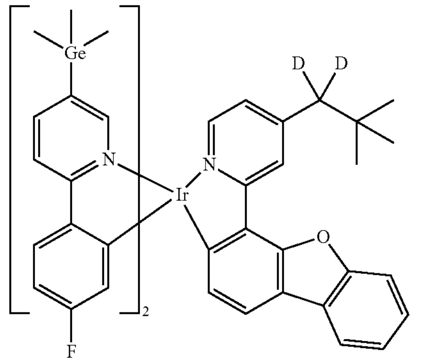
749
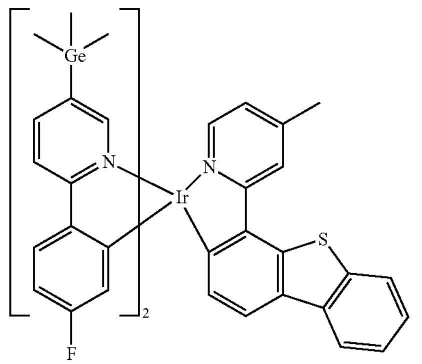
750
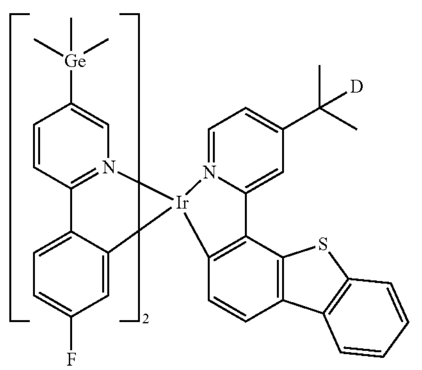
751
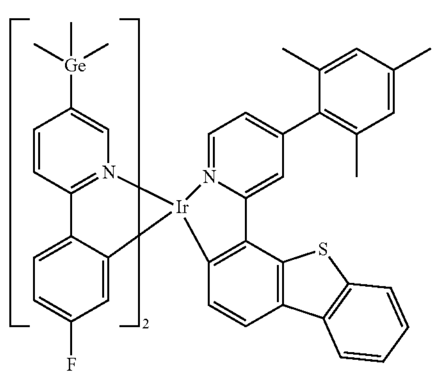

-continued
752
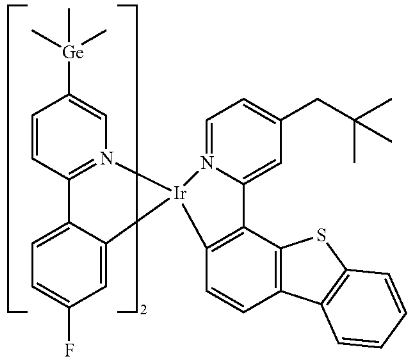
753
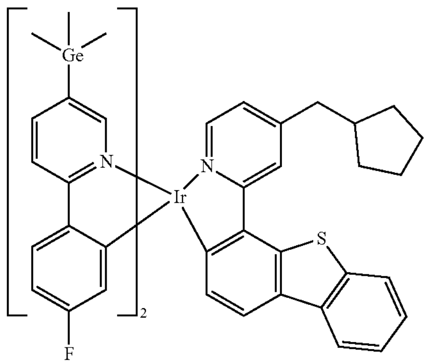
754
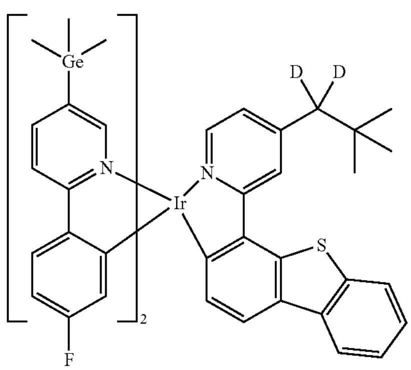
755
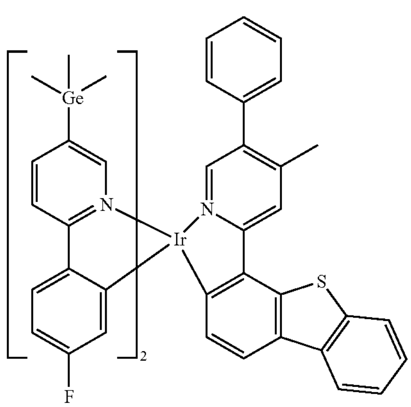
-continued
756
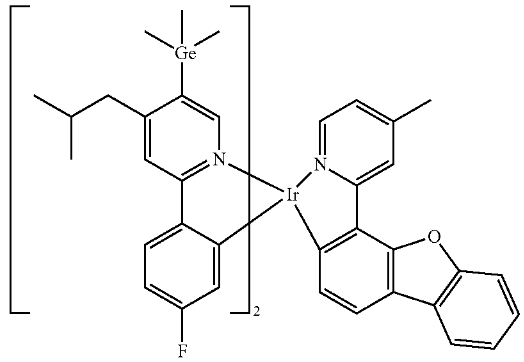
757
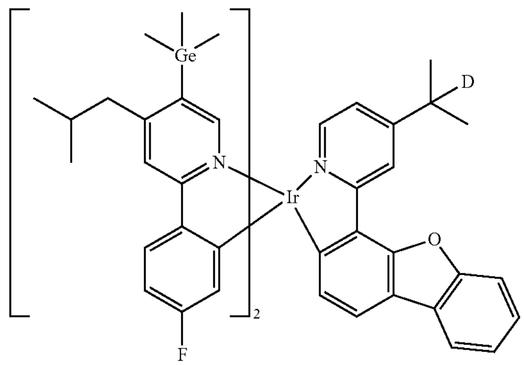
758
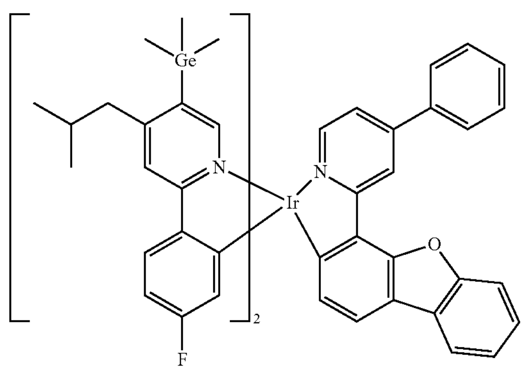
759
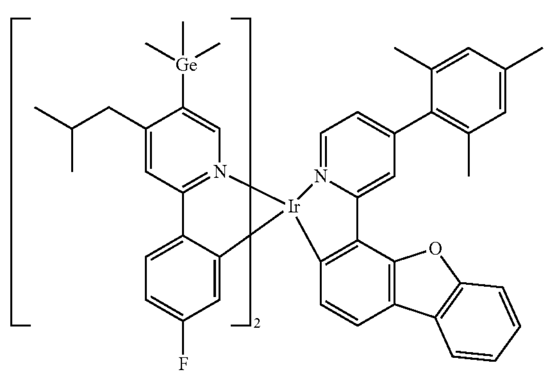

-continued
760
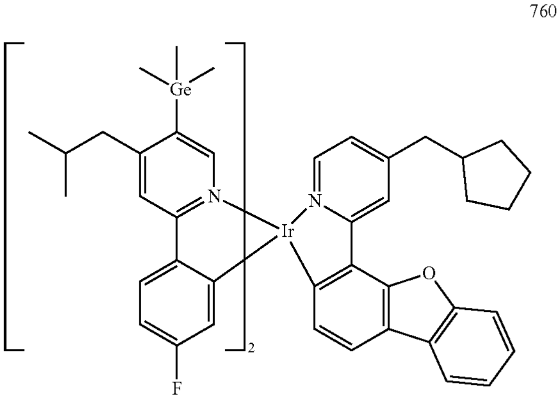
761
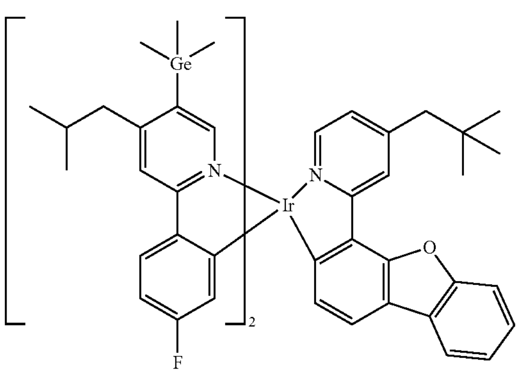
762
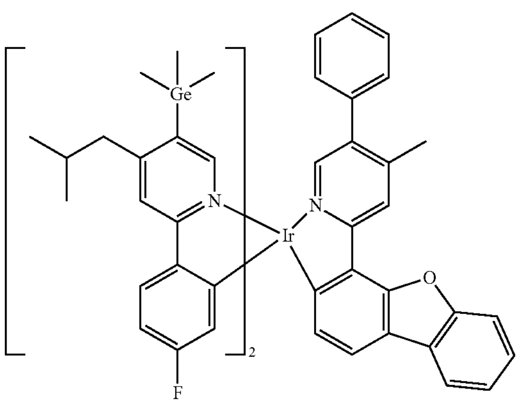
763
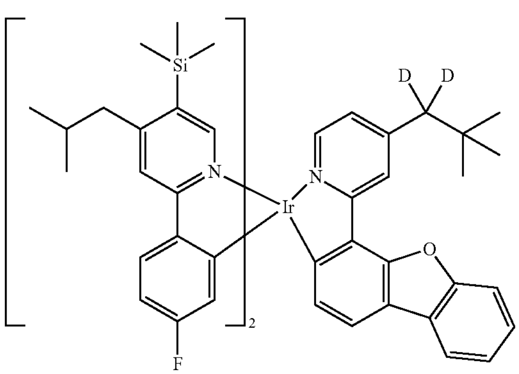
-continued
764
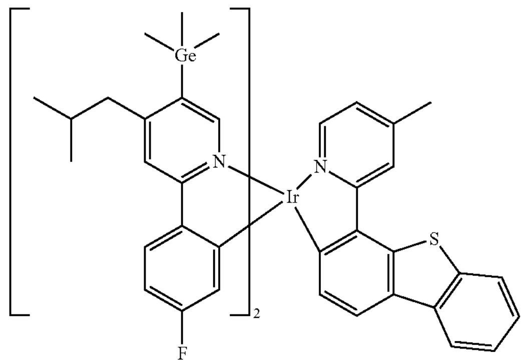
765
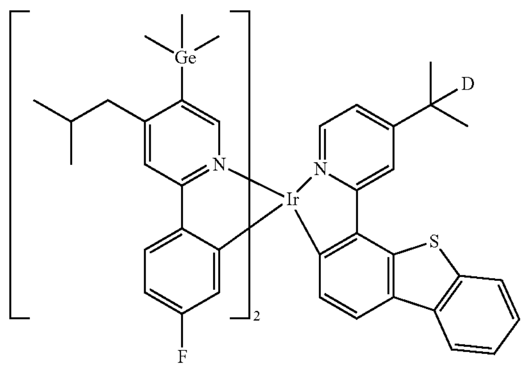
766
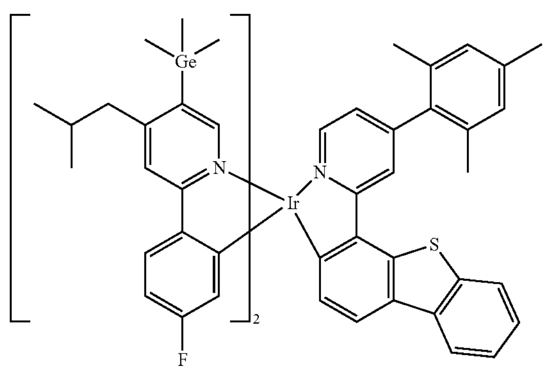
767
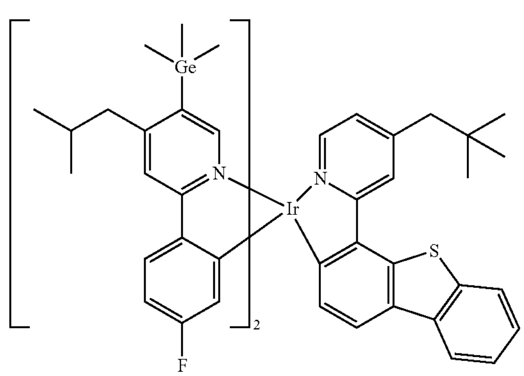

314
-continued
768
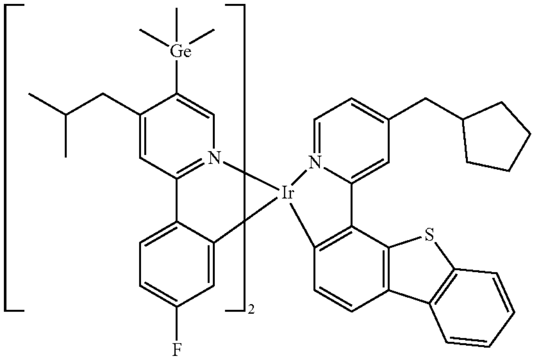
769
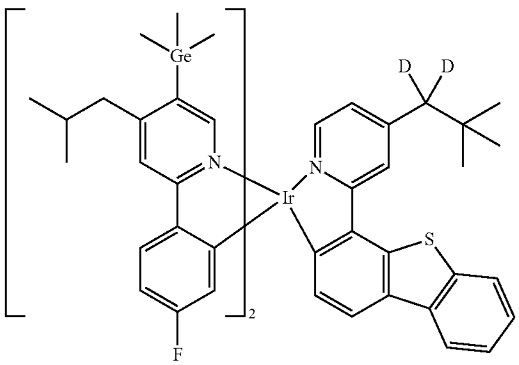
770
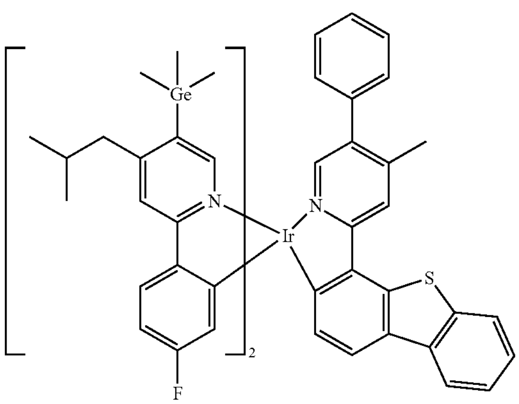
771
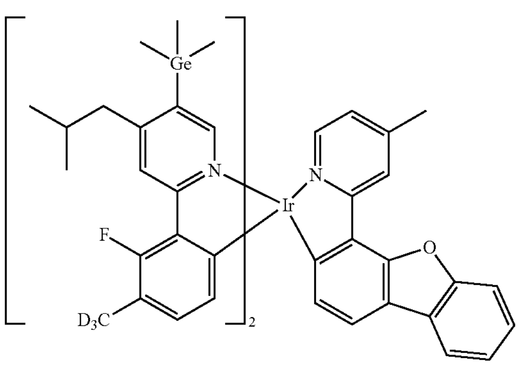
772
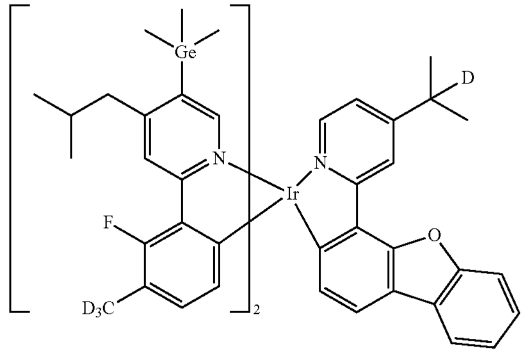
773
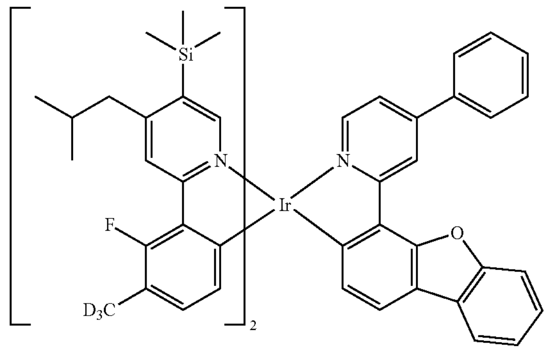
774
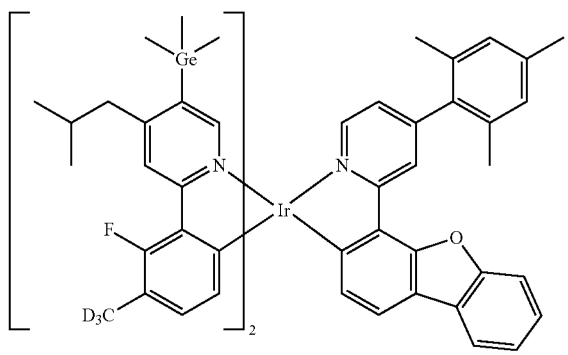
775
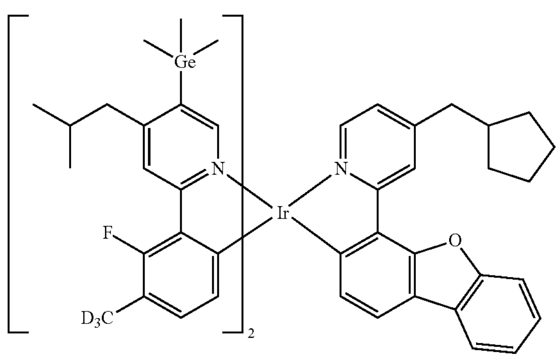

-continued
776
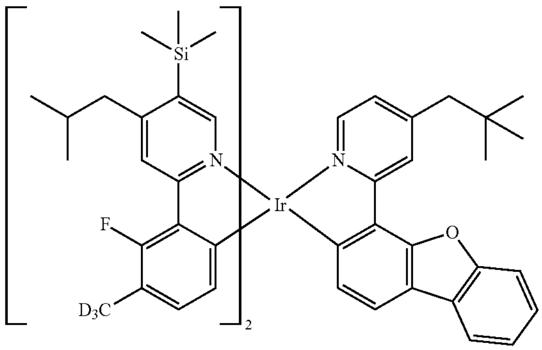
777
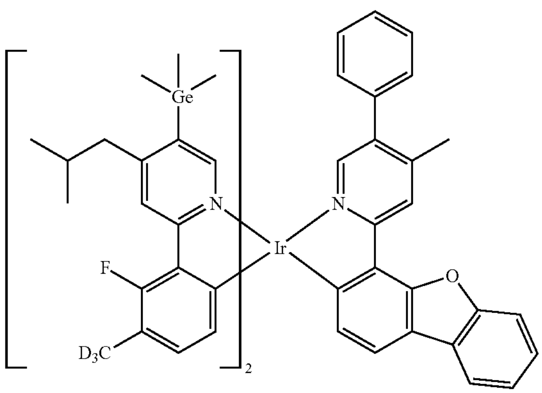
778
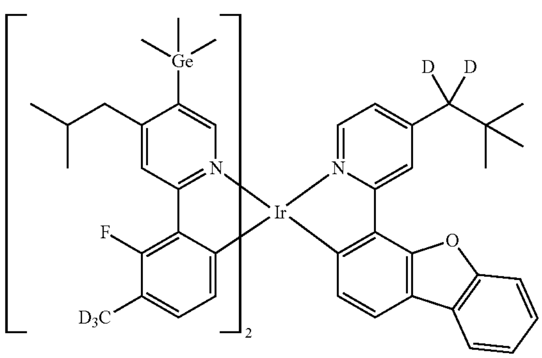
779
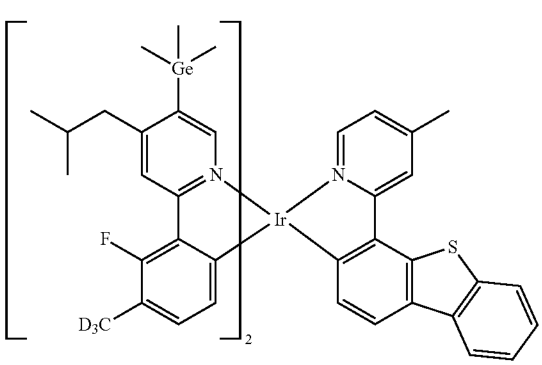
-continued
780
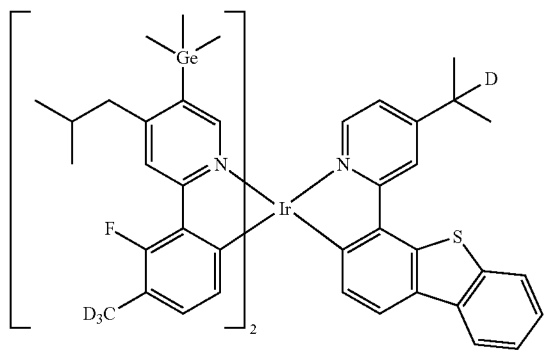
781
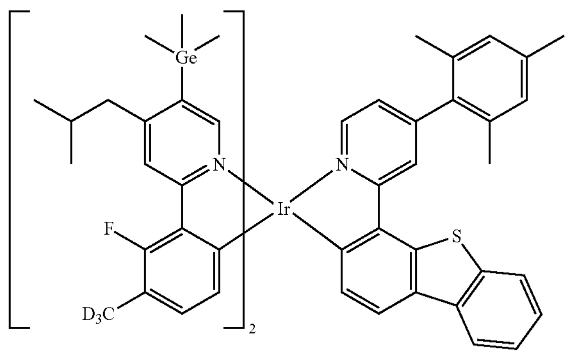
782
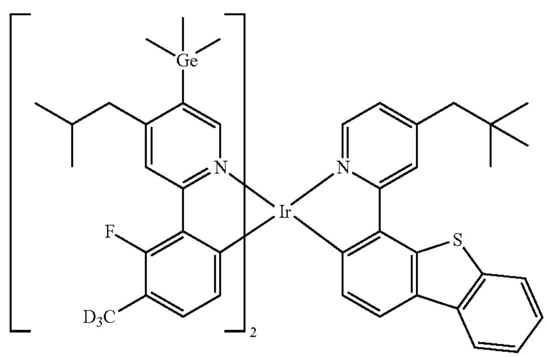
783
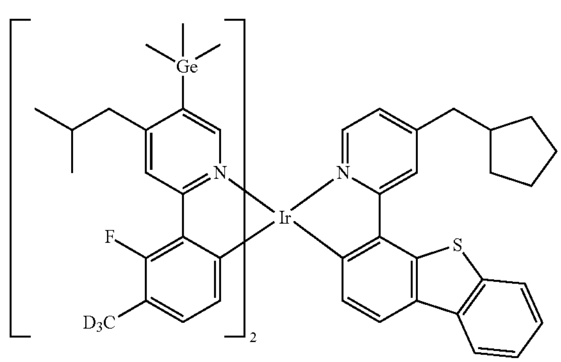

-continued
784
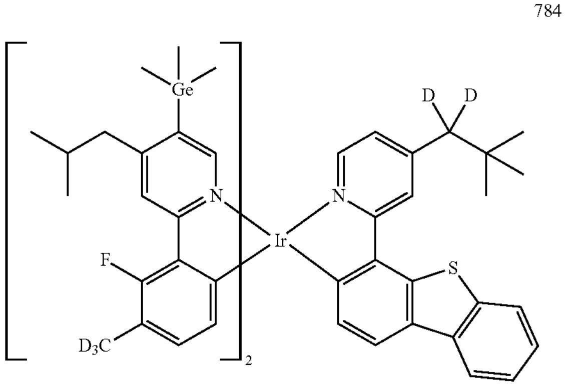
785
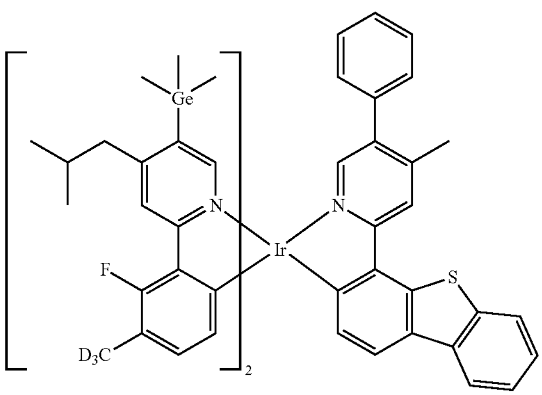
786
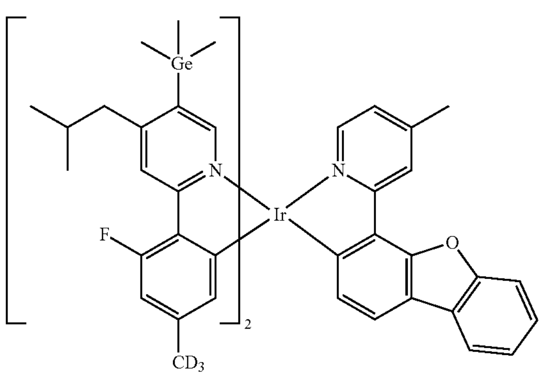
787
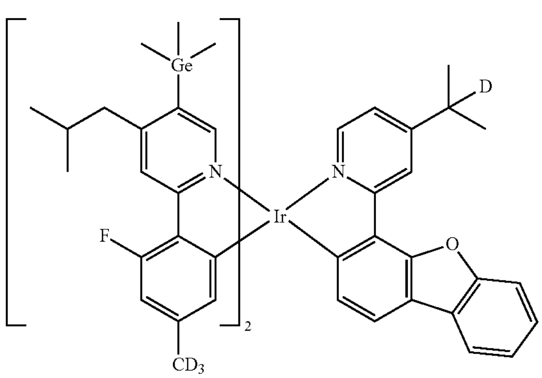
-continued
788
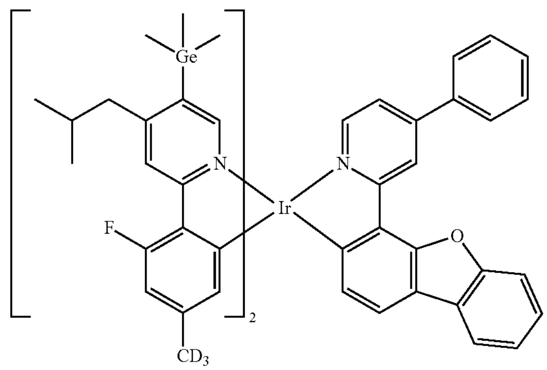
789
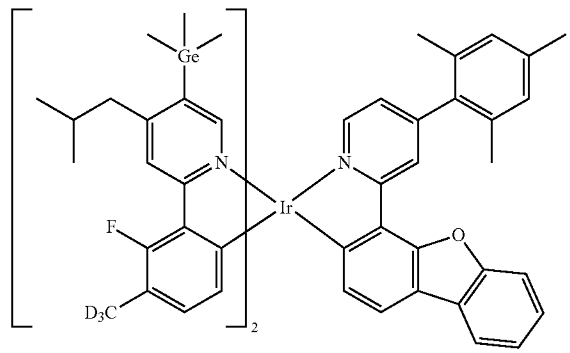
790
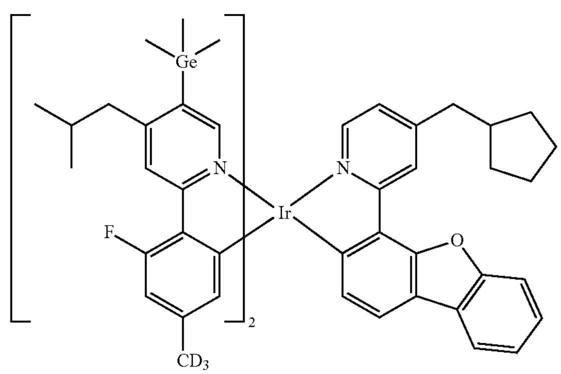
791
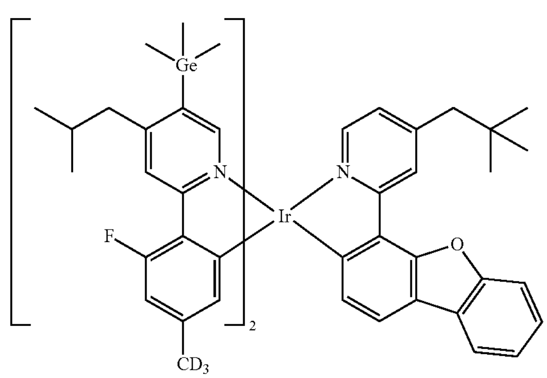

-continued
792
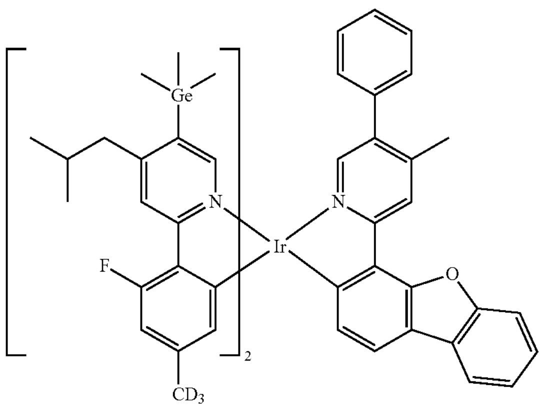
793
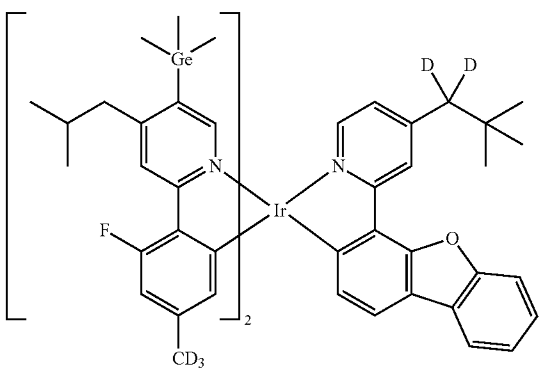
794
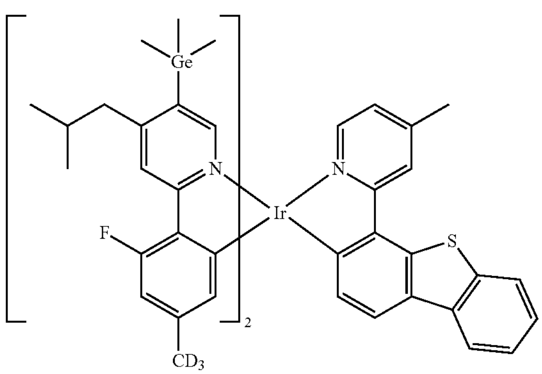
795
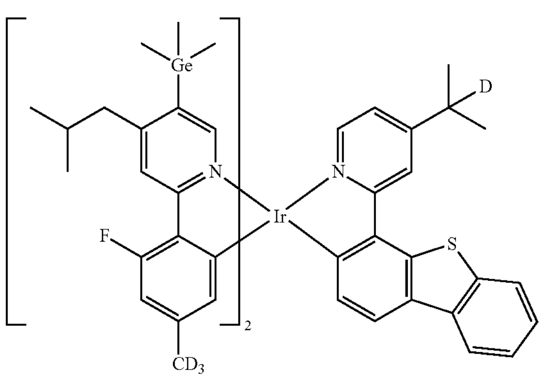
-continued
796
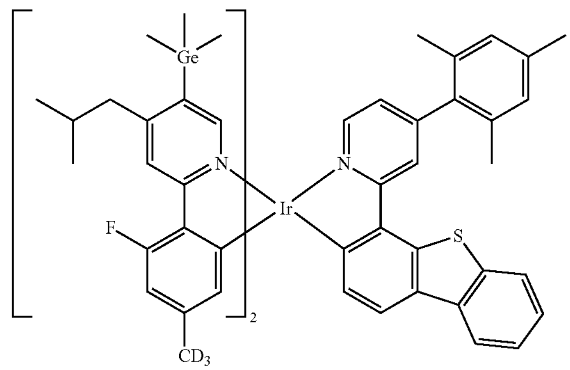
797
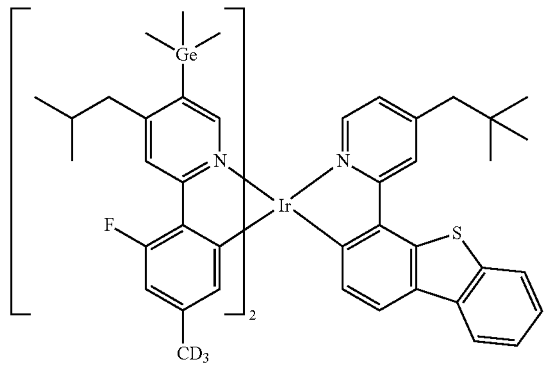
798
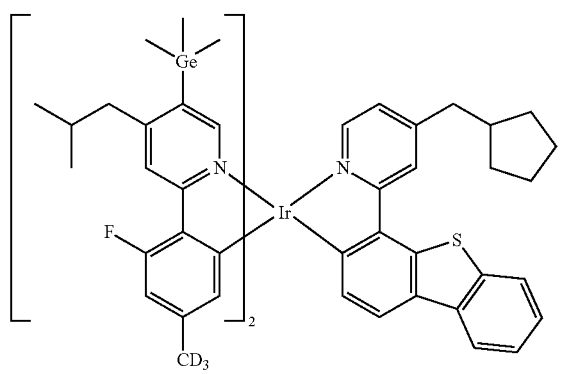
799
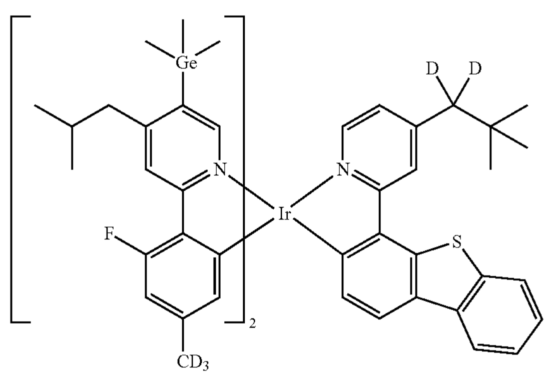

800
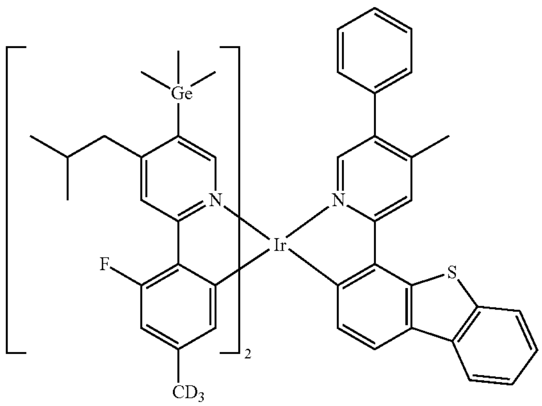
801
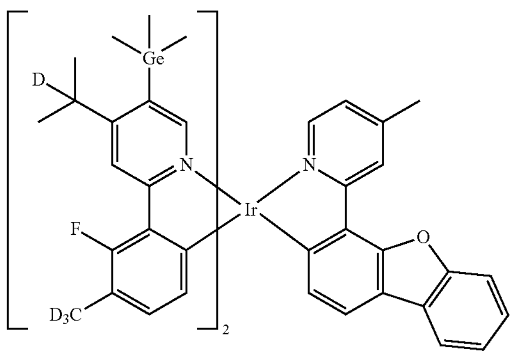
802
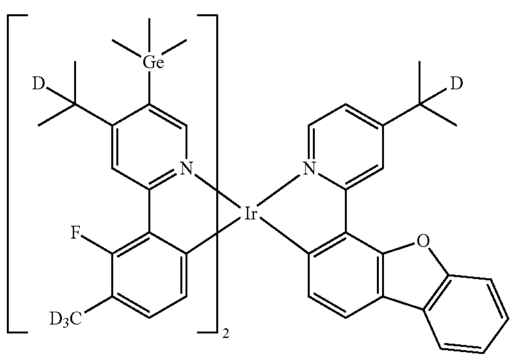
803
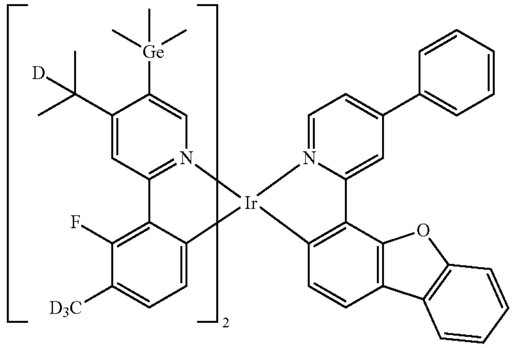
804
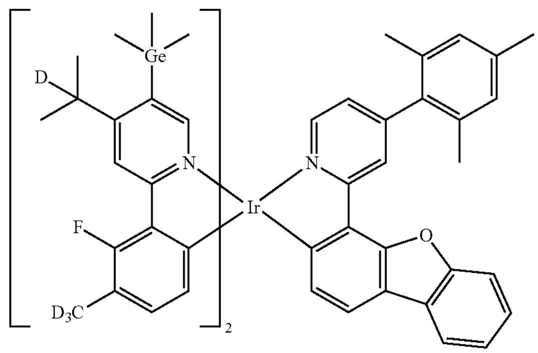
805
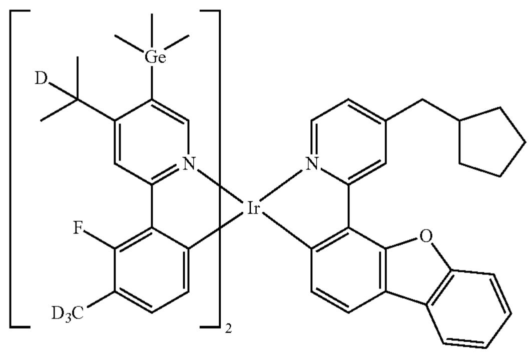
806
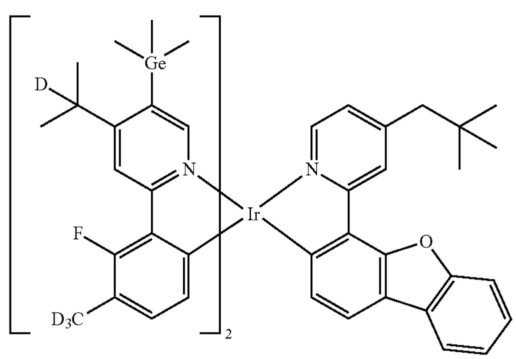
807
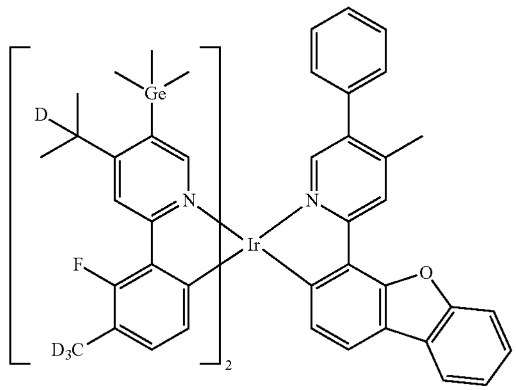

-continued
808
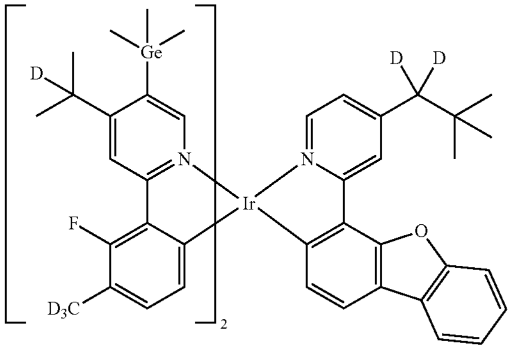
809
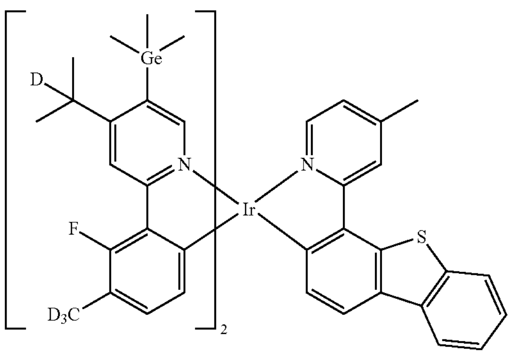
810
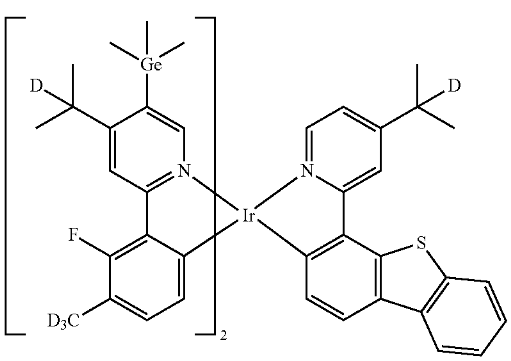
811
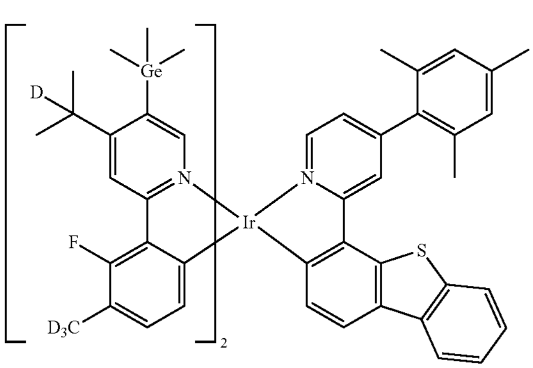
-continued
812
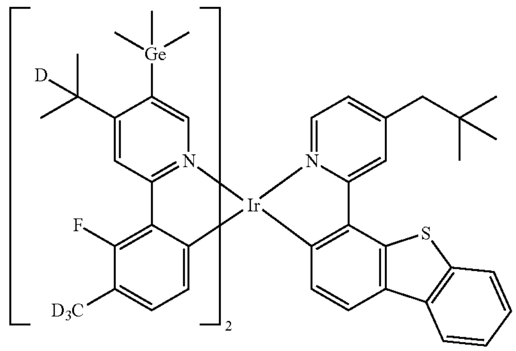
813
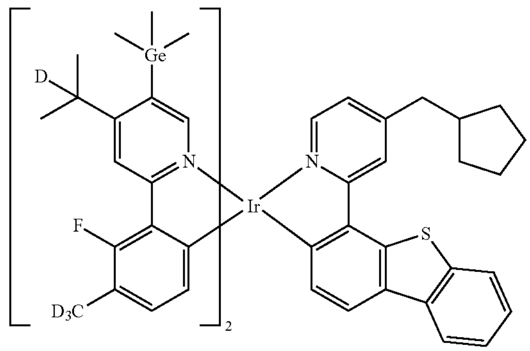
814
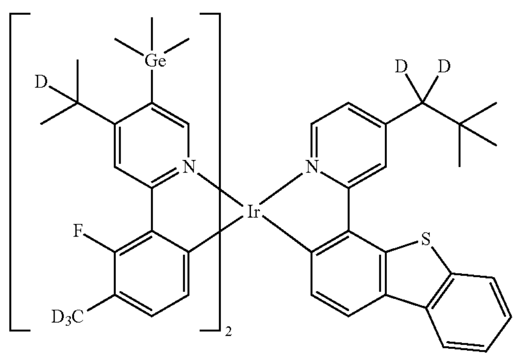
815
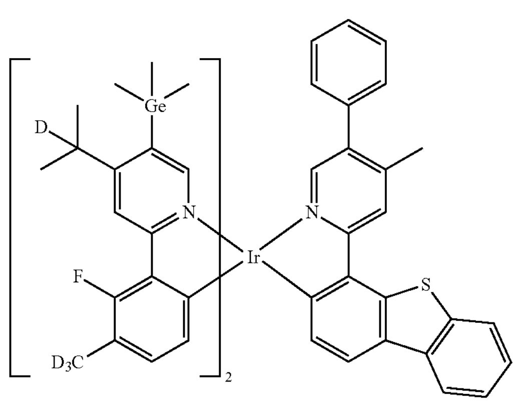

-continued
816
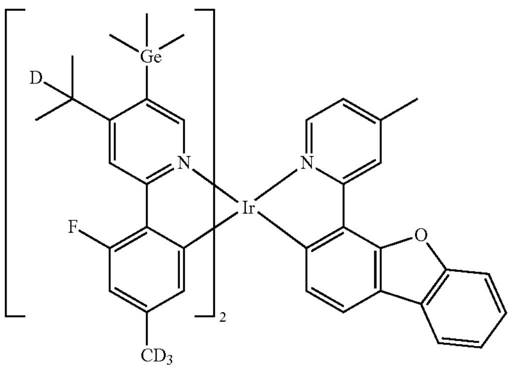
817
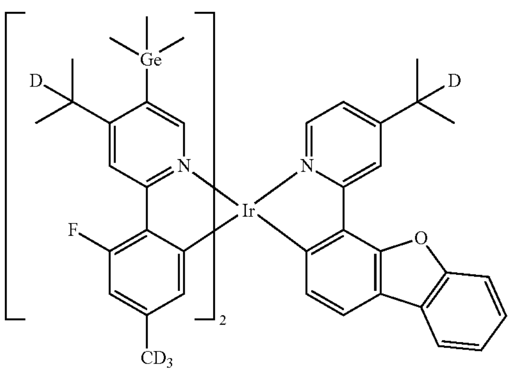
818
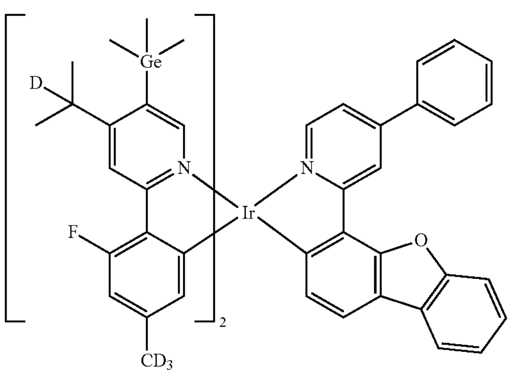
819
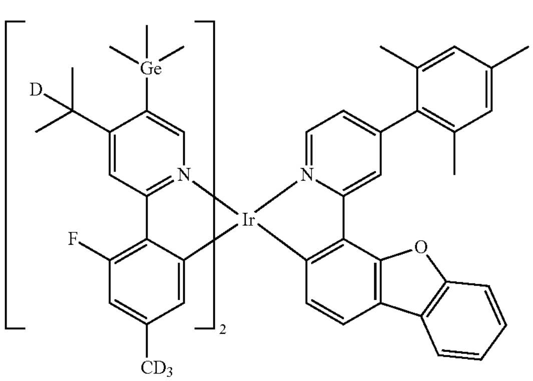
-continued
820
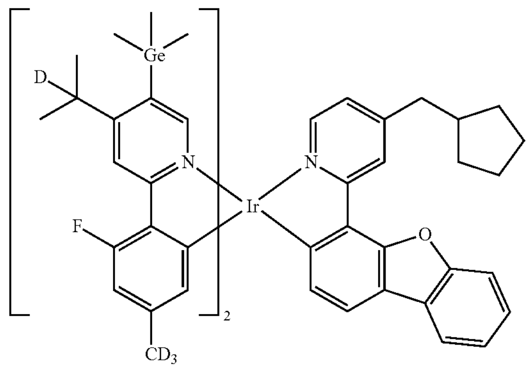
821
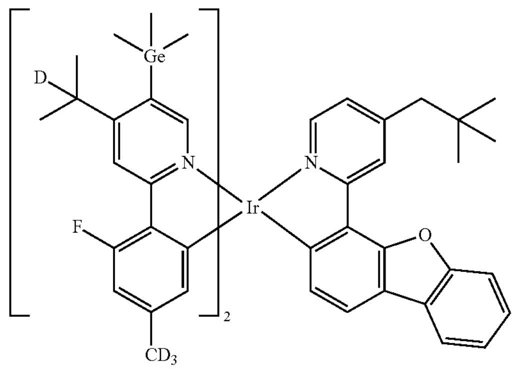
822
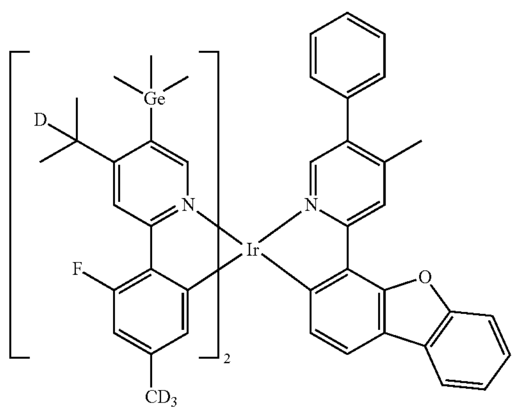
823
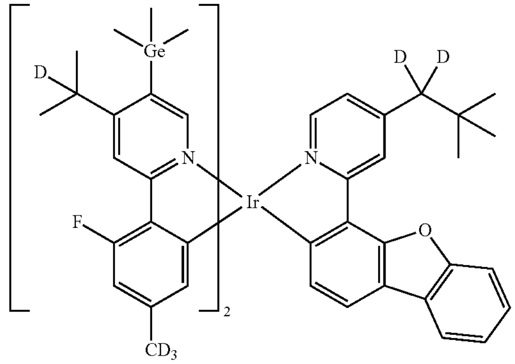

-continued
824
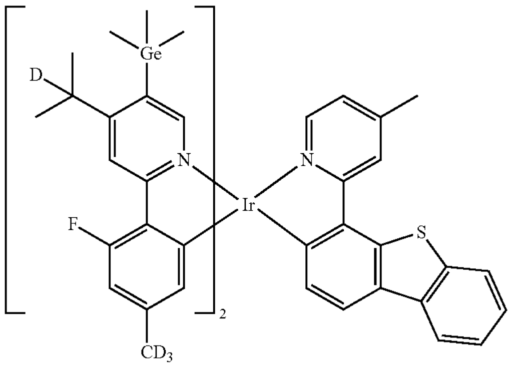
825
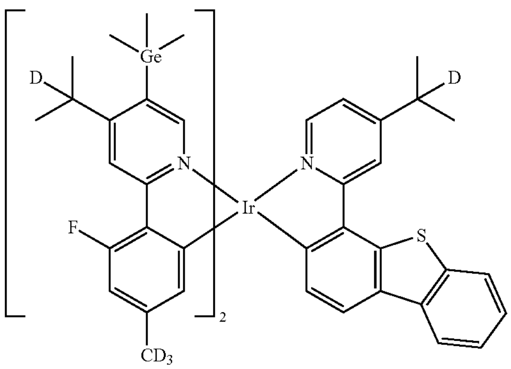
826
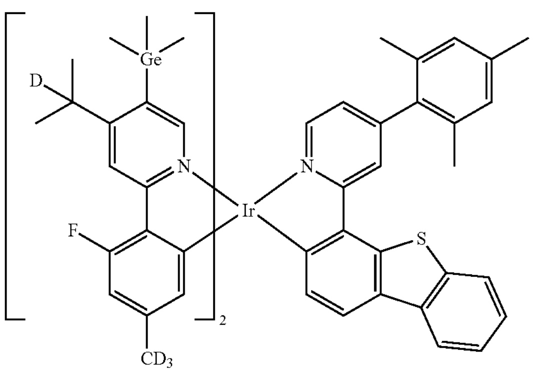
827
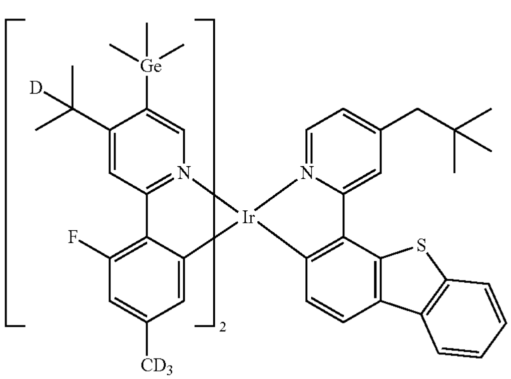
-continued
828
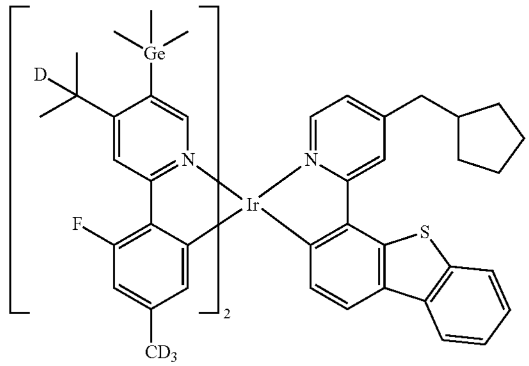
829
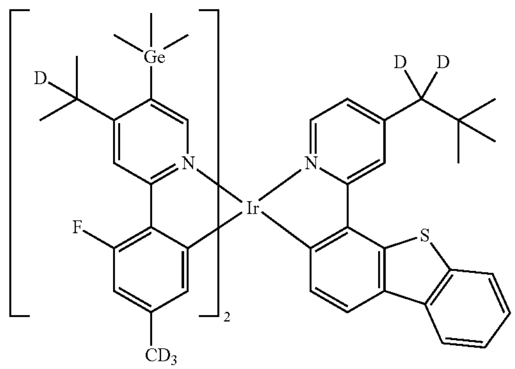
830
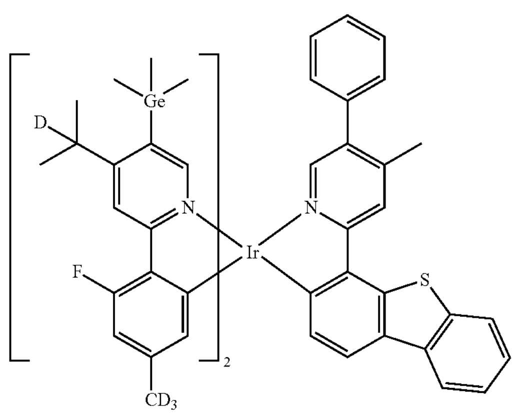
831
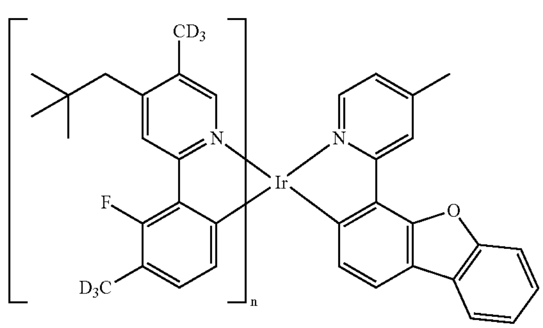

-continued
832
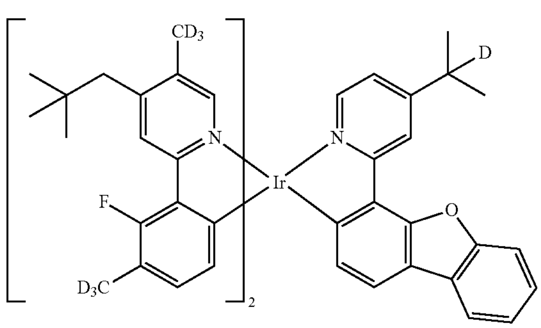
833
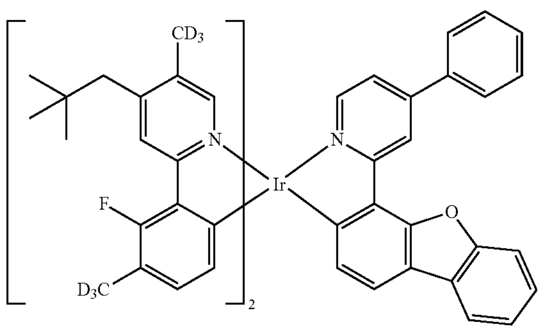
834
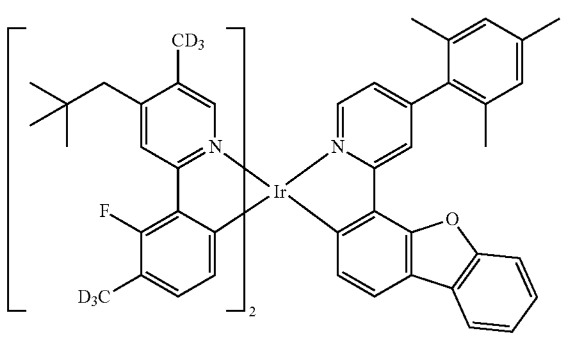
835
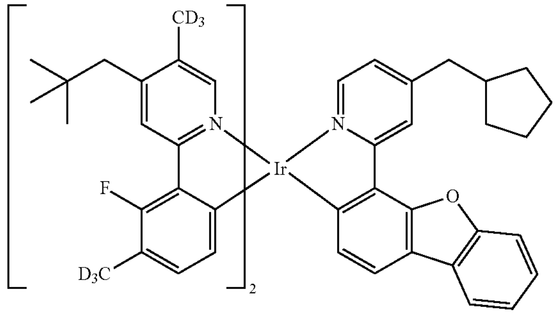
-continued
836
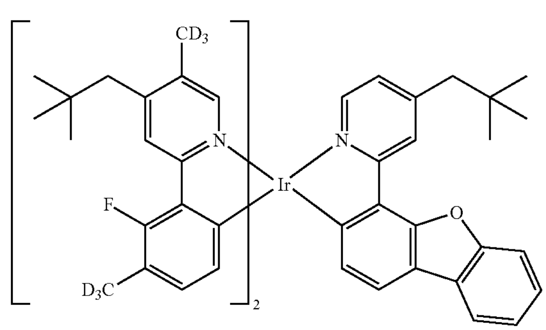
837
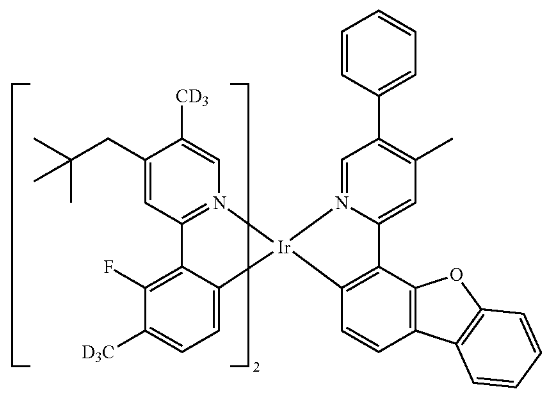
838
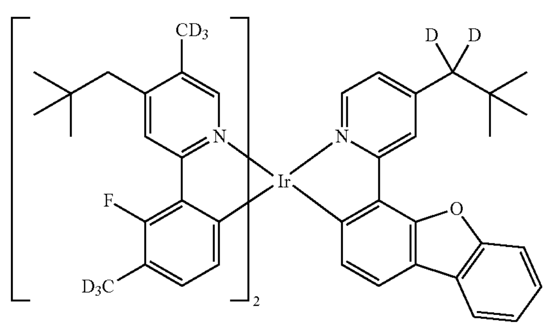
839
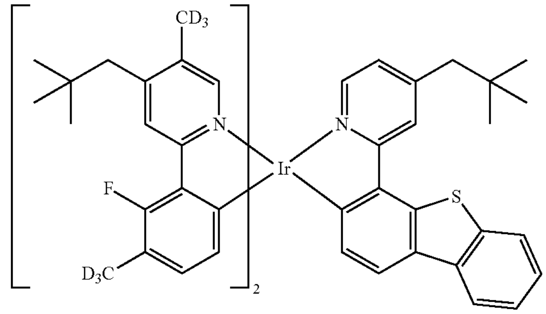

-continued
840
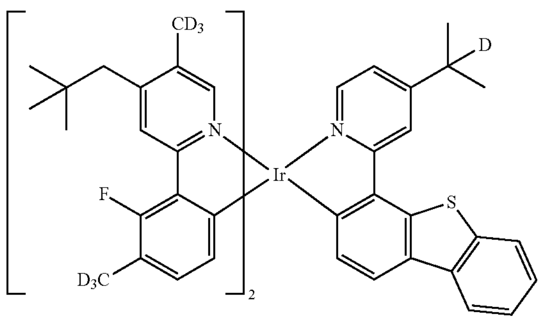
841
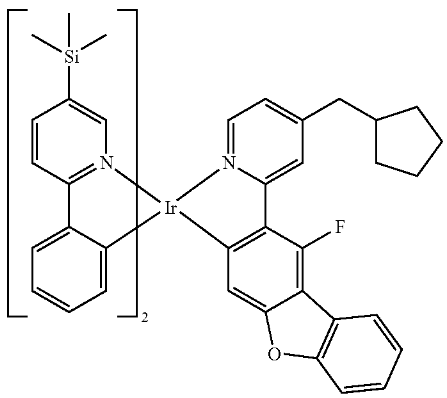
842
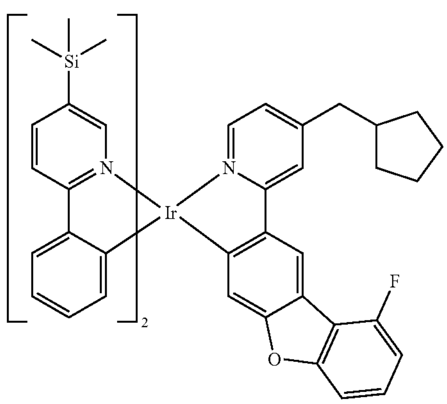
843
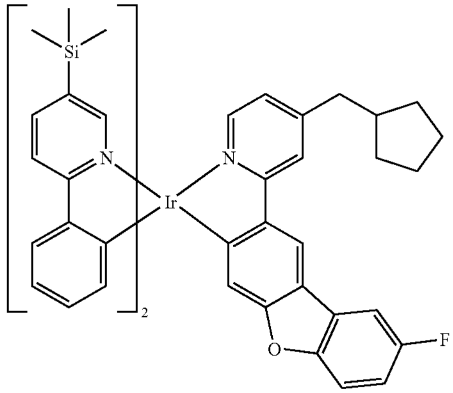
-continued
844
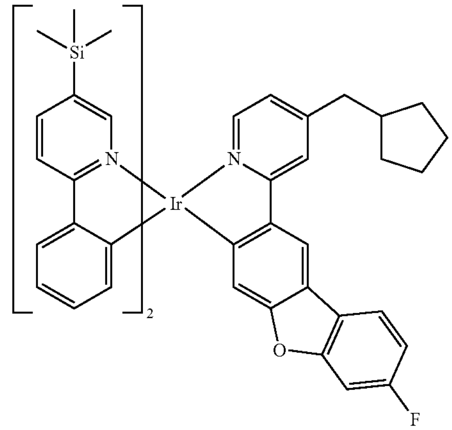
845
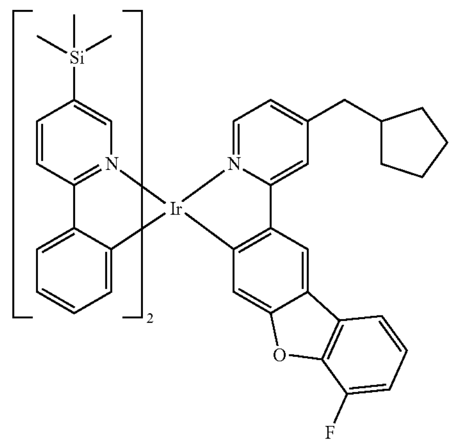
846
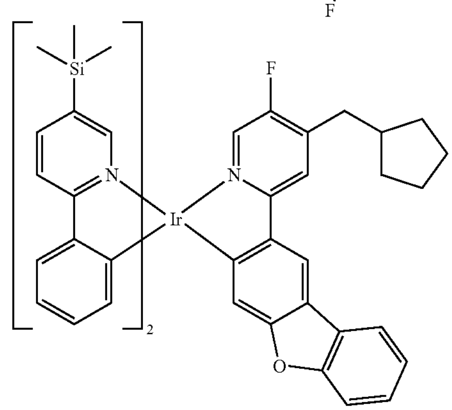
847
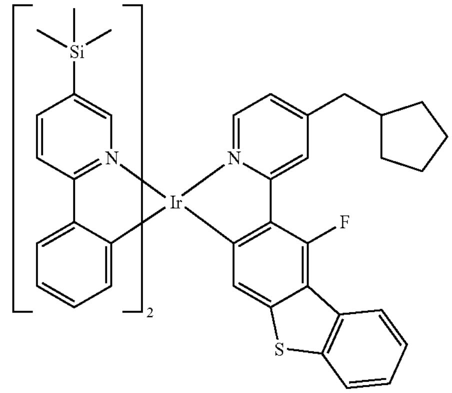

848
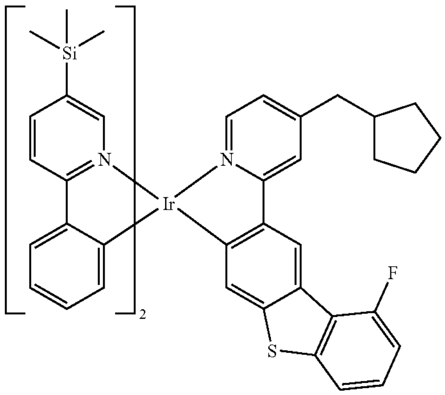
849
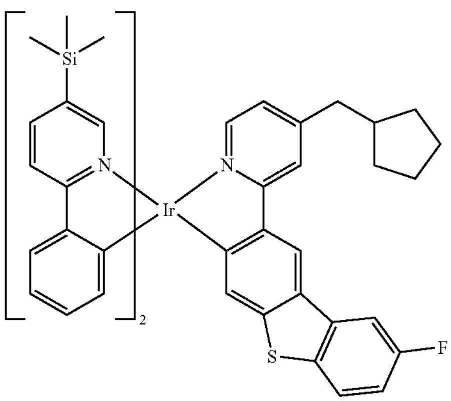
850
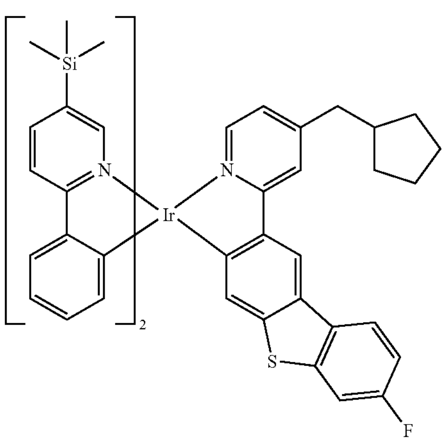
851
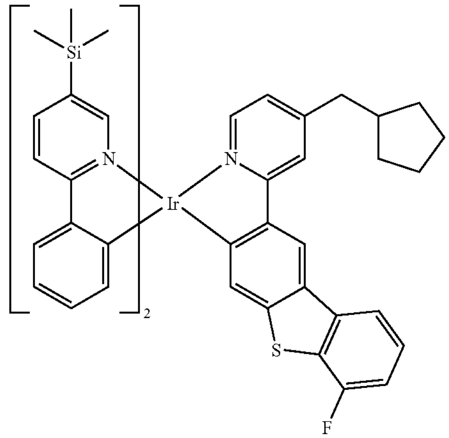
852
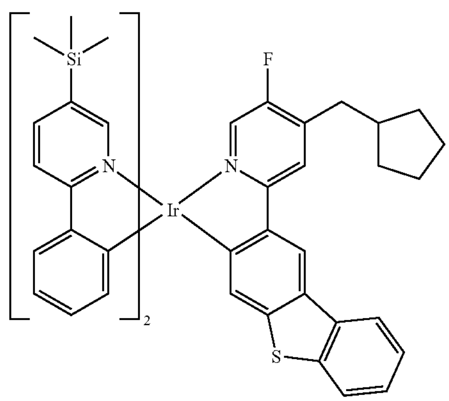
853
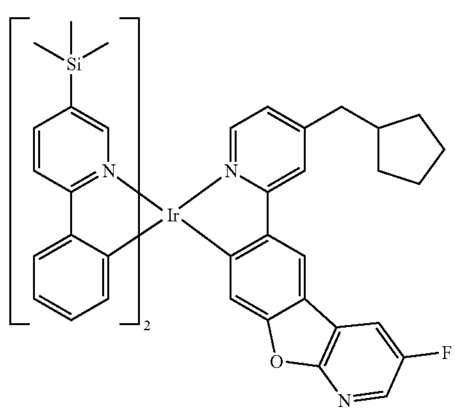

-continued
854
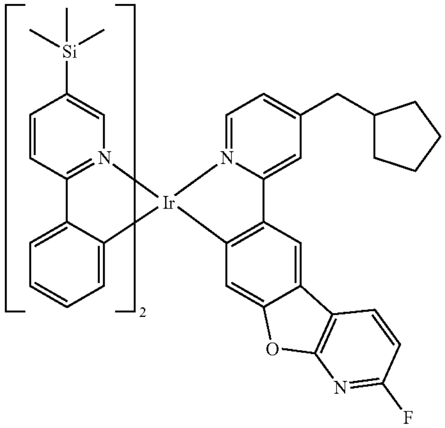
855
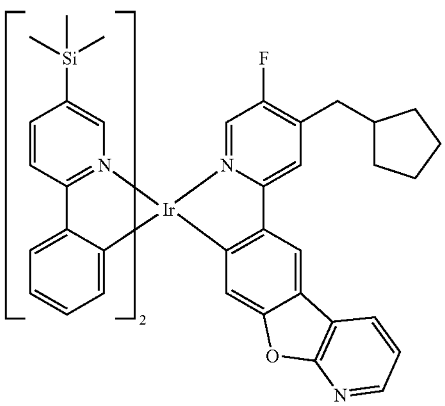
856
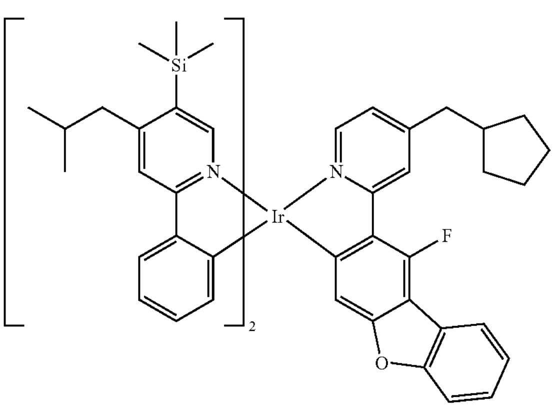
-continued
857
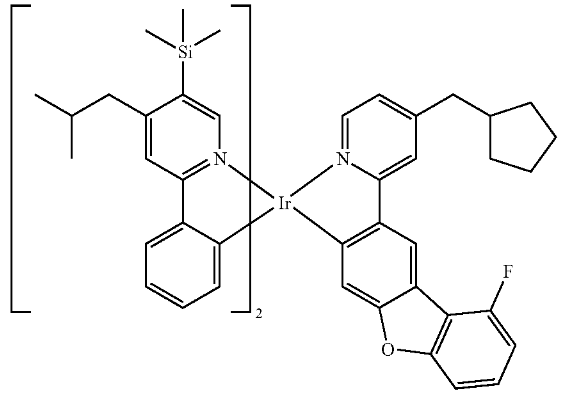
858
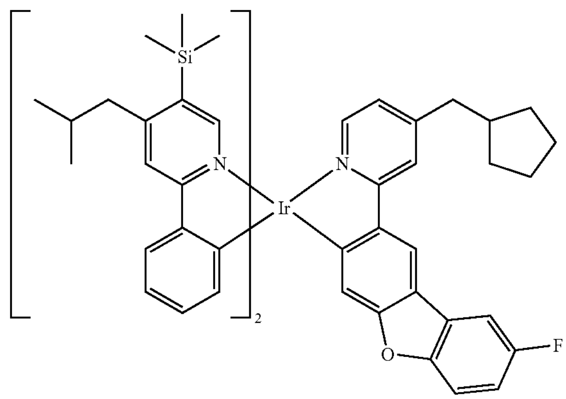
859
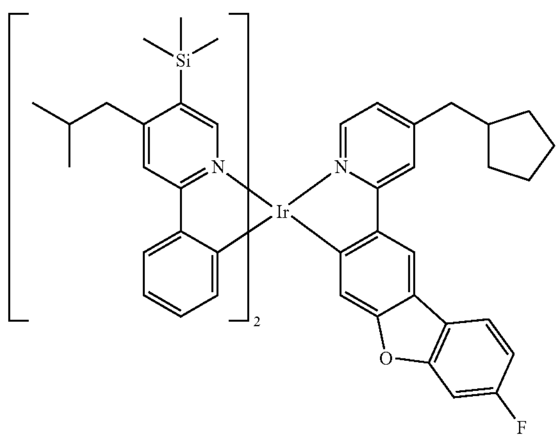

-continued
860
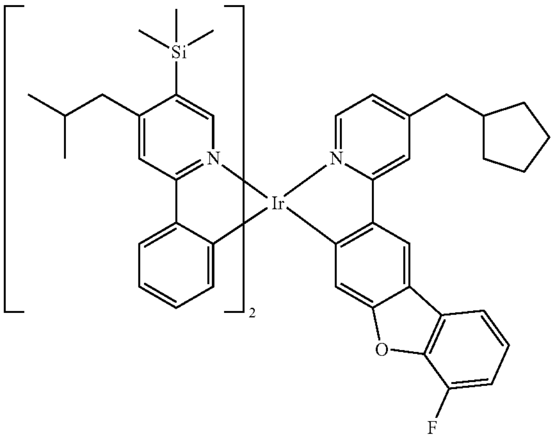
861
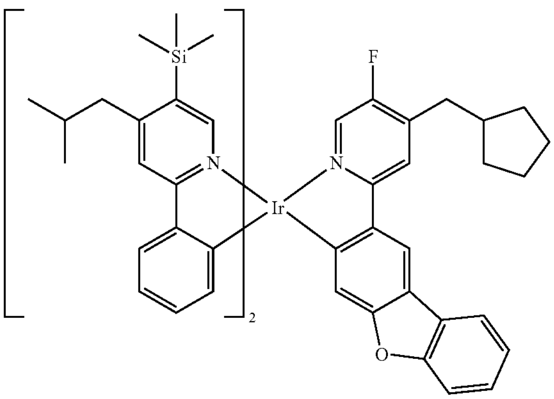
862
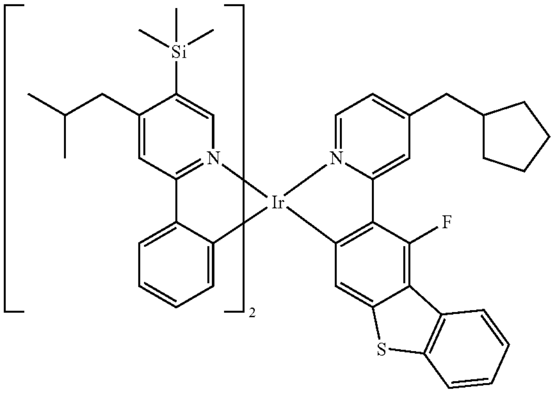
-continued
863
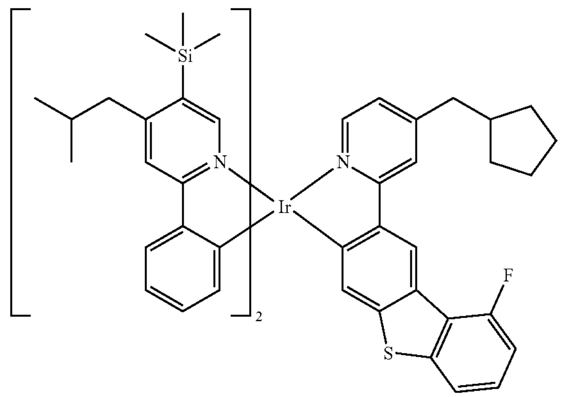
864
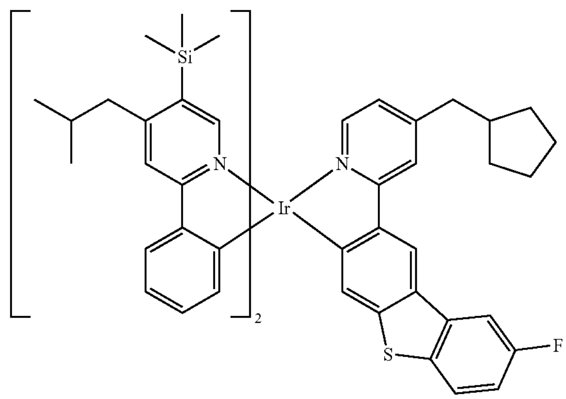
865
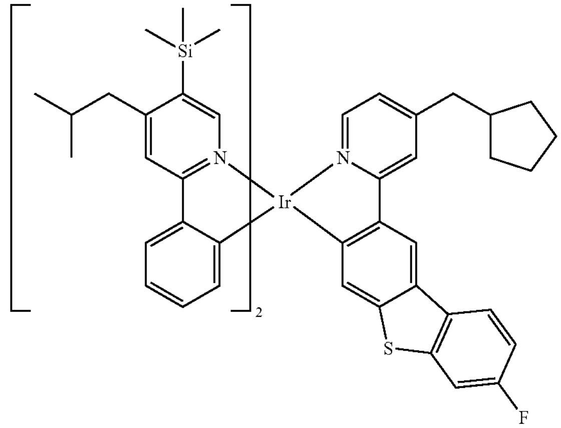

866
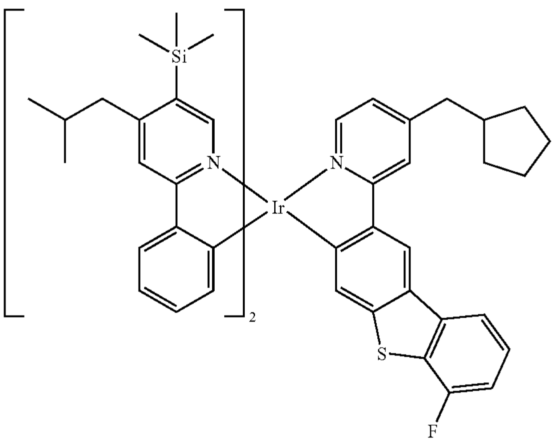
869
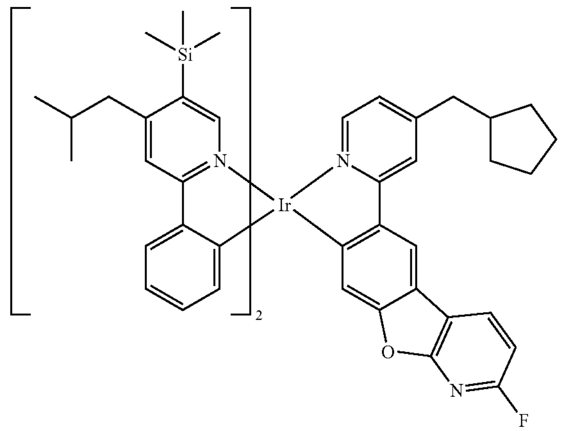
867
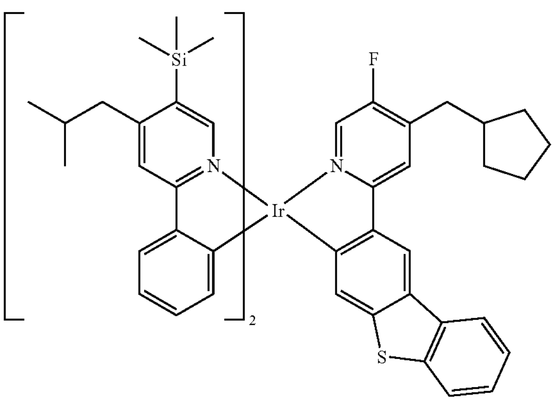
870
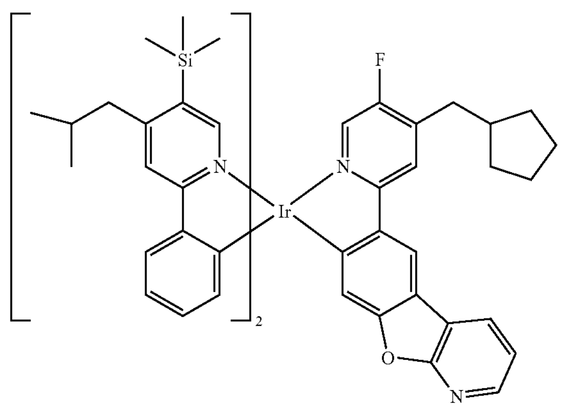
868
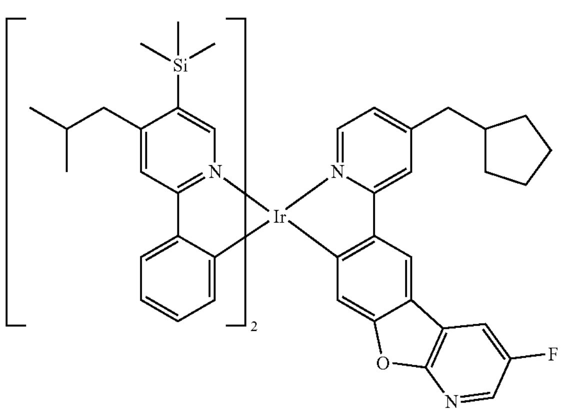
871
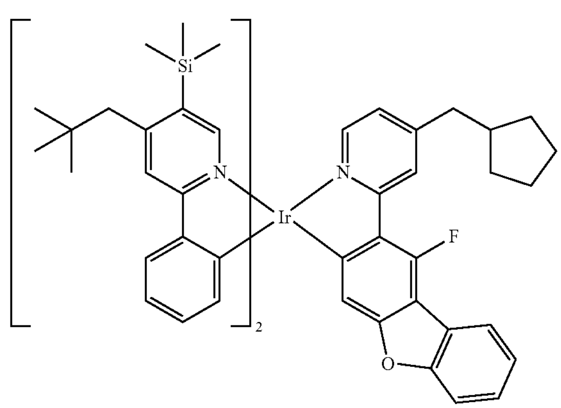

-continued
872
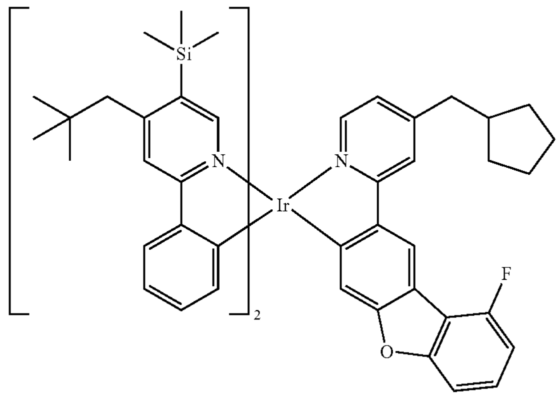
873
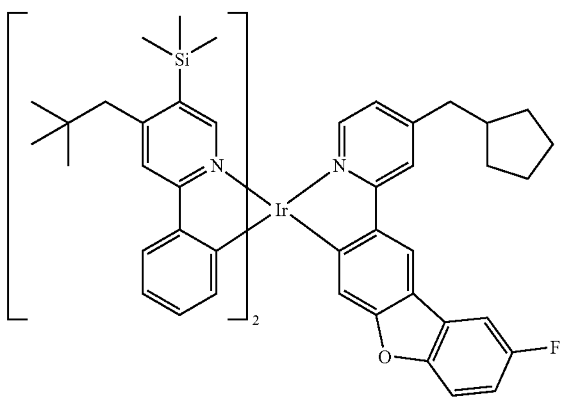
874
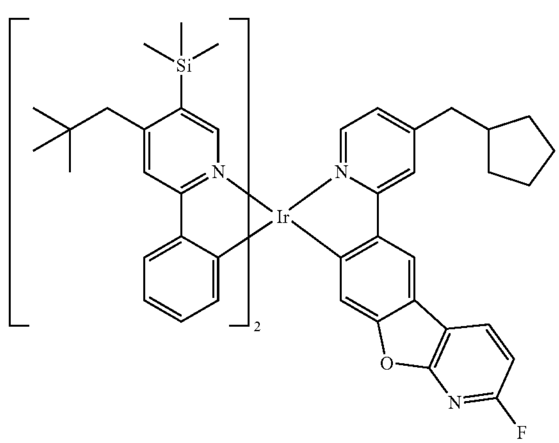
-continued
875
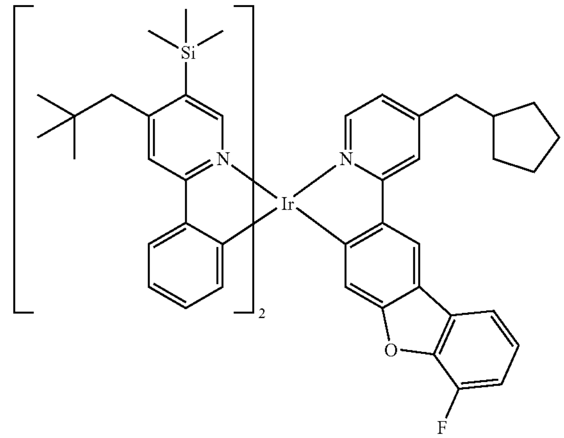
876
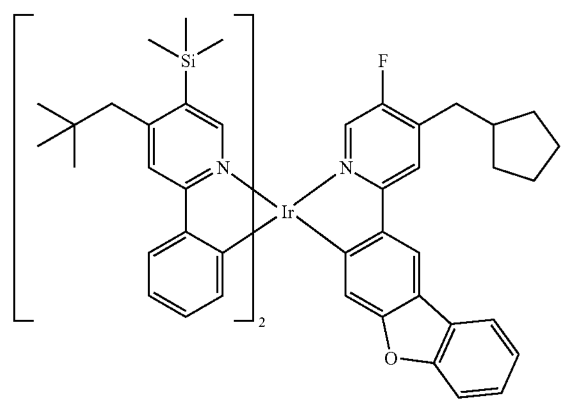
877
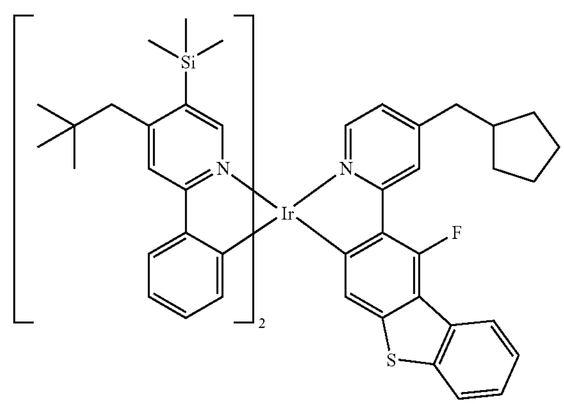

-continued
878
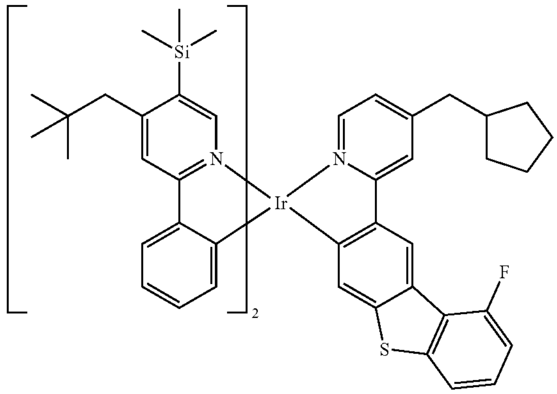
879
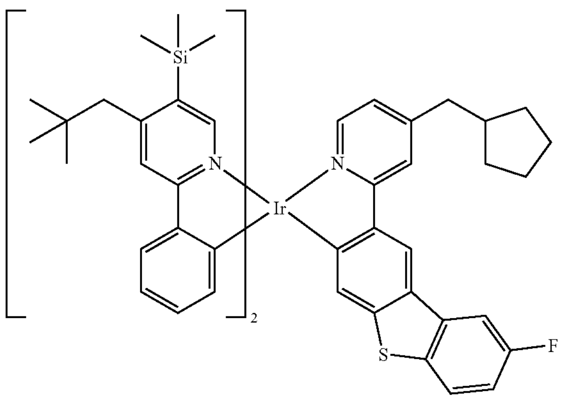
880
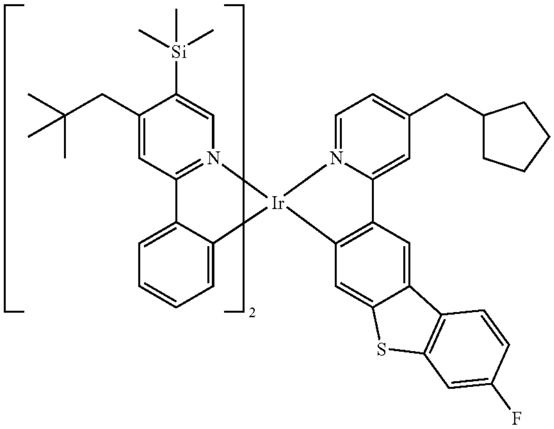
-continued
881
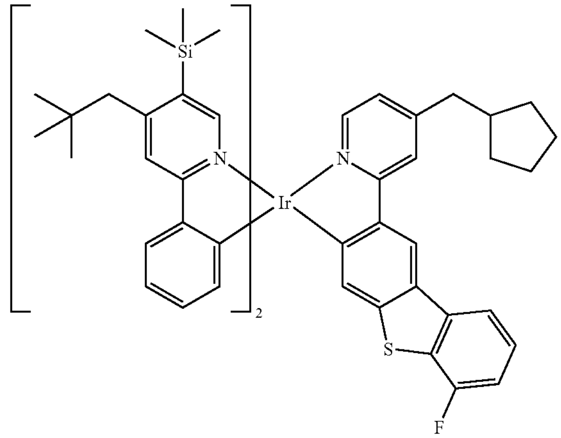
882
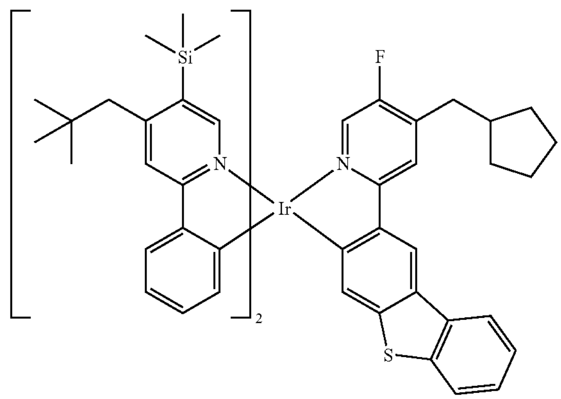
883
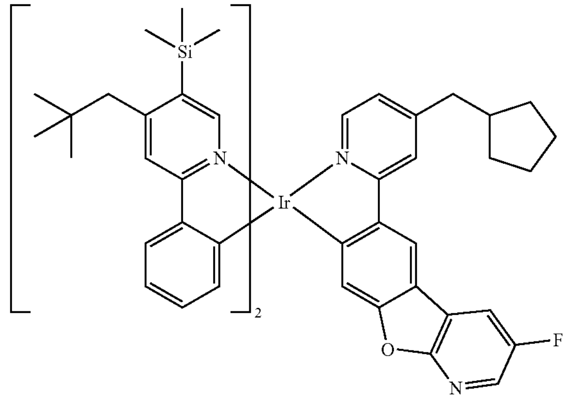

-continued
884
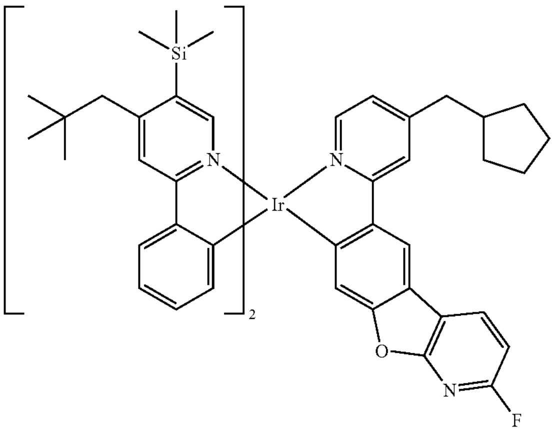
885
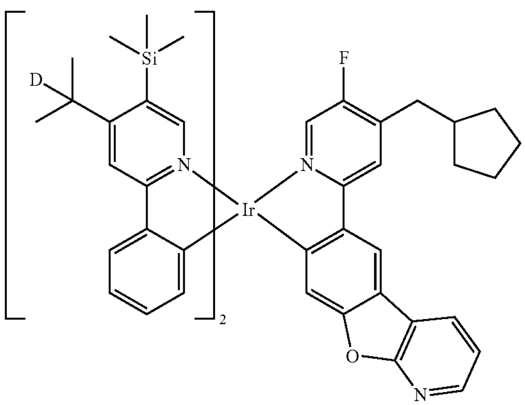
886
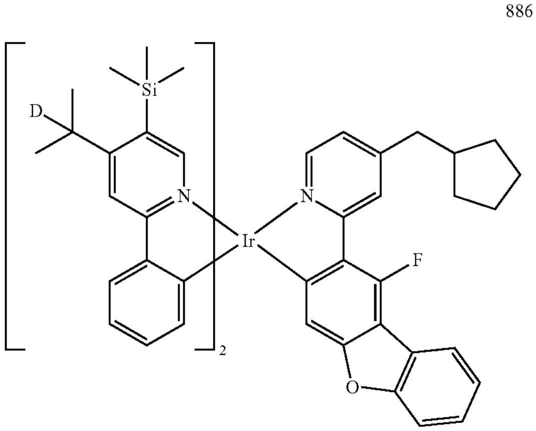
-continued
887
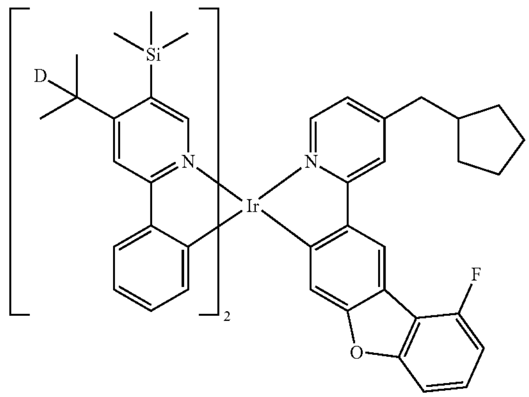
888
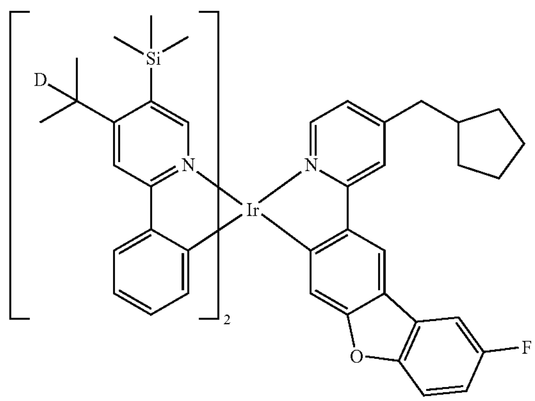
889
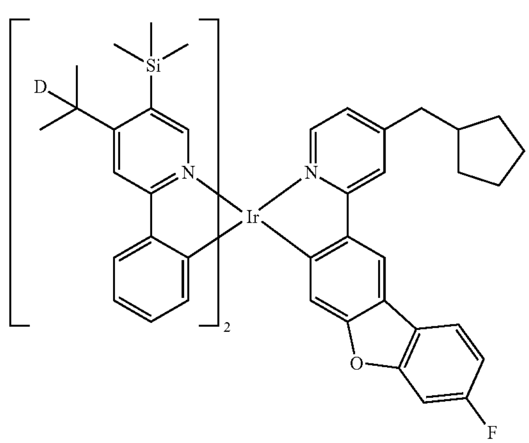

-continued
890
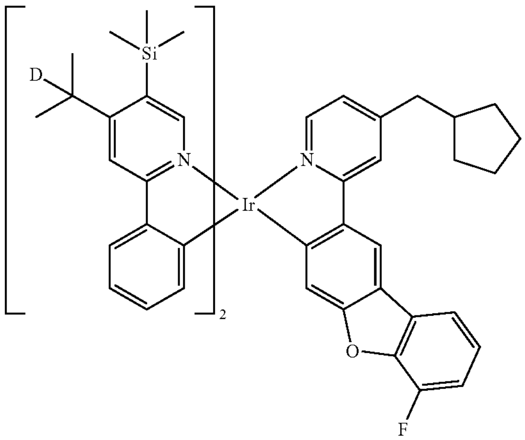
891
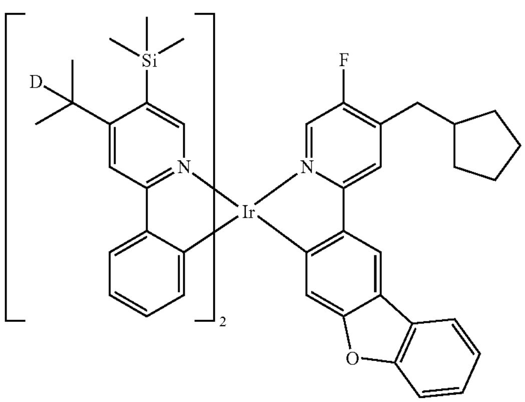
892
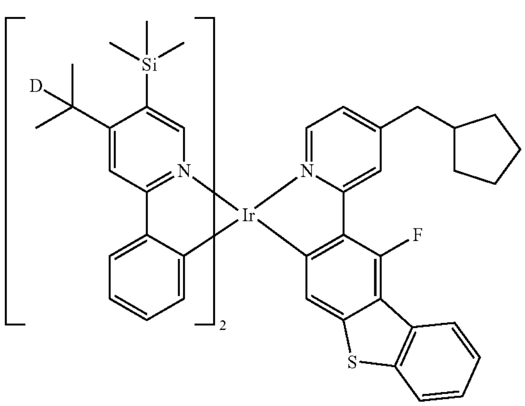
-continued
893
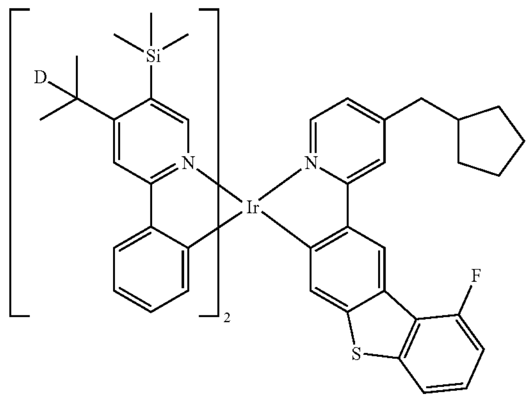
894
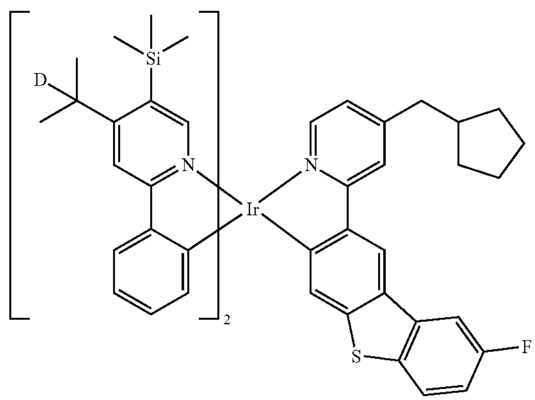
895
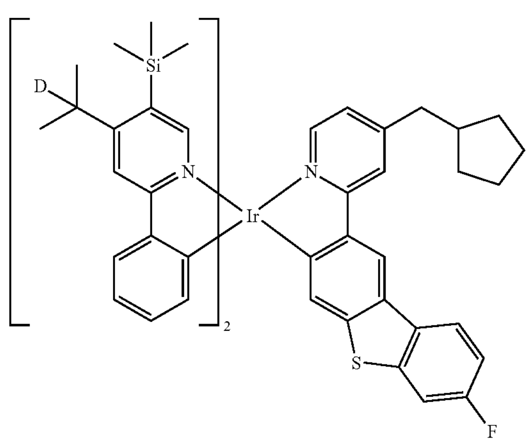

-continued
896
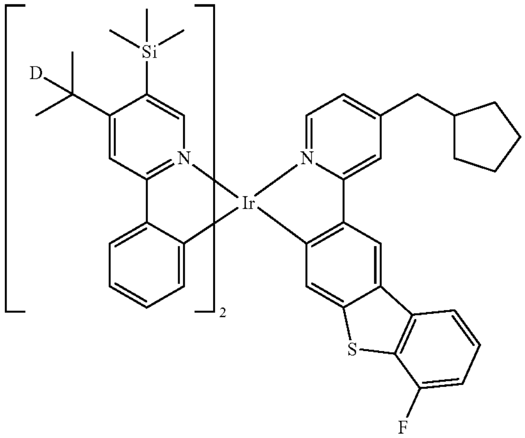
897
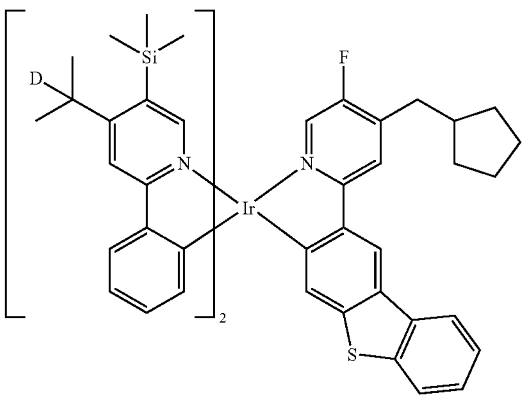
898
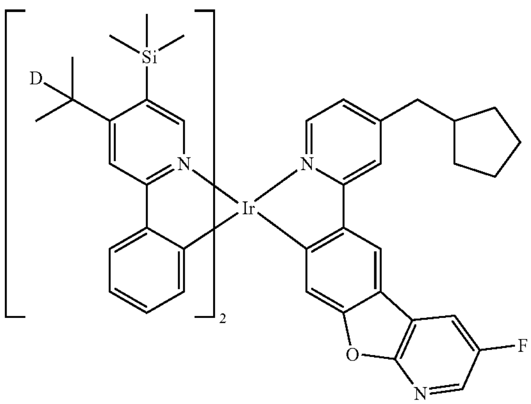
-continued
899
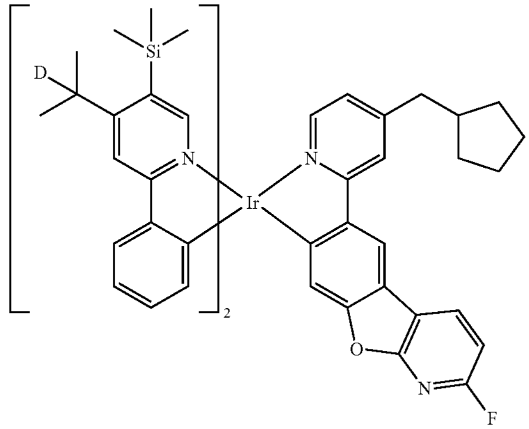
900
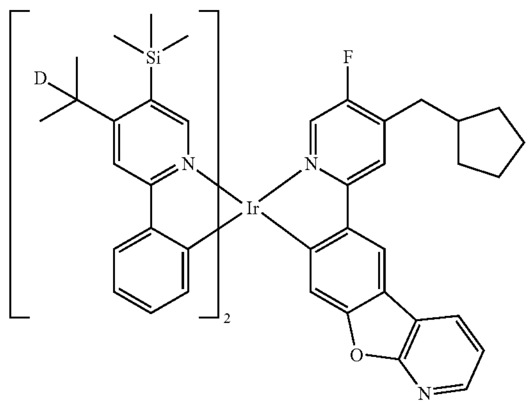
901
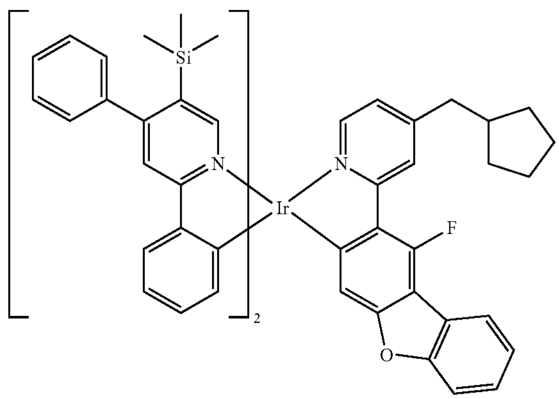

-continued
902
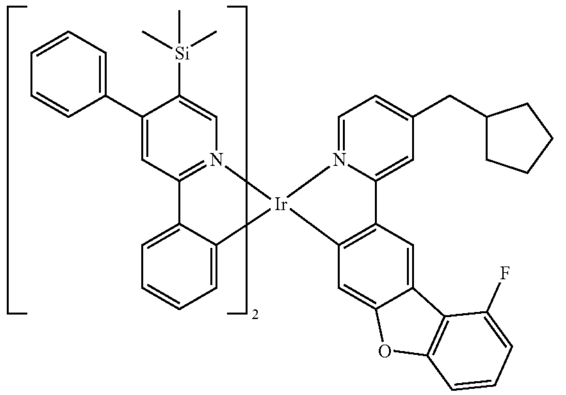
903
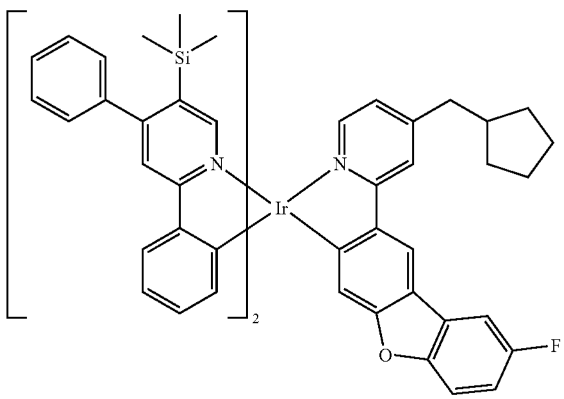
904
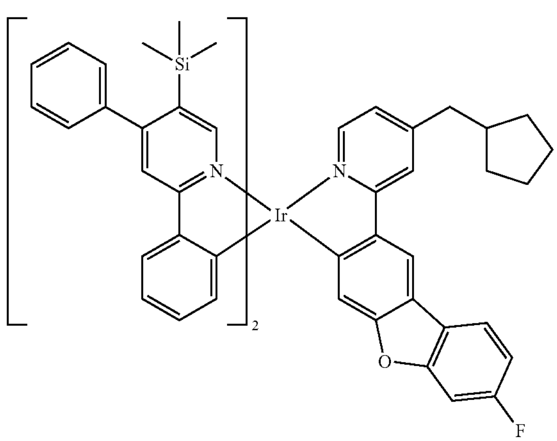
-continued
905
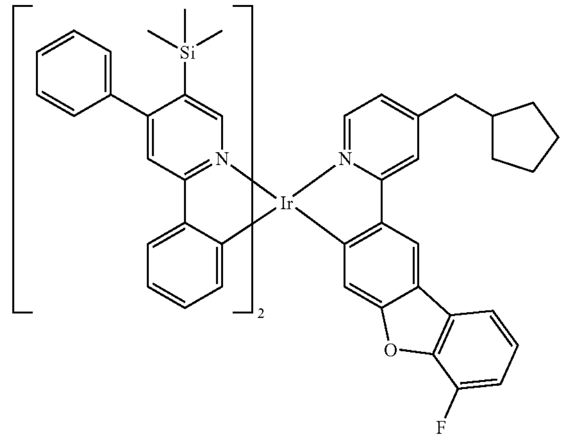
906
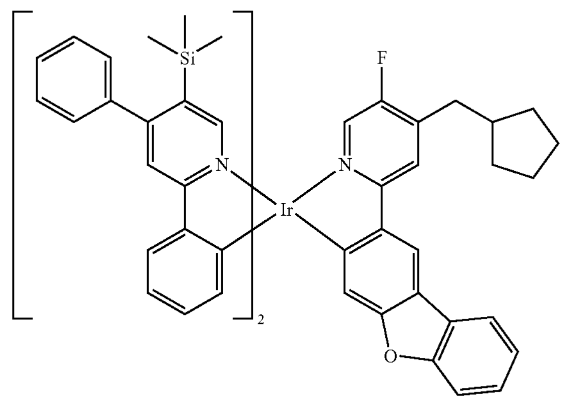
907
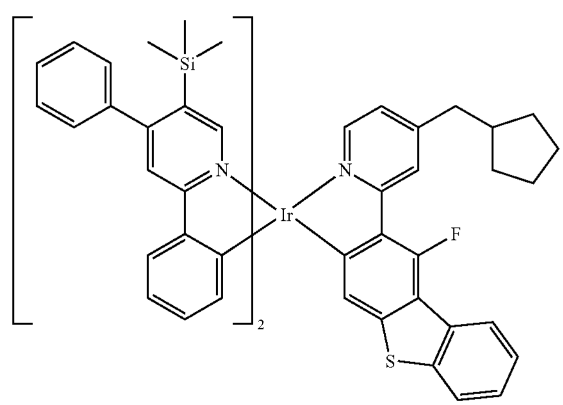

-continued
908
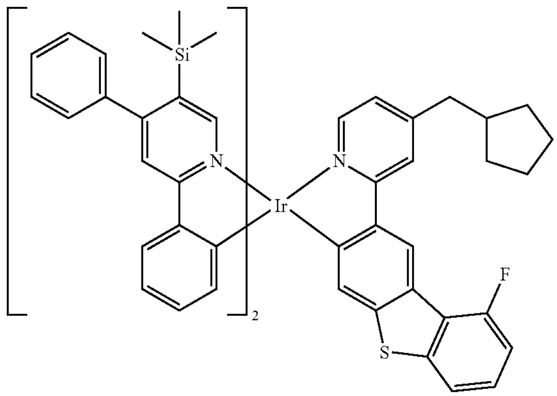
909
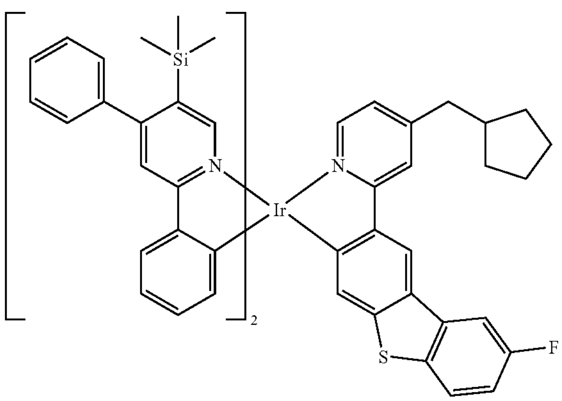
910
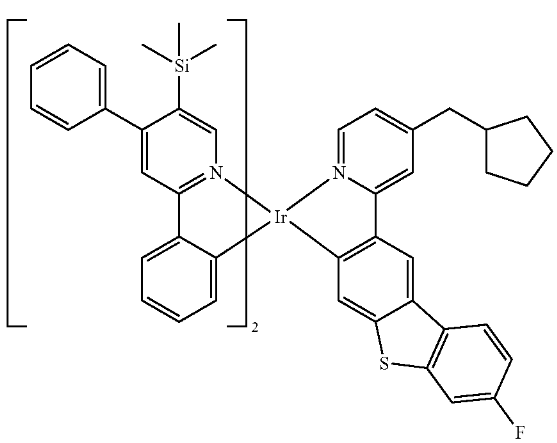
-continued
911
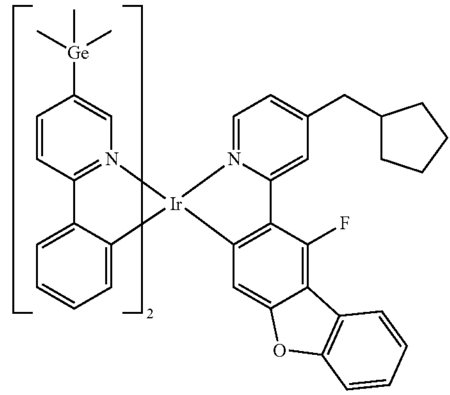
912
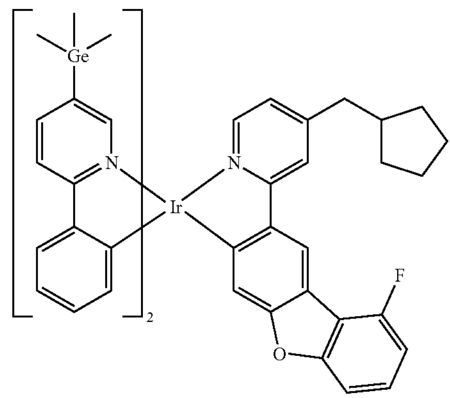
913
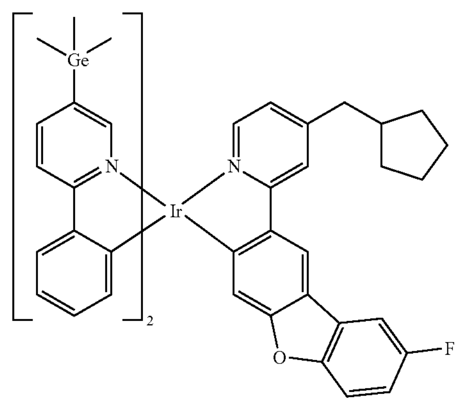
914
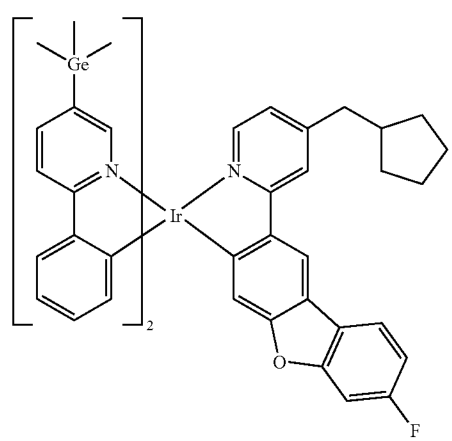

-continued
915
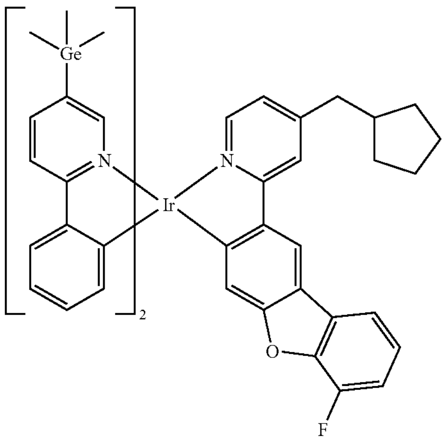
916
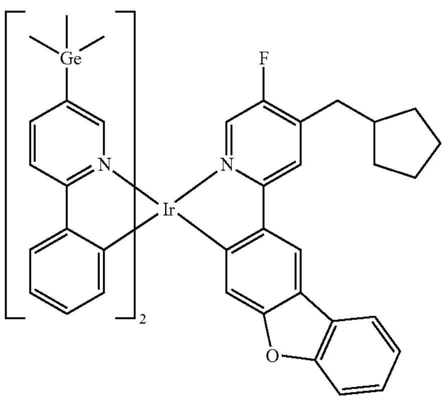
917
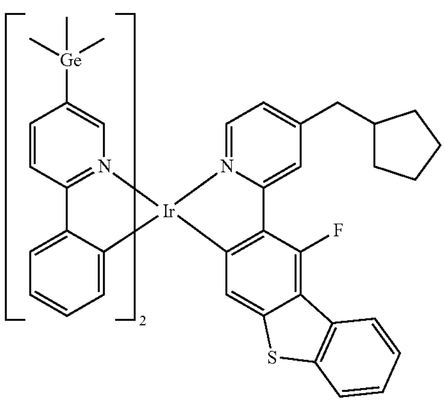
918
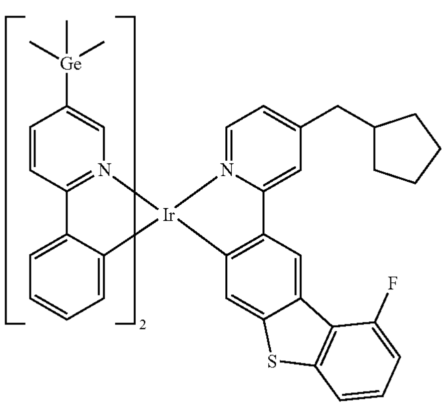
-continued
919
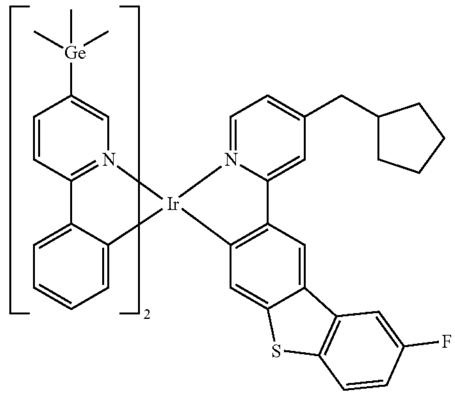
920
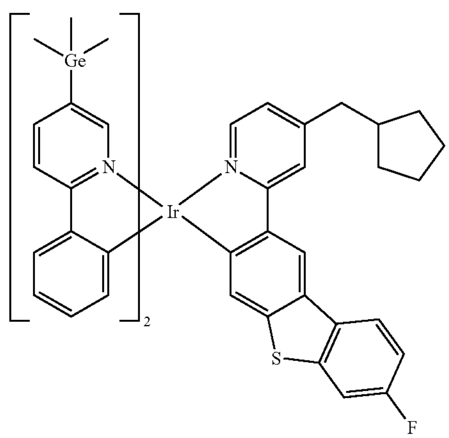
921
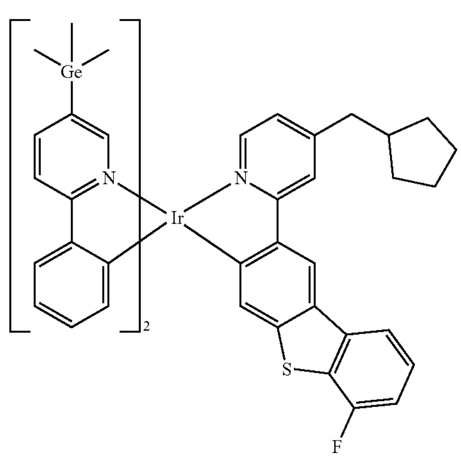

-continued
922
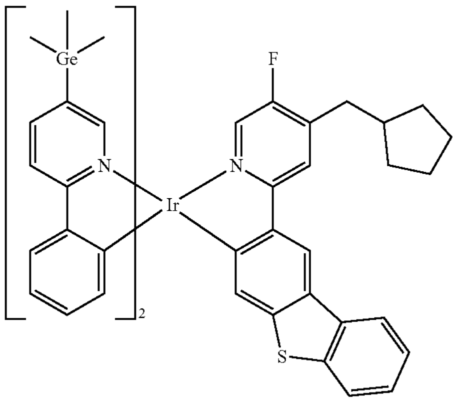
923
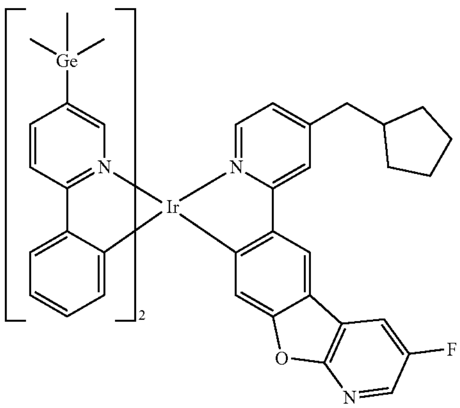
924
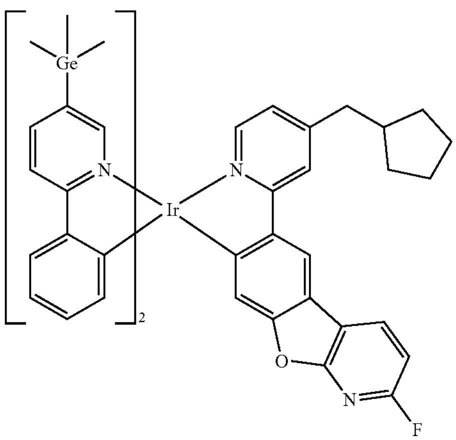
925
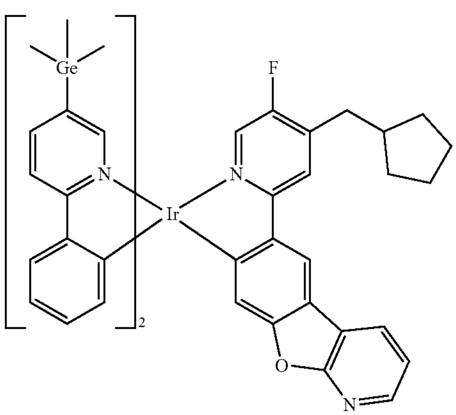
-continued
926
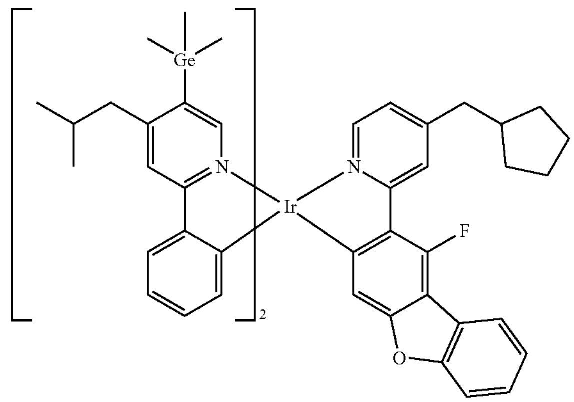
927
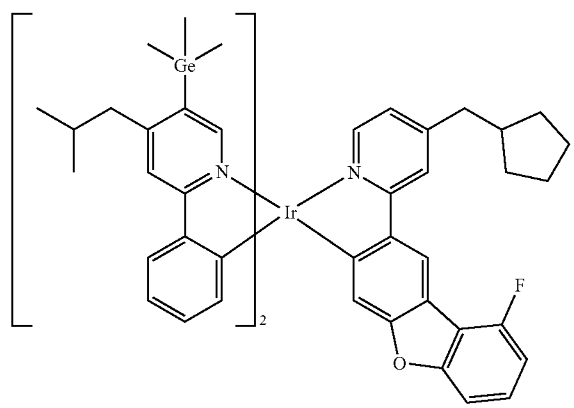
928
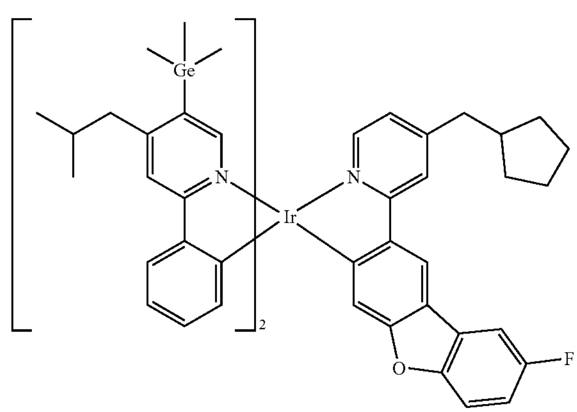

929
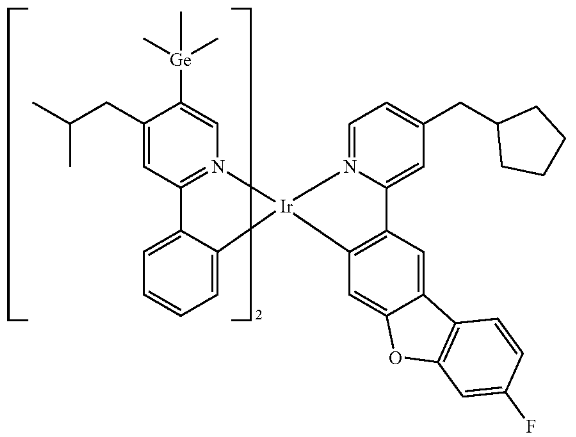
930
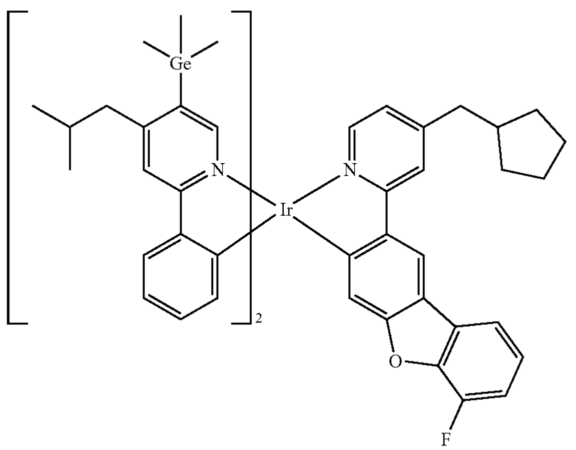
931
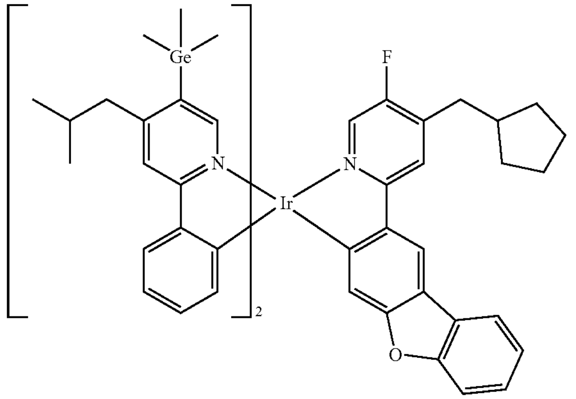
932
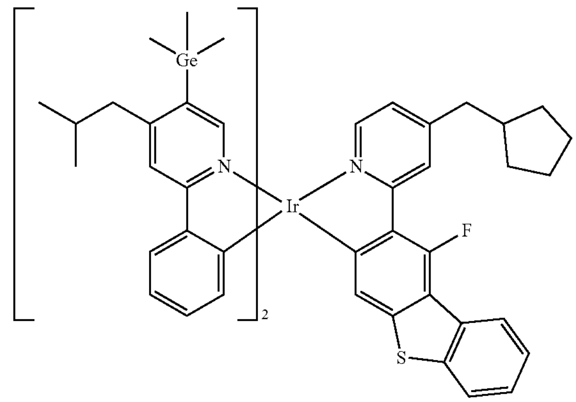
933
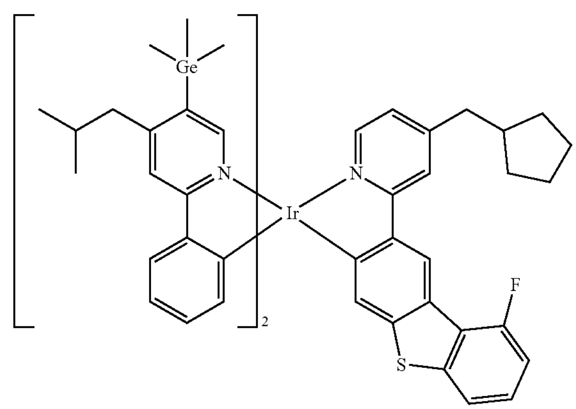
934
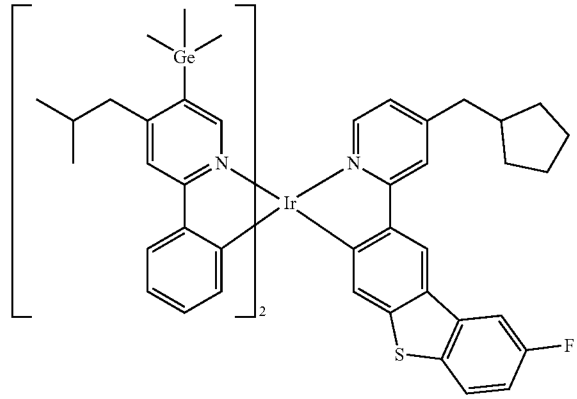

-continued
935
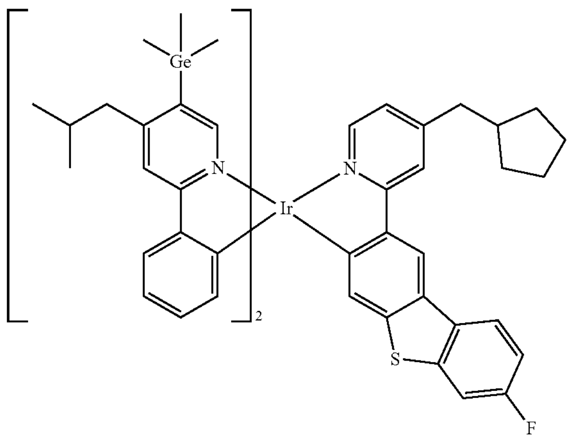
936
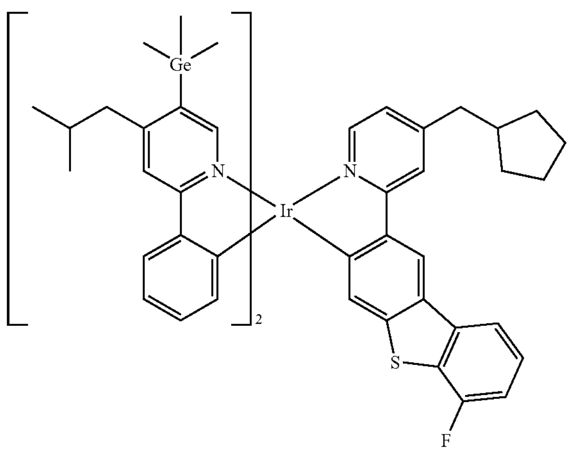
937
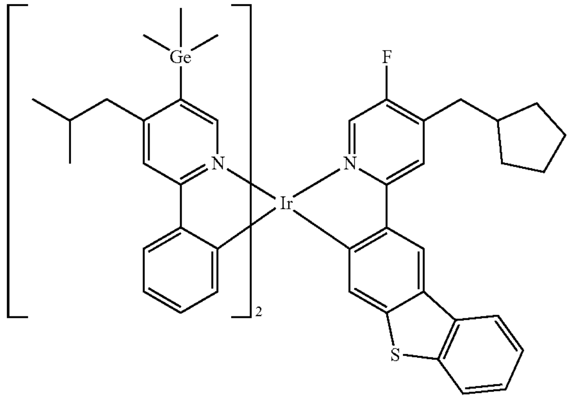
-continued
938
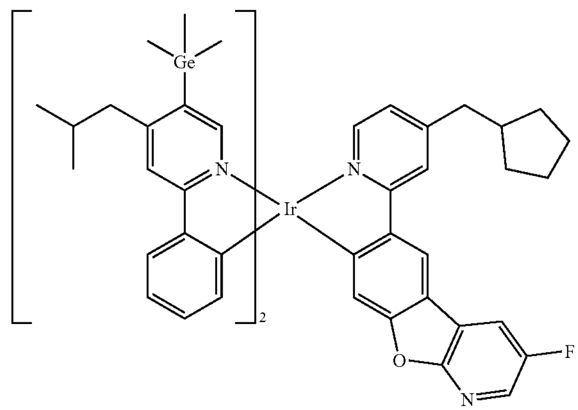
939
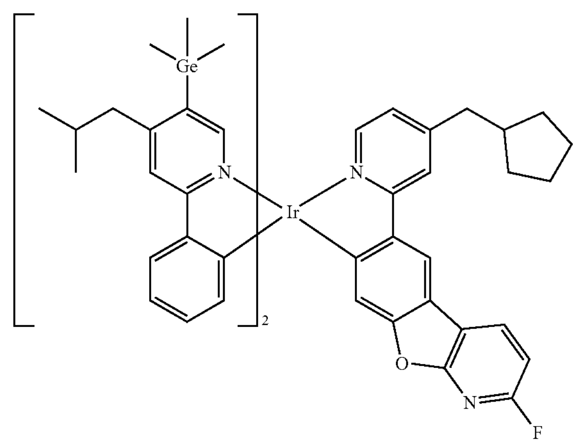
940
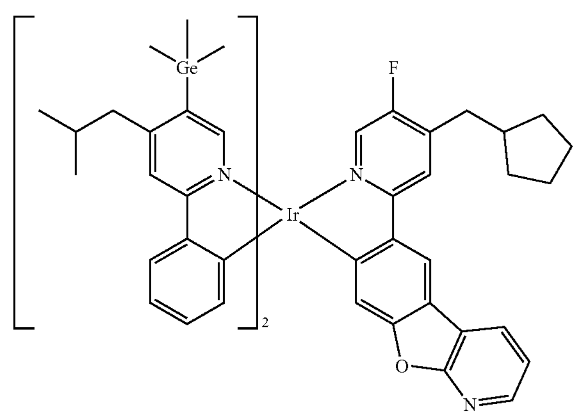

-continued
941
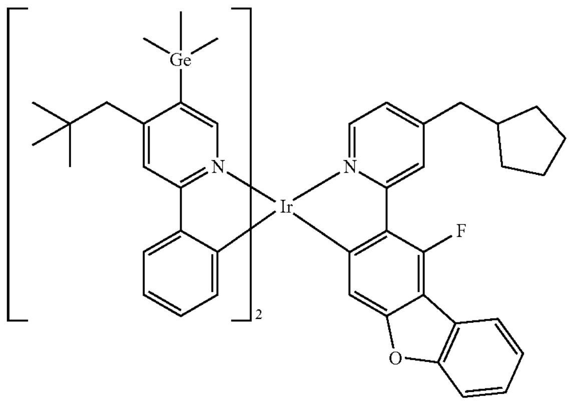
942
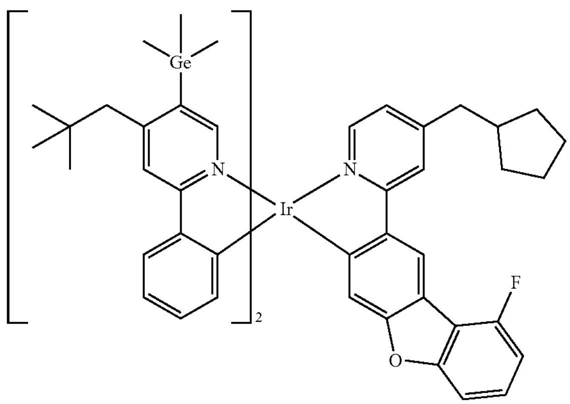
943
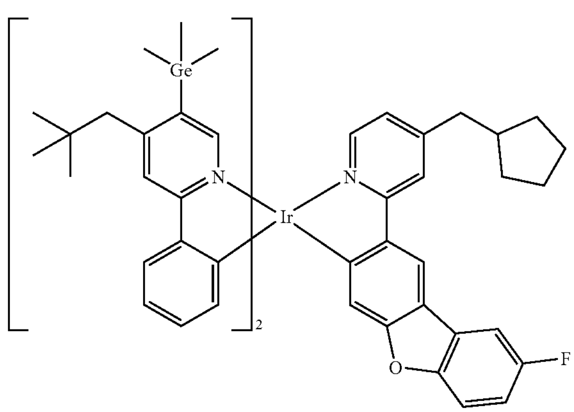
-continued
944
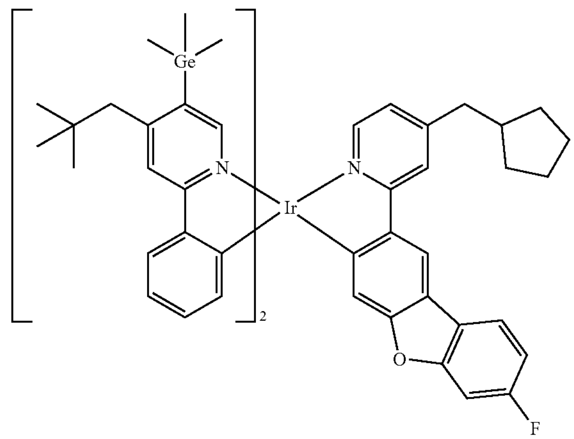
945
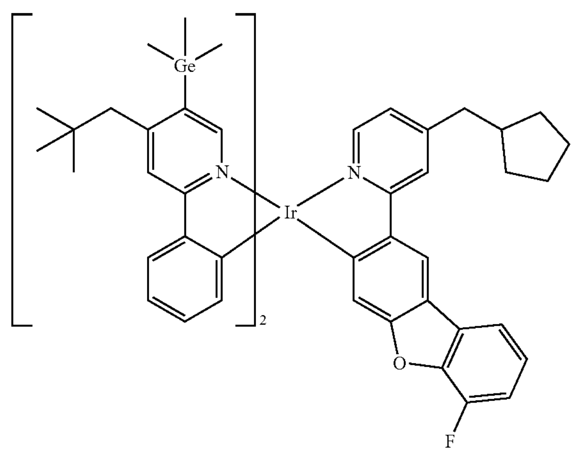
946
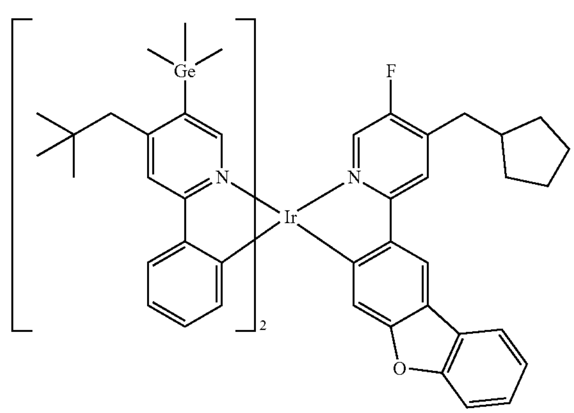

-continued
947
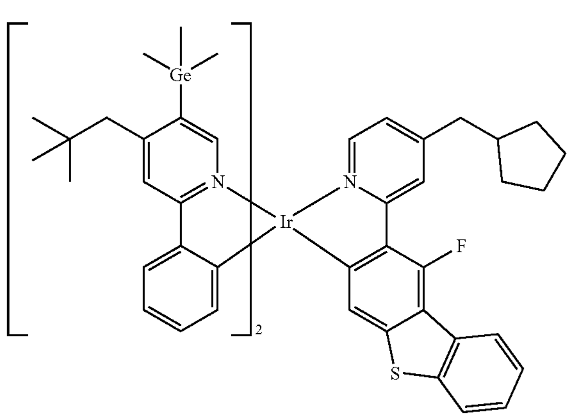
948
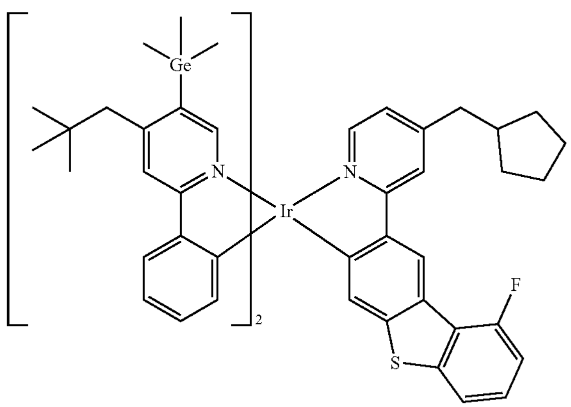
949
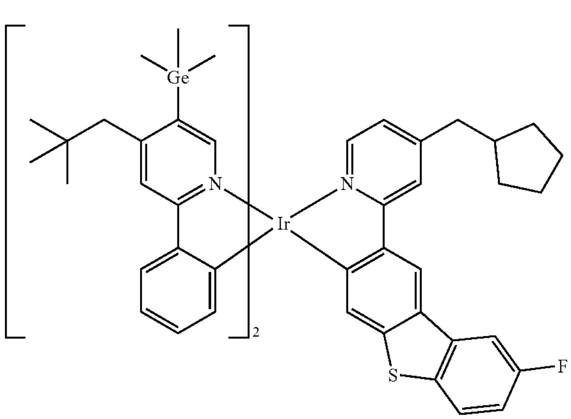
-continued
950
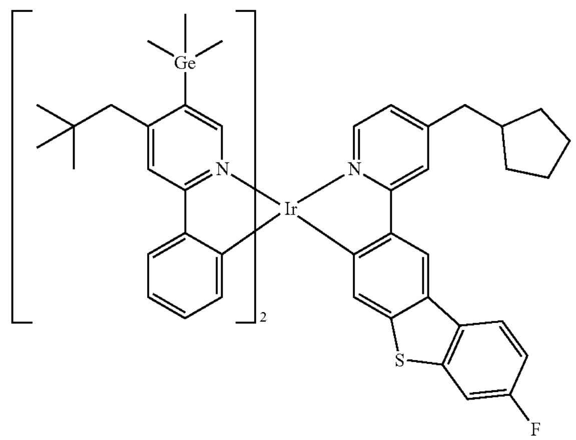
951
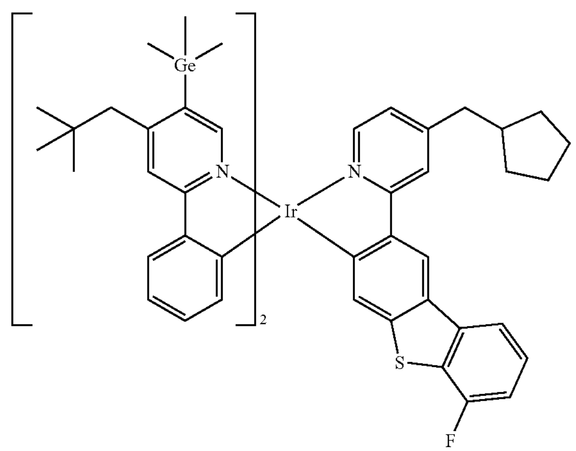
952
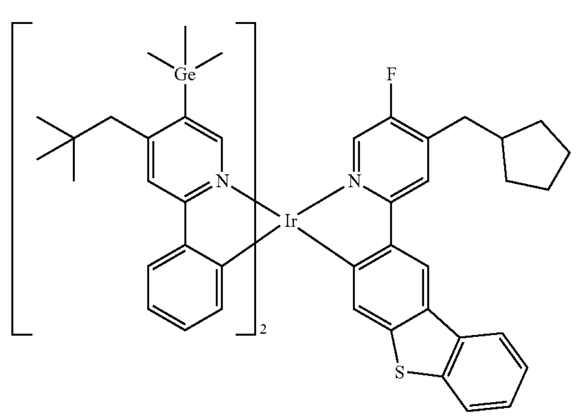

953
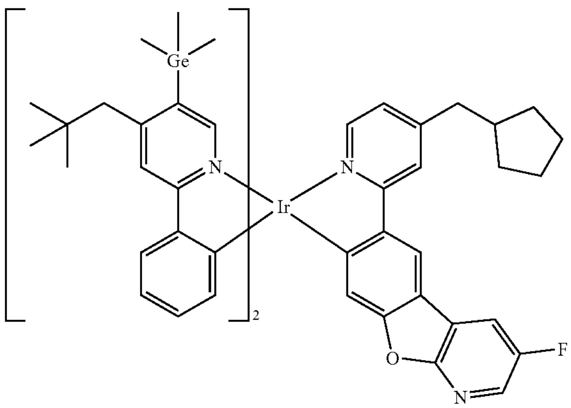
954
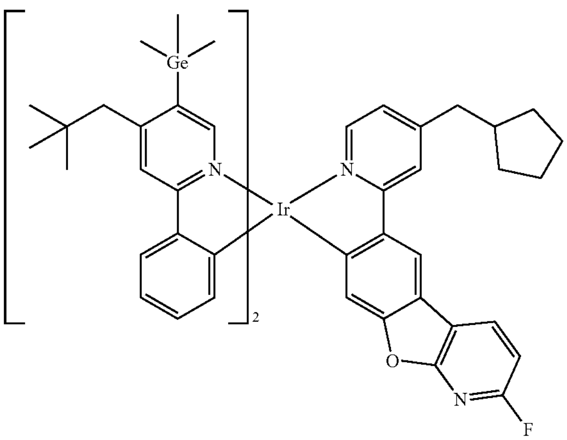
955
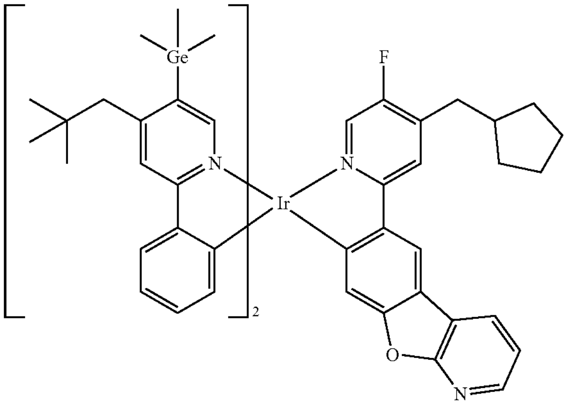
956
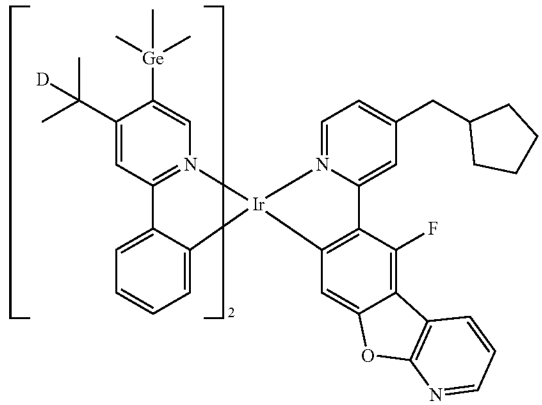
957
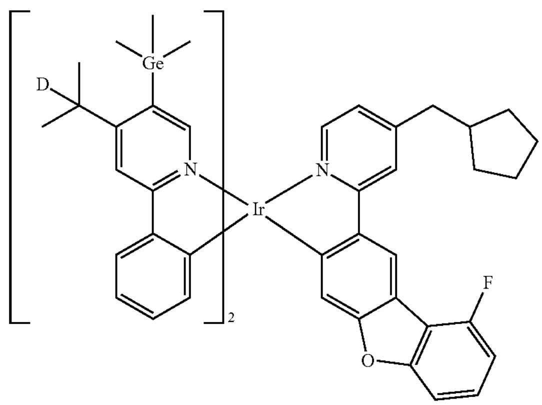
958
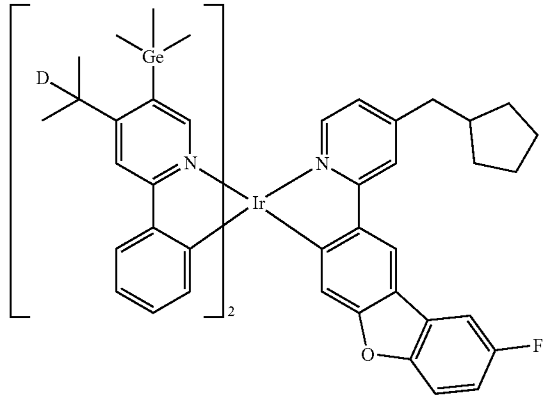

959
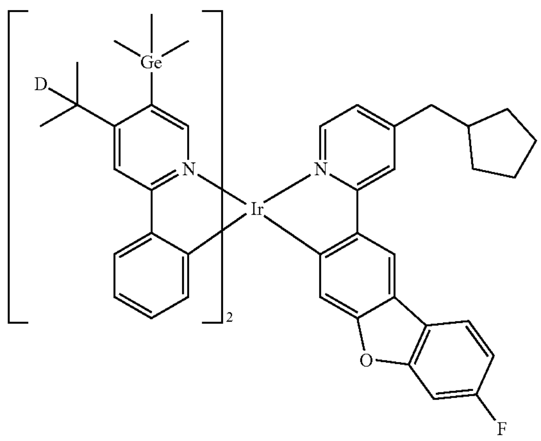
960
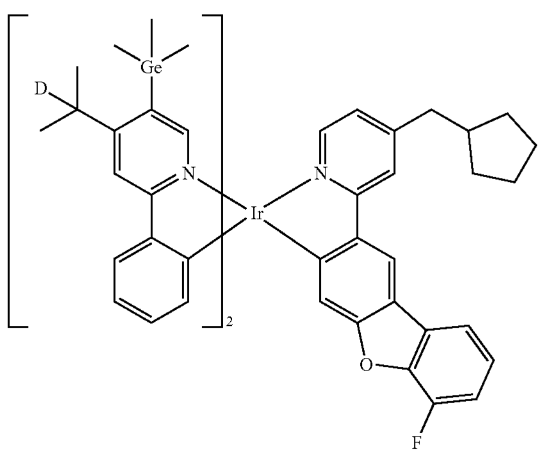
961
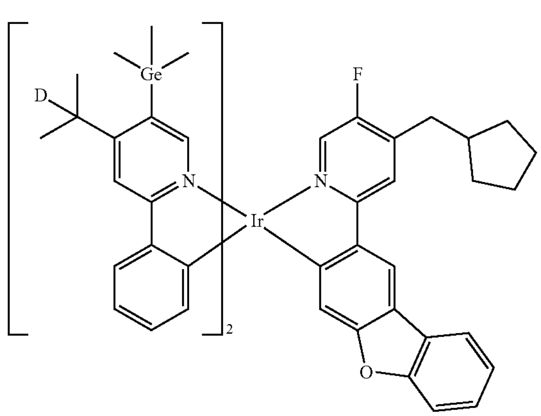
962
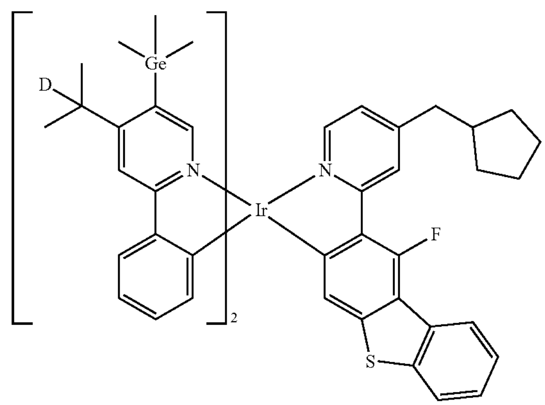
963
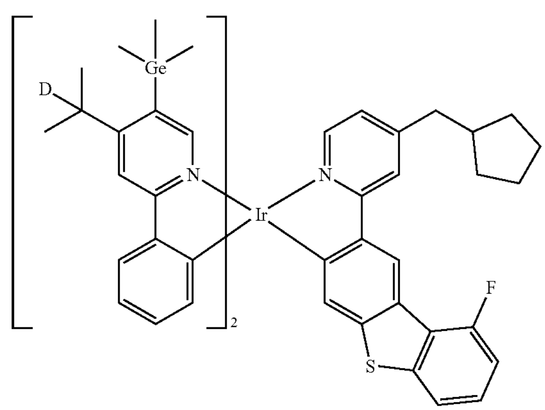
964
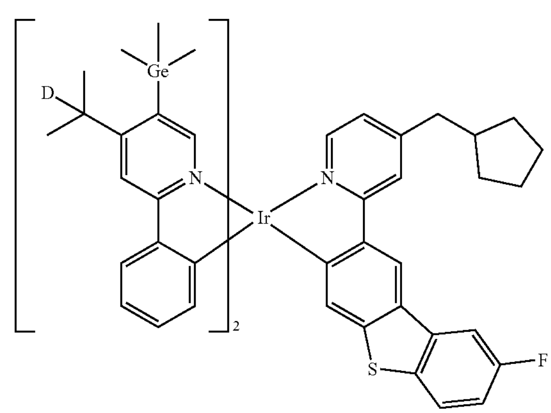

965
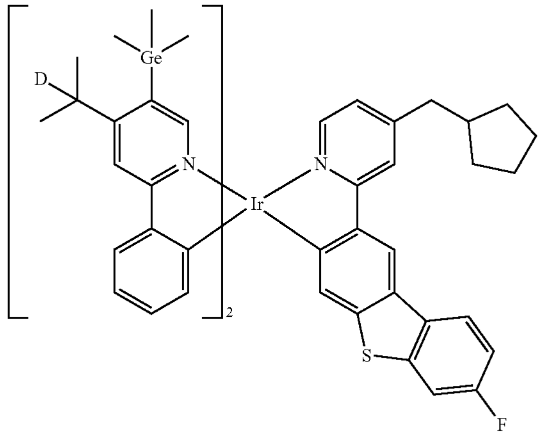
966
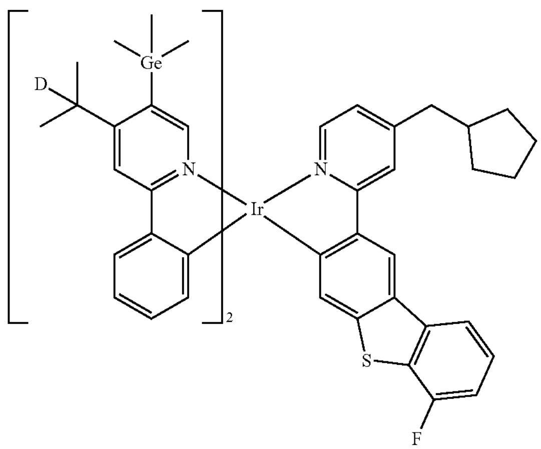
967
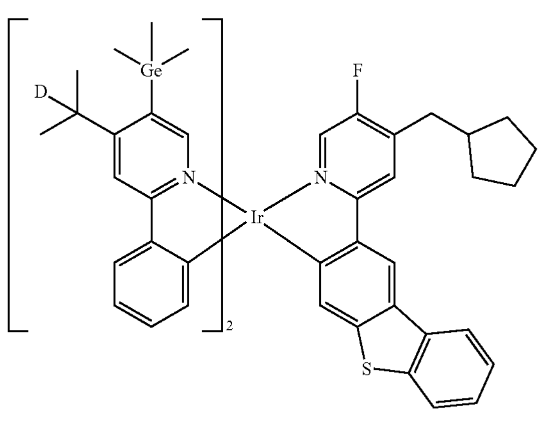
968
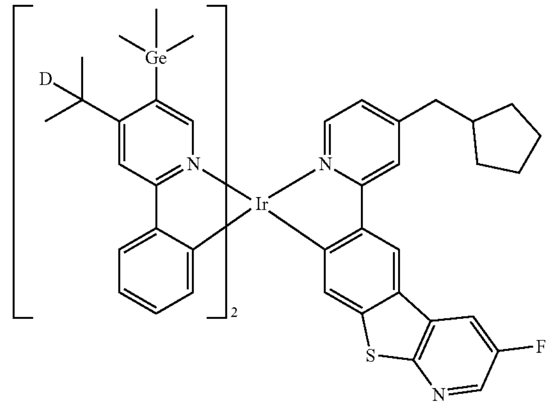
969
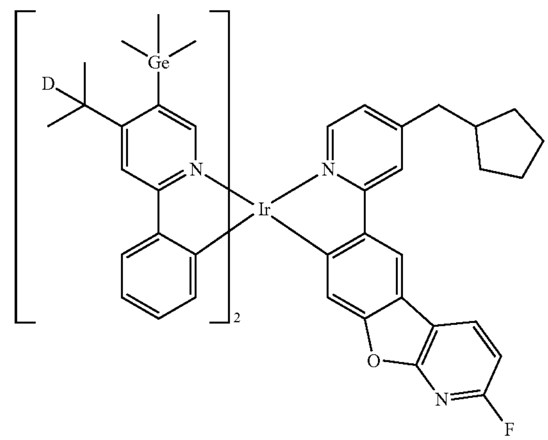
970
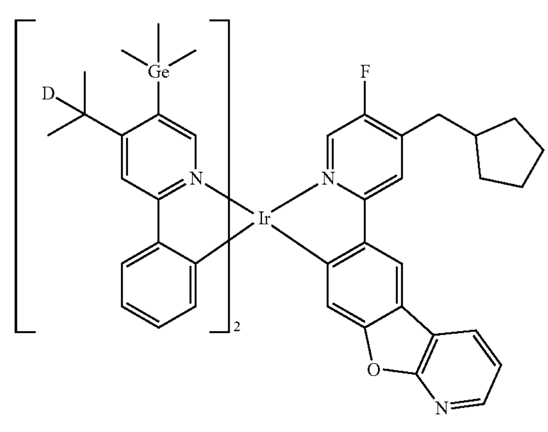

-continued
971
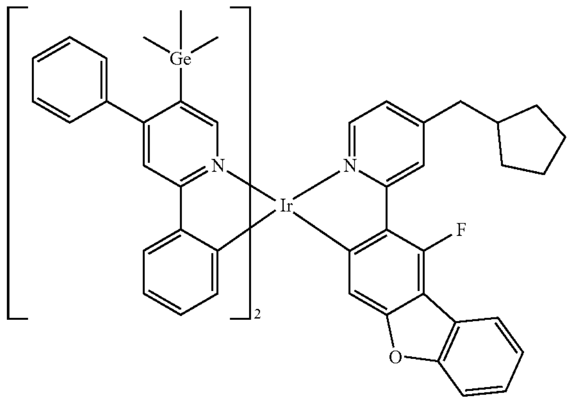
972
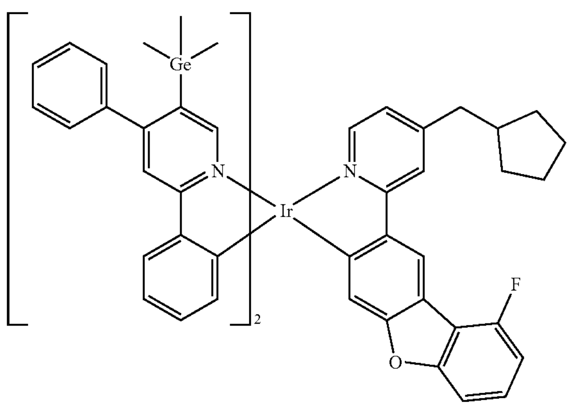
973
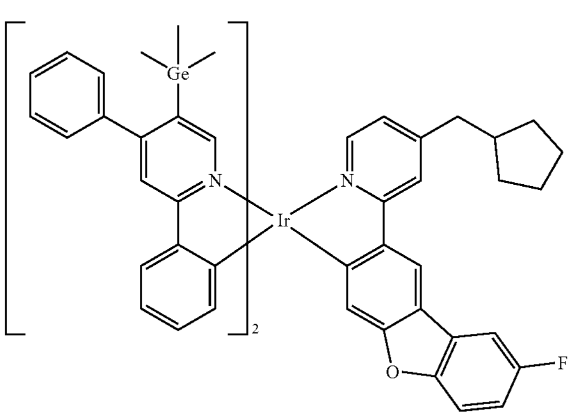
-continued
974
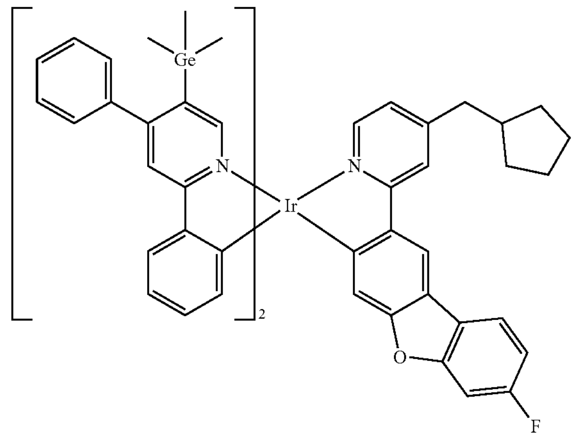
975
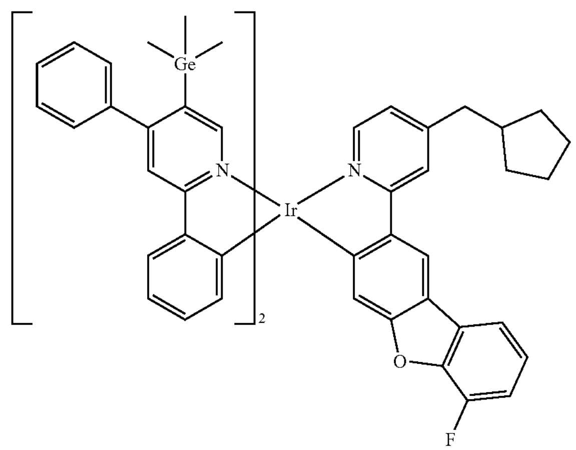
976
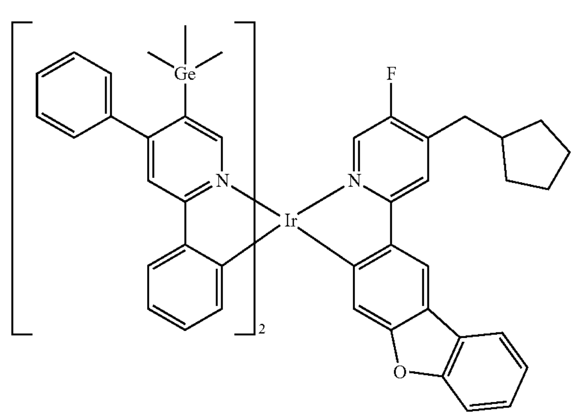

-continued
977
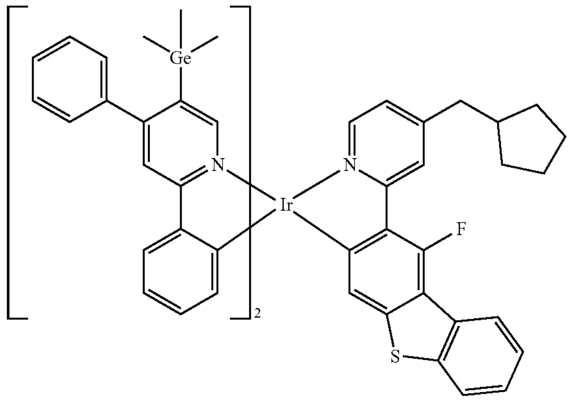
978
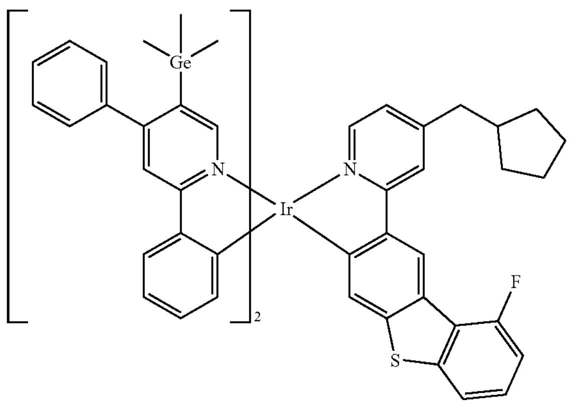
979
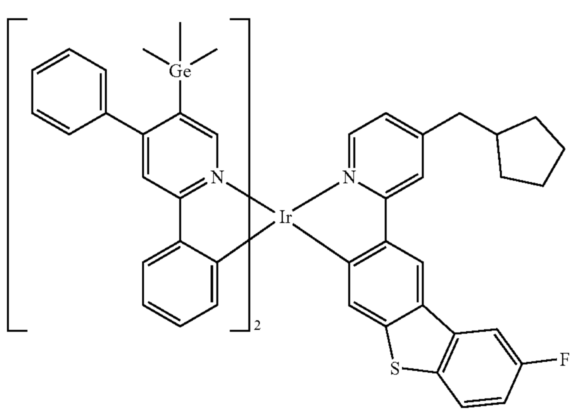
-continued
980
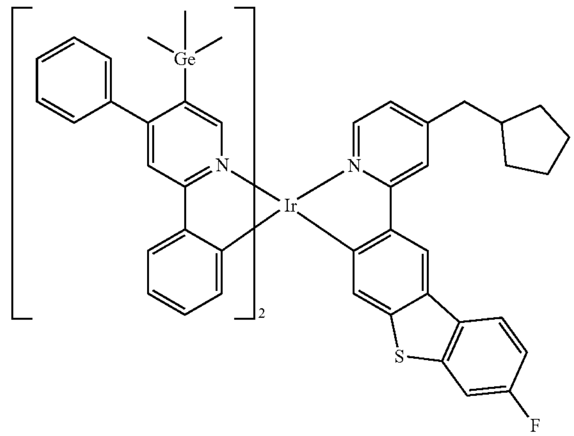
981
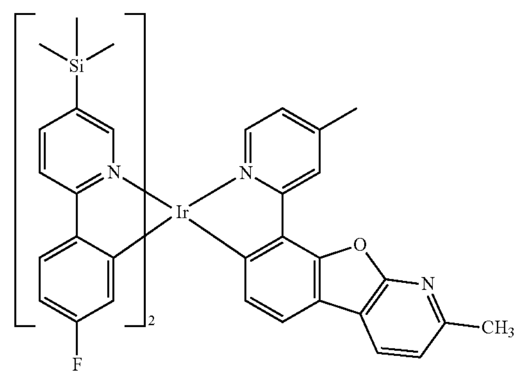
982
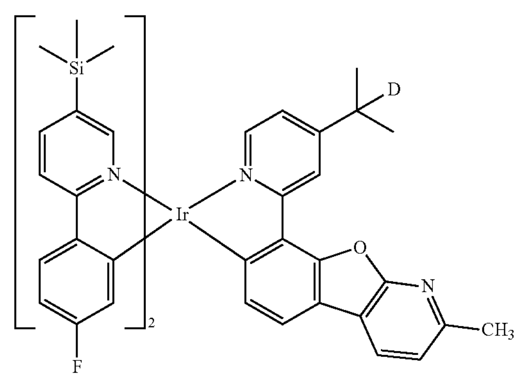
983
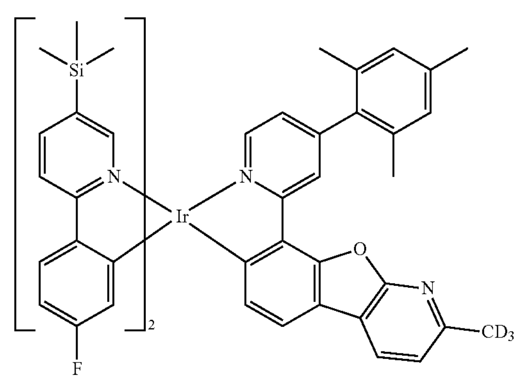

-continued
984
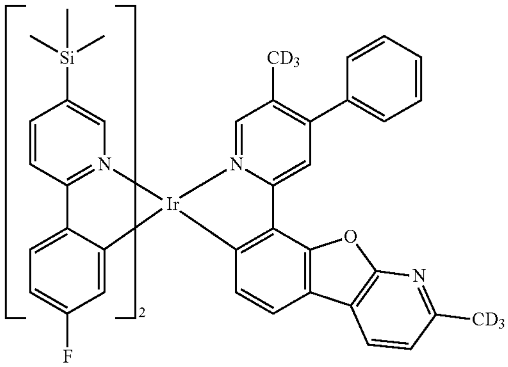
985
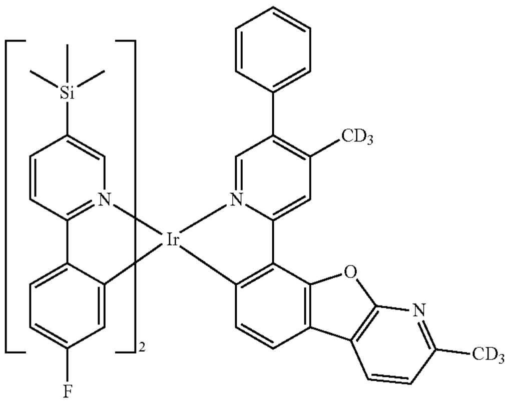
986
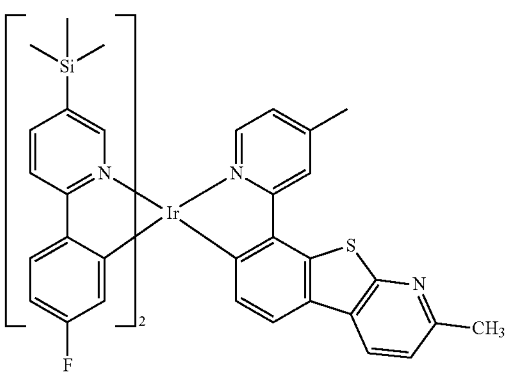
987
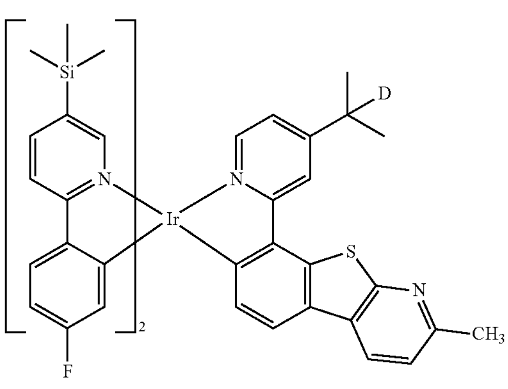
-continued
988
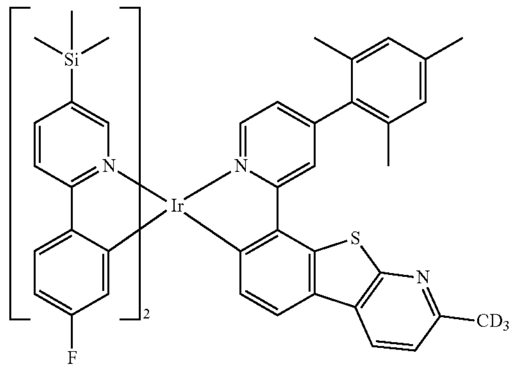
989
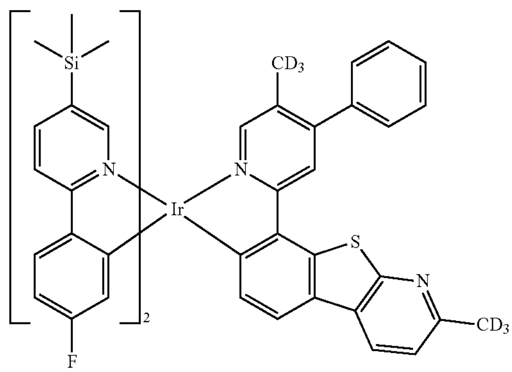
990
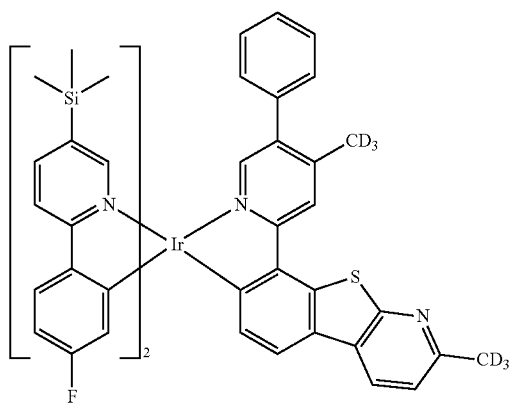
991
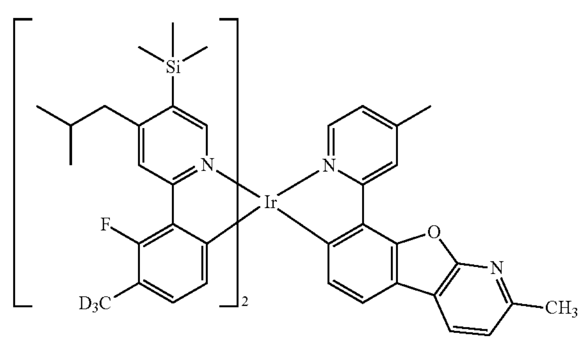

-continued
992
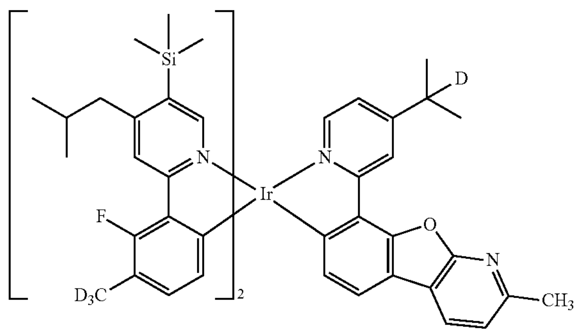
993
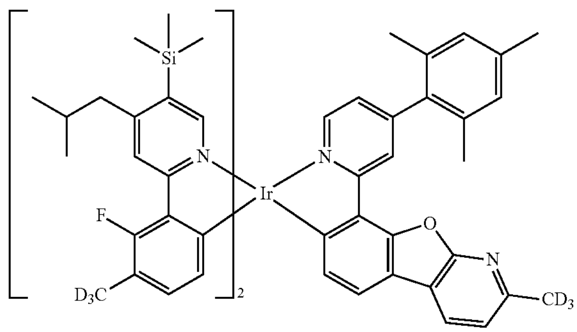
994
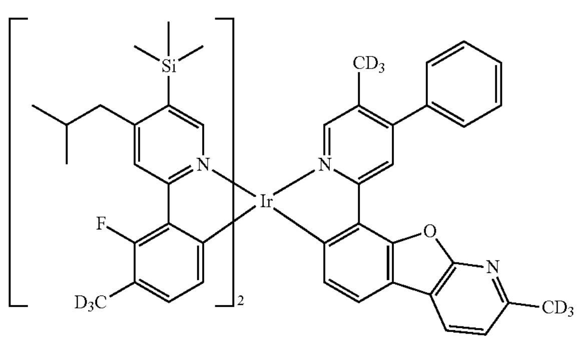
995
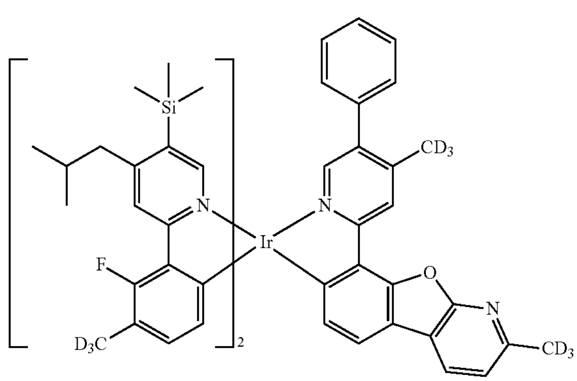
-continued
996
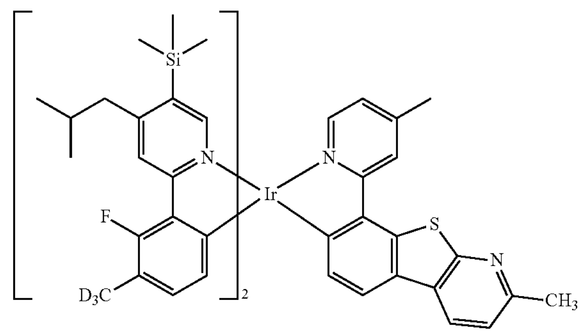
997
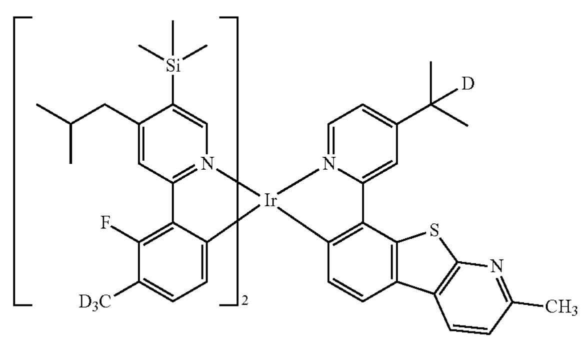
998
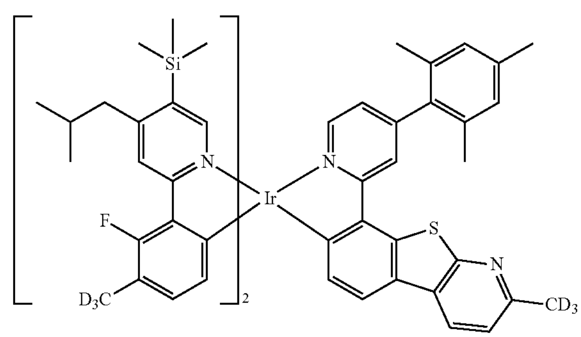
999
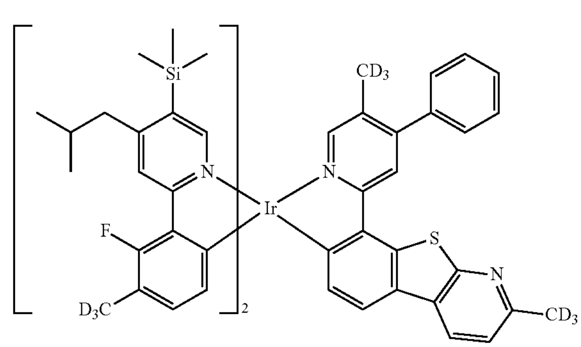

-continued
1000
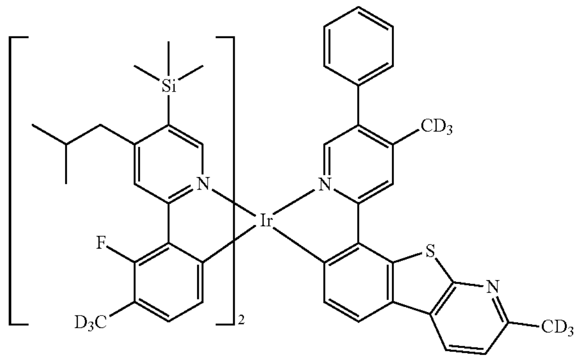
1001
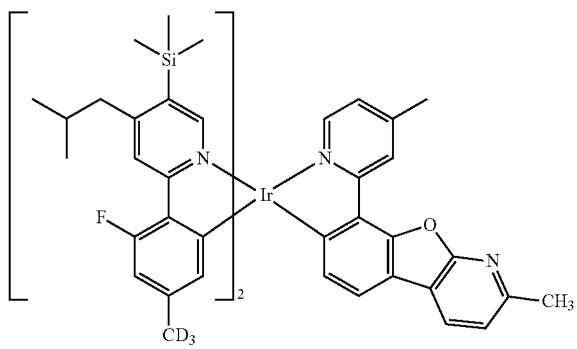
1002
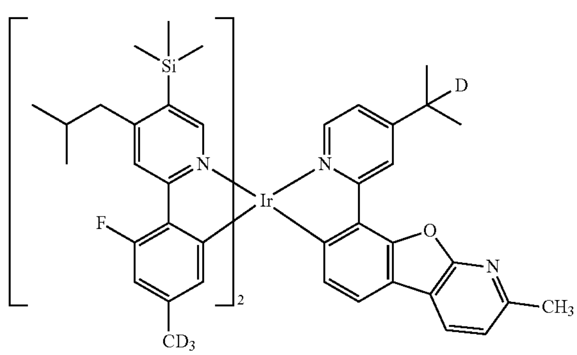
1003
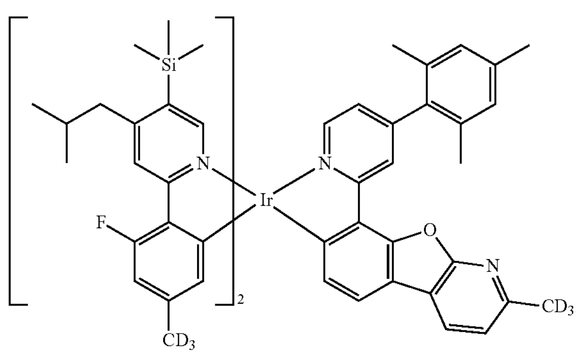
-continued
1004
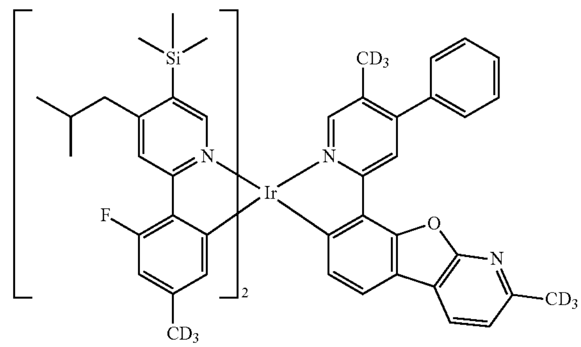
1005
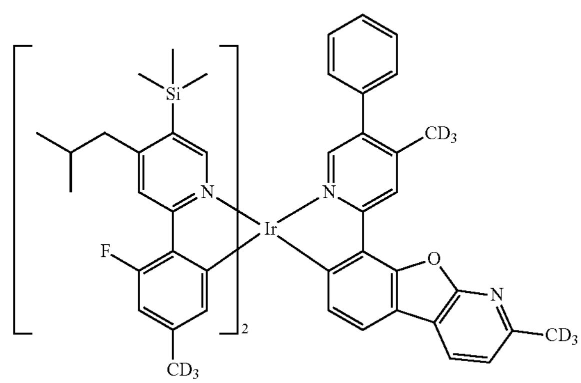
1006
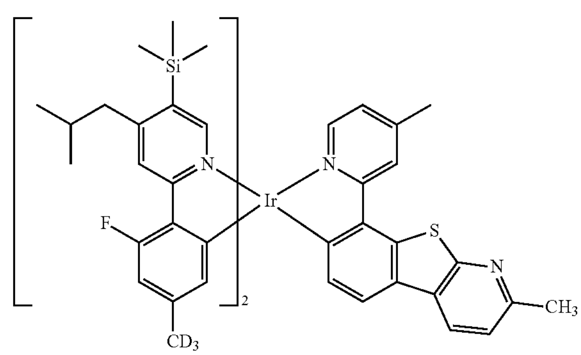
1007
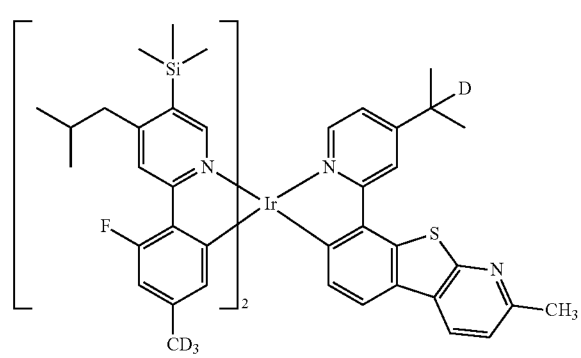

-continued
1008
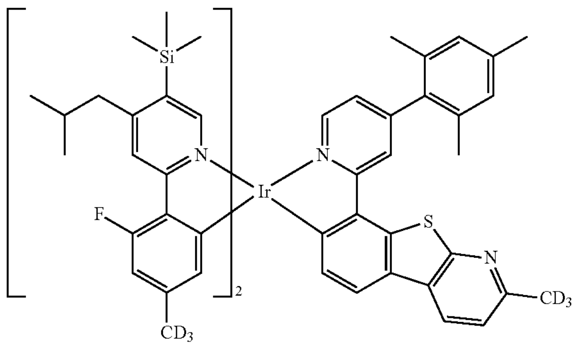
1009
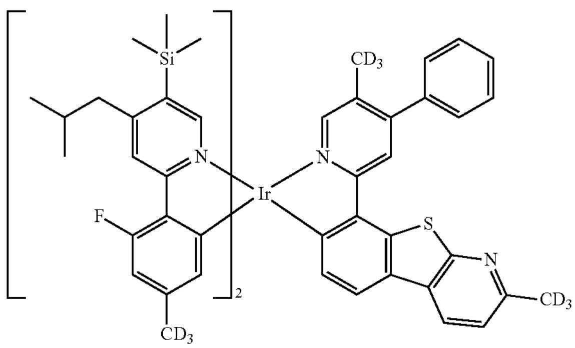
1010
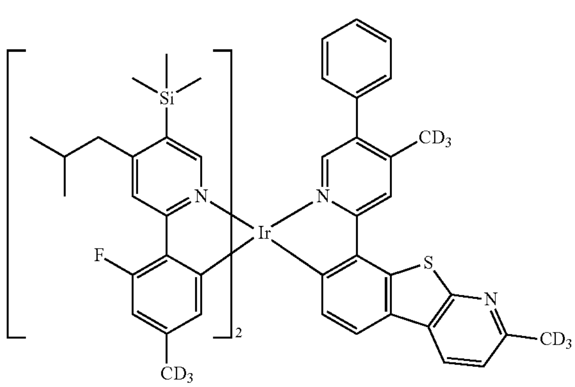
1011
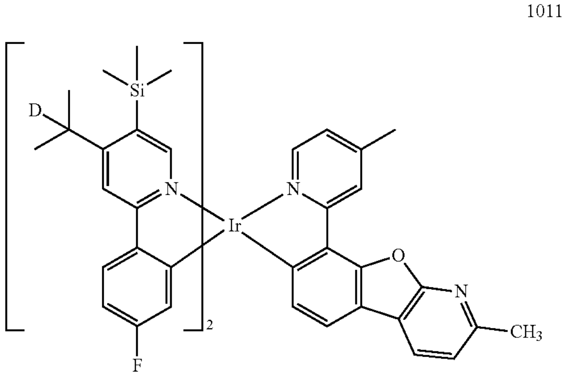
-continued
1012
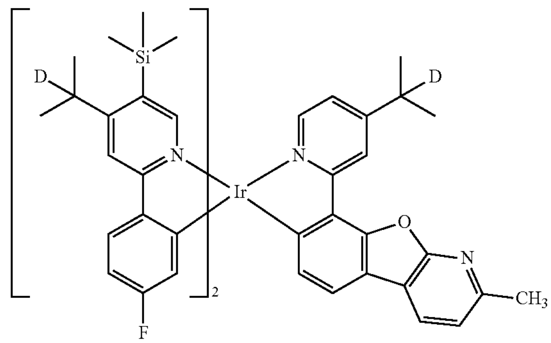
1013
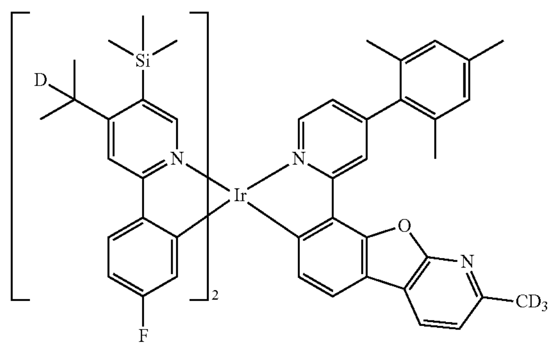
1014
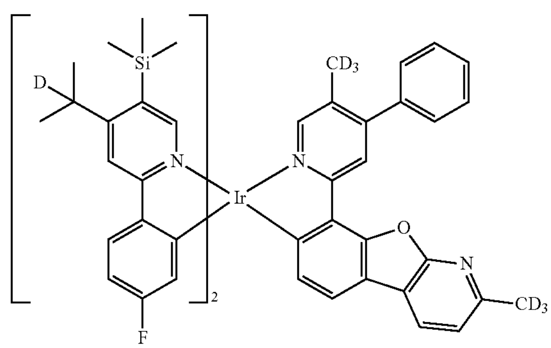
1015
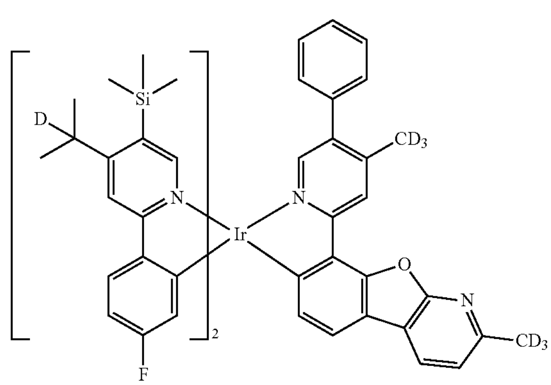

-continued
1016
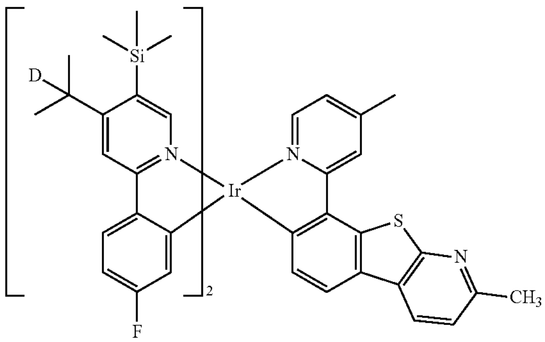
1017
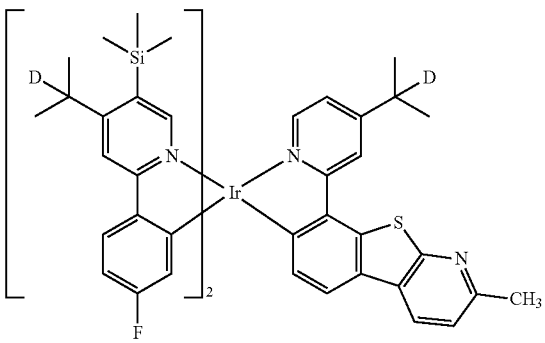
1018
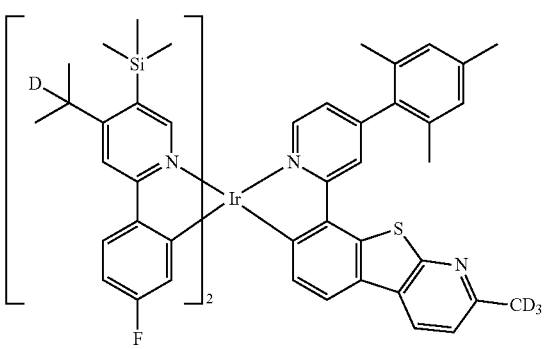
1019
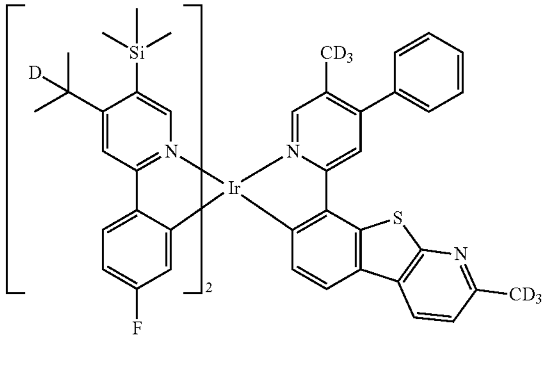
-continued
1020
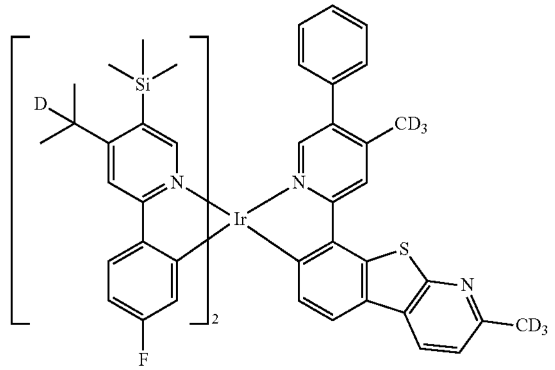
1021
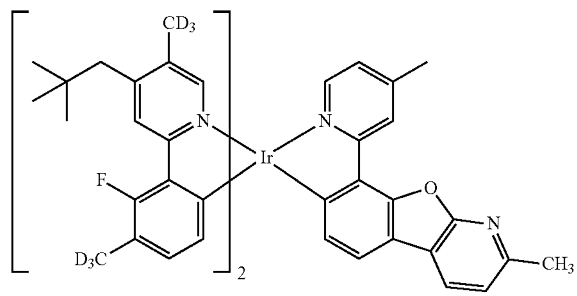
1022
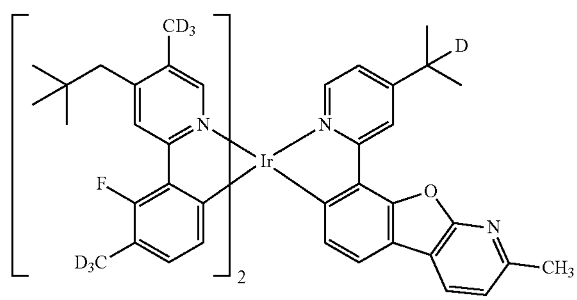
1023
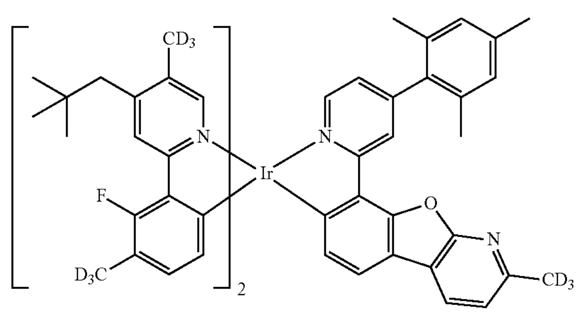

-continued
1024
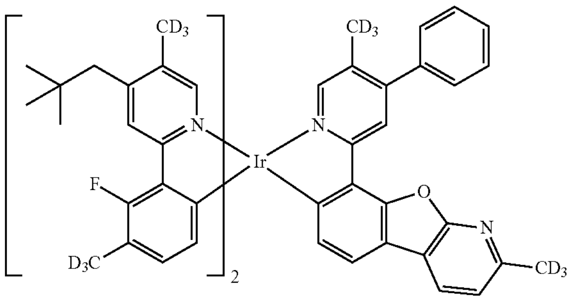
1025
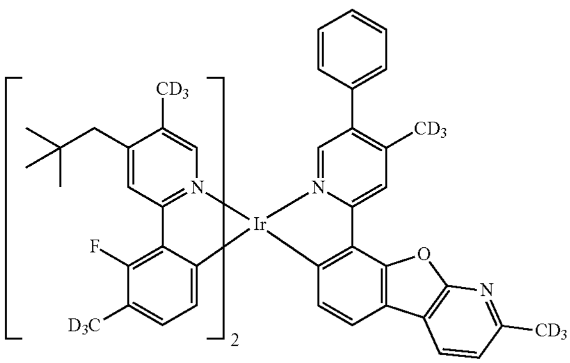
1026
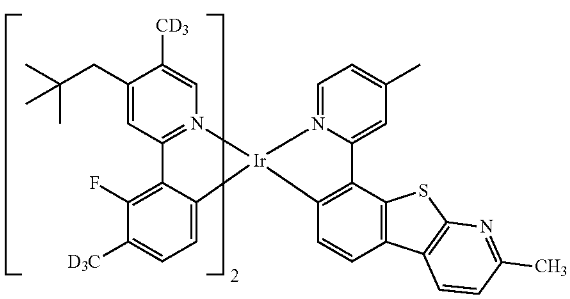
1027
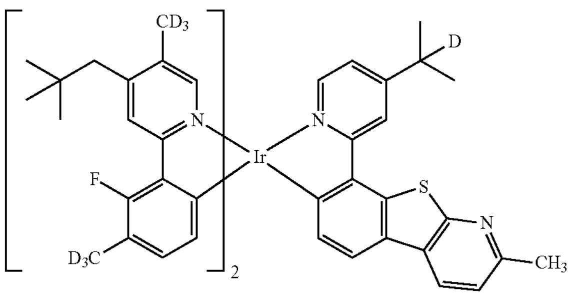
-continued
1028
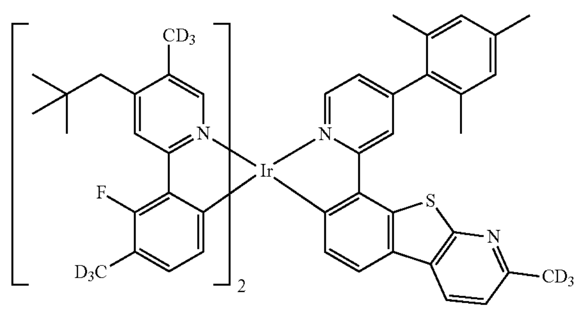
1029
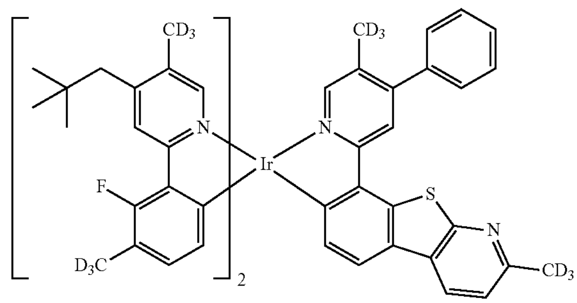
1030
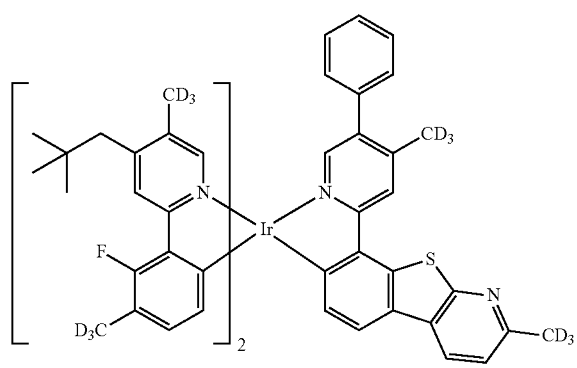
1031
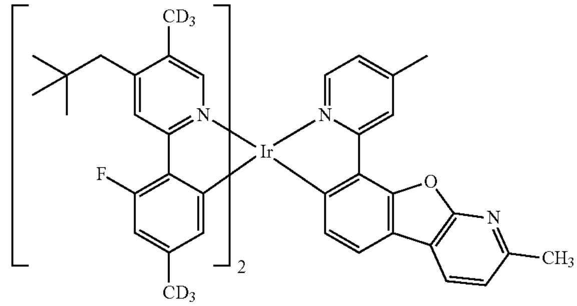

-continued
1032
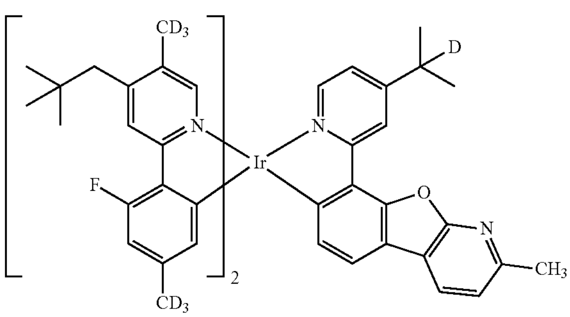
1033
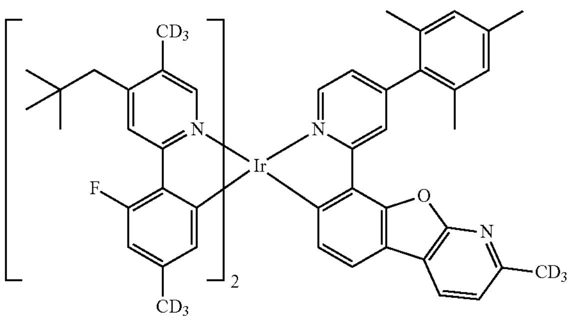
1034
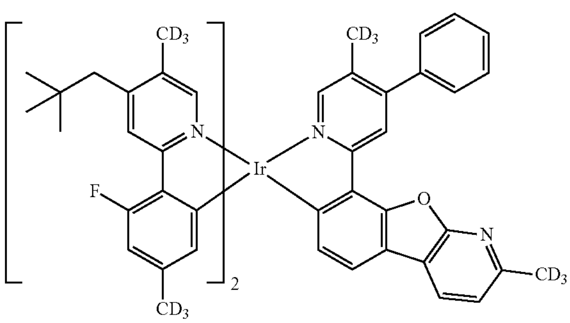
1035
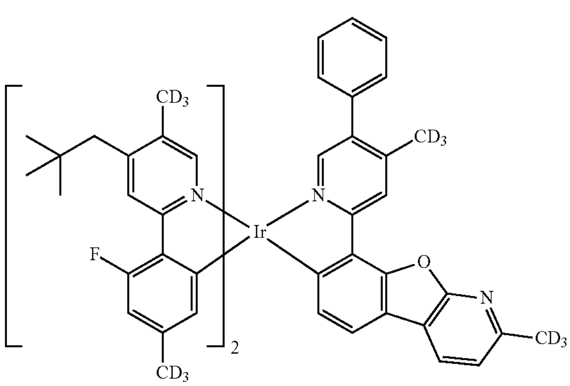
-continued
1036
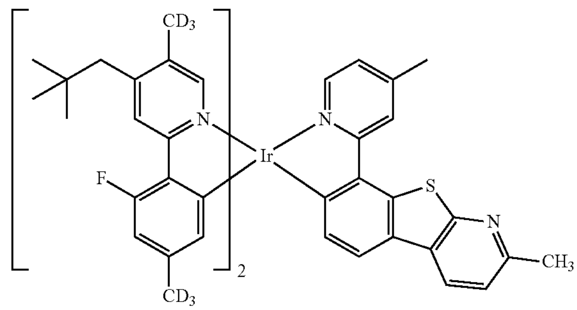
1037
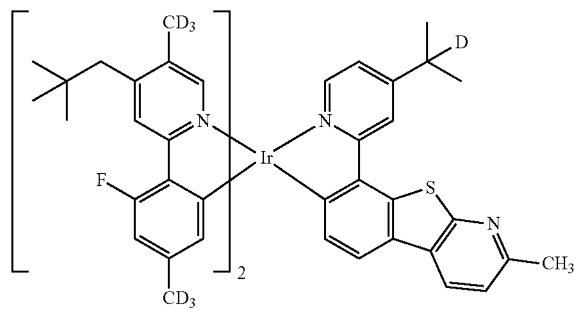
1038
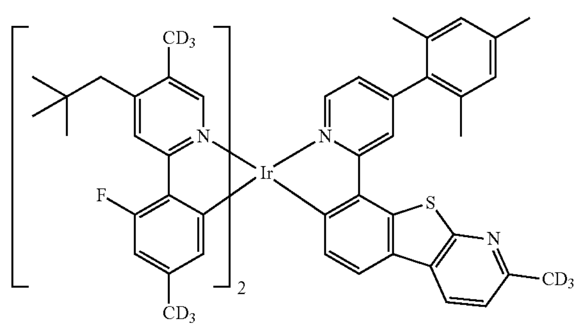
1039
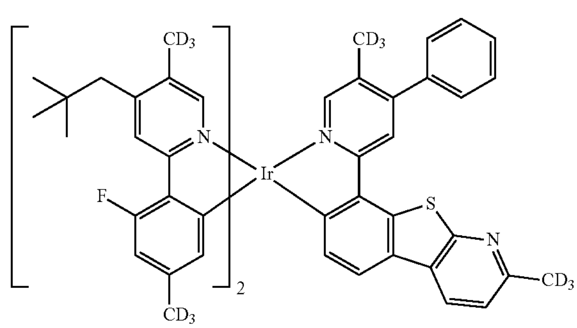

-continued
1040
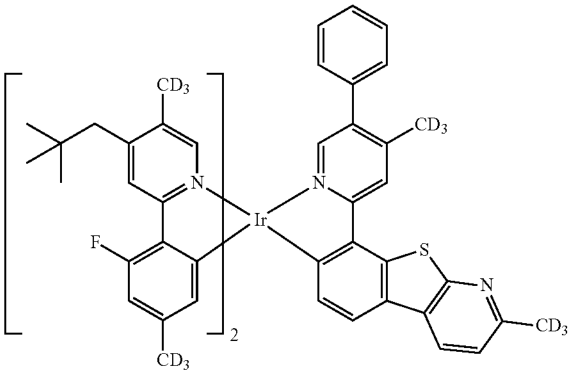
1041
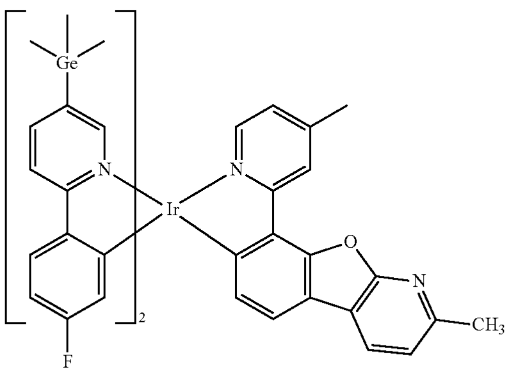
1042
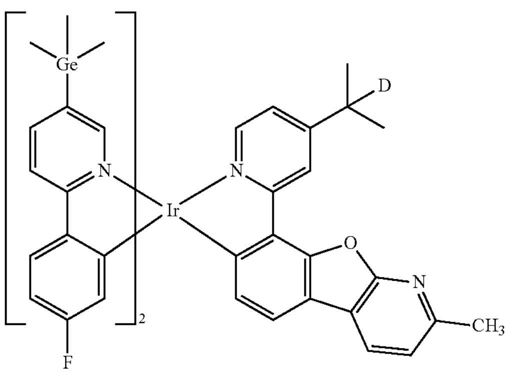
1043
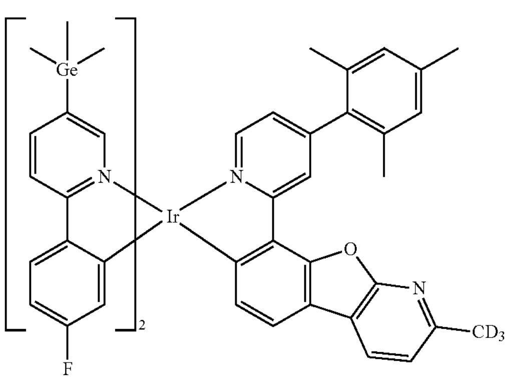
-continued
1044
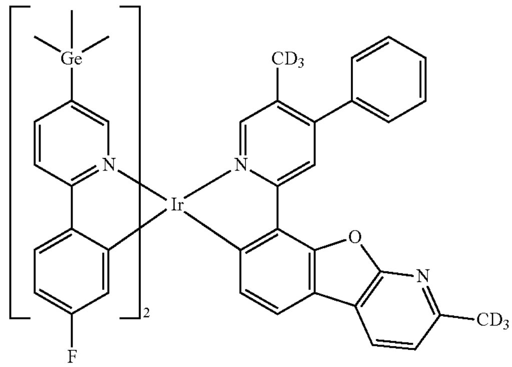
1045
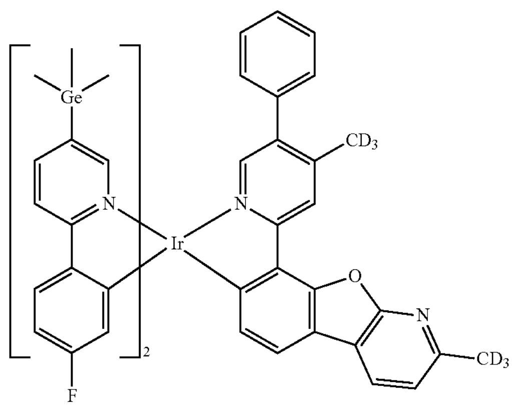
1046
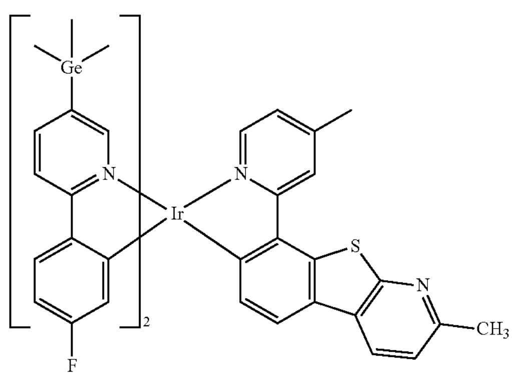
1047
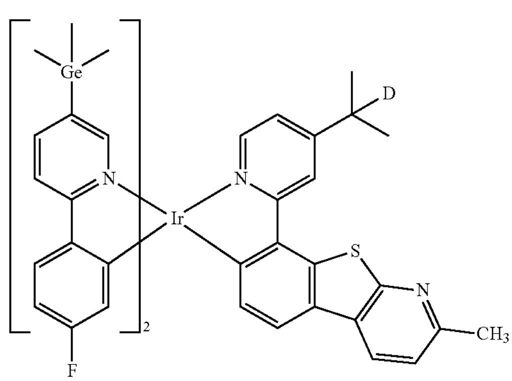

-continued
1048
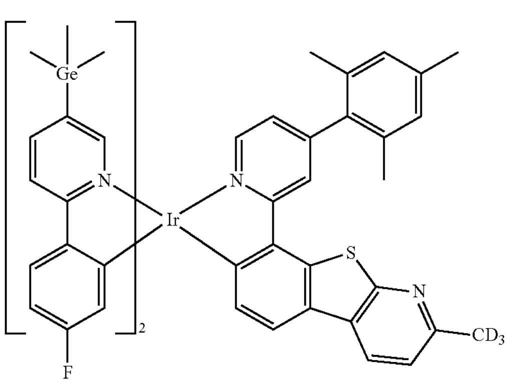
1049
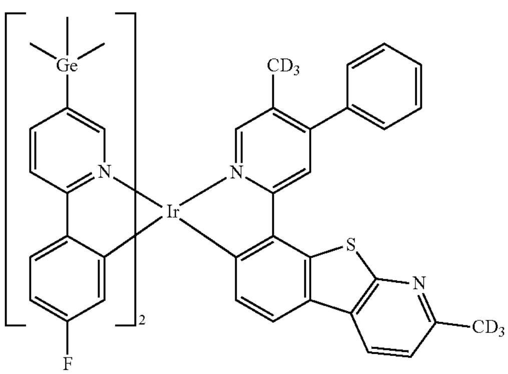
1050
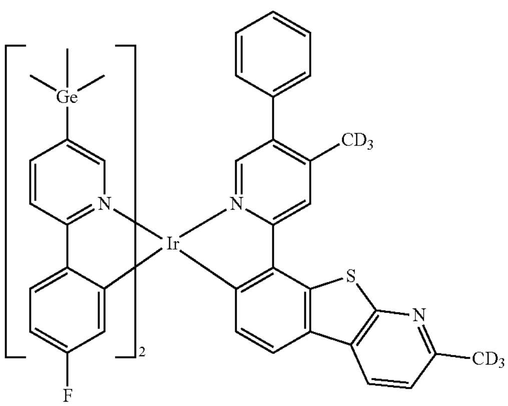
1051
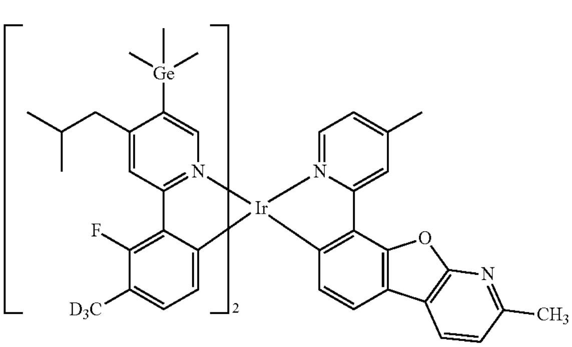
-continued
1052
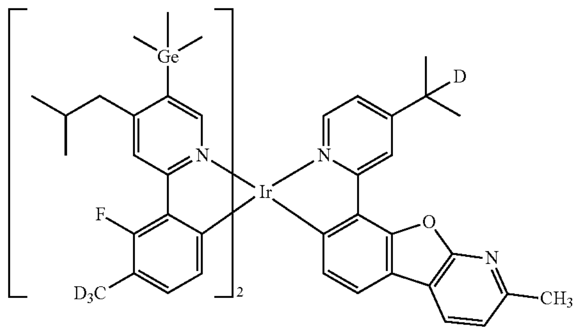
1053
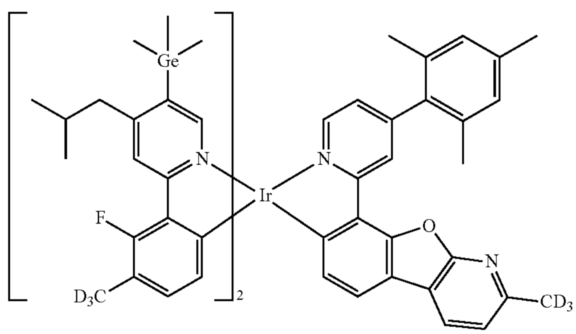
1054
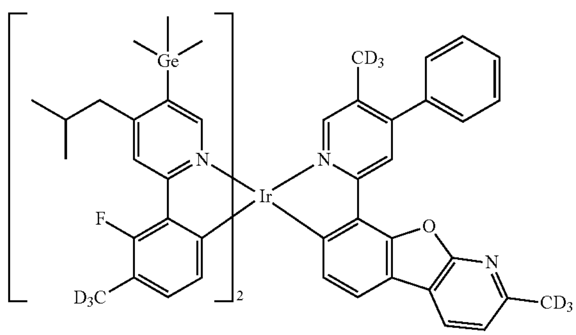
1055
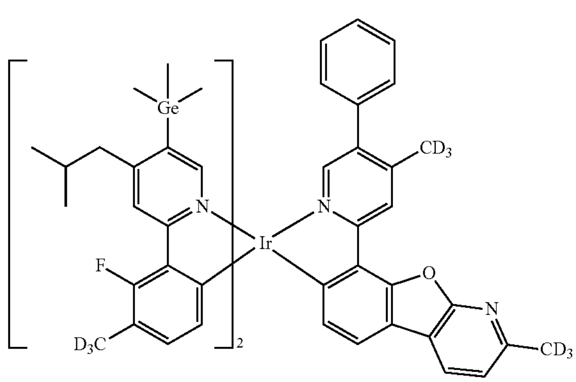

-continued
1056
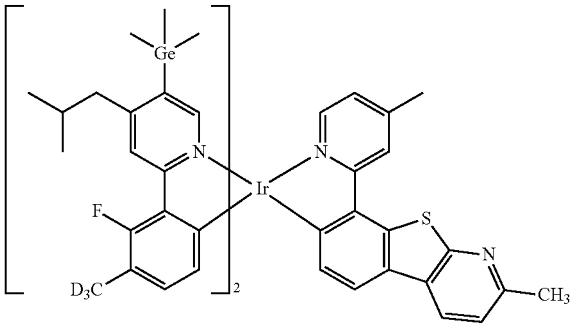
1057
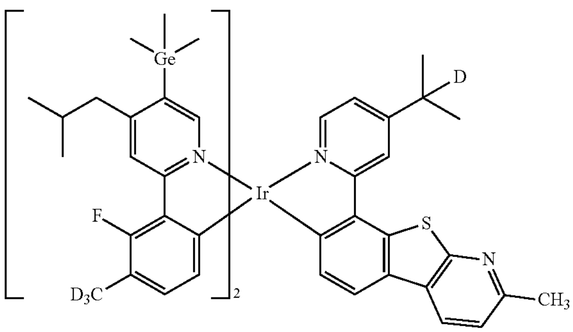
1058
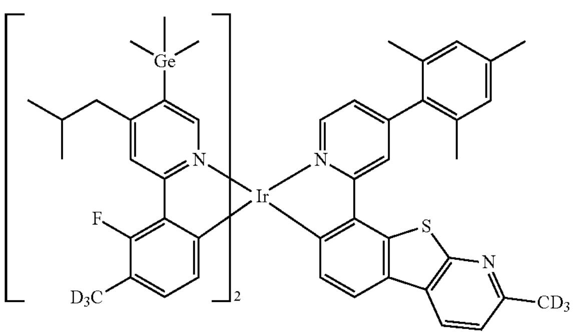
1059
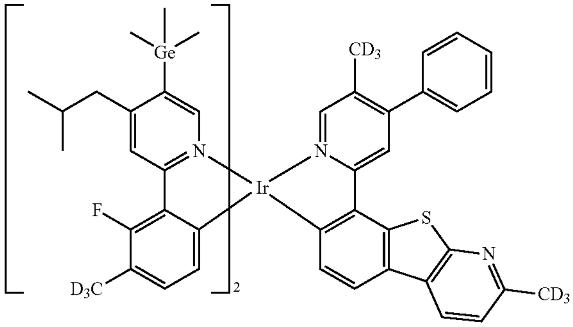
-continued
1060
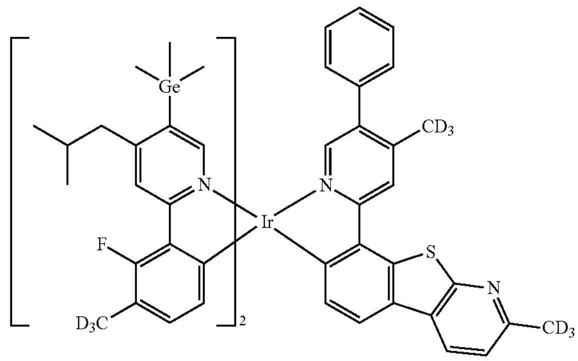
1061
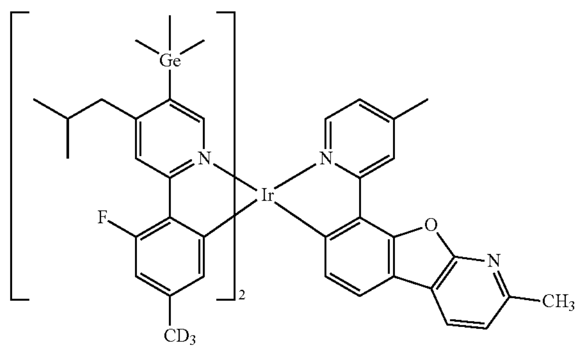
1062
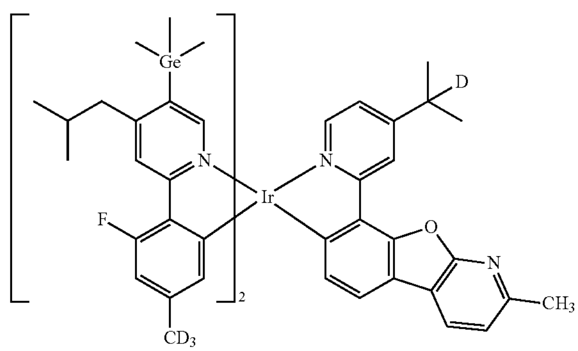
1063
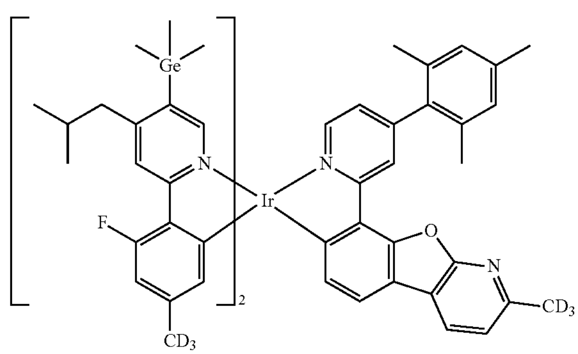

-continued
1064
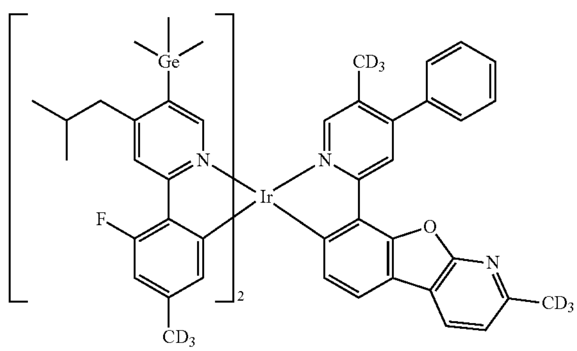
1065
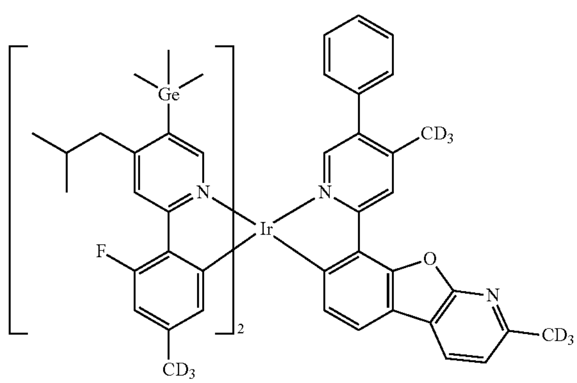
1066
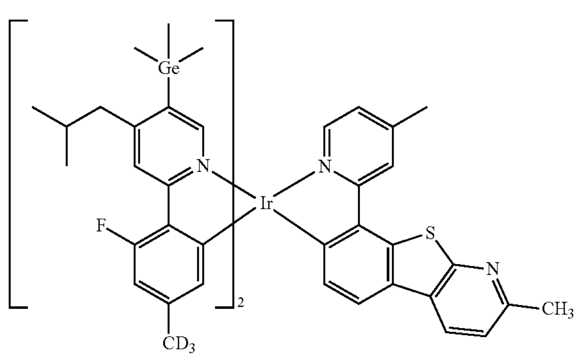
1067
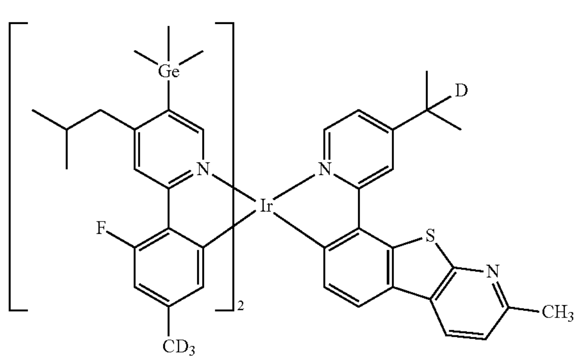
-continued
1068
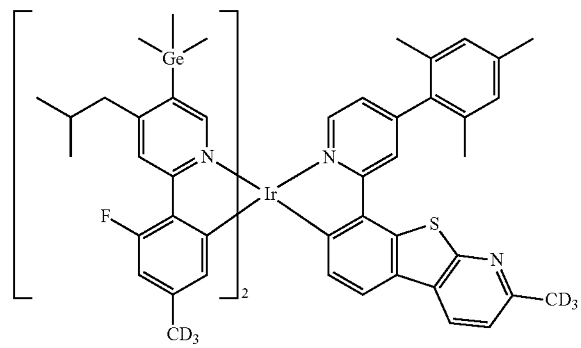
1069
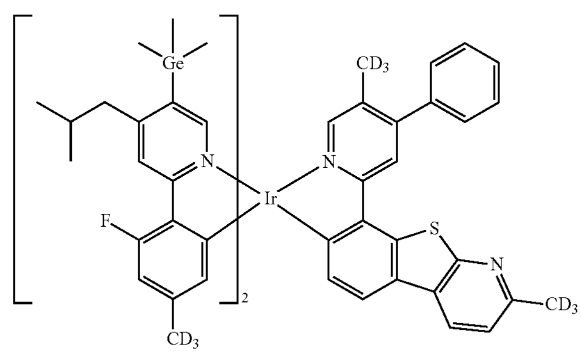
1070
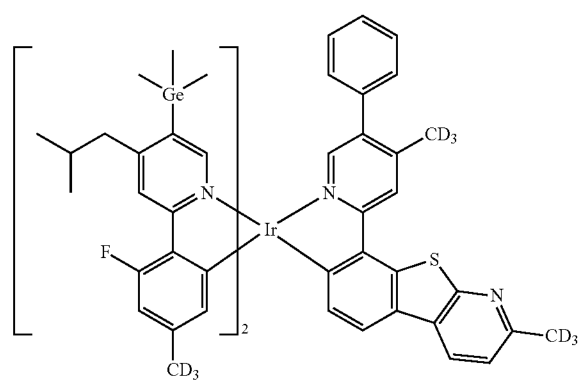
1071
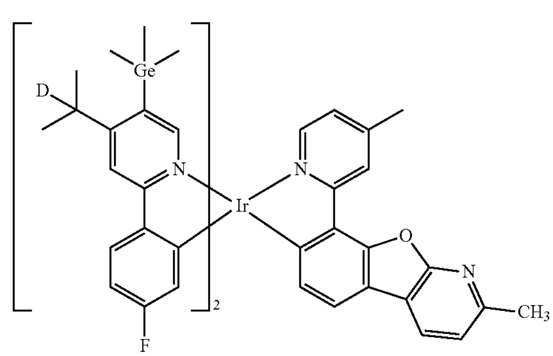

-continued
1072
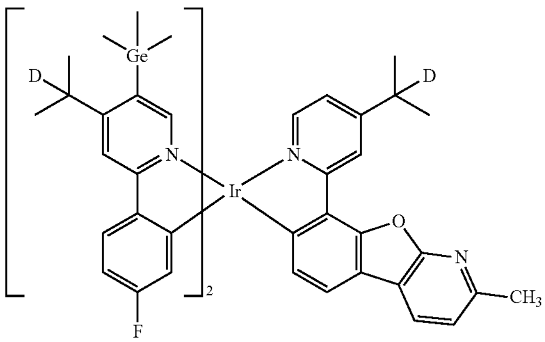
1073
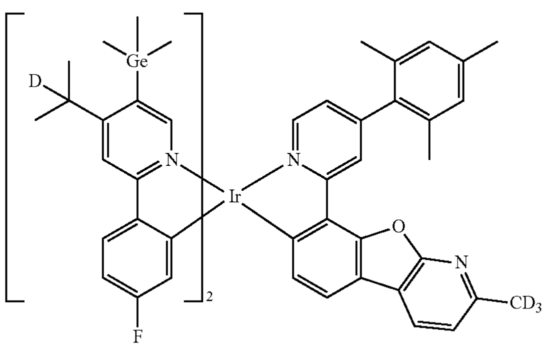
1074
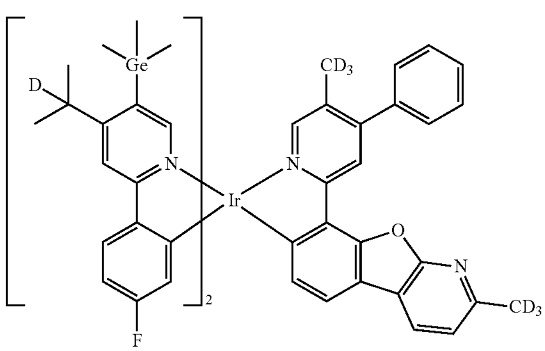
1075
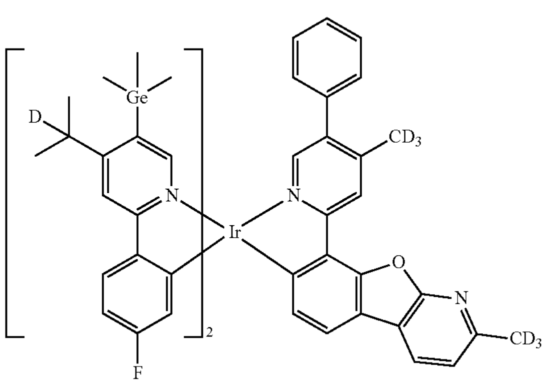
-continued
1076
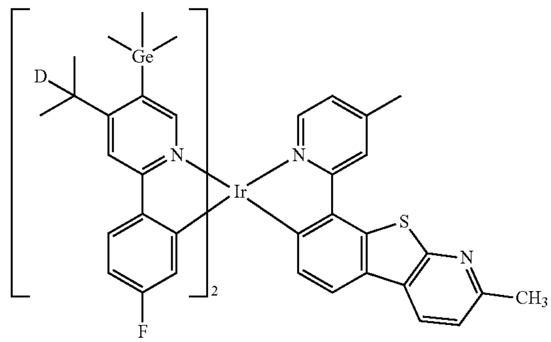
1077
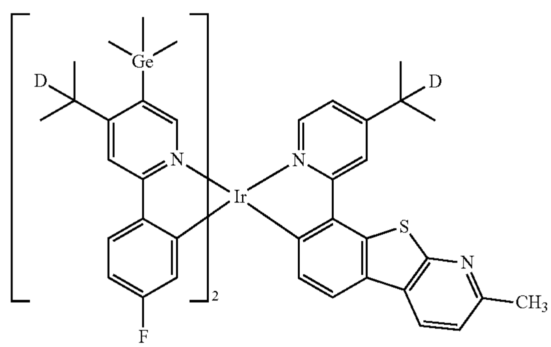
1078
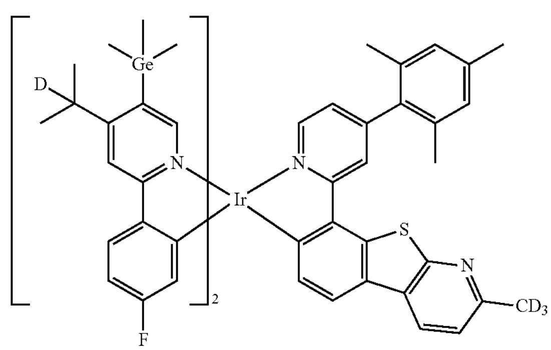
1079
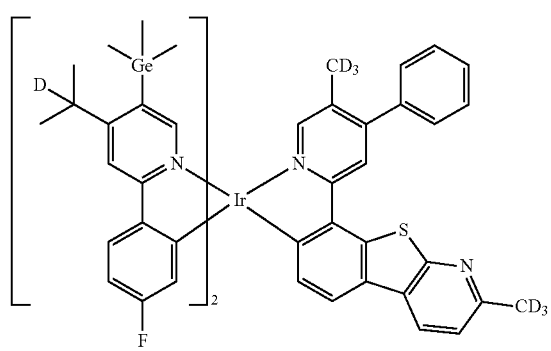

-continued
1080
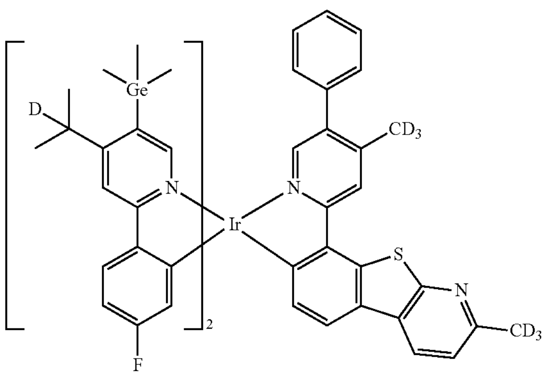
1081
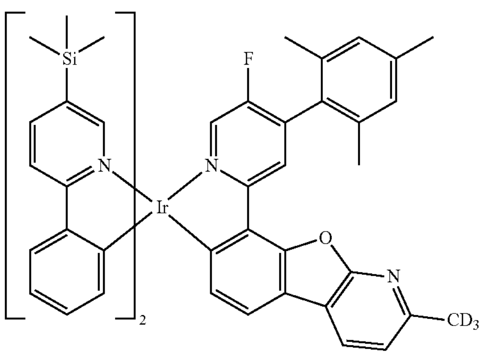
1082
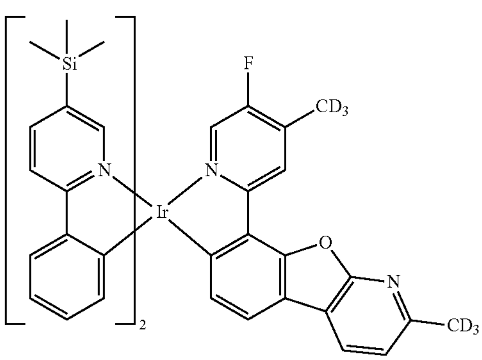
1083
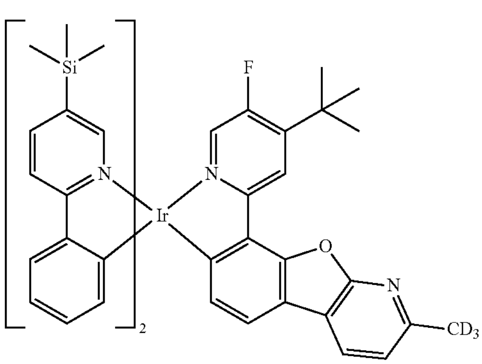
-continued
1084
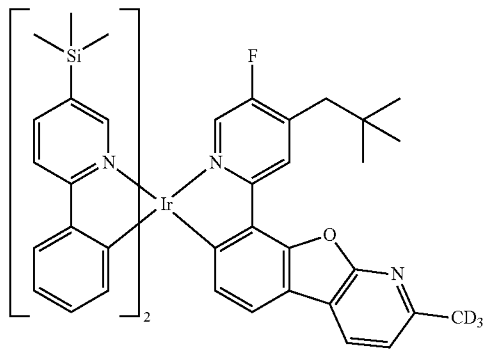
1085
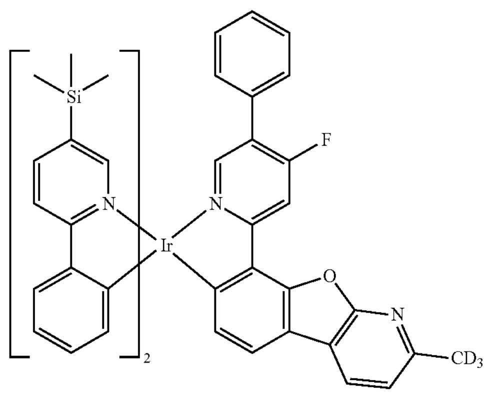
1086
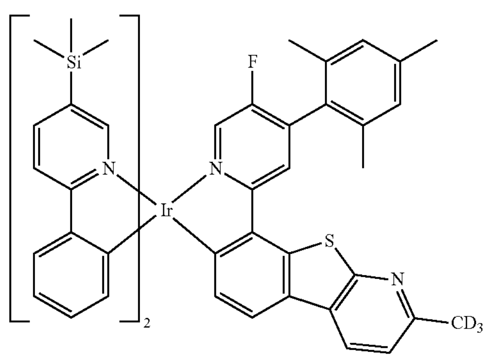
1087
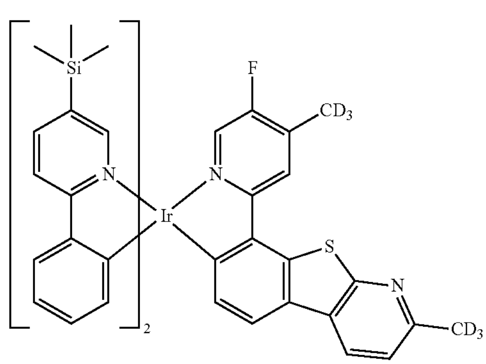

1088
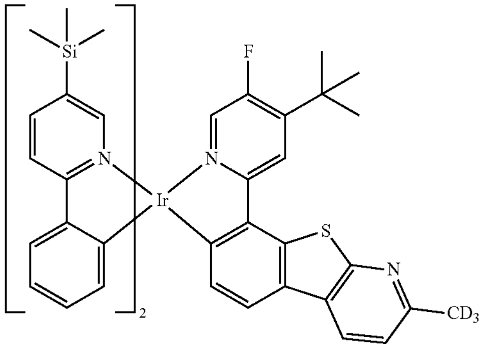
1089
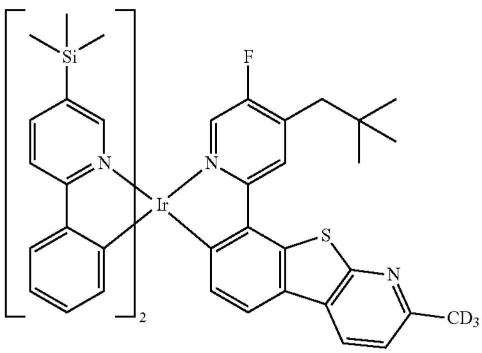
1090
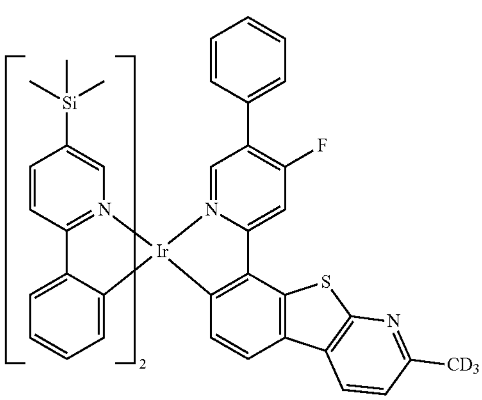
1091
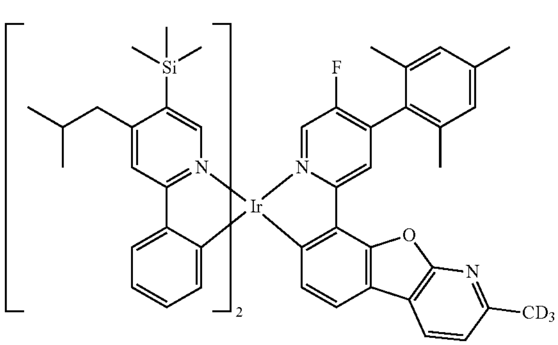
1092
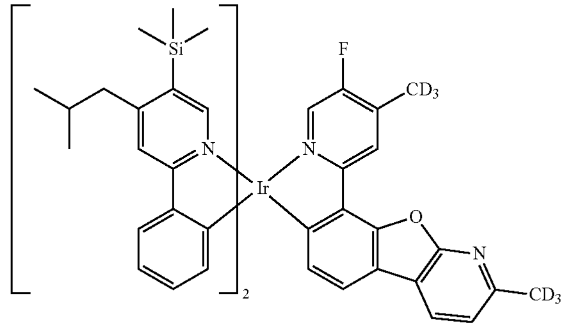
1093
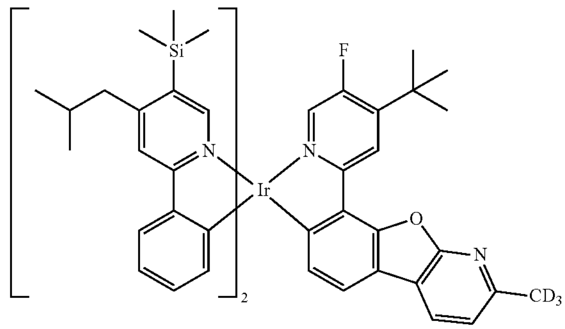
1094
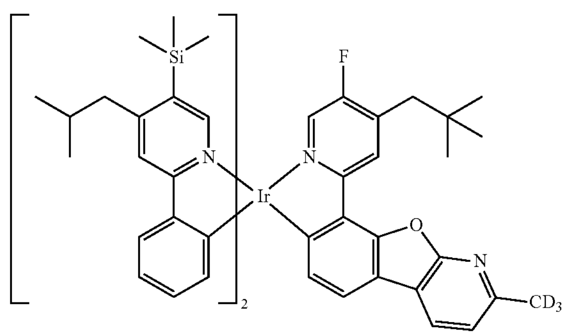
1095
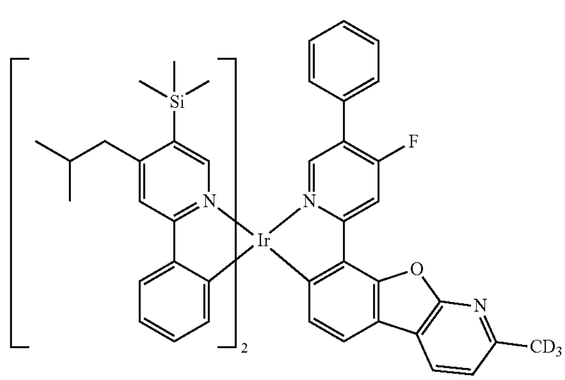

-continued
1096
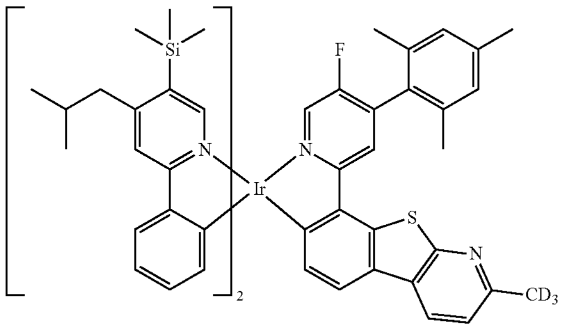
1097
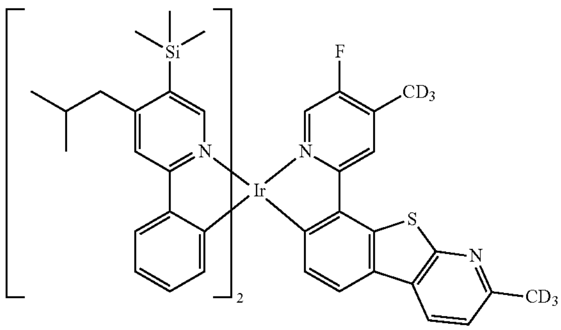
1098
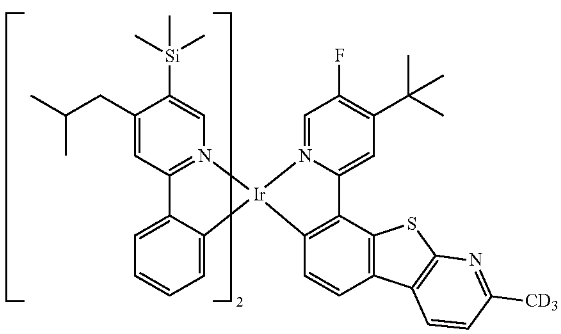
1099
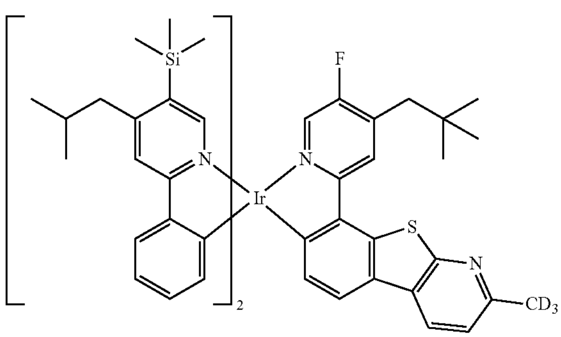
-continued
1100
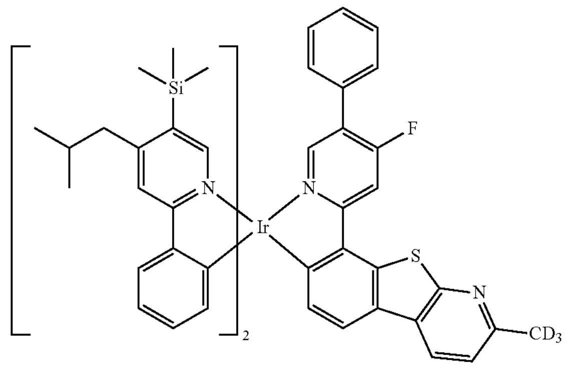
1101
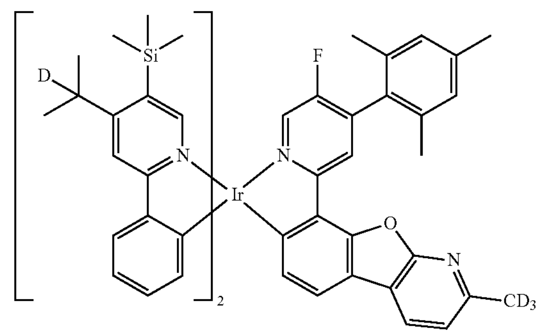
1102
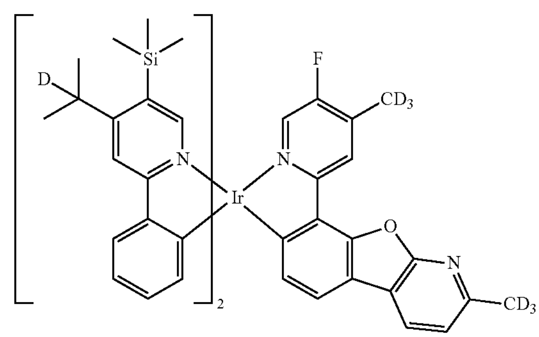
1103
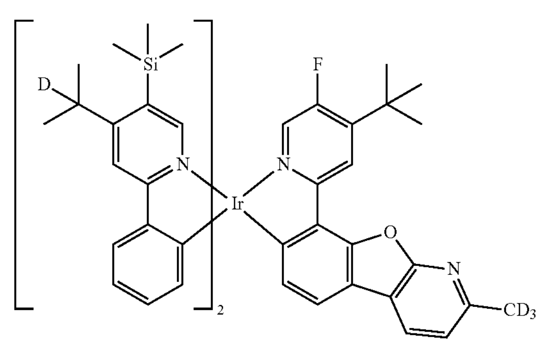

1104
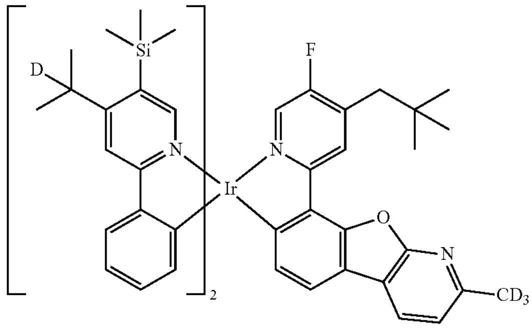
1105
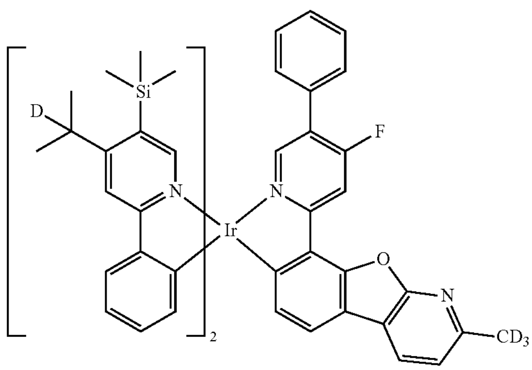
1106
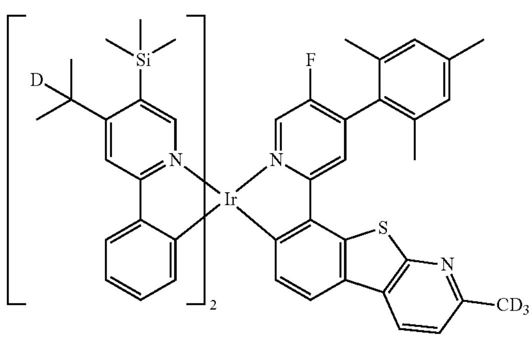
1107
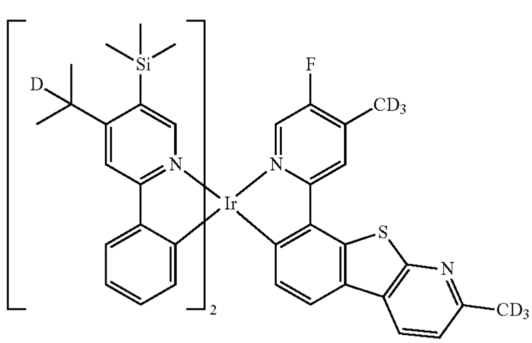
1108
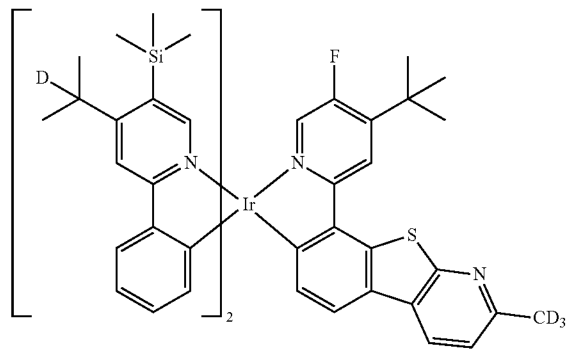
1109
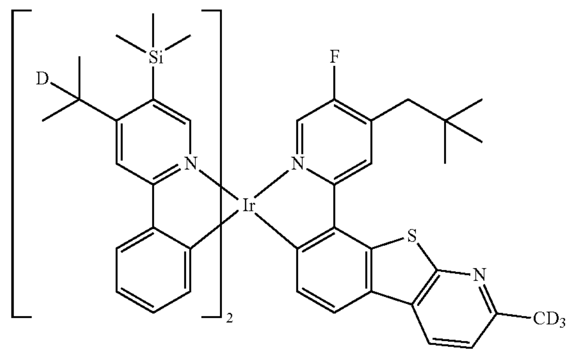
1110
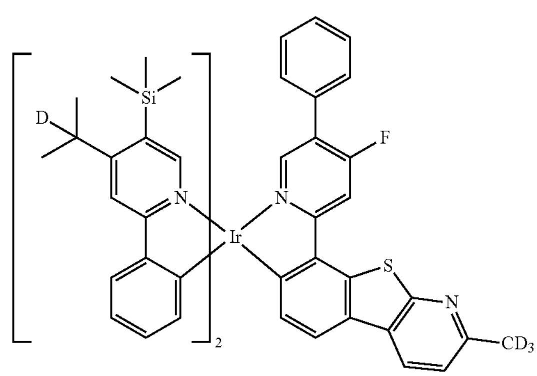
1111
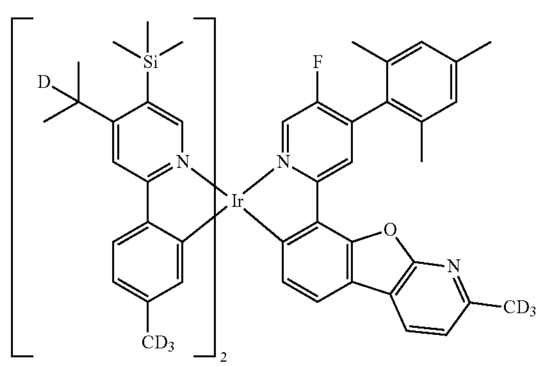

-continued
1112
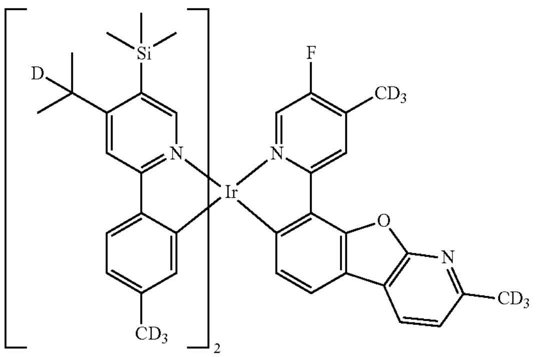
1113
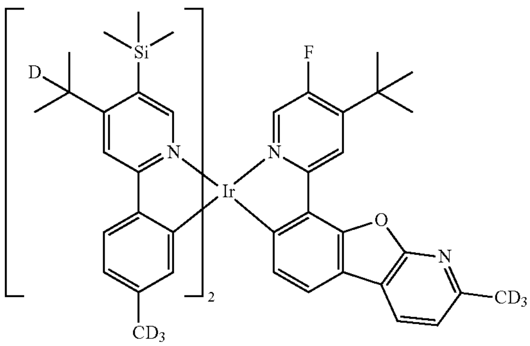
1114
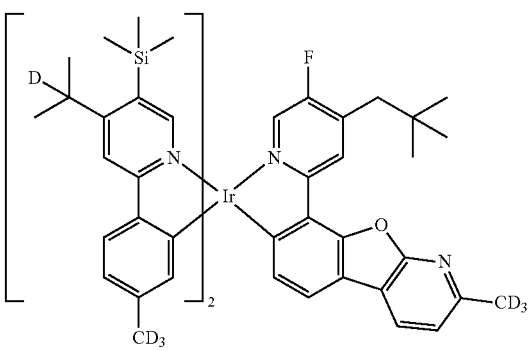
1115
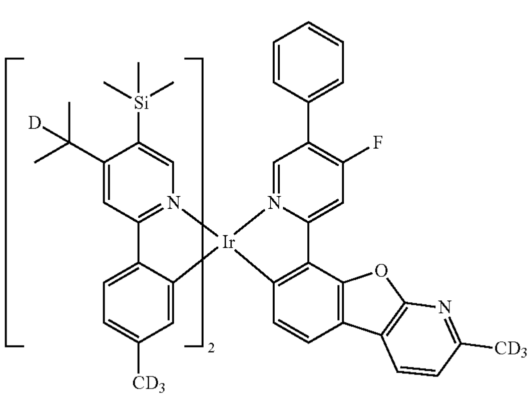
-continued
1116
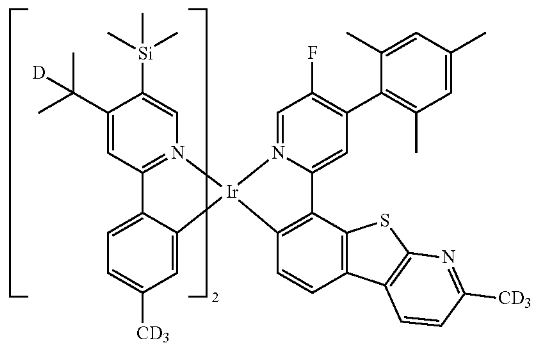
1117
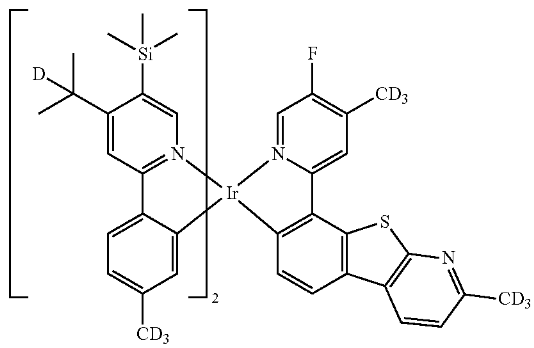
1118
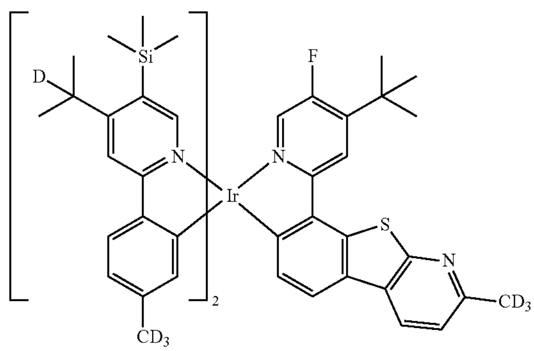
1119
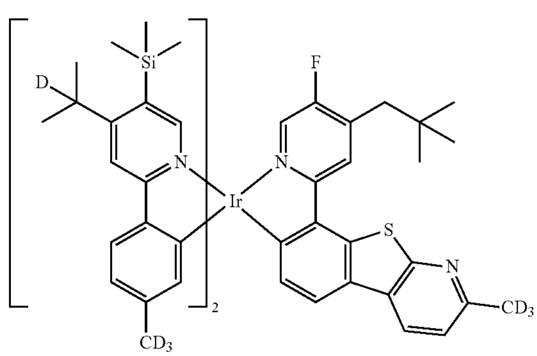

-continued
1120
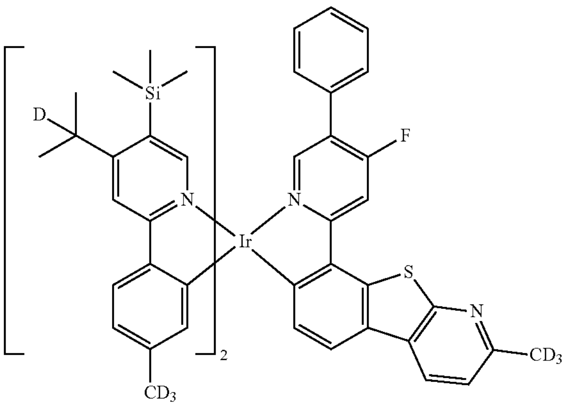
1121
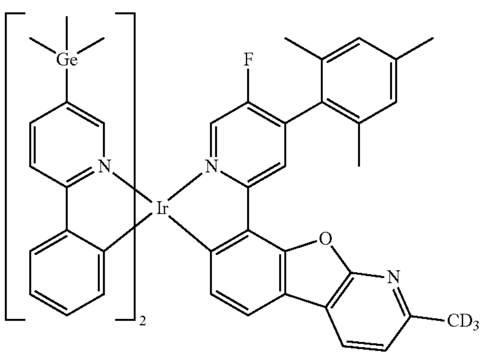
1122
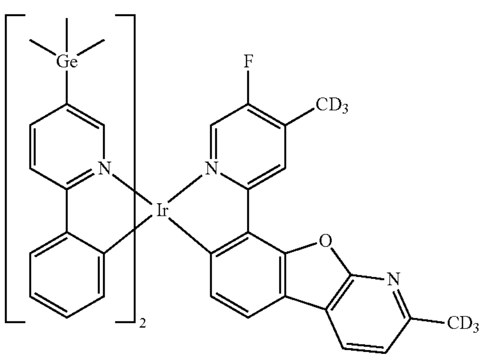
1123
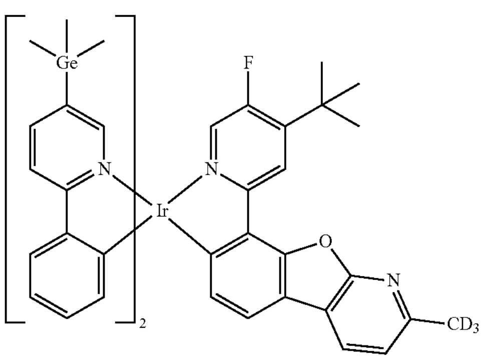
-continued
1124
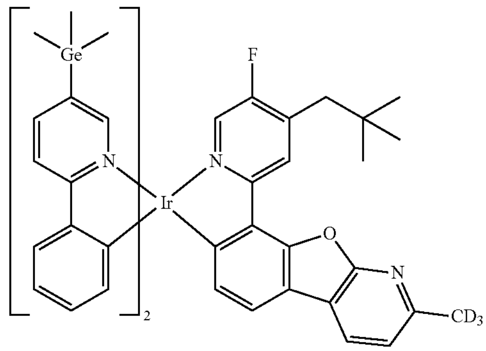
1125
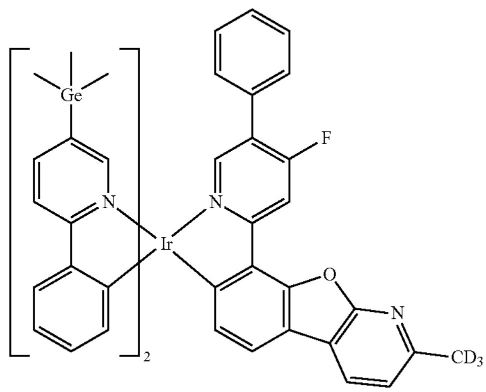
1126
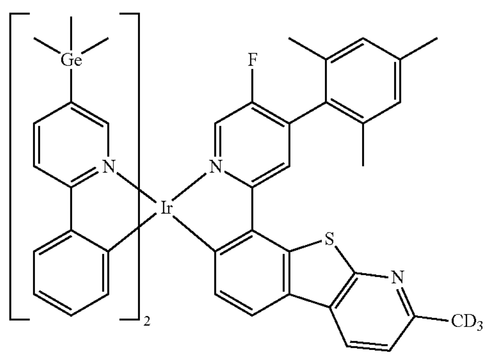
1127
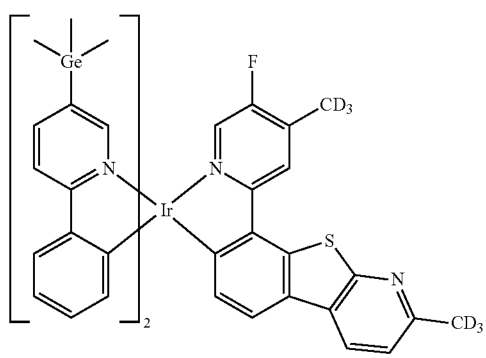

1128
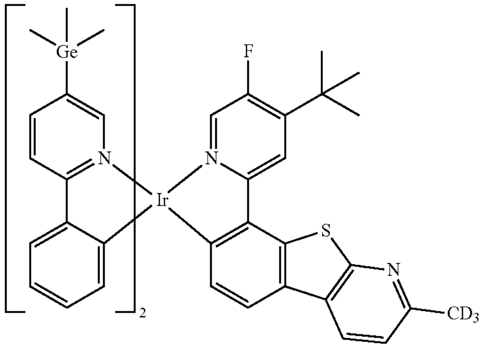
1129
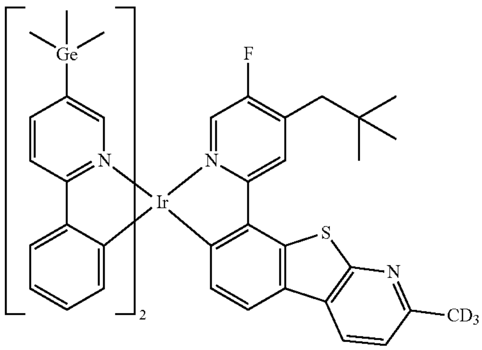
1130
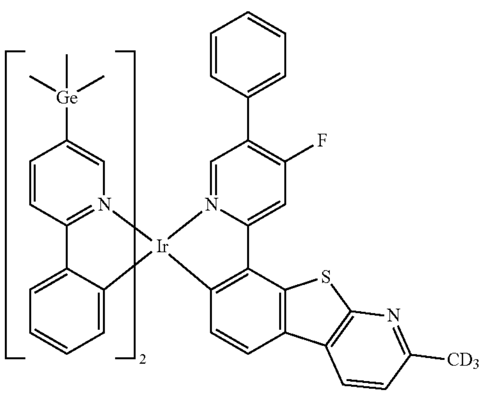
1131
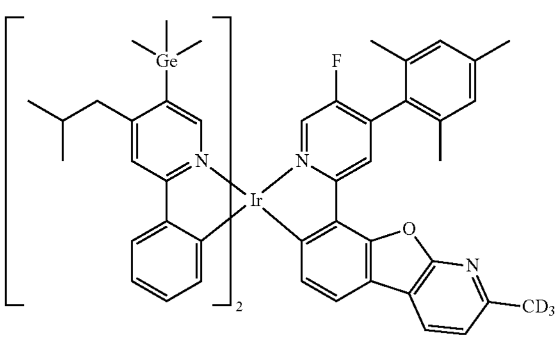
1132
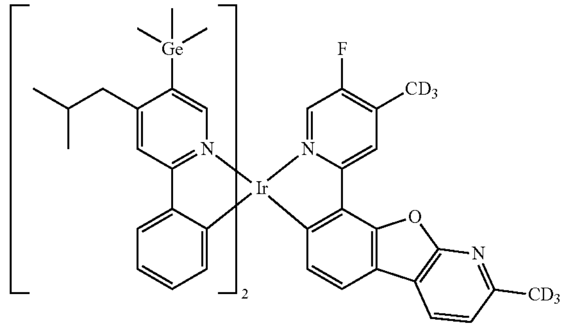
1133
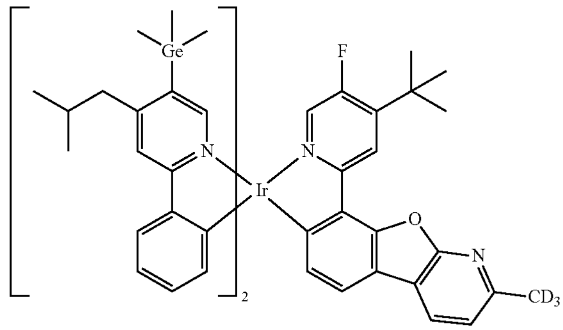
1134
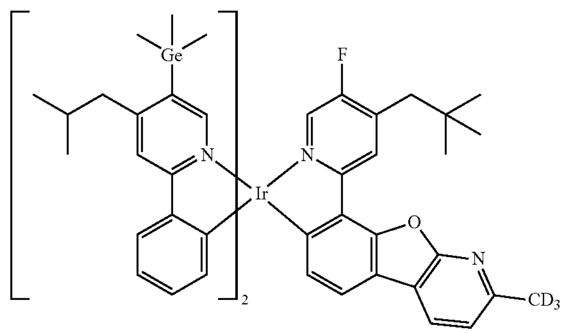
1135
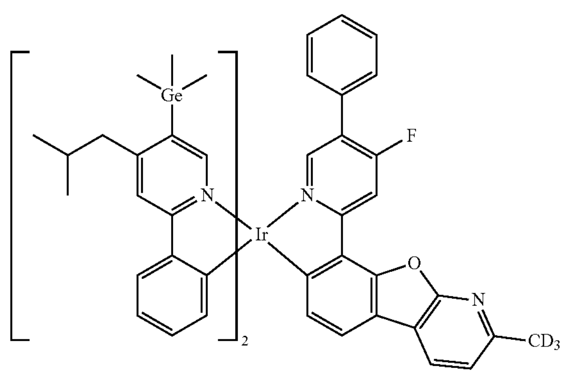

-continued
1136
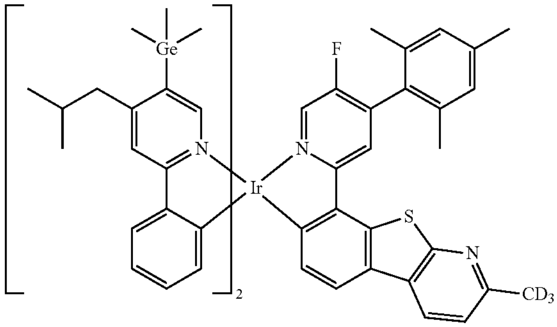
1137
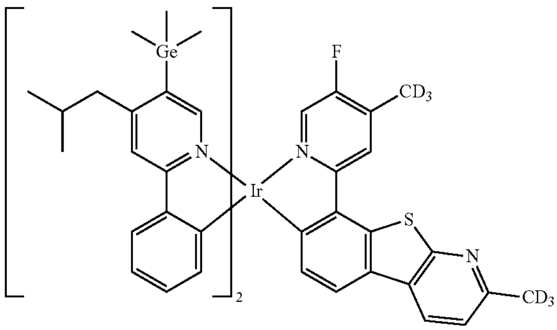
1138
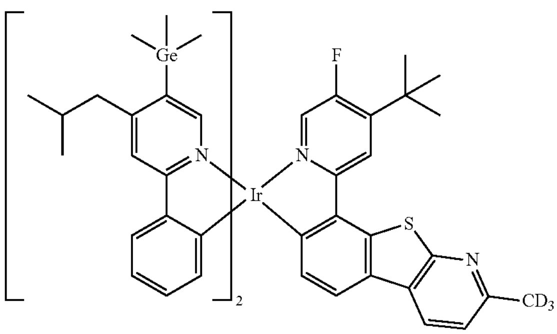
1139
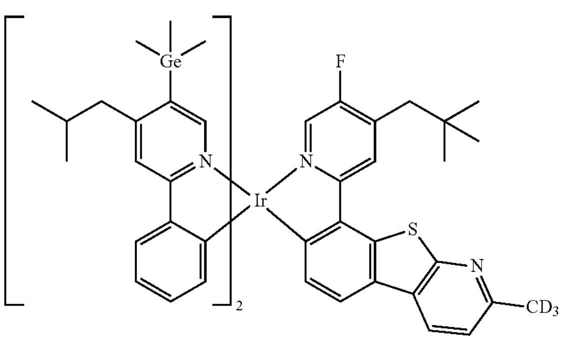
-continued
1140
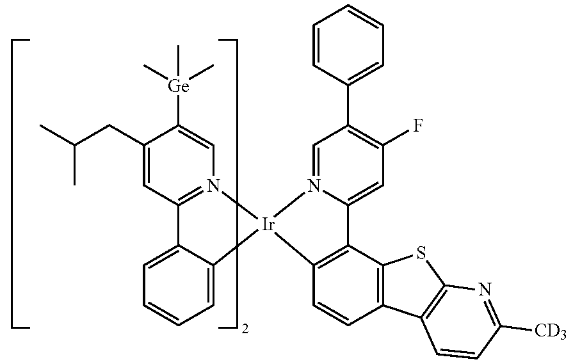
1141
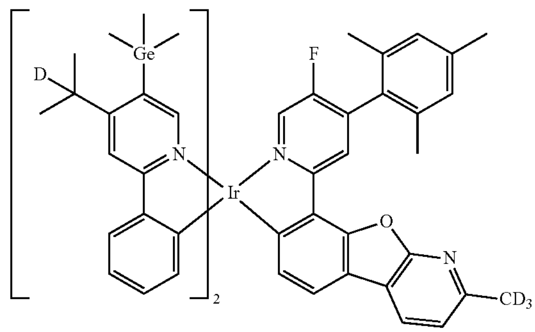
1142
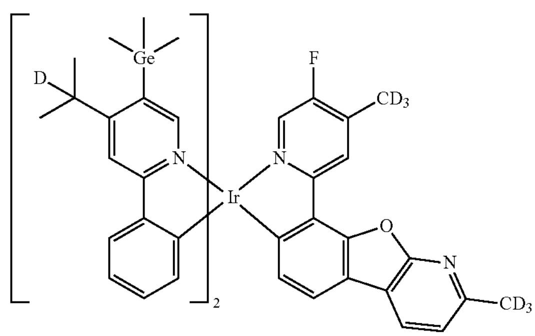
1143
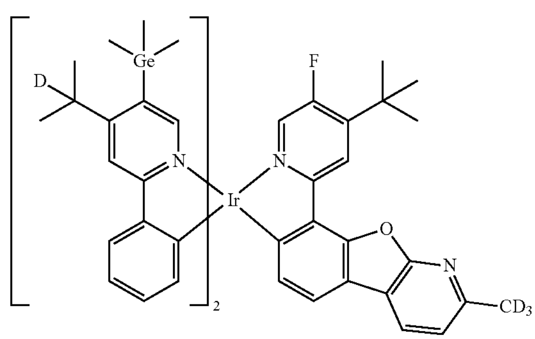

-continued
1144
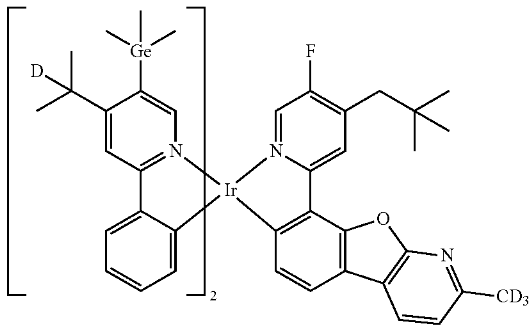
1145
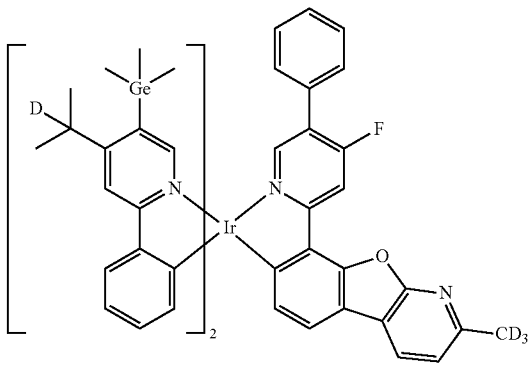
1146
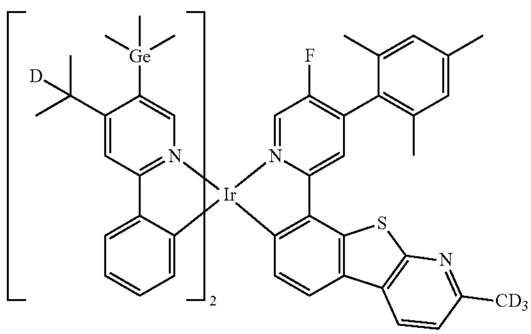
1147
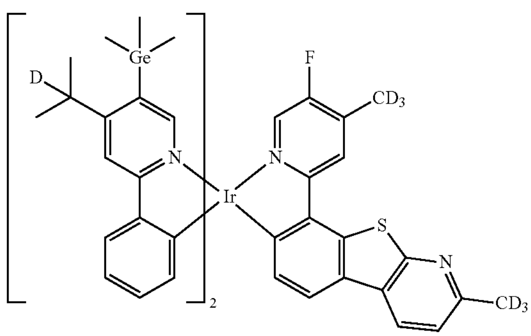
1148
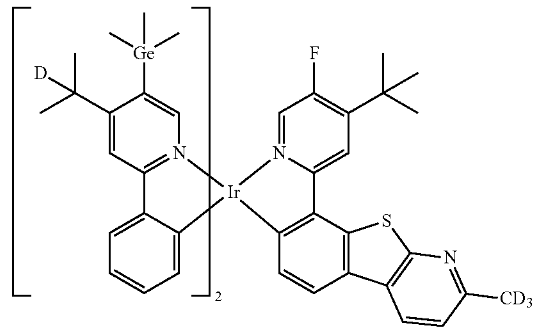
1149
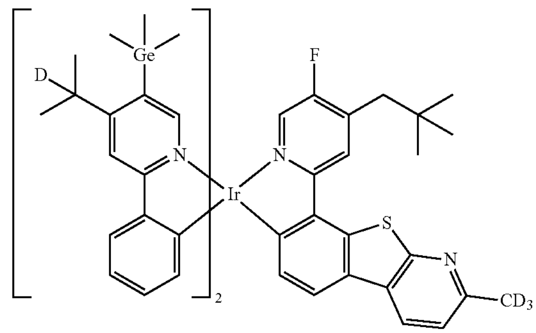
1150
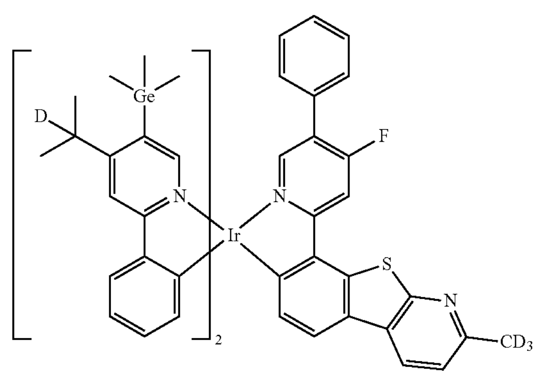
1151
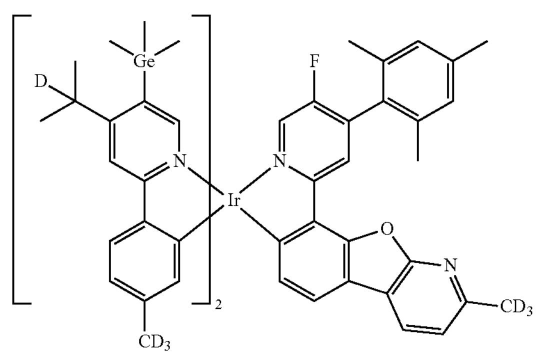

-continued
1152
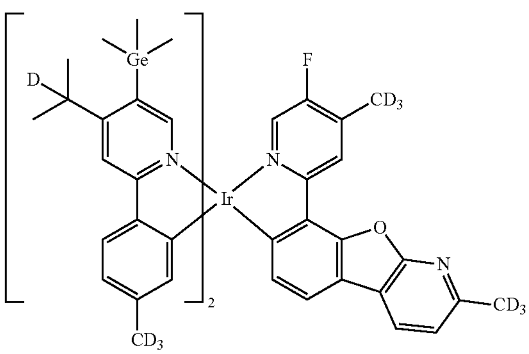
1153
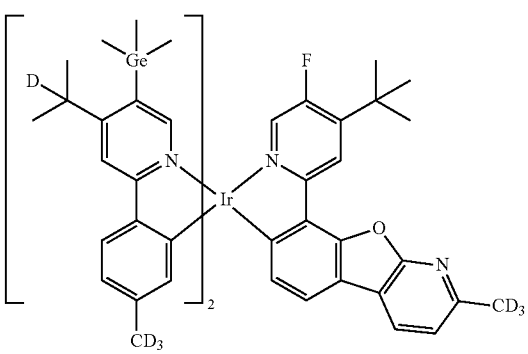
1154
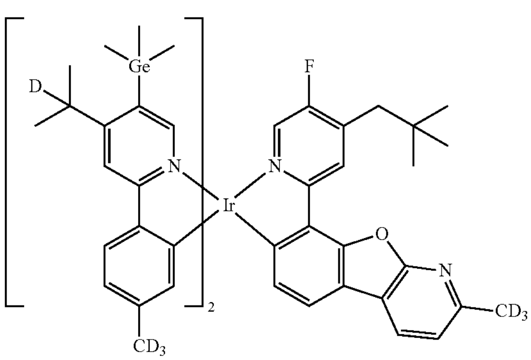
1155
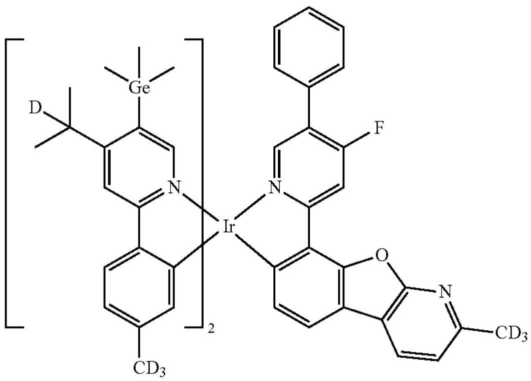
-continued
1156
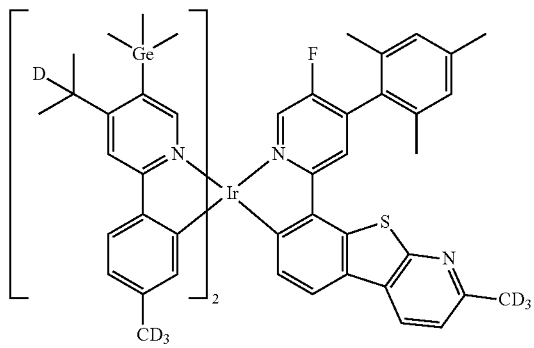
1157
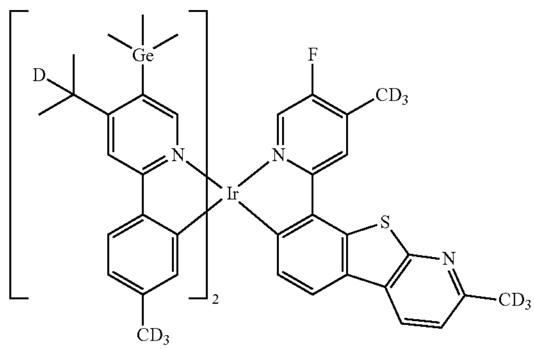
1158
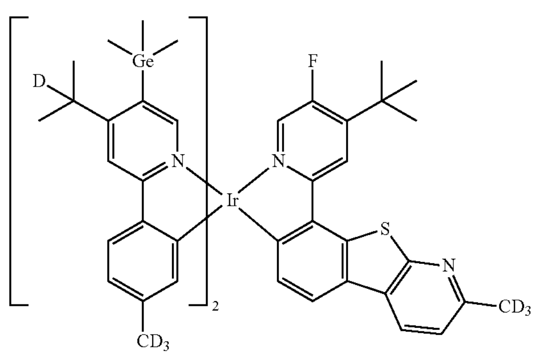
1159
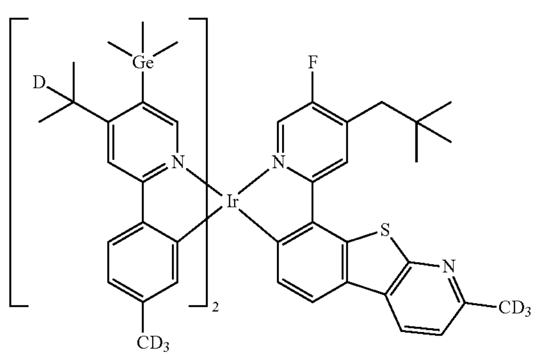

-continued
1160
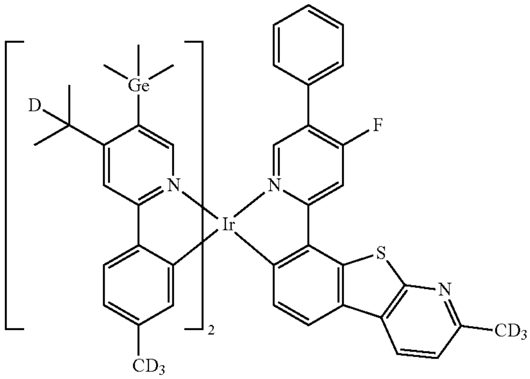
1161
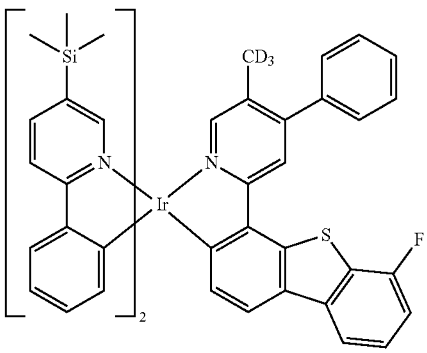
1162
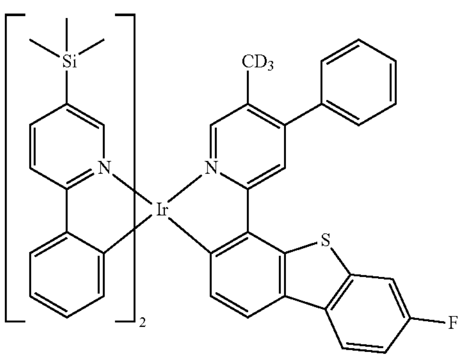
1163
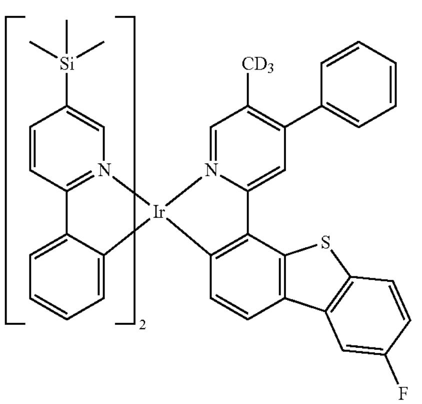
-continued
1164
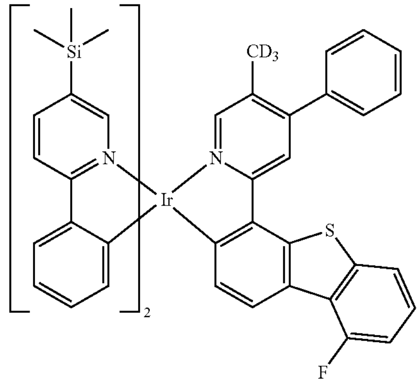
1165
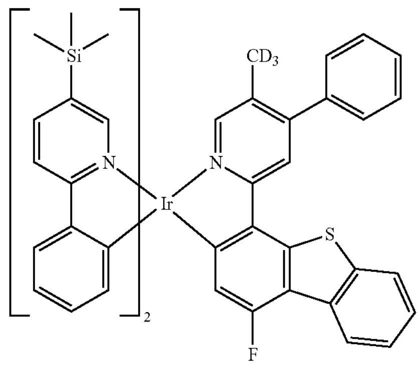
1166
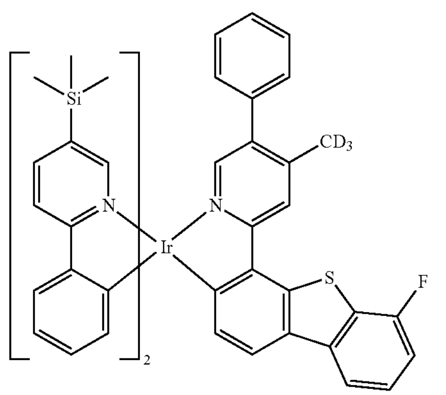
1167
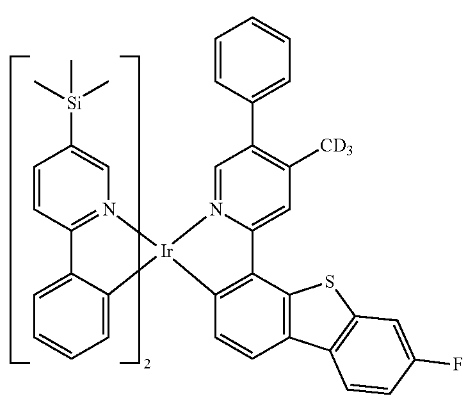

-continued
1168
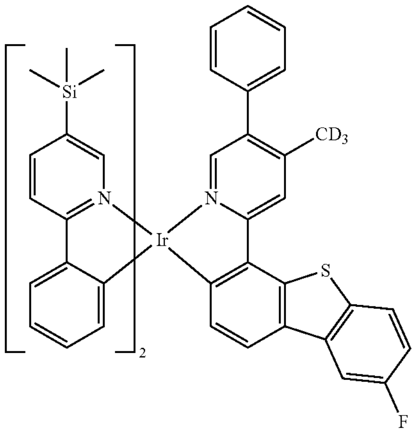
1169
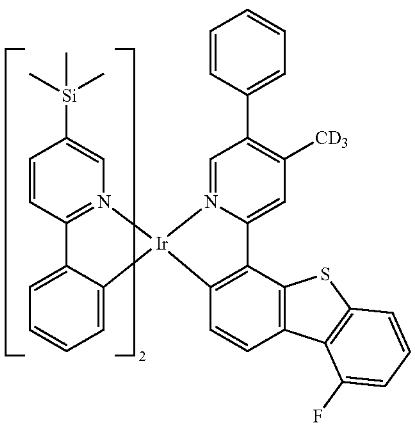
1170
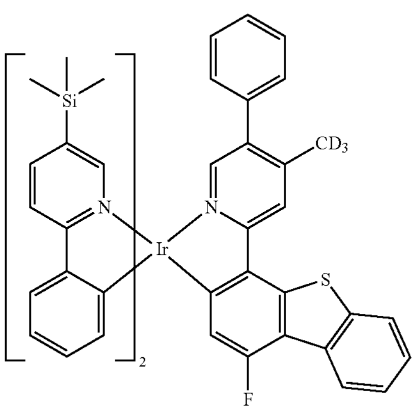
1171
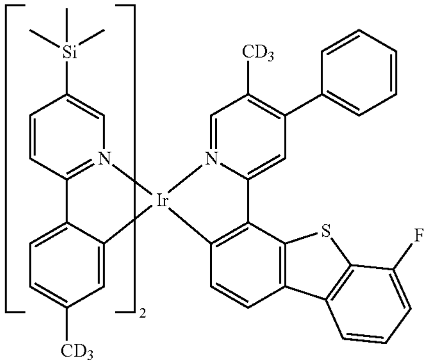
-continued
1172
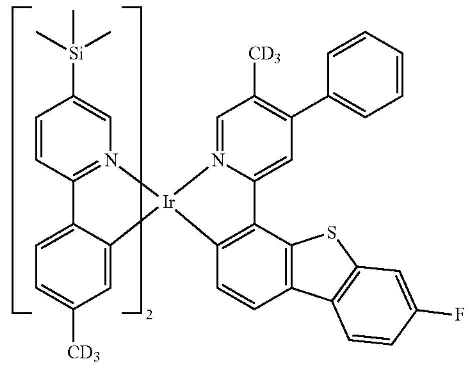
1173
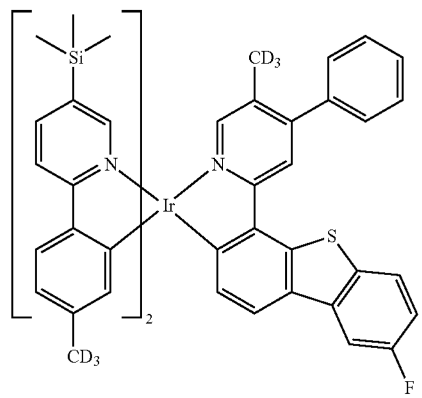
1174
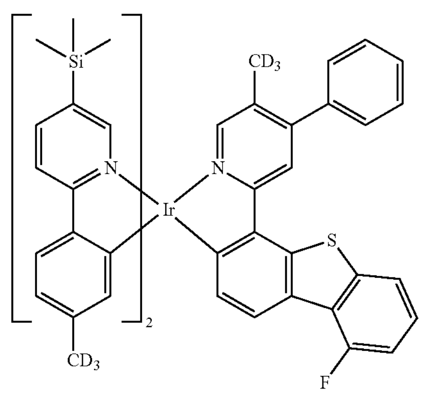
1175
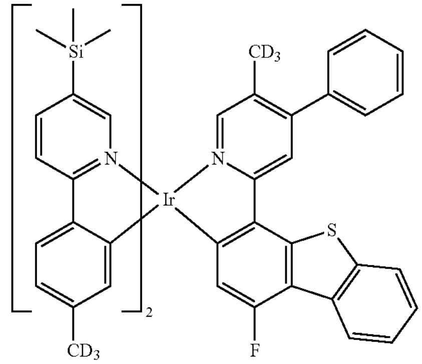

-continued
1176
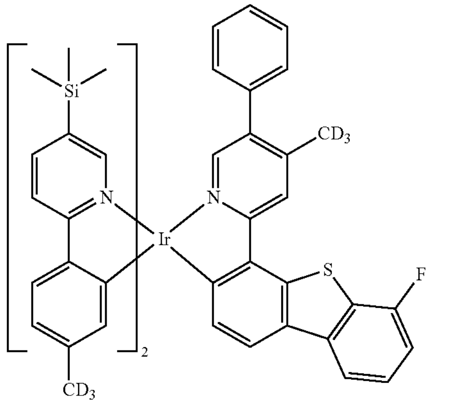
1177
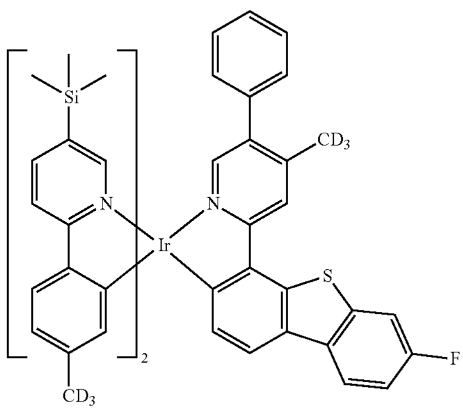
1178
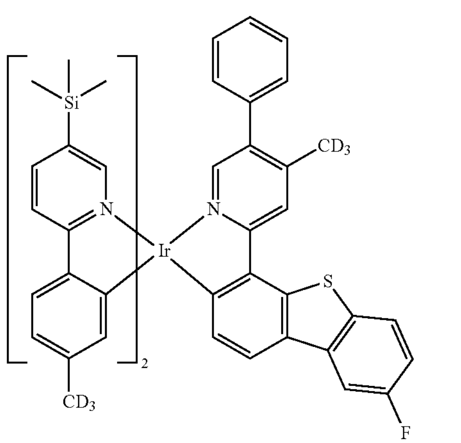
-continued
1179
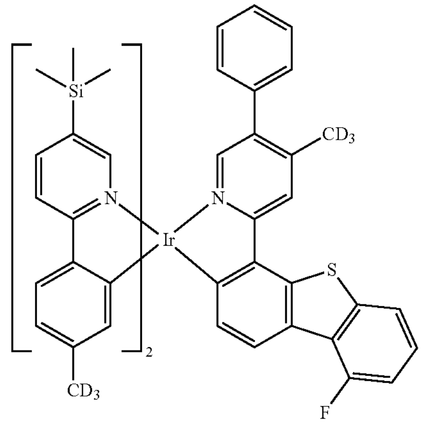
1180
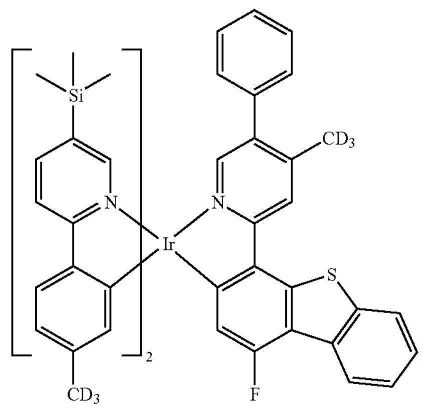
1181
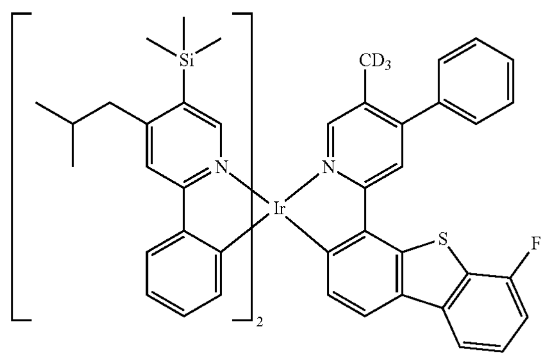
1182
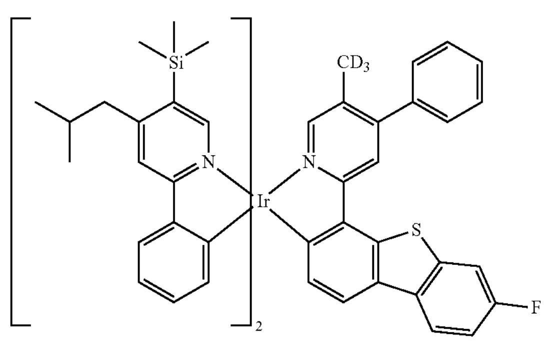

-continued
1183
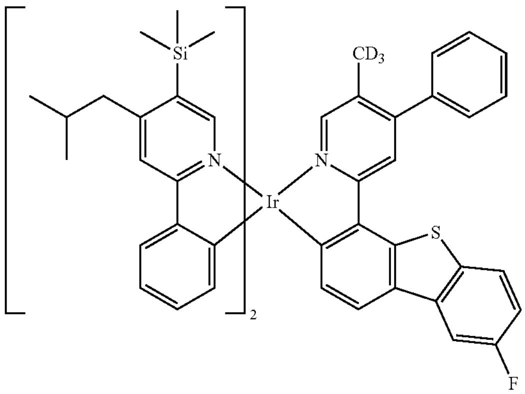
1184
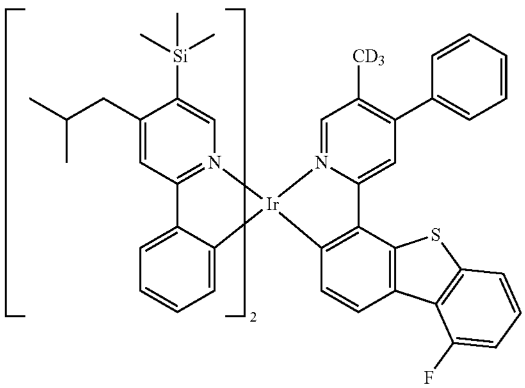
1185
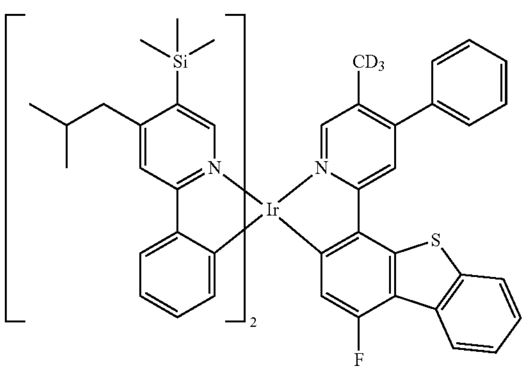
1186
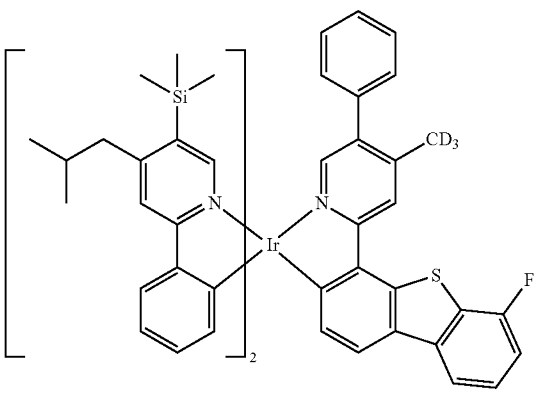
-continued
1187
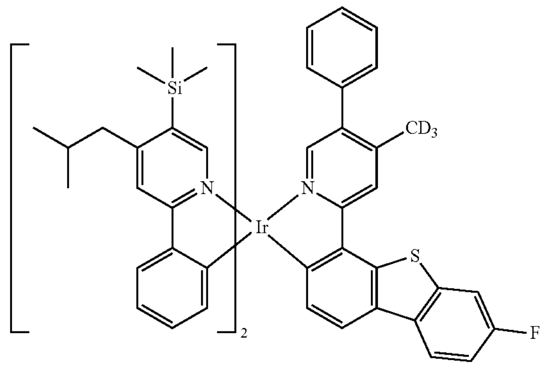
1188
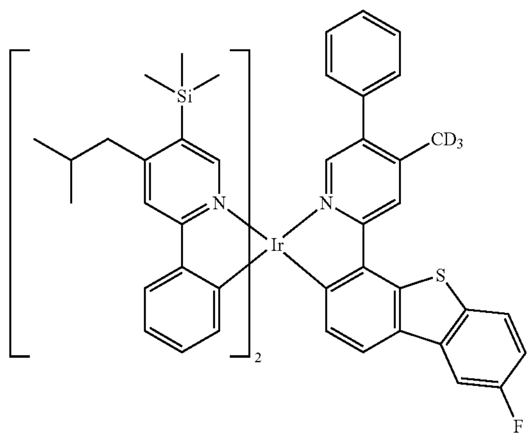
1189
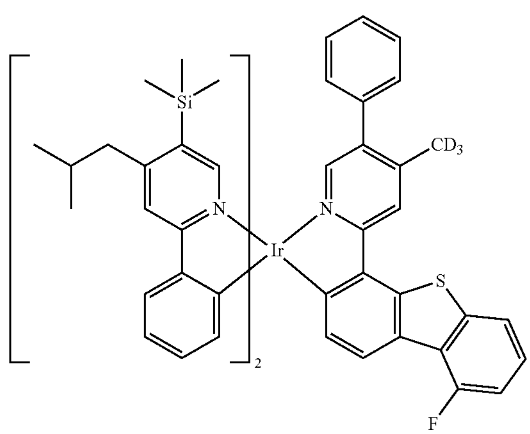

-continued
1190
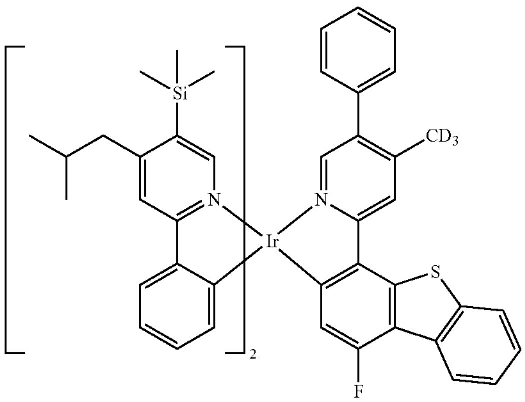
1191
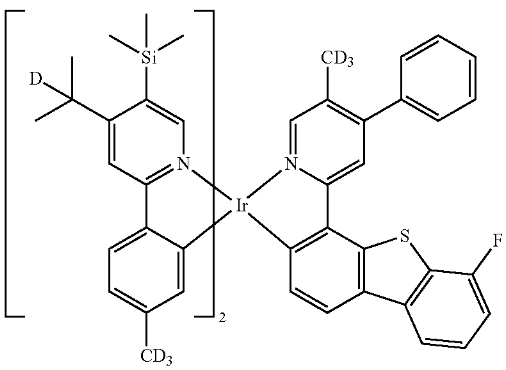
1192
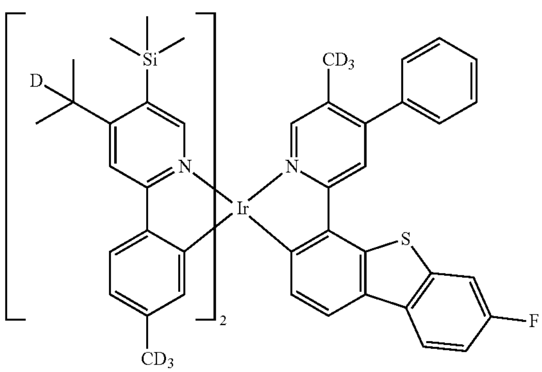
1193
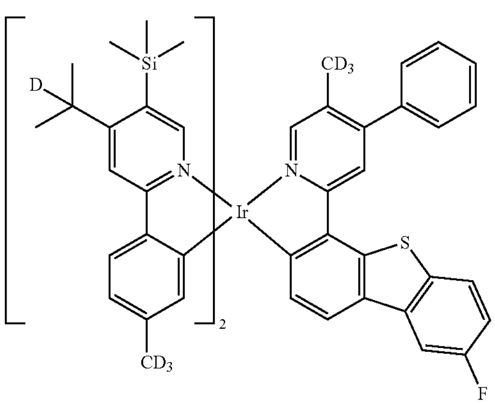
-continued
1194
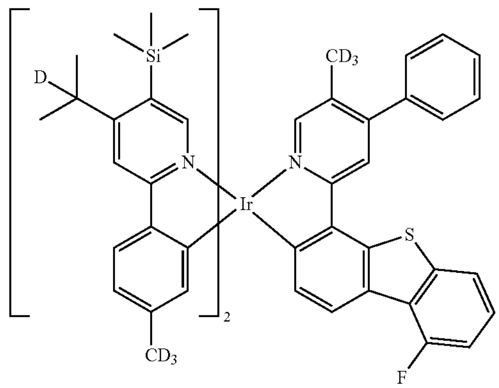
1195
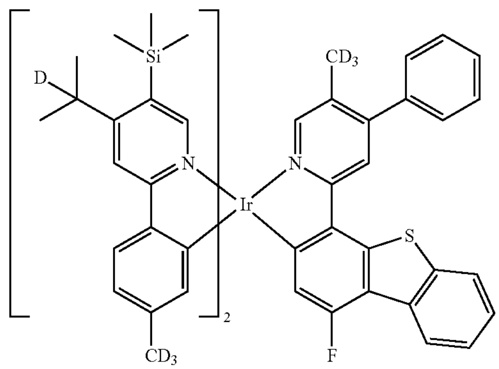
1196
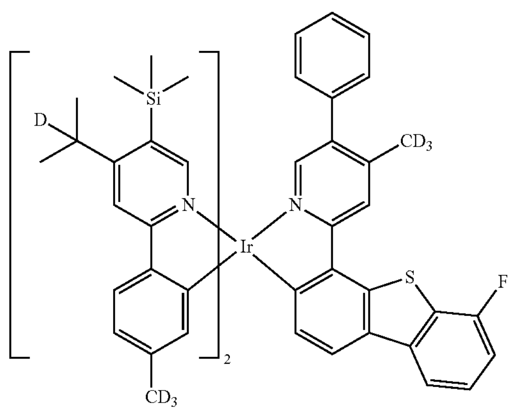
1197
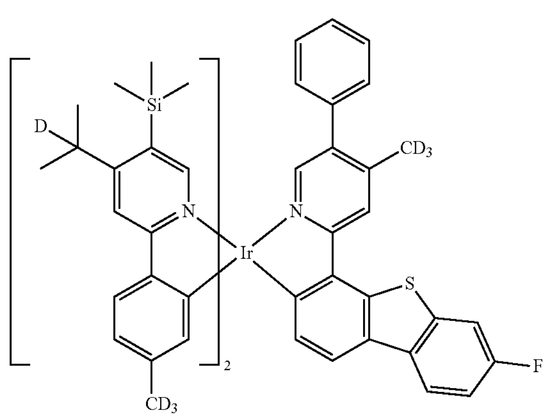

-continued
1198
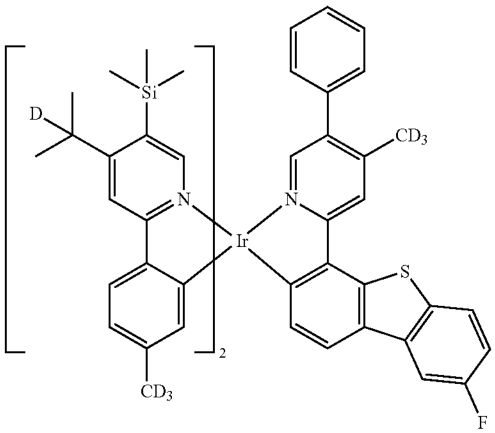
1199
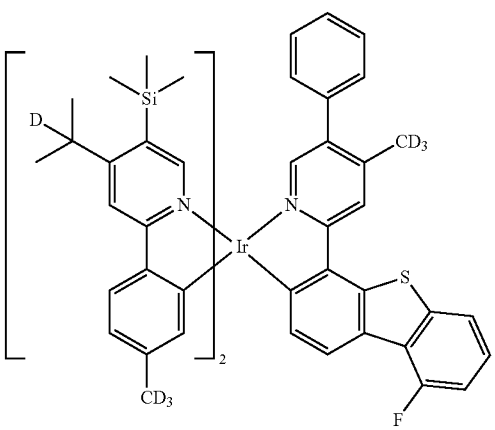
1200
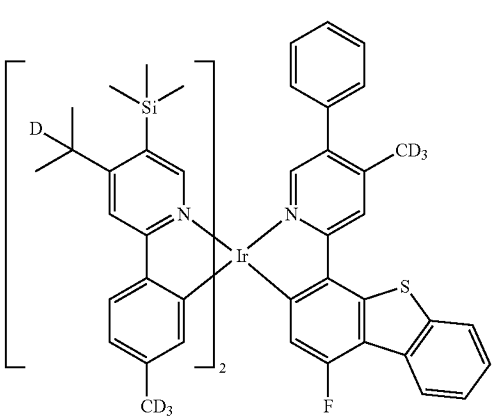
-continued
1201
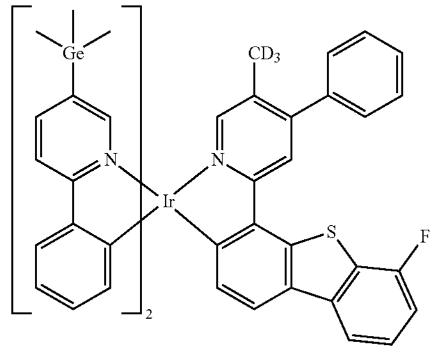
1202
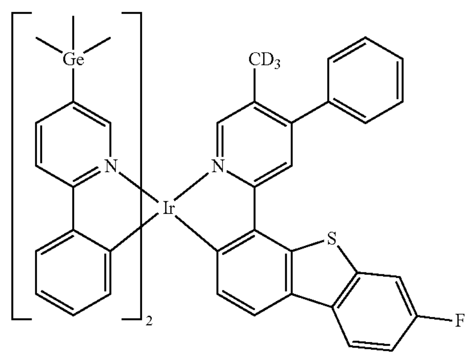
1203
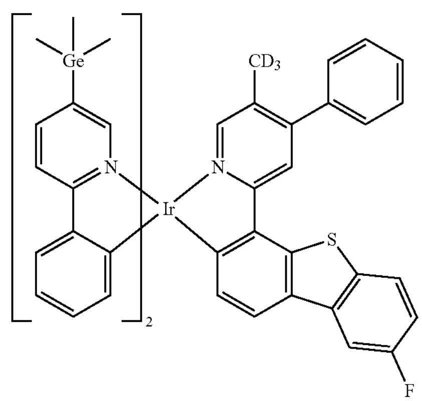
1204
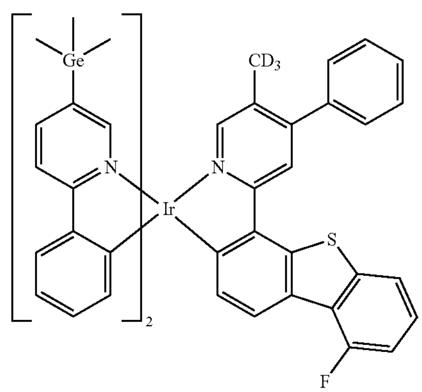

-continued
1205
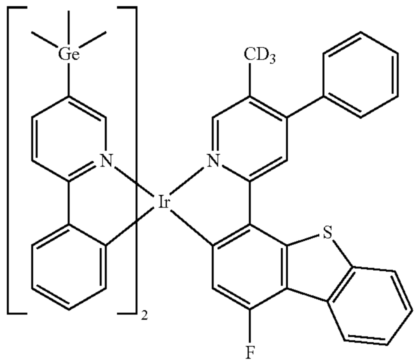
1206
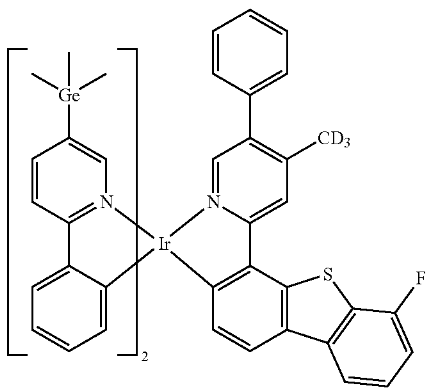
1207
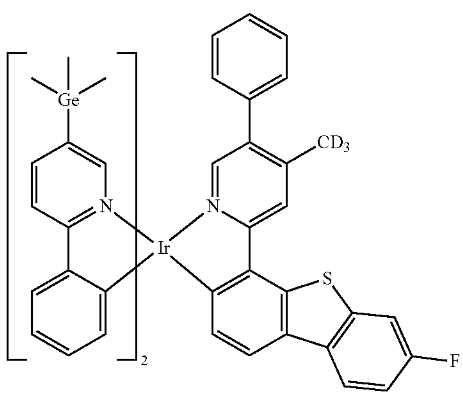
1208
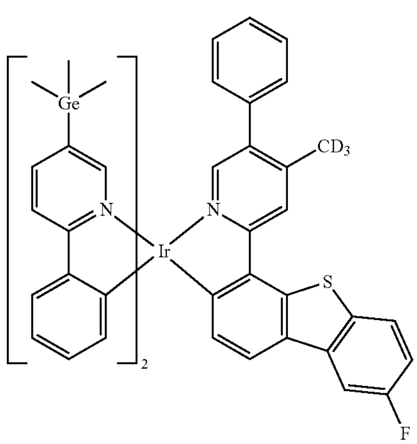
-continued
1209
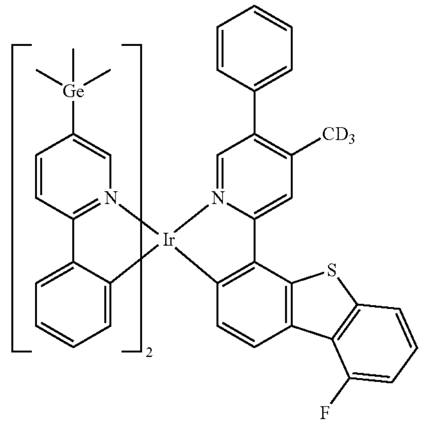
1210
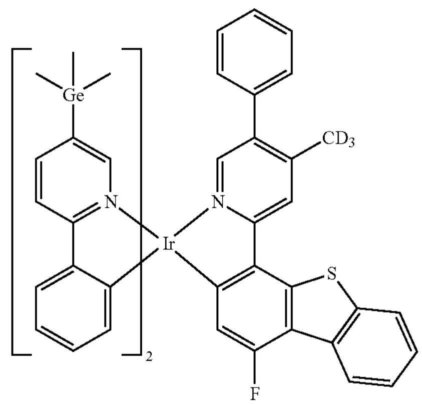
1211
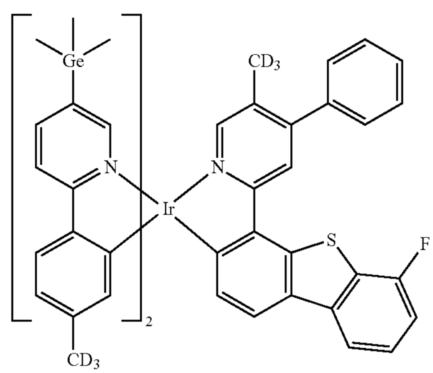
1212
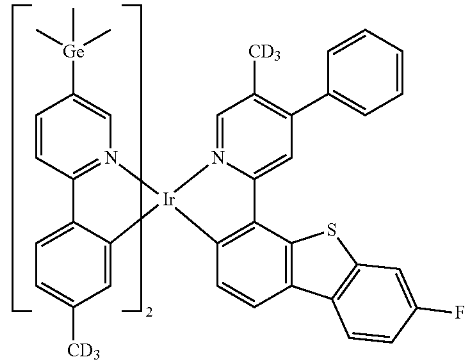

-continued
1213
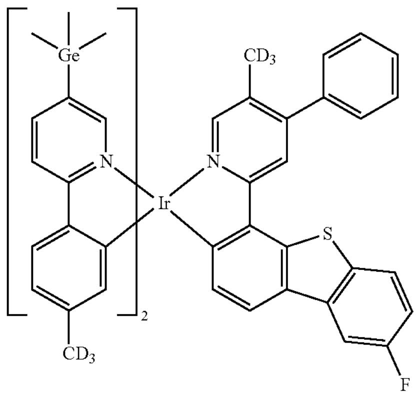
1214
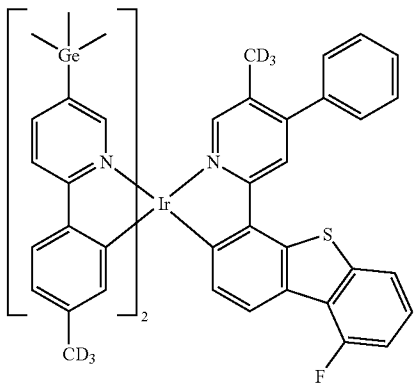
1215
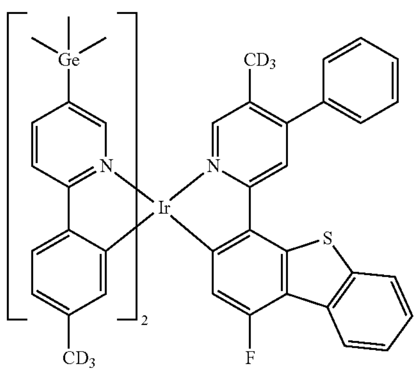
1216
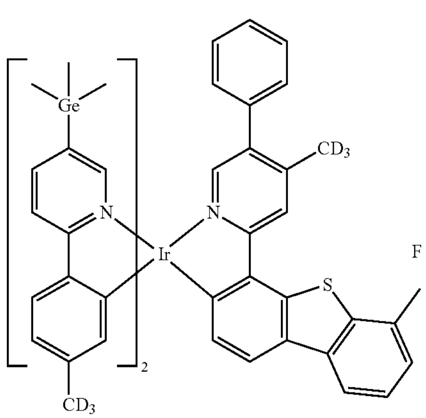
-continued
1217
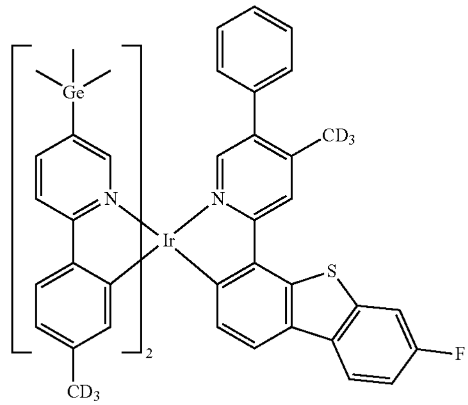
1218
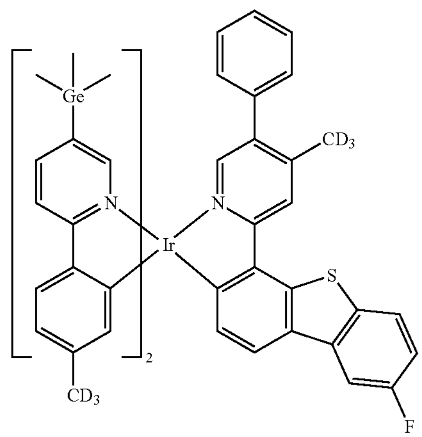
1219
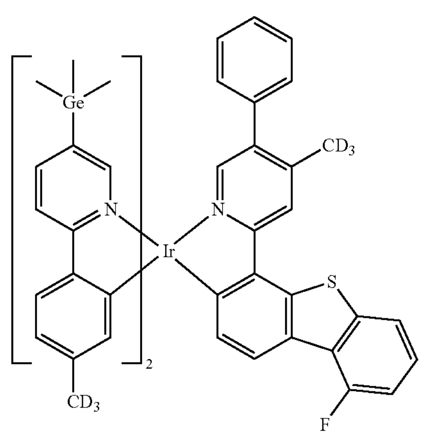

-continued
1220
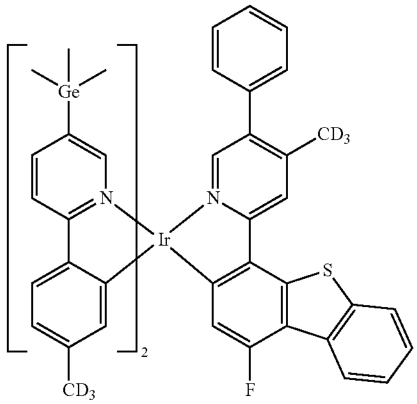
1221
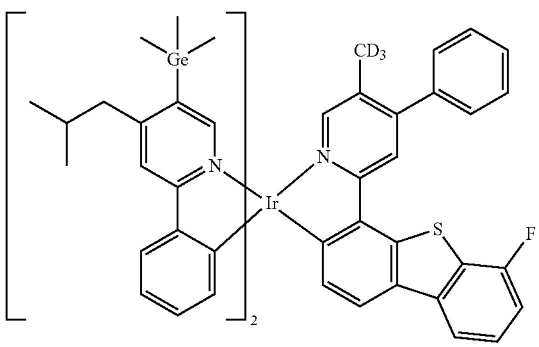
1222
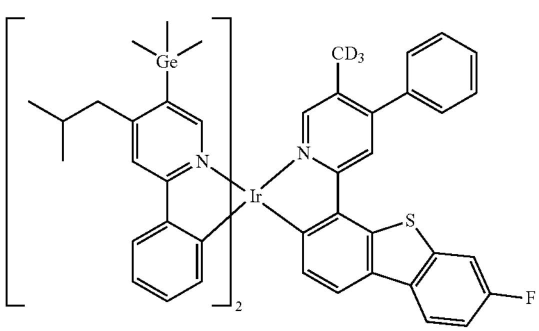
1223
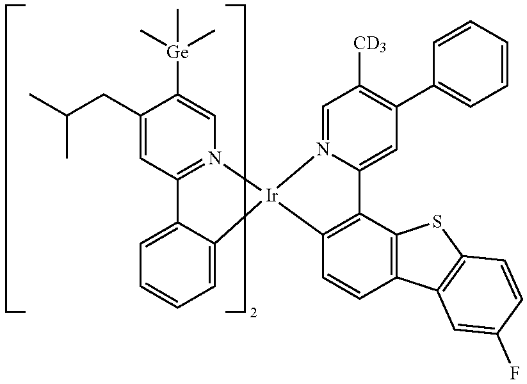
-continued
1224
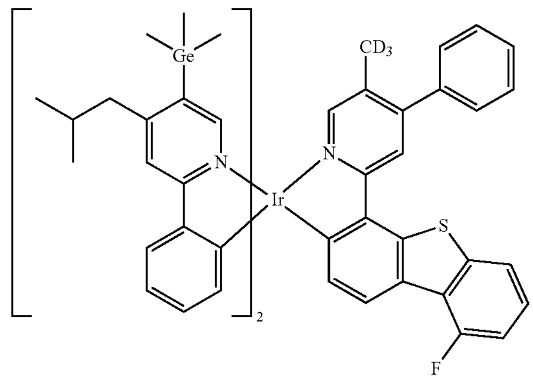
1225
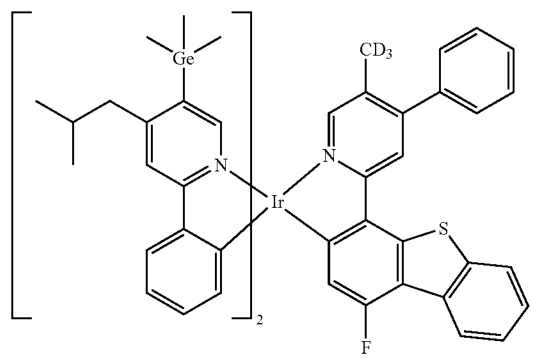
1226
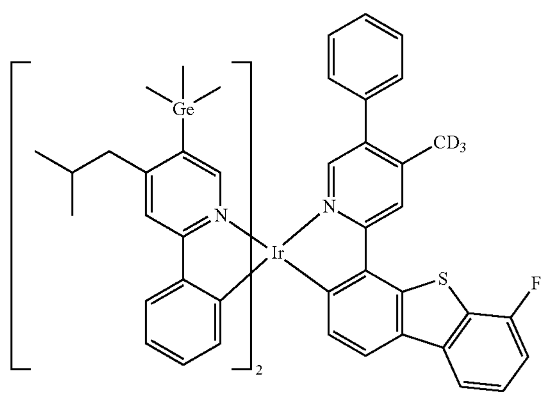
1227
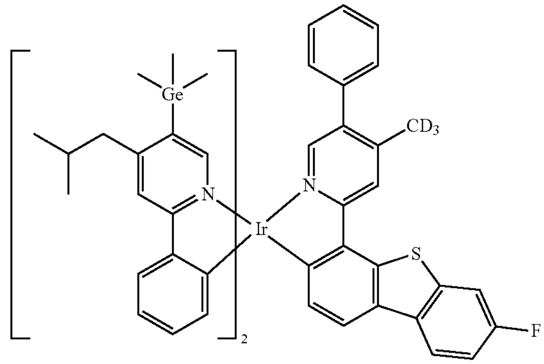

-continued
1228
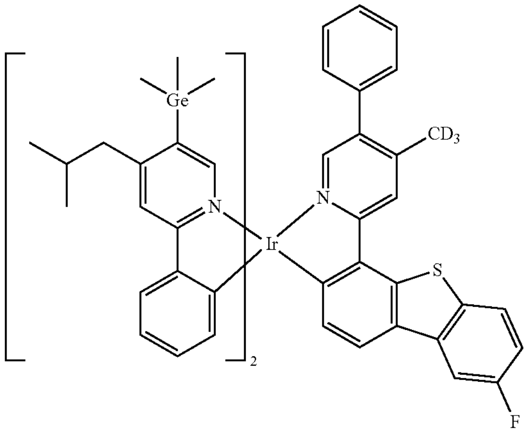
1229
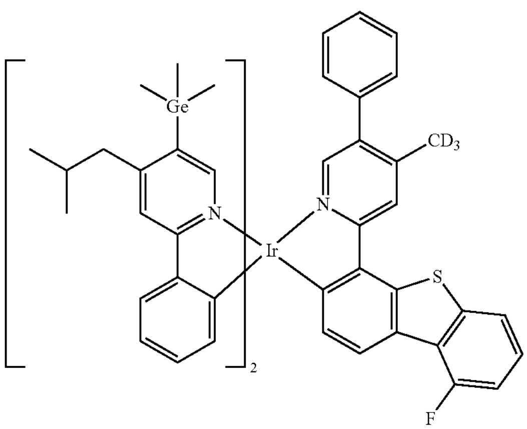
1230
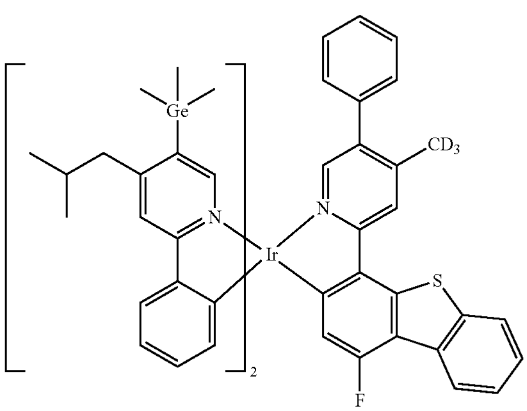
-continued
1231
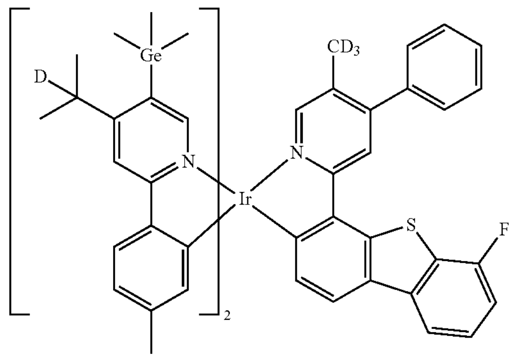
1232
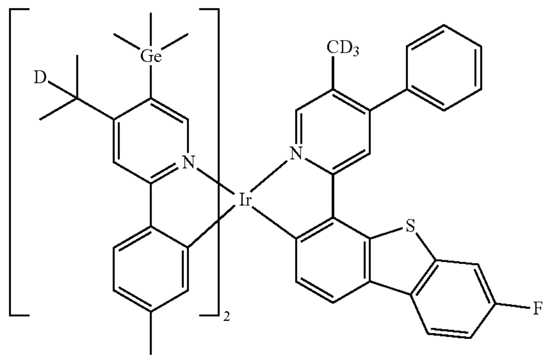
1233
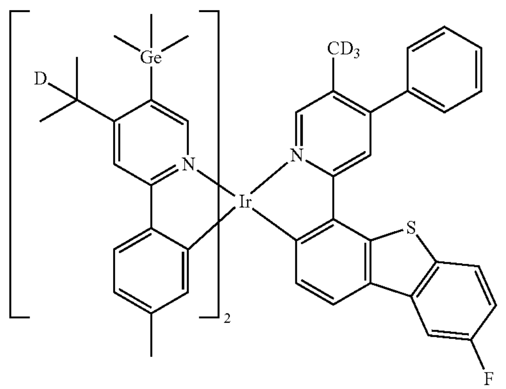
1234
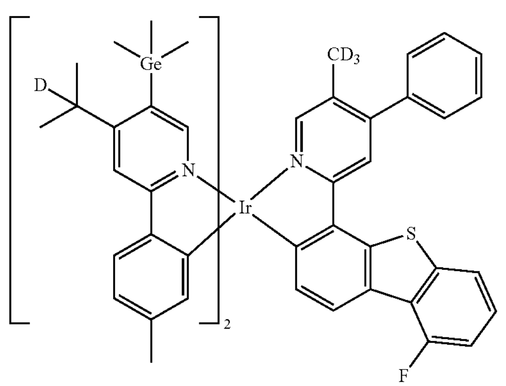

-continued
1235
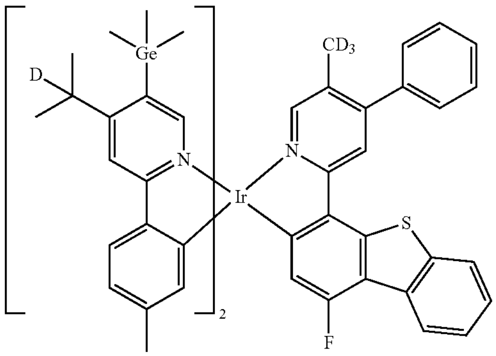
1236
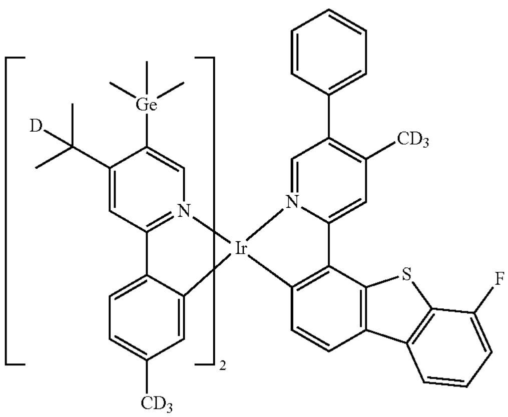
1237
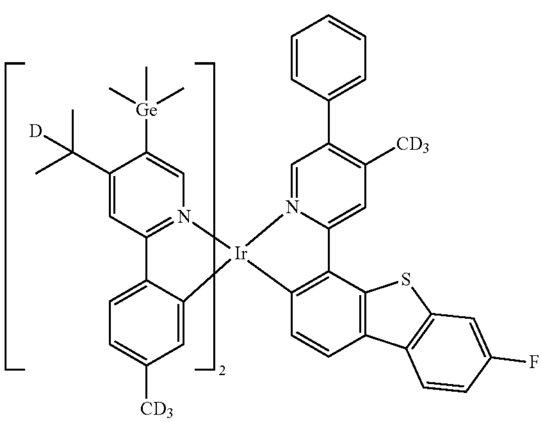
-continued
1238
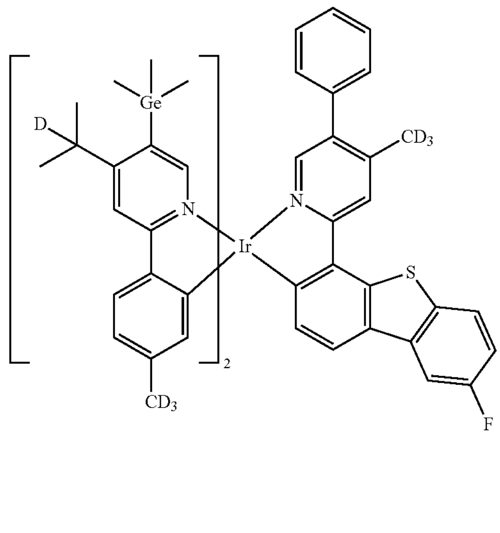
1239
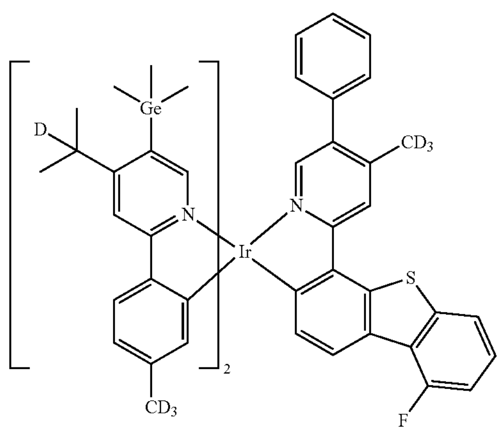
1240
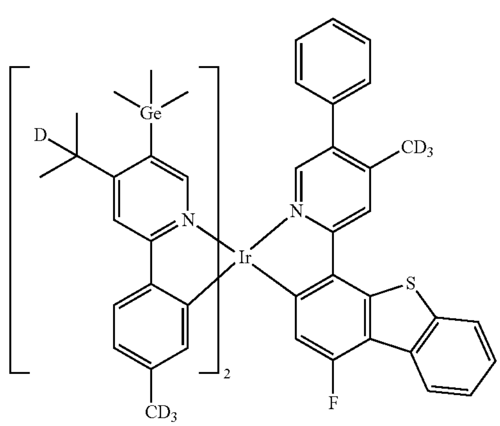

-continued
1241
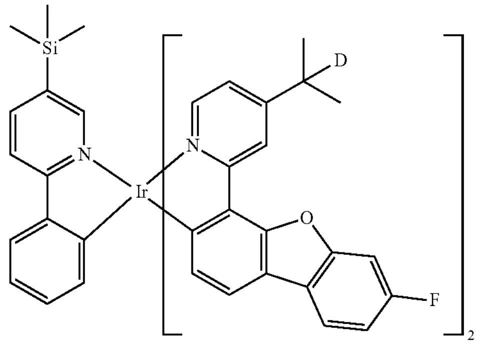
1242
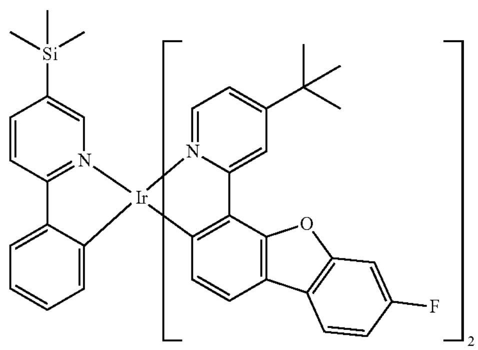
1243
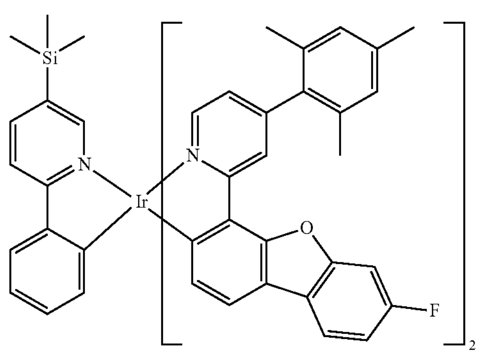
1244
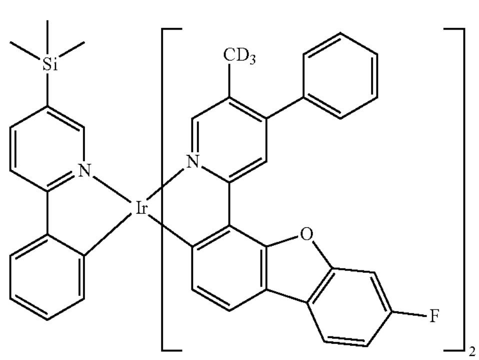
-continued
1245
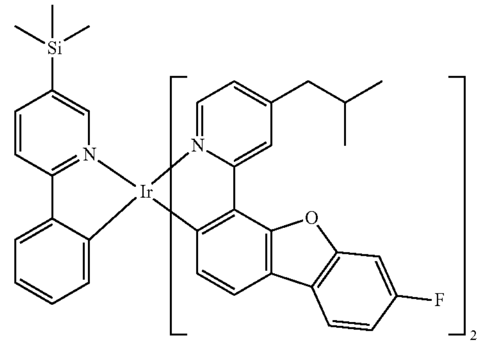
1246
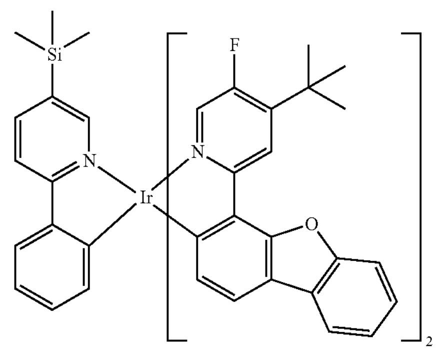
1247
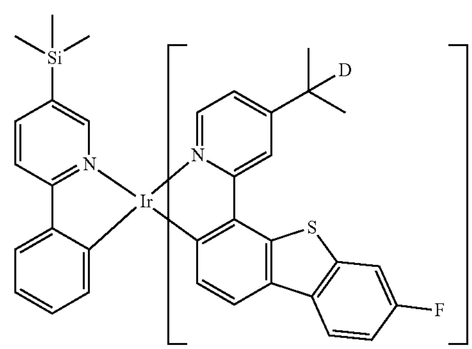
1248
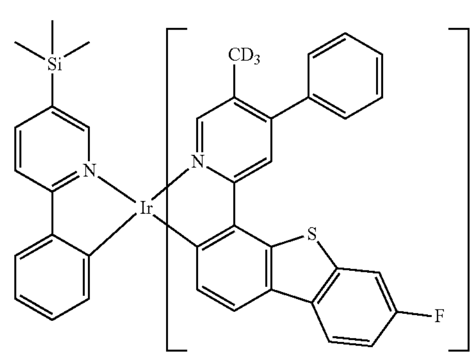

-continued
1249
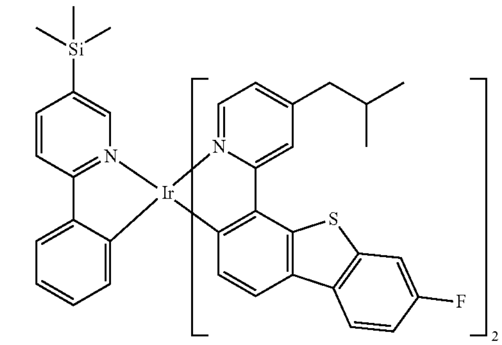
1250
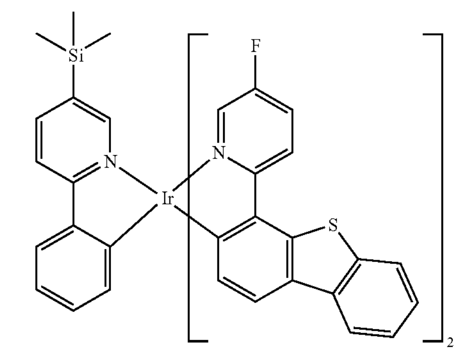
1251
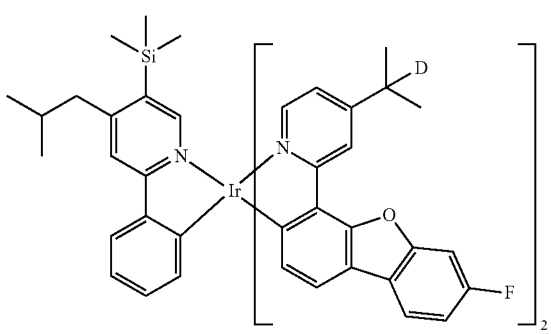
1252
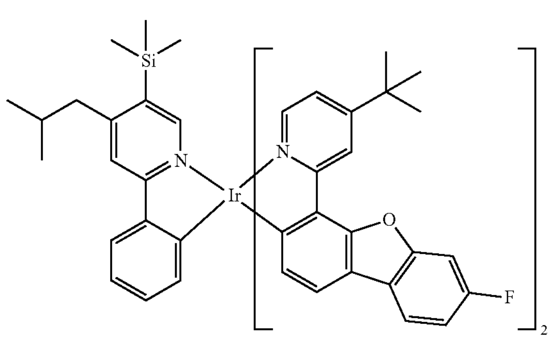
-continued
1253
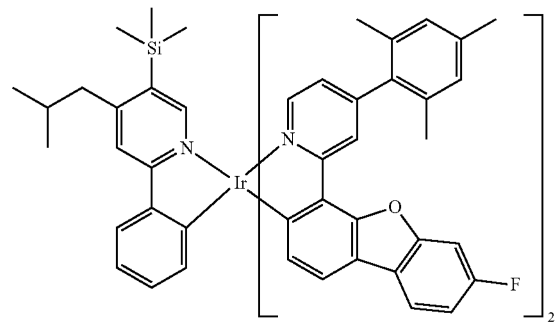
1254
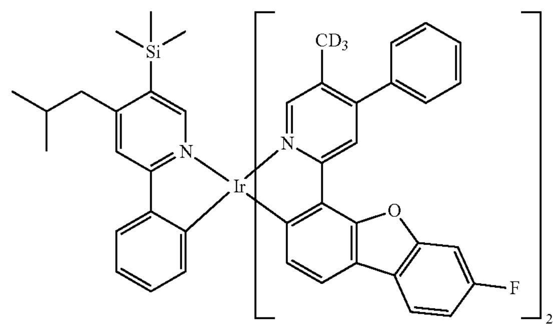
1255
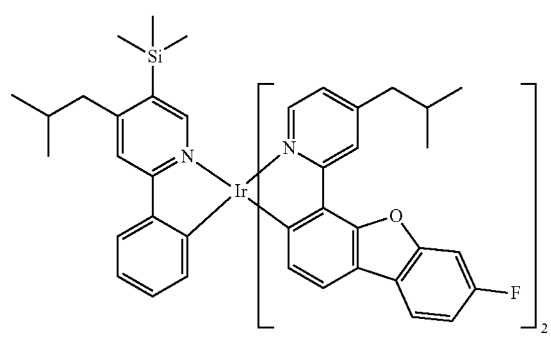
1256
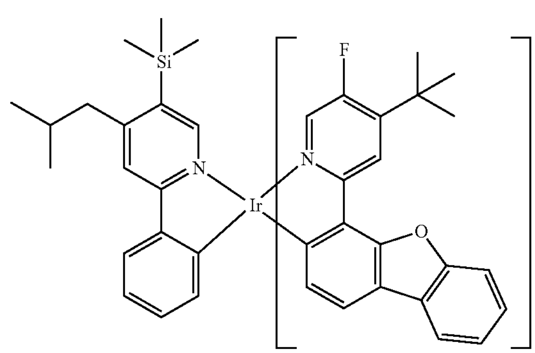

-continued
1257
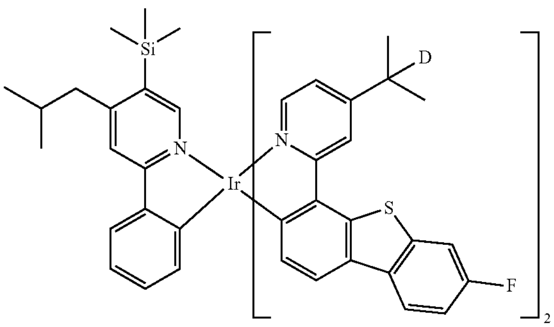
1258
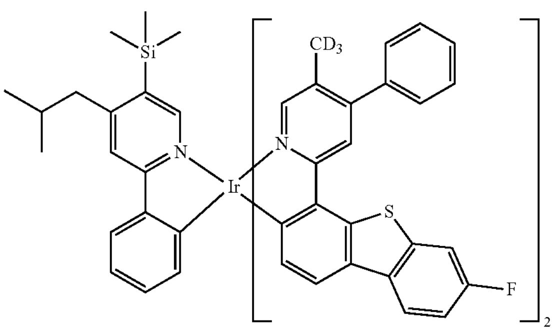
1259
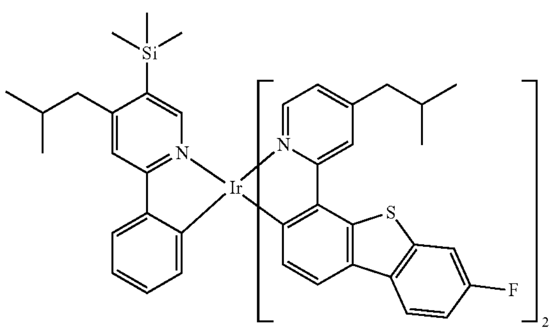
1260
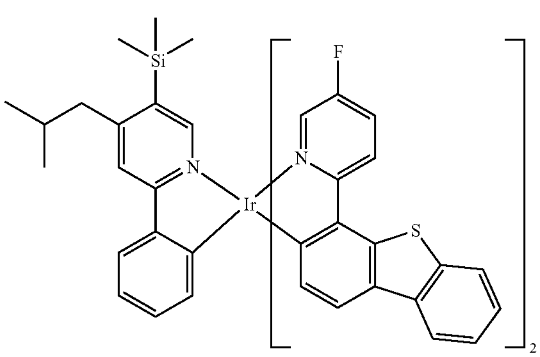
-continued
1261
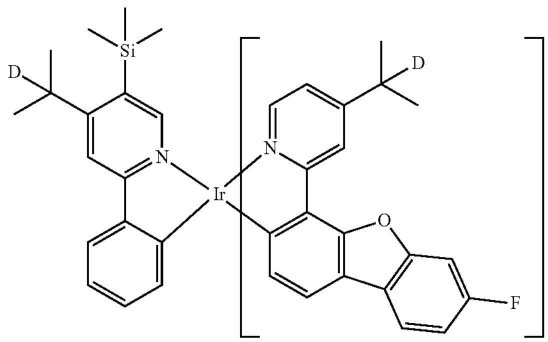
1262
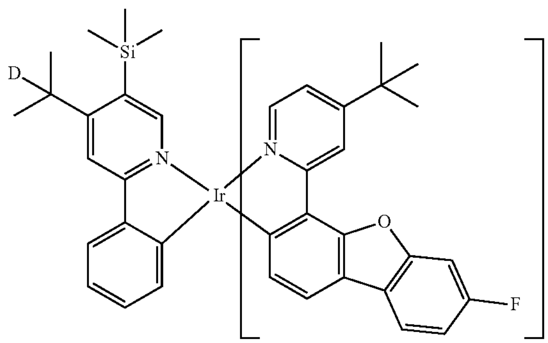
1263
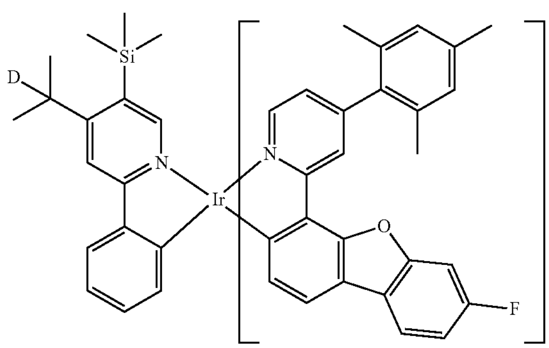
1264
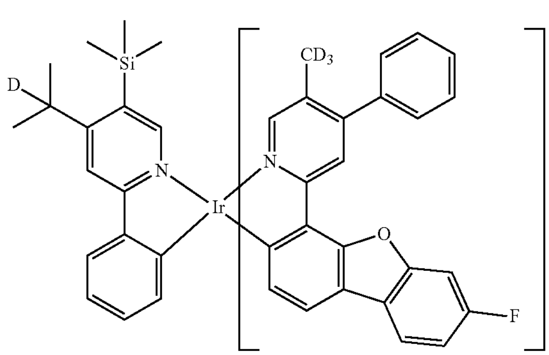

-continued
1265
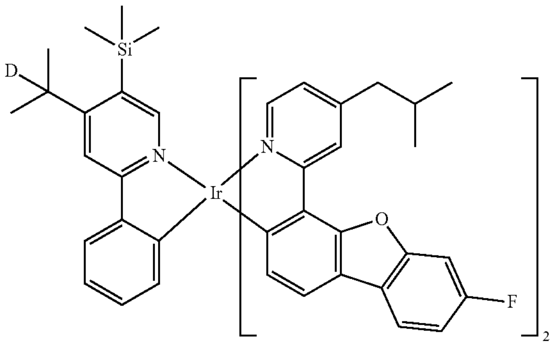
1266
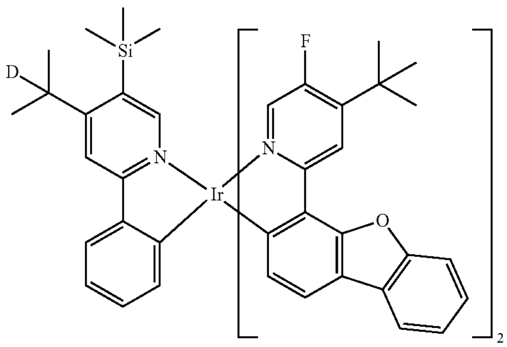
1267
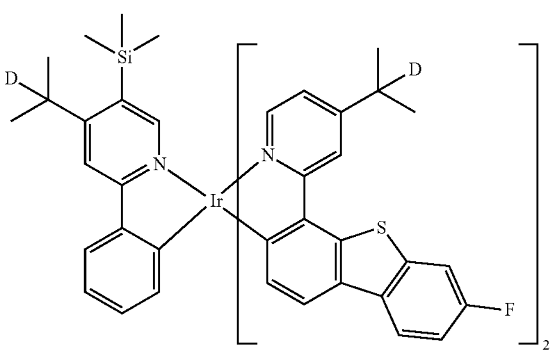
1268
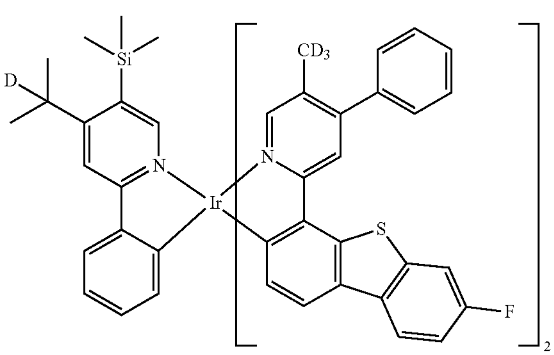
-continued
1269
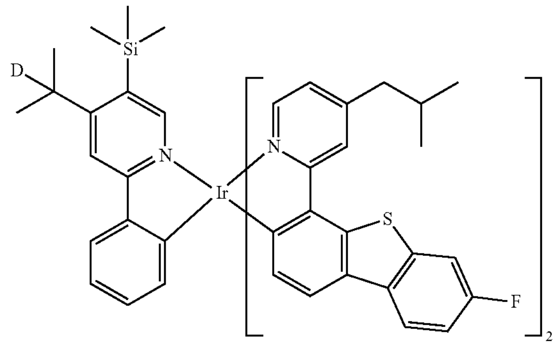
1270
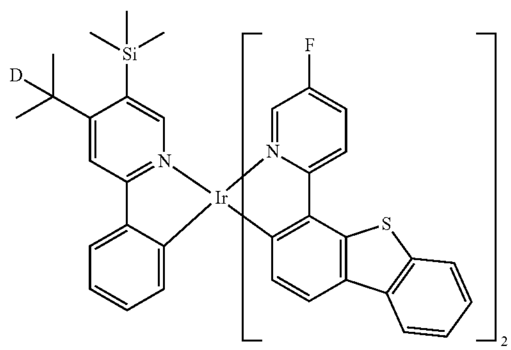
1271
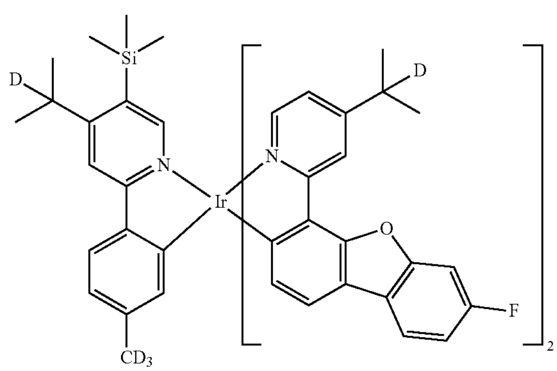
1272
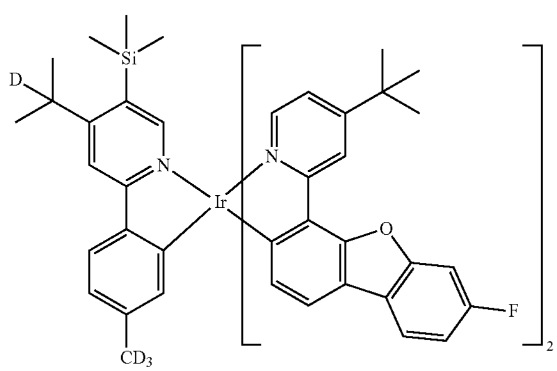

-continued
1273
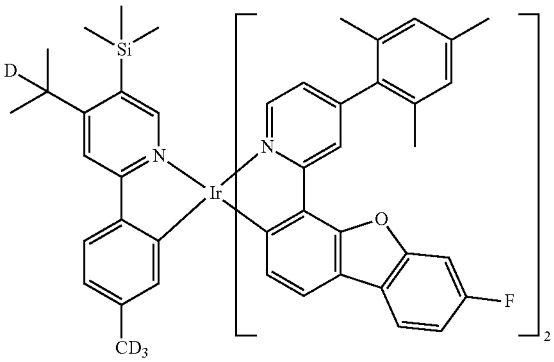
1274
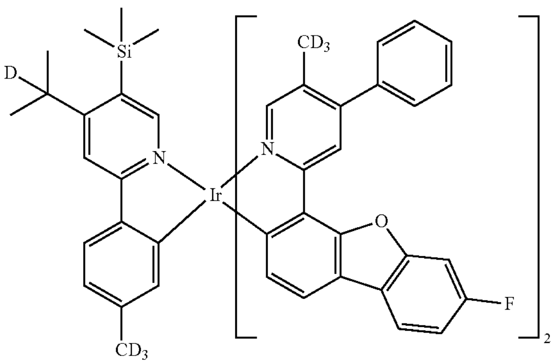
1275
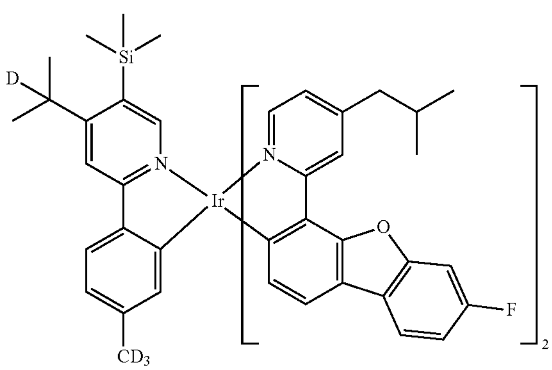
1276
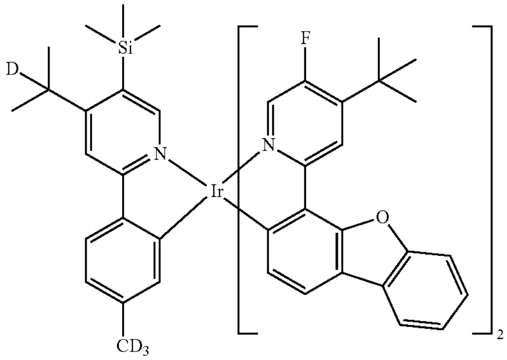
-continued
1277
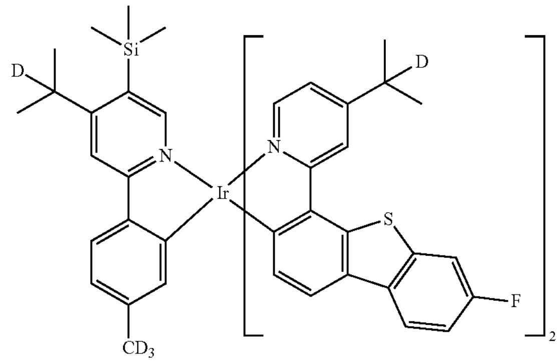
1278
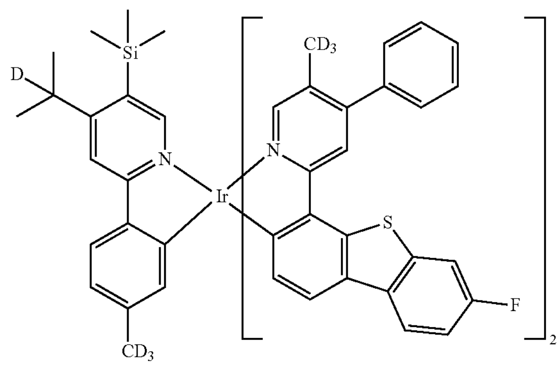
1279
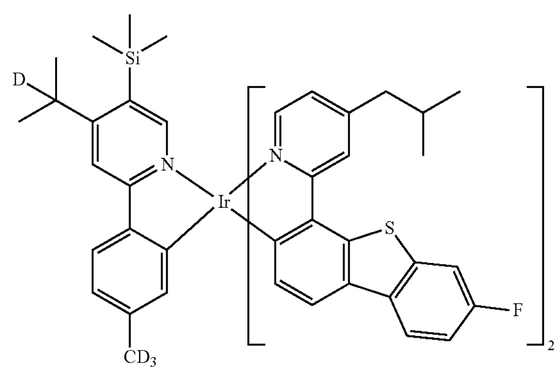
1280
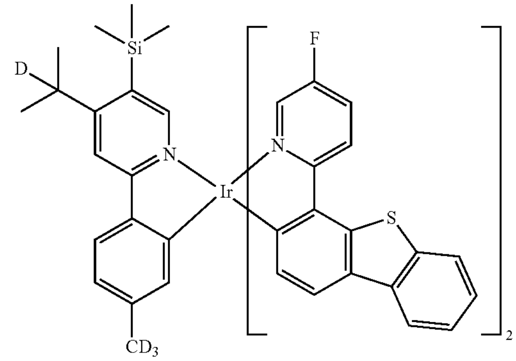

1281
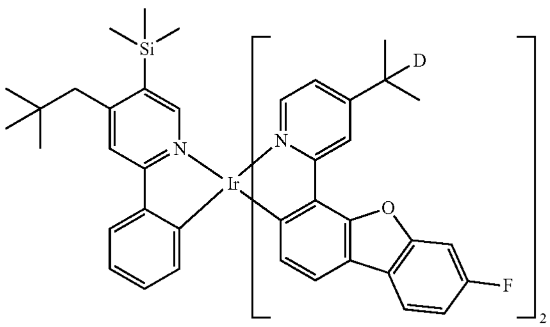
1282
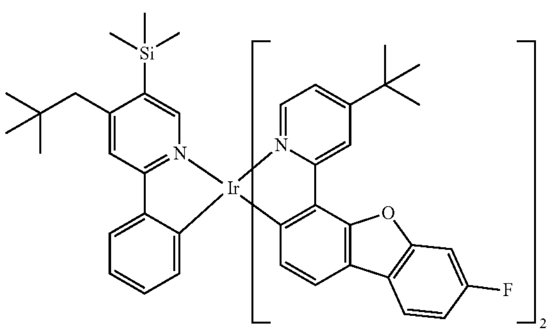
1283
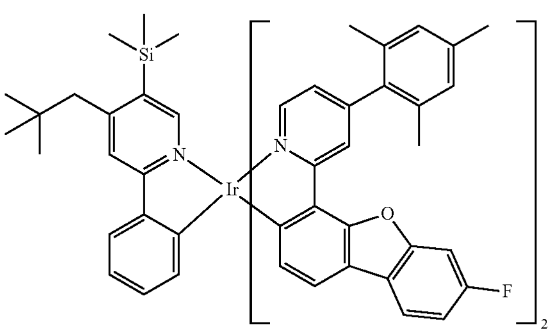
1284
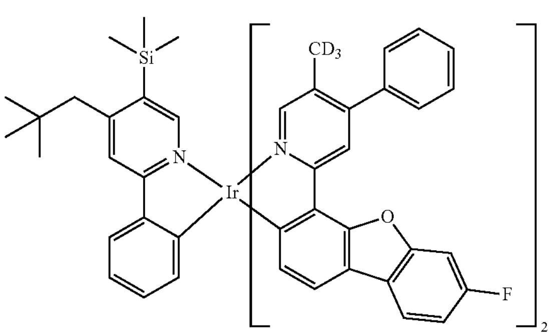
1285
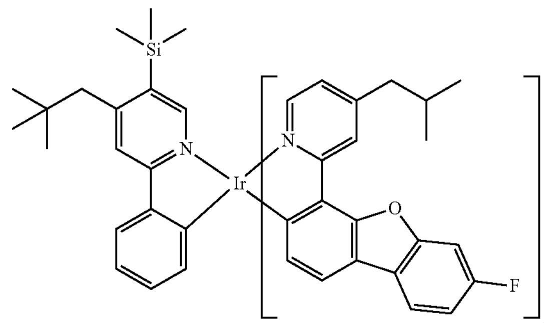
1286
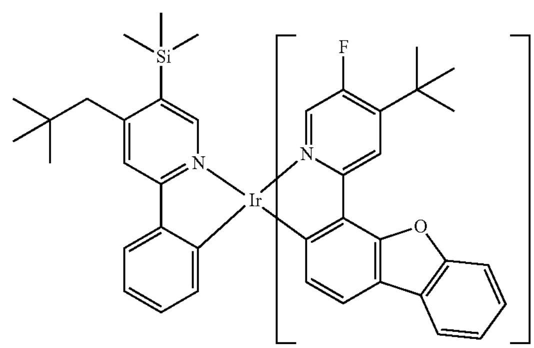
1287
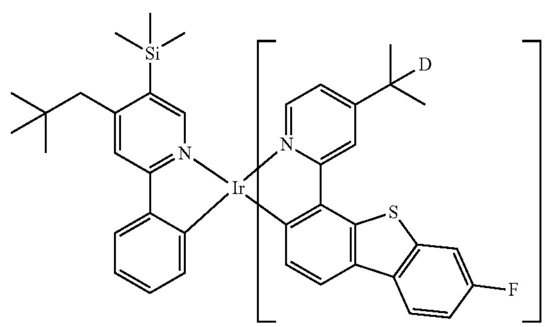
1288
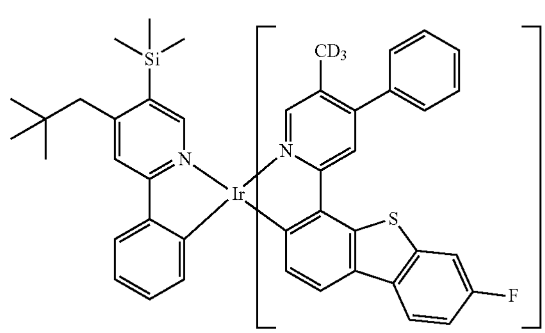

1289
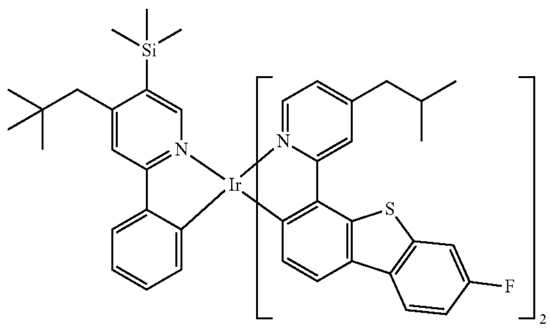
1290
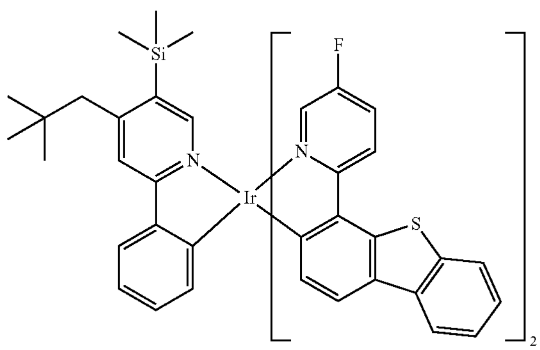
1291
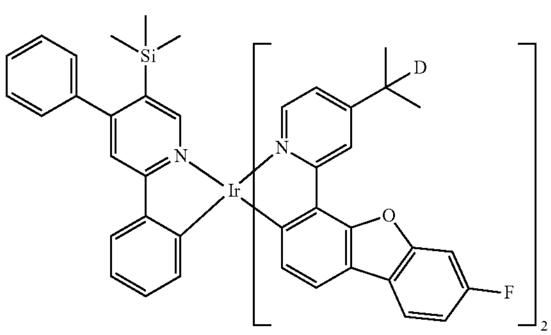
1292
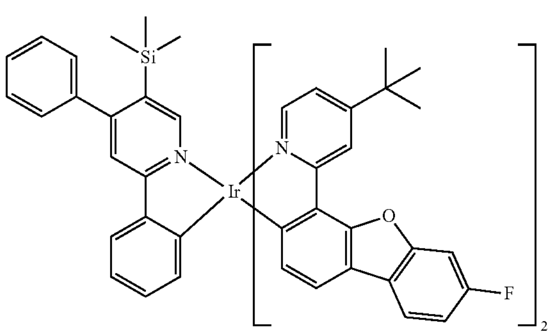
1293
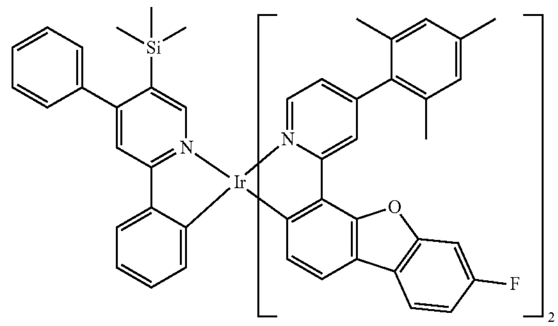
1294
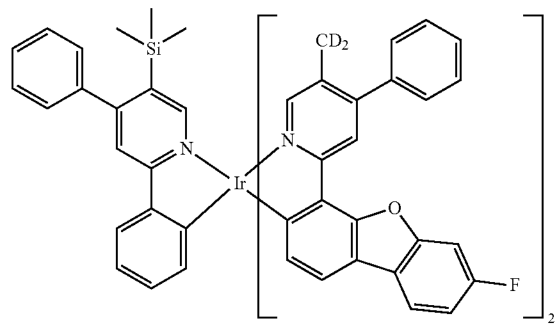
1295
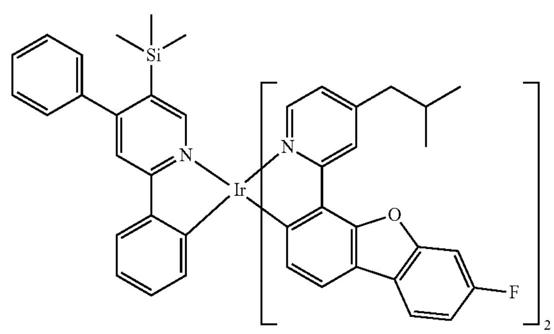
1296
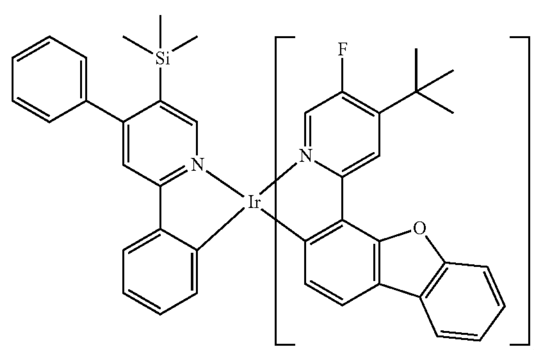

1297
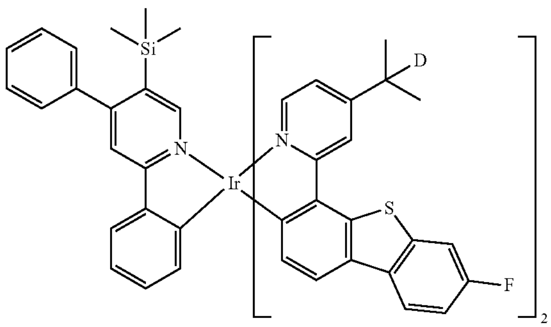
1298
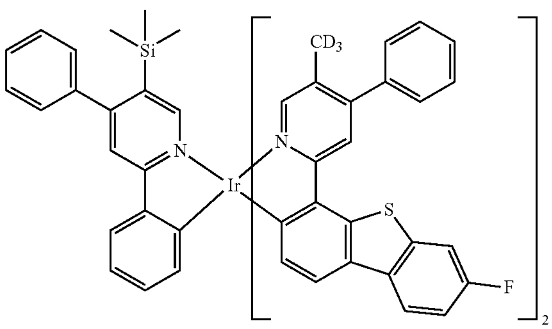
1299
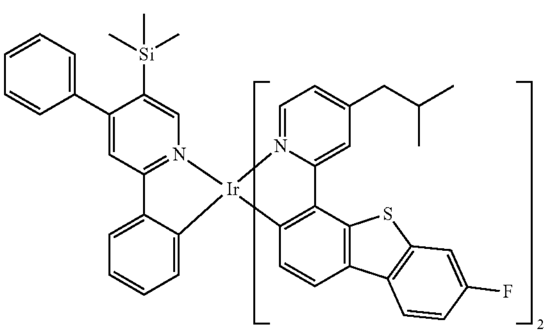
1300
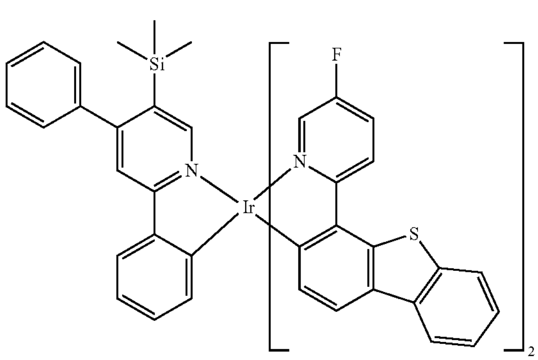
1301
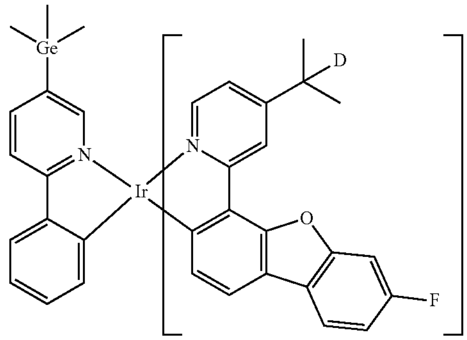
1302
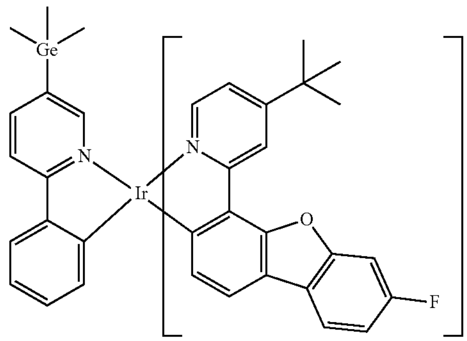
1303
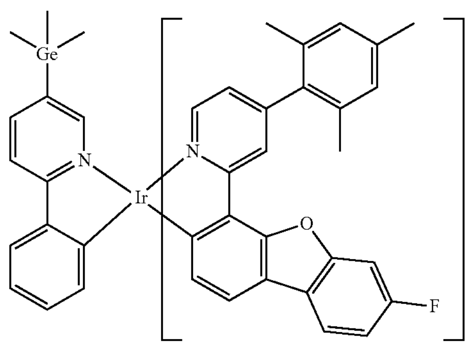
1304
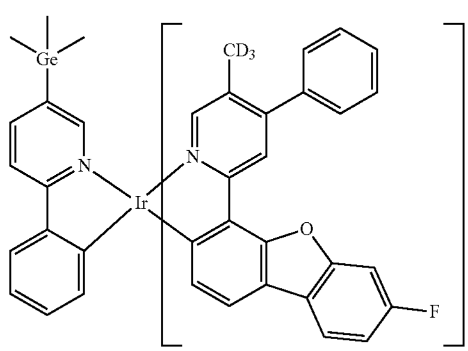

-continued
1305
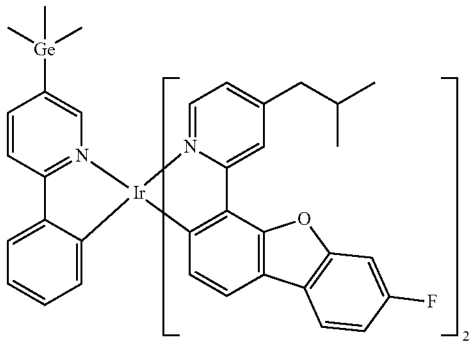
1306
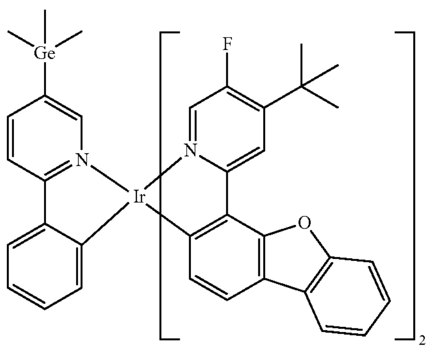
1307
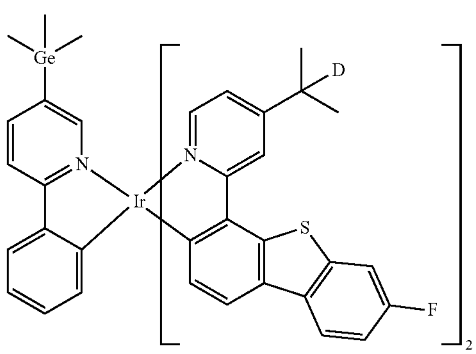
1308
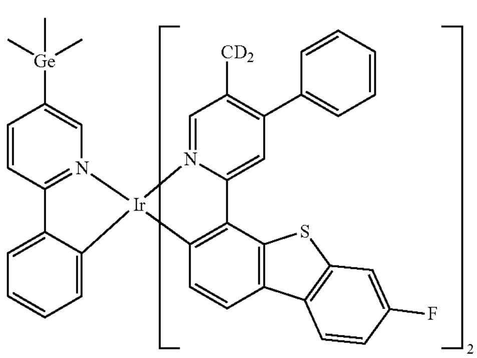
-continued
1309
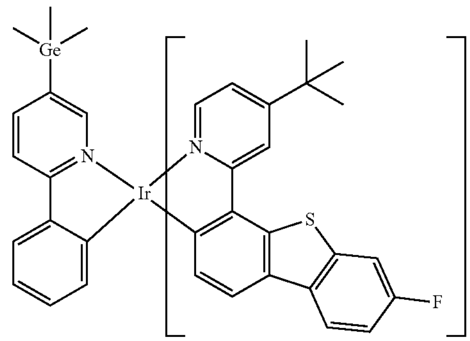
1310
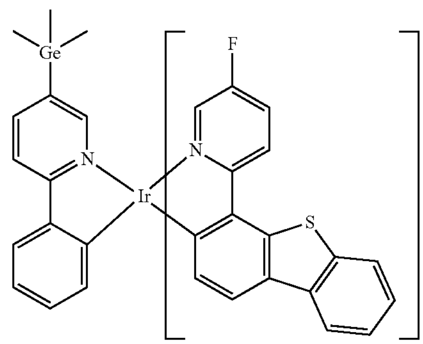
1311
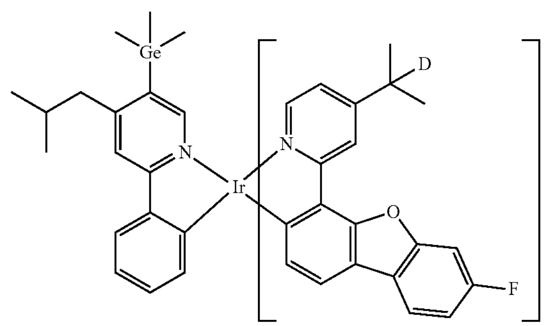
1312
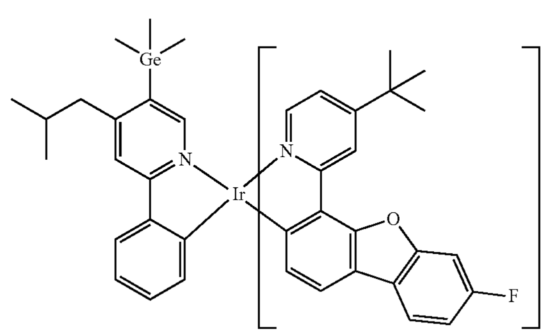

-continued
1313
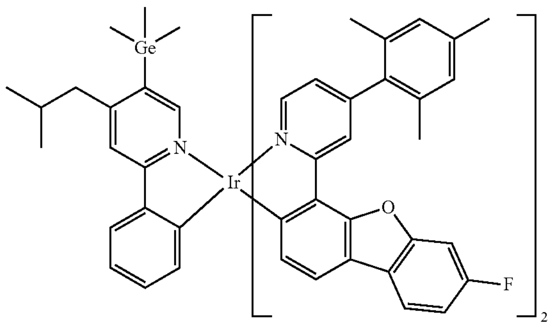
1314
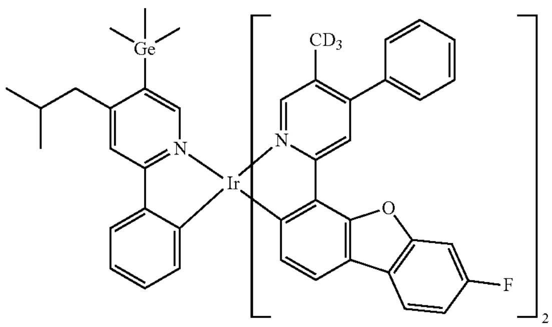
1315
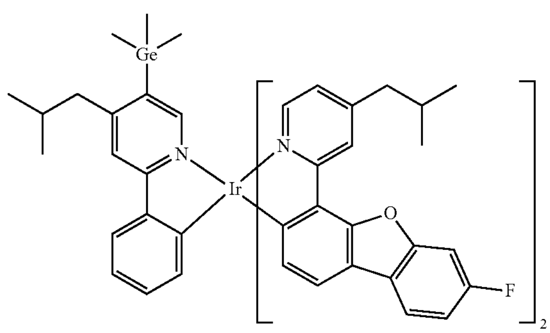
1316
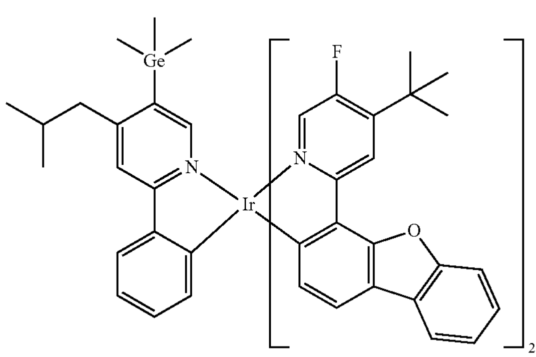
-continued
1317
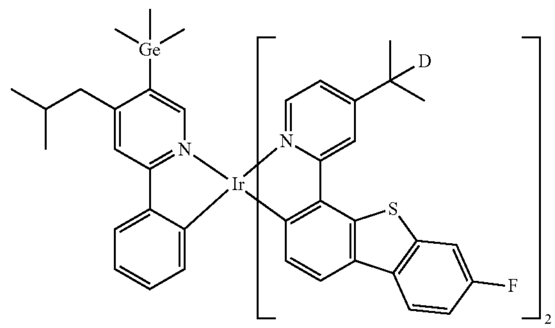
1318
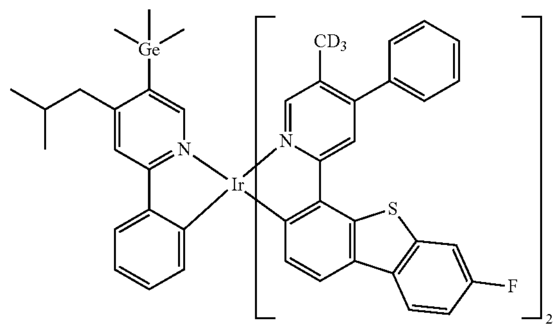
1319
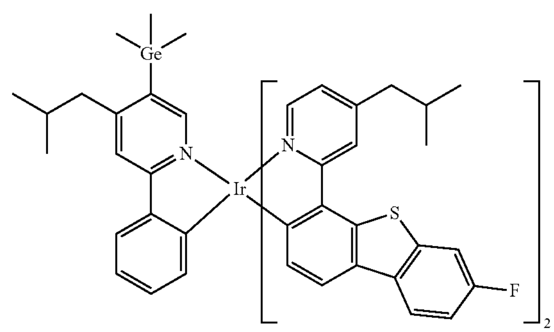
1320
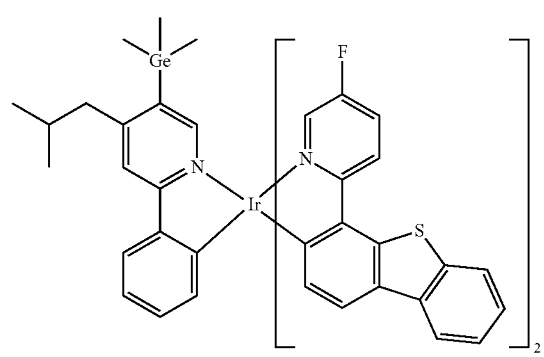

-continued
1321
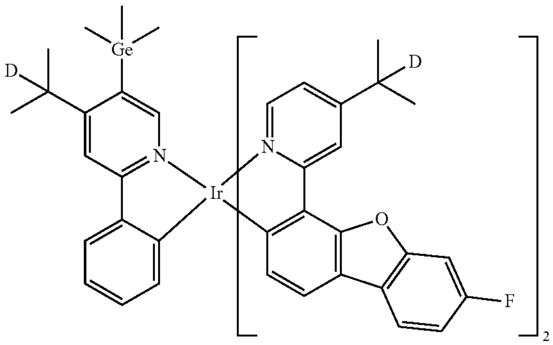
1322
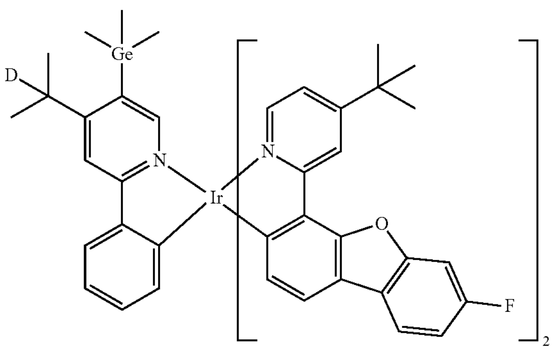
1323
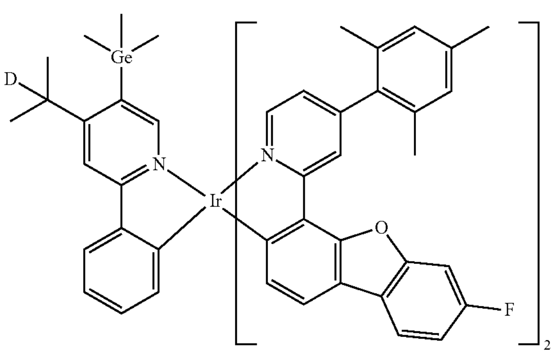
1324
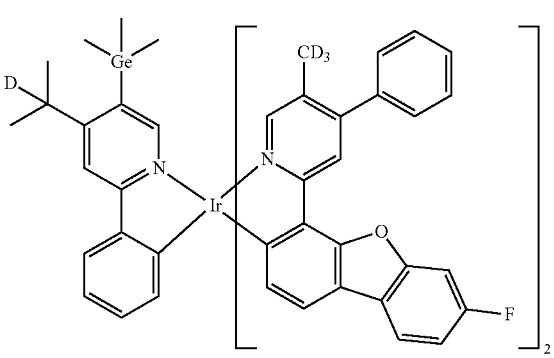
-continued
1325
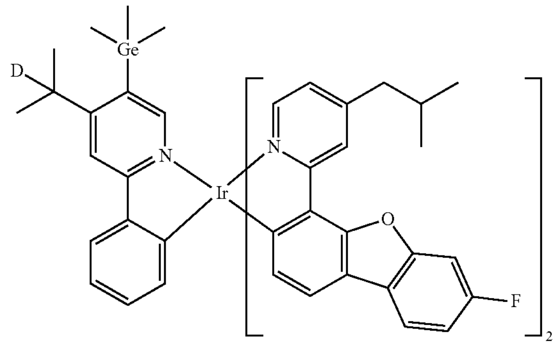
1326
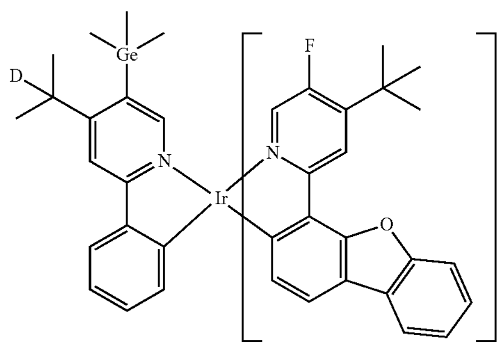
1327
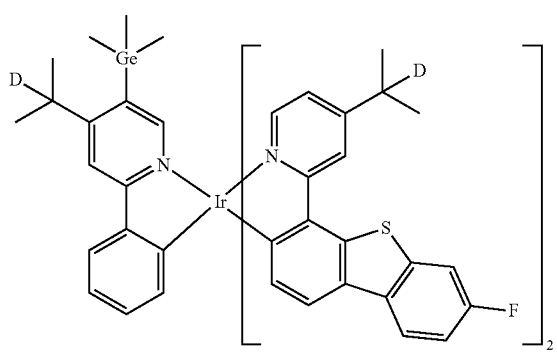
1328
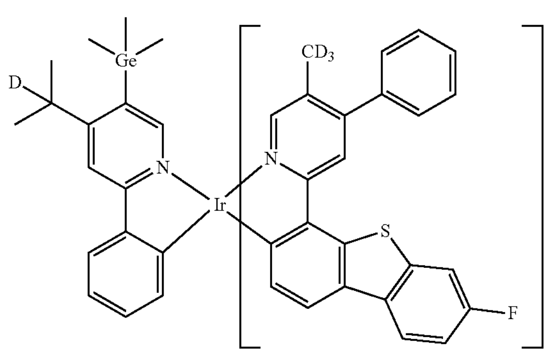

-continued
1329
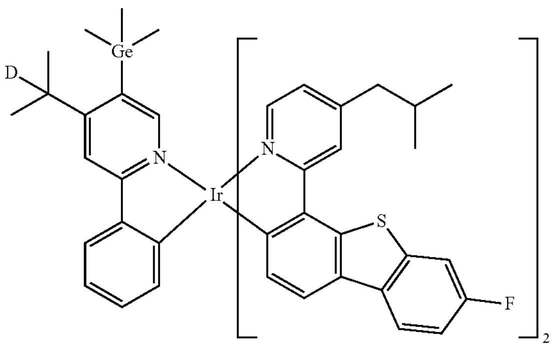
1330
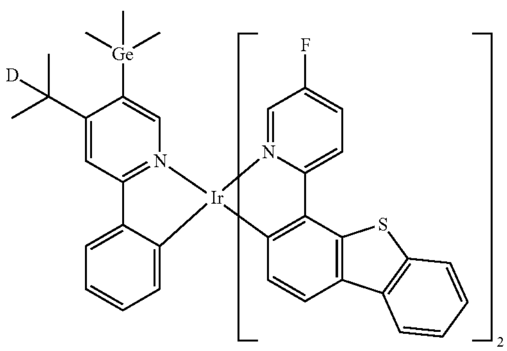
1331
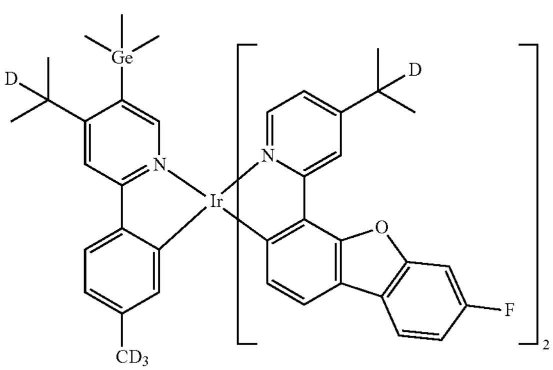
1332
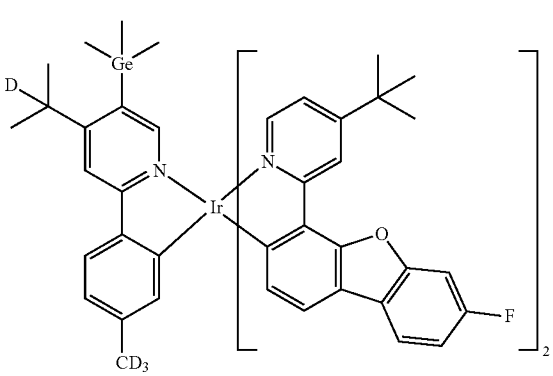
-continued
1333
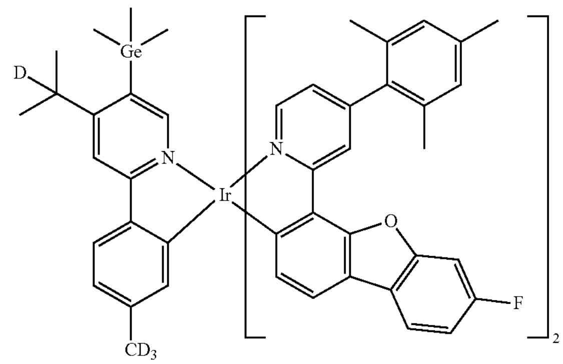
1334
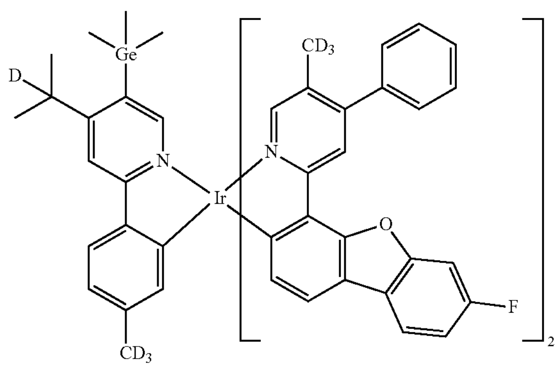
1335
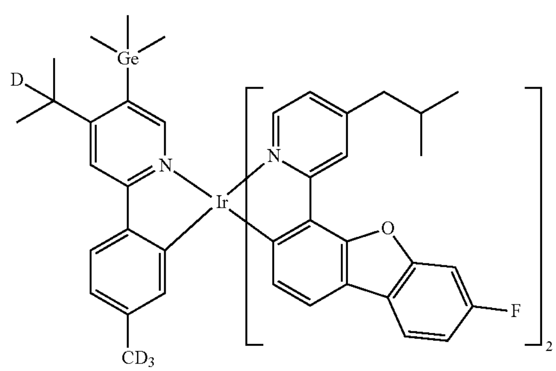
1336
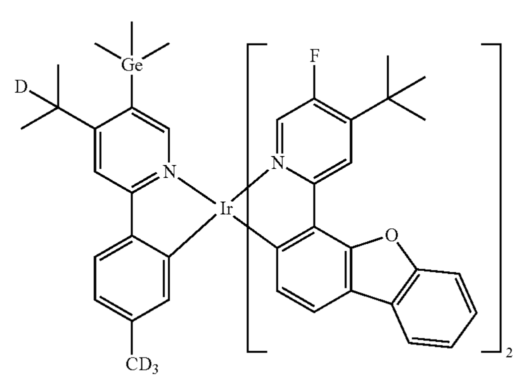

-continued
1337
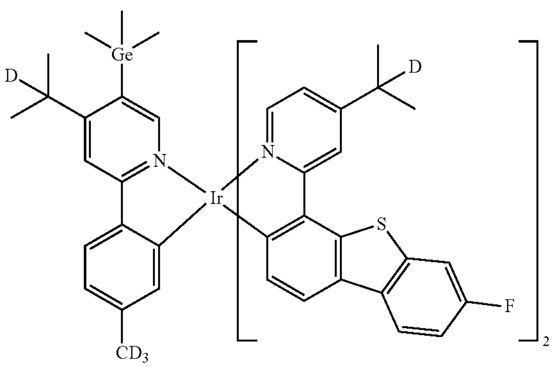
1338
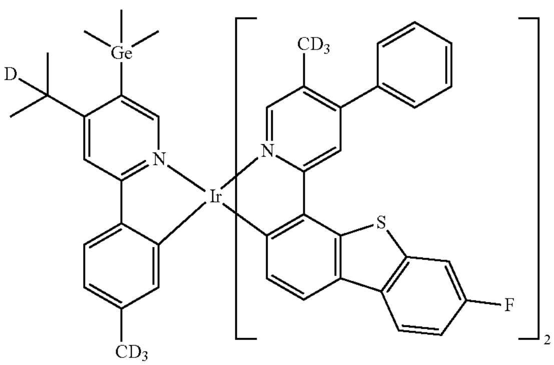
1339
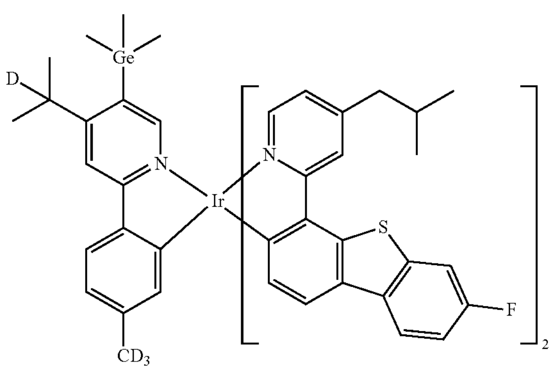
1340
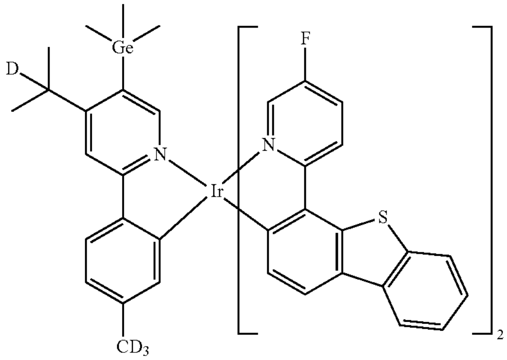
-continued
1341
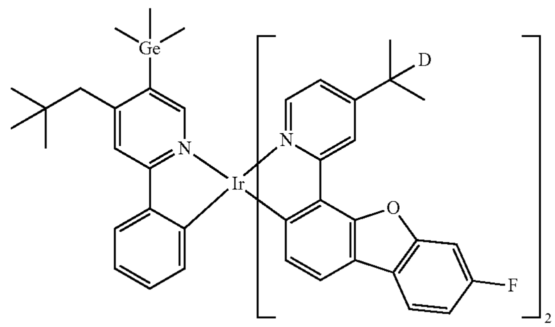
1342
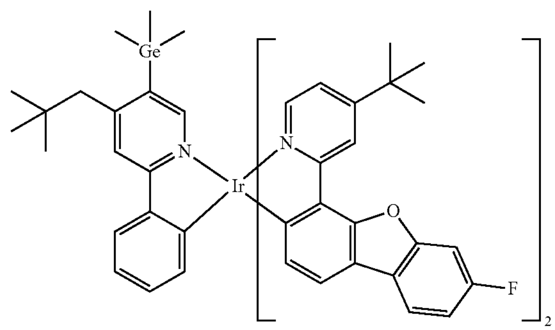
1343
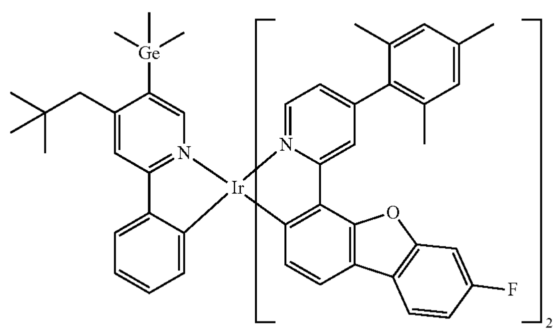
1344
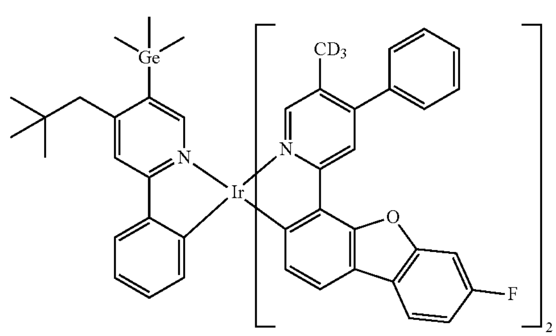

1345
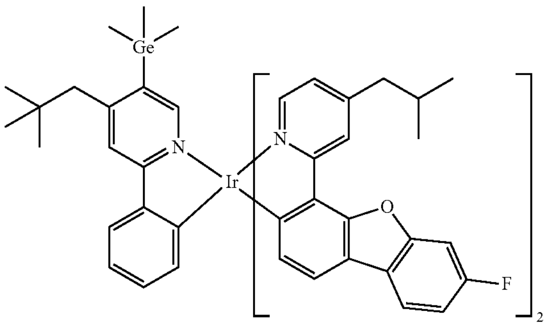
1346
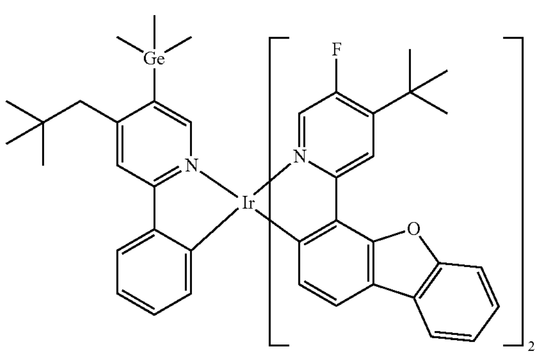
1347
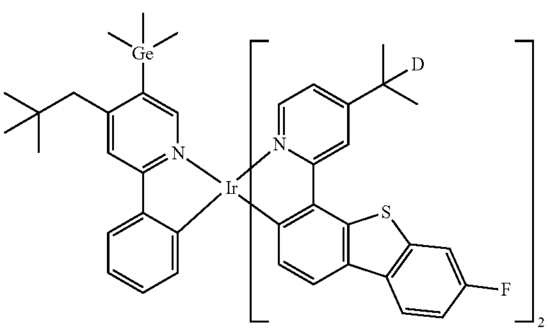
1348
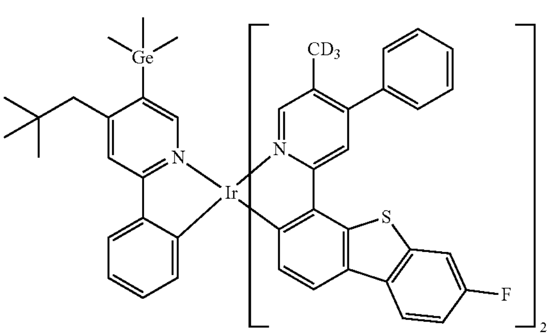
1349
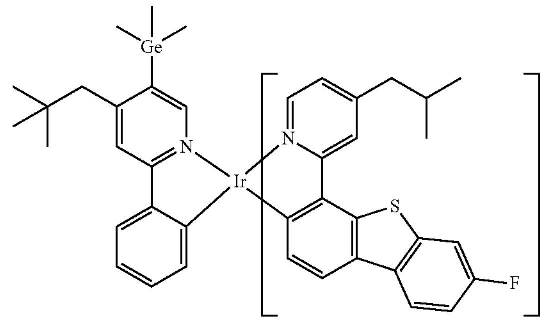
1350
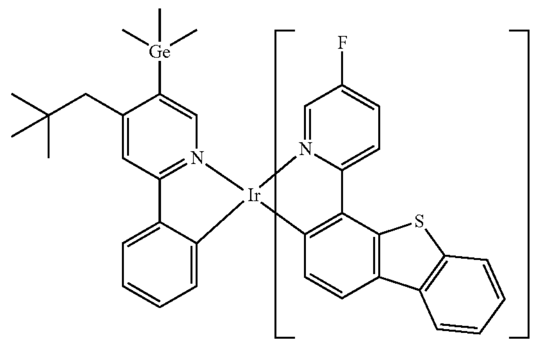
1351
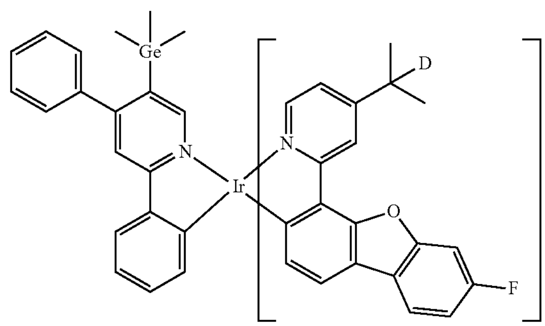
1352
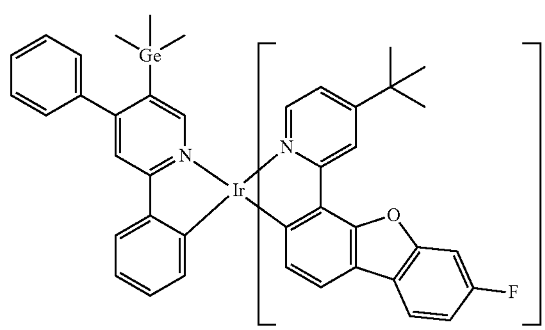

-continued
1353
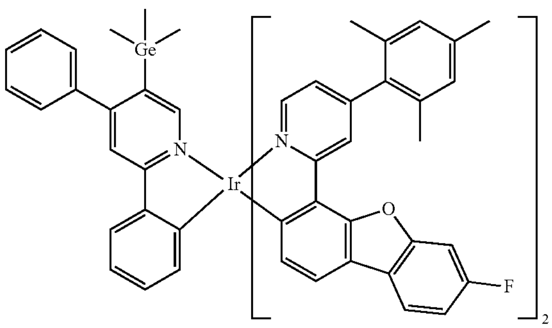
1354
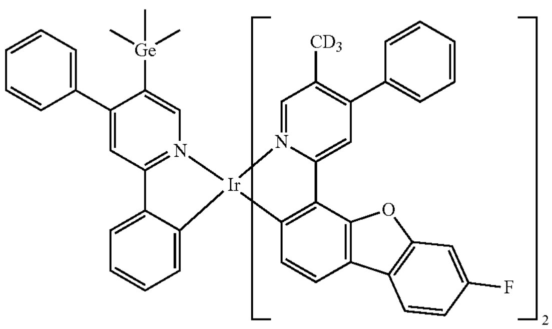
1355
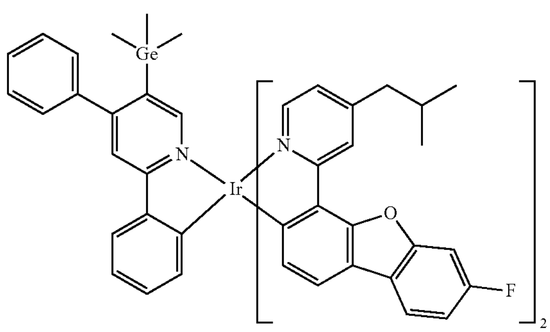
1356
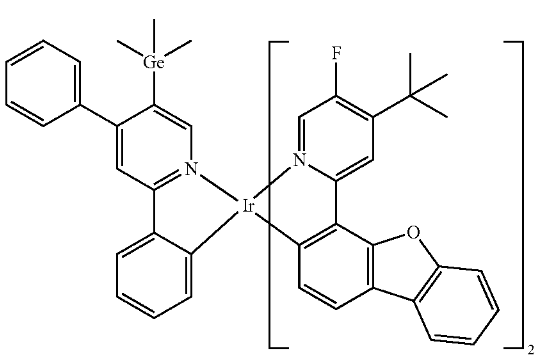
-continued
1357
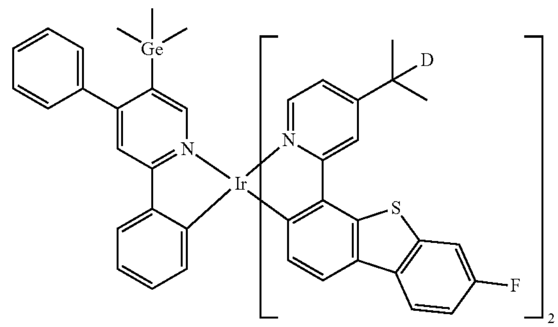
1358
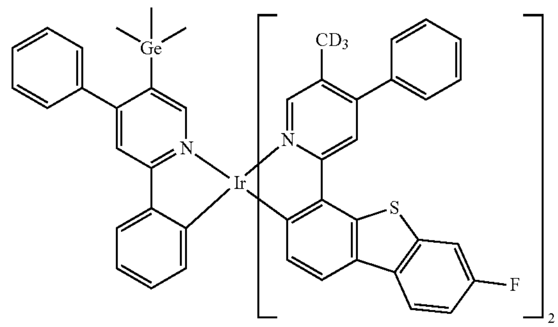
1359
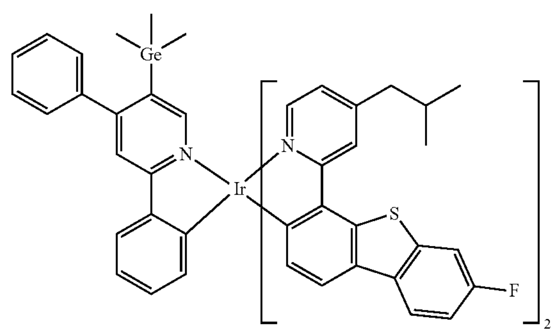
1360
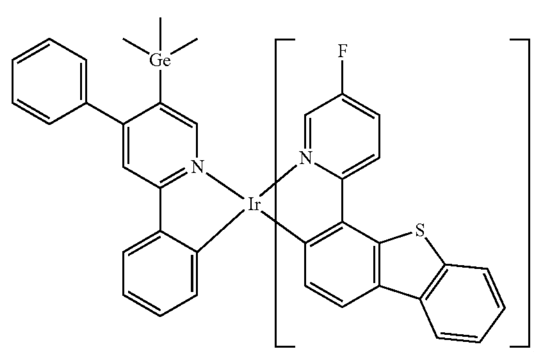

-continued
1361
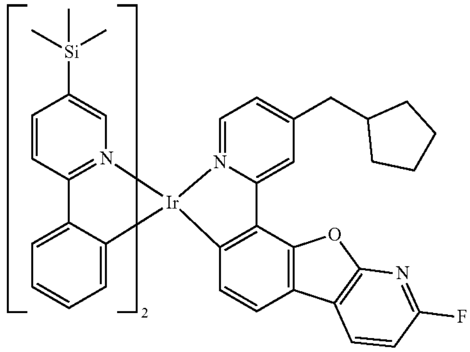
1362
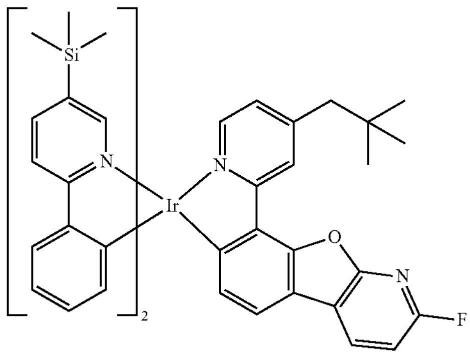
1363
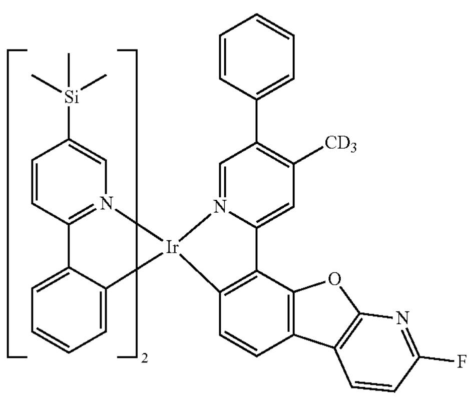
1364
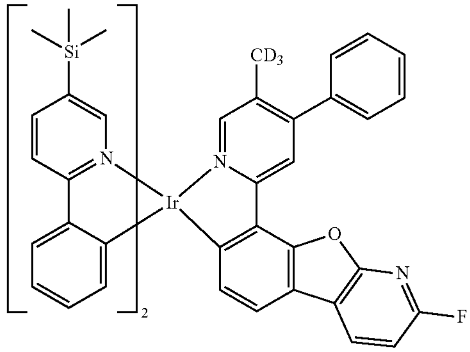
1365
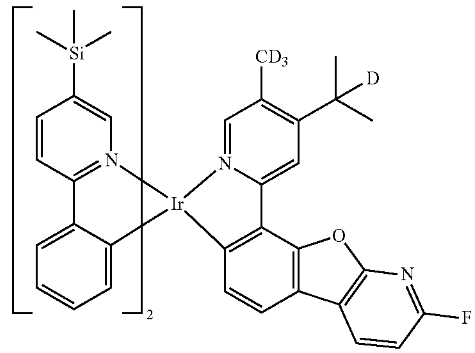
1366
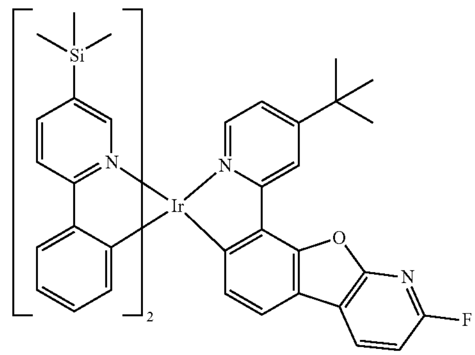
1367
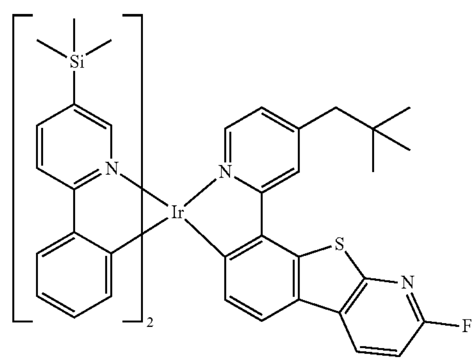
1368
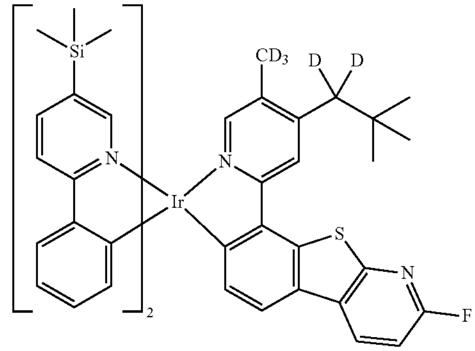

-continued
1369
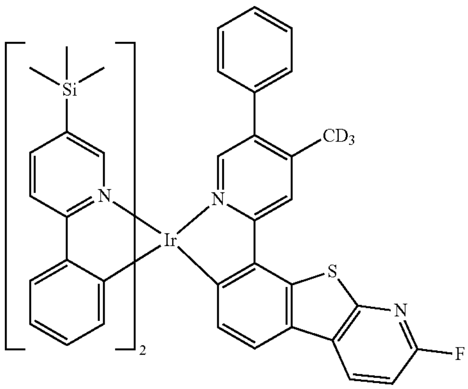
1370
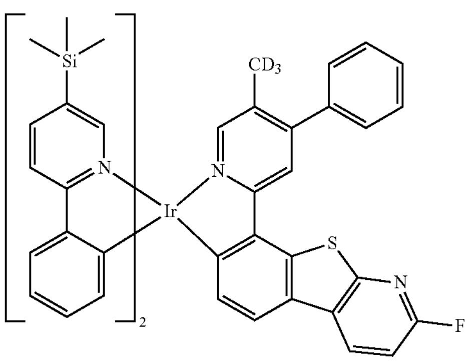
1371
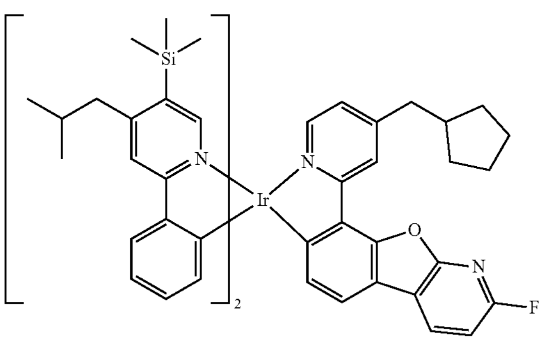
1372
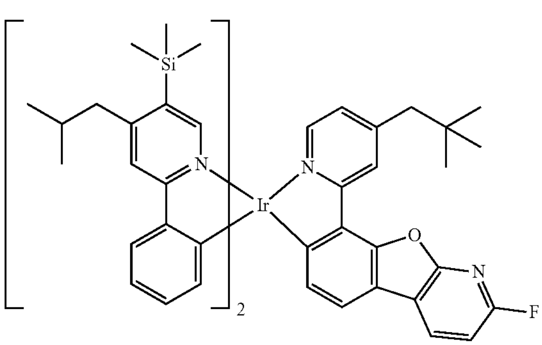
-continued
1373
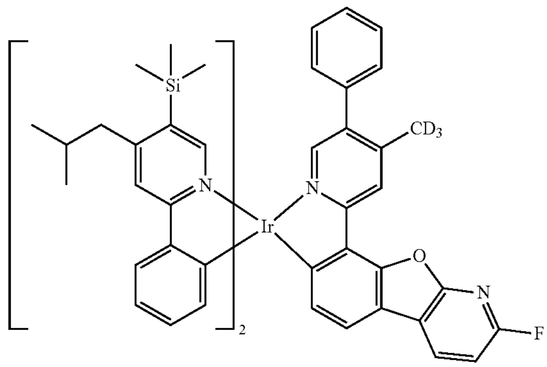
1374
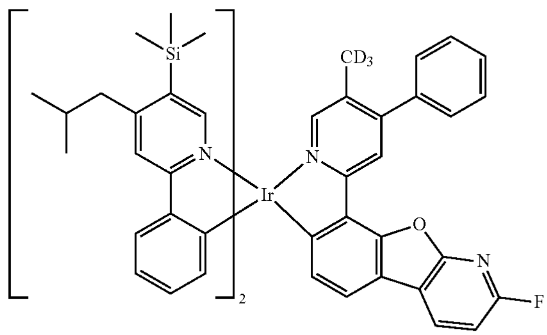
1375
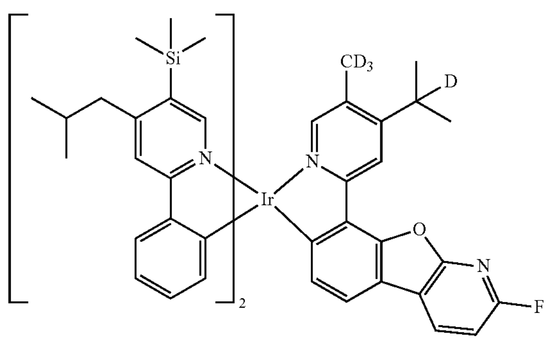
1376
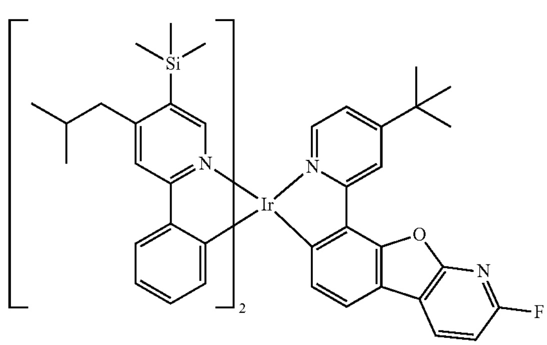

1377
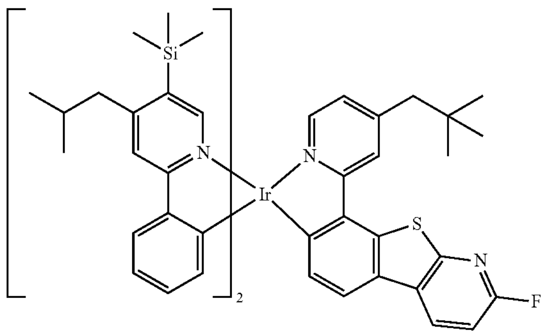
1378
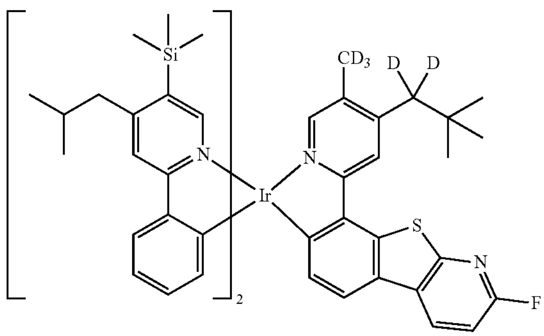
1379
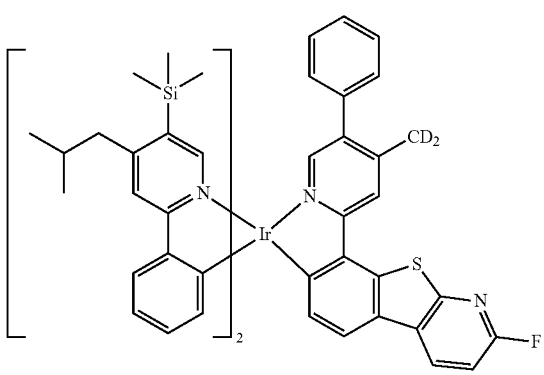
1380
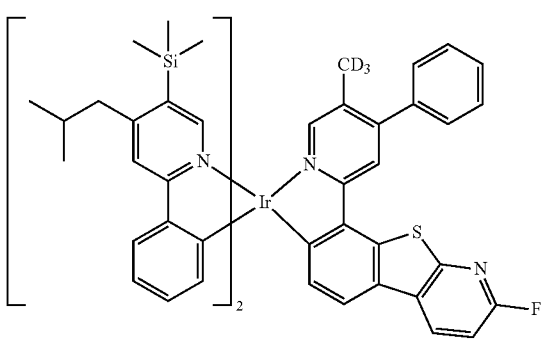
1381
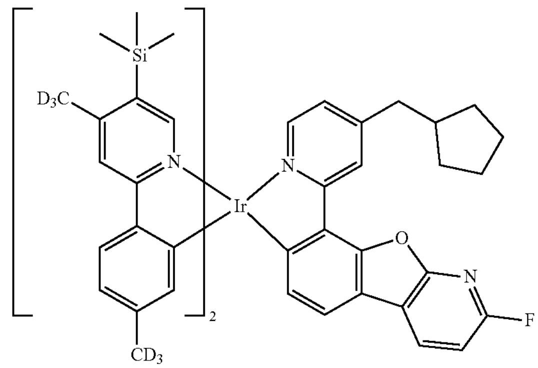
1382
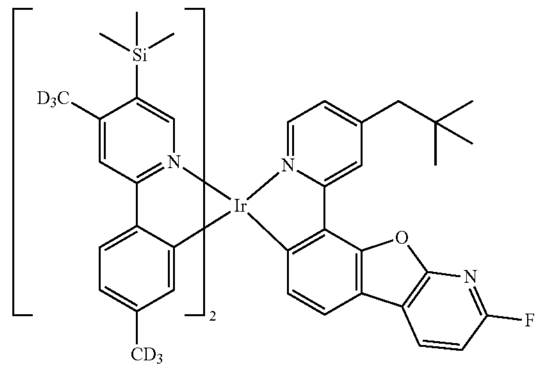
1383
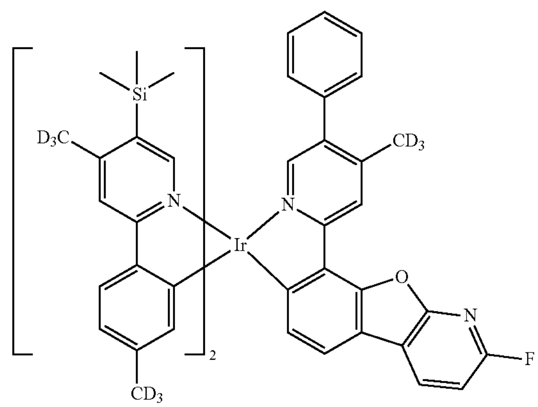
1384
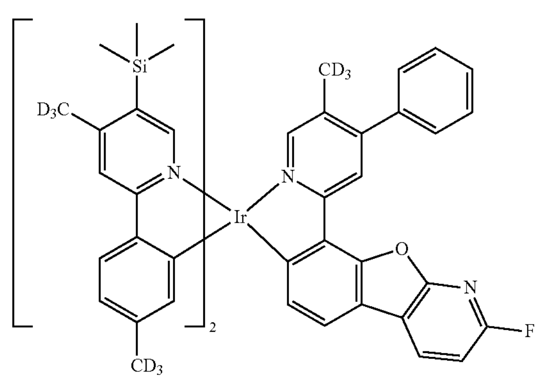

-continued
1385
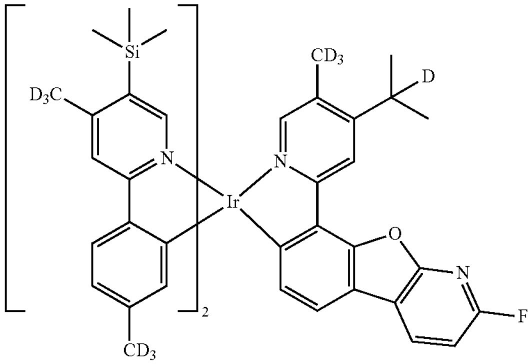
1386
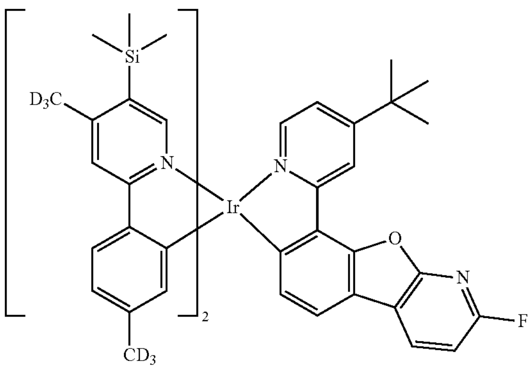
1387
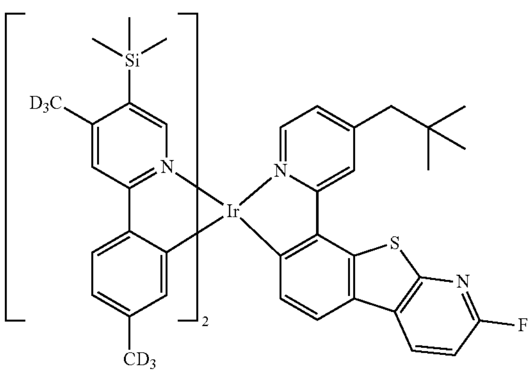
1388
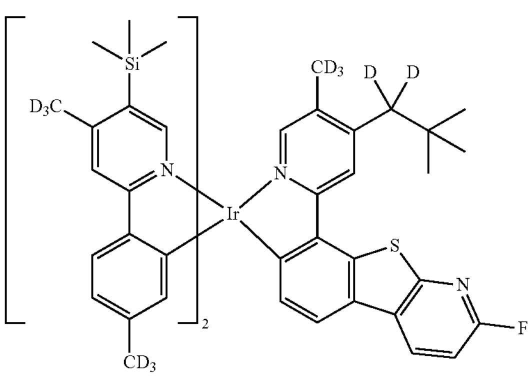
-continued
1389
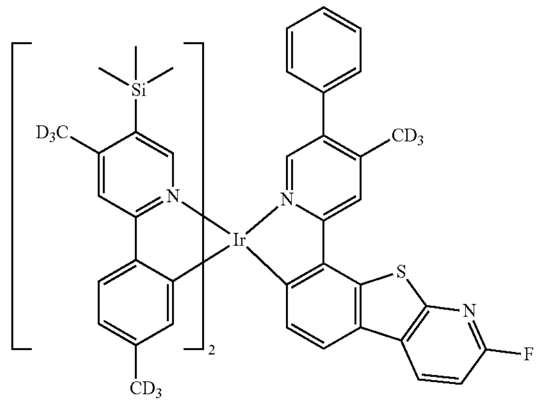
1390
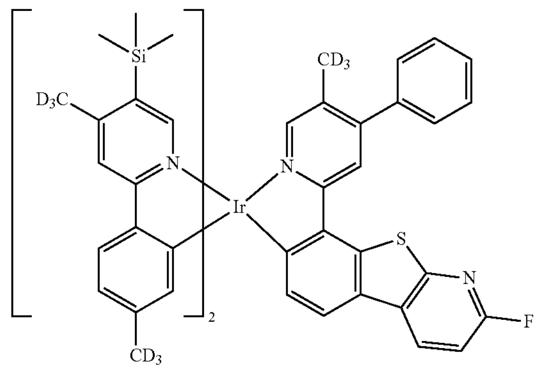
1391
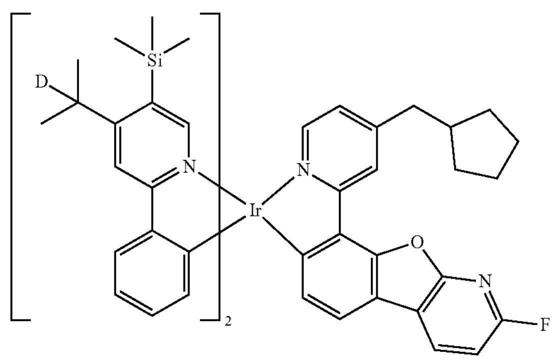
1392
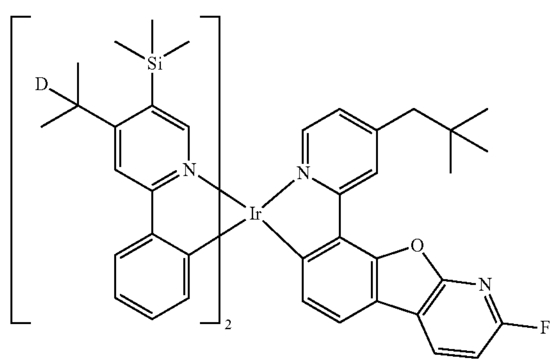

-continued
1393
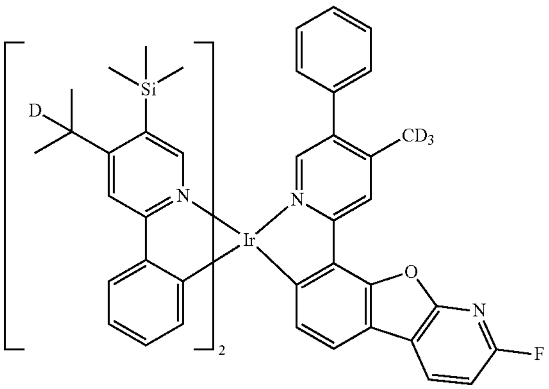
1394
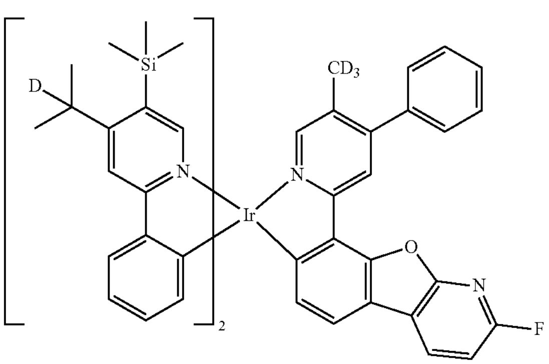
1395
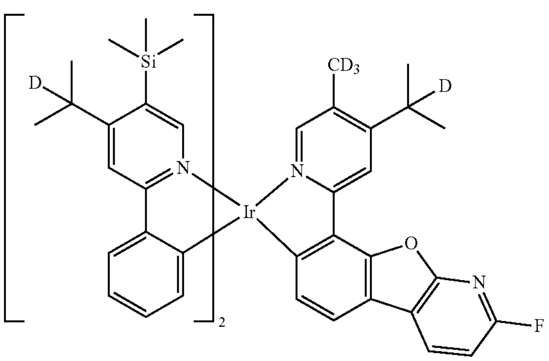
1396
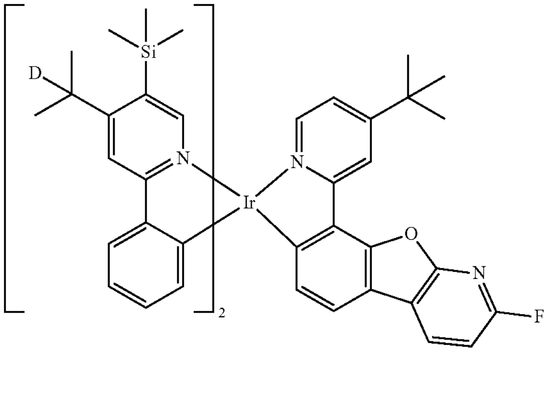
-continued
1397
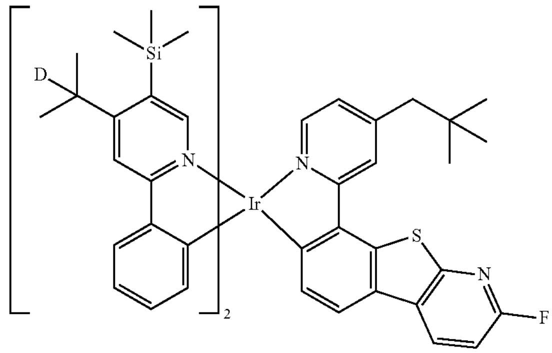
1398
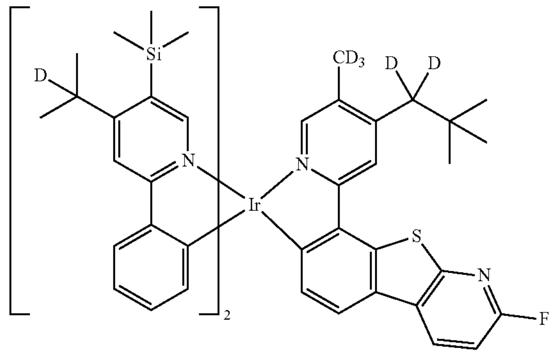
1399
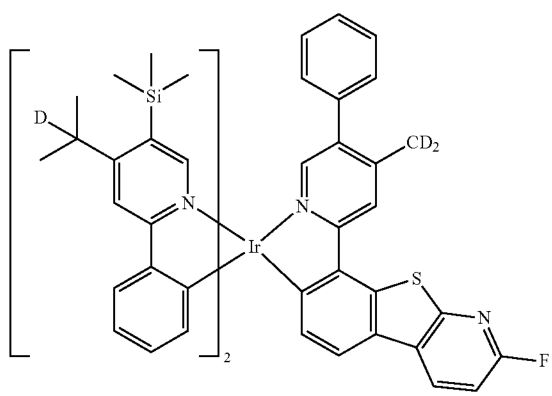
1400
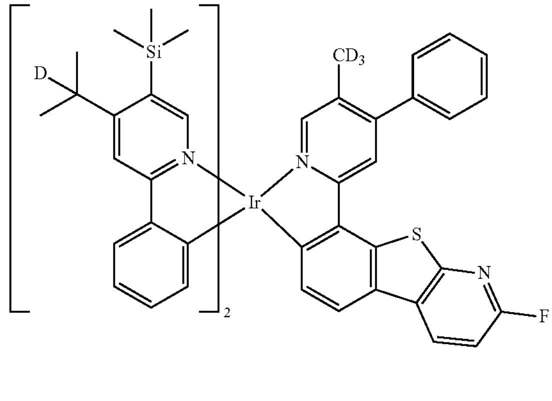

-continued
1401
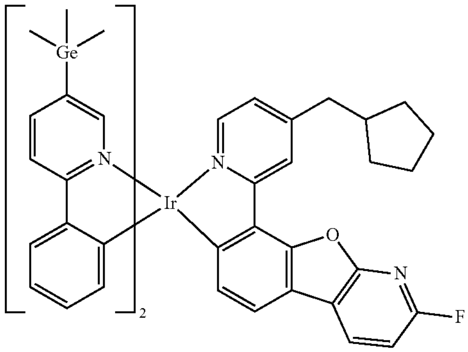
1402
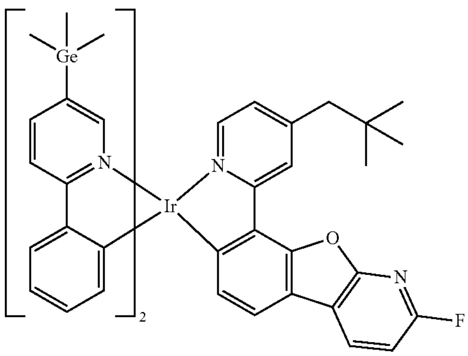
1403
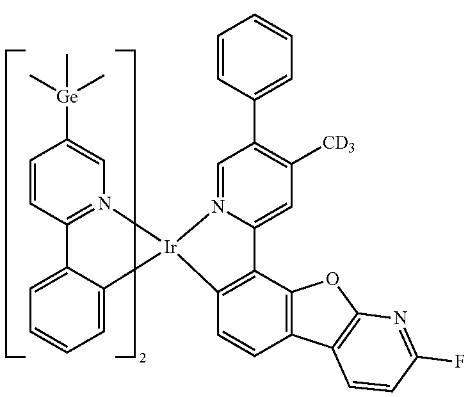
1404
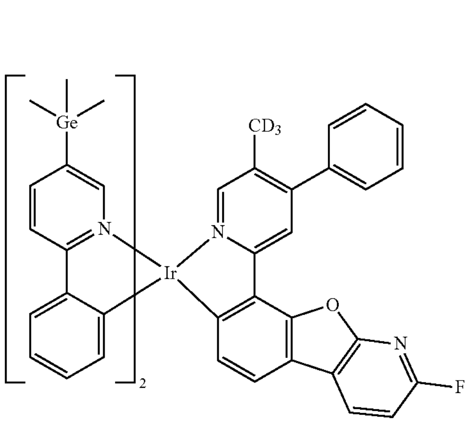
-continued
1405
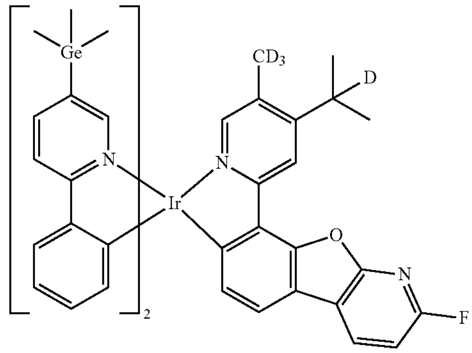
1406
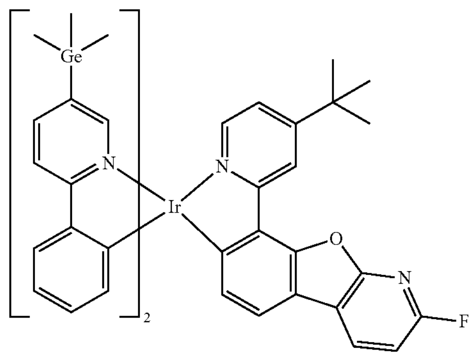
1407
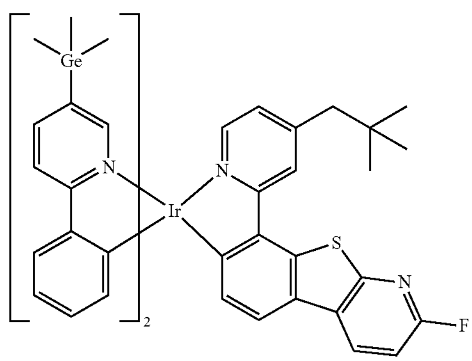
1408
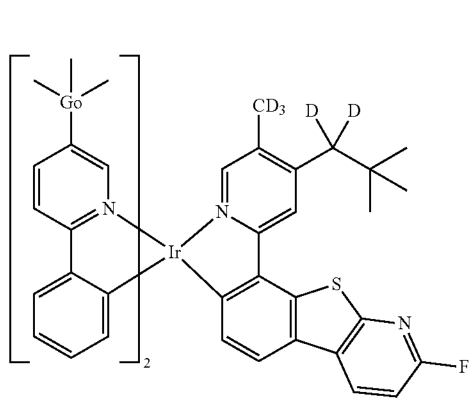

-continued
1409
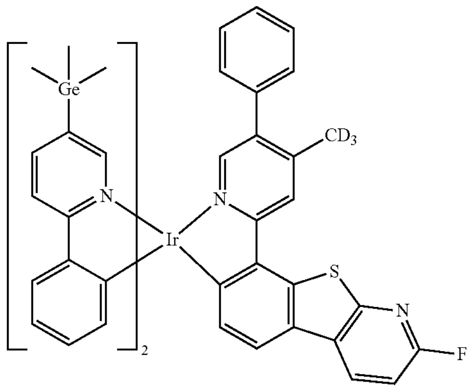
1410
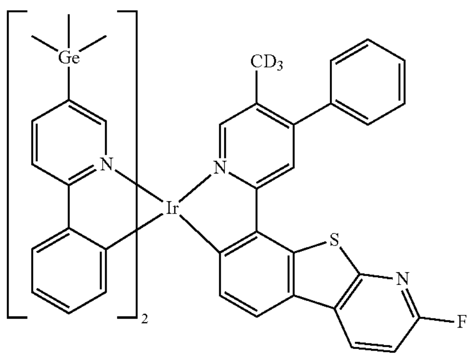
1411
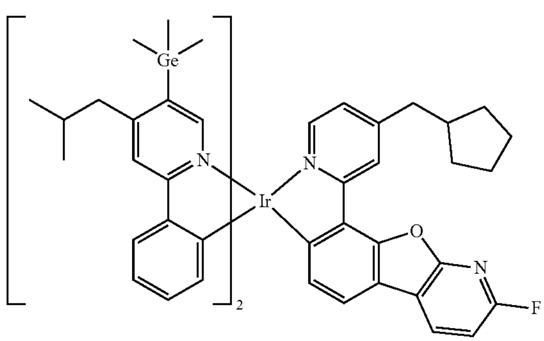
1412
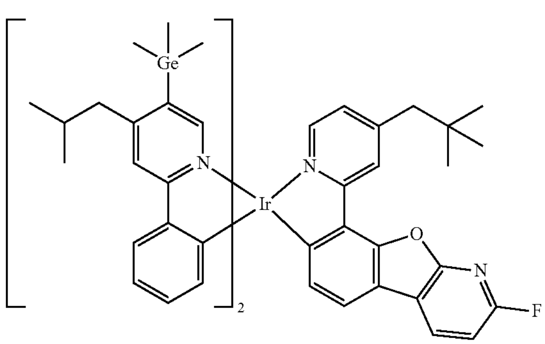
-continued
1413
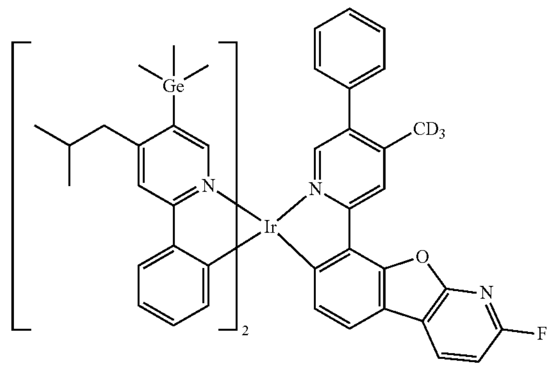
1414
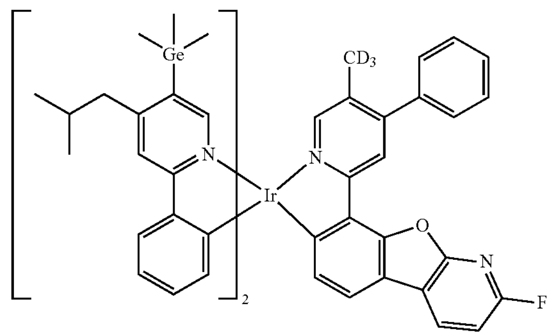
1415
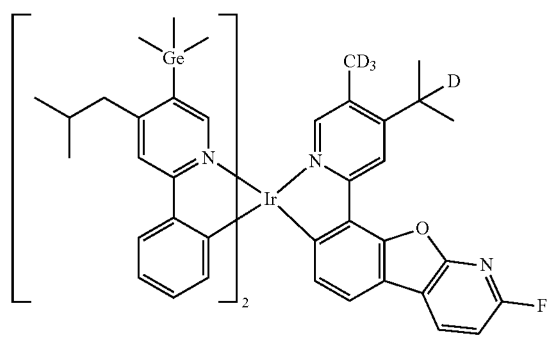
1416
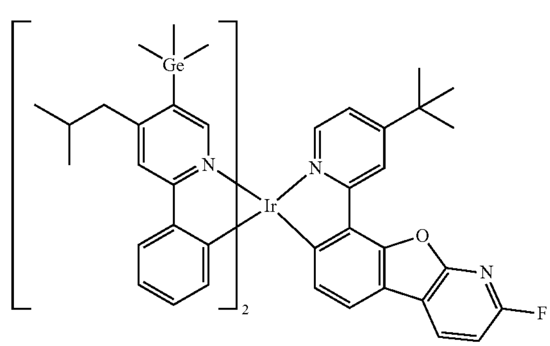

-continued
1417
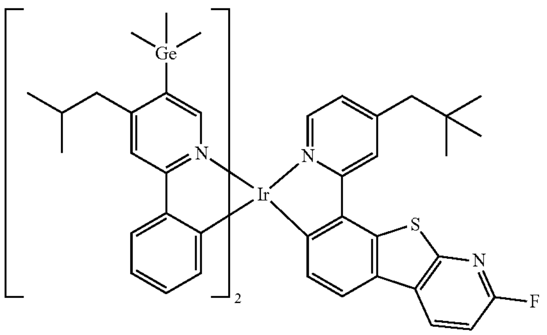
1418
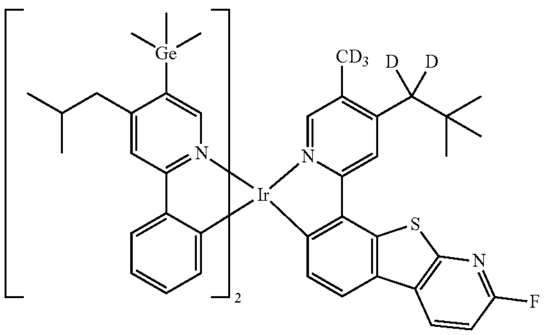
1419
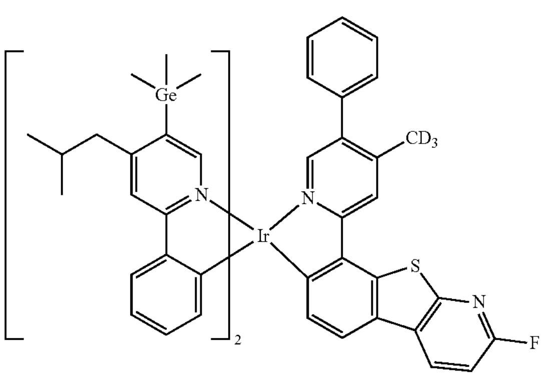
1420
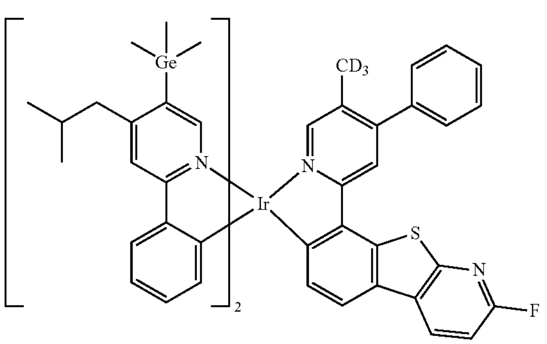
-continued
1421
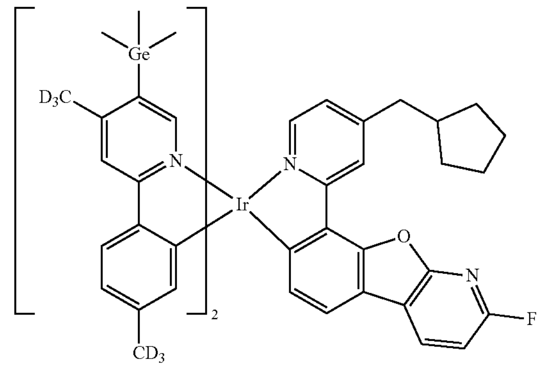
1422
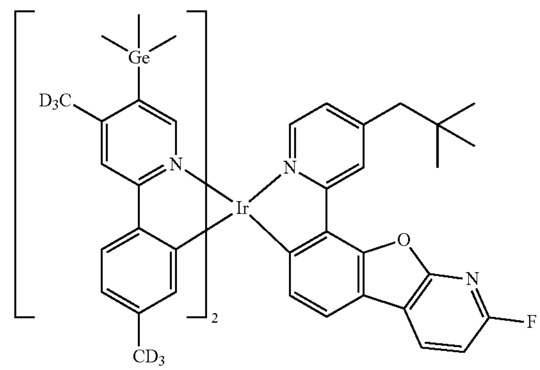
1423
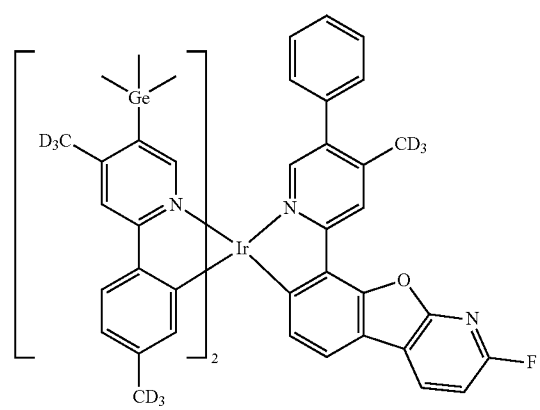
1424
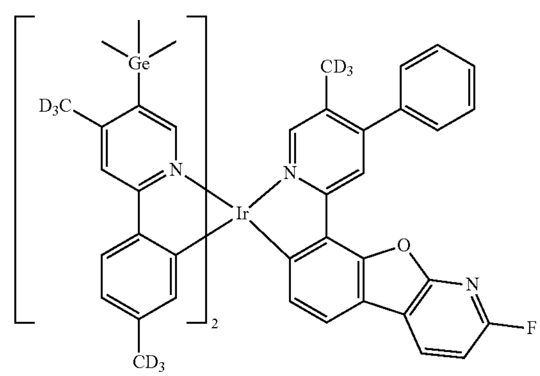

-continued
1425
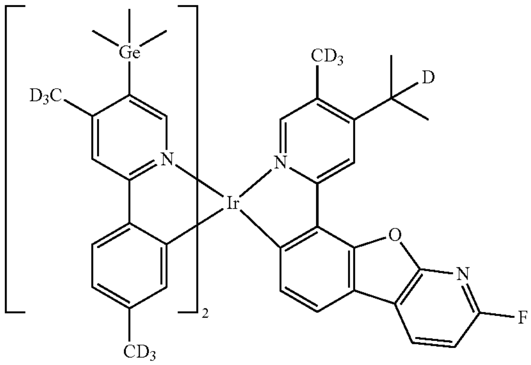
1426
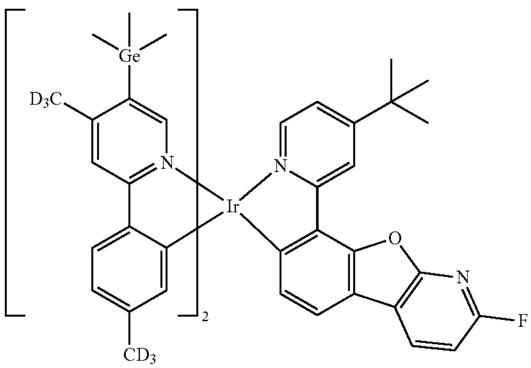
1427
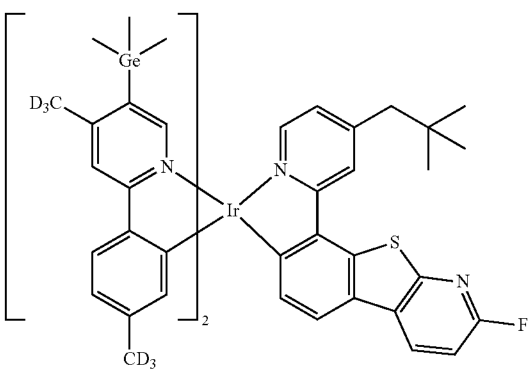
1428
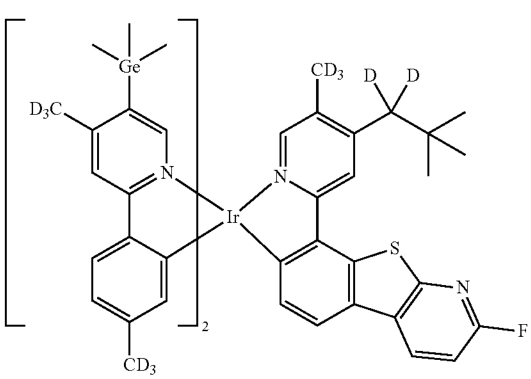
-continued
1429
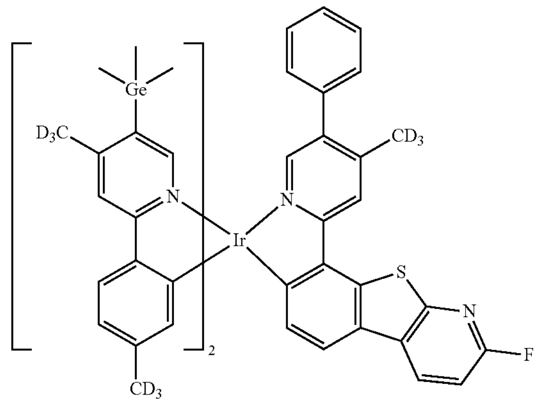
1430
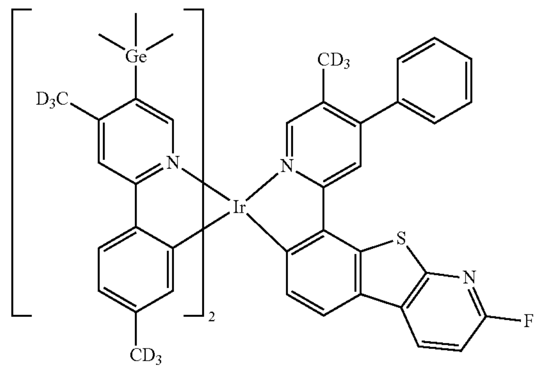
1431
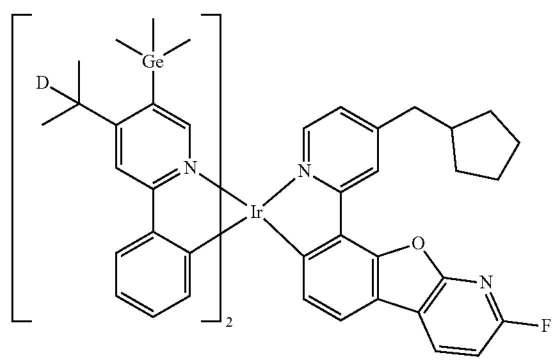
1432
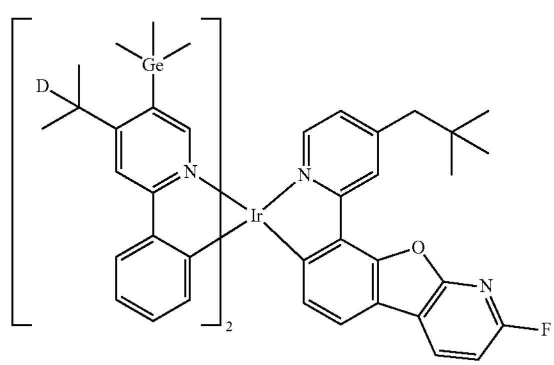

-continued
1433
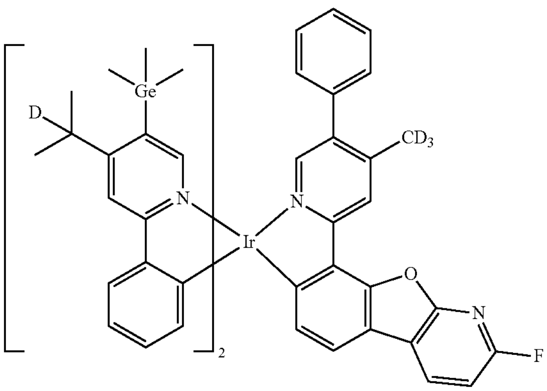
1434
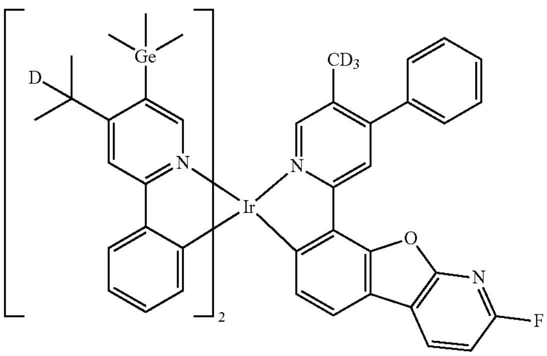
1435
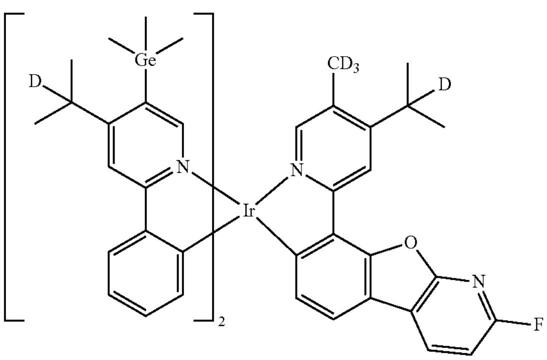
1436
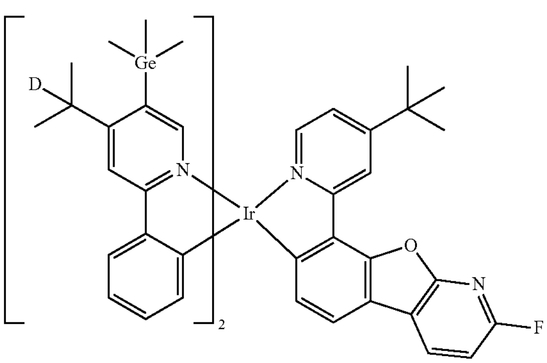
-continued
1437
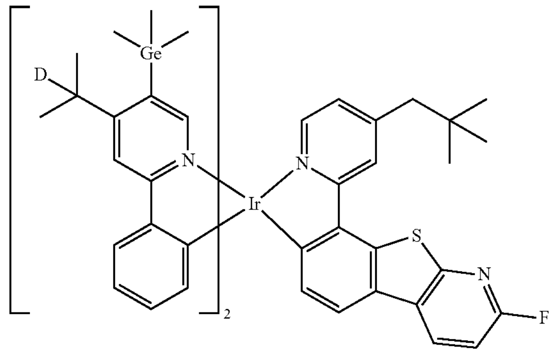
1438
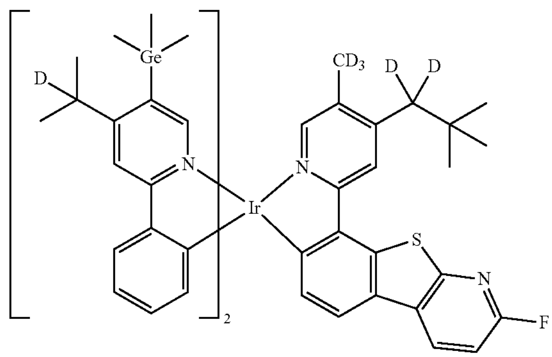
1439
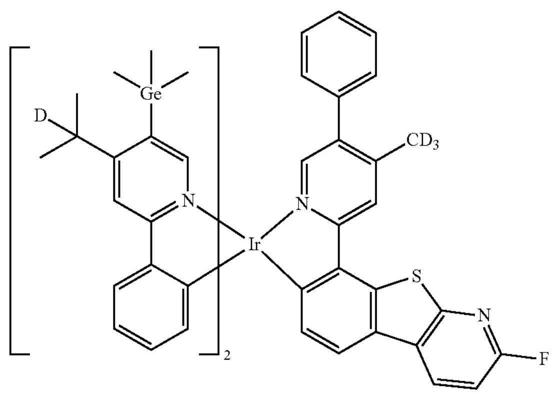
1440
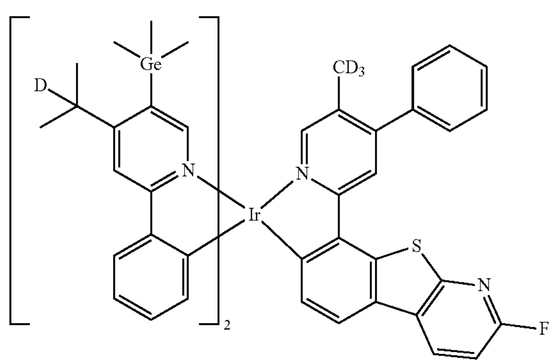
In the organometallic compound represented by Formula 1, $L_1$ may be a ligand represented by Formula 2A, n1 which indicates the number of $L_1$ may be 1 or 2, $L_2$ may be a ligand represented by Formula 2B, n2 which indicates the number of $L_2$ may be 1 or 2, and $L_1$ and $L_2$ may be different from each other. That is, the organometallic compound may be a heteroleptic complex that includes, as a ligand bonded to metal M, at least one ligand represented by Formula 2A and at least one ligand represented by Formula 2B.

In Formulae 2A and 2B, $Z_1$, $Z_3$, and $Z_4$ may each independently be a fluoro group or a fluorinated group, $Z_2$ may be a fluoro group, a fluorinated non-cyclic group, or a fluorinated saturated cyclic group, and the sum of a1, a2, a3, and a4 may be 1 or more. That is, the organometallic compound represented by Formula 1 may include at least one fluoro group. Accordingly, the organometallic compound represented by Formula 1 may have a relatively deep highest occupied molecular orbital (HOMO) energy level (that is, a large absolute value of HOMO energy level) and improved charge mobility.

In an embodiment, when i) none of $T_1$ to $T_8$ in Formula 2A is N, ii) a2 in Formula 2A is not 0, and iii) $Z_2$ in Formula 2A is a fluoro group, then a) b3 in Formula 2B may not be 0, and b) at least one of $R_3$(s) in the number of b3 in Formula 2B may be —Si($Q_3$)($Q_4$)($Q_5$) or —Ge($Q_3$)($Q_4$)($Q_5$). Accordingly, the organometallic compound represented by Formula 1 may have improved molecular orientation, so that the orientation of the organometallic compound represented by Formula 1 with a compound, such as a host, used with the organometallic compound may be also improved.

In an embodiment, an electronic device using the organometallic compound represented by Formula 1, for example, an organic light-emitting device using the organometallic compound represented by Formula 1 may have improved luminescence efficiency and/or long lifespan characteristics.

The HOMO energy level, lowest unoccupied molecular orbital (LUMO) energy level, $S_1$ energy level, and $T_1$ energy level of some compounds of the organometallic compound represented by Formula 1 are evaluated using the Gaussian 09 program with the molecular structure optimization obtained by B3LYP-based density functional theory (DFT), and results thereof are shown in Table 1.

TABLE 1

| Compound No. | HOMO (eV) | LUMO (eV) | $S_1$ (eV) | $T_1$ (eV) |
|---|---|---|---|---|
| 182 | −4.766 | −1.206 | 2.878 | 2.544 |
| 486 | −4.834 | −1.325 | 2.810 | 2.499 |
| 717 | −4.818 | −1.199 | 2.942 | 2.561 |

From Table 1, it is confirmed that the organometallic compound represented by Formula 1 has such electric characteristics that are suitable for use as a dopant for an electronic device, for example, an organic light-emitting device.

Synthesis methods of the organometallic compound represented by Formula 1 may be recognizable by one of ordinary skill in the art by referring to Synthesis Examples provided below.

Accordingly, the organometallic compound represented by Formula 1 is suitable for use as a material for an organic layer of an organic light-emitting device, for example, a dopant in an emission layer of the organic layer. Thus, an aspect of the present disclosure provides an organic light-emitting device including: a first electrode; a second electrode; and an organic layer arranged between the first electrode and the second electrode, wherein the organic layer includes an emission layer, wherein he organic layer further includes at least one organometallic compound represented by Formula 1.

While not wishing to be bound by theory, it is understood that due to the inclusion of the organic layer including the organometallic compound represented by Formula 1 described above, the organic light-emitting device may have high external quantum efficiency and long lifespan characteristics.

The organometallic compound of Formula 1 may be used between a pair of electrodes of the organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit, for example, green light to blue light.

The expression "(an organic layer) includes at least one of organometallic compounds" as used herein may include a case in which "(an organic layer) includes identical organometallic compounds represented by Formula 1" and a case in which "(an organic layer) includes two or more different organometallic compounds represented by Formula 1".

In an embodiment, the organic layer may include, as the organometallic compound, only Compound 1. In an embodiment, Compound 1 may be included in the emission layer of the organic light-emitting device. In an embodiment, the organic layer may include, as the organometallic compound, Compound 1 and Compound 2. In an embodiment, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

For example, in the organic light-emitting device, the first electrode may be an anode, and the second electrode may be a cathode, and the organic layer may further include a hole transport region between the first electrode and the emission layer and an electron transport region between the emission layer and the second electrode, wherein the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

FIG. 1 is a schematic cross-sectional view of an organic light-emitting device 10 according to an embodiment. Hereinafter, the structure of an organic light-emitting device according to an embodiment of the present disclosure and a method of manufacturing an organic light-emitting device according to an embodiment of the present disclosure will be described in connection with the FIGURE. The organic light-emitting device 10 includes a first electrode 11, an organic layer 15, and a second electrode 19, which are sequentially stacked.

A substrate may be additionally arranged under the first electrode 11 or above the second electrode 19. For use as the substrate, any suitable substrate that is used in organic light-emitting devices available in the art may be used, and the substrate may be a glass substrate or a transparent plastic substrate, each having suitable mechanical strength, thermal stability, transparency, surface smoothness, ease of handling, and water resistance.

In an embodiment, the first electrode 11 may be formed by, for example, depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. In an embodiment, the material for forming the first electrode 11 may be indium tin oxide (ITO), indium zinc oxide (IZO), tin oxide ($SnO_2$), or zinc oxide (ZnO). In an embodiment, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is arranged on the first electrode 11.

The organic layer 15 may include: a hole transport region; an emission layer; and an electron transport region.

The hole transport region may be arranged between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. The hole transport region may have a hole injection layer/hole transport layer structure or a hole injection layer/hole transport layer/electron blocking layer structure, wherein, in each structure, layers are sequentially stacked on the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature in a range about 100° C. to about 500° C., for example, from about 100° C. to about 400° C., from about 100° C. to about 300° C., from about 100° C. to about 200° C., a vacuum pressure in a range of about $10^{-8}$ torr to about $10^{-3}$ torr, for example, from about $10^{-8}$ torr to about $10^{-7}$ torr, from about $10^{-8}$ torr to about $10^{-6}$ torr, from about $10^{-8}$ torr to about $10^{-5}$ torr, from about $10^{-8}$ torr to about $10^{-4}$ torr, and a deposition rate in a range of about 0.01 Å/sec to about 100 Å/sec, for example, from about 0.01 Å/sec to about 10 Å/sec, from about 0.01 Å/sec to about 30 Å/sec, about 0.01 Å/sec to about 50 Å/sec, from about 0.01 Å/sec to about 70 Å/sec, or from about 0.01 Å/sec to about 90 Å/sec.

When the hole injection layer is formed by spin coating, the coating conditions may vary according to a material that is used to form the hole injection layer, and the structure and thermal characteristics of the hole injection layer. For example, the coating conditions may include a coating speed in a range of about 2,000 rpm (revolutions per minute) to about 5,000 rpm, for example, from about 2,000 rpm to about 3,000 rpm, from about 2,000 rpm to about 4,000 rpm, and a temperature at which a heat treatment is performed to remove a solvent after coating in a range of about 80° C. to about 200° C., for example, from about 80° C. to about 100° C., from about 80° C. to about 120° C., from about 80° C. to about 140° C., from about 80° C. to about 160° C., or from about 80° C. to about 180° C.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PAN I/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or a combination thereof:

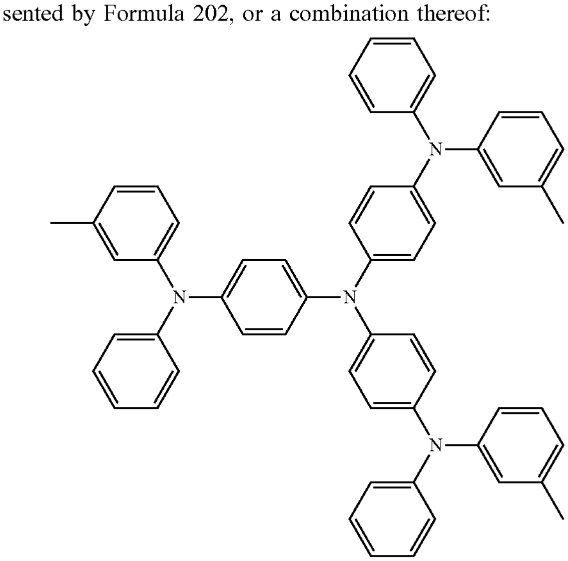

m-MTDATA

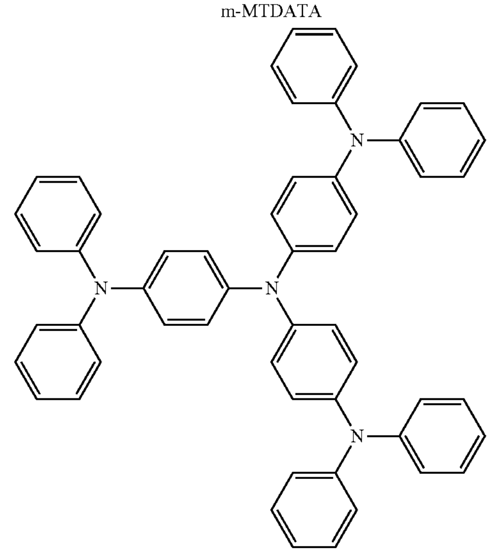

TDATA

-continued
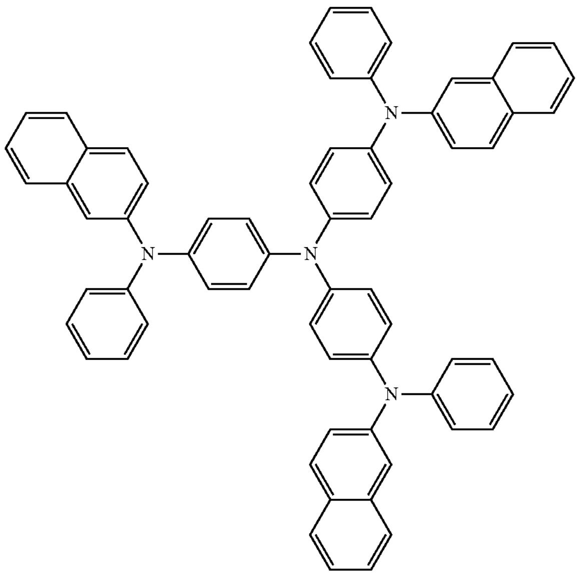
2-TNATA
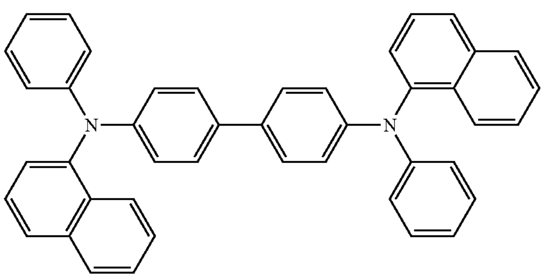
NPB
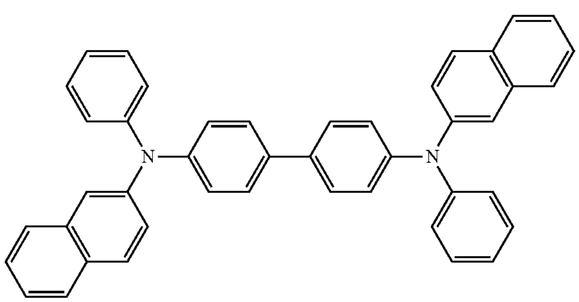
β-NPB
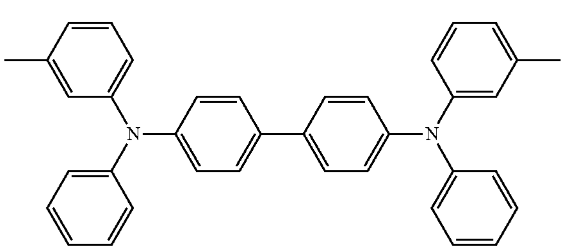
TPD
-continued
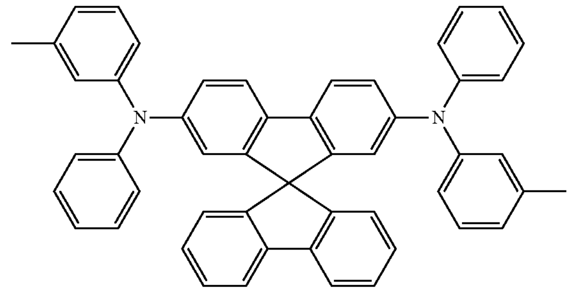
Spiro-TPD
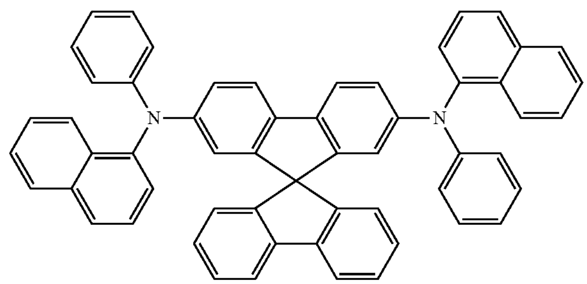
Spiro-NPB
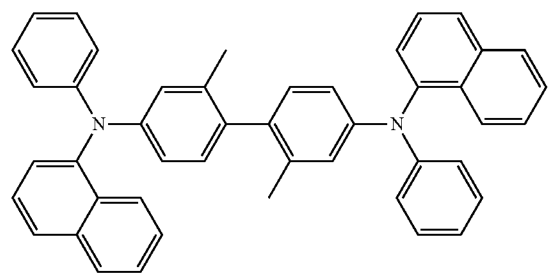
methylated NPB
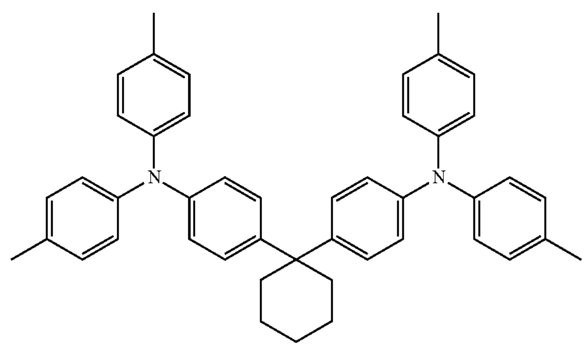
TAPC
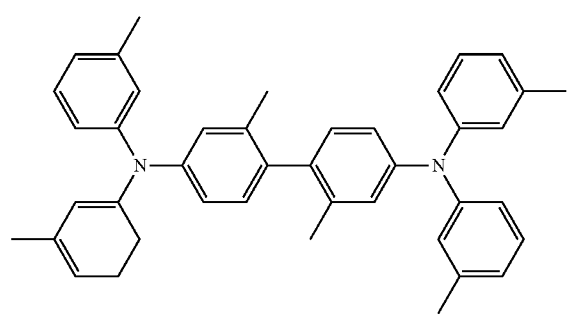
HMTPD -continued Formula 201

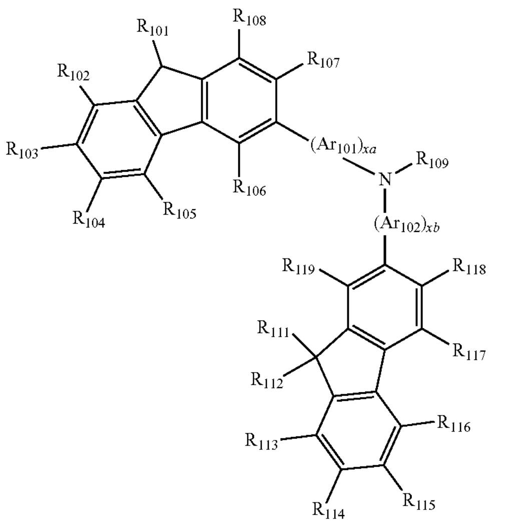

Formula 202

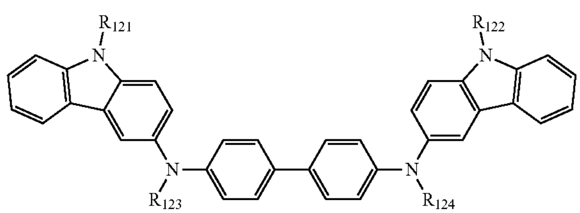

wherein, $Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each independently unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, or a combination thereof.

In Formula 201, xa and xb may each independently be an integer from 0 to 5, or may be 0, 1, or 2. For example, xa may be 1, and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, etc.), or a $C_1$-$C_{10}$ alkoxy group (for example, a methoxy group, an ethoxy group, a propoxy group, a butoxy group, a pentoxy group, etc.);

a $C_1$-$C_{10}$ alkyl group or a $C_1$-$C_{10}$ alkoxy group, each independently unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group or a pyrenyl group, each independently unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof.

In Formula 201, $R_{109}$ may be a phenyl group, a naphthyl group, an anthracenyl group, or a pyridinyl group, each independently unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

In an embodiment, the compound represented by Formula 201 may be represented by Formula 201A:

Formula 201A

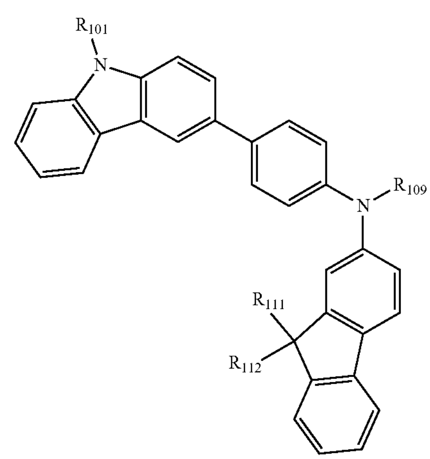

wherein, in Formula 201A, $R_{101}$, $R_{111}$, $R_{112}$, and $R_{109}$ may each be the same as described herein.

For example, the hole transport region may include one of Compounds HT1 to HT20 or a combination thereof:

-continued
HT1
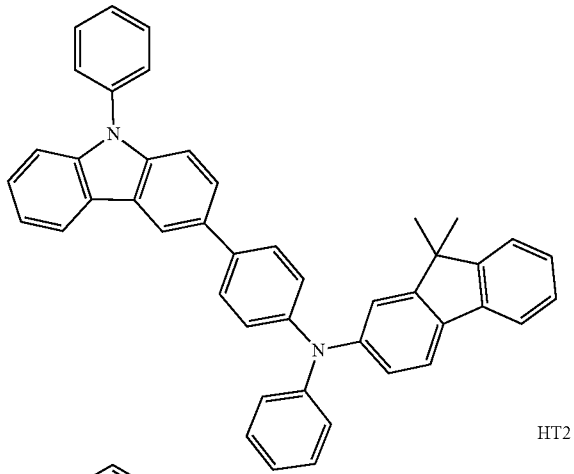
HT2
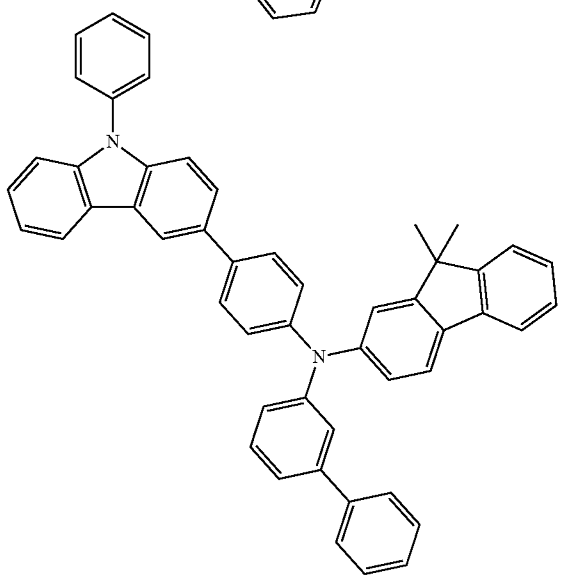
HT3
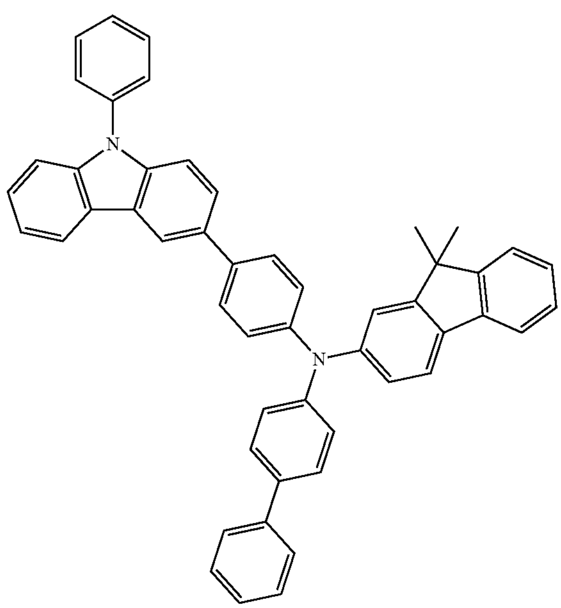
HT4
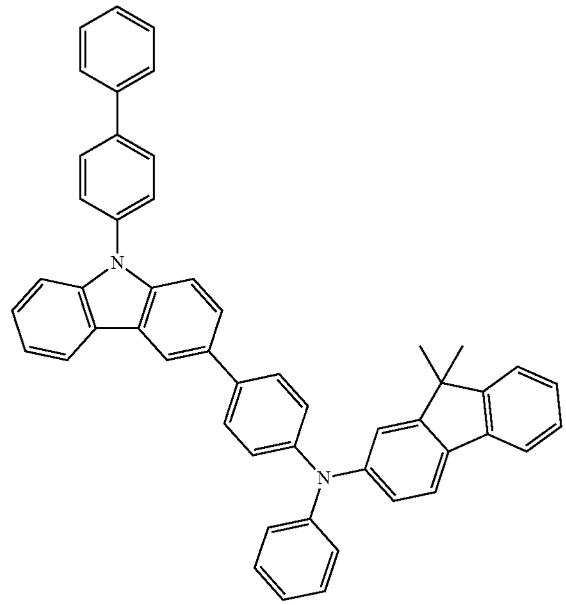
HT5
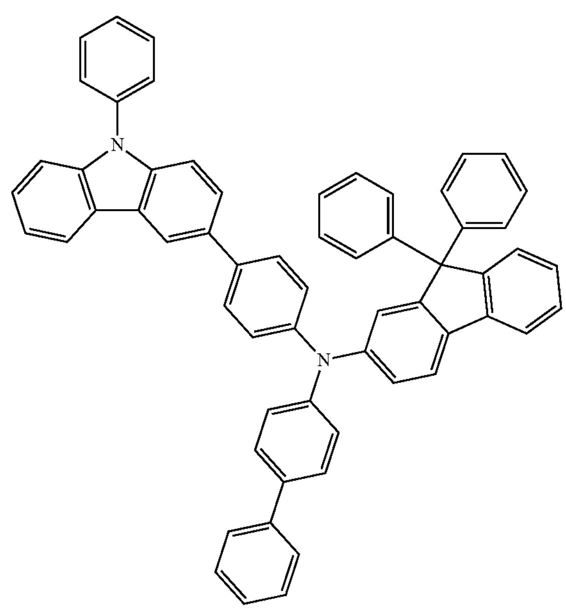

HT6
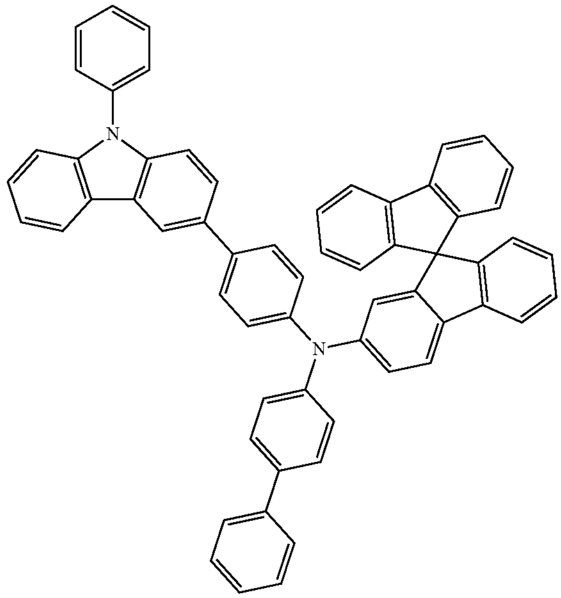
HT7
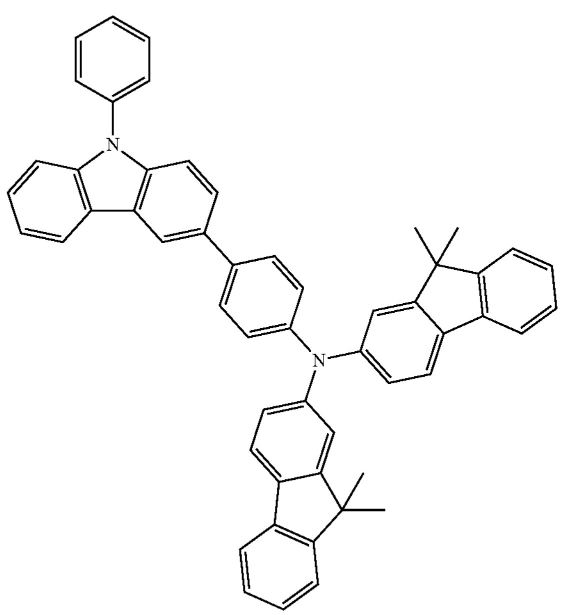
HT8
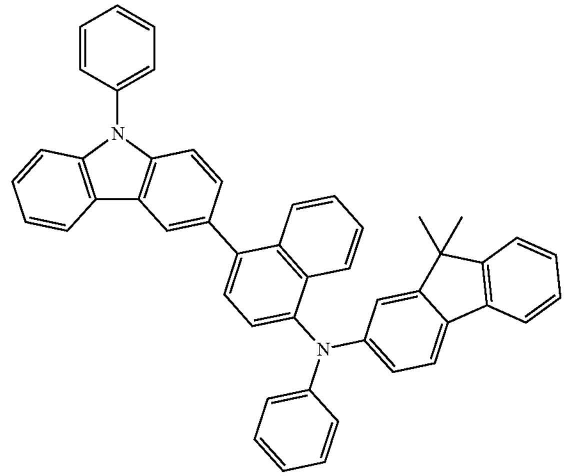
HT9
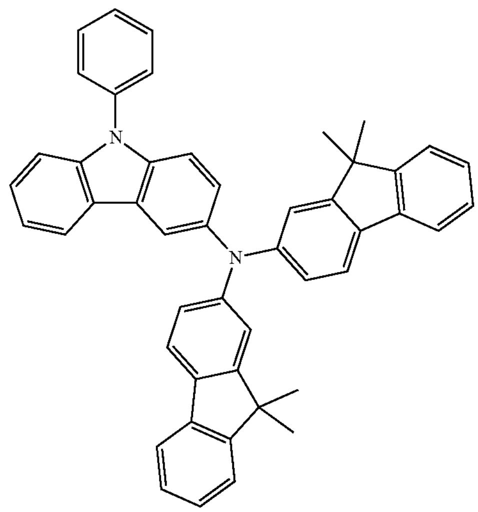
HT10
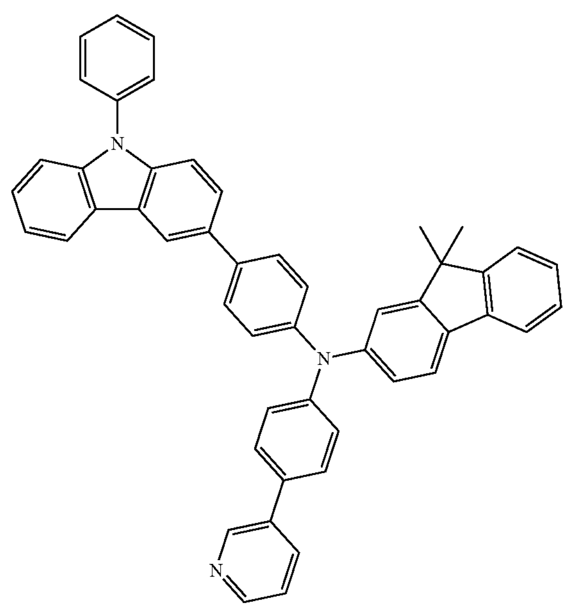

-continued
HT11
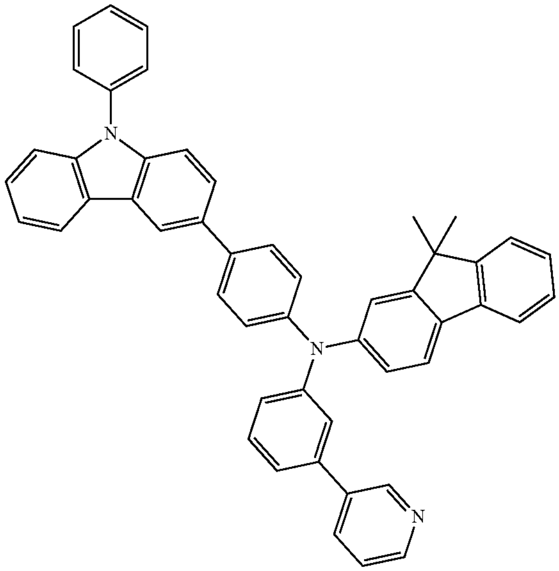
HT12
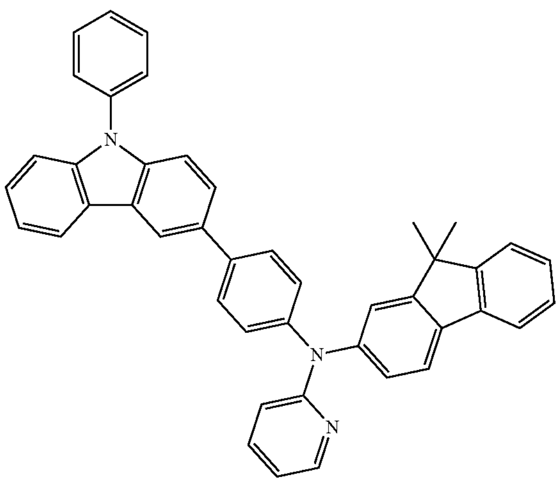
HT13
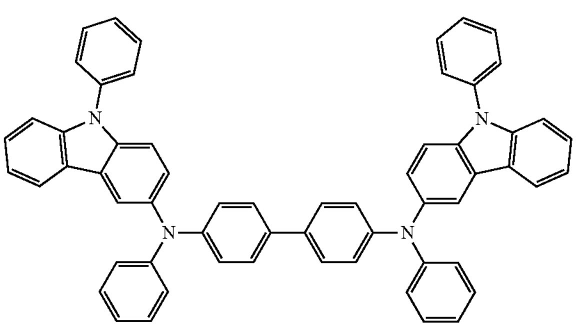
-continued
HT14
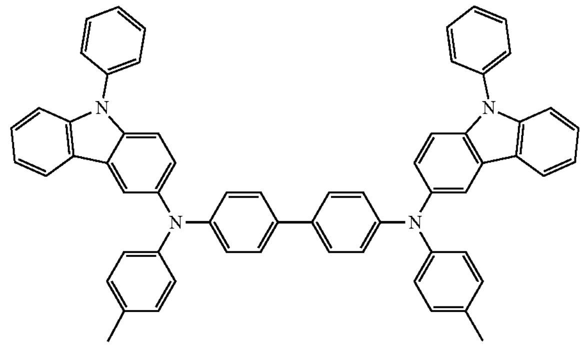
HT15
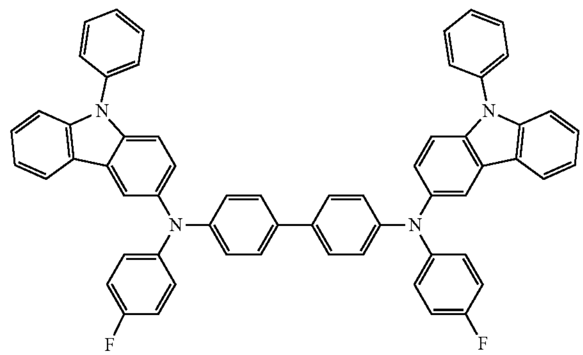
HT16
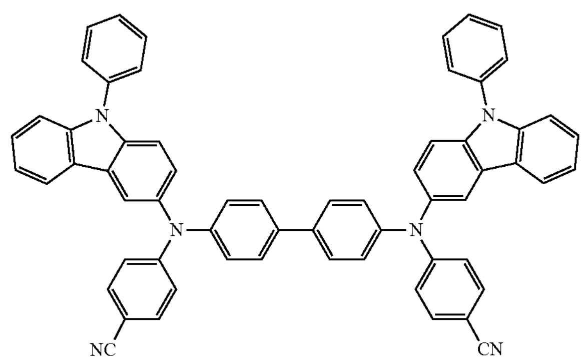
HT17
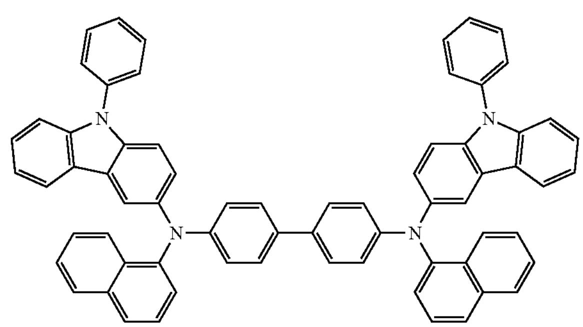

-continued

HT18

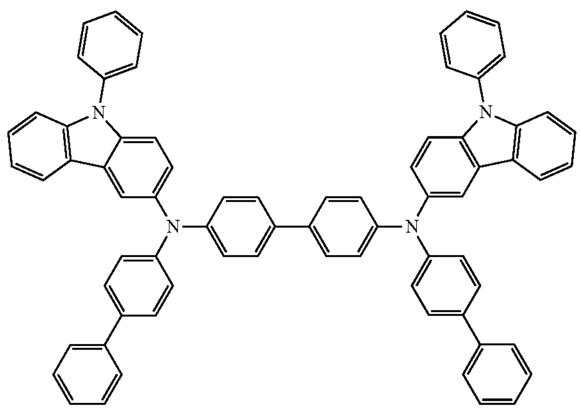

HT19

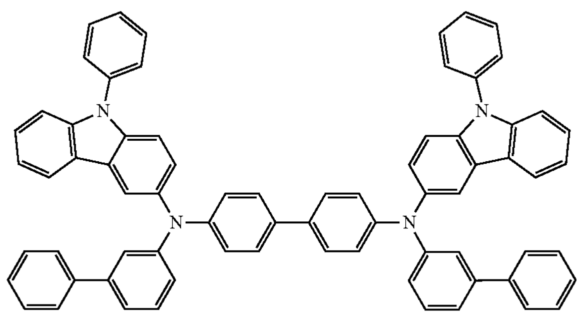

HT20

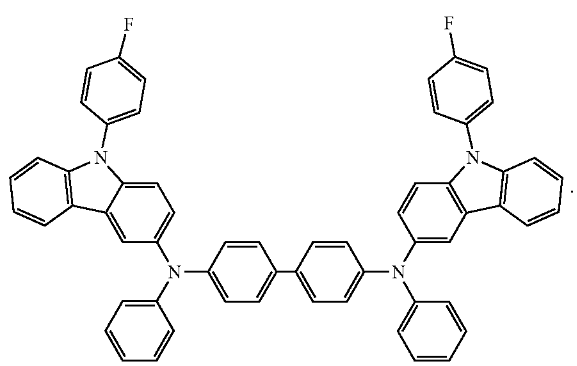

A thickness of the hole transport region may be in a range of about 100 Angstroms (Å) to about 10,000 Å, for example, about 100 Å to about 1,000 Å, about 100 Å to about 2,000 Å, about 100 Å to about 3000 Å, about 100 Å to about 5,000 Å, about 100 Å to about 7,000 Å, or about 100 Å to about 9,000 Å. When the hole transport region includes at least one of a hole injection layer and a hole transport layer, a thickness of the hole injection layer may be in a range of about 100 Å to about 10,000 Å, for example, about 100 Å to about 1,000 Å, about 100 Å to about 2,000 Å, about 100 Å to about 3000 Å, about 100 Å to about 5,000 Å, about 100 Å to about 7,000 Å, or about 100 Å to about 9,000 Å, and a thickness of the hole transport layer may be in a range of about 50 Å to about 2,000 Å, for example, about 100 Å to about 500 Å, about 100 Å to about 1,000 Å, or about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or a combination thereof. For example, the p-dopant may be: a quinone derivative such as tetracyanoquinodimethane (TCNQ), 2,3,5,6-tetrafluoro-tetracyano-1,4-benzoquinonedimethane (F4-TCNQ), or F6-TCNNQ; a metal oxide, such as tungsten oxide and molybdenum oxide; a cyano group-containing compound, such as Compound HT-D1; or a combination thereof.

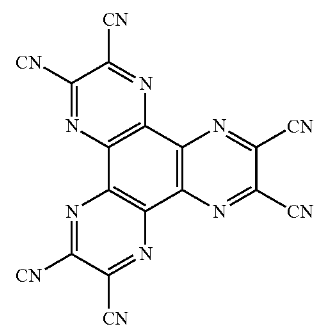

HT-D1

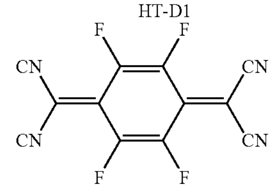

F4-TCNQ

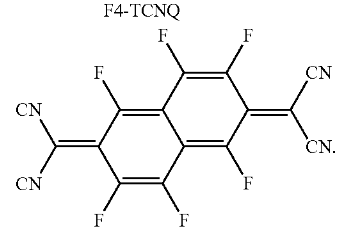

F6-TCNNQ

The hole transport region may further include a buffer layer.

The buffer layer may compensate for an optical resonance distance according to a wavelength of light emitted from the emission layer, and thus, efficiency of a formed organic light-emitting device may be improved.

In an embodiment, when the hole transport region includes an electron blocking layer, a material for forming the electron blocking layer may include a material that is used in the hole transport region as described above, a host material described below, or a combination thereof. For example, when the hole transport region includes an electron blocking layer, a material for forming the electron blocking layer may be mCP, which is described below.

In an embodiment, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

The emission layer may include a host and a dopant, and the dopant may include the organometallic compound represented by Formula 1 described above.

The host may include TPBi, TBADN, ADN (also referred to as "DNA"), CBP, CDBP, TCP, mCP, Compound H50, Compound H51, Compound H52, or a combination thereof:

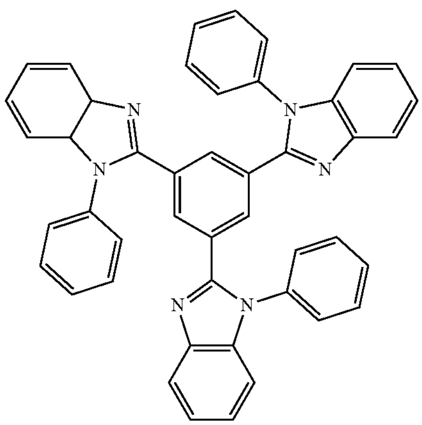

TPBi

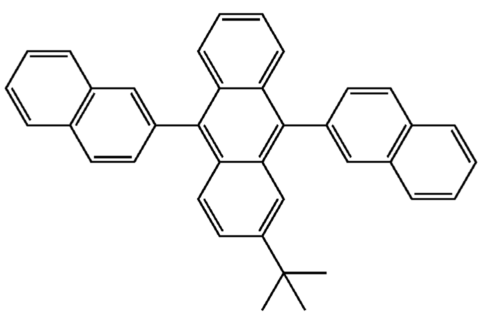

TBADN

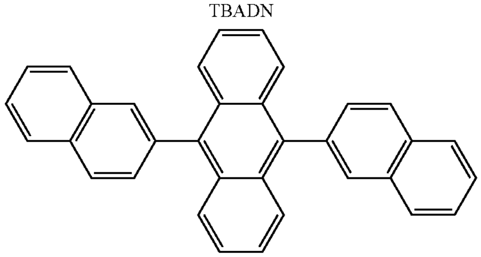

ADN

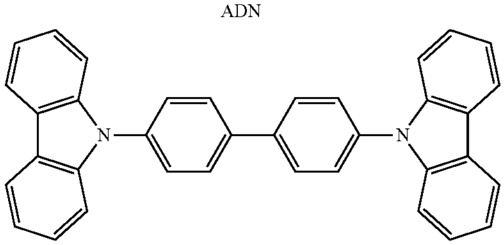

CBP

-continued

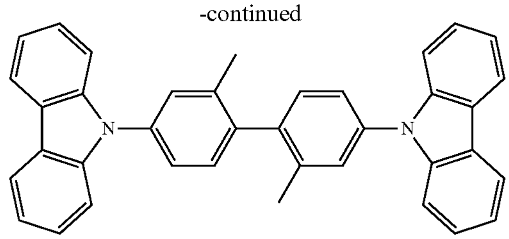

CDBP

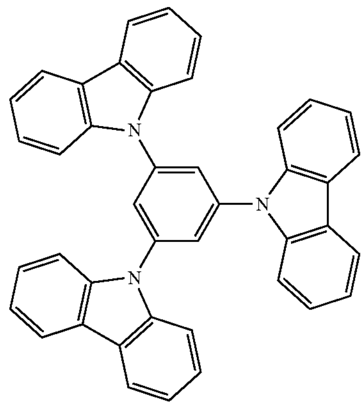

TCP

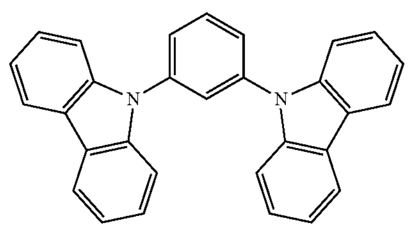

mCP

H50

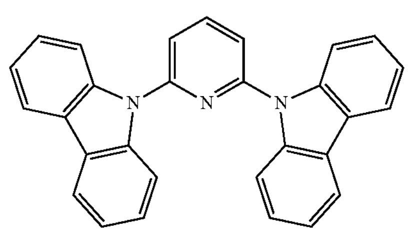

H51

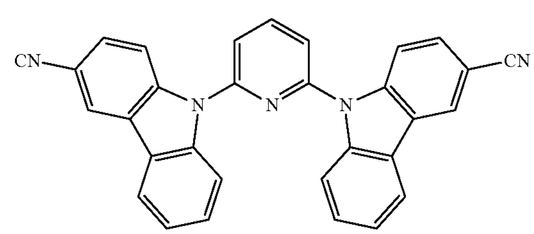

-continued

H52

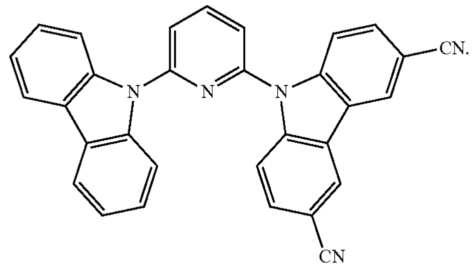

In an embodiment, when the organic light-emitting device is a full-color organic light-emitting device, the emission layer may be patterned into a red emission layer, a green emission layer, and/or a blue emission layer. In an embodiment, due to a stacked structure including a red emission layer, a green emission layer, and/or a blue emission layer, the emission layer may emit white light.

In an embodiment, when the emission layer includes a host and a dopant, an amount of the dopant may be in a range of about 0.01 parts by weight to about 15 parts by weight based on 100 parts by weight of the host, for example, about 0.01 parts by weight to about 5 parts by weight, or about 0.01 parts by weight to about 10 parts by weight based on 100 parts by weight of the host.

A thickness of the emission layer may be in a range of about 100 Å to about 1,000 Å, for example, about 200 Å to about 600 Å, about 300 Å to about 700 Å, example, or about 400 Å to about 900 Å. While not wishing to be bound by theory, it is understood that when the thickness of the emission layer is within these ranges, improved light-emission characteristics may be obtained without a substantial increase in driving voltage.

In an embodiment, an electron transport region may be arranged on the emission layer.

The electron transport region may include a hole blocking layer, an electron transport layer, an electron injection layer, or a combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or a combination thereof.

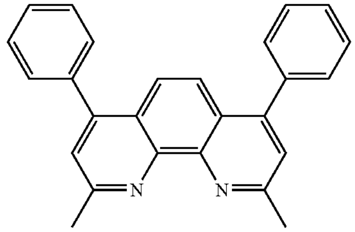

BCP

-continued

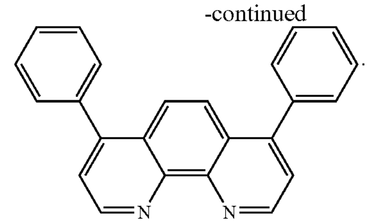

Bphen

A thickness of the hole blocking layer may be in a range of about 20 Å to about 1,000 Å, for example, about 20 Å to about 400 Å about 30 Å to about 600 Å, about 40 Å to about 800 Å, or about 50 Å to about 1000 Å. While not wishing to be bound by theory, it is understood that when the thickness of the hole blocking layer is within these ranges, improved hole blocking characteristics may be obtained without a substantial increase in driving voltage.

In an embodiment, the electron transport layer may include BCP, Bphen, TPBi, $Alq_3$, BAlq, TAZ, NTAZ, or a combination thereof:

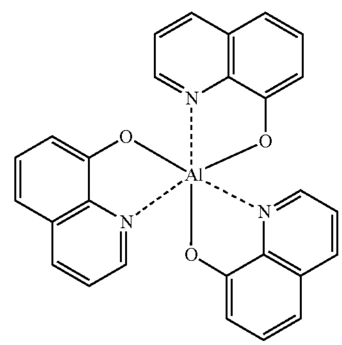

$Alq_3$

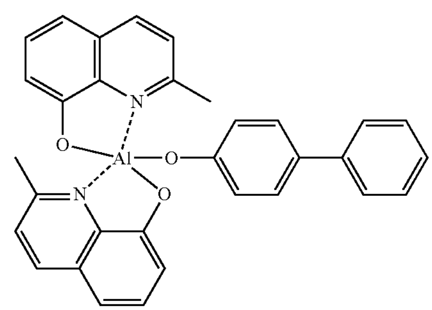

BAlq

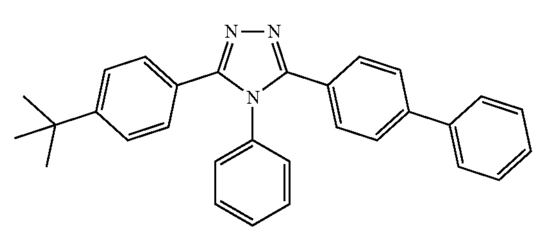

TAZ

-continued
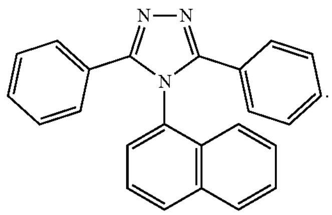
NTAZ
In an embodiment, the electron transport layer may include one of Compounds ET1 to ET25 or a combination thereof:
ET1
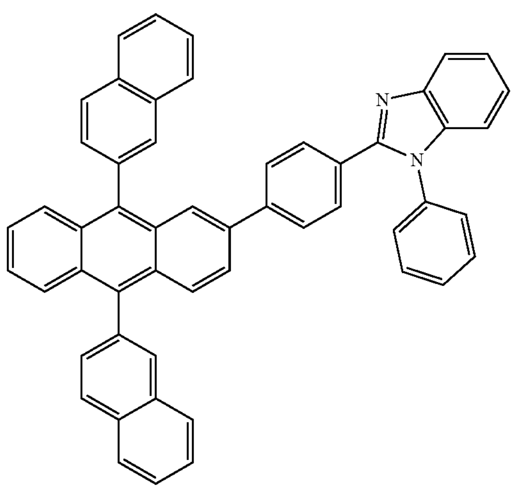
ET2
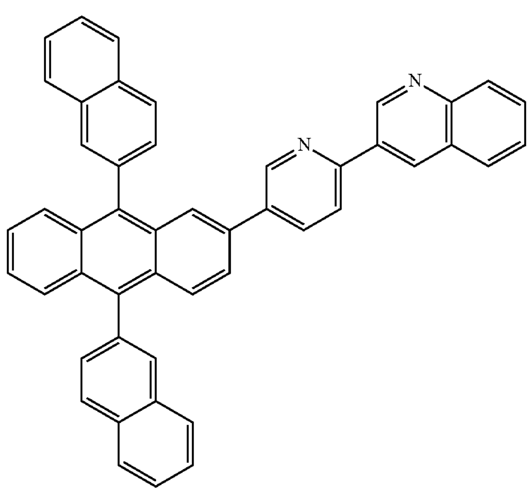
-continued
ET3
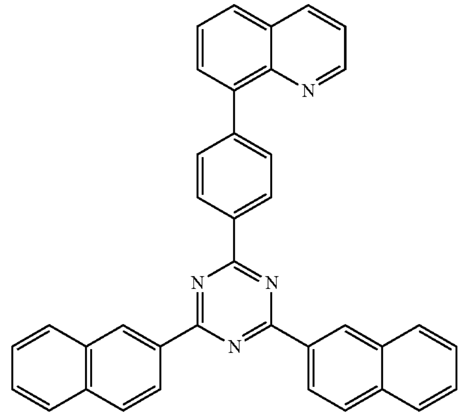
ET4
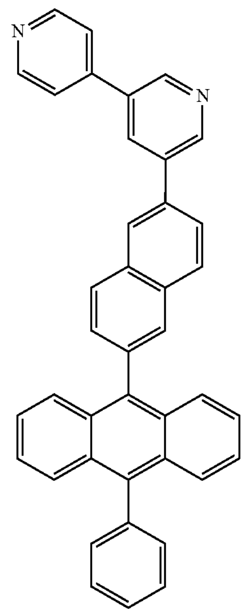
ET5
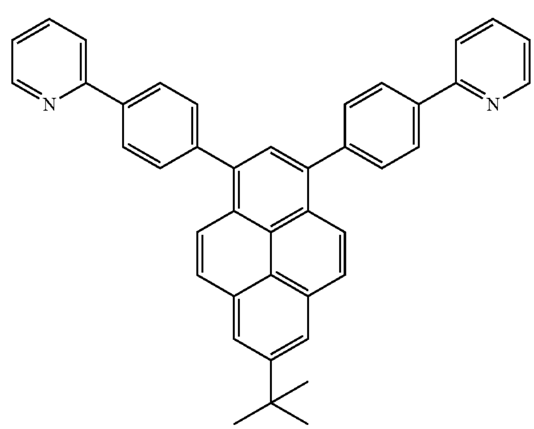

-continued
ET6
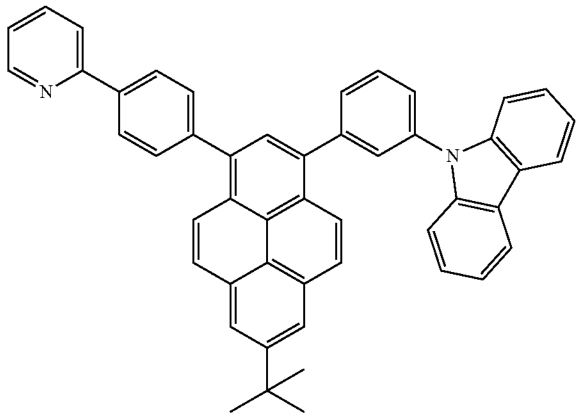
ET7
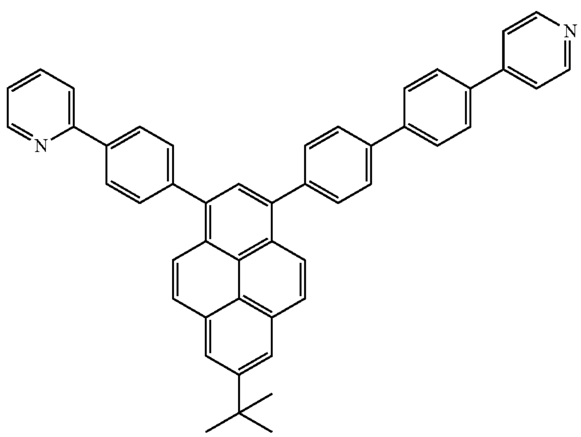
ET8
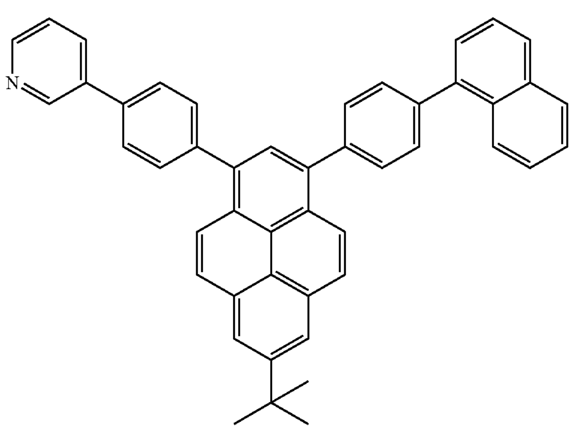
-continued
ET9
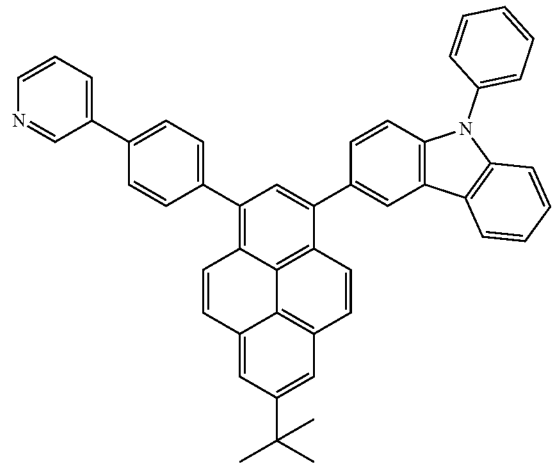
ET10
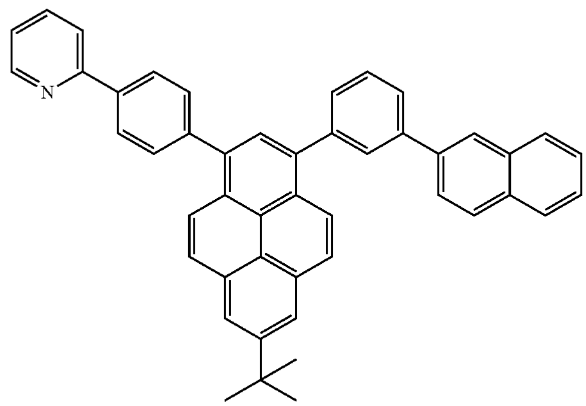
ET11
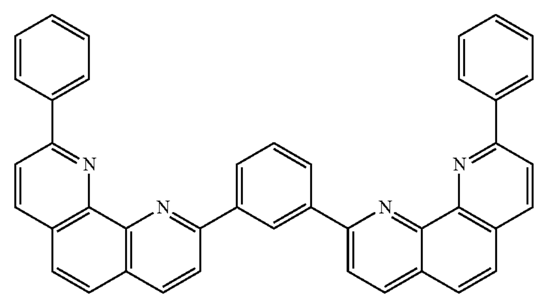
ET12
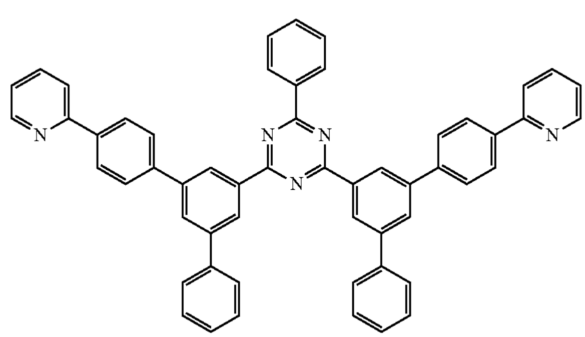

-continued
ET13
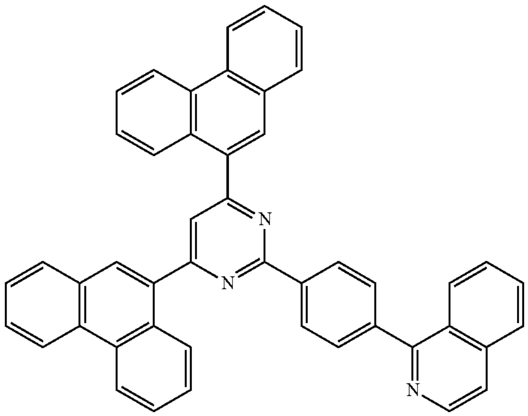
ET14
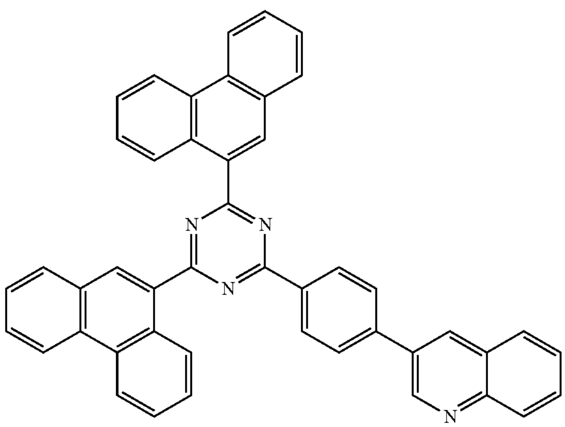
ET15
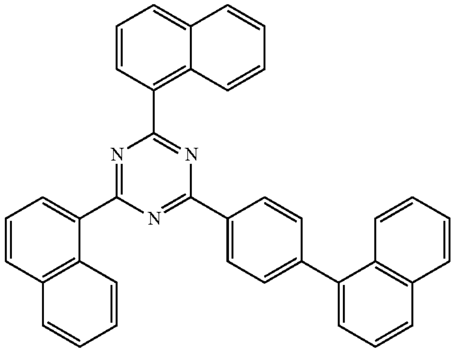
-continued
ET16
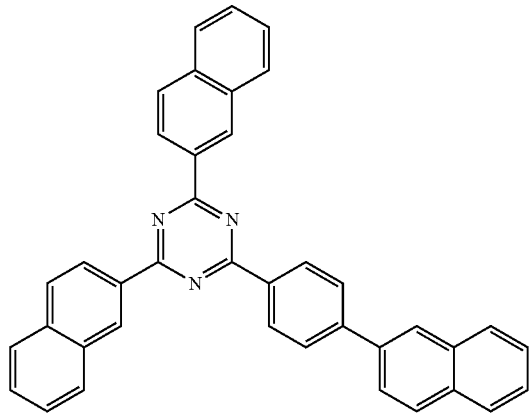
ET17
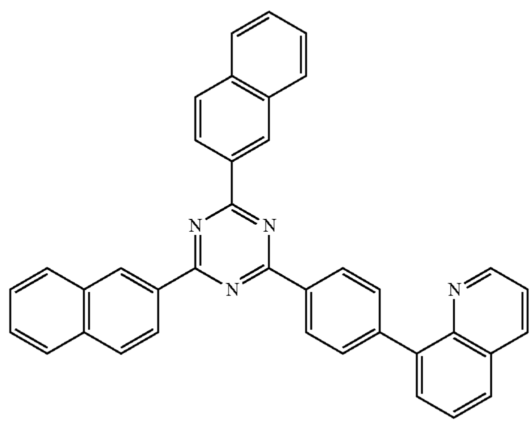
ET18
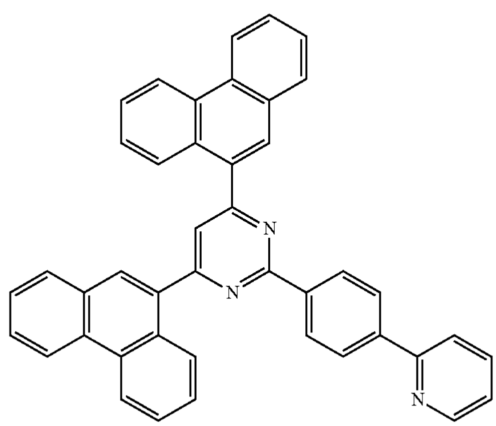

-continued
ET19
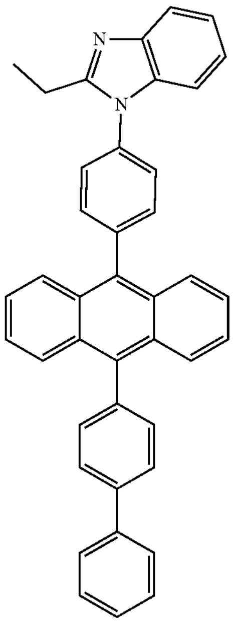
ET20
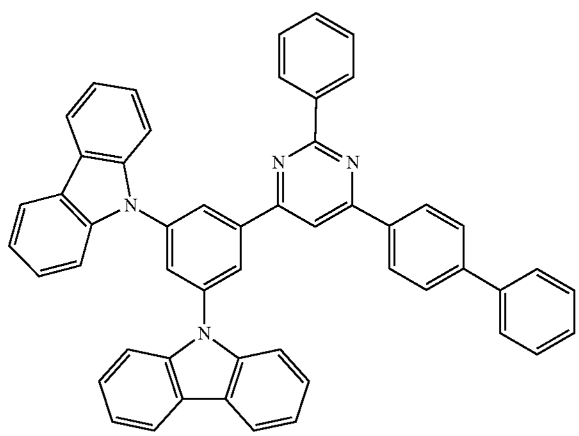
ET21
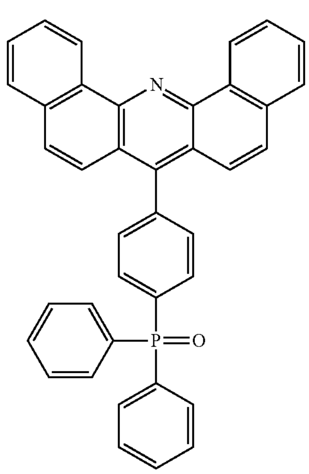
-continued
ET22
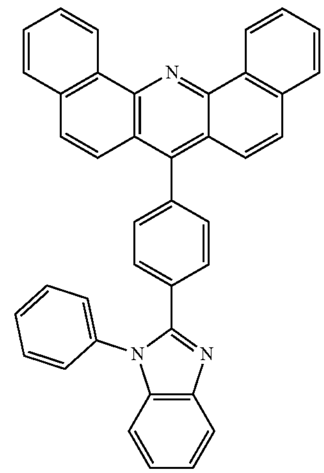
ET23
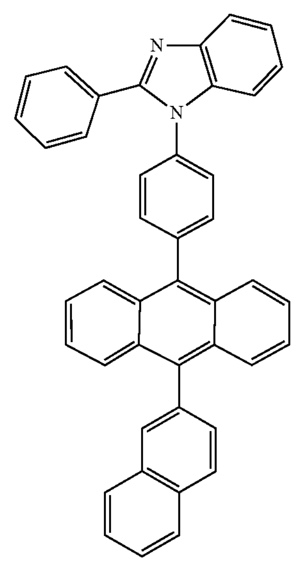
ET24
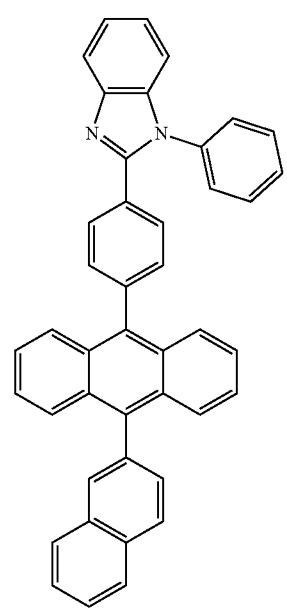

-continued

ET25

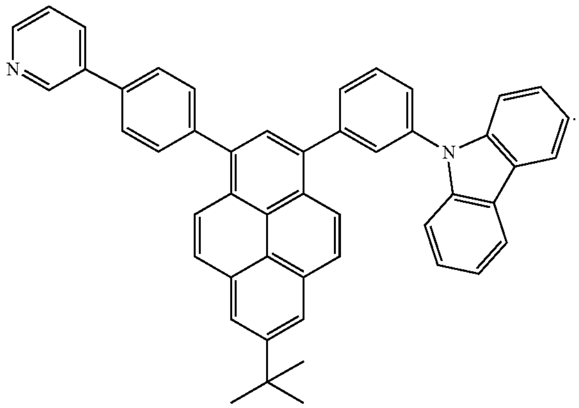

A thickness of the electron transport layer may be in a range of about 100 Å to about 1,000 Å, for example, about 150 Å to about 400 Å, about 150 Å to about 500 Å, about 200 Å to about 600 Å, about 300 Å to about 700 Å, about 400 Å to about 800 Å, or about 500 Å to about 900 Å. While not wishing to be bound by theory, it is understood that when the thickness of the electron transport layer is within these ranges, satisfactory electron transport characteristics may be obtained without a substantial increase in driving voltage.

The electron transport layer may further include, in addition to the materials described above, a metal-containing material.

The metal-containing material may include a Li complex. The Li complex may include, for example, Compound ET-D1 or ET-D2:

ET-D1

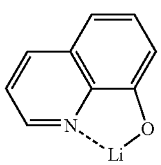

ET-D2

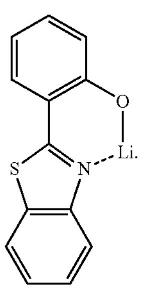

The electron transport region may include an electron injection layer that promotes the flow of electrons from the second electrode 19 thereinto.

The electron injection layer may include LiF, NaCl, CsF, $Li_2O$, BaO, or a combination thereof.

A thickness of the electron injection layer may be in a range of about 1 Å to about 100 Å, and, for example, about 2 Å to about 80 Å, about 3 Å to about 90 Å, about 10 Å to about 90 Å, or about 50 Å to about 90 Å. While not wishing to be bound by theory, it is understood that when the thickness of the electron injection layer is within these ranges, satisfactory electron injection characteristics may be obtained without a substantial increase in driving voltage.

The second electrode 19 is arranged on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. To manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

In an embodiment, the organic light-emitting device may be included in an electronic apparatus. Thus, an aspect of the present disclosure provides an electronic apparatus including the organic light-emitting device. The electronic apparatus may include, for example, a display, an illuminator, a sensor, and the like.

An aspect of the present disclosure provides a diagnostic composition including at least one organometallic compound represented by Formula 1.

The organometallic compound represented by Formula 1 provides high luminescence efficiency. In an embodiment, the diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each independently unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or a combination thereof. For example, Formula 9-33 is a branched $C_6$ alkyl group, for example, a tert-butyl group that is substituted with two methyl groups.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, and a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof are an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group are a cyclopropyl group, a cyclobutyl group, a cyclopentyl group, cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a monocyclic group that includes at least one hetero atom selected from N, O, P, Si, S, Se, Ge, and B as a ring-forming atom other than carbon, and 1 to 10 carbon atoms, and the term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group are a silolanyl group, a silinanyl group, tetrahydrofuranyl group, a tetrahydro-2H-pyranyl group, and a tetrahydrothiophenyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, Si, S, Se, Ge, and B as a ring-forming atom other than carbon, 1 to 10 carbon atoms, and at least one carbon-carbon double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_7$-$C_{60}$ alkylaryl group" as used herein refers to a $C_6$-$C_{60}$ aryl group substituted with at least one $C_1$-$C_{60}$ alkyl group, and the term "$C_7$-$C_{60}$ arylalkyl group" as used herein indicates -$A_{104}A_{105}$ (wherein $A_{105}$ is the $C_6$-$C_{59}$ aryl group and $A_{104}$ is the $C_1$-$C_{53}$ alkylene group).

The term "$C_1$-$C_{60}$ heteroaryl group" as used herein refers to a monovalent group having at least one hetero atom selected from N, O, P, Si, S, Se, Ge, and B as a ring-forming atom instead of a carbon atom and a cyclic aromatic system having 1 to 60 carbon atoms, and the term "$C_1$-$C_{60}$ heteroarylene group" as used herein refers to a divalent group having at least one hetero atom selected from N, O, P, Si, S, Se, Ge, and B as a ring-forming atom instead of carbon and a cyclic aromatic system having 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be fused to each other.

The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein indicates -$OA_{102}$ (wherein $A_{102}$ indicates the $C_6$-$C_{60}$ aryl group), the term "$C_6$-$C_{60}$ arylthio group" as used herein indicates -$SA_{103}$ (wherein $A_{103}$ indicates the $C_6$-$C_{60}$ aryl group), and the term "$C_1$-$C_{60}$ alkylthio group" as used herein indicates -$SA_{104}$ (wherein $A_{104}$ indicates the $C_1$-$C_{60}$ alkyl group).

The term "$C_1$-$C_{60}$ heteroaryloxy group" as used herein refers to -$OA_{106}$ (wherein $A_{106}$ is the $C_2$-$C_{60}$ heteroaryl group), the term "$C_1$-$C_{60}$ heteroarylthio group" as used herein indicates -$SA_{107}$ (wherein $A_{107}$ is the $C_1$-$C_{60}$ heteroaryl group), and the term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. An example of the monovalent non-aromatic condensed polycyclic group is a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, a heteroatom selected from N, O, P, Si, S, Se, Ge, and B, other than carbon atoms, as a ring-forming atom, and no aromaticity in its entire molecular structure. An example of the monovalent non-aromatic condensed heteropolycyclic group is a carbazolyl group. The term "divalent non-aromatic heterocondensed polycyclic group" as used herein refers to a divalent group having the same structure as a monovalent non-aromatic heterocondensed polycyclic group.

The term "$C_3$-$C_{30}$ carbocyclic group" as used herein refers to a saturated or unsaturated cyclic group having, as a ring-forming atom, 3 to 30 carbon atoms only. The $C_3$-$C_{30}$ carbocyclic group may be a monocyclic group or a polycyclic group. Examples of the "$C_3$-$C_{30}$ carbocyclic group (unsubstituted or substituted with at least one $R_{10a}$)" are an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a fluorene group (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B other than 1 to 30 carbon atoms. The $C_1$-$C_{10}$ heterocyclic group may be a monocyclic group or a polycyclic group. Examples of the "$C_1$-$C_{30}$ heterocyclic group (unsubstituted or substituted with at least one $R_{10a}$)" are a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group (each unsubstituted or substituted with at least one $R_{10a}$).

Examples of the "$C_3$-$C_{30}$ carbocyclic group" and the "$C_1$-$C_{30}$ heterocyclic group" are i) first ring, ii) a second ring, iii) a condensed cyclic group in which two or more first rings are condensed with each other, iv) a condensed cyclic group in which two or more second rings are condensed with each other, or v) a condensed cyclic group in which at least one first ring and at least one second ring are condensed with each other, wherein the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group. Examples the "fluorinated $C_1$ alkyl group (that is, the fluorinated methyl group)" are —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, all hydrogen included therein are not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated heterocycloalkyl group," and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (that is, a deuterated methyl group)" are —$CD_3$, —$CD_2H$, and —$CDH_2$, and an example of the "deuterated $C_3$-$C_{10}$ cycloalkyl group" is Formula 10-501. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated heterocycloalkyl group, or a fully deuterated phenyl group, in which, in each group, all hydrogen included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated heterocycloalkyl group, or a partially deuterated phenyl group, in which, in each group, each hydrogen included therein is not substituted with deuterium.

The term "($C_1$-$C_{20}$ alkyl)'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of the ($C_1$ alkyl)phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group," in which, in each group, at least one of ring-forming carbon atoms is substituted with nitrogen.

Substituents of the substituted $C_3$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each independently substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkyl heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, $—P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkyl heteroaryl group, a monovalent non-aromatic condensed polycyclic group, or a monovalent non-aromatic condensed heteropolycyclic group, each independently unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkyl heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, $—P(Q_{28})(Q_{29})$, or a combination thereof;

$—N(Q_{31})(Q_{32})$, $—Si(Q_{33})(Q_{34})(Q_{35})$, $—B(Q_{36})(Q_{37})$, $—P(=O)(Q_{38})(Q_{39})$, or $—P(Q_{38})(Q_{39})$, or a combination thereof, wherein $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl, —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group, a $C_1$-$C_{60}$ heteroaryl group; a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$, and $Q_{31}$ to $Q_{39}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$,

—CHDCD$_2$H, —CHDCDH$_2$, —CHDCD$_3$, —CD$_2$CD$_3$, —CD$_2$CD$_2$H, or —CD$_2$CDH$_2$, or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each independently unsubstituted or substituted with deuterium, a $C_1$-$C_{10}$ alkyl group, a phenyl group, or a combination thereof.

The term "room temperature" as used herein refers to about 25° C.

The term "biphenyl group" refers to a monovalent group in which two benzene groups are linked via a single bond.

The term "terphenyl group" refers to a monovalent group in which three benzene groups are linked via a single bond.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 182)

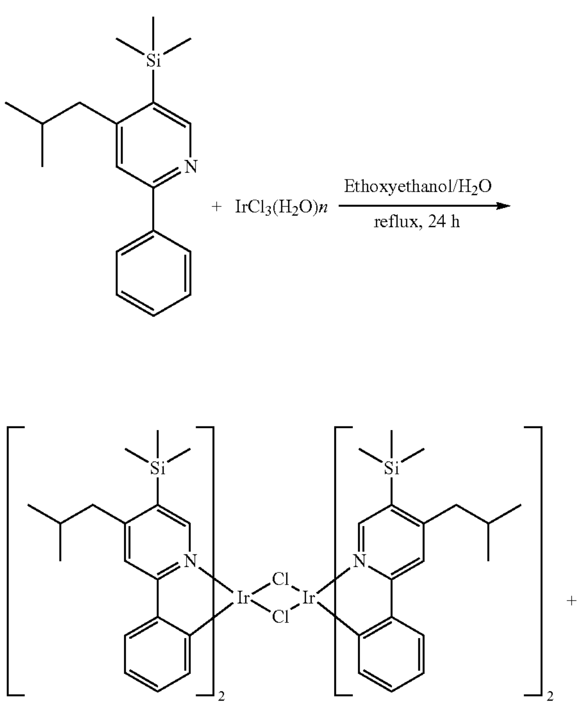

182A

-continued

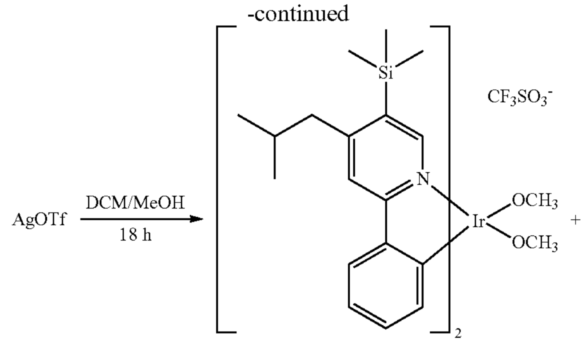

182B

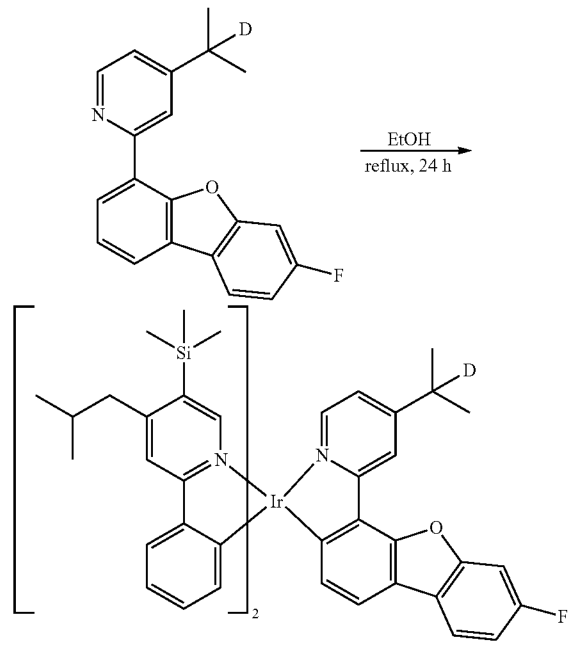

182

Synthesis of Compound 182A4-isobutyl-2-phenyl-5-(trimethylsilyl)pyridine) (3.0 gram (g), 10.6 millimole (mmol)) and iridium chloride ($IrCl_3(H_2O)_n$) (1.7 g, 4.8 mmol) are mixed with 120 milliliters (mL) of ethoxyethanol and 40 mL of distilled water. The mixed solution was stirred under reflux for 24 hours. Then, the reaction temperature was lowered to room temperature. The produced solid was separated by filtration, washed thoroughly with water/methanol/hexane in this stated order, and dried in a vacuum oven, so as to obtain 3.1 g (yield of 81%) of Compound 182A.

Synthesis of Compound 182B Compound 182A (1.4 g, 0.9 mmol) was mixed with 120 mL of dichloromethane, and a mixture of silver trifluoromethanesulfonate (AgOTf) (0.45 g, 1.8 mmol) and 40 mL of methanol was added thereto. Afterwards, the resultant mixed solution was stirred for 18 hours while blocking light with aluminum foil, and then, filtered through Celite to remove the resultant solid. The filtrate was decompressed to obtain a solid (Compound 182B), which was used in the next reaction without performing any additional purification process thereon.

Synthesis of Compound 182 Compound 182B (1.5 g, 1.6 mmol) and 2-(7-fluorodibenzo[b,d]furan-4-yl)-4-(propan-2-yl-2-d)pyridine (0.55 g, 1.8 mmol) were mixed with 50 mL of ethanol. The mixed solution was stirred under reflux for 24 hours, and the reaction temperature was lowered to room temperature. The obtained mixture was decompressed, and the solid produced therefrom was subjected to column chromatography (eluent: hexane and ethyl acetate), so as to obtain 0.64 g (yield of 39%) of Compound 182. The obtained compound was identified by Mass spectrum and HPLC analysis.

HRMS(MALDI) calcd for $C_{56}H_{62}DFIrN_3OSi_2$: m/z 1062.4186 Found: 1062.4184.

Synthesis Example 2 (Compound 486)

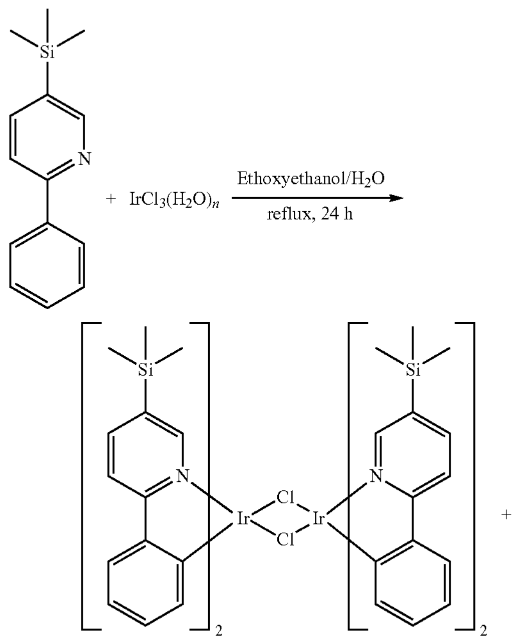

486A

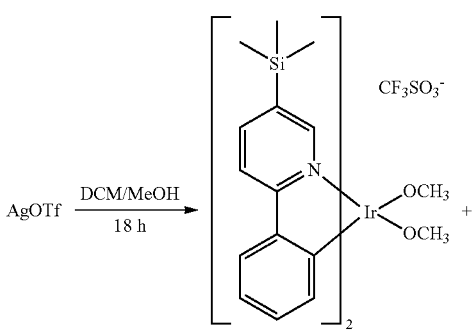

486B

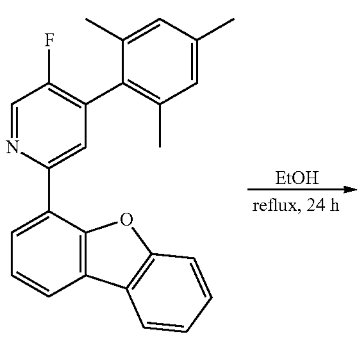

-continued

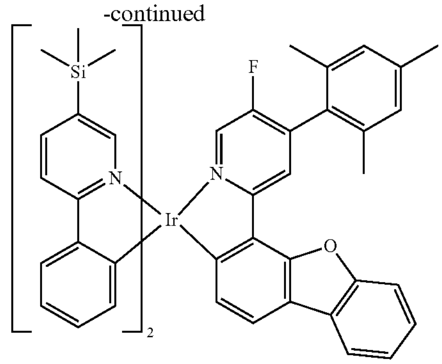

486

Synthesis of Compound 486A2.8 g (yield of 83%) of Compound 486A was obtained in the same manner as in the synthesis of Compound 182A of Synthesis Example 1, except that 2-phenyl-5-(trimethylsilyl)pyridine was used instead of 4-isobutyl-2-phenyl-5-(trimethylsilyl)pyridine.

Synthesis of Compound 486B Compound 486B was obtained in the same manner as in the synthesis of Compound 182B of Synthesis Example 1, except that Compound 486A was used instead of Compound 182A. Compound 486B thus obtained was used in the next reaction without performing any additional purification process thereon.

Synthesis of Compound 4860.46 g (yield of 26%) of Compound 486 was obtained in the same manner as in the synthesis of Compound 182 of Synthesis Example 1, except that Compound 486B was used instead of Compound 182B and 2-(dibenzo[b,d]furan-4-yl)-5-fluoro-4-mesitylpyridine was used instead of 2-(7-fluorodibenzo[b,d]furan-4-yl)-4-(propan-2-yl-2-d)pyridine. The obtained compound was identified by Mass spectrum and HPLC analysis.

HRMS(MALDI) calcd for $C_{54}H_{51}FIrN_3OSi_2$: m/z 1025.3184 Found: 1025.3181.

Synthesis Example 3 (Compound 672)

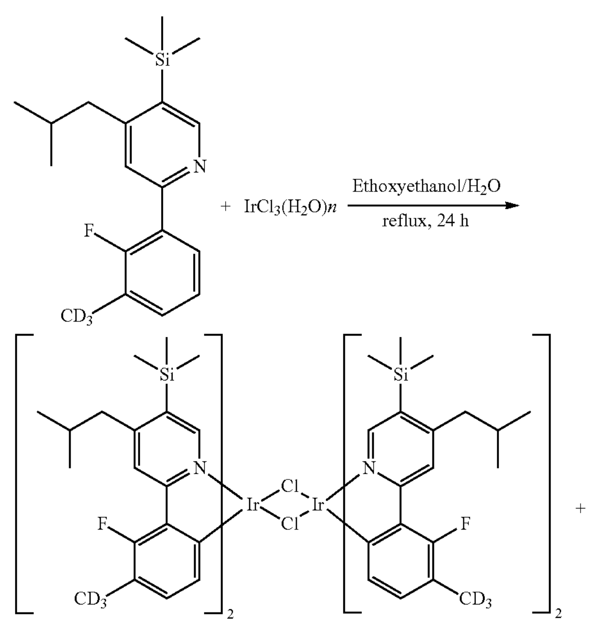

672A

-continued

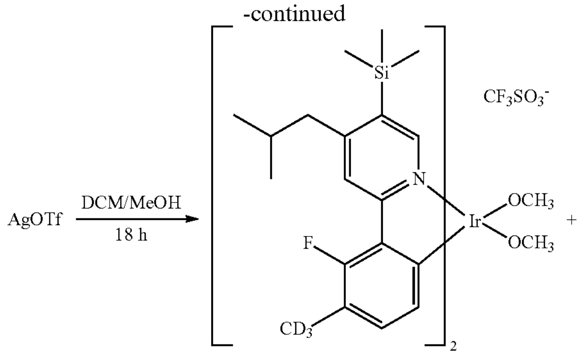

672B

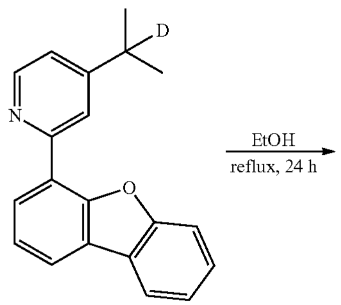

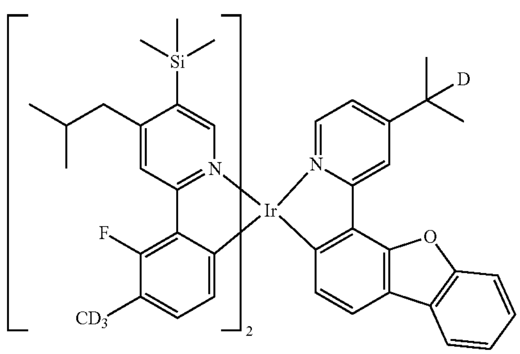

672

Synthesis of Compound 672A2.2 g (yield of 79%) of Compound 672A was obtained in the same manner as in the synthesis of Compound 182A of Synthesis Example 1, except that 2-(2-fluoro-3-(methyl-$d_3$)phenyl)-4-isobutyl-5-(trimethylsilyl)pyridine was used instead of 4-isobutyl-2-phenyl-5-(trimethylsilyl)pyridine.

Synthesis of Compound 672B Compound 672B was obtained in the same manner as in the synthesis of Compound 182B of Synthesis Example 1, except that Compound 672A was used instead of Compound 182A. Compound 672B thus obtained was used in the next reaction without performing any additional purification process thereon.

Synthesis of Compound 6720.49 g (yield of 32%) of Compound 672 was obtained in the same manner as in the synthesis of Compound 182 of Synthesis Example 1, except that Compound 672B was used instead of Compound 182B and 2-(dibenzo[b,d]furan-4-yl)-4-(propan-2-yl-2-d)pyridine was used instead of 2-(7-fluorodibenzo[b,d]furan-4-yl)-4-(propan-2-yl-2-d)pyridine. The obtained compound was identified by Mass spectrum and HPLC analysis.

HRMS(MALDI) calcd for $C_{58}H_{59}D_7F_2IrN_3OSi_2$: m/z 1114.4781 Found: 1114.4785.

Synthesis Example 4 (Compound 943)

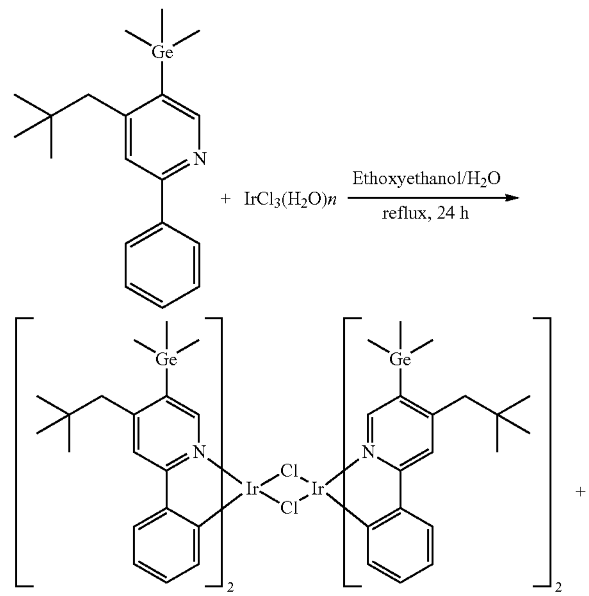

943A

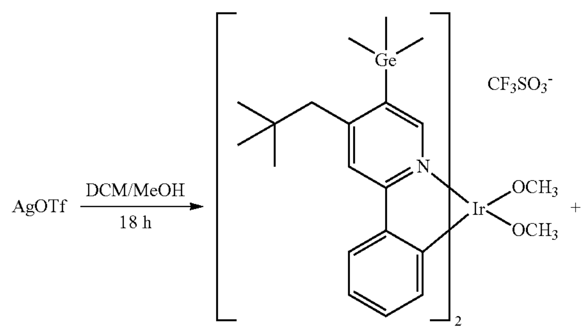

943B

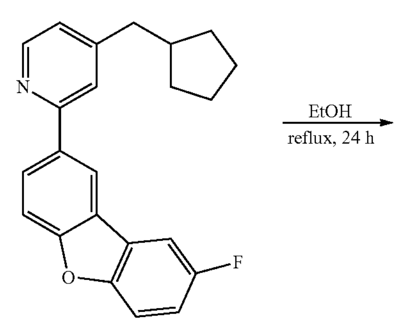

-continued

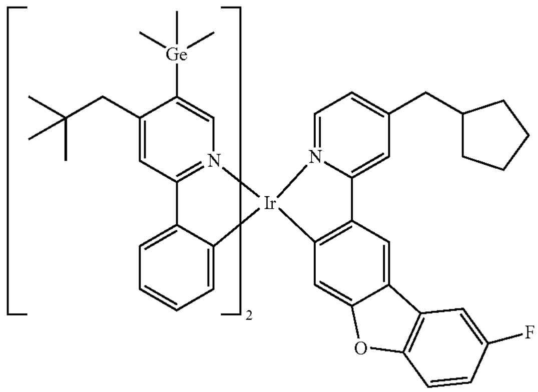

943

Synthesis of Compound 943A3.6 g (yield of 84%) of Compound 943A was obtained in the same manner as in the synthesis of Compound 182A of Synthesis Example 1, except that 4-neopentyl-2-phenyl-5-(trimethylgermyl)pyridine was used instead of 4-isobutyl-2-phenyl-5-(trimethylsilyl)pyridine.

Synthesis of Compound 943B Compound 943B was obtained in the same manner as in the synthesis of Compound 182B of Synthesis Example 1, except that Compound 943A was used instead of Compound 182A. Compound 943B thus obtained was used in the next reaction without performing any additional purification process thereon.

Synthesis of Compound 9430.52 g (yield of 29%) of Compound 943 was obtained in the same manner as in the synthesis of Compound 182 of Synthesis Example 1, except that Compound 943B was used instead of Compound 182B and 4-(cyclopentylmethyl)-2-(8-fluorodibenzo[b,d]furan-2-yl)pyridine was used instead of 2-(7-fluorodibenzo[b,d]furan-4-yl)-4-(propan-2-yl-2-d)pyridine. The obtained compound was identified by Mass spectrum and HPLC analysis.

HRMS(MALDI) calcd for $C_{61}H_{71}FGe_2IrN_3O$: m/z 1221.3634 Found: 1221.3636.

Synthesis Example 5 (Compound 1034)

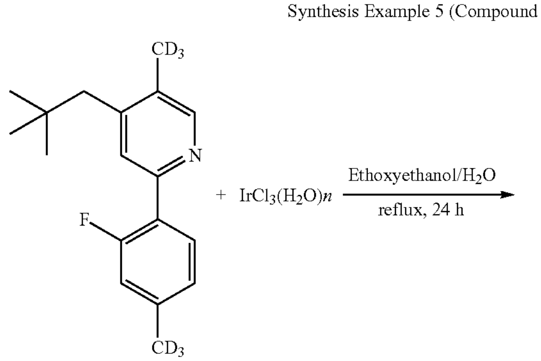

-continued

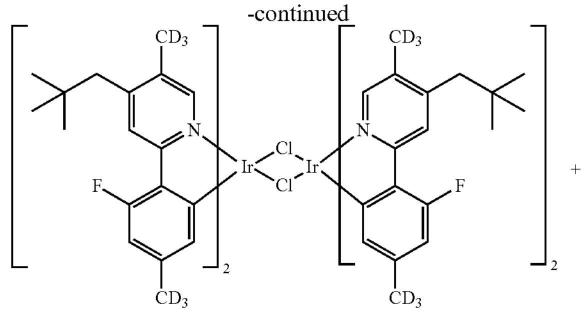

1034A

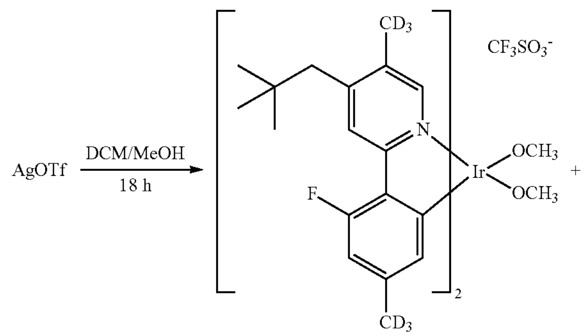

1034B

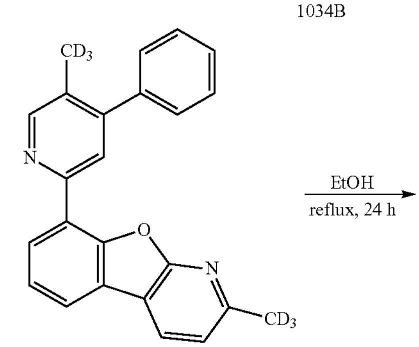

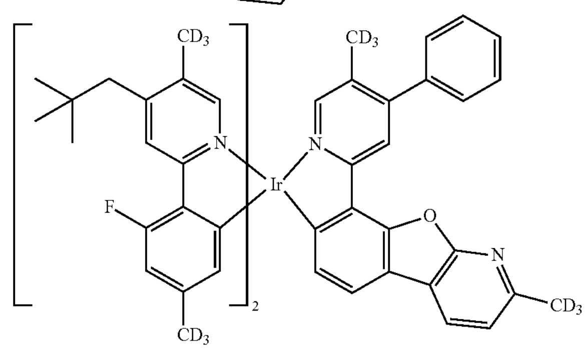

1034

Synthesis of Compound 1034A2.9 g (yield of 86%) of Compound 1034A was obtained in the same manner as in the synthesis of Compound 182A of Synthesis Example 1, except that 2-(2-fluoro-4-(methyl-d$_3$)phenyl)-5-(methyl-d$_3$)-4-neopentylpyridine was used instead of 4-isobutyl-2-phenyl-5-(trimethylsilyl)pyridine.

Synthesis of Compound 1034B Compound 1034B was obtained in the same manner as in the synthesis of Compound 182B of Synthesis Example 1, except that Compound 1034A was used instead of Compound 182A. Compound 1034B thus obtained was used in the next reaction without performing any additional purification process thereon.

Synthesis of Compound 10340.42 g (yield of 28%) of Compound 1034 was obtained in the same manner as in the synthesis of Compound 182 of Synthesis Example 1, except that Compound 1034B was used instead of Compound 182B and 2-(methyl-$d_3$)-8-(5-(methyl-$d_3$)-4-phenylpyridin-2-yl) benzofuro[2,3-b]pyridine was used instead of 2-(7-fluorodibenzo[b,d]furan-4-yl)-4-(propan-2-yl-2-d)pyridine. The obtained compound was identified by Mass spectrum and HPLC analysis.

HRMS(MALDI) calcd for $C_{60}H_{41}D_{18}F_2IrN_4O$: m/z 1100.5416 Found: 1100.5413.

Synthesis Example 6 (Compound 1153)

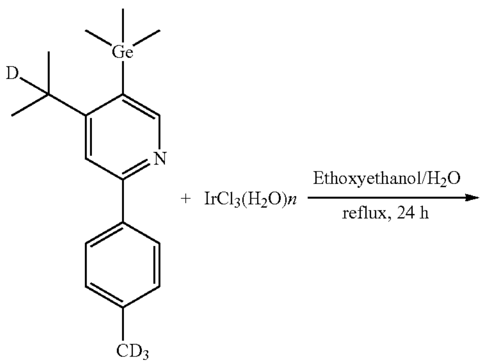

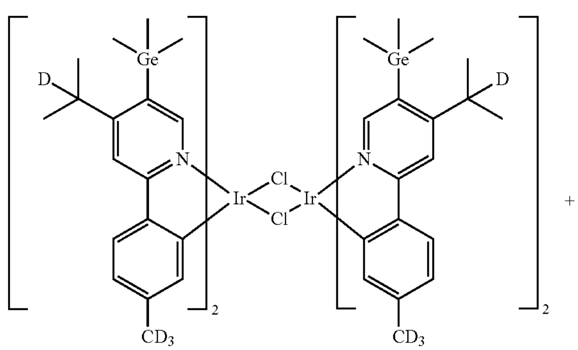

1153A

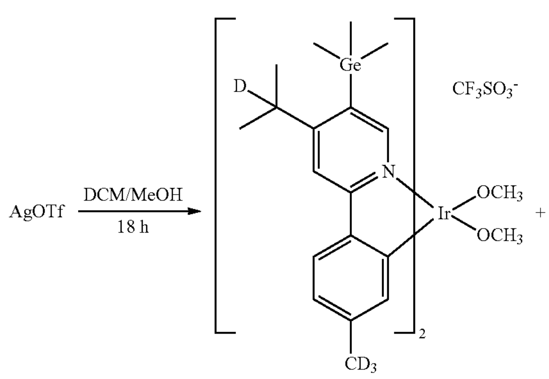

1153B

-continued

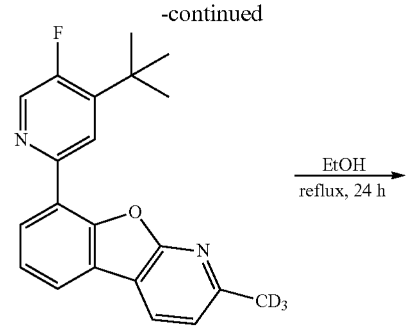

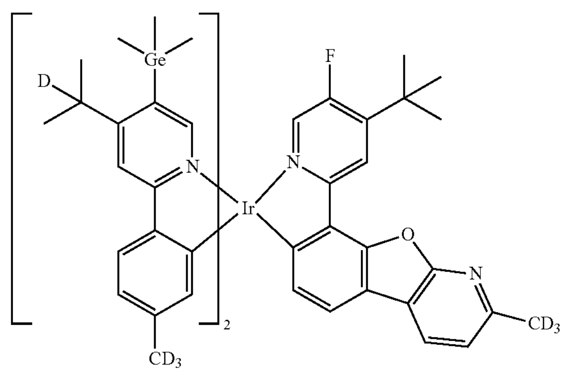

1153

Synthesis of Compound 1153A3.2 g (yield of 85%) of Compound 1153A was obtained in the same manner as in the synthesis of Compound 182A of Synthesis Example 1, except that 2-(4-(methyl-$d_3$)phenyl)-4-(propan-2-yl-2-d)-5-(trimethylgermyl)pyridine was used instead of 4-isobutyl-2-phenyl-5-(trimethylsilyl)pyridine.

Synthesis of Compound 1153B Compound 1153B was obtained in the same manner as in the synthesis of Compound 182B of Synthesis Example 1, except that Compound 1153A was used instead of Compound 182A. Compound 1153B thus obtained was used in the next reaction without performing any additional purification process thereon.

Synthesis of Compound 11530.46 g (yield of 31%) of Compound 1153 was obtained in the same manner as in the synthesis of Compound 182 of Synthesis Example 1, except that Compound 1153B was used instead of Compound 182B and 8-(4-(tert-butyl)-5-fluoropyridin-2-yl)-2-(methyl-$d_3$) benzofuro[2,3-b]pyridine was used instead of 2-(7-fluorodibenzo[b,d]furan-4-yl)-4-(propan-2-yl-2-d)pyridine. The obtained compound was identified by Mass spectrum and HPLC analysis.

HRMS(MALDI) calcd for $C_{57}H55D_{11}FGe_2IrN_4O$: m/z 1193.3964 Found: 1193.3961.

Synthesis Example 7 (Compound 1177)

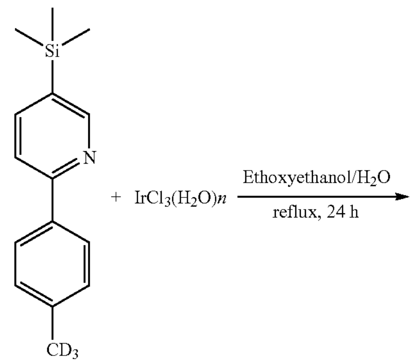

-continued

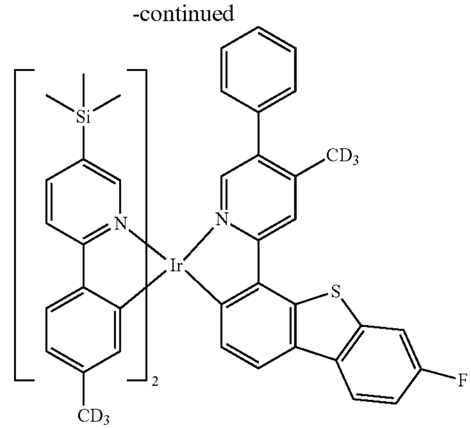

1177

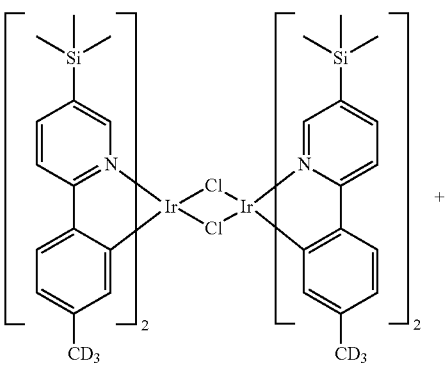

1177A

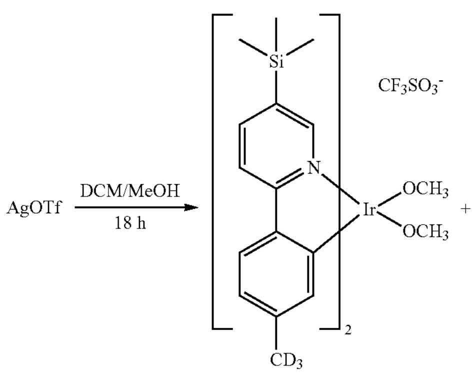

1177B

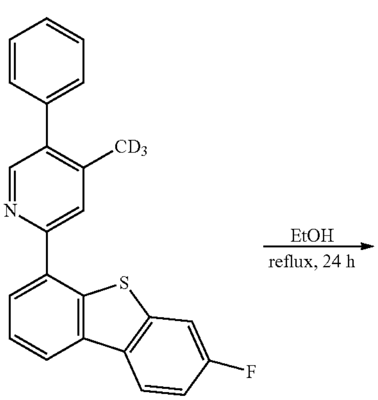

Synthesis of Compound 1177A4.5 g (yield of 87%) of Compound 1177A was obtained in the same manner as in the synthesis of Compound 182A of Synthesis Example 1, except that 2-(4-(methyl-$d_3$)phenyl)-5-(trimethylsilyl)pyridine was used instead of 4-isobutyl-2-phenyl-5-(trimethylsilyl)pyridine.

Synthesis of Compound 1177B Compound 1177B was obtained in the same manner as in the synthesis of Compound 182B of Synthesis Example 1, except that Compound 1177A was used instead of Compound 182A. Compound 1177B thus obtained was used in the next reaction without performing any additional purification process thereon.

Synthesis of Compound 11770.43 g (yield of 27%) of Compound 1177 was obtained in the same manner as in the synthesis of Compound 182 of Synthesis Example 1, except that Compound 1177B was used instead of Compound 182B and 2-(7-fluorodibenzo[b,d]thiophen-4-yl)-4-(methyl-$d_3$)-5-phenylpyridine was used instead of 2-(7-fluorodibenzo[b,d]furan-4-yl)-4-(propan-2-yl-2-d)pyridine. The obtained compound was identified by Mass spectrum and HPLC analysis.

HRMS(MALDI) calcd for $C_{54}H_{42}D_9FIrN_3SSi_2$: m/z 1050.3520 Found: 1050.3518.

Synthesis Example 8 (Compound 1295)

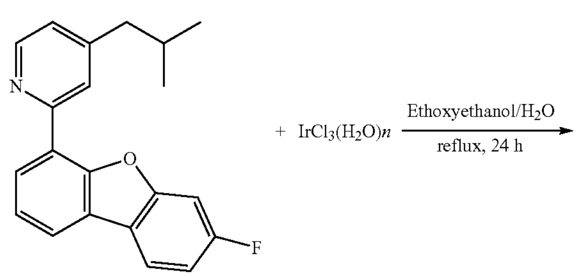

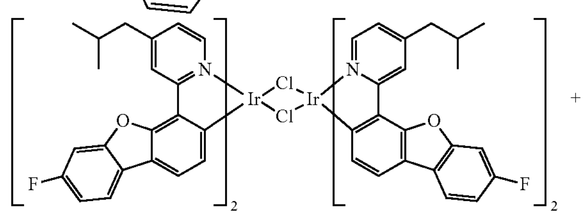

1295A

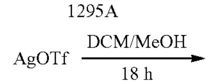

-continued

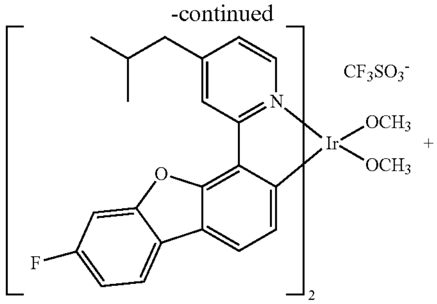

1295B

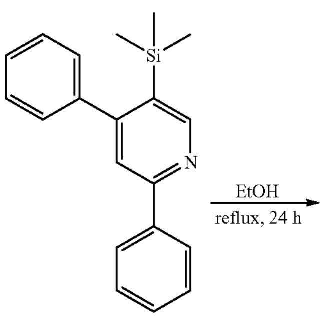

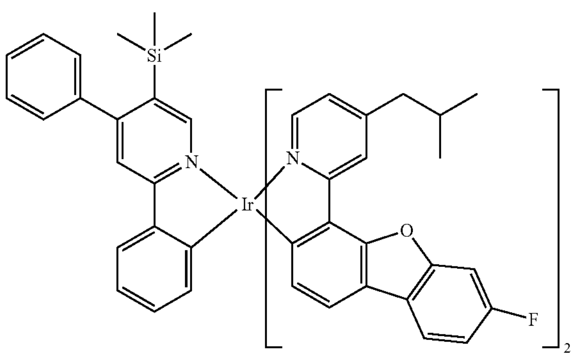

1295

Synthesis of Compound 1295A4.5 g (yield of 86%) of Compound 1295A was obtained in the same manner as in the synthesis of Compound 182A of Synthesis Example 1, except that 2-(7-fluorodibenzo[b,d]furan-4-yl)-4-isobutylpyridine was used instead of 4-isobutyl-2-phenyl-5-(trimethylsilyl)pyridine.

Synthesis of Compound 1295B Compound 1295B was obtained in the same manner as in the synthesis of Compound 182B of Synthesis Example 1, except that Compound 1295A was used instead of Compound 182A. Compound 1295B thus obtained was used in the next reaction without performing any additional purification process thereon.

Synthesis of Compound 12950.45 g (yield of 35%) of Compound 1295 was obtained in the same manner as in the synthesis of Compound 182 of Synthesis Example 1, except that Compound 1295B was used instead of Compound 182B and 2,4-diphenyl-5-(trimethylsilyl)pyridine was used instead of 2-(7-fluorodibenzo[b,d]furan-4-yl)-4-(propan-2-yl-2-d)pyridine. The obtained compound was identified by Mass spectrum and HPLC analysis.

HRMS(MALDI) calcd for $C_{62}H_{54}F_2IrN_3O_2Si$: m/z 1131.3583 Found: 1131.3586.

Synthesis Example 9 (Compound 1382)

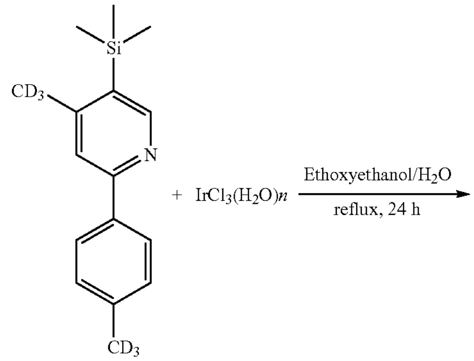

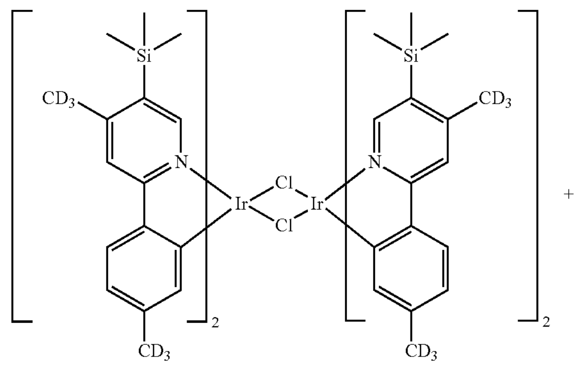

1382A

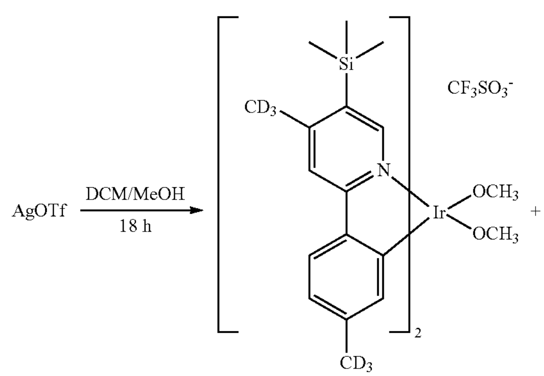

1382B

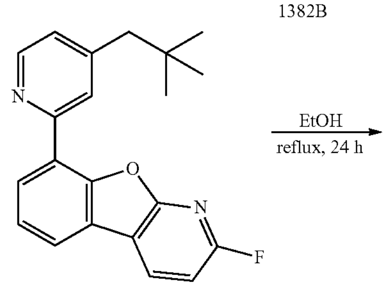

-continued

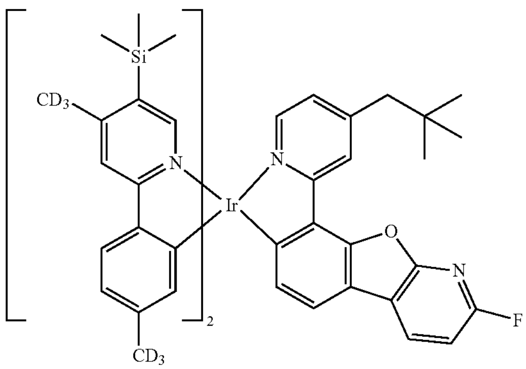

1382

Synthesis of Compound 1382A3.8 g (yield of 85%) of Compound 1382A was obtained in the same manner as in the synthesis of Compound 182A of Synthesis Example 1, except that 4-(methyl-$d_3$)-2-(4-(methyl-$d_3$)phenyl)-5-(trimethylsilyl)pyridine was used instead of 4-isobutyl-2-phenyl-5-(trimethylsilyl)pyridine.

Synthesis of Compound 1382B Compound 1382B was obtained in the same manner as in the synthesis of Compound 182B of Synthesis Example 1, except that Compound 1382A was used instead of Compound 182A. Compound 1382B thus obtained was used in the next reaction without performing any additional purification process thereon.

Synthesis of Compound 13820.42 g (yield of 34%) of Compound 1382 was obtained in the same manner as in the synthesis of Compound 182 of Synthesis Example 1, except that Compound 1382B was used instead of Compound 182B and 2-fluoro-8-(4-neopentylpyridin-2-yl)benzofuro[2,3-b]pyridine was used instead of 2-(7-fluorodibenzo[b,d]furan-4-yl)-4-(propan-2-yl-2-d)pyridine. The obtained compound was identified by Mass spectrum and HPLC analysis.

HRMS(MALDI) calcd for $C_{53}H_{46}D_{12}FIrN_4OSi_2$: m/z 1046.4516 Found: 1046.4513.

Comparative Synthesis Example A (Compound A)

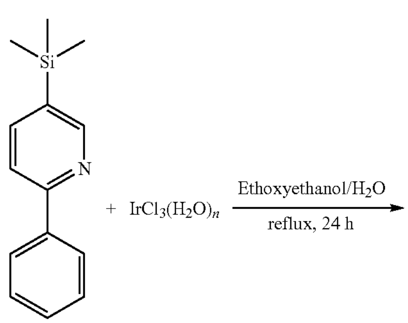

-continued

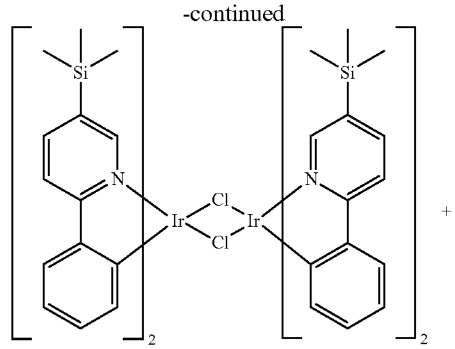

A(1)

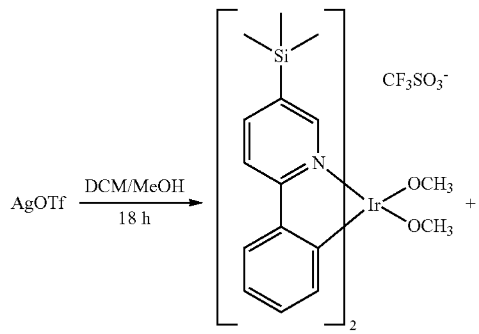

A(2)

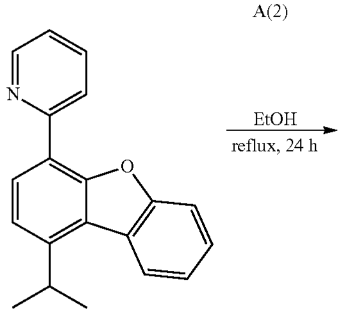

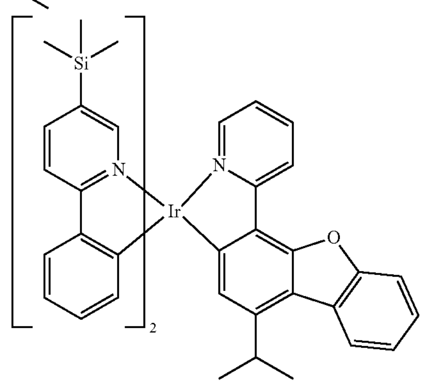

A

Synthesis of Compound A(1) 2.1 g (yield of 82%) of Compound A(1) was obtained in the same manner as in the synthesis of Compound 182A of Synthesis Example 1, except that 2-phenyl-5-(trimethylsilyl)pyridine was used instead of 4-isobutyl-2-phenyl-5-(trimethylsilyl)pyridine.

Synthesis of Compound A(2)Compound A(2) was obtained in the same manner as in the synthesis of Compound 182B of Synthesis Example 1, except that Compound A(1) was used instead of Compound 182A. Compound A(2) thus obtained was used in the next reaction without performing any additional purification process thereon.

Synthesis of Compound A 0.27 g (yield of 34%) of Compound A was obtained in the same manner as in the synthesis of Compound 182 of Synthesis Example 1, except that Compound A(2) was used instead of Compound 182B and 2-(1-isopropyldibenzo[b,d]furan-4-yl)pyridine was used instead of 2-(7-fluorodibenzo[b,d]furan-4-yl)-4-(propan-2-yl-2-d)pyridine. The obtained compound was identified by Mass spectrum and HPLC analysis.

HRMS(MALDI) calcd for $C_{48}H_{48}IrN_3OSi_2$: m/z 931.2965 Found: 931.2968.

Comparative Synthesis Example B (Compound B)

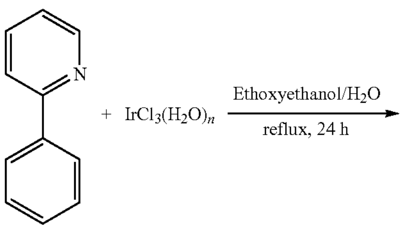

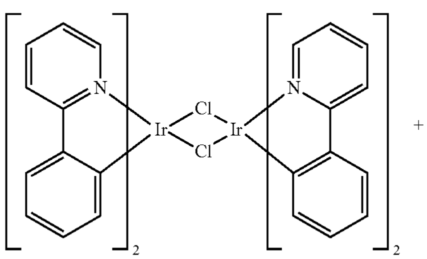

B(1)

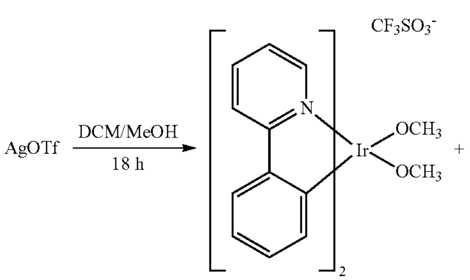

B(2)

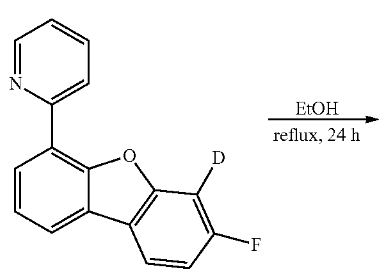

-continued

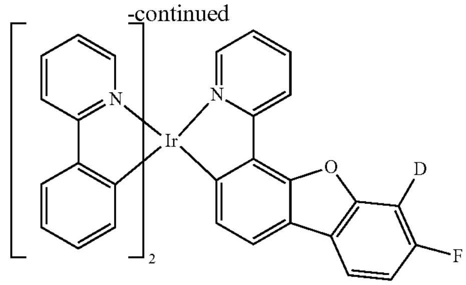

B

Synthesis of Compound B(1) 2.9 g (yield of 84%) of Compound was obtained in the same manner as in the synthesis of Compound 182A of Synthesis Example 1, except that 2-phenylpyridine was used instead of 4-isobutyl-2-phenyl-5-(trimethylsilyl)pyridine.

Synthesis of Compound B(2) Compound B(2) was obtained in the same manner as in the synthesis of Compound 182B of Synthesis Example 1, except that Compound B(1) was used instead of Compound 182A. Compound B(2) thus obtained was used in the next reaction without performing any additional purification process thereon.

Synthesis of Compound B0.35 g (yield of 41%) of Compound B was obtained in the same manner as in the synthesis of Compound 182 of Synthesis Example 1, except that Compound B(2) was used instead of Compound 182B and 2-(7-fluorodibenzo[b,d]furan-4-yl-6-d)pyridine was used instead of 2-(7-fluorodibenzo[b,d]furan-4-yl)-4-(propan-2-yl-2-d)pyridine. The obtained compound was identified by Mass spectrum and HPLC analysis.

HRMS(MALDI) calcd for $C_{39}H_{24}DFIrN_3O$: m/z 764.1674 Found: 764.1671.

Example 1

As an anode, a glass substrate with ITO/Ag/ITO deposited thereon to a thickness of 70 Å/1,000 Å/70 Å was cut to a size of 50 millimeters (mm)×50 mm×0.5 mm, sonicated with isopropyl alcohol and pure water each for 5 minutes, and then cleaned by exposure to ultraviolet rays and ozone for 30 minutes. Then the resultant glass substrate was loaded onto a vacuum deposition apparatus.

2-TNATA was vacuum-deposited on the anode to form a hole injection layer having a thickness of 600 Å, and 4,4'-bis[N-(1-naphthyl)-N-phenylamino] biphenyl (hereinafter referred to as NPB) was vacuum-deposited on the hole injection layer to form a hole transport layer having a thickness of 1,350 Å.

Subsequently, CBP (host) and Compound 182 (dopant) were co-deposited at a weight ratio of 98:2 on the hole transport layer to form an emission layer having a thickness of 400 Å.

Thereafter, BCP was vacuum-deposited on the emission layer to form a hole blocking layer having a thickness of 50 Å, $Alq_3$ was vacuum-deposited on the hole blocking layer to form an electron transport layer having a thickness of 350 Å, LiF was vacuum-deposited on the electron transport layer to form an electron injection layer having a thickness of 10 Å, and Mg and Ag were co-deposited at a weight ratio of 90:10 on the electron injection layer to form a cathode having a thickness of 120 Å, thereby completing an organic light-emitting device.

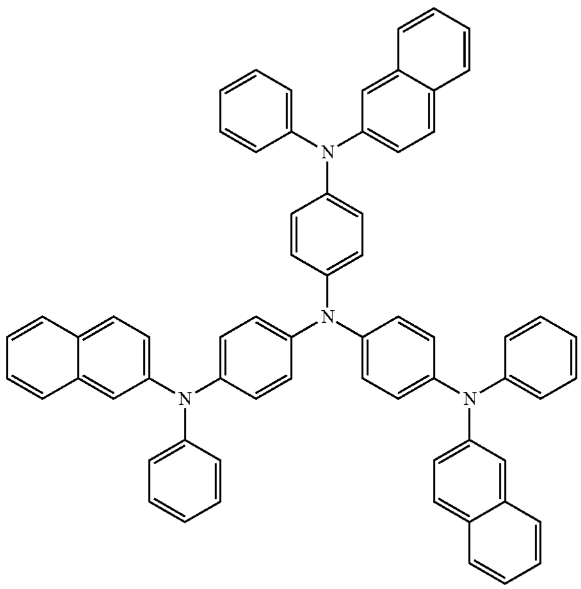

2-TNATA

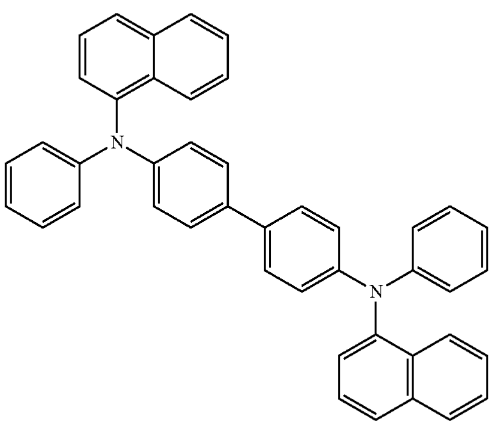

NPB

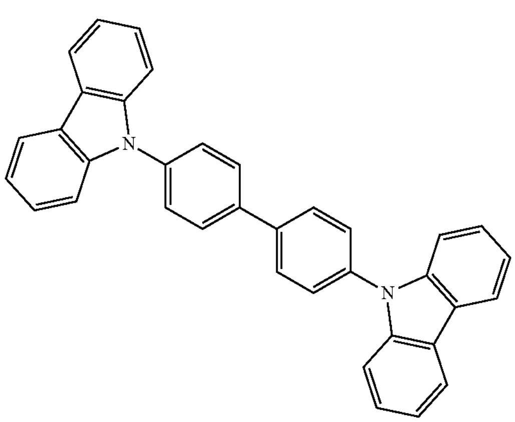

CBP

-continued

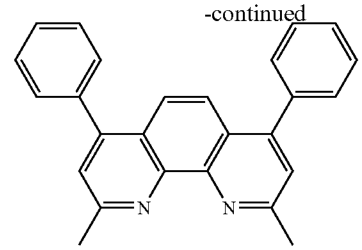

BCP

Examples 2 to 9 and Comparative Examples A and B

Organic light-emitting devices were manufactured in the same manner as in Example 1, except that Compounds shown in Table 2 were each used instead of Compound 182 as a dopant in forming an emission layer.

Evaluation Example 1: Characterization of Organic Light-Emitting Device

Regarding the organic light-emitting devices of Examples 1 to 9 and Comparative Examples A and B, the driving voltage, maximum value of external quantum efficiency (Max EQE, %), and lifespan ($LT_{97}$, hr.) were evaluated, and results are shown in Table 2. A current-voltage meter (Keithley 2400) and a luminescence meter (Minolta Cs-1, 000A) were used as an apparatus for evaluation, and the lifespan ($T_{97}$) (at 3500 candela per square meter (cd/$m^2$) or nit) was evaluated by measuring the amount of time that elapsed until luminance was reduced to 97% of the initial luminance of 100%, and the results were expressed as a relative value (%).

TABLE 2

| | Compound No. as a dopant in emission layer | Max EQE (relative value) | $LT_{97}$ (relative value) (at 3500 cd/$m^2$) |
|---|---|---|---|
| Example 1 | 182 | 93% | 51% |
| Example 2 | 486 | 100% | 57% |
| Example 3 | 672 | 93% | 34% |
| Example 4 | 943 | 88% | 95% |
| Example 5 | 1034 | 90% | 30% |
| Example 6 | 1153 | 95% | 42% |
| Example 7 | 1177 | 96% | 100% |
| Example 8 | 1295 | 100% | 58% |
| Example 9 | 1382 | 93% | 63% |
| Comparative Example A | A | 75% | 16% |
| Comparative Example B | B | 79% | 8% |

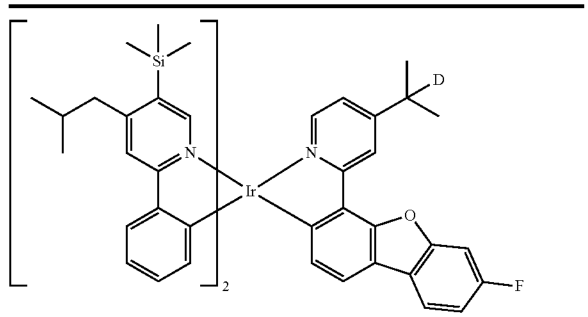

182

TABLE 2-continued
| Compound No. as a dopant in emission layer | Max EQE (relative value) | LT$_{97}$ (relative value) (at 3500 cd/m$^2$) |
|---|---|---|
| 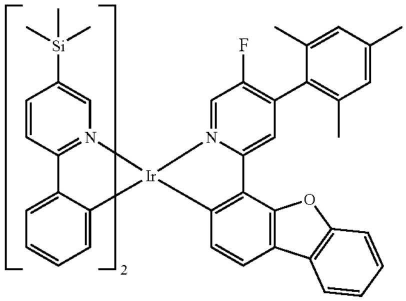 486 | | |
| 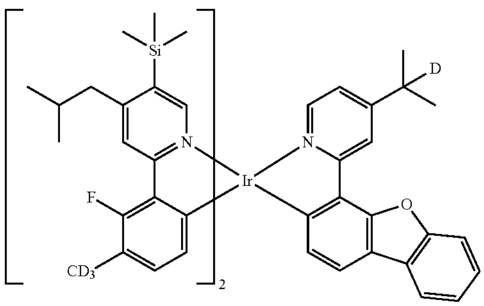 672 | | |
| 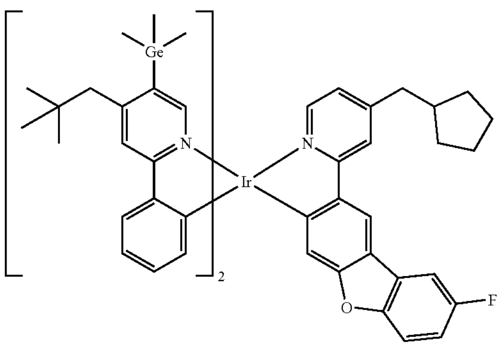 943 | | |
| 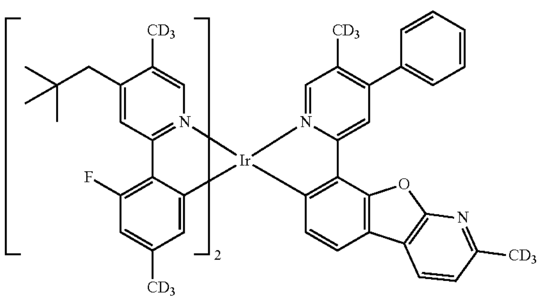 1034 | | |
TABLE 2-continued
| Compound No. as a dopant in emission layer | Max EQE (relative value) | LT$_{97}$ (relative value) (at 3500 cd/m$^2$) |
|---|---|---|
| 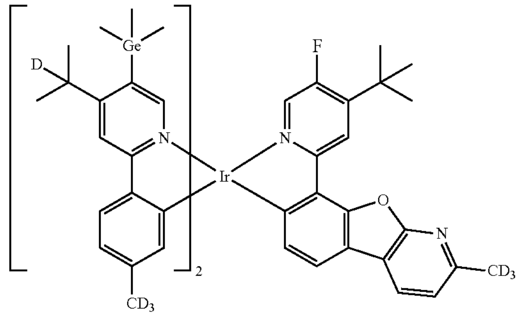 1153 | | |
| 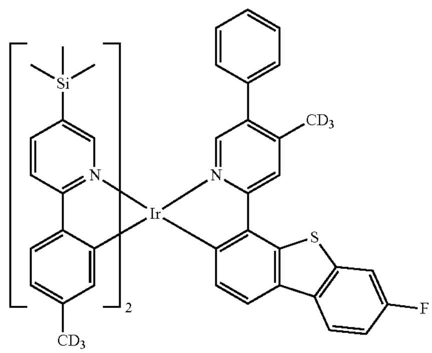 1177 | | |
| 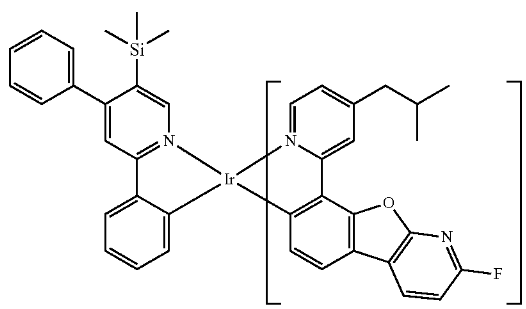 1295 | | |
| 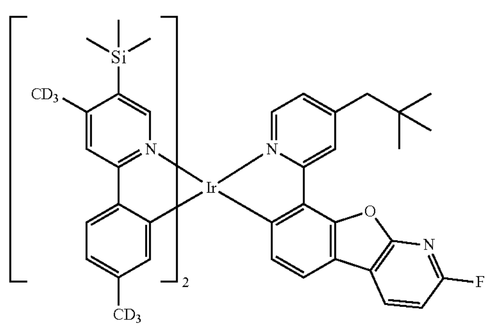 1382 | | |

TABLE 2-continued

| Compound No. as a dopant in emission layer | Max EQE (relative value) | $LT_{97}$ (relative value) (at 3500 cd/$m^2$) |
|---|---|---|
| 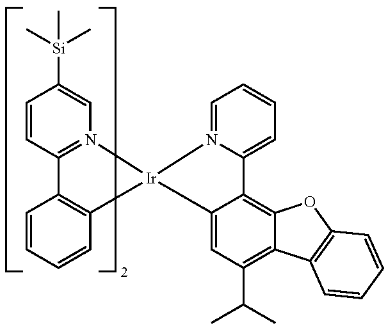 A | | |
| 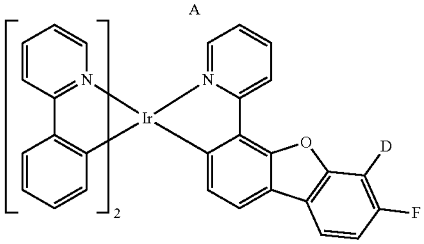 B | | |

From Table 2, it was confirmed that the organic light-emitting devices of Examples 1 to 9 had improved EQE and improved lifespan characteristics compared to the organic light-emitting devices of Comparative Examples A and B.

According to the one or more embodiments, an organometallic compound may have improved electrical characteristics and improved durability, so that an electronic device, for example, an organic light-emitting device, including such an organometallic compound may have improved external quantum efficiency (EQE) and improved lifespan characteristics. Therefore, the use of the organometallic compound may enable the embodiments of a high-quality organic light-emitting device and an electronic device including the same.

It should be understood that exemplary embodiments described in detail herein should be considered in a descriptive sense and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope of the present detailed description as defined by the following claims.

What is claimed is:

1. An organometallic compound represented by Formula 1:

Formula 1

$$M(L_1)_{n1}(L_2)_{n2}$$

wherein, in Formula 1,

M is a transition metal, $L_1$ is a ligand represented by Formula 2A, $L_2$ is a ligand represented by Formula 2B, n1 and n2 are each independently 1 or 2, wherein, when n1 is 2, two $L_1$(s) are identical to or different from each other, and when n2 is 2, two $L_2$(s) are identical to or different from each other, the sum of n1 and n2 is 2 or 3, and $L_1$ and $L_2$ are different from each other:

Formula 2A

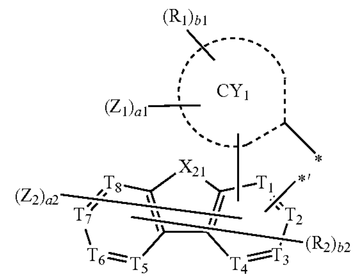

Formula 2B

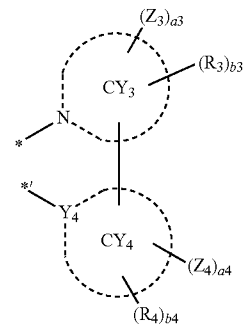

wherein, in Formulae 2A and 2B, $Y_4$ is C or N, $X_{21}$ is O, S, Se, S(═O), or N($R_{29}$), $T_1$ to $T_4$ are each independently C, N, carbon bonded to ring $CY_1$, or carbon bonded to M in Formula 1, wherein one of $T_1$ to $T_4$ is the carbon bonded to M in Formula 1, and one of the remaining groups $T_1$ to $T_4$ that is not bonded to M in Formula 1 is the carbon bonded to ring $CY_1$, $T_5$ to $T_8$ are each independently C or N, ring $CY_1$ and ring $CY_3$ are each independently a $C_1$-$C_{30}$ heterocyclic group, ring $CY_4$ is a $C_3$-$C_{30}$ carbocyclic group or a $C_1$-$C_{30}$ heterocyclic group, $Z_1$, $Z_3$, $Z_2$, and $Z_4$ are each a fluoro group or a fluorinated $C_1$-$C_{20}$ alkyl group, a1, a3, and a4 are each independently an integer from 0 to 20, wherein a2 is an integer from 0 to 6, and the sum of a1, a2, a3, and a4 is 1 or more, $R_1$ to $R_4$ and $R_{29}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, b1 and b4 are each independently an integer from 0 to 20, b2 is an integer from 0 to 6, and b3 is an integer from 1 to 20, when i) none of $T_1$ to $T_8$ in Formula 2A is N, ii) a2 in Formula 2A is not 0, and iii) $Z_2$ in Formula 2A is a fluoro group, then at least one of $R_3$(s) in the number of b3 in Formula 2B is —$Si(Q_3)(Q_4)(Q_5)$ or —$Ge(Q_3)(Q_4)(Q_5)$, in Formula 2B, and at least one of $R_3$(s) in the number of $b_3$ is —$Si(Q_3)(Q_4)(Q_5)$, —$Ge(Q_3)(Q_4)(Q_5)$, or a $C_1$-$C_{20}$ alkyl group unsubstituted or substituted with at least one deuterium, two or more of a plurality of $R_1$(s) are optionally linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_2$(s) are optionally linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_3$(s) are optionally linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_4$(s) are optionally linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_1$,

* and *' in Formulae 2A and 2B each indicate a binding site to M in Formula 1, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each independently substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each independently unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-Coo aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen;

deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

2. The organometallic compound of claim 1, wherein in Formula 1, M is Ir, and the sum of n1 and n2 is 3; or in Formula 1, M is Pt, and the sum of n1 and n2 is 2.

3. The organometallic compound of claim 1, wherein ring $CY_1$ and ring $CY_3$ are each independently a pyridine group, a pyrimidine group, a pyrazine group, a pyridazine group, a triazine group, a quinoline group, an isoquinoline group, a benzoquinoline group, a benzoisoquinoline group, a 5,6,7,8-tetrahydroisoquinoline group, a 5,6,7,8-tetrahydroquinoline group, or a pyridine group condensed with a norbornane group, $Y_4$ is C, and ring $CY_4$ is a benzene group, a naphthalene group, a 1,2,3,4-tetrahydronaphthalene group, a fluorene group, a carbazole group, a dibenzofuran group, a dibenzothiophene group, a dibenzosilole group, an azafluorene group, an azacarbazole group, an azadibenzofuran group, an azadibenzothiophene group, an azadibenzosilole group, or a benzene group condensed with a norbornane group.

4. The organometallic compound of claim 1, wherein a1 is 1, and a2, a3, and a4 are each independently 0, a2 is 1 or 2, and a1, a3, and a4 are each independently 0, a3 is 1, and a1, a2, and a4 are each independently 0, a4 is 1, and a1, a2, and a3 are each independently 0, a2 and a4 are each independently 1, and a1 and a3 are each independently 0, or a1 and a2 are each independently 1, and a3 and a4 are each independently 0.

5. The organometallic compound of claim 1, wherein $R_1$ to $R_4$ and $R_{29}$ are each independently:

hydrogen, deuterium, or a cyano group;

a $C_1$-$C_{20}$ alkyl group unsubstituted or substituted with deuterium, a cyano group, a $C_3$-$C_{10}$ cycloalkyl group, a deuterated $C_3$-$C_{10}$ cycloalkyl group, a ($C_1$-$C_{20}$ alkyl)$C_3$-$C_{10}$ cycloalkyl group, a deuterated ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a deuterated ($C_1$-$C_{20}$ alkyl)$C_1$-$C_{10}$ heterocycloalkyl group, a phenyl group, a deuterated phenyl group, a ($C_1$-$C_{20}$ alkyl)phenyl group, a deuterated ($C_1$-$C_{20}$ alkyl)phenyl group, a biphenyl group, a deuterated biphenyl group, a ($C_1$-$C_{20}$ alkyl)biphenyl group, a deuterated ($C_1$-$C_{20}$ alkyl)biphenyl group, or a combination thereof;

a $C_3$-$C_{10}$ cycloalkyl group, a $C_1$-$C_{10}$ heterocycloalkyl group, a phenyl group, or a biphenyl group, each independently unsubstituted or substituted with deuterium, a cyano group, a $C_1$-$C_{20}$ alkyl group, a deuterated $C_1$-$C_{20}$ alkyl group, a $C_1$-$C_{20}$ alkoxy group, a deuterated $C_1$-$C_{20}$ alkoxy group, a $C_3$-$C_{10}$ cycloalkyl group, a deuterated a $C_3$-$C_{10}$ cycloalkyl group, a ($C_1$-$C_{20}$ alkyl)$C_3$-$C_{10}$ cycloalkyl group, a deuterated ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a ($C_1$-$C_{20}$ alkyl)$C_1$-$C_{10}$ heterocycloalkyl group, a deuterated ($C_1$-$C_{20}$ alkyl)$C_1$-$C_{10}$ heterocycloalkyl group, a phenyl group, a deuterated phenyl group, a ($C_1$-$C_{20}$ alkyl)phenyl group, a deuterated ($C_1$-$C_{20}$ alkyl)phenyl group, a biphenyl group, a deuterated biphenyl group, a ($C_1$-$C_{20}$ alkyl)biphenyl group, a deuterated ($C_1$-$C_{20}$ alkyl)biphenyl group, or a combination thereof, or —Si($Q_3$)($Q_4$)($Q_5$) or —Ge($Q_3$)($Q_4$)($Q_5$).

6. The organometallic compound of claim 1, wherein in Formula 2B, at least one of $R_3$(s) in the number of b3 is —Si($Q_3$)($Q_4$)($Q_5$) or —Ge($Q_3$)($Q_4$)($Q_5$).

7. The organometallic compound of claim 1, wherein the organometallic compound comprises at least one deuterium.

8. The organometallic compound of claim 1, wherein a group represented by

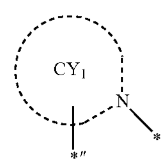

in Formula 2A is a group represented by one of Formulae CY1(1) to CY1(22):

CY1(1)

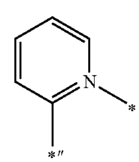

CY1(2)

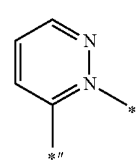

CY1(3)

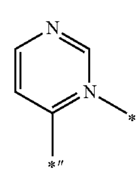

-continued
CY1(4)
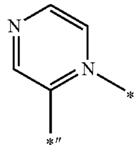
CY1(5)
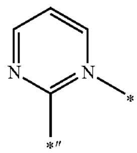
CY1(6)
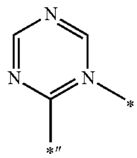
CY1(7)
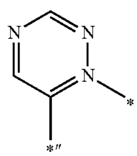
CY1(8)
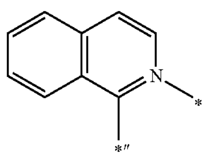
CY1(9)
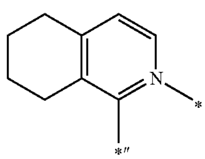
CY1(10)
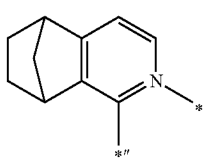
CY1(11)
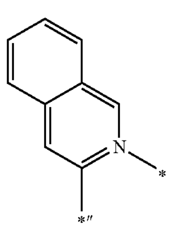
-continued
CY1(12)
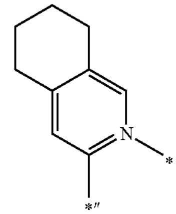
CY1(13)
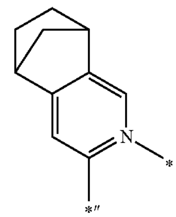
CY1(14)
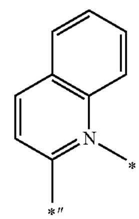
CY1(15)
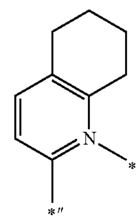
CY1(16)
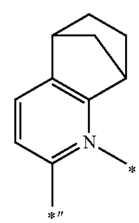
CY1(17)
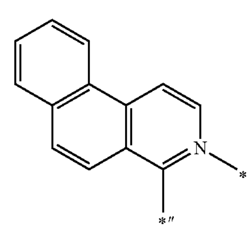
CY1(18)
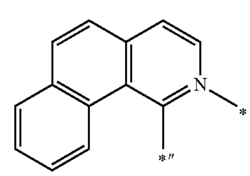

-continued
CY1(19)
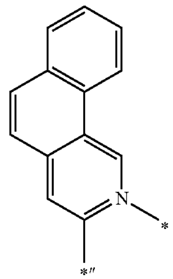
CY1(20)
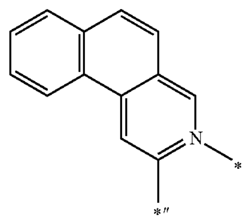
CY1(21)
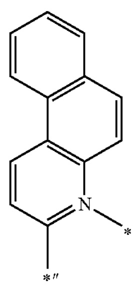
CY1(22)
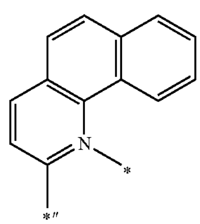
wherein, in Formulae CY1(1) to CY1(22), * indicates a binding site to M in Formula 1, and *" indicates a binding site to a neighboring carbon atom in Formula 2A.
9. The organometallic compound of claim 1, wherein a group represented by
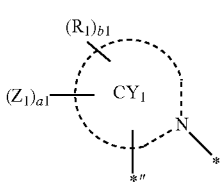
in Formula 2A is a group represented by one of Formulae CY1-1 to CY1-16 and CY1-1F to CY1-32F:
CY1-1
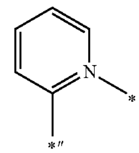
CY1-2
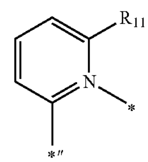
CY1-3
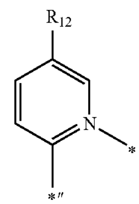
CY1-4
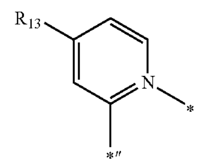
CY1-5
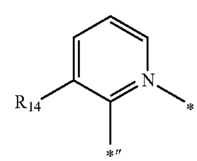
CY1-6
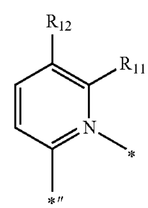
CY1-7
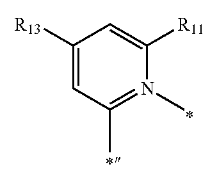
CY1-8
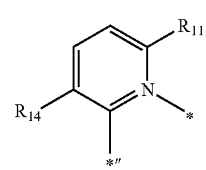

-continued
CY1-9
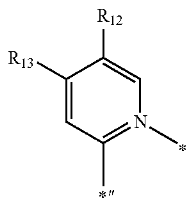
CY1-10
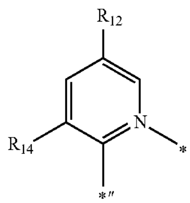
CY1-11
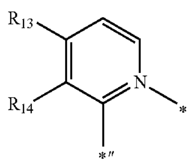
CY1-12
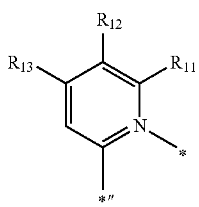
CY1-13
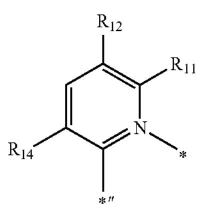
CY1-14
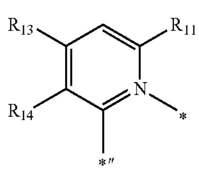
CY1-15
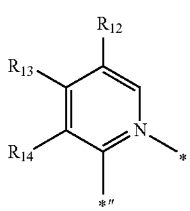
-continued
CY1-16
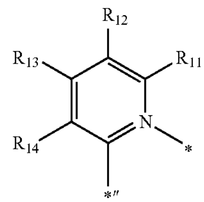
CY1-1F
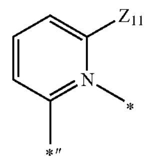
CY1-2F
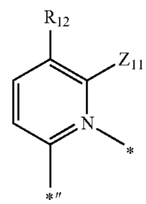
CY1-3F
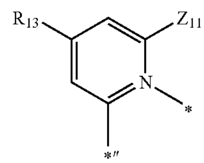
CY1-4F
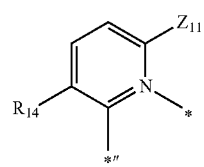
CY1-5F
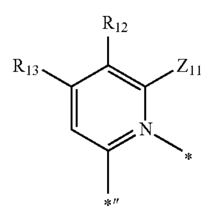
CY1-6F
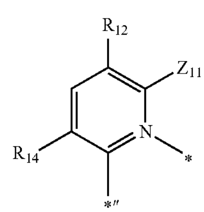
CY1-7F
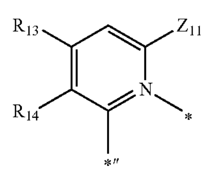

-continued
CY1-8F
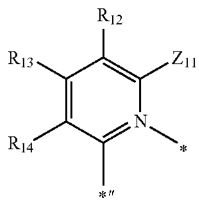
CY1-9F
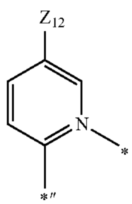
CY1-10F
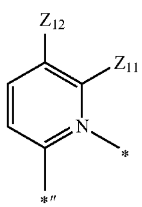
CY1-11F
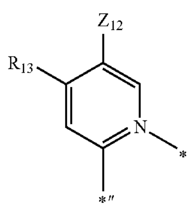
CY1-12F
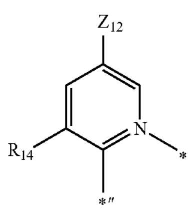
CY1-13F
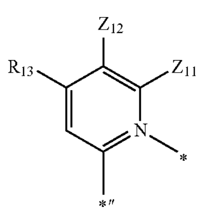
CY1-14F
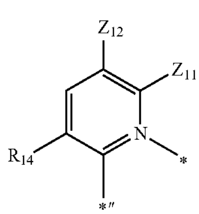
-continued
CY1-15F
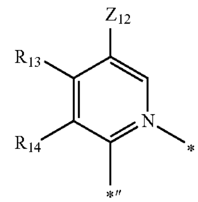
CY1-16F
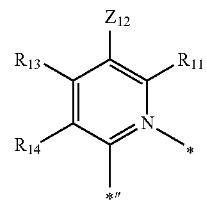
CY1-17F
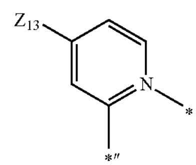
CY1-18F
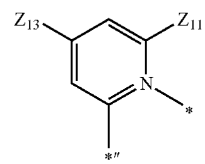
CY1-19F
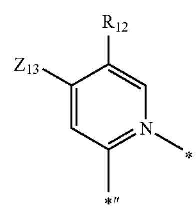
CY1-20F
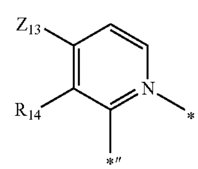
CY1-21F
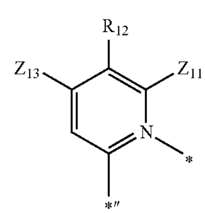
CY1-22F
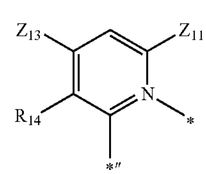

-continued

CY1-23F

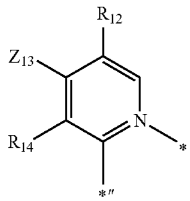

CY1-24F

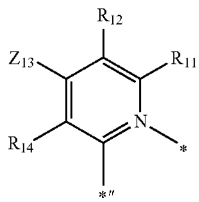

CY1-25F

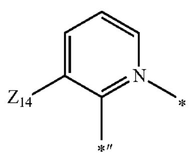

CY1-26F

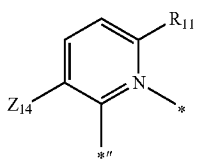

CY1-27F

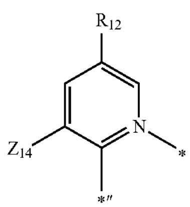

CY1-28F

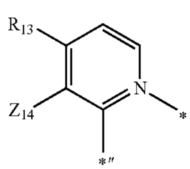

CY1-29F

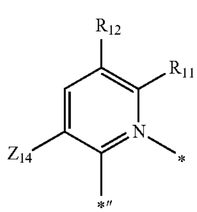

CY1-30F

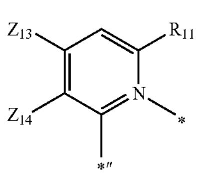

-continued

CY1-31F

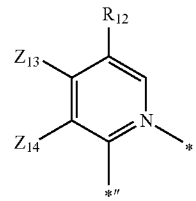

CY1-32F

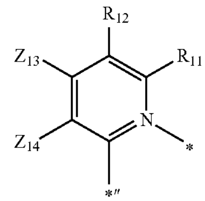

wherein, in Formulae CY1-1 to CY1-16 and CY1-1F to CY1-32F, $Z_{11}$ to $Z_{14}$ are each the same as described in connection with $Z_1$ in claim 1, $R_{11}$ to $R_{14}$ are each the same as described in connection with $R_1$ in claim 1, wherein each of $R_{11}$ to $R_{14}$ is not hydrogen,

* indicates a binding site to M in Formula 1, and

*" indicates a binding site to a neighboring carbon atom in Formula 2A.

10. The organometallic compound of claim 1, wherein a group represented by

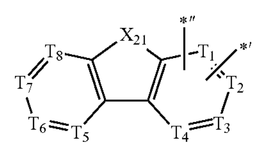

in Formula 2A is a group represented by one of Formulae CY2-1 to CY2-6:

CY2-1

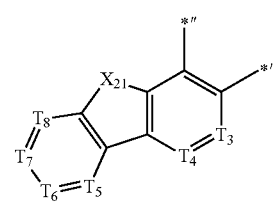

CY2-2

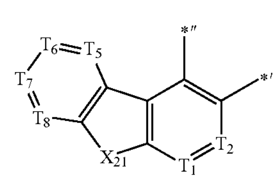

-continued

CY2-3

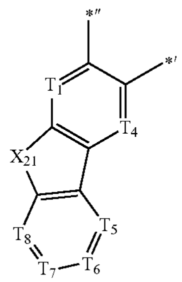

CY2-4

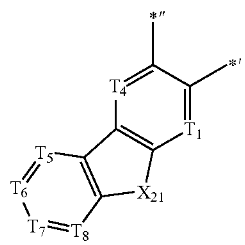

CY2-5

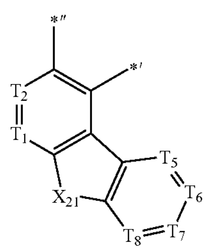

CY2-6

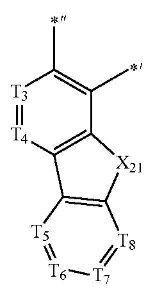

wherein, in Formulae CY2-1 to CY2-6, *' indicates a binding site to M in Formula 1, and *" indicates a binding site to ring CY1 in Formula 2A.

11. The organometallic compound of claim 1, wherein a group represented by

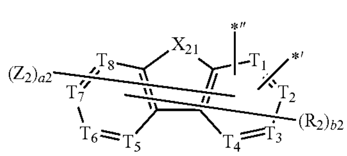

in Formula 2A is a group represented by one of Formulae CY2-1-1 to CY2-1-22, CY2-1-1N to CY2-1-16N, CY2-4-1 to CY2-4-22, CY2-4-1N to CY2-4-16N, CY2-1-1F to CY2-1-21F, CY2-1-1NF to CY2-1-15NF, CY2-4-1F to CY2-4-21F, and CY2-4-1NF to CY2-4-15NF:

CY2-1-1

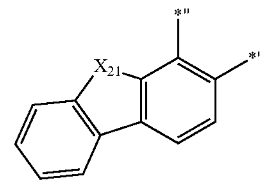

CY2-1-2

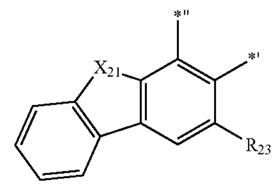

CY2-1-3

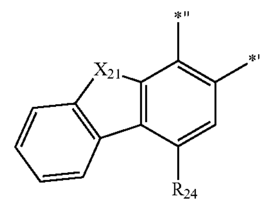

CY2-1-4

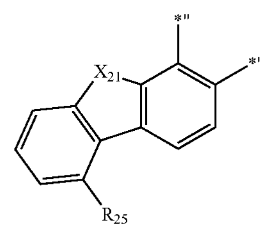

CY2-1-5

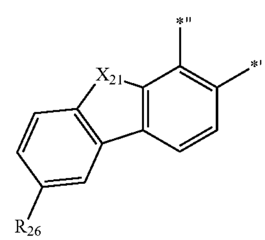

CY2-1-6

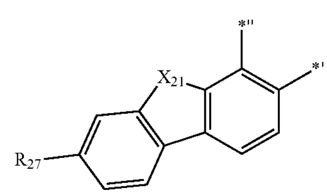

CY2-1-7

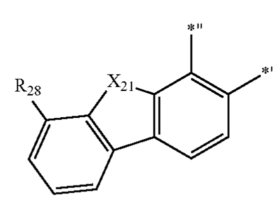

CY2-1-8

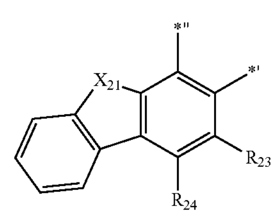

-continued
CY2-1-9
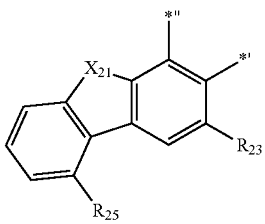
CY2-1-10
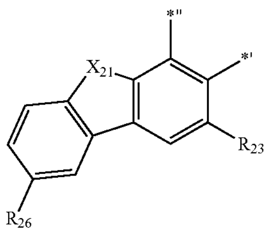
CY2-1-11
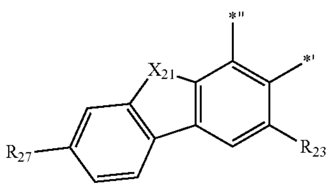
CY2-1-12
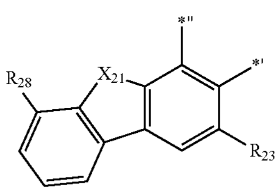
CY2-1-13
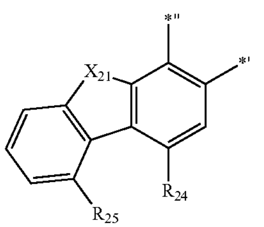
CY2-1-14
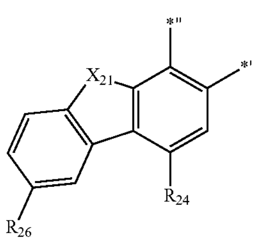
CY2-1-15
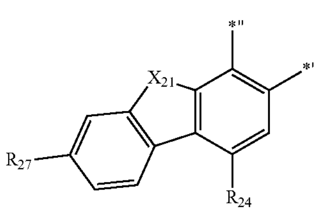
-continued
CY2-1-16
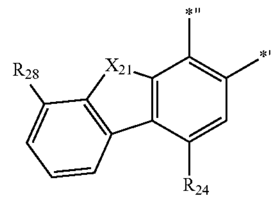
CY2-1-17
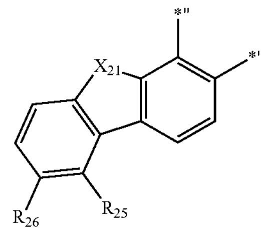
CY2-1-18
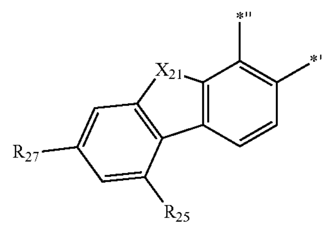
CY2-1-19
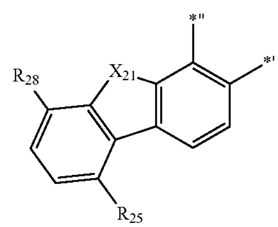
CY2-1-20
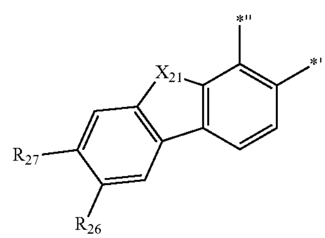
CY2-1-21
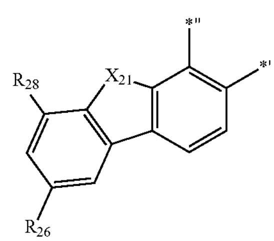
CY2-1-22
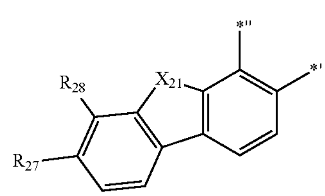

-continued
CY2-1-1N
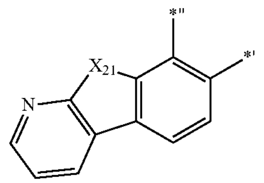
CY2-1-2N
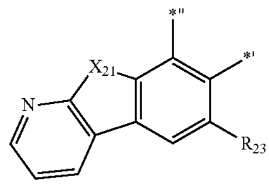
CY2-1-3N
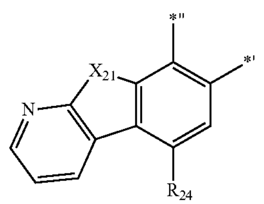
CY2-1-4N
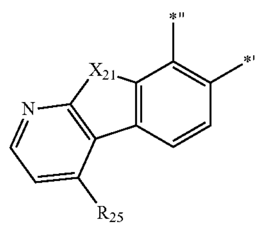
CY2-1-5N
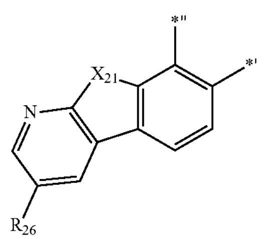
CY2-1-6N
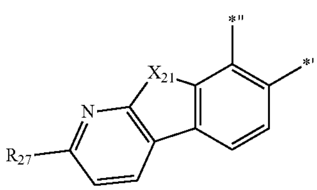
CY2-1-7N
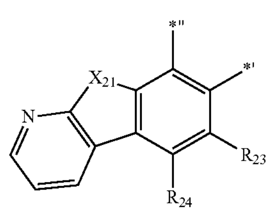
-continued
CY2-1-8N
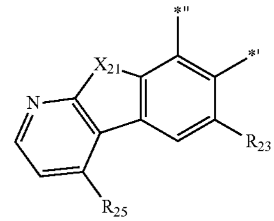
CY2-1-9N
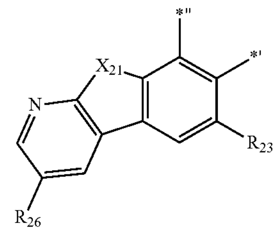
CY2-1-10N
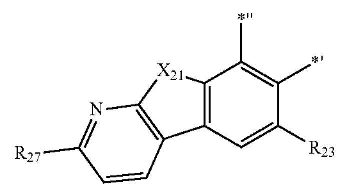
CY2-1-11N
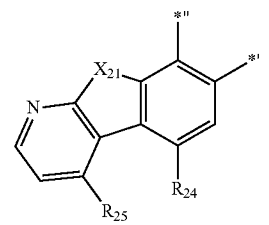
CY2-1-12N
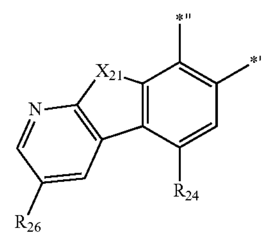
CY2-1-13N
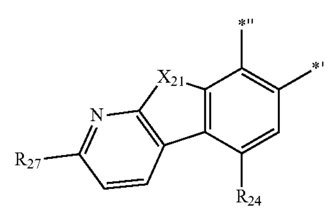
CY2-1-14N
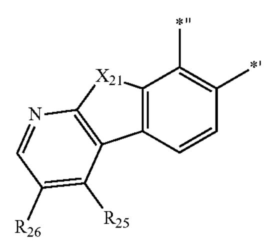

-continued
CY2-1-15N
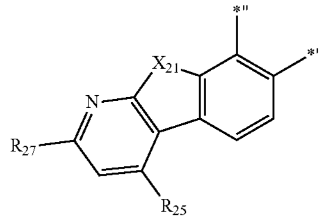
CY2-1-16N
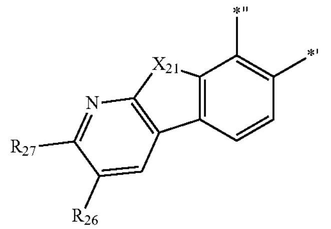
CY2-4-1
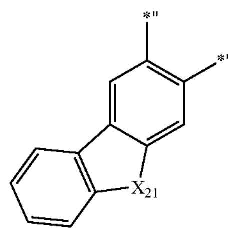
CY2-4-2
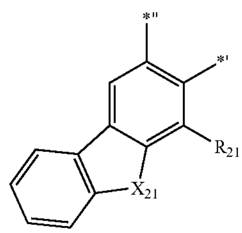
CY2-4-3
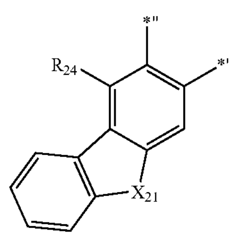
CY2-4-4
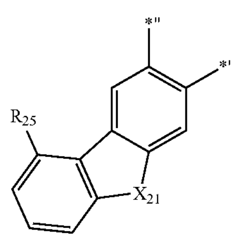
CY2-4-5
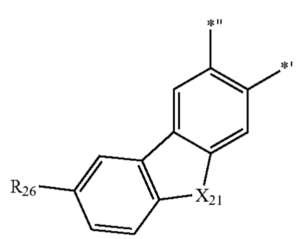
-continued
CY2-4-6
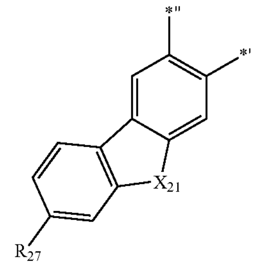
CY2-4-7
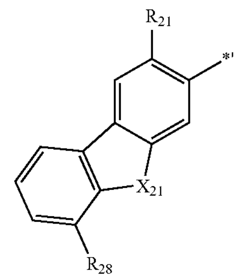
CY2-4-8
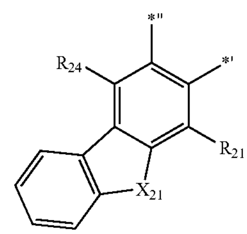
CY2-4-9
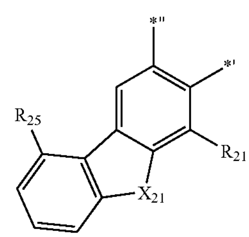
CY2-4-10
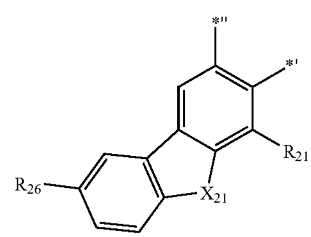
CY2-4-11
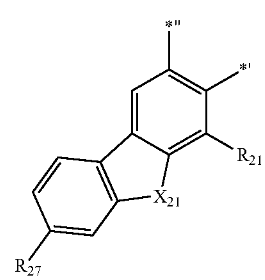

CY2-4-12
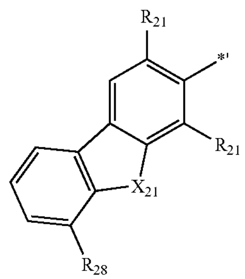
CY2-4-13
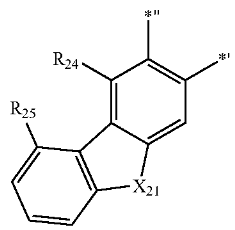
CY2-4-14
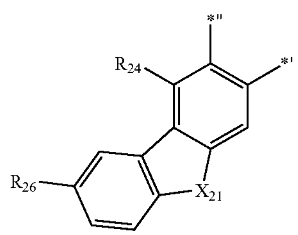
CY2-4-15
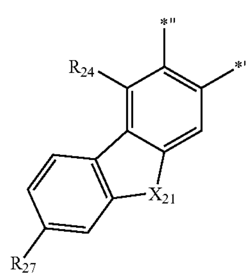
CY2-4-16
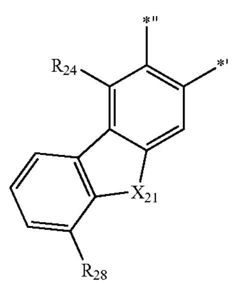
CY2-4-17
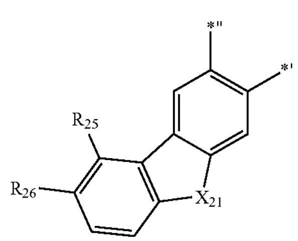
CY2-4-18
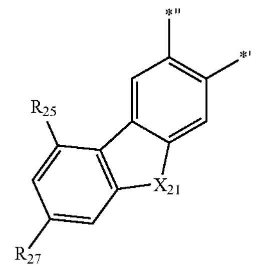
CY2-4-19
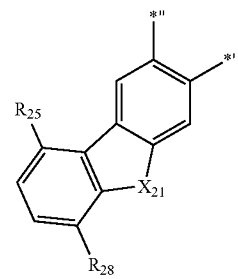
CY2-4-20
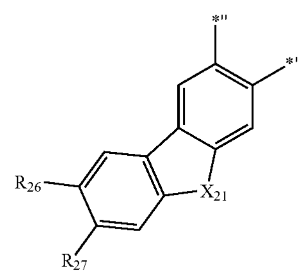
CY2-4-21
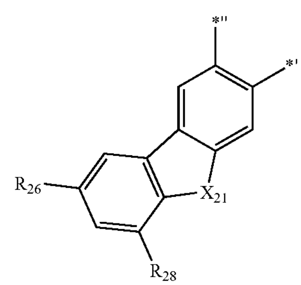
CY2-4-22
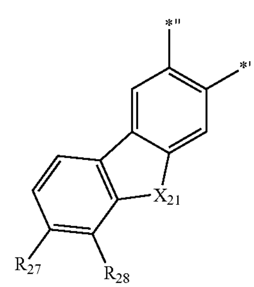
CY2-4-1N
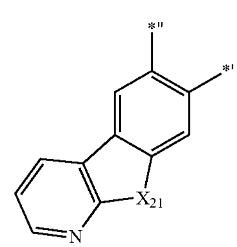

-continued
CY2-4-2N
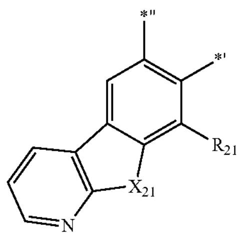
CY2-4-3N
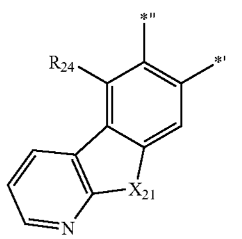
CY2-4-4N
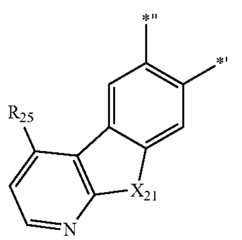
CY2-4-5N
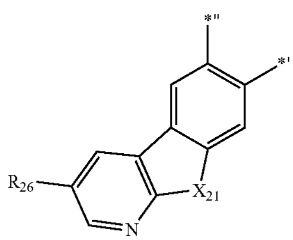
CY2-4-6N
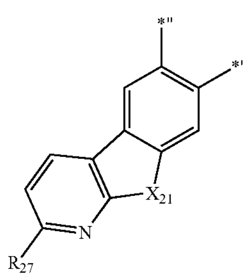
CY2-4-7N
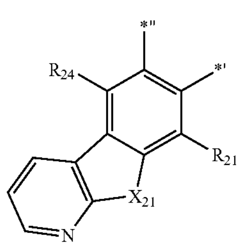
-continued
CY2-4-8N
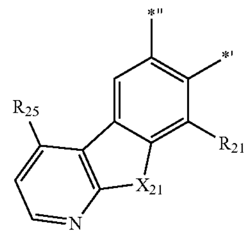
CY2-4-9N
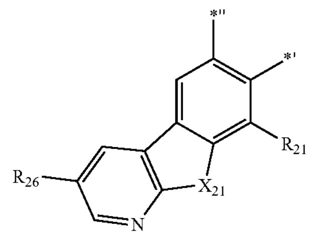
CY2-4-10N
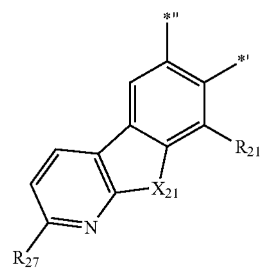
CY2-4-11N
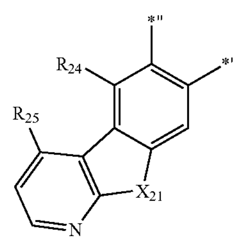
CY2-4-12N
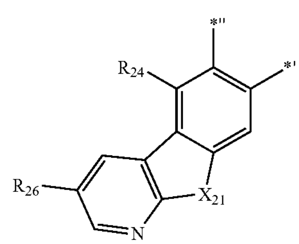
CY2-4-13N
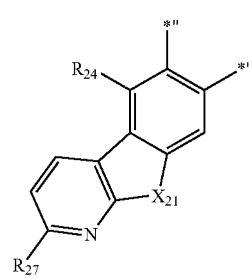

-continued
CY2-4-14N
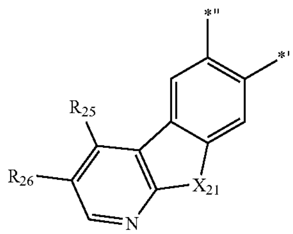
CY2-4-15N
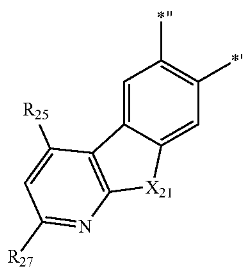
CY2-4-16N
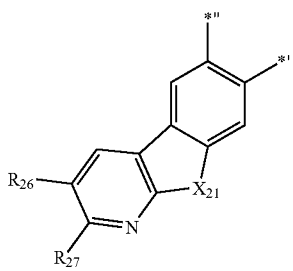
CY2-1-1F
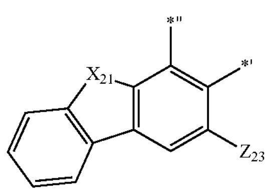
CY2-1-2F
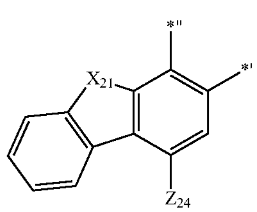
CY2-1-3F
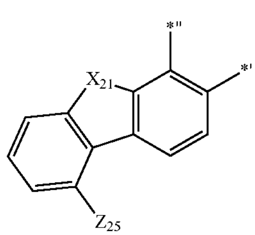
-continued
CY2-1-4F
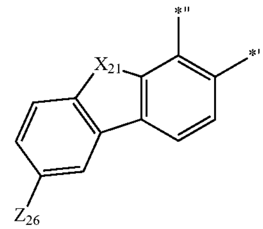
CY2-1-5F
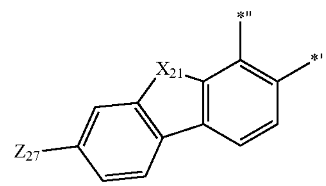
CY2-1-6F
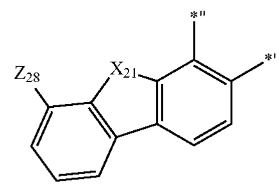
CY2-1-7F
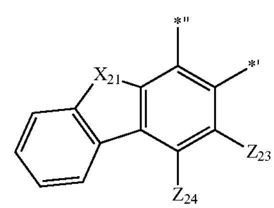
CY2-1-8F
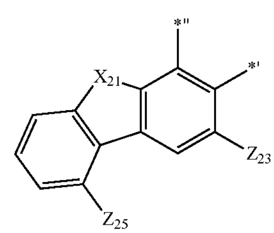
CY2-1-9F
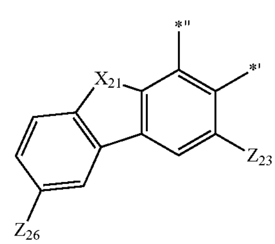
CY2-1-10F
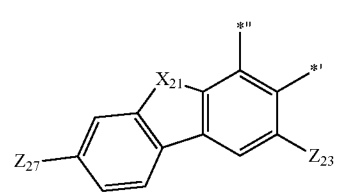

-continued
CY2-1-11F
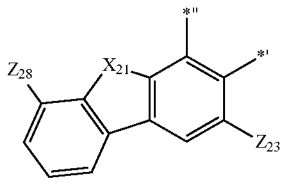
CY2-1-12F
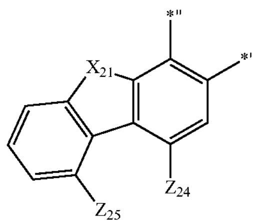
CY2-1-13F
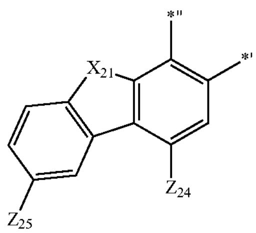
CY2-1-14F
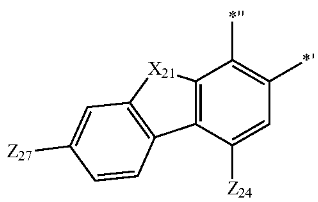
CY2-1-15F
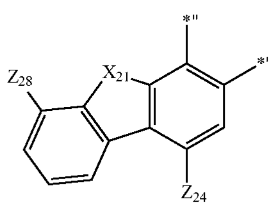
CY2-1-16F
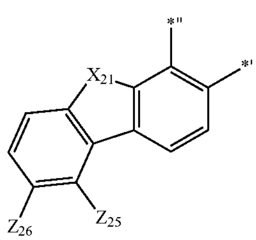
CY2-1-17F
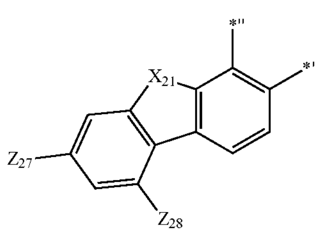
-continued
CY2-1-18F
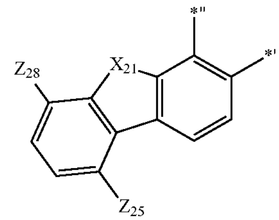
CY2-1-19F
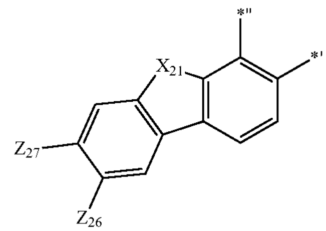
CY2-1-20F
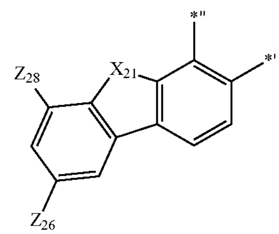
CY2-1-21F
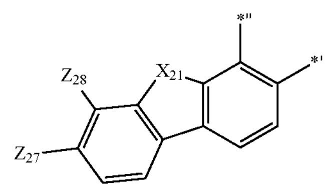
CY2-1-1NF
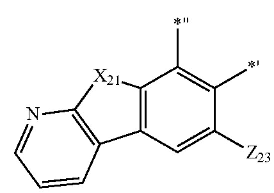
CY2-1-2NF
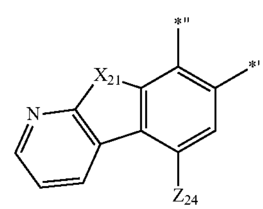
CY2-1-3NF
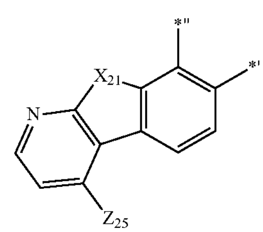

-continued
CY2-1-4NF
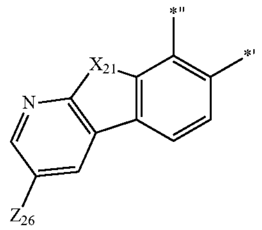
CY2-1-5NF
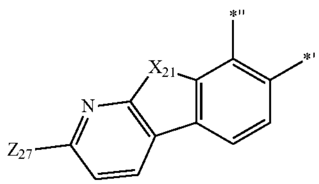
CY2-1-6NF
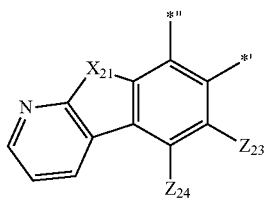
CY2-1-7NF
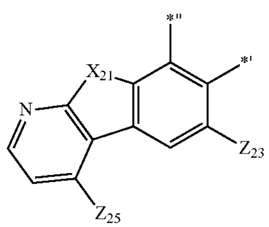
CY2-1-8NF
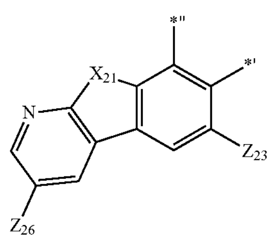
CY2-1-9NF
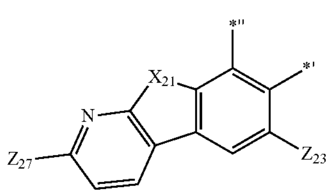
CY2-1-10NF
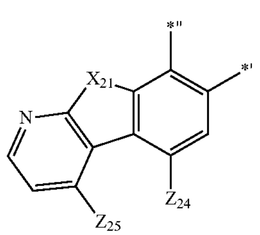
-continued
CY2-1-11NF
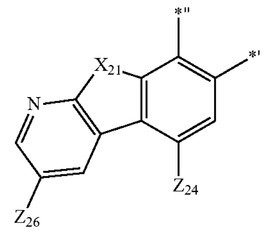
CY2-1-12NF
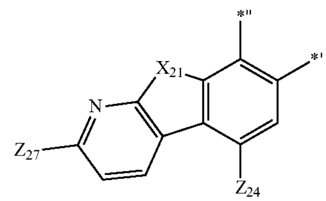
CY2-1-13NF
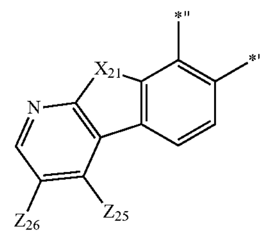
CY2-1-14NF
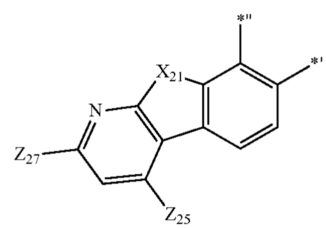
CY2-1-15NF
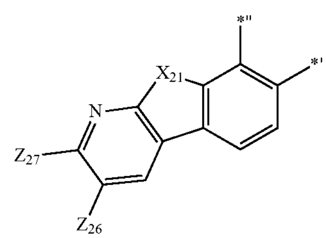
CY2-4-1F
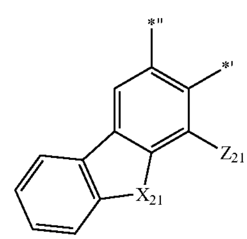
CY2-4-2F
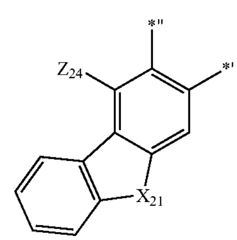

-continued
CY2-4-3F
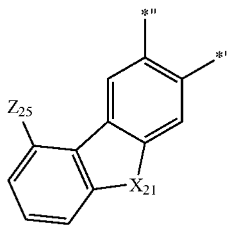
CY2-4-4F
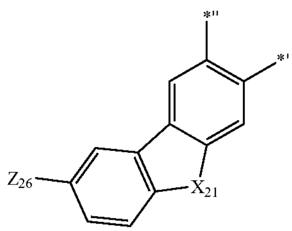
CY2-4-5F
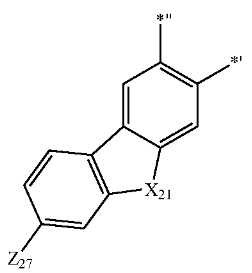
CY2-4-6F
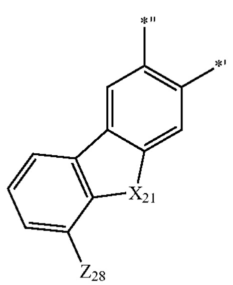
CY2-4-7F
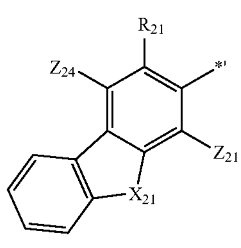
CY2-4-8F
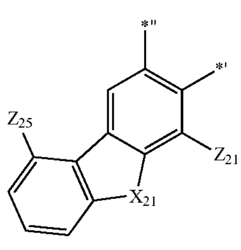
-continued
CY2-4-9F
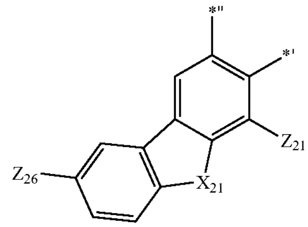
CY2-4-10F
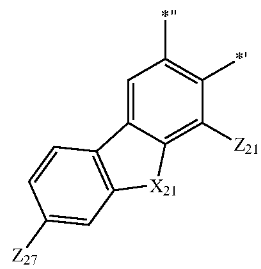
CY2-4-11F
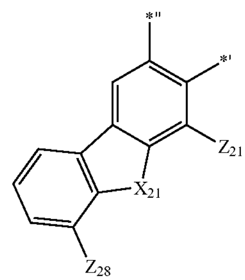
CY2-4-12F
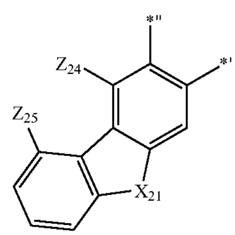
CY2-4-13F
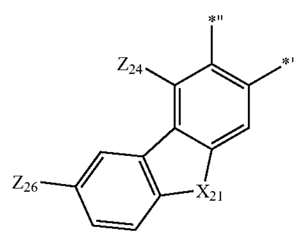
CY2-4-14F
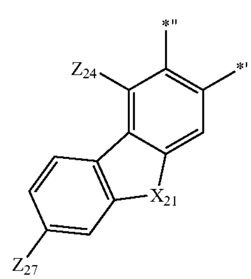

CY2-4-15F
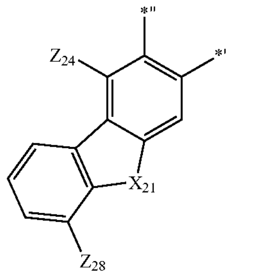
CY2-4-16F
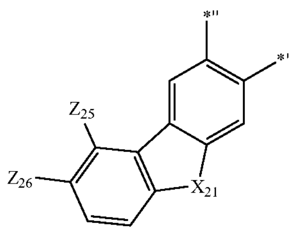
CY2-4-17F
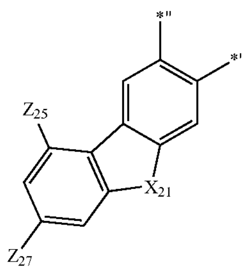
CY2-4-18F
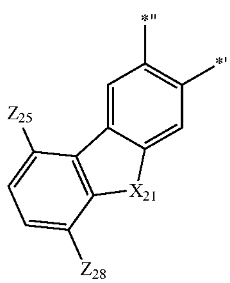
CY2-4-19F
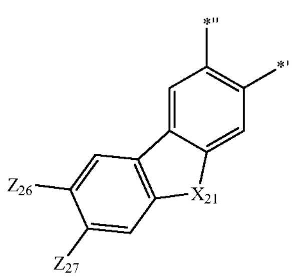
CY2-4-20F
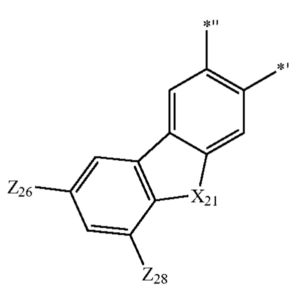
CY2-4-21F
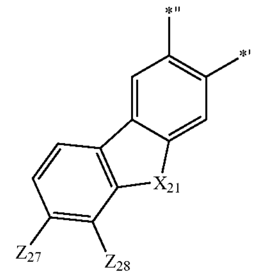
CY2-4-1NF
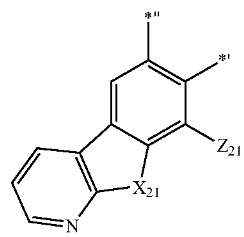
CY2-4-2NF
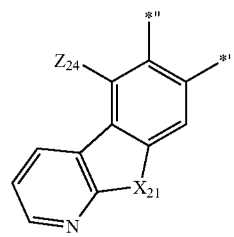
CY2-4-3NF
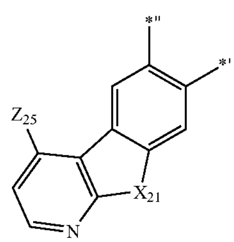
CY2-4-4NF
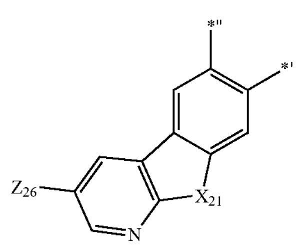
CY2-4-5NF
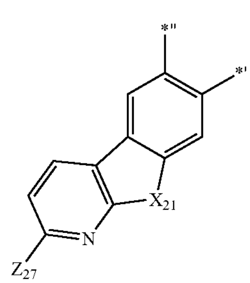

-continued

CY2-4-6NF

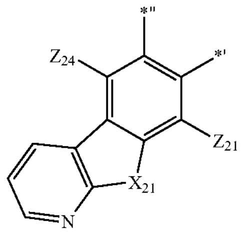

CY2-4-7NF

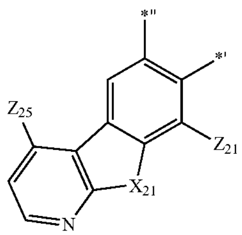

CY2-4-8NF

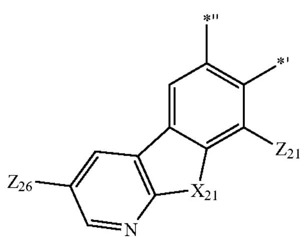

CY2-4-9NF

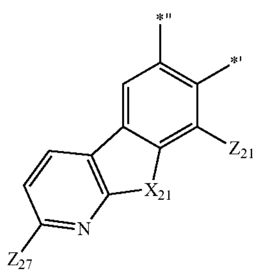

CY2-4-10NF

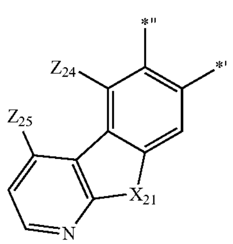

CY2-4-11NF

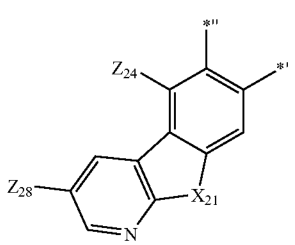

-continued

CY2-4-12NF

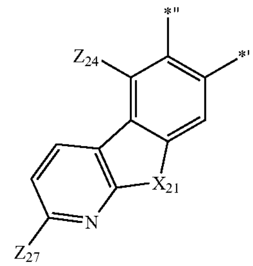

CY2-4-13NF

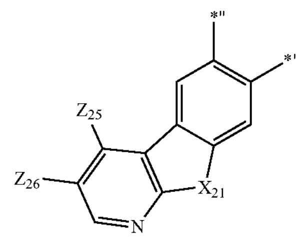

CY2-4-14NF

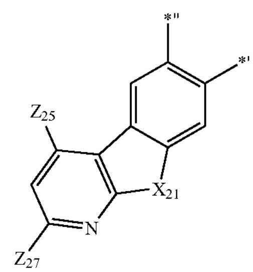

CY2-4-15NF

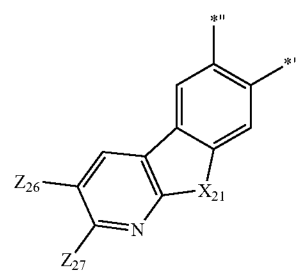

wherein, in Formulae CY2-1-1 to CY2-1-22, CY2-1-1N to CY2-1-16N, CY2-4-1 to CY2-4-22, CY2-4-1N to CY2-4-16N, CY2-1-1F to CY2-1-21F, CY2-1-1NF to CY2-1-15NF, CY2-4-1F to CY2-4-21F, and CY2-4-1NF to CY2-4-15NF, $Z_{21}$ to $Z_{28}$ are each the same as described in connection with $Z_2$ in claim 1, $R_{21}$ to $R_{28}$ are each the same as described in connection with $R_2$ in claim 1, wherein each of $R_{21}$ to $R_{28}$ is not hydrogen,

*' indicates a binding site to M in Formula 1, and

*" indicates a binding site to ring CY1 in Formula 2A.

12. The organometallic compound of claim 1, wherein a group represented by

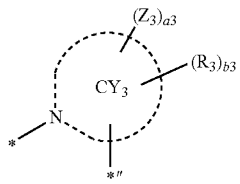

in Formula 2B is a group represented by Formula CY3(1):

CY3(1)

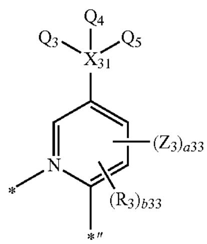

wherein, in Formula CY3(1), $X_{31}$ is Si or Ge, $Z_3$, $R_3$, and $Q_3$ to $Q_5$ are each the same as described in claim 1, a33 and b33 are each independently an integer from 0 to 3, two or more of $R_3$(s) in the number of a33 are optionally linked together to form a $C_3$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in connection with $R_1$ in claim 1,

* indicates a binding site to M in Formula 1, and

*" indicates a binding site to ring CY4 in Formula 2B.

13. The organometallic compound of claim 1, wherein a group represented by

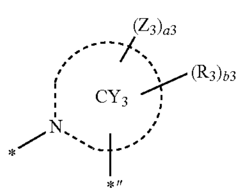

in Formula 2B is a group represented by one of Formulae CY3-2 to CY3-16, CY3-2F to CY3-8F, or CY3-10F to CY3-16F, CY3-18F to CY3-24F, or CY3-26F to CY3-32F:

CY3-2

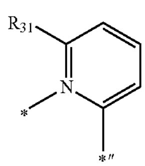

-continued

CY3-3

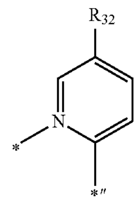

CY3-4

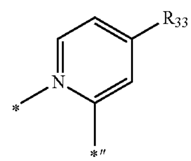

CY3-5

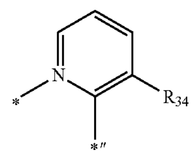

CY3-6

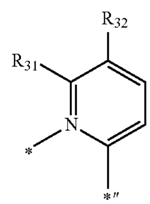

CY3-7

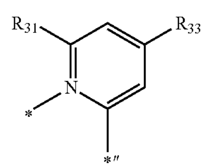

CY3-8

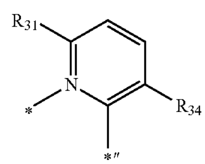

CY3-9

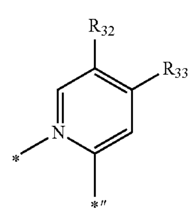

CY3-10

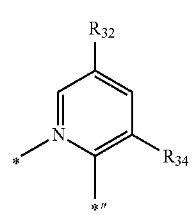

-continued
CY3-11
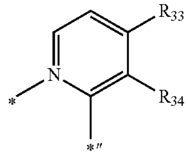
CY3-12
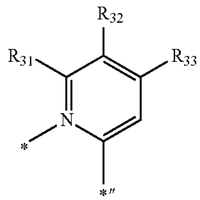
CY3-13
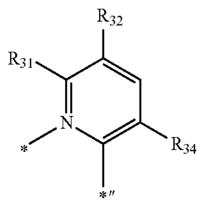
CY3-14
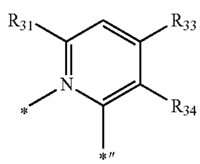
CY3-15
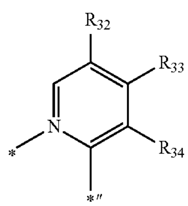
CY3-16
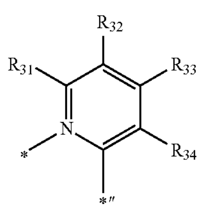
CY3-2F
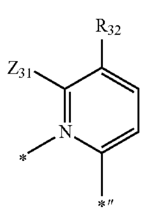
CY3-3F
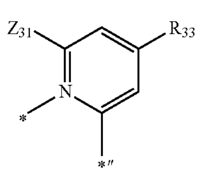
-continued
CY3-4F
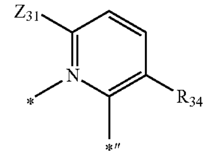
CY3-5F
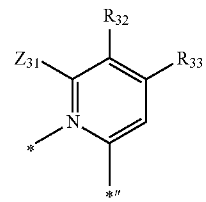
CY3-6F
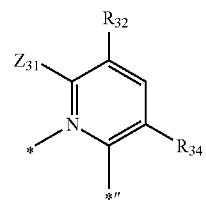
CY3-7F
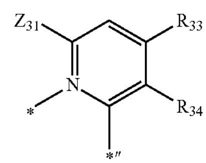
CY3-8F
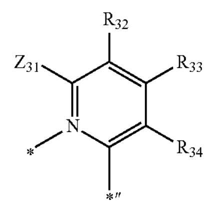
CY3-10F
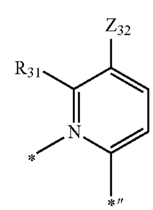
CY3-11F
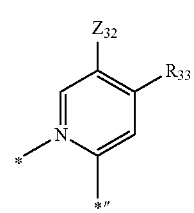

-continued
CY3-12F
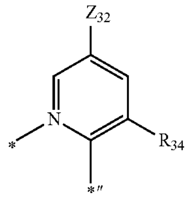
CY3-13F
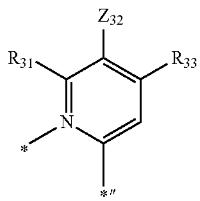
CY3-14F
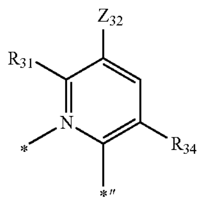
CY3-15F
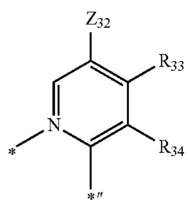
CY3-16F
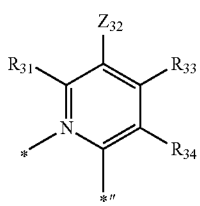
CY3-18F
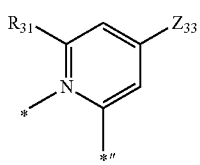
CY3-19F
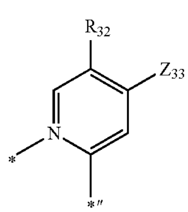
CY3-20F
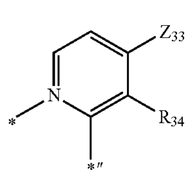
-continued
CY3-21F
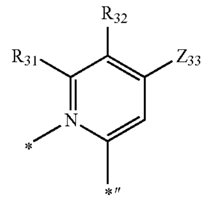
CY3-22F
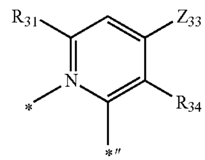
CY3-23F
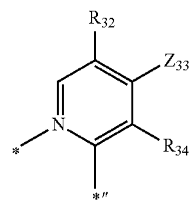
CY3-24F
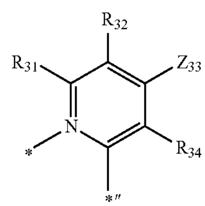
CY3-26F
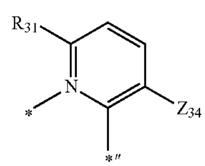
CY3-27F
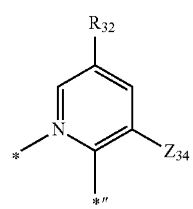
CY3-28F
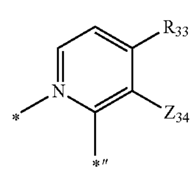
CY3-29F
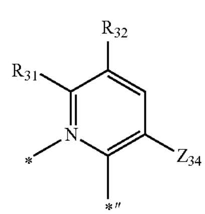

-continued

CY3-30F

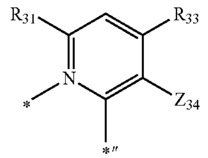

CY3-31F

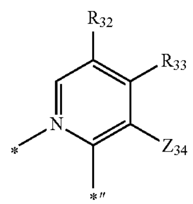

CY3-32F

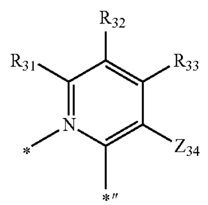

wherein, in Formulae CY3-2 to CY3-16, CY3-2F to CY3-8F, or CY3-10F to CY3-16F, CY3-18F to CY3-24F, or CY3-26F to CY3-32F, $Z_{31}$ to $Z_{34}$ are each the same as described in connection with $Z_3$ in claim 1, $R_{31}$ to $R_{34}$ are each the same as described in connection with $R_3$ in claim 1, wherein each of $R_{31}$ to $R_{34}$ is not hydrogen,

* indicates a binding site to M in Formula 1, and

*" indicates a binding site to ring $CY_4$ in Formula 2B.

14. The organometallic compound of claim 1, wherein a group represented by

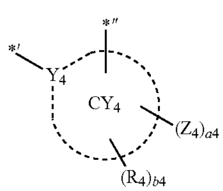

in Formula 2B is a group represented by one of Formulae CY4-1 to CY4-16 and CY4-1F to CY4-32F:

CY4-1

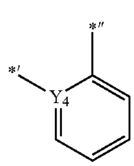

CY4-2

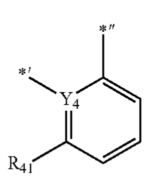

-continued

CY4-3

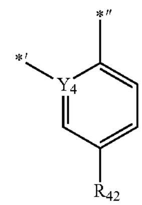

CY4-4

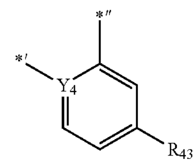

CY4-5

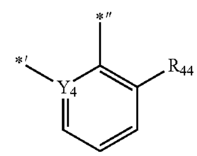

CY4-6

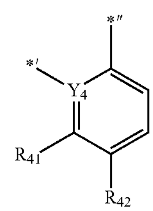

CY4-7

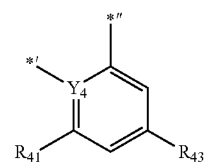

CY4-8

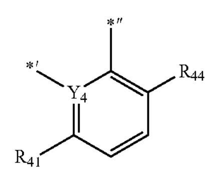

CY4-9

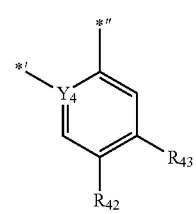

CY4-10

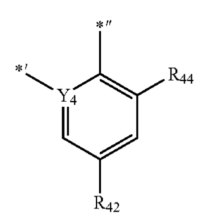

-continued
CY4-11
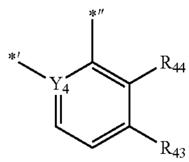
CY4-12
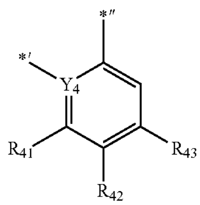
CY4-13
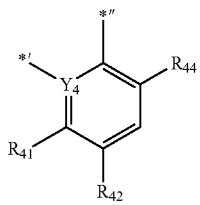
CY4-14
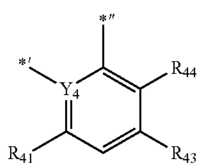
CY4-15
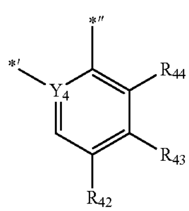
CY4-16
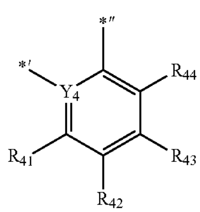
CY4-1F
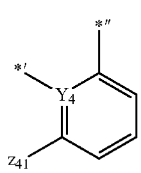
CY4-2F
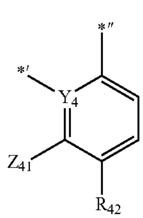
-continued
CY4-3F
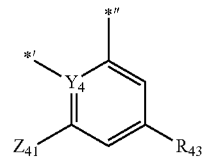
CY4-4F
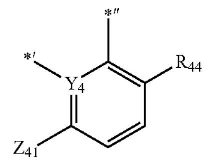
CY4-5F
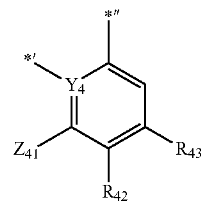
CY4-6F
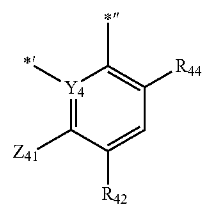
CY4-7F
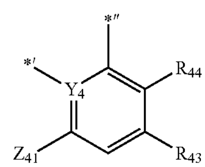
CY4-8F
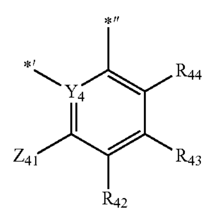
CY4-9F
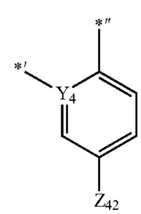
CY4-10F
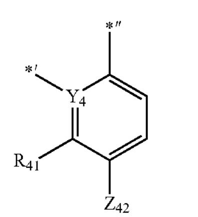

CY4-11F
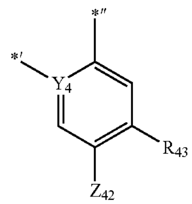
CY4-12F
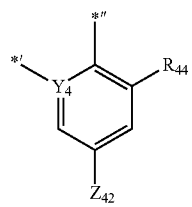
CY4-13F
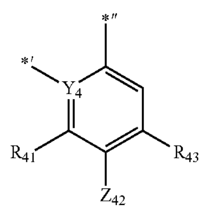
CY4-14F
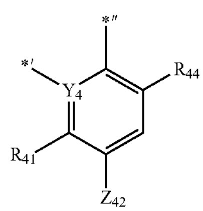
CY4-15F
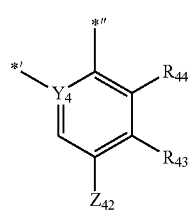
CY4-16F
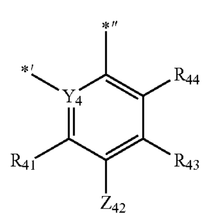
CY4-17F
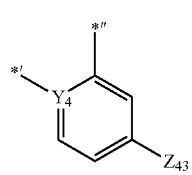
CY4-18F
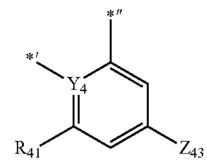
CY4-19F
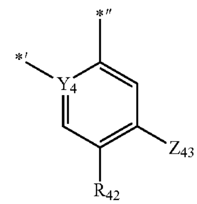
CY4-20F
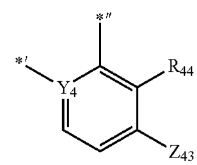
CY4-21F
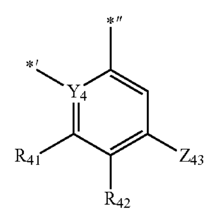
CY4-22F
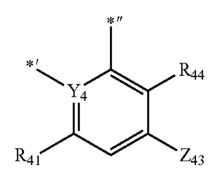
CY4-23F
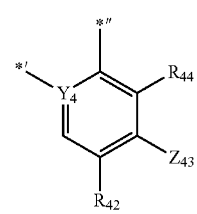
CY4-24F
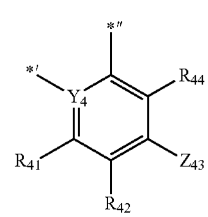

-continued

CY4-25F

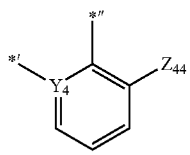

CY4-26F

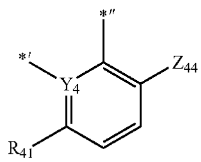

CY4-27F

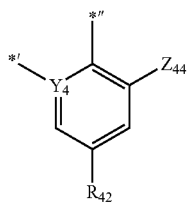

CY4-28F

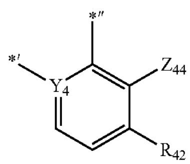

CY4-29F

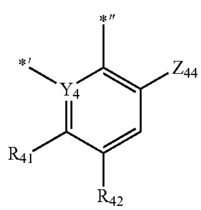

CY4-30F

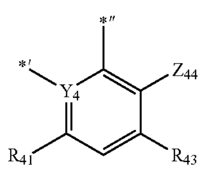

CY4-31F

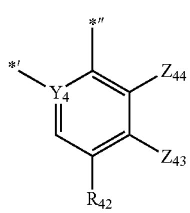

-continued

CY4-32F

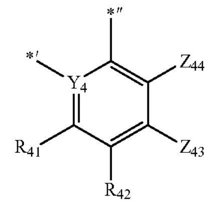

wherein, in Formulae CY4-1 to CY4-16 and CY4-1F to CY4-32F, $Z_{41}$ to $Z_{44}$ are each the same as described in connection with $Z_4$ in claim 1, $R_{41}$ to $R_{44}$ are each the same as described in connection with $R_4$ in claim 1, wherein each of $R_{41}$ to $R_{44}$ is not hydrogen,

* indicates a binding site to M in Formula 1, and

*" indicates a binding site to ring $CY_3$ in Formula 2B.

15. An organic light-emitting device comprising:

a first electrode;

a second electrode; and an organic layer arranged between the first electrode and the second electrode, wherein the organic layer comprises an emission layer, wherein the organic layer further comprises at least one organometallic compound of claim 1.

16. The organic light-emitting device of claim 15, wherein the first electrode is an anode, the second electrode is a cathode, the organic layer further comprises a hole transport region between the first electrode and the emission layer and an electron transport region between the emission layer and the second electrode, the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

17. The organic light-emitting device of claim 15, wherein the emission layer comprises the at least one organometallic compound.

18. The organic light-emitting device of claim 17, wherein the emission layer further comprises a host, and an amount of the host in the emission layer is greater than an amount of the at least one organometallic compound in the emission, each based on total weight of the emission layer.

19. An electronic apparatus comprising the organic light-emitting device of claim 15.

20. The organometallic compound of claim 1, wherein the sum of a1, a2, and a4 is 1 or more.

* * * * *